US006696309B2

(12) United States Patent
Yamanaka et al.

(10) Patent No.: US 6,696,309 B2
(45) Date of Patent: Feb. 24, 2004

(54) METHODS FOR MAKING ELECTROOPTICAL DEVICE AND DRIVING SUBSTRATE THEREFOR

(76) Inventors: Hideo Yamanaka, c/o Sony Corporation, 7-35, Kitashinagawa 6-chome, Shinagawa-ku, Tokyo 141 (JP); Hisayoshi Yamoto, c/o Sony Corporation, 7-35, Kitashinagawa 6-chome, Shinagawa-ku, Tokyo 141 (JP); Yuuichi Sato, c/o Sony Corporation, 7-35, Kitashinagawa 6-chome, Shinagawa-ku, Tokyo 141 (JP); Hajime Yagi, c/o Sony Corporation, 7-35, Kitashinagawa 6-chome, Shinagawa-ku, Tokyo 141 (JP)

( * ) Notice: Subject to any disclaimer, the term of this patent is extended or adjusted under 35 U.S.C. 154(b) by 64 days.

(21) Appl. No.: 09/798,852

(22) Filed: Mar. 2, 2001

(65) Prior Publication Data

US 2002/0013011 A1 Jan. 31, 2002

(51) Int. Cl.[7] .......................... H01L 21/00; H01L 21/84

(52) U.S. Cl. .......................................... 438/30; 438/158

(58) Field of Search ............................ 438/30, 151–166

(56) References Cited

U.S. PATENT DOCUMENTS 6,492,190 B2 * 12/2002 Yamanaka et al. ............ 438/30

* cited by examiner

*Primary Examiner*—Richard Booth
(74) *Attorney, Agent, or Firm*—Robert J. Depke; Holland & Knight LLC

(57) ABSTRACT

An electrooptical device including a first substrate including a display section having pixel electrodes and a peripheral-driving-circuit section provided on a periphery of the display section, a second substrate, and an optical material disposed between the first substrate and the second substrate is produced as follows. A material layer having a high degree of lattice matching with single-crystal silicon is formed on one face of the first substrate. A polycrystalline or amorphous silicon layer is formed on the first substrate and then a low-melting-point metal layer is formed on or under the silicon layer on the first substrate, or a low-melting-point metal layer containing silicon is formed on the first substrate having the material layer. The silicon layer or the silicon is dissolved into the low-melting-point metal layer by a heat treatment. A single-crystal silicon layer precipitates from the silicon in the silicon layer or the silicon in the low-melting-point metal layer by heteroepitaxial growth including a cooling treatment using the material layer as a seed. The single-crystal silicon layer is treated through a predetermined process to form at least an active device between the active device and a passive device.

50 Claims, 204 Drawing Sheets

FIG. 13

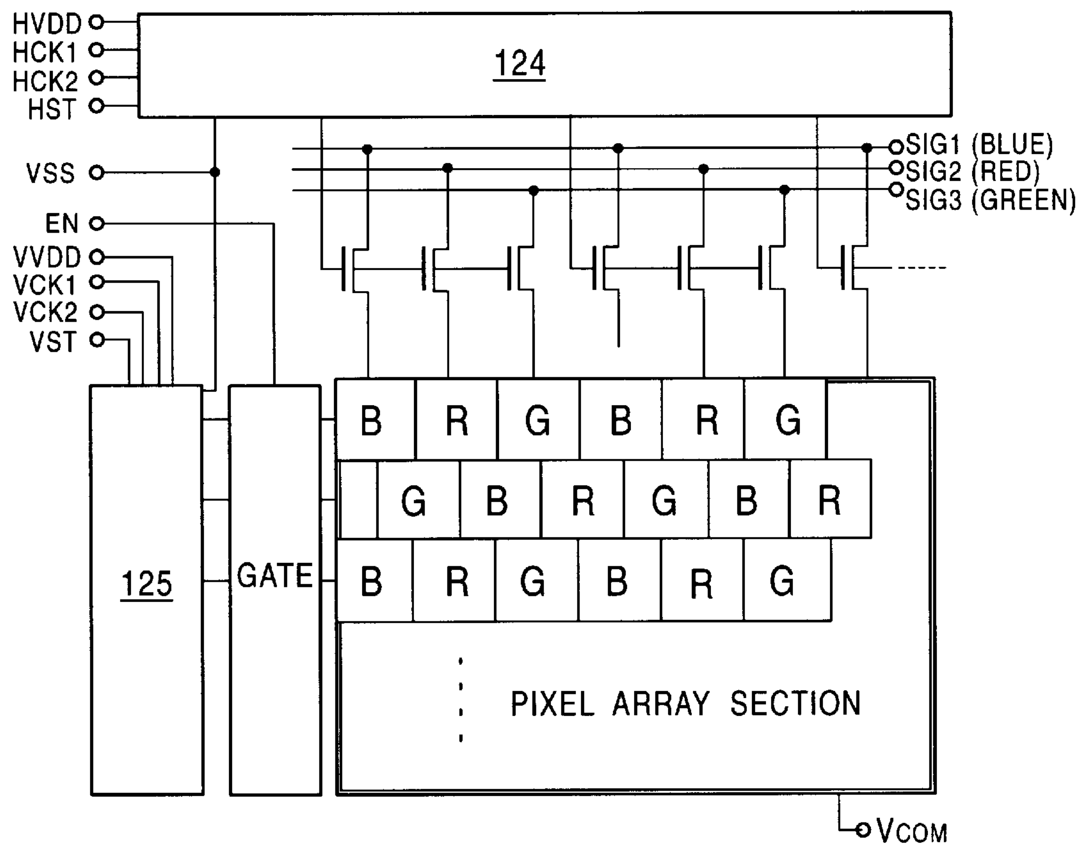

VCOM : COMMON-ELECTRODE VOLTAGE
HVDD : INPUT TERMINAL FOR H-DRIVER
VVDD : INPUT TERMINAL FOR V-DRIVER
HCK1 : CLOCK INPUT TERMINAL FOR DRIVING H-SHIFT REGISTER
HCK2 : CLOCK INPUT TERMINAL FOR DRIVING H-SHIFT REGISTER
VCK1 : CLOCK INPUT TERMINAL FOR DRIVING V-SHIFT REGISTER
VCK2 : CLOCK INPUT TERMINAL FOR DRIVING V-SHIFT REGISTER
HST : START PULSE INPUT TERMINAL FOR DRIVING H-SHIFT REGISTER
VST : START PULSE INPUT TERMINAL FOR DRIVING V-SHIFT REGISTER
VSS : GND TERMINAL FOR H-, V-DRIVERS
SIG1 : VIDEO-SIGNAL INPUT-TERMINAL VOLTAGE (BLUE)
SIG2 : VIDEO-SIGNAL INPUT-TERMINAL VOLTAGE (RED)
S1G3 : VIDEO-SIGNAL INPUT-TERMINAL VOLTAGE (GREEN)

FIG. 174

| No. | PERIPHERAL DRIVING CIRCUIT SECTION | DISPLAY SECTION |
|---|---|---|
| 1 | TOP-GATE TYPE | TOP-GATE TYPE |
| 2 | TOP-GATE TYPE | BOTTOM-GATE TYPE |
| 3 | TOP-GATE TYPE | DUAL-GATE TYPE |
| 4 | TOP-GATE TYPE + BOTTOM-GATE TYPE | TOP-GATE TYPE |
| 5 | TOP-GATE TYPE + BOTTOM-GATE TYPE | BOTTOM-GATE TYPE |
| 6 | TOP-GATE TYPE + BOTTOM-GATE TYPE | DUAL-GATE TYPE |
| 7 | TOP-GATE TYPE + DUAL-GATE TYPE | TOP-GATE TYPE |
| 8 | TOP-GATE TYPE + DUAL-GATE TYPE | BOTTOM-GATE TYPE |
| 9 | TOP-GATE TYPE + DUAL-GATE TYPE | DUAL-GATE TYPE |
| 10 | TOP-GATE TYPE + BOTTOM-GATE TYPE + DUAL-GATE TYPE | TOP-GATE TYPE |
| 11 | TOP-GATE TYPE + BOTTOM-GATE TYPE + DUAL-GATE TYPE | BOTTOM-GATE TYPE |
| 12 | TOP-GATE TYPE + BOTTOM-GATE TYPE + DUAL-GATE TYPE | DUAL-GATE TYPE |

FIG. 175

| No. | PERIPHERAL DRIVING CIRCUIT SECTION | DISPLAY SECTION |
|---|---|---|
| 1 | BOTTOM-GATE TYPE | TOP-GATE TYPE |
| 2 | BOTTOM-GATE TYPE | BOTTOM-GATE TYPE |
| 3 | BOTTOM-GATE TYPE | DUAL-GATE TYPE |
| 4 | BOTTOM-GATE TYPE + BOTTOM-GATE TYPE | TOP-GATE TYPE |
| 5 | BOTTOM-GATE TYPE + BOTTOM-GATE TYPE | BOTTOM-GATE TYPE |
| 6 | BOTTOM-GATE TYPE + BOTTOM-GATE TYPE | DUAL-GATE TYPE |
| 7 | BOTTOM-GATE TYPE + DUAL-GATE TYPE | TOP-GATE TYPE |
| 8 | BOTTOM-GATE TYPE + DUAL-GATE TYPE | BOTTOM-GATE TYPE |
| 9 | BOTTOM-GATE TYPE + DUAL-GATE TYPE | DUAL-GATE TYPE |
| 10 | BOTTOM-GATE TYPE + BOTTOM-GATE TYPE + DUAL-GATE TYPE | TOP-GATE TYPE |
| 11 | BOTTOM-GATE TYPE + BOTTOM-GATE TYPE + DUAL-GATE TYPE | BOTTOM-GATE TYPE |
| 12 | BOTTOM-GATE TYPE + BOTTOM-GATE TYPE + DUAL-GATE TYPE | DUAL-GATE TYPE |

FIG. 176

| No. | PERIPHERAL DRIVING CIRCUIT SECTION | DISPLAY SECTION |
|---|---|---|
| 1 | DUAL-GATE TYPE | TOP-GATE TYPE |
| 2 | DUAL-GATE TYPE | BOTTOM-GATE TYPE |
| 3 | DUAL-GATE TYPE | DUAL-GATE TYPE |
| 4 | DUAL-GATE TYPE + BOTTOM-GATE TYPE | TOP-GATE TYPE |
| 5 | DUAL-GATE TYPE + BOTTOM-GATE TYPE | BOTTOM-GATE TYPE |
| 6 | DUAL-GATE TYPE + BOTTOM-GATE TYPE | DUAL-GATE TYPE |
| 7 | DUAL-GATE TYPE + DUAL-GATE TYPE | TOP-GATE TYPE |
| 8 | DUAL-GATE TYPE + DUAL-GATE TYPE | BOTTOM-GATE TYPE |
| 9 | DUAL-GATE TYPE + DUAL-GATE TYPE | DUAL-GATE TYPE |
| 10 | DUAL-GATE TYPE + BOTTOM-GATE TYPE + DUAL-GATE TYPE | TOP-GATE TYPE |
| 11 | DUAL-GATE TYPE + BOTTOM-GATE TYPE + DUAL-GATE TYPE | BOTTOM-GATE TYPE |
| 12 | DUAL-GATE TYPE + BOTTOM-GATE TYPE + DUAL-GATE TYPE | DUAL-GATE TYPE |

FIG. 177

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 1 | TOP GATE | p | TOP GATE | p |
| 2 | TOP GATE | p | TOP GATE | n |
| 3 | TOP GATE | n | TOP GATE | n |
| 4 | TOP GATE | n | TOP GATE | p |
| 5 | TOP GATE | c | TOP GATE | p |
| 6 | TOP GATE | c | TOP GATE | n |
| 7 | TOP GATE | c | TOP GATE | c |
| 8 | TOP GATE | p | TOP GATE | c |
| 9 | TOP GATE | n | TOP GATE | c |
| 10 | TOP GATE | p | BOTTOM GATE | p |
| 11 | TOP GATE | p | BOTTOM GATE | n |
| 12 | TOP GATE | n | BOTTOM GATE | n |
| 13 | TOP GATE | n | BOTTOM GATE | p |
| 14 | TOP GATE | c | BOTTOM GATE | p |
| 15 | TOP GATE | c | BOTTOM GATE | n |
| 16 | TOP GATE | c | BOTTOM GATE | c |
| 17 | TOP GATE | p | BOTTOM GATE | c |
| 18 | TOP GATE | n | BOTTOM GATE | c |
| 19 | TOP GATE | p | DUAL GATE | p |
| 20 | TOP GATE | p | DUAL GATE | n |
| 21 | TOP GATE | n | DUAL GATE | n |
| 22 | TOP GATE | n | DUAL GATE | p |
| 23 | TOP GATE | c | DUAL GATE | p |
| 24 | TOP GATE | c | DUAL GATE | n |
| 25 | TOP GATE | c | DUAL GATE | c |
| 26 | TOP GATE | p | DUAL GATE | c |
| 27 | TOP GATE | n | DUAL GATE | c |

p : p-CHANNEL TYPE n : n-CHANNEL TYPE c : COMPLEMENTARY TYPE OF COMBINATION OF p-CHANNEL TYPE AND n-CHANNEL TYPE

FIG. 178

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 28 | TOP GATE | c + n | TOP GATE | p |
| 29 | TOP GATE | c + n | TOP GATE | n |
| 30 | TOP GATE | c + n | TOP GATE | c |
| 31 | TOP GATE | c + p | TOP GATE | p |
| 32 | TOP GATE | c + p | TOP GATE | n |
| 33 | TOP GATE | c + p | TOP GATE | c |
| 34 | TOP GATE | c + n + p | TOP GATE | p |
| 35 | TOP GATE | c + n + p | TOP GATE | n |
| 36 | TOP GATE | c + n + p | TOP GATE | c |
| 37 | TOP GATE | c + n | BOTTOM GATE | p |
| 38 | TOP GATE | c + n | BOTTOM GATE | n |
| 39 | TOP GATE | c + n | BOTTOM GATE | c |
| 40 | TOP GATE | c + p | BOTTOM GATE | p |
| 41 | TOP GATE | c + p | BOTTOM GATE | n |
| 42 | TOP GATE | c + p | BOTTOM GATE | c |
| 43 | TOP GATE | c + n + p | BOTTOM GATE | p |
| 44 | TOP GATE | c + n + p | BOTTOM GATE | n |
| 45 | TOP GATE | c + n + p | BOTTOM GATE | c |
| 46 | TOP GATE | c + n | DUAL GATE | p |
| 47 | TOP GATE | c + n | DUAL GATE | n |
| 48 | TOP GATE | c + n | DUAL GATE | c |
| 49 | TOP GATE | c + p | DUAL GATE | p |
| 50 | TOP GATE | c + p | DUAL GATE | n |
| 51 | TOP GATE | c + p | DUAL GATE | c |
| 52 | TOP GATE | c + n + p | DUAL GATE | p |
| 53 | TOP GATE | c + n + p | DUAL GATE | n |
| 54 | TOP GATE | c + n + p | DUAL GATE | c |

FIG. 179

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 55 | TOP GATE | p | TOP GATE | p |
| 56 | TOP GATE | p | TOP GATE | n |
| 57 | TOP GATE | n | TOP GATE | n |
| 58 | TOP GATE | n | TOP GATE | p |
| 59 | TOP GATE | c | TOP GATE | p |
| 60 | TOP GATE | c | TOP GATE | n |
| 61 | TOP GATE | c | TOP GATE | c |
| 62 | TOP GATE | p | TOP GATE | c |
| 63 | TOP GATE | n | TOP GATE | c |
| 64 | TOP GATE | p | BOTTOM GATE | p |
| 65 | TOP GATE | p | BOTTOM GATE | n |
| 66 | TOP GATE | n | BOTTOM GATE | n |
| 67 | TOP GATE | n | BOTTOM GATE | p |
| 68 | TOP GATE | c | BOTTOM GATE | p |
| 69 | TOP GATE | c | BOTTOM GATE | n |
| 70 | TOP GATE | c | BOTTOM GATE | c |
| 71 | TOP GATE | p | BOTTOM GATE | c |
| 72 | TOP GATE | n | BOTTOM GATE | c |
| 73 | TOP GATE | p | DUAL GATE | p |
| 74 | TOP GATE | p | DUAL GATE | n |
| 75 | TOP GATE | n | DUAL GATE | n |
| 76 | TOP GATE | n | DUAL GATE | p |
| 77 | TOP GATE | c | DUAL GATE | p |
| 78 | TOP GATE | c | DUAL GATE | n |
| 79 | TOP GATE | c | DUAL GATE | c |
| 80 | TOP GATE | p | DUAL GATE | c |
| 81 | TOP GATE | n | DUAL GATE | c |

FIG. 180

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 82 | TOP GATE | c + n | TOP GATE | p |
| 83 | TOP GATE | c + n | TOP GATE | n |
| 84 | TOP GATE | c + n | TOP GATE | c |
| 85 | TOP GATE | c + p | TOP GATE | p |
| 86 | TOP GATE | c + p | TOP GATE | n |
| 87 | TOP GATE | c + p | TOP GATE | c |
| 88 | TOP GATE | c + n + p | TOP GATE | p |
| 89 | TOP GATE | c + n + p | TOP GATE | n |
| 90 | TOP GATE | c + n + p | TOP GATE | c |
| 91 | TOP GATE | c + n | BOTTOM GATE | p |
| 92 | TOP GATE | c + n | BOTTOM GATE | n |
| 93 | TOP GATE | c + n | BOTTOM GATE | c |
| 94 | TOP GATE | c + p | BOTTOM GATE | p |
| 95 | TOP GATE | c + p | BOTTOM GATE | n |
| 96 | TOP GATE | c + p | BOTTOM GATE | c |
| 97 | TOP GATE | c + n + p | BOTTOM GATE | p |
| 98 | TOP GATE | c + n + p | BOTTOM GATE | n |
| 99 | TOP GATE | c + n + p | BOTTOM GATE | c |
| 100 | TOP GATE | c + n | DUAL GATE | p |
| 101 | TOP GATE | c + n | DUAL GATE | n |
| 102 | TOP GATE | c + n | DUAL GATE | c |
| 103 | TOP GATE | c + p | DUAL GATE | p |
| 104 | TOP GATE | c + p | DUAL GATE | n |
| 105 | TOP GATE | c + p | DUAL GATE | c |
| 106 | TOP GATE | c + n + p | DUAL GATE | p |
| 107 | TOP GATE | c + n + p | DUAL GATE | n |
| 108 | TOP GATE | c + n + p | DUAL GATE | c |

FIG. 181

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 109 | TOP GATE | p | TOP GATE | p |
| 110 | TOP GATE | p | TOP GATE | n |
| 111 | TOP GATE | n | TOP GATE | n |
| 112 | TOP GATE | n | TOP GATE | p |
| 113 | TOP GATE | c | TOP GATE | p |
| 114 | TOP GATE | c | TOP GATE | n |
| 115 | TOP GATE | c | TOP GATE | c |
| 116 | TOP GATE | p | TOP GATE | c |
| 117 | TOP GATE | n | TOP GATE | c |
| 118 | TOP GATE | p | BOTTOM GATE | p |
| 119 | TOP GATE | p | BOTTOM GATE | n |
| 120 | TOP GATE | n | BOTTOM GATE | n |
| 121 | TOP GATE | n | BOTTOM GATE | p |
| 122 | TOP GATE | c | BOTTOM GATE | p |
| 123 | TOP GATE | c | BOTTOM GATE | n |
| 124 | TOP GATE | c | BOTTOM GATE | c |
| 125 | TOP GATE | p | BOTTOM GATE | c |
| 126 | TOP GATE | n | BOTTOM GATE | c |
| 127 | TOP GATE | p | DUAL GATE | p |
| 128 | TOP GATE | p | DUAL GATE | n |
| 129 | TOP GATE | n | DUAL GATE | n |
| 130 | TOP GATE | n | DUAL GATE | p |
| 131 | TOP GATE | c | DUAL GATE | p |
| 132 | TOP GATE | c | DUAL GATE | n |
| 133 | TOP GATE | c | DUAL GATE | c |
| 134 | TOP GATE | p | DUAL GATE | c |
| 135 | TOP GATE | n | DUAL GATE | c |

FIG. 182

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 136 | TOP GATE | c + n | TOP GATE | p |
| 137 | TOP GATE | c + n | TOP GATE | n |
| 138 | TOP GATE | c + n | TOP GATE | c |
| 139 | TOP GATE | c + p | TOP GATE | p |
| 140 | TOP GATE | c + p | TOP GATE | n |
| 141 | TOP GATE | c + p | TOP GATE | c |
| 142 | TOP GATE | c + n + p | TOP GATE | p |
| 143 | TOP GATE | c + n + p | TOP GATE | n |
| 144 | TOP GATE | c + n + p | TOP GATE | c |
| 145 | TOP GATE | c + n | BOTTOM GATE | p |
| 146 | TOP GATE | c + n | BOTTOM GATE | n |
| 147 | TOP GATE | c + n | BOTTOM GATE | c |
| 148 | TOP GATE | c + p | BOTTOM GATE | p |
| 149 | TOP GATE | c + p | BOTTOM GATE | n |
| 150 | TOP GATE | c + p | BOTTOM GATE | c |
| 151 | TOP GATE | c + n + p | BOTTOM GATE | p |
| 152 | TOP GATE | c + n + p | BOTTOM GATE | n |
| 153 | TOP GATE | c + n + p | BOTTOM GATE | c |
| 154 | TOP GATE | c + n | DUAL GATE | p |
| 155 | TOP GATE | c + n | DUAL GATE | n |
| 156 | TOP GATE | c + n | DUAL GATE | c |
| 157 | TOP GATE | c + p | DUAL GATE | p |
| 158 | TOP GATE | c + p | DUAL GATE | n |
| 159 | TOP GATE | c + p | DUAL GATE | c |
| 160 | TOP GATE | c + n + p | DUAL GATE | p |
| 161 | TOP GATE | c + n + p | DUAL GATE | n |
| 162 | TOP GATE | c + n + p | DUAL GATE | c |

FIG. 183

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 163 | TOP GATE | p | TOP GATE | p |
| 164 | TOP GATE | p | TOP GATE | n |
| 165 | TOP GATE | n | TOP GATE | n |
| 166 | TOP GATE | n | TOP GATE | p |
| 167 | TOP GATE | c | TOP GATE | p |
| 168 | TOP GATE | c | TOP GATE | n |
| 169 | TOP GATE | c | TOP GATE | c |
| 170 | TOP GATE | p | TOP GATE | c |
| 171 | TOP GATE | n | TOP GATE | c |
| 172 | TOP GATE | p | BOTTOM GATE | p |
| 173 | TOP GATE | p | BOTTOM GATE | n |
| 174 | TOP GATE | n | BOTTOM GATE | n |
| 175 | TOP GATE | n | BOTTOM GATE | p |
| 176 | TOP GATE | c | BOTTOM GATE | p |
| 177 | TOP GATE | c | BOTTOM GATE | n |
| 178 | TOP GATE | c | BOTTOM GATE | c |
| 179 | TOP GATE | p | BOTTOM GATE | c |
| 180 | TOP GATE | n | BOTTOM GATE | c |
| 181 | TOP GATE | p | DUAL GATE | p |
| 182 | TOP GATE | p | DUAL GATE | n |
| 183 | TOP GATE | n | DUAL GATE | n |
| 184 | TOP GATE | n | DUAL GATE | p |
| 185 | TOP GATE | c | DUAL GATE | p |
| 186 | TOP GATE | c | DUAL GATE | n |
| 187 | TOP GATE | c | DUAL GATE | c |
| 188 | TOP GATE | p | DUAL GATE | c |
| 189 | TOP GATE | n | DUAL GATE | c |

FIG. 184

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 190 | TOP GATE | c + n | TOP GATE | p |
| 191 | TOP GATE | c + n | TOP GATE | n |
| 192 | TOP GATE | c + n | TOP GATE | c |
| 193 | TOP GATE | c + p | TOP GATE | p |
| 194 | TOP GATE | c + p | TOP GATE | n |
| 195 | TOP GATE | c + p | TOP GATE | c |
| 196 | TOP GATE | c + n + p | TOP GATE | p |
| 197 | TOP GATE | c + n + p | TOP GATE | n |
| 198 | TOP GATE | c + n + p | TOP GATE | c |
| 199 | TOP GATE | c + n | BOTTOM GATE | p |
| 200 | TOP GATE | c + n | BOTTOM GATE | n |
| 201 | TOP GATE | c + n | BOTTOM GATE | c |
| 202 | TOP GATE | c + p | BOTTOM GATE | p |
| 203 | TOP GATE | c + p | BOTTOM GATE | n |
| 204 | TOP GATE | c + p | BOTTOM GATE | c |
| 205 | TOP GATE | c + n + p | BOTTOM GATE | p |
| 206 | TOP GATE | c + n + p | BOTTOM GATE | n |
| 207 | TOP GATE | c + n + p | BOTTOM GATE | c |
| 208 | TOP GATE | c + n | DUAL GATE | p |
| 209 | TOP GATE | c + n | DUAL GATE | n |
| 210 | TOP GATE | c + n | DUAL GATE | c |
| 211 | TOP GATE | c + p | DUAL GATE | p |
| 212 | TOP GATE | c + p | DUAL GATE | n |
| 213 | TOP GATE | c + p | DUAL GATE | c |
| 214 | TOP GATE | c + n + p | DUAL GATE | p |
| 215 | TOP GATE | c + n + p | DUAL GATE | n |
| 216 | TOP GATE | c + n + p | DUAL GATE | c |

FIG. 185

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 1 | BOTTOM GATE | p | TOP GATE | p |
| 2 | BOTTOM GATE | p | TOP GATE | n |
| 3 | BOTTOM GATE | n | TOP GATE | n |
| 4 | BOTTOM GATE | n | TOP GATE | p |
| 5 | BOTTOM GATE | c | TOP GATE | p |
| 6 | BOTTOM GATE | c | TOP GATE | n |
| 7 | BOTTOM GATE | c | TOP GATE | c |
| 8 | BOTTOM GATE | p | TOP GATE | c |
| 9 | BOTTOM GATE | n | TOP GATE | c |
| 10 | BOTTOM GATE | p | BOTTOM GATE | p |
| 11 | BOTTOM GATE | p | BOTTOM GATE | n |
| 12 | BOTTOM GATE | n | BOTTOM GATE | n |
| 13 | BOTTOM GATE | n | BOTTOM GATE | p |
| 14 | BOTTOM GATE | c | BOTTOM GATE | p |
| 15 | BOTTOM GATE | c | BOTTOM GATE | n |
| 16 | BOTTOM GATE | c | BOTTOM GATE | c |
| 17 | BOTTOM GATE | p | BOTTOM GATE | c |
| 18 | BOTTOM GATE | n | BOTTOM GATE | c |
| 19 | BOTTOM GATE | p | DUAL GATE | p |
| 20 | BOTTOM GATE | p | DUAL GATE | n |
| 21 | BOTTOM GATE | n | DUAL GATE | n |
| 22 | BOTTOM GATE | n | DUAL GATE | p |
| 23 | BOTTOM GATE | c | DUAL GATE | p |
| 24 | BOTTOM GATE | c | DUAL GATE | n |
| 25 | BOTTOM GATE | c | DUAL GATE | c |
| 26 | BOTTOM GATE | p | DUAL GATE | c |
| 27 | BOTTOM GATE | n | DUAL GATE | c |

p : p-CHANNEL TYPE n : n-CHANNEL TYPE c : COMPLEMENTARY TYPE OF COMBINATION OF p-CHANNEL TYPE AND n-CHANNEL TYPE

FIG. 186

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 28 | BOTTOM GATE | c + n | TOP GATE | p |
| 29 | BOTTOM GATE | c + n | TOP GATE | n |
| 30 | BOTTOM GATE | c + n | TOP GATE | c |
| 31 | BOTTOM GATE | c + p | TOP GATE | p |
| 32 | BOTTOM GATE | c + p | TOP GATE | n |
| 33 | BOTTOM GATE | c + p | TOP GATE | c |
| 34 | BOTTOM GATE | c + n + p | TOP GATE | p |
| 35 | BOTTOM GATE | c + n + p | TOP GATE | n |
| 36 | BOTTOM GATE | c + n + p | TOP GATE | c |
| 37 | BOTTOM GATE | c + n | BOTTOM GATE | p |
| 38 | BOTTOM GATE | c + n | BOTTOM GATE | n |
| 39 | BOTTOM GATE | c + n | BOTTOM GATE | c |
| 40 | BOTTOM GATE | c + p | BOTTOM GATE | p |
| 41 | BOTTOM GATE | c + p | BOTTOM GATE | n |
| 42 | BOTTOM GATE | c + p | BOTTOM GATE | c |
| 43 | BOTTOM GATE | c + n + p | BOTTOM GATE | p |
| 44 | BOTTOM GATE | c + n + p | BOTTOM GATE | n |
| 45 | BOTTOM GATE | c + n + p | BOTTOM GATE | c |
| 46 | BOTTOM GATE | c + n | DUAL GATE | p |
| 47 | BOTTOM GATE | c + n | DUAL GATE | n |
| 48 | BOTTOM GATE | c + n | DUAL GATE | c |
| 49 | BOTTOM GATE | c + p | DUAL GATE | p |
| 50 | BOTTOM GATE | c + p | DUAL GATE | n |
| 51 | BOTTOM GATE | c + p | DUAL GATE | c |
| 52 | BOTTOM GATE | c + n + p | DUAL GATE | p |
| 53 | BOTTOM GATE | c + n + p | DUAL GATE | n |
| 54 | BOTTOM GATE | c + n + p | DUAL GATE | c |

FIG. 187

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 55 | BOTTOM GATE | p | TOP GATE | p |
| 56 | BOTTOM GATE | p | TOP GATE | n |
| 57 | BOTTOM GATE | n | TOP GATE | n |
| 58 | BOTTOM GATE | n | TOP GATE | p |
| 59 | BOTTOM GATE | c | TOP GATE | p |
| 60 | BOTTOM GATE | c | TOP GATE | n |
| 61 | BOTTOM GATE | c | TOP GATE | c |
| 62 | BOTTOM GATE | p | TOP GATE | c |
| 63 | BOTTOM GATE | n | TOP GATE | c |
| 64 | BOTTOM GATE | p | BOTTOM GATE | p |
| 65 | BOTTOM GATE | p | BOTTOM GATE | n |
| 66 | BOTTOM GATE | n | BOTTOM GATE | n |
| 67 | BOTTOM GATE | n | BOTTOM GATE | p |
| 68 | BOTTOM GATE | c | BOTTOM GATE | p |
| 69 | BOTTOM GATE | c | BOTTOM GATE | n |
| 70 | BOTTOM GATE | c | BOTTOM GATE | c |
| 71 | BOTTOM GATE | p | BOTTOM GATE | c |
| 72 | BOTTOM GATE | n | BOTTOM GATE | c |
| 73 | BOTTOM GATE | p | DUAL GATE | p |
| 74 | BOTTOM GATE | p | DUAL GATE | n |
| 75 | BOTTOM GATE | n | DUAL GATE | n |
| 76 | BOTTOM GATE | n | DUAL GATE | p |
| 77 | BOTTOM GATE | c | DUAL GATE | p |
| 78 | BOTTOM GATE | c | DUAL GATE | n |
| 79 | BOTTOM GATE | c | DUAL GATE | c |
| 80 | BOTTOM GATE | p | DUAL GATE | c |
| 81 | BOTTOM GATE | n | DUAL GATE | c |

FIG. 188

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 82 | BOTTOM GATE | c + n | TOP GATE | p |
| 83 | BOTTOM GATE | c + n | TOP GATE | n |
| 84 | BOTTOM GATE | c + n | TOP GATE | c |
| 85 | BOTTOM GATE | c + p | TOP GATE | p |
| 86 | BOTTOM GATE | c + p | TOP GATE | n |
| 87 | BOTTOM GATE | c + p | TOP GATE | c |
| 88 | BOTTOM GATE | c + n + p | TOP GATE | p |
| 89 | BOTTOM GATE | c + n + p | TOP GATE | n |
| 90 | BOTTOM GATE | c + n + p | TOP GATE | c |
| 91 | BOTTOM GATE | c + n | BOTTOM GATE | p |
| 92 | BOTTOM GATE | c + n | BOTTOM GATE | n |
| 93 | BOTTOM GATE | c + n | BOTTOM GATE | c |
| 94 | BOTTOM GATE | c + p | BOTTOM GATE | p |
| 95 | BOTTOM GATE | c + p | BOTTOM GATE | n |
| 96 | BOTTOM GATE | c + p | BOTTOM GATE | c |
| 97 | BOTTOM GATE | c + n + p | BOTTOM GATE | p |
| 98 | BOTTOM GATE | c + n + p | BOTTOM GATE | n |
| 99 | BOTTOM GATE | c + n + p | BOTTOM GATE | c |
| 100 | BOTTOM GATE | c + n | DUAL GATE | p |
| 101 | BOTTOM GATE | c + n | DUAL GATE | n |
| 102 | BOTTOM GATE | c + n | DUAL GATE | c |
| 103 | BOTTOM GATE | c + p | DUAL GATE | p |
| 104 | BOTTOM GATE | c + p | DUAL GATE | n |
| 105 | BOTTOM GATE | c + p | DUAL GATE | c |
| 106 | BOTTOM GATE | c + n + p | DUAL GATE | p |
| 107 | BOTTOM GATE | c + n + p | DUAL GATE | n |
| 108 | BOTTOM GATE | c + n + p | DUAL GATE | c |

FIG. 189

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 109 | BOTTOM GATE | p | TOP GATE | p |
| 110 | BOTTOM GATE | p | TOP GATE | n |
| 111 | BOTTOM GATE | n | TOP GATE | n |
| 112 | BOTTOM GATE | n | TOP GATE | p |
| 113 | BOTTOM GATE | c | TOP GATE | p |
| 114 | BOTTOM GATE | c | TOP GATE | n |
| 115 | BOTTOM GATE | c | TOP GATE | c |
| 116 | BOTTOM GATE | p | TOP GATE | c |
| 117 | BOTTOM GATE | n | TOP GATE | c |
| 118 | BOTTOM GATE | p | BOTTOM GATE | p |
| 119 | BOTTOM GATE | p | BOTTOM GATE | n |
| 120 | BOTTOM GATE | n | BOTTOM GATE | n |
| 121 | BOTTOM GATE | n | BOTTOM GATE | p |
| 122 | BOTTOM GATE | c | BOTTOM GATE | p |
| 123 | BOTTOM GATE | c | BOTTOM GATE | n |
| 124 | BOTTOM GATE | c | BOTTOM GATE | c |
| 125 | BOTTOM GATE | p | BOTTOM GATE | c |
| 126 | BOTTOM GATE | n | BOTTOM GATE | c |
| 127 | BOTTOM GATE | p | DUAL GATE | p |
| 128 | BOTTOM GATE | p | DUAL GATE | n |
| 129 | BOTTOM GATE | n | DUAL GATE | n |
| 130 | BOTTOM GATE | n | DUAL GATE | p |
| 131 | BOTTOM GATE | c | DUAL GATE | p |
| 132 | BOTTOM GATE | c | DUAL GATE | n |
| 133 | BOTTOM GATE | c | DUAL GATE | c |
| 134 | BOTTOM GATE | p | DUAL GATE | c |
| 135 | BOTTOM GATE | n | DUAL GATE | c |

FIG. 190

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 136 | BOTTOM GATE | c + n | TOP GATE | p |
| 137 | BOTTOM GATE | c + n | TOP GATE | n |
| 138 | BOTTOM GATE | c + n | TOP GATE | c |
| 139 | BOTTOM GATE | c + p | TOP GATE | p |
| 140 | BOTTOM GATE | c + p | TOP GATE | n |
| 141 | BOTTOM GATE | c + p | TOP GATE | c |
| 142 | BOTTOM GATE | c + n + p | TOP GATE | p |
| 143 | BOTTOM GATE | c + n + p | TOP GATE | n |
| 144 | BOTTOM GATE | c + n + p | TOP GATE | c |
| 145 | BOTTOM GATE | c + n | BOTTOM GATE | p |
| 146 | BOTTOM GATE | c + n | BOTTOM GATE | n |
| 147 | BOTTOM GATE | c + n | BOTTOM GATE | c |
| 148 | BOTTOM GATE | c + p | BOTTOM GATE | p |
| 149 | BOTTOM GATE | c + p | BOTTOM GATE | n |
| 150 | BOTTOM GATE | c + p | BOTTOM GATE | c |
| 151 | BOTTOM GATE | c + n + p | BOTTOM GATE | p |
| 152 | BOTTOM GATE | c + n + p | BOTTOM GATE | n |
| 153 | BOTTOM GATE | c + n + p | BOTTOM GATE | c |
| 154 | BOTTOM GATE | c + n | DUAL GATE | p |
| 155 | BOTTOM GATE | c + n | DUAL GATE | n |
| 156 | BOTTOM GATE | c + n | DUAL GATE | c |
| 157 | BOTTOM GATE | c + p | DUAL GATE | p |
| 158 | BOTTOM GATE | c + p | DUAL GATE | n |
| 159 | BOTTOM GATE | c + p | DUAL GATE | c |
| 160 | BOTTOM GATE | c + n + p | DUAL GATE | p |
| 161 | BOTTOM GATE | c + n + p | DUAL GATE | n |
| 162 | BOTTOM GATE | c + n + p | DUAL GATE | c |

FIG. 191

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 163 | BOTTOM GATE | p | TOP GATE | p |
| 164 | BOTTOM GATE | p | TOP GATE | n |
| 165 | BOTTOM GATE | n | TOP GATE | n |
| 166 | BOTTOM GATE | n | TOP GATE | p |
| 167 | BOTTOM GATE | c | TOP GATE | p |
| 168 | BOTTOM GATE | c | TOP GATE | n |
| 169 | BOTTOM GATE | c | TOP GATE | c |
| 170 | BOTTOM GATE | p | TOP GATE | c |
| 171 | BOTTOM GATE | n | TOP GATE | c |
| 172 | BOTTOM GATE | p | BOTTOM GATE | p |
| 173 | BOTTOM GATE | p | BOTTOM GATE | n |
| 174 | BOTTOM GATE | n | BOTTOM GATE | n |
| 175 | BOTTOM GATE | n | BOTTOM GATE | p |
| 176 | BOTTOM GATE | c | BOTTOM GATE | p |
| 177 | BOTTOM GATE | c | BOTTOM GATE | n |
| 178 | BOTTOM GATE | c | BOTTOM GATE | c |
| 179 | BOTTOM GATE | p | BOTTOM GATE | c |
| 180 | BOTTOM GATE | n | BOTTOM GATE | c |
| 181 | BOTTOM GATE | p | DUAL GATE | p |
| 182 | BOTTOM GATE | p | DUAL GATE | n |
| 183 | BOTTOM GATE | n | DUAL GATE | n |
| 184 | BOTTOM GATE | n | DUAL GATE | p |
| 185 | BOTTOM GATE | c | DUAL GATE | p |
| 186 | BOTTOM GATE | c | DUAL GATE | n |
| 187 | BOTTOM GATE | c | DUAL GATE | c |
| 188 | BOTTOM GATE | p | DUAL GATE | c |
| 189 | BOTTOM GATE | n | DUAL GATE | c |

FIG. 192

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 190 | BOTTOM GATE | c + n | TOP GATE | p |
| 191 | BOTTOM GATE | c + n | TOP GATE | n |
| 192 | BOTTOM GATE | c + n | TOP GATE | c |
| 193 | BOTTOM GATE | c + p | TOP GATE | p |
| 194 | BOTTOM GATE | c + p | TOP GATE | n |
| 195 | BOTTOM GATE | c + p | TOP GATE | c |
| 196 | BOTTOM GATE | c + n + p | TOP GATE | p |
| 197 | BOTTOM GATE | c + n + p | TOP GATE | n |
| 198 | BOTTOM GATE | c + n + p | TOP GATE | c |
| 199 | BOTTOM GATE | c + n | BOTTOM GATE | p |
| 200 | BOTTOM GATE | c + n | BOTTOM GATE | n |
| 201 | BOTTOM GATE | c + n | BOTTOM GATE | c |
| 202 | BOTTOM GATE | c + p | BOTTOM GATE | p |
| 203 | BOTTOM GATE | c + p | BOTTOM GATE | n |
| 204 | BOTTOM GATE | c + p | BOTTOM GATE | c |
| 205 | BOTTOM GATE | c + n + p | BOTTOM GATE | p |
| 206 | BOTTOM GATE | c + n + p | BOTTOM GATE | n |
| 207 | BOTTOM GATE | c + n + p | BOTTOM GATE | c |
| 208 | BOTTOM GATE | c + n | DUAL GATE | p |
| 209 | BOTTOM GATE | c + n | DUAL GATE | n |
| 210 | BOTTOM GATE | c + n | DUAL GATE | c |
| 211 | BOTTOM GATE | c + p | DUAL GATE | p |
| 212 | BOTTOM GATE | c + p | DUAL GATE | n |
| 213 | BOTTOM GATE | c + p | DUAL GATE | c |
| 214 | BOTTOM GATE | c + n + p | DUAL GATE | p |
| 215 | BOTTOM GATE | c + n + p | DUAL GATE | n |
| 216 | BOTTOM GATE | c + n + p | DUAL GATE | c |

FIG. 193

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 1 | DUAL GATE | p | TOP GATE | p |
| 2 | DUAL GATE | p | TOP GATE | n |
| 3 | DUAL GATE | n | TOP GATE | n |
| 4 | DUAL GATE | n | TOP GATE | p |
| 5 | DUAL GATE | c | TOP GATE | p |
| 6 | DUAL GATE | c | TOP GATE | n |
| 7 | DUAL GATE | c | TOP GATE | c |
| 8 | DUAL GATE | p | TOP GATE | c |
| 9 | DUAL GATE | n | TOP GATE | c |
| 10 | DUAL GATE | p | BOTTOM GATE | p |
| 11 | DUAL GATE | p | BOTTOM GATE | n |
| 12 | DUAL GATE | n | BOTTOM GATE | n |
| 13 | DUAL GATE | n | BOTTOM GATE | p |
| 14 | DUAL GATE | c | BOTTOM GATE | p |
| 15 | DUAL GATE | c | BOTTOM GATE | n |
| 16 | DUAL GATE | c | BOTTOM GATE | c |
| 17 | DUAL GATE | p | BOTTOM GATE | c |
| 18 | DUAL GATE | n | BOTTOM GATE | c |
| 19 | DUAL GATE | p | DUAL GATE | p |
| 20 | DUAL GATE | p | DUAL GATE | n |
| 21 | DUAL GATE | n | DUAL GATE | n |
| 22 | DUAL GATE | n | DUAL GATE | p |
| 23 | DUAL GATE | c | DUAL GATE | p |
| 24 | DUAL GATE | c | DUAL GATE | n |
| 25 | DUAL GATE | c | DUAL GATE | c |
| 26 | DUAL GATE | p | DUAL GATE | c |
| 27 | DUAL GATE | n | DUAL GATE | c |

p : p-CHANNEL TYPE n : n-CHANNEL TYPE c : COMPLEMENTARY TYPE OF COMBINATION OF p-CHANNEL TYPE AND n-CHANNEL TYPE

FIG. 194

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 28 | DUAL GATE | c + n | TOP GATE | p |
| 29 | DUAL GATE | c + n | TOP GATE | n |
| 30 | DUAL GATE | c + n | TOP GATE | c |
| 31 | DUAL GATE | c + p | TOP GATE | p |
| 32 | DUAL GATE | c + p | TOP GATE | n |
| 33 | DUAL GATE | c + p | TOP GATE | c |
| 34 | DUAL GATE | c + n + p | TOP GATE | p |
| 35 | DUAL GATE | c + n + p | TOP GATE | n |
| 36 | DUAL GATE | c + n + p | TOP GATE | c |
| 37 | DUAL GATE | c + n | BOTTOM GATE | p |
| 38 | DUAL GATE | c + n | BOTTOM GATE | n |
| 39 | DUAL GATE | c + n | BOTTOM GATE | c |
| 40 | DUAL GATE | c + p | BOTTOM GATE | p |
| 41 | DUAL GATE | c + p | BOTTOM GATE | n |
| 42 | DUAL GATE | c + p | BOTTOM GATE | c |
| 43 | DUAL GATE | c + n + p | BOTTOM GATE | p |
| 44 | DUAL GATE | c + n + p | BOTTOM GATE | n |
| 45 | DUAL GATE | c + n + p | BOTTOM GATE | c |
| 46 | DUAL GATE | c + n | DUAL GATE | p |
| 47 | DUAL GATE | c + n | DUAL GATE | n |
| 48 | DUAL GATE | c + n | DUAL GATE | c |
| 49 | DUAL GATE | c + p | DUAL GATE | p |
| 50 | DUAL GATE | c + p | DUAL GATE | n |
| 51 | DUAL GATE | c + p | DUAL GATE | c |
| 52 | DUAL GATE | c + n + p | DUAL GATE | p |
| 53 | DUAL GATE | c + n + p | DUAL GATE | n |
| 54 | DUAL GATE | c + n + p | DUAL GATE | c |

FIG. 195

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 55 | DUAL GATE | p | TOP GATE | p |
| 56 | DUAL GATE | p | TOP GATE | n |
| 57 | DUAL GATE | n | TOP GATE | n |
| 58 | DUAL GATE | n | TOP GATE | p |
| 59 | DUAL GATE | c | TOP GATE | p |
| 60 | DUAL GATE | c | TOP GATE | n |
| 61 | DUAL GATE | c | TOP GATE | c |
| 62 | DUAL GATE | p | TOP GATE | c |
| 63 | DUAL GATE | n | TOP GATE | c |
| 64 | DUAL GATE | p | BOTTOM GATE | p |
| 65 | DUAL GATE | p | BOTTOM GATE | n |
| 66 | DUAL GATE | n | BOTTOM GATE | n |
| 67 | DUAL GATE | n | BOTTOM GATE | p |
| 68 | DUAL GATE | c | BOTTOM GATE | p |
| 69 | DUAL GATE | c | BOTTOM GATE | n |
| 70 | DUAL GATE | c | BOTTOM GATE | c |
| 71 | DUAL GATE | p | BOTTOM GATE | c |
| 72 | DUAL GATE | n | BOTTOM GATE | c |
| 73 | DUAL GATE | p | DUAL GATE | p |
| 74 | DUAL GATE | p | DUAL GATE | n |
| 75 | DUAL GATE | n | DUAL GATE | n |
| 76 | DUAL GATE | n | DUAL GATE | p |
| 77 | DUAL GATE | c | DUAL GATE | p |
| 78 | DUAL GATE | c | DUAL GATE | n |
| 79 | DUAL GATE | c | DUAL GATE | c |
| 80 | DUAL GATE | p | DUAL GATE | c |
| 81 | DUAL GATE | n | DUAL GATE | c |

FIG. 196

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 82 | DUAL GATE | c + n | TOP GATE | p |
| 83 | DUAL GATE | c + n | TOP GATE | n |
| 84 | DUAL GATE | c + n | TOP GATE | c |
| 85 | DUAL GATE | c + p | TOP GATE | p |
| 86 | DUAL GATE | c + p | TOP GATE | n |
| 87 | DUAL GATE | c + p | TOP GATE | c |
| 88 | DUAL GATE | c + n + p | TOP GATE | p |
| 89 | DUAL GATE | c + n + p | TOP GATE | n |
| 90 | DUAL GATE | c + n + p | TOP GATE | c |
| 91 | DUAL GATE | c + n | BOTTOM GATE | p |
| 92 | DUAL GATE | c + n | BOTTOM GATE | n |
| 93 | DUAL GATE | c + n | BOTTOM GATE | c |
| 94 | DUAL GATE | c + p | BOTTOM GATE | p |
| 95 | DUAL GATE | c + p | BOTTOM GATE | n |
| 96 | DUAL GATE | c + p | BOTTOM GATE | c |
| 97 | DUAL GATE | c + n + p | BOTTOM GATE | p |
| 98 | DUAL GATE | c + n + p | BOTTOM GATE | n |
| 99 | DUAL GATE | c + n + p | BOTTOM GATE | c |
| 100 | DUAL GATE | c + n | DUAL GATE | p |
| 101 | DUAL GATE | c + n | DUAL GATE | n |
| 102 | DUAL GATE | c + n | DUAL GATE | c |
| 103 | DUAL GATE | c + p | DUAL GATE | p |
| 104 | DUAL GATE | c + p | DUAL GATE | n |
| 105 | DUAL GATE | c + p | DUAL GATE | c |
| 106 | DUAL GATE | c + n + p | DUAL GATE | p |
| 107 | DUAL GATE | c + n + p | DUAL GATE | n |
| 108 | DUAL GATE | c + n + p | DUAL GATE | c |

FIG. 197

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 109 | DUAL GATE | p | TOP GATE | p |
| 110 | DUAL GATE | p | TOP GATE | n |
| 111 | DUAL GATE | n | TOP GATE | n |
| 112 | DUAL GATE | n | TOP GATE | p |
| 113 | DUAL GATE | c | TOP GATE | p |
| 114 | DUAL GATE | c | TOP GATE | n |
| 115 | DUAL GATE | c | TOP GATE | c |
| 116 | DUAL GATE | p | TOP GATE | c |
| 117 | DUAL GATE | n | TOP GATE | c |
| 118 | DUAL GATE | p | BOTTOM GATE | p |
| 119 | DUAL GATE | p | BOTTOM GATE | n |
| 120 | DUAL GATE | n | BOTTOM GATE | n |
| 121 | DUAL GATE | n | BOTTOM GATE | p |
| 122 | DUAL GATE | c | BOTTOM GATE | p |
| 123 | DUAL GATE | c | BOTTOM GATE | n |
| 124 | DUAL GATE | c | BOTTOM GATE | c |
| 125 | DUAL GATE | p | BOTTOM GATE | c |
| 126 | DUAL GATE | n | BOTTOM GATE | c |
| 127 | DUAL GATE | p | DUAL GATE | p |
| 128 | DUAL GATE | p | DUAL GATE | n |
| 129 | DUAL GATE | n | DUAL GATE | n |
| 130 | DUAL GATE | n | DUAL GATE | p |
| 131 | DUAL GATE | c | DUAL GATE | p |
| 132 | DUAL GATE | c | DUAL GATE | n |
| 133 | DUAL GATE | c | DUAL GATE | c |
| 134 | DUAL GATE | p | DUAL GATE | c |
| 135 | DUAL GATE | n | DUAL GATE | c |

FIG. 198

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 136 | DUAL GATE | c + n | TOP GATE | p |
| 137 | DUAL GATE | c + n | TOP GATE | n |
| 138 | DUAL GATE | c + n | TOP GATE | c |
| 139 | DUAL GATE | c + p | TOP GATE | p |
| 140 | DUAL GATE | c + p | TOP GATE | n |
| 141 | DUAL GATE | c + p | TOP GATE | c |
| 142 | DUAL GATE | c + n + p | TOP GATE | p |
| 143 | DUAL GATE | c + n + p | TOP GATE | n |
| 144 | DUAL GATE | c + n + p | TOP GATE | c |
| 145 | DUAL GATE | c + n | BOTTOM GATE | p |
| 146 | DUAL GATE | c + n | BOTTOM GATE | n |
| 147 | DUAL GATE | c + n | BOTTOM GATE | c |
| 148 | DUAL GATE | c + p | BOTTOM GATE | p |
| 149 | DUAL GATE | c + p | BOTTOM GATE | n |
| 150 | DUAL GATE | c + p | BOTTOM GATE | c |
| 151 | DUAL GATE | c + n + p | BOTTOM GATE | p |
| 152 | DUAL GATE | c + n + p | BOTTOM GATE | n |
| 153 | DUAL GATE | c + n + p | BOTTOM GATE | c |
| 154 | DUAL GATE | c + n | DUAL GATE | p |
| 155 | DUAL GATE | c + n | DUAL GATE | n |
| 156 | DUAL GATE | c + n | DUAL GATE | c |
| 157 | DUAL GATE | c + p | DUAL GATE | p |
| 158 | DUAL GATE | c + p | DUAL GATE | n |
| 159 | DUAL GATE | c + p | DUAL GATE | c |
| 160 | DUAL GATE | c + n + p | DUAL GATE | p |
| 161 | DUAL GATE | c + n + p | DUAL GATE | n |
| 162 | DUAL GATE | c + n + p | DUAL GATE | c |

FIG. 199

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 163 | DUAL GATE | p | TOP GATE | p |
| 164 | DUAL GATE | p | TOP GATE | n |
| 165 | DUAL GATE | n | TOP GATE | n |
| 166 | DUAL GATE | n | TOP GATE | p |
| 167 | DUAL GATE | c | TOP GATE | p |
| 168 | DUAL GATE | c | TOP GATE | n |
| 169 | DUAL GATE | c | TOP GATE | c |
| 170 | DUAL GATE | p | TOP GATE | c |
| 171 | DUAL GATE | n | TOP GATE | c |
| 172 | DUAL GATE | p | BOTTOM GATE | p |
| 173 | DUAL GATE | p | BOTTOM GATE | n |
| 174 | DUAL GATE | n | BOTTOM GATE | n |
| 175 | DUAL GATE | n | BOTTOM GATE | p |
| 176 | DUAL GATE | c | BOTTOM GATE | p |
| 177 | DUAL GATE | c | BOTTOM GATE | n |
| 178 | DUAL GATE | c | BOTTOM GATE | c |
| 179 | DUAL GATE | p | BOTTOM GATE | c |
| 180 | DUAL GATE | n | BOTTOM GATE | c |
| 181 | DUAL GATE | p | DUAL GATE | p |
| 182 | DUAL GATE | p | DUAL GATE | n |
| 183 | DUAL GATE | n | DUAL GATE | n |
| 184 | DUAL GATE | n | DUAL GATE | p |
| 185 | DUAL GATE | c | DUAL GATE | p |
| 186 | DUAL GATE | c | DUAL GATE | n |
| 187 | DUAL GATE | c | DUAL GATE | c |
| 188 | DUAL GATE | p | DUAL GATE | c |
| 189 | DUAL GATE | n | DUAL GATE | c |

FIG. 200

| | TFTS IN PERIPHERAL DRIVING CIRCUIT | | TFT IN DISPLAY SECTION | |
|---|---|---|---|---|
| No. | GATE STRUCTURE | CHANNEL CONDUCTIVE TYPE | GATE STRUCTURE | CHANNEL CONDUCTIVE TYPE |
| 190 | DUAL GATE | c + n | TOP GATE | p |
| 191 | DUAL GATE | c + n | TOP GATE | n |
| 192 | DUAL GATE | c + n | TOP GATE | c |
| 193 | DUAL GATE | c + p | TOP GATE | p |
| 194 | DUAL GATE | c + p | TOP GATE | n |
| 195 | DUAL GATE | c + p | TOP GATE | c |
| 196 | DUAL GATE | c + n + p | TOP GATE | p |
| 197 | DUAL GATE | c + n + p | TOP GATE | n |
| 198 | DUAL GATE | c + n + p | TOP GATE | c |
| 199 | DUAL GATE | c + n | BOTTOM GATE | p |
| 200 | DUAL GATE | c + n | BOTTOM GATE | n |
| 201 | DUAL GATE | c + n | BOTTOM GATE | c |
| 202 | DUAL GATE | c + p | BOTTOM GATE | p |
| 203 | DUAL GATE | c + p | BOTTOM GATE | n |
| 204 | DUAL GATE | c + p | BOTTOM GATE | c |
| 205 | DUAL GATE | c + n + p | BOTTOM GATE | p |
| 206 | DUAL GATE | c + n + p | BOTTOM GATE | n |
| 207 | DUAL GATE | c + n + p | BOTTOM GATE | c |
| 208 | DUAL GATE | c + n | DUAL GATE | p |
| 209 | DUAL GATE | c + n | DUAL GATE | n |
| 210 | DUAL GATE | c + n | DUAL GATE | c |
| 211 | DUAL GATE | c + p | DUAL GATE | p |
| 212 | DUAL GATE | c + p | DUAL GATE | n |
| 213 | DUAL GATE | c + p | DUAL GATE | c |
| 214 | DUAL GATE | c + n + p | DUAL GATE | p |
| 215 | DUAL GATE | c + n + p | DUAL GATE | n |
| 216 | DUAL GATE | c + n + p | DUAL GATE | c |

FIG. 202

| TYPE OF SILICON OF MOSTFT | TYPE OF MOSTFT | |
|---|---|---|
| | PERIPHERAL DRIVING CIRCUIT SECTION | DISPLAY SECTION |
| SINGLE-CRYSTAL | cMOS, n OR pMOS, OR cMOS + pMOS + nMOS | n OR pMOS OR cMOS |
| POLY-CRYSTALLINE | cMOS, n OR pMOS, OR cMOS + pMOS + nMOS | n OR pMOS OR cMOS |
| AMORPHOUS | —— | n OR pMOS OR cMOS |

METHODS FOR MAKING ELECTROOPTICAL DEVICE AND DRIVING SUBSTRATE THEREFOR

BACKGROUND OF THE INVENTION

1. Field of the Invention

The present invention relates to methods for making electrooptical devices and driving substrates for the electrooptical devices. In particular, the present invention relates to a method suitable for, for example, a liquid crystal display having an active region of a top-gate-type thin-film insulating-gate field-effect transistor (hereinafter referred to as top-gate-type MOSTFT) using a single-crystal silicon layer, grown by heteroepitaxy on an insulating substrate, and a passive region. Herein, the top-gate types include a stagger type and a coplanar type. Also, the present invention relates to a method suitable for, for example, a liquid crystal display having an active region of a bottom-gate-type thin-film insulating-gate field-effect transistor (hereinafter referred to as bottom-gate-type MOSTFT) using a single-crystal silicon layer, grown by heteroepitaxy on an insulating substrate, and a passive region. Herein, the bottom-gate types include an inverted-stagger NSI type and an inverted-stagger ISI type. Moreover, the present invention relates to a method suitable for, for example, a liquid crystal display having an active region of a dual-gate-type thin-film insulating-gate field-effect transistor (hereinafter referred to as dual-gate-type MOSTFT) using a single-crystal silicon layer, grown by heteroepitaxy on an insulating substrate, and a passive region. These configurations are suitable for liquid crystal displays etc.

2. Description of the Related Art

Various types of active-matrix liquid crystal displays are known. For example, a liquid crystal display has a display region using amorphous silicon for TFTs and an IC for an external driving circuit. Another type of liquid crystal display integrates a display section using solid phase deposition polycrystalline silicon TFTs and a driving circuit, as disclosed in Japanese Patent Application Laid-Open No. 6-242433. Integration of a display section using excimer laser annealing polycrystalline silicon TFTs and a driving circuit is also known in Japanese Patent Application Laid-Open No. 7-131030.

Although conventional amorphous silicon TFTs have high productivity, they are not suitable for production of p-channel MOSTFTs (hereinafter referred to as pMOSTFTs) due to a low electron mobility of 0.5 to 1.0 $cm^2$/v.sec. Since a peripheral driving section using pMOSTFTs and a display section cannot be formed on the same substrate, the driver IC should be an external component, which is mounted by, for example, a tape automated bonding (TAB) method, which has high production costs. This configuration inhibits production of high-resolution devices. Furthermore, the small electron mobility, as described above, causes a small ON current; hence, the size of the transistors in the display section is inevitably large, resulting in a small aperture ratio of pixels.

Conventional polycrystalline silicon TFTs have an electron mobility of 70 to $cm^2$/v.sec and can facilitate production of high-resolution devices. Thus, liquid crystal displays (LCDs) which use polycrystalline silicon and are integrated with driving circuits have attracted attention. The above electron mobility, however, is insufficient for driving a large LCD of 15 inches or more, and thus ICs for an external driving circuit are required.

TFTs using polycrystalline silicon formed by a solid-phase deposition process require annealing at a temperature of 600° C. or more for several tens of hours and thermal oxidation at approximately 1,000° C. to from a gate $SiO_2$ layer. Thus, the production of such TFTs requires using a semiconductor production apparatus. Thus, the wafer size is limited to 8 to 12 inches and the use of expensive heat-resistant quartz glass is inevitable, resulting in high production cost. Thus, the use of such TFTs is limited to EVF and audiovisual (AV) projectors.

Polycrystalline silicon TFTs produced by excimer laser annealing have many problems, including unstable output of the excimer lasers, low productivity, increasing price of the apparatus with increasing size, low yield and low quality. These problems are pronounced when large glass substrates having a side of, for example, 1 meter are used.

SUMMARY OF THE INVENTION

It is an object of the present invention to provide a method for uniformly depositing a single-crystal silicon thin-film having high electron/hole mobility at a relatively low temperature in a peripheral driving circuit to facilitate production of an electrooptical device such as a thin-film semiconductor display device using the single-crystal silicon thin-film, to form an integrated configuration of a display section including n-channel MOSTFTs (hereinafter referred to as nMOSTFTs) or pMOSTFTs having high switching characteristics and a lightly-doped drain (LDD) structure or complementary thin-film insulating gate electric field transistors (hereinafter referred to as cMOSTFTs) and a peripheral driving circuit including cMOSTFTs, nMOSTFTs, and/or pMOSTFTs, to facilitate production of a large display panel with high quality, high definition, a narrow frame, and high efficiency, to facilitate the use of a large glass substrate which has a low distortion point and does not require expensive facilities, to readily control the threshold voltage (Vth) of the device, and to facilitate operation of the device at a high rate due to reduced resistance.

The present invention is directed to a method for making an electrooptical device comprising a first substrate (a driving substrate) including a display section provided with pixel electrodes (arranged in a matrix) and a peripheral-driving-circuit section provided on a periphery of the display section, a second substrate (opposite substrate), and an optical material disposed between the first substrate and the second substrate, and to a method for making a driving substrate for the electrooptical device.

According to a first aspect of the present invention, the method for making an electrooptical device comprises the steps of: forming a material layer having a high degree of lattice matching with single-crystal silicon on one main face of the first substrate; forming a polycrystalline or amorphous silicon layer having a given thickness on the first substrate including the material layer and then forming a low-melting-point metal layer on or under the polycrystalline or amorphous silicon layer on the first substrate, or forming a low-melting-point metal layer containing silicon on the first substrate having the material layer; dissolving the polycrystalline or amorphous silicon layer or the silicon into the low-melting-point metal layer by a heat treatment; precipitating a single-crystal silicon layer from the silicon in the polycrystalline or amorphous silicon layer or the silicon in the low-melting-point metal layer by heteroepitaxy including a cooling treatment using the material layer as a seed; and treating the single-crystal silicon layer through a predetermined process to form at least an active device between the active device and a passive device.

According to a second aspect of the present invention, the method for making an electrooptical device comprises the steps of: forming a gate section comprising a gate electrode and a gate insulating film on one face of the first substrate; forming a material layer having a high degree of lattice matching with single-crystal silicon on the same face of the first substrate; forming a polycrystalline or amorphous silicon layer having a given thickness on the first substrate including the material layer and the gate section, and then forming a low-melting-point metal layer on or under the polycrystalline or amorphous silicon layer on the first substrate, or forming a low-melting-point metal layer containing silicon on the first substrate having the material layer; dissolving the polycrystalline or amorphous silicon layer or the silicon into the low-melting-point metal layer by a heat treatment; precipitating a single-crystal silicon layer from the silicon in the polycrystalline or amorphous silicon layer or the silicon in the low-melting-point metal layer by heteroepitaxial growth including a cooling treatment using the material layer as a seed; and treating the single-crystal silicon layer through a predetermined process to form a channel region, a source region, and a drain region; and forming a bottom-gate first thin film transistor having the gate section below the channel region and constituting a part of the peripheral driving circuit section.

According to a third aspect of the present invention, the method for making an electrooptical device comprises the steps of: forming a gate section comprising a gate electrode and a gate insulating film on one face of the first substrate; forming a material layer having a high degree of lattice matching with single-crystal silicon on the same face of the first substrate; forming a polycrystalline or amorphous silicon layer having a given thickness on the first substrate including the material layer and the gate section, and then forming a low-melting-point metal layer on or under the polycrystalline or amorphous silicon layer on the first substrate, or forming a low-melting-point metal layer containing silicon on the first substrate having the material layer; dissolving the polycrystalline or amorphous silicon layer or the silicon into the low-melting-point metal layer by a heat treatment; precipitating a single-crystal silicon layer from the silicon in the polycrystalline or amorphous silicon layer or the silicon in the low-melting-point metal layer by heteroepitaxial growth including a cooling treatment using the material layer as a seed; and treating the single-crystal silicon layer through a predetermined process to form a channel region, a source region, and a drain region; and forming a dual-gate first thin film transistor having the gate sections above and below the channel region and constituting a part of the peripheral driving circuit section.

According to a fourth aspect of the present invention, the method for making an electrooptical device comprises the steps of: forming a gate section comprising a gate electrode and a gate insulating film on one face of the first substrate; forming a material layer having a high degree of lattice matching with single-crystal silicon on the same face of the first substrate; forming a melt layer of a low-melting-point metal containing silicon on the first substrate including the material layer and the gate section; precipitating a single-crystal silicon layer from the silicon in the melt layer by heteroepitaxial growth including a cooling treatment using the material layer as a seed; treating the single-crystal silicon layer through a predetermined process to form a channel region, a source region, and a drain region; and forming a bottom-gate first thin film transistor having the gate section below the channel region and constituting a part of the peripheral driving circuit.

According to a fifth aspect of the present invention, the method for making an electrooptical device comprises the steps of: forming a gate section comprising a gate electrode and a gate insulating film on one face of the first substrate; forming a material layer having a high degree of lattice matching with single-crystal silicon on the same face of the first substrate; forming a melt layer of a low-melting-point metal containing silicon on the first substrate including the material layer and the gate section; precipitating a single-crystal silicon layer from the silicon in the melt layer by heteroepitaxial growth including a cooling treatment using the material layer as a seed; treating the single-crystal silicon layer through a predetermined process to form a channel region, a source region, and a drain region; and forming a dual-gate first thin film transistor having the gate sections above and below the channel region and constituting a part of the peripheral driving circuit.

In the present invention, the single-crystal silicon layer includes a single-crystal silicon layer and a single-crystal compound semiconductor layer. The active device includes a thin-film transistor and other devices such as a diode. The active device includes a resistor, an inductor, and a capacitor. For example, the active device is a capacitor formed by sandwiching a high-dielectric film of, for example, silicon nitride (SiN) with the single-crystal silicon layers (electrodes) having low resistance. Typical thin film transistors are field emission transistors (FETs including a MOS type and a junction type) and bipolar transistors. The present invention is applicable to these transistors.

In accordance with the present invention, a single-crystal semiconductor thin-film, such as a single-crystal silicon thin-film, is formed by heteroepitaxy using the material layer having a high degree of lattice matching with single-crystal silicon, e.g., a crystalline sapphire film, as a seed, from a low-melting-point metal layer which dissolves a semiconductor material, such as polycrystalline silicon or amorphous silicon, and is used for active devices, such as top-gate, bottom-gate, and dual-gate MOSTFTs, in a peripheral driving circuit of a driving substrate such as an active-matrix substrate and in a peripheral driving circuit of an electrooptical device, such as a liquid crystal device (LCD) integrating a display section and a peripheral driving circuit, and for passive devices, such as resistors, inductors, and capacitors. The following outstanding advantages (A) to (H) are achieved in the present invention.

(A) The material layer having a high degree of lattice matching with single-crystal silicon (for example, a sapphire film) is formed on the substrate, and a single-crystal silicon layer, such as a single-crystal silicon thin-film, is deposited by heteroepitaxy using the material layer as a seed. The single-crystal silicon layer has a high electron mobility of at least 540 $cm^2$/v.sec. Thus, an electrooptical device, such as a thin-film semiconductor display device having a high-speed driver, can be produced.

(B) Since this single-crystal silicon thin-film has high electron and hole mobility, single-crystal silicon top-gate, bottom-gate, and dual-gate MOSTFTs can form an integrated configuration of a display section including nMOSTFTs, pMOSTFTs or cMOSTFTs having high switching characteristics and a lightly-doped drain (LDD) structure, which moderates the intensity of the electric field and reduces leakage current, and a peripheral driving circuit including cMOSTFTs, nMOSTFTs, and/or pMOSTFTs having high driving characteristics. Such an integrated configuration facilitates production of a large display panel with high quality, high definition, a narrow frame, and high efficiency. Since this single-crystal silicon thin-film has high hole mobility, a peripheral driving circuit for driving electrons and holes independently or in combination can be provided and integrated with display TFTs of nMOS, pMOS or cMOS LDD-type. In a compact or small panel, either of a pair of vertical peripheral driving circuits may be omitted.

(C) The polycrystalline or amorphous silicon layer can be formed by a plasma-enhanced or reduced-pressure CVD process at a substrate temperature of 100 to 400° C. using the material layer as a seed for epitaxy, and the low-melting-point metal layer can be formed by a vacuum evaporation process or a sputtering process. In addition, the single-crystal silicon layer can be uniformly formed on the insulating substrate at a relatively low heating temperature, for example, 400 to 450° C., because the heating treatment during the silicon epitaxy can be performed at 930° C. or less.

(D) The method in accordance with the present invention does not include annealing at a middle temperature (approximately 600° C.) for several ten hours or excimer laser annealing and an expensive production facility. Thus, the method has high productivity with low production costs.

(E) In the heteroepitaxy in the present invention, a single-crystal silicon thin-film having a variety of P-type impurity concentration and high mobility can be readily produced by adjusting the ratio of polycrystalline silicon or amorphous silicon to a low-melting-point metal, and the heating temperature and the cooling rate of the substrate. Thus, the threshold voltage (Vth) of the device can be readily controlled and the device can operate at a high rate due to reduced resistance.

(F) When the low-melting-point metal layer containing polycrystalline or amorphous silicon is deposited, the layer is doped with an adequate amount of Group III or V impurity, such as boron, phosphorus, antimony, arsenic, bismuth or aluminum, so that the type and the concentration of the impurity in the heteroepitaxial single-crystal silicon thin-film, that is, the type (P-type or N-type) and the carrier concentration are controlled without limitation.

(G) The material layer such as a crystalline sapphire thin-film functions as a diffusion barrier against various atoms and can suppress diffusion of impurities from the glass substrate.

(H) When the dual-gate MOSTFTs are formed in the peripheral driving circuit, the cMOSTFT, nMOSTFT, and pMOSTFT have a drive capability which is 1.5 to 2 times higher than that of single-gate types. Thus, the dual-gate MOSTFTs are suitable for a peripheral driving circuit requiring TFTs having high drive capability. One of the pair of vertical driving circuits can be omitted by using the MOSTFTs. Moreover, the dual-gate MOSTFTs are suitable for electrooptical devices other than LCDs, such as organic ELs and FEDs. Moreover, this configuration can be readily changeable to top-gate types or bottom-gate types by selecting the upper or lower gate section. If one of the upper and lower gate sections does not work, the other can be used.

BRIEF DESCRIPTION OF THE DRAWINGS

FIG. 13 is an outline view showing a configuration of the LCD in accordance with the present invention;

FIGS. 84J to 84K, 85L to 88N, and 86O to 86Q are cross-sectional views illustrating the production steps of the LCD in accordance with the twenty-second embodiment of the present invention;

FIGS. 1081 to 108J, 109K to 109M, and 110N to 110P are cross-sectional views of main portions in the production steps of the LCD in accordance with the twenty-fifth embodiment of the present invention;

FIGS. 122A to 122D, 123E to 123H, 124I to 124K, 125L to 1250, and 126P to 126R are cross-sectional views illustrating production steps of a liquid crystal display (LCD) in accordance with a twenty-ninth embodiment of the present invention;

FIGS. 128A to 128C, 129D to 129G, 130H to 130K, 131L to 131N, 132O to 132Q, and 133R to 133T are cross-sectional views illustrating production steps of a liquid crystal display (LCD) in accordance with a thirtieth embodiment of the present invention;

FIGS. 174 to 200 are tables showing combinations of TFTs in a display section and a peripheral-driving-circuit section of a LCD in accordance with a forty-third embodiment of the present invention;

FIG. 202 is a table showing combinations of TFTs in the display section and the peripheral-driving-circuit section of the LCD in accordance with the forty-fourth embodiment of the present invention;

DESCRIPTION OF THE PREFERRED EMBODIMENTS

Figures 1A, 1B, 1C, 1D:
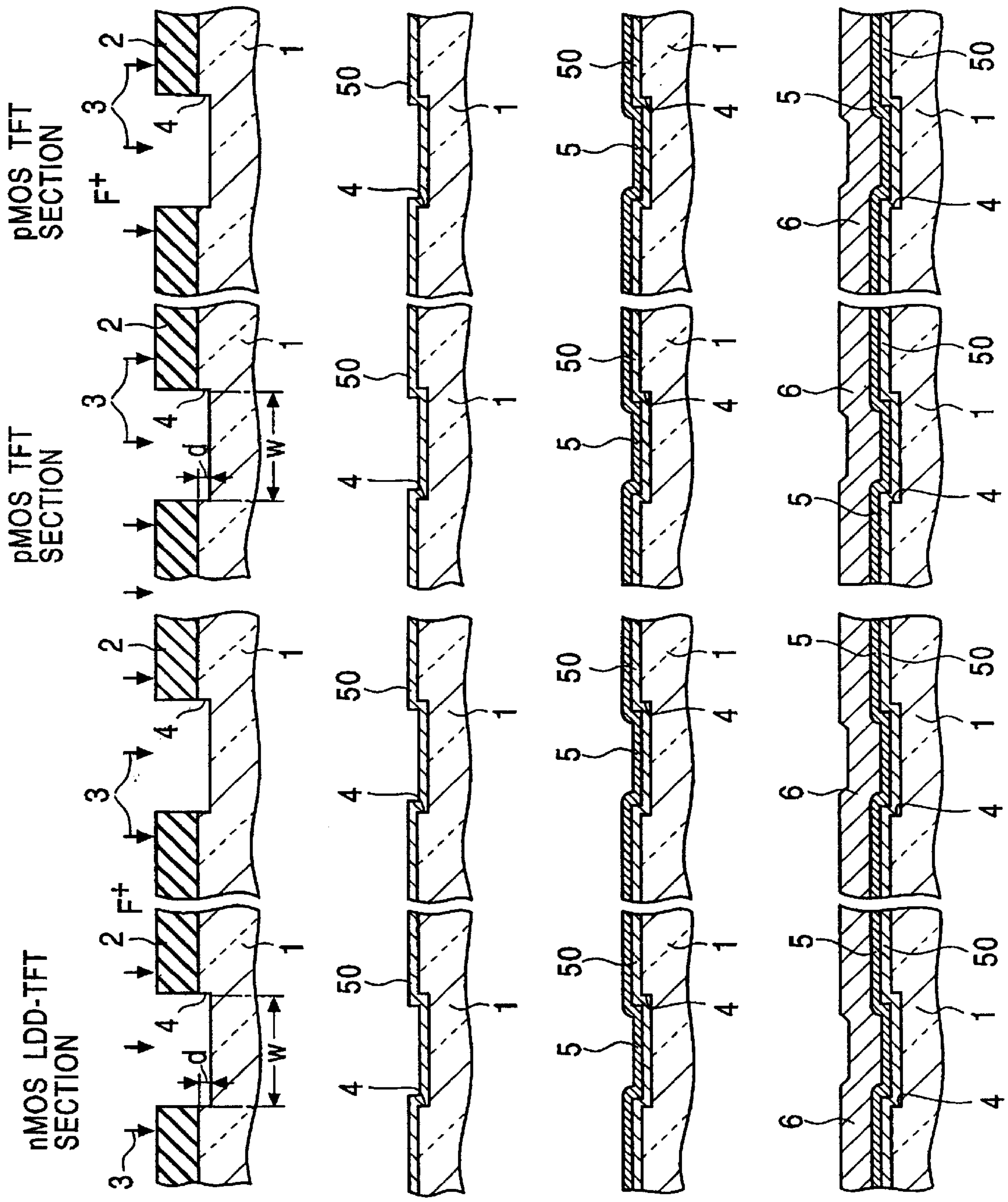
FIGS. 1A to 1D, 2E to 2G, 3H to 3J, 4K to 4M, 5N to 5P, and 6Q to 6S are cross-sectional views illustrating production steps of a liquid crystal display (LCD) in accordance with a first embodiment of the present invention.

In the present invention, a top-gate type first thin film transistor preferably constitutes at least a part of the peripheral-driving-circuit section, in which the single-crystal silicon layer is subjected to predetermined processing to form a channel region, a source region and a drain region, a gate section being formed above the channel region.

In the present invention, an insulating substrate is used as the first substrate, and the material layer is preferably made of a material selected from group consisting of sapphire ($Al_2O_3$), a spinel structure (for example, $MgO.Al_2O_3$), calcium fluoride ($CaF_2$), strontium fluoride ($SrF_2$), barium fluoride ($BaF_2$), boron phosphide (BP), yttrium oxide ($(Y_2O_3)_m$) and zirconium oxide ($(ZrO_2)_{1-m}$), and the like.

The polycrystalline or amorphous silicon layer is preferably formed to a thickness, for example, of several μm to 0.005 μm on the material layer by a low-temperature deposition process at a substrate temperature of 100 to 400° C., for example, a reduced-pressure CVD process, a catalytic CVD process, a plasma-enhanced CVD process, a sputtering process, or the like, and the low-melting-point metal layer is further deposited by a vacuum evaporation process, a sputtering process or the like to a thickness of about several tens to several hundreds times the thickness of the polycrystalline or amorphous silicon layer, followed by annealing.

Alternatively, a low-melting-point metal melt containing 2.0 to 0.005% by weight of silicon, for example, 1% by weight of silicon, may be coated on the heated insulating substrate, maintained for a predetermined time of several minutes to several tens minutes, and then cooled. As a result, a single-crystal silicon film having a thickness of 0.005 μm to several μm, for example, 1 μm, can be obtained.

In this case, the low-melting-point metal layer may be formed above or below the polycrystalline or amorphous silicon layer formed by the low-temperature deposition process. Alternatively, a low-melting-point metal layer containing silicon may be deposited and then annealed.

Alternatively, the substrate may be an insulating substrate, for example, a glass substrate, a heat-resistant organic substrate, and the low-melting-point metal layer may be formed of at least one metal selected from the group consisting of indium, gallium, tin, bismuth, lead, zinc, antimony and aluminum.

When the low-melting-point metal layer is formed of indium, this layer is preferably annealed at 850 to 1,100° C. (more preferably 900 to 950° C.) in a hydrogen-based atmosphere (pure hydrogen, a nitrogen-hydrogen mixture, or an argon-hydrogen mixture) to form an indium-silicon melt. When the low-melting-point metal layer is formed of indium-gallium or gallium, this layer is preferably annealed at 300 to 1,100° C. (more preferably 350 to 600° C.) or at 400 to 1,100° C. (more preferably 420 to 600° C.) in a hydrogen-based atmosphere to form an indium-gallium-silicon melt or a gallium-silicon melt. The substrate may be uniformly heated using an electrical furnace or a lamp. Alternatively, a predetermined region of the substrate may be locally heated using laser or electron beams.

When indium is used as the low-melting-point metal, the melt may be coated on the insulating substrate heated to 850 to 1,100° C., preferably 900 to 950° C. When indium-gallium or gallium is used as the low-melting-point metal, the melt may be coated on the insulating substrate heated to 300 to 1,100° C., preferably 350 to 600° C. or 400 to 1,100° C., preferably 420 to 600° C.

Figure 10A:
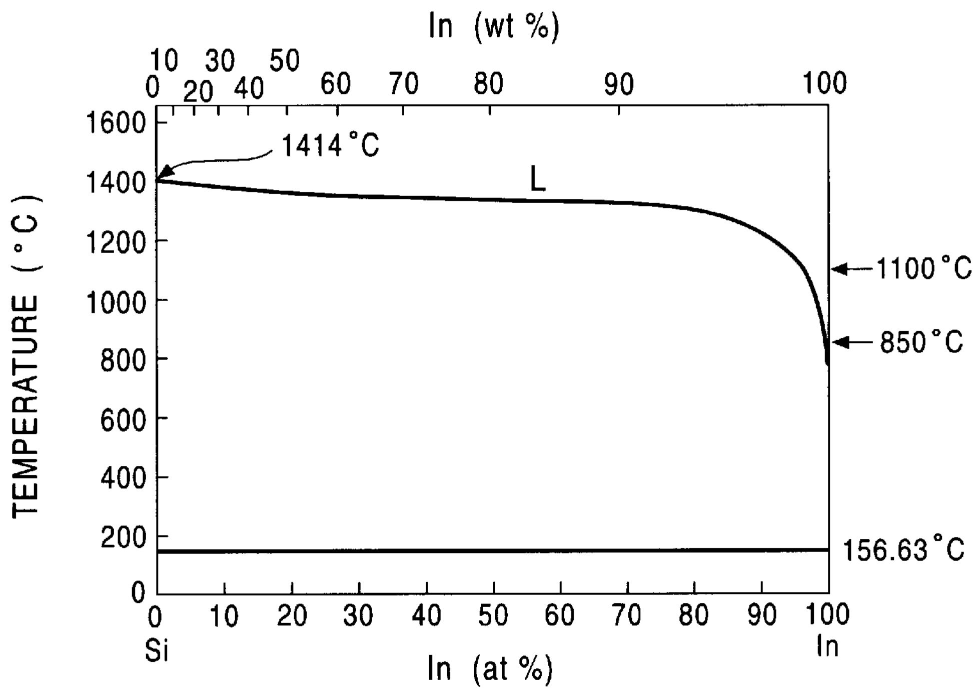
FIGS. 10A and 10B are phase diagrams of a Si—In alloy and a Si—Ga alloy, respectively.
Figure 10B:
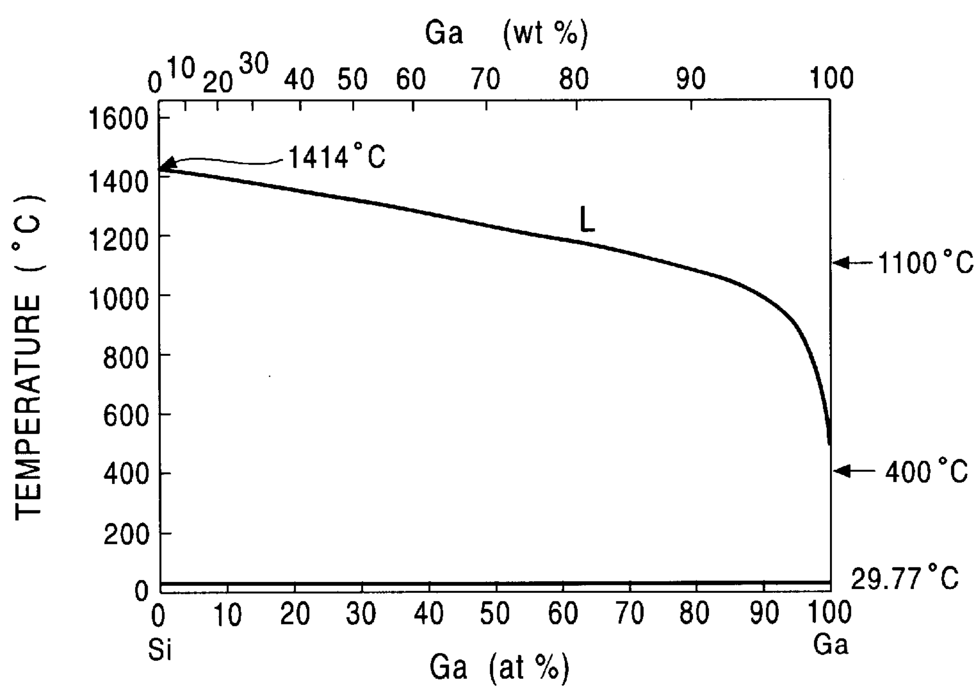

With reference to FIG. 10, the melting point of the silicon-containing low-melting-point metal decreases as the content of the low-melting-point metal increases. The silicon-containing indium melt layer (for example, containing 1% by weight of silicon) is formed at a substrate temperature of 850 to 1,100° C. when indium is used, because such a substrate temperature permits use of quartz plate glass as the substrate up to a temperature of about 1,000° C., and use of glass having low heat resistance, such as crystallized glass, up to a temperature of 850 to 1,100° C. When gallium is used, a gallium melt layer containing silicon (for example, 1% by weight of silicon) may be formed at a substrate temperature of 400 to 1,100° C. from the same reason as the above.

In the latter case, i.e., when indium-gallium-silicon or gallium-silicon is used, a glass substrate having a low distortion point or a heat-resistant organic substrate can be used. Thus, a semiconductor crystalline layer can be formed on a large glass substrate having an area of, for example, 1 $m^2$ or more. Such a substrate is inexpensive and a long thin substrate can be readily prepared. A single-crystal silicon thin-film can be formed continuously or discontinuously on the long glass or heat-resistant organic substrate by heteroepitaxy.

In the melt coating method, the substrate is gradually cooled after being maintained for the predetermined time of several minutes to several tens minutes. However, a dipping method comprising dipping the substrate in the melt, maintaining the substrate for the predetermined time of several minutes to several tens minutes, and then gradually pulling up the substrate, or a floating method comprising moving the melt or the surface thereof at a proper rate and then gradually cooling the substrate may be used. The thickness of the epitaxially grown layer and the concentration of the carrier impurity can be controlled by controlling the composition of the melt, the temperature and the pulling-up rate. The coating, dipping, and floating methods are capable of continuously or intermittently transferring the substrate for processing, thereby improving productivity.

Since the components of the glass having the low distortion point rapidly diffuse into the upper layer, a thin diffusion-barrier layer composed of, for example, silicon nitride (SiN) having a thickness of about 50 to 200 nm is preferably formed to suppress such diffusion. In this case, the polycrystalline or amorphous silicon layer or a silicon-containing low-melting-point metal layer is thus formed on the diffusion-barrier layer.

The silicon-containing low-melting-point metal layer is slowly cooled so that the single-crystal silicon layer is deposited by heteroepitaxy using the material layer as a seed, and then the low-melting-point metal layer is removed by resolution, for example, with hydrochloric acid. Then, the single-crystal silicon layer is subjected to predetermined treatment to form an active device and a passive device.

When the low-melting-point metal layer composed of indium deposited on the single-crystal silicon layer is removed by resolution with hydrochloric acid after slow cooling, a trace amount (approximately $10^{16}$ atoms/cc) of indium remains in the silicon layer. Thus, the single-crystal silicon layer becomes a p-type thin-film semiconductor. This layer is advantageous for production of an nMOSTFT. An n-type impurity such as phosphorus may be ion-implanted into the entire surface or selective regions of the single-crystal silicon layer to form an n-type single-crystal silicon thin-film in the entire surface or selective regions, whereby a pMOSTFT can be formed. A cMOSTFT can also be formed. The polycrystalline or amorphous silicon layer or the silicon-containing low-melting-point metal layer may be doped with a Group III or V impurity having a large solubility, such as boron, phosphorus, antimony, arsenic, or bismuth, in a proper amount, during the deposition of this layer so as to control the type and/or the concentration of the impurity in the epitaxially grown silicon layer, that is, to control the doping type (n- or p-) and/or the concentration of the carrier.

Accordingly, the single-crystal silicon layer heteroepitaxially grown on the substrate is used as a channel region, a source region and a drain region of a top-gate MOSTFT which constitutes at least a part of the peripheral driving circuit. The type and/or the concentration of each region can be controlled, as described above.

Thin-film transistors in the peripheral-driving-circuit section and the display section may constitute n-channel, p-channel or complementary insulating-gate field-effect transistors. For example, a thin-film transistor may comprise a combination of a complementary type and an n-channel type, a complementary type and a p-channel type, or a complementary type, an n-channel type and a p-channel type. At least a part of the thin-film transistors in the peripheral-driving-circuit section and the display section has a lightly-doped drain (LDD) structure. The LDD structure may be provided between the gate and the drain or between the gate and the source or drain, or between the gate and source and between the gate and the drain, respectively (referred to as "double LDD").

Preferably, the MOSTFT constitutes an LDD-type TFT of an nMOS, a pMOS or a cMOS in the display section, and a cMOSTFT, an nMOSTFT, a pMOSTFT, or a mixture thereof, in the peripheral-driving-circuit section.

In the present invention, a step difference is preferably formed in the insulating substrate and/or the SiN film formed thereon so that it forms an indented section having a cross-section in which a side face is perpendicular to or slanted to the bottom face so as to have a basilar angle of preferably 90° or less. The step difference possibly functions as a seed for heteroepitaxy of the single-crystal silicon layer to improve the crystallinity of the single-crystal silicon film and promote the growth thereof. The step difference is preferably formed along at least one side of a device region comprising the channel region, the source region and the drain region of the active element, for example, a thin film transistor. Alternatively, the step difference is preferably formed along at least one side of a device region in which a passive element, for example, a resistor, is formed.

In this case, the step difference having the predetermined shape is formed at the predetermined position on the insulating substrate as the substrate so that it functions as a seed for the heteroepitaxy to increase the crystallinity of the single-crystal silicon film and promote the growth thereof, and the material layer may be formed on the insulating substrate including the step difference.

Alternatively, a step difference having the same shape as the above may be formed in the material layer, and the single-crystal silicon layer may be formed on the material layer including the step difference.

In this case, not only the material layer but also the step difference function as seeds for heteroepitaxy, and thus the single-crystal silicon layer having higher crystallinity can be formed, and growth of the single-crystal silicon layer can be promoted.

The first thin-film transistor such as the MOSTFT may be provided in the indented section formed by the step difference, in the vicinity of the indented section outside it, or in both regions on the substrate. The step difference may be formed by dry etching such as reactive ion etching or the like.

In such a case, the step difference is formed on one surface of the first substrate, and a crystalline sapphire film and a single-crystal, polycrystalline or amorphous silicon layer are formed on the substrate having the step difference. The single-crystal, polycrystalline or amorphous silicon layer is used for a channel region, a source region and a drain region of a second thin-film transistor, and a gate section is provided above and/or below the channel region. That is, the second thin-film transistor may be a top-gate, bottom-gate or dual-gate thin-film transistor.

In this case, the step difference forms an indented section having a cross-section in which a side face is perpendicular to or slanted to the bottom face so as to have a basilar angle of preferably 90° or less, and the step difference functions as a seed for heteroepitaxy of the single-crystal silicon layer to improve the growth rate and crystallinity.

The second thin-film transistor may be formed inside and/or outside the indented section formed by the step difference formed in the first substrate and/or the film provided thereon, and the heteroepitaxially grown single-crystal silicon layer may be used for the source, drain and channel regions of the second thin-film transistor, as in the first thin-film transistor.

Also, in the second thin-film transistor, the type and the concentration of the Group III or V impurity in the single-crystal, polycrystalline or amorphous silicon layer may be controlled as described above. The step difference may be formed along at least one side of a device region including the channel region, the source region and the drain region of the second thin-film transistor. A gate electrode below the single-crystal, polycrystalline or amorphous silicon layer is preferably trapezoidal at the side end section. A diffusion-barrier layer may be provided between the first substrate and the single-crystal, polycrystalline or amorphous silicon layer.

The source or drain electrode of the first and/or second thin-film transistor is preferably formed on a region including the step difference.

The first thin-film transistor is at least the top-gate type selected from a top-gate type having a gate section above the channel region, a bottom-gate type having a gate section below the channel region, and a dual-gate type having one gate section above and one below the channel region, and a switching device for switching a pixel electrode in the display section comprises one of the top-gate second thin-film transistor, the bottom-gate second thin-film transistor and the dual-gate second thin-film transistor.

The first thin-film transistor is at least the bottom-gate type selected from a top-gate type having a gate section above the channel region, a bottom-gate type having a gate section below the channel region, and a dual-gate type having one gate section above and one below the channel region, and a switching device for switching a pixel electrode in the display section comprises one of the top-gate second thin-film transistor, the bottom-gate second thin-film transistor and the dual-gate second thin-film transistor.

The first thin-film transistor is at least the dual-gate type selected from a top-gate type having a gate section above the channel region, a bottom-gate type having a gate section below the channel region, and a dual-gate type having one gate section above and one below the channel region, and a switching device for switching a pixel electrode in the display section comprises one of the top-gate second thin-film transistor, the bottom-gate second thin-film transistor and the dual-gate second thin-film transistor.

In this case, a gate electrode formed below the channel region preferably comprises a heat resistant material, and an upper-gate electrode of the second thin-film transistor and a gate electrode of the first thin-film transistor may comprise a common material.

The peripheral-driving-circuit section may further comprises at least one of a top-gate, bottom-gate or dual-gate thin-film transistor having a channel region of a polycrystalline or amorphous silicon layer and a gate region formed above and/or below the channel region, and may comprise a diode, a resistor, a capacitor and an inductor, each comprising a single-crystal, polycrystalline or amorphous silicon layer.

Thin-film transistors in the peripheral driving circuit section and/or the display section have a single-gate or a multi-gate configuration.

When the n- or p-channel thin-film transistors in the peripheral-driving-circuit section and the display section are the dual-gate type, the upper or a lower-gate electrode is electrically opened or a given negative voltage for the n-channel type or a given positive voltage for the p-channel type is applied so that the dual-gate type thin-film transistors operate as bottom- or top-gate type thin-film transistors.

The thin-film transistor in the peripheral-driving-circuit section may be the first thin-film transistor of an n-channel, p-channel or complementary type. The thin-film transistor in the display section may be an n-channel, p-channel or complementary type when the channel region is a single-crystal silicon layer, a polycrystalline silicon layer, or an amorphous silicon layer.

After the single-crystal silicon layer is deposited, an upper-gate section including a gate insulating film and a gate electrode is formed on the single-crystal silicon layer, and the single-crystal silicon layer is doped with a Group III or V impurity element through the upper-gate section used as a mask to form the channel region, the source region and the drain region.

When the second thin-film transistor is a bottom-gate type or a dual-gate type, a lower-gate electrode composed of a heat resistant material is provided below the channel region, and a gate insulating film is formed on the gate electrode to form a lower-gate section, and the second thin-film transistor is formed by the same steps including the step for forming the step difference as those in the first thin-film transistor. In such a case, the upper-gate electrode of the second thin-film transistor and the gate electrode of the first thin-film transistor may be composed of a common material.

The single-crystal silicon layer formed on the lower-gate section may be doped with a Group III or V impurity element to form a source region and a drain region and then subjected to activation treatment.

The source and drain regions of each of the first and second thin-film transistors may be formed by ion-implantation of the above impurity element on the single-crystal silicon layer through a resist mask and then subjected to activation treatment. Furthermore, the gate electrode of the first thin-film transistor, and the upper-gate electrode of the second thin-film transistor, if necessary, may be formed after the formation of the gate insulating film.

Alternatively, in the bottom-gate type, the source and drain regions of each of the first and second thin-film transistors may be formed by ion-implantation of the above impurity element on the single-crystal silicon layer through a resist mask and then subjected to activation treatment. Furthermore, the gate electrode of the first thin-film transistor, and the upper-gate electrode of the second thin-film transistor may be formed after the formation of the gate insulating film.

Alternatively, in the dual-gate type, the source and drain regions of each of the first and second thin-film transistors may be formed by ion-implantation of the above impurity element on the single-crystal silicon layer through a resist mask and then subjected to activation treatment. Furthermore, the upper-gate electrode of the first thin-film transistor, and if required, the upper-gate electrode of the second thin-film transistor may be formed after the formation of the gate insulating film.

When the second thin-film transistor is the top-gate type, the source and drain regions of each of the first and second thin-film transistors may be formed on the single-crystal silicon layer by ion implantation of the impurity element through a resist mask and then subjected to activation treatment, and then the gate section including the gate insulating film and the gate electrode of each of the first and second thin-film transistors may be formed.

Alternatively, when the second thin-film transistor is the top-gate type, the source and drain regions of each of the first and second thin-film transistors may be formed on the single-crystal silicon layer by ion implantation of the impurity element through a resist mask and then subjected to activation treatment, and then the gate section including the gate insulating film and the gate electrode of the second thin-film transistor may be formed.

Alternatively, when the second thin-film transistor is the top-gate type, the gate section of each of the first and second thin-film transistors, which includes the gate insulating film and the gate electrode comprising a heat resistant material, may be formed after the formation of the single-crystal silicon layer, and then the source and drain regions of each of the first and second thin-film transistors may be formed on the single-crystal silicon layer by ion implantation of the impurity element through the gate section used as a mask and then subjected to activation treatment.

Alternatively, when the second thin-film transistor is the top-gate type, the gate section of the second thin-film transistor, which includes the gate insulating film and the gate electrode comprising a heat resistant material, may be formed on the single-crystal silicon layer, and then the source and drain regions of each of the first and second thin-film transistors may be formed on the single-crystal silicon layer by ion implantation of the impurity element through the gate section used as a mask and a resist mask and then subjected to activation treatment.

Alternatively, when the second thin-film transistor is the top-gate type, the gate section of each of the first and second thin-film transistors, which includes the gate insulating film and the gate electrode comprising a heat resistant material, may be formed on the single-crystal silicon layer, and then the source and drain regions of each of the first and second thin-film transistors may be formed on the single-crystal silicon layer by ion implantation of the impurity element through the gate section used as a mask and a resist mask and then subjected to activation treatment.

The remaining resist mask used for forming the LDD structure may be used for ion implantation for forming the source and drain regions.

The substrate may be optically opaque or transparent, and may be provided with pixel electrodes for a reflective or transmissive display.

When the display section has a lamination configuration of the pixel electrodes and a color filter layer, the color filter is formed on the display array section to improve the aperture ratio and the luminance of the display panel, and decrease cost due to omission of a color filter substrate and improved productivity.

When the pixel electrodes are reflective electrodes, unevenness is preferably formed in a resin film so that the resin film has optimized reflective characteristics and viewing-angle characteristics, and then the pixel electrodes are formed on the resin film. When the pixel electrodes are transparent electrodes, the surface is preferably planarized by a transparent planarization film and then the pixel electrodes are formed on the planarized plane.

The display section is constructed so that light emission or light control is performed by driving the above-described MOSTFT. The display section may comprise, for example, a liquid crystal display (LCD), an electroluminescent (EL) display, a field emission display (FED), a light-emitting polymer display (LEPD), or a light-emitting diode (LED) display. In this case, a plurality of pixel electrodes are arranged in a matrix in the display section and a switching device is connected to each pixel electrode.

The present invention will now be described in more detail with reference to the following preferable embodiments.

First Embodiment

FIGS. 1A to 13 show a first embodiment of the present invention.

The first embodiment relates to an active-matrix reflective liquid crystal display (LCD) comprising top-gate MOSTFTs formed by using a single-crystal silicon layer which is heteroepitaxially grown from indium-silicon at high temperature using, as a seed, a material layer (for example, a crystalline sapphire film) formed on a surface including a step difference (indented section) provided on a heat-resistant substrate. The overall layout of the reflective LCD is described below with reference to FIGS. 11 to 13.

Figure 11:
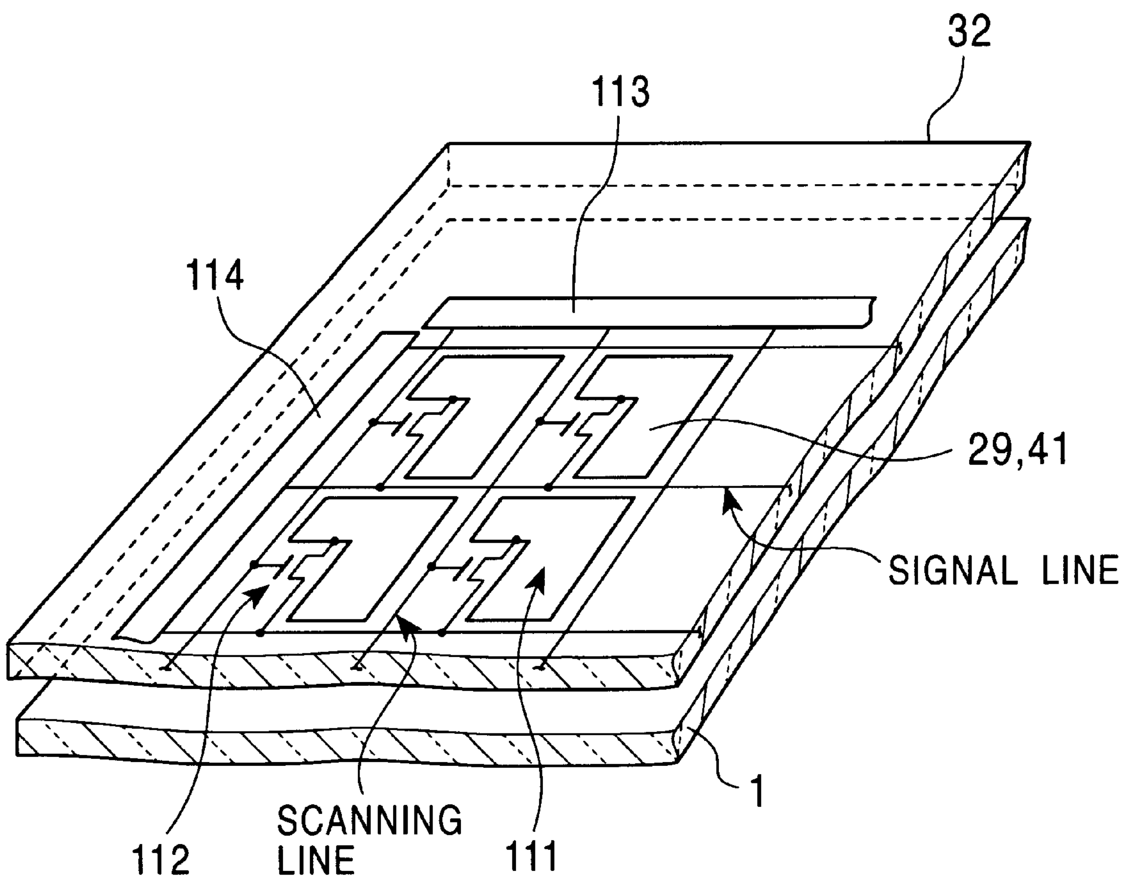
FIG. 11 is an outline isometric view of the LCD in accordance with the present invention.

With reference to FIG. 11, the active-matrix reflective LCD has a flat panel configuration including a main substrate 1 (active-matrix substrate) and a counter substrate 32 which are bonded to each other with a spacer provided therebetween (not shown in the drawing). The space between the main substrate 1 and the counter substrate 32 is filled with a liquid crystal (not shown in the drawing). A display section including pixel electrodes 29 or 41 arranged in a matrix and switching devices 112 for driving the pixel electrodes, and peripheral-driving-circuit sections 113 and 114 connected to the display section are provided on the surface of the main substrate 1.

Each switching device 112 in the display section 111 is composed of an nMOS, pMOS, or cMOS top-gate TFT having a LDD structure in accordance with the present invention. Also, in the peripheral-driving-circuit sections 113 and 114, cMOS, nMOS and/or pMOS top-gate TFTs in accordance with the present invention are formed as circuit components. One of the peripheral-driving-circuit sections 113 and 114 is a horizontal driving circuit which supplies a data signal to drive the TFT of each pixel for each horizontal line, and the other peripheral-driving-circuit section is a vertical driving circuit for driving the gate of the TFT of each pixel for each scanning line. The horizontal and vertical driving circuits are typically provided around the display section. These driving circuits may be a dot-sequential analog type or a line-sequential digital type.

Figure 12:
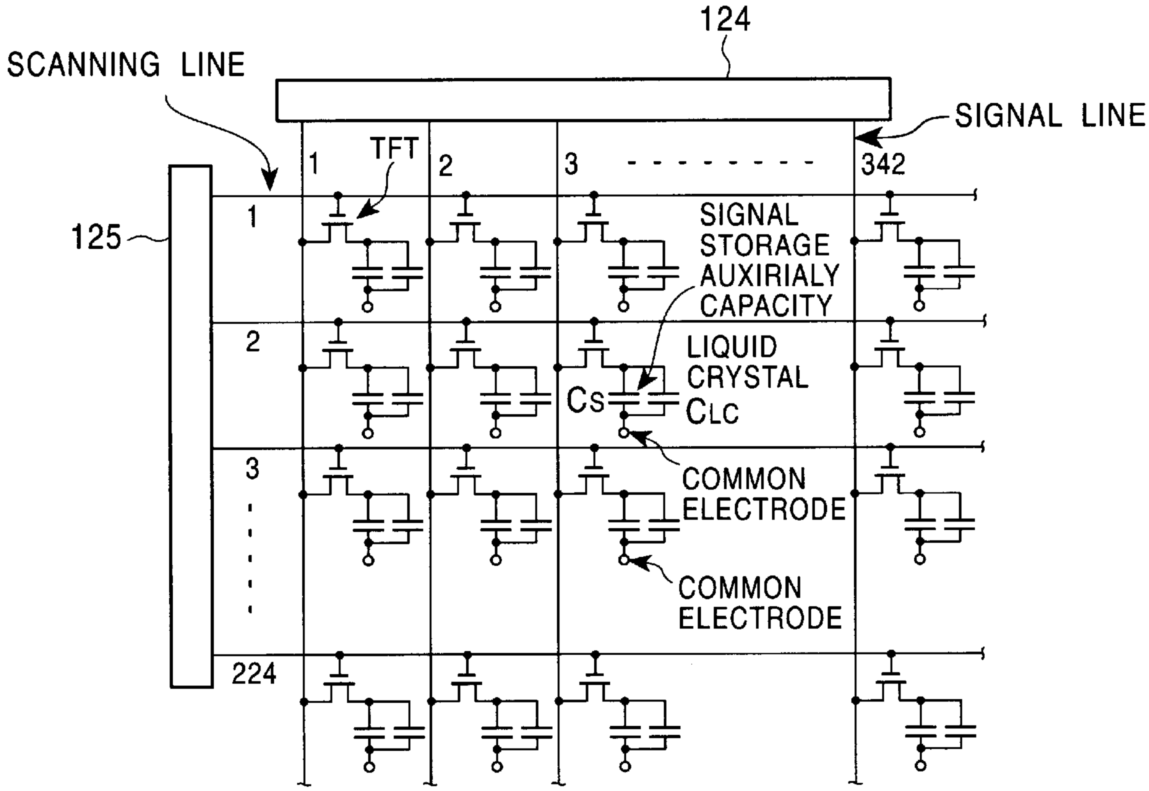
FIG. 12 is an equivalent circuit diagram of the LCD in accordance with the present invention.

With reference to FIG. 12, the TFTs are arranged at the intersections of gate bus lines (scanning lines) and data bus lines (signal lines) which cross each other at right angles. The TFTs write image information into liquid crystal capacitors ($C_{LC}$) and the charge in the liquid crystal capacitors is retained until the next information is written. Since the channel resistance of each TFT is not sufficient to retain the information, storage capacitors ($C_S$) may be provided in parallel to the liquid crystal capacitors to suppress a decrease in the liquid crystal voltage due to a leakage current. Characteristics required for TFTs used in the pixel or display region are different from characteristics required for TFTs used in the peripheral driving circuits. Particularly, an important property of the TFTs in the pixel region is to control an OFF current and to retain an ON current. Providing TFTs having a LDD structure in the display section can reduce electric fields between the gates and the drains and thus reduce effective electric fields applied to the channel regions, the OFF current and a change in characteristics. The production process, however, is complicated, the size of the device is inevitably increased, and the ON current is decreased. Thus, the design must be optimized to meet the purpose.

Usable liquid crystals include TN liquid crystals (nematic liquid crystals used in a TN mode of active-matrix driving), super-twisted nematic (STN) liquid crystals, guest-host (GH) liquid crystals, phase change (PC) liquid crystals, ferroelectric liquid crystals (FLCs), antiferroelectric liquid crystals (AFLCs), and polymer dispersion-type liquid crystals (PDLCs).

With reference to FIG. 13, the system of and the method for driving the peripheral driving circuits will now be described. The driving circuits include a gate driving circuit and a data driving circuit. These driving circuits have shift registers. Each shift resister generally may be a CMOS circuit including both pMOSTFTs and nMOSTFTs or may be a circuit including either pMOSTFTs or nMOSTFTs. A circuit generally used is a cMOSTFT or CMOS circuit in view of the operational speed, reliability, and low power consumption.

The scanning driving circuit includes shift registers and buffers and supplies pulses to lines in synchronism with a horizontal scanning period. The data driving circuit may be a dot-sequential driving system or a line-sequential driving system. The dot-sequential driving system shown in the drawing has a relatively simplified configuration and writes display signals directly into pixels through analog switches under control by the shift registers. The signals are sequentially written into pixels in a line within a horizontal scanning time for the line (R, G and B in the drawing schematically represent red, green and blue pixels).

With reference to FIGS. 1A to 9F, the active-matrix reflective LCD in this embodiment will be described based on the production steps. In FIGS. 1A to 6S, the left side of each drawing shows the production step of the display section and the right side shows the production step of the peripheral-driving-circuit section.

With reference to FIG. 1A, a photoresist layer 2 having a given pattern is formed in at least a TFT-forming region of one main surface of an insulating substrate composed of quartz glass or transparent crystallized glass. The surface is irradiated with, for example, $F^+$ ions 3 of $CF_4$ plasma through the photoresist layer 2 used as a mask. A plurality of step differences 4 having a given shape and a given size are formed on the substrate 1 by typical photolithography, such as reactive ion etching (RIE), and then by etching (photoetching).

The insulating substrate 1 may be composed of a highly-heat-resistant substrate having a diameter of 8 to 12 inches and a thickness of 700 to 800 $\mu$m, such as quartz glass, transparent crystallized glass, or ceramic. In a transmissive LCD described below, an opaque ceramic substrate, a low-transparent crystallized glass substrate cannot be used. The step differences 4 function as seeds for epitaxy of single-crystal silicon. Each step difference 4 has, for example, a depth d of 0.4 $\mu$m, a width w of 2 to 10 $\mu$m, and a length l of 10 to 20 $\mu$m (in the direction perpendicular to the drawing). The basilar angle defined by the bottom face and the side face is rectangular. In order to prevent diffusion of Na ions from the glass substrate, a SiN film having a thickness of, for example, 50 to 200 nm, and if required, a silicon oxide film (referred to as a "$SiO_2$ film" hereinafter) having a thickness of, for example, about 100 nm may be continuously formed on the surface of the substrate 1.

With reference to FIG. 1B, after the photoresist layer 2 is removed, a crystalline sapphire thin film 50 having a thickness of 20 to 200 nm is formed in at least the TFT-forming regions including the step differences 4 on one main surface of the insulating substrate 1. The crystalline sapphire thin film 50 is formed by oxidative crystallization of a trimethylaluminum gas with an oxidizing gas containing oxygen and moisture by a high-density plasma-enhanced CVD process, a catalytic CVD process (refer to Japanese Unexamined Patent Publication No. 63-40314), or the like. As the insulating substrate 1, a highly-heat-resistant glass substrate having a diameter of 8 to 12 inches and a thickness of 700 to 800 nm can be used.

With reference to FIG. 1C, a polycrystalline silicon film 5 having a thickness of several $\mu$m to 0.005 $\mu$m, for example, 0.1 $\mu$m, is deposited on the entire surface of the crystalline sapphire thin film 50 including the step differences 4 by a known catalytic CVD process, a plasma-enhanced CVD process, or a sputtering process. Although an amorphous silicon film may be formed in place of the polycrystalline silicon film 5, the polycrystalline silicon film 5 will be described as a typical example in this embodiment.

With reference to FIG. 1D, an indium film 6 is formed on the polysilicon film 5 by a MOCVD process, a sputtering process or a vacuum evaporation process using trimethylindium so that the thickness of the indium film 6 is, for example, 10 to 15 $\mu$m which is several ten to several hundred times the thickness of the polycrystalline silicon film 5.

The substrate 1 is heated in a hydrogen-based atmosphere, such as hydrogen, a nitrogen-hydrogen mixture, or an argon-hydrogen mixture to a temperature not higher than 1,000° C., preferably 900 to 930° C. for 5 minutes. The polycrystalline silicon 5 is thereby melted into the melt of the indium film 6. Silicon in the melt can be precipitated at a temperature which is significantly lower than the original precipitation temperature. The substrate 1 may be uniformly heated using an electrical furnace etc. Alternatively, predetermined regions, for example, the TFT-forming regions of the substrate 1 may be locally heated using laser or electron beams.

Figure 2E:
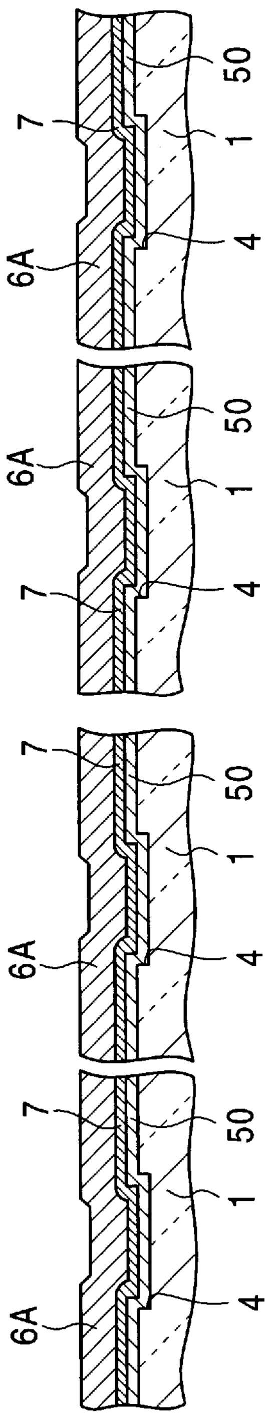

With reference to FIG. 2E, the substrate 1 is gradually cooled so that silicon dissolved in indium is heteroepitaxially grown by using the crystalline sapphire thin film 50 (furthermore, the bottom corner of each step difference 4) as a seed to deposit a P-type single-crystal silicon layer 7 having a thickness of, for example, approximately 0.1 $\mu$m.

Figure 8A:
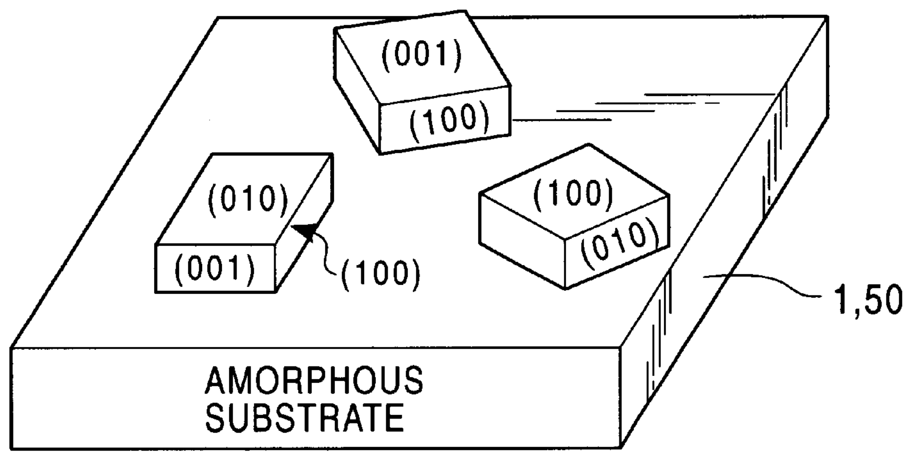
FIGS. 8A and 8B are schematic isometric views showing deposition of silicon crystals on an amorphous substrate.
Figure 8B:
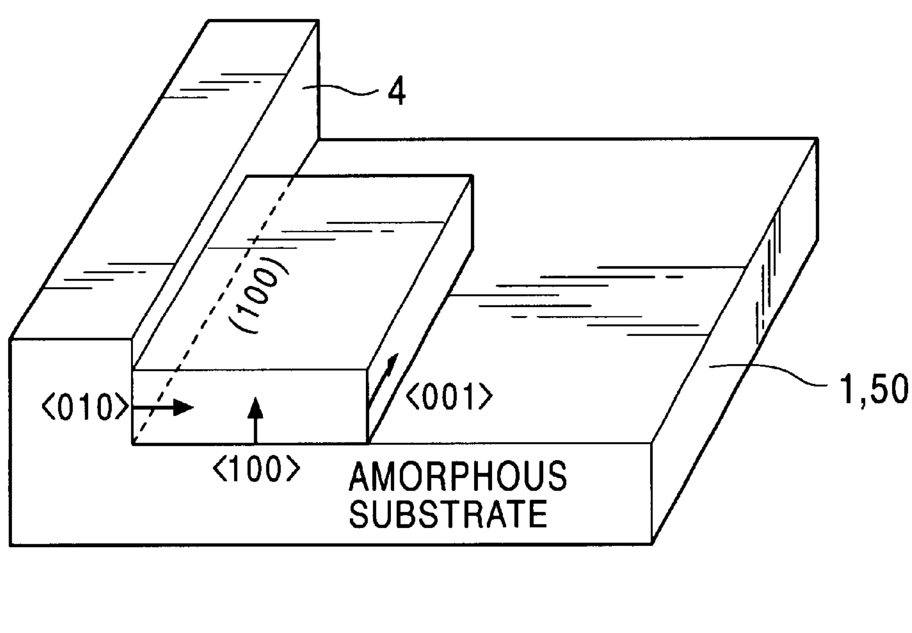
Figure 9A:
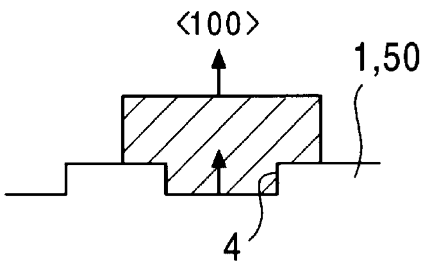
FIGS. 9A to 9F are cross-sectional views showing the shapes of the step difference and the orientation of the deposited silicon crystal in heteroepitaxy.
Figure 9B:
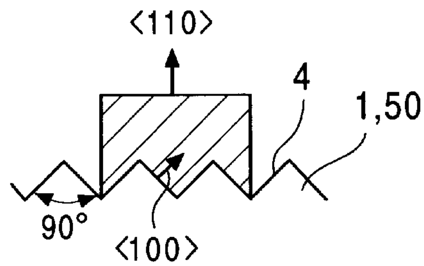
Figure 9C:
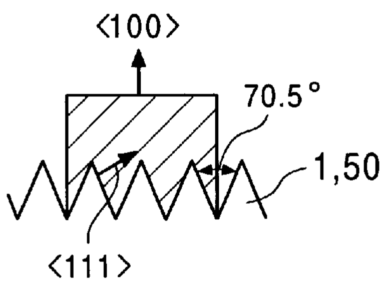
Figure 9D:
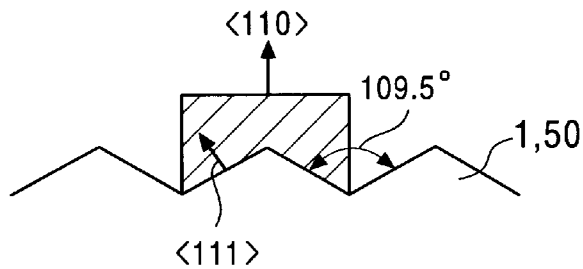
Figure 9E:
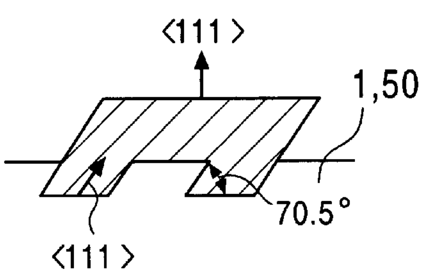
Figure 9F:
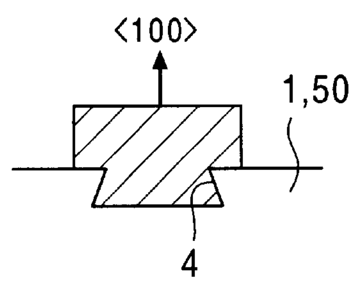

In the thus-deposited single-crystal silicon layer 7, for example, a (100) plane is heteroepitaxially grown on the substrate because the crystalline sapphire film 50 exhibits good lattice matching with single-crystal silicon. In this case, the step differences 4 also contribute to heteroepitaxy including a known phenomenon referred to as graphoepitaxy, thereby obtaining the single-crystal silicon layer 7 having higher crystallinity. With reference to FIGS. 8A and 8B, a vertical wall, such as the above-mentioned step differences 4, is formed on the amorphous substrate (glass) 1, and an epitaxial layer is formed thereon. As shown in FIG. 8B, the (100) plane of a single-crystal is grown along the side face of each of the step differences 4, whereas a crystal having random plane orientation is grown on a flat amorphous substrate 1, as shown in FIG. 8A. The size of the single-crystal grain increases in proportion to the temperature and the time. When the temperature is lowered or when the time is shortened, the distance between the step differences must be decreased. The orientation of the grown crystal can be controlled by changing the shape of the step differences, as shown in FIGS. 9A to 9F. When MOS transistors are formed, the (100) plane is most frequently used. Accordingly, the step differences 4 may have any cross-sectional shape having a specified plane which facilitates crystal growth. For example, the angle at the bottom corner (basilar angle) may be a right angle, or the side wall may be inclined inwardly or outwardly. The basilar angle of each of the step differences 4 is preferably 90° or less, and the bottom corner thereof is preferably slightly rounded.

Figure 2F:
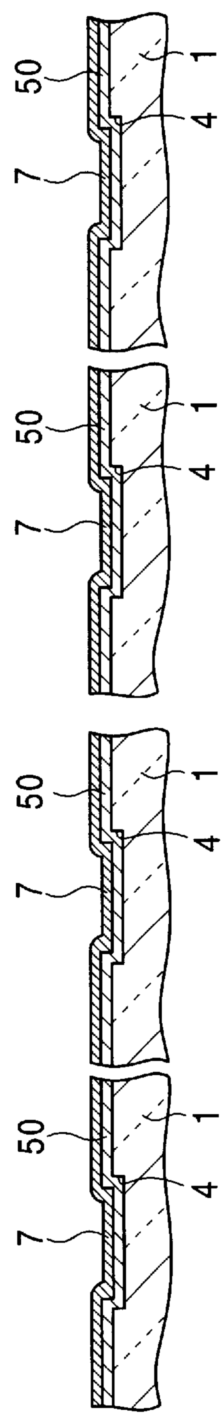

With reference to FIG. 2F, after the single-crystal silicon layer 7 is deposited on the substrate 1 by heteroepitaxy, the indium film 6A deposited on the surface is removed by resolution with hydrochloric acid or sulfuric acid. In this step, post-treatment is performed in order to avoid the formation of a low-grade silicon oxide film, to form a top-gate MOSTFT having a channel region comprising the single-crystal silicon layer 7.

Figure 2G:
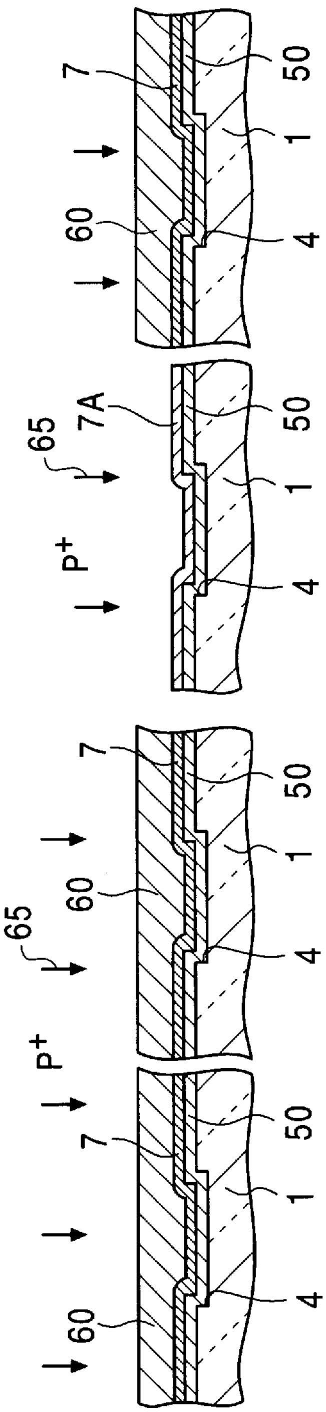

Since the single-crystal silicon layer 7 deposited by heteroepitaxy contains indium, the layer is a p-type layer. Since the concentration of the p-type impurity fluctuates, the p-channel MOSTFT sections are masked with a photoresist layer (not shown in the drawing) and are doped with p-type impurity ions such as $B^+$ at 10 kV and at a dose of $2.7\times10^{11}$ atoms/cm$^2$ to adjust specific resistance. With reference to FIG. 2G, in order to control the concentration of the impurity in the pMOSTFT-forming regions, the nMOSTFT sections are masked with a photoresist layer 60 and are doped with n-type impurity ions 65 such as $P^+$ at 10 kV and at a dose of $1\times10^{11}$ atoms/cm$^2$ to form n-type wells 7A.

Figure 3H:
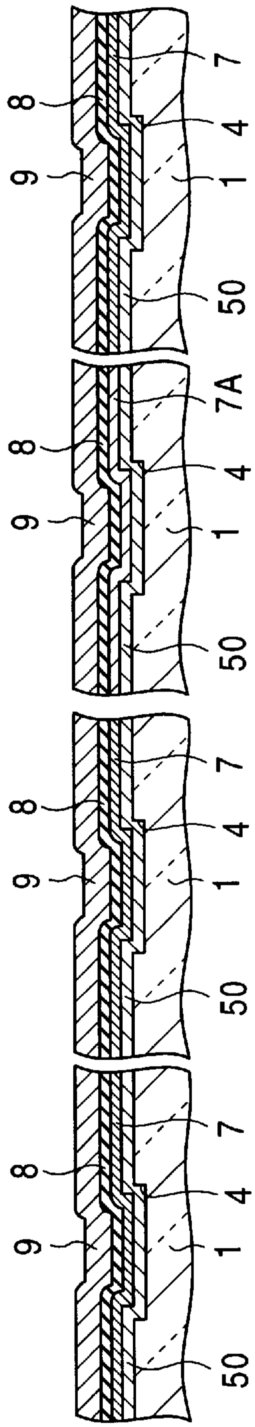

With reference to FIG. 3H, $SiO_2$ having a thickness of approximately 200 nm and SiN having a thickness of approximately 100 nm are continuously deposited in this order on the entire surface of the single-crystal silicon layer 7 by a plasma-enhanced CVD process, a high-density plasma-enhanced CVD process or a catalytic CVD process to form a gate insulating film 8. A molybdenum-tantalum (Mo—Ta) alloy film 9 having a thickness of 500 to 600 nm is formed thereon by a sputtering process.

Figure 3I:
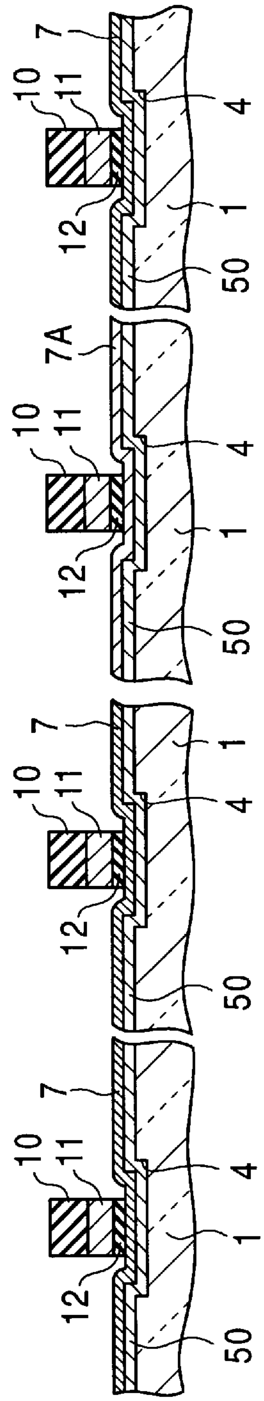

With reference to FIG. 3I, a photoresist pattern 10 is formed in the step difference regions (indented sections) of the TFT sections in the display region and of the TFT sections of the peripheral driving region by any conventional photolithographic process. By continuous etching, gate electrodes 11 of the Mo—Ta alloy and gate insulating films 12 of SiN-$SiO_2$ are formed, and the single-crystal silicon layer 7 is exposed. The Mo—Ta alloy film 9 is etched with an acidic solution, SiN is etched by plasma etching with $CF_4$ gas, and $SiO_2$ is etched with a hydrofluoric acid solution.

Figure 3J:
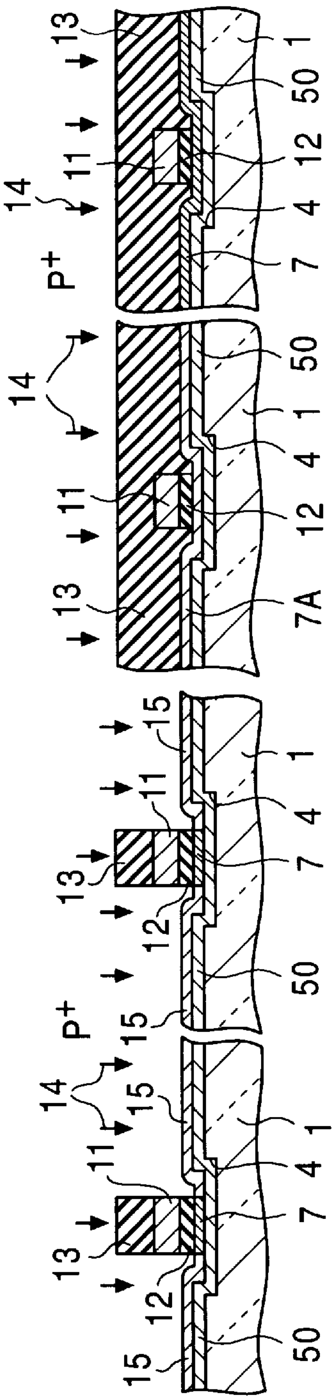

With reference to FIG. 3J, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 4K:
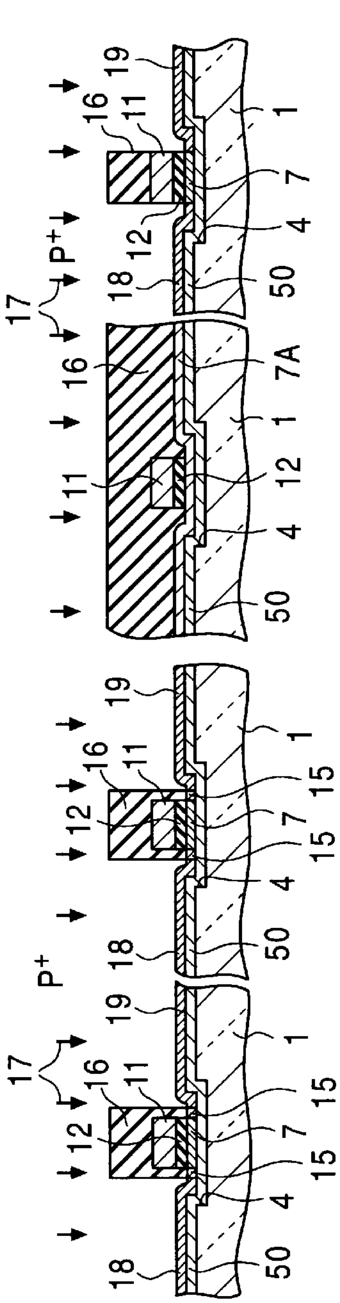

With reference to FIG. 4K, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^5$ atoms/cm$^2$ to form source sections 18, drain sections 19 and the LDD sections 15 of $N^+$-type layers of the nMOSTFTs.

Figure 4L:
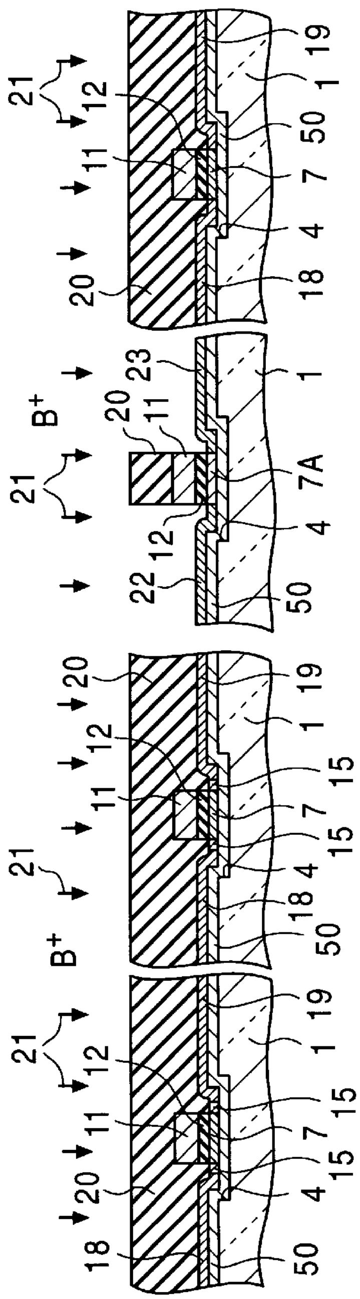

With reference to FIG. 4L, all of the nMOSTFTs in the peripheral driving region and the display region and the gate sections of the pMOSTFTs in the peripheral driving region are covered with a photoresist layer 20. The exposed regions are doped with boron ions 21 by ion implantation at 10 kV and at a dose of $5 \times 10^{15}$ atoms/cm$^2$ to form source sections 22 and drain sections 23 of $P^+$-type layers of the pMOSTFTs. In the case of an nMOS peripheral driving circuit, this step is not necessary since the circuit does not have a pMOSTFT.

Figure 4M:
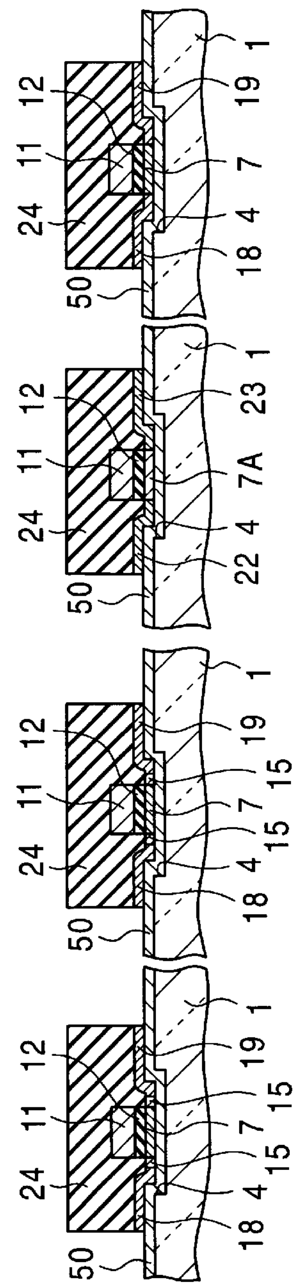

With reference to FIG. 4M, in order to island the active device sections including TFTs and diodes and the passive device sections including resistors and inductors, photoresist layers 24 are provided on all of the active device sections and the passive device sections in the peripheral driving section and the display section, and the single-crystal silicon layer 7 in other sections is removed by a conventional photolithographic process and etching process using a hydrofluoric acid etching solution.

Figure 5N:
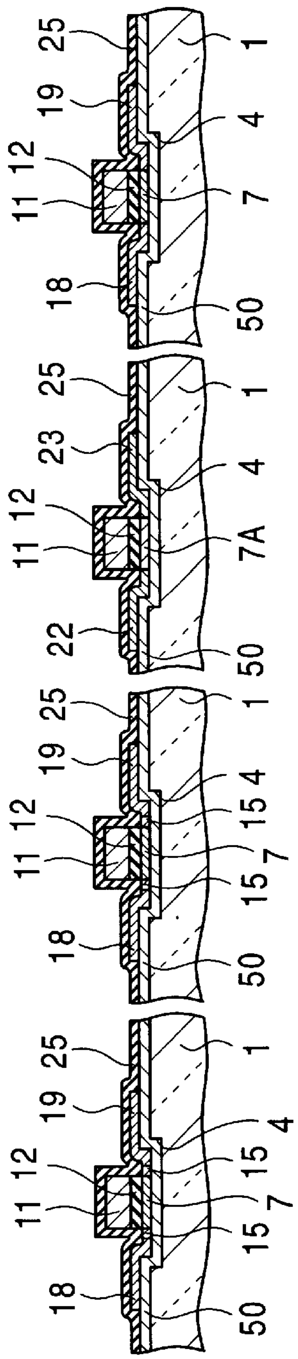
Figure 5O:
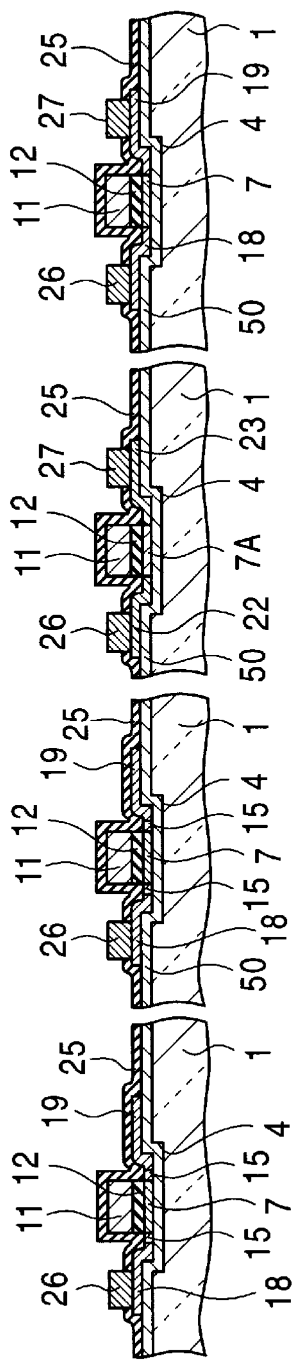

With reference to FIG. 5N, a $SiO_2$ film having a thickness of approximately 200 nm and a phosphosilicate glass (PSG) film having a thickness of approximately 300 nm are continuously deposited in this order to form a protective film 25 on the entire surface by a plasma-enhanced CVD process, a high-density plasma-enhanced CVD process or a catalytic CVD process.

In this state, the single-crystal silicon layer is activated. Since activation is performed at approximately 1,000° C. for approximately 10 seconds using, for example, a halogen lamp or the like. The gate electrode material composed of the Mo—Ta alloy having a high melting point is durable during the annealing for activation. The gate electrode material can thus be used for not only the gate sections but also lead lines over a wide range. In the activation, expensive excimer laser annealing is generally not used. If excimer laser annealing is used, overlapping scanning of 90% or more is preferably performed on the entire surface or selectively the active device sections and the passive device sections using XeCl (wavelength: 308 nm).

With reference to FIG. 50, contact holes are formed in all of the source-drain sections of the TFTs in the peripheral driving circuit and the source sections of the TFTs in the display region, by a conventional photolithographic process and an etching process.

A sputtered film of aluminum, an aluminum alloy, for example, aluminum containing 1% Si or containing 1 to 2% copper, copper, or the like, which has a thickness of 500 to 600 nm, is formed on the entire surface. By a conventional photolithographic process and an etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Figure 5P:
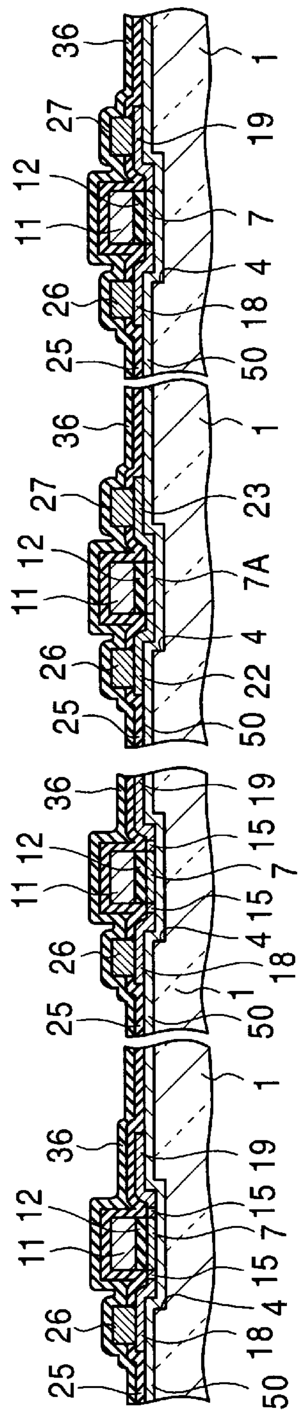

With reference to FIG. 5P, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed in the drain sections of TFTs in the display region. It is not necessary to remove the $SiO_2$, PSG and SiN films in the pixel sections.

Figure 6Q:
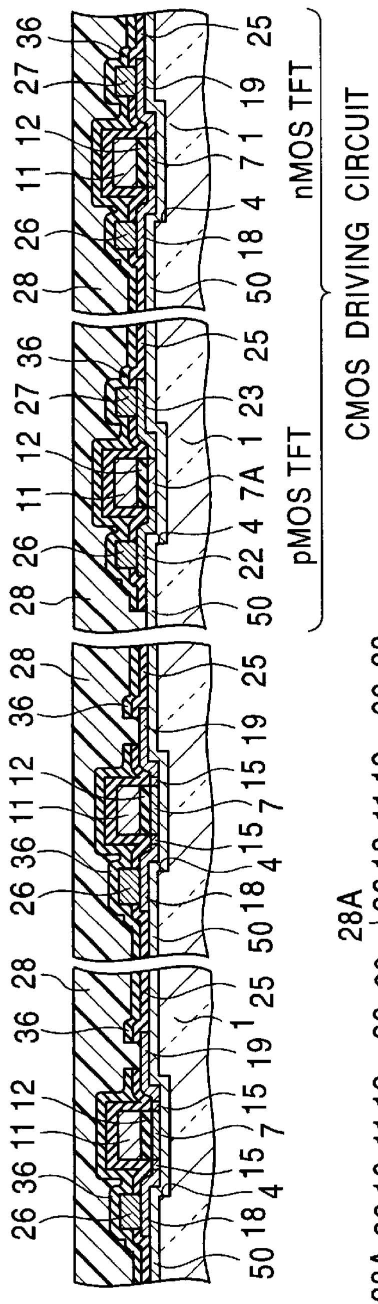
Figure 6R:
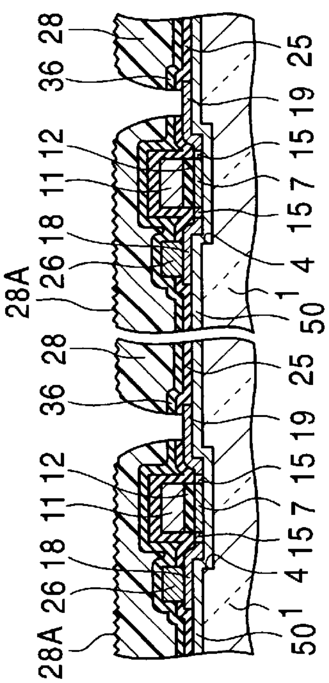

Basic requirements of a reflective liquid crystal display are to reflect incident light incident towards the interior of the liquid crystal panel and to scatter the light, because the direction of the incident light is uncertain although the position of the observer with respect to the display is substantially fixed. Thus, a reflector must be designed on the assumption that a point light source is located at any position. As shown in FIG. 6Q, a photosensitive resin film 28 having a thickness of 2 to 3 $\mu$m is formed on the entire surface by spin coating. Next, as shown in FIG. 6R, an uneven pattern is formed in at least the pixel region by a conventional photolithographic process and an etching process so that the pixel section has optimized reflective characteristics and viewing-angle characteristics. The uneven pattern is subjected to reflow to form a lower portion of the reflective face of an uneven surface 28A. At the same time, contact holes are formed in the resin film in the drain sections of TFTs in the display region.

Figure 6S:
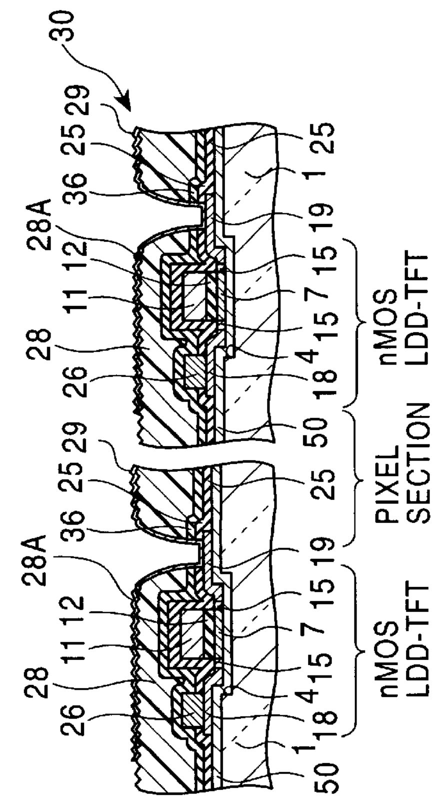

With reference to FIG. 6S, a sputtered film of aluminum, aluminum containing 1% Si, or the like, which has a thickness of 400 to 500 nm, is deposited on the entire surface. The sputtered film is removed from regions other than the pixel sections by a general photolithographic process and an etching process to form uneven aluminum reflective sections 29 which are connected to the drain sections 19 of the display TFTs. The reflective sections 29 are used as pixel electrodes for displaying. Next, these are subjected to sintering at approximately 300° C. for 1 hour in a forming gas to achieve sufficient contact. Silver or a silver alloy may be used instead of the aluminum system to increase the reflectance.

As described above, the single-crystal silicon layer 7 is formed by high-temperature heteroepitaxy using the sapphire thin film 50 including the step differences 4 as the seed, and CMOS circuits each comprising top-gate nMOSLDD-TFT, pMOSTFT, and nMOSTFT are formed in each of the display section and the peripheral-driving-circuit section each comprising the single-crystal silicon layer 7, to produce an active matrix substrate 30 in which the display section and the peripheral-driving-circuit section are integrated.

Figure 7:
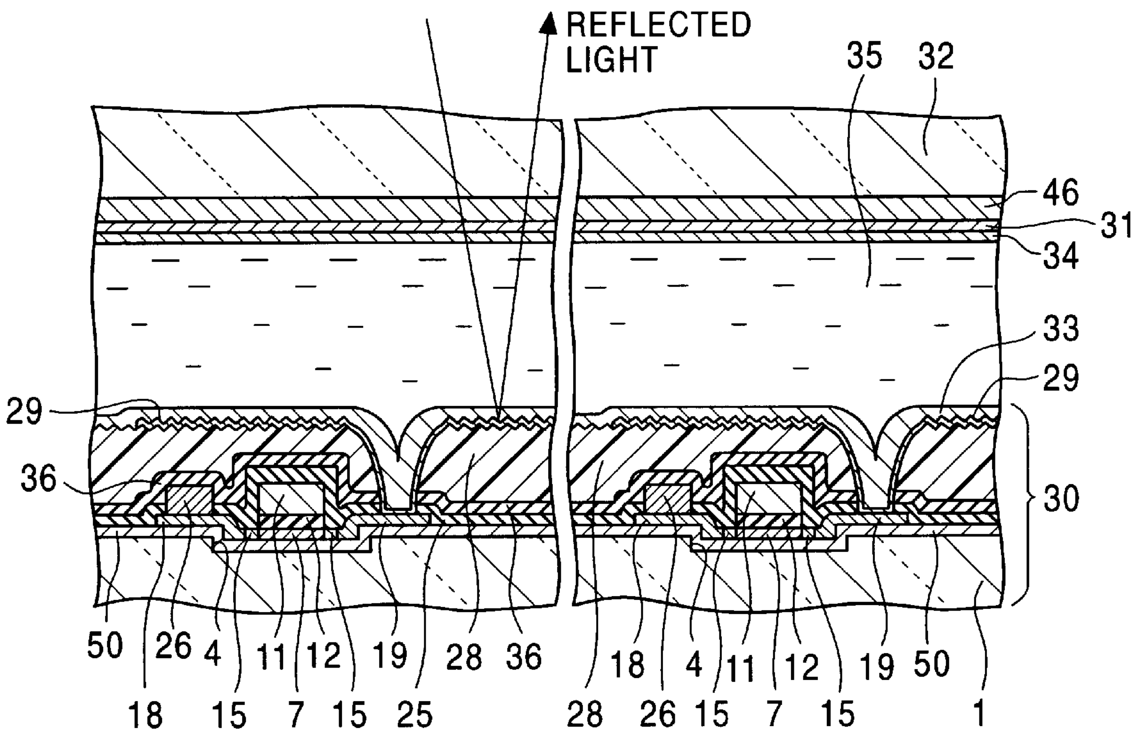
FIG. 7 is a cross-sectional view illustrating a main portion of the liquid crystal display (LCD) in accordance with the present invention.

With reference to FIG. 7, a method for making a reflective liquid crystal display (LCD) using the active-matrix substrate (driving substrate) 30 will now be described. Hereinafter, the active-matrix substrate is referred to as a TFT substrate.

When a liquid crystal cell in this LCD is produced by double-side assembly (suitable for medium to large liquid crystal panels of 2 inches or more), polyimide alignment films 33 and 34 are formed one the TFT substrate 30 and the device-forming surface of a counter electrode 32 on the entire surface of which a solid indium tin oxide (ITO) electrode 31 is provided, respectively. The polyimide alignment films are formed by roll coating or spin coating so that thicknesses are in a range of 50 to 100 nm and are cured at 180° C. for 2 hours.

The TFT substrate 30 and the counter substrate 32 are aligned by rubbing or by an optical method. Rubbing may be performed by using a cotton or rayon rubbing puff. Cotton is preferable in view of dust produced by rubbing and retardation. In optical alignment, liquid crystal molecules are aligned by noncontact linearly polarized UV light irradiation. The polymer alignment film can also be formed by polarized or unpolarized light which is diagonally incident. Among such polymer films are polymethyl methacrylate polymers containing azobenzene.

After washing with water or isopropyl alcohol to remove the rubbing dust, a common material is applied to the TFT substrate 30 whereas a sealing agent is applied to the counter electrode 32. The common material may be an acrylic, an epoxy-acrylate or epoxy adhesive containing a conductive filler. The sealing agent may be an acrylic, an epoxy-acrylate or epoxy adhesive. Curing may be performed by heating, UV irradiation, or a combination thereof. A combination of heating and UV irradiation is preferable due to high superposition accuracy and workability.

Spacers are distributed on the counter substrate 32 to form a given gap, and the counter substrate 32 is overlapped with the TFT substrate 30 so that an alignment mark of the counter substrate 32 is precisely aligned to an alignment mark of the TFT substrate 30. Then, the sealing agent is preliminarily cured by UV irradiation, and then cured by heating.

A single liquid crystal panel is formed by scribing the composite of the TFT substrate 30 and the counter electrode 32.

The gap between the two substrates 30 and 32 is filled with a liquid crystal 35. The injection port is sealed with an UV-curable adhesive and washed with isopropyl alcohol. Any type of liquid crystal may be used, and, for example, a nematic liquid crystal used in a twisted nematic (TN) mode having high-speed response is generally used.

The liquid crystal 35 is aligned by heating and rapid cooling treatment.

Flexible lead lines are connected to the panel electrode extraction section of the TFT substrate 30 by thermal compressive bonding using an anisotropic conductive film, and then a polarizer is bonded to the counter electrode 32.

When the liquid crystal panel is produced by single-side assembly (suitable for compact liquid crystal panels of 2 inches or less), polyimide alignment films 33 and 34 are formed on one surface of the TFT substrate 30 and one surface of the counter electrode 32, respectively, on which devices are formed, and then both substrates 30 and 32 are aligned by rubbing or noncontact optical alignment using linearly polarized UV light.

The TFT substrate 30 and the counter substrate 32 are divided into segments by dicing or scribing and are washed with water or isopropyl alcohol. A common material is applied to each divided TFT substrate 30 whereas a sealing agent containing spacers is applied to each counter substrate 32. Both substrates are combined with each other. The subsequent process is substantially the same as above.

The counter substrate 32 of the reflective LCD is a color filter (CF) substrate having a color filter layer 46 provided below the ITO electrode 31. Incident light from the counter substrate 32 is effectively reflected by the reflective film 29 and is emitted from the counter substrate 32.

Besides the above-described substrate structure shown in FIG. 7, in an on-chip color filter (OCCF) structure TFT substrate comprising a color filter provided on the TFT substrate 30, an ITO electrode or an ITO electrode with a black mask is directly bonded to the counter electrode 32.

When the auxiliary capacitors ($C_s$) shown in FIG. 12 are provided in the pixel section, a dielectric layer (not shown in the drawing) provided on the substrate 1 is connected to the drain regions 19 of the single-crystal silicon.

As described above, this embodiment has the following noticeable advantages.

(a) The step differences 4 having a predetermined size and a shape are formed on the substrate 1, and the single-crystal silicon thin film 7 is deposited by high-temperature heteroepitaxy using the crystalline sapphire thin film 50 formed on the substrate 1 as a seed (heating during the heteroepitaxy is performed at a relatively low temperature or 900 to 930° C.). As a result, the single-crystal silicon thin film 7 has a high electron mobility of 540 $cm^2$/v.sec or more which enables production of a LCD with built-in high-performance drivers. Since the step differences 4 promote heteroepitaxy, the single-crystal silicon thin film 7 having higher crystallinity can be obtained.

(b) The single-crystal silicon thin film has higher electron or hole mobility, comparable with that of a single-crystal silicon substrate and is higher than that of conventional amorphous or polycrystalline silicon thin films. Therefore, an integrated configuration of the display section and the peripheral-driving-circuit section can be formed, in which nMOS, pMOS, or cMOS top-gate TFTs of a LDD structure in the display section have high switching characteristics and a low leakage current, and top-gate TFTs of cMOS, nMOS, cMOS, or a combination thereof in the peripheral-driving-circuit section have high driving ability. Thus, the display panel has high image quality, high definition, a narrow frame, a large screen and a high luminescent efficiency. Since the single-crystal silicon layer 7 has sufficiently high hole mobility, the peripheral driving circuits can drive by using only electrons or holes, or a combination thereof. Therefore, a panel can be realized, in which the peripheral driving circuits are integrated with the nMOS, pMOS or cMOS display TFTs having the LDD structure. In a compact to medium panel, one of a pair of vertical peripheral driving circuits may be omitted.

(c) The polycrystalline or amorphous silicon layer 5 can be formed by a plasma-enhanced CVD process or a reduced-pressure CVD process at a substrate temperature of 100 to 400° C. The low-melting-point metal layer 6 can be formed by a vacuum evaporation process or a sputtering process. In addition, heating during heteroepitaxy can be performed at 930° C. or less. Thus, the single-crystal silicon layer 7 can be uniformly formed on the insulating substrate at a relatively low temperature of, for example, 900 to 930° C. or less. Quartz glass, crystallized glass or ceramic can be used as a substrate.

(d) Since this process does not require long-term annealing at a medium temperature nor excimer annealing, which is essential for solid phase epitaxy, this process has high productivity and does not require expensive facilities, resulting in reduced production cost.

(e) In the high-temperature heteroepitaxy, single-crystal silicon thin films having a variety of p-type impurity concentrations and high mobility can be readily produced by controlling the crystallinity of the crystalline sapphire thin film, the ratio of indium to silicon, the shape of the step differences, the heating temperature of the substrate, the cooling rate, and the concentrations of n-type or p-type carrier impurities. Thus, the threshold voltage ($V_{th}$) can be readily controlled, and the resulting low resistance enables high-speed operations.

(f) When a color filter is provided on the display array, improvements in the aperture ratio of the display panel and the luminance, and cost reduction due to omission of a color filter substrate and improved productivity can be realized.

(g) Since the crystalline sapphire thin film functions as a diffusion barrier to various atoms, diffusion of impurities from the glass substrate can be suppressed.

Second Embodiment

FIGS. 14A to FIG. 20V show a second embodiment of the present invention.

The second embodiment is the same as the first embodiment except that a bottom-gate MOSTFT comprising a single-crystal silicon layer heteroepitaxially grown from indium-silicon using a material layer as a seed is used for forming the peripheral-driving-circuit section of an active-matrix reflective liquid crystal display (LCD).

With reference to FIGS. 14A to 20V, the method in the second embodiment will be described based on the production steps. In FIGS. 14A to 20V, the left side of each drawing shows the production step of the display section and the right side shows the production step of the peripheral-driving-circuit section.

Figure 14A:
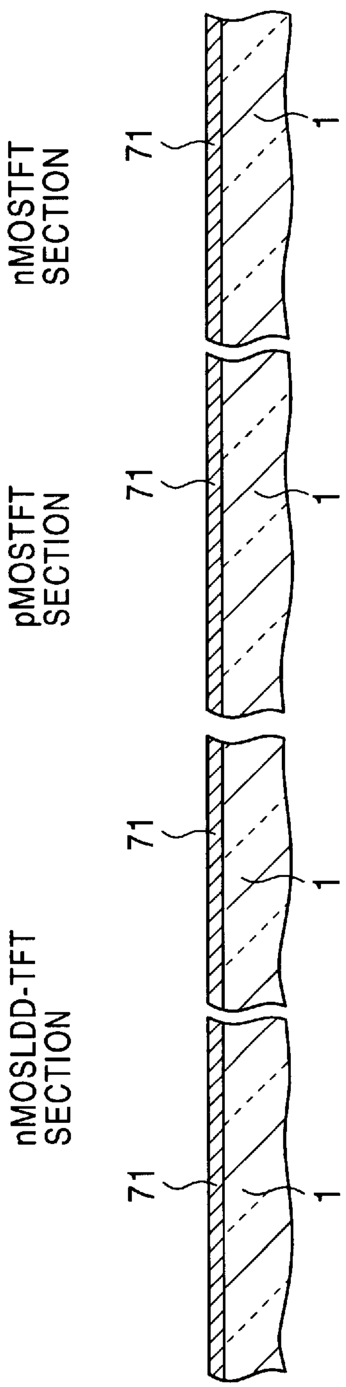
FIGS. 14A to 14C, 15D to 15G, 16H to 16J, 17K to 17M, 18N to 18P, 19Q to 19S, and 20T to 20V are cross-sectional views illustrating production steps of a liquid crystal display (LCD) in accordance with a second embodiment of the present invention.

With reference to FIG. 14A, a molybdenum-tantalum (Mo—Ta) alloy film 71 having a thickness of 500 to 600 nm is formed by sputtering on a main surface of an insulating substrate 1 made of quartz glass, transparent crystallized glass, or the like.

Figure 14B:
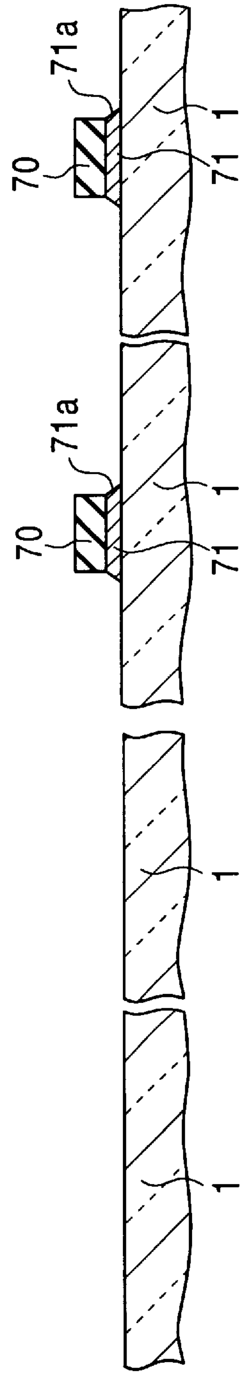

With reference to FIG. 14B, a photoresist layer 70 having a given pattern is formed on the sputtered Mo—Ta film 71, and the Mo—Ta film 71 is taper-etched by using the photoresist layer 70 as a mask to form gate electrodes 71 each having a trapezoidal side base 71*a* gently inclined at an angle of 20 to 45 degrees.

Figure 14C:
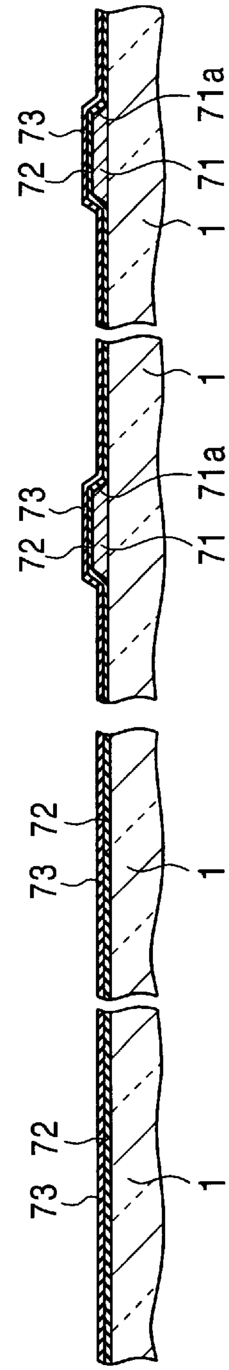

With reference to FIG. 14C, after the photoresist layer 70 is removed, a SiN film 72 having a thickness of approximately 100 nm and a $SiO_2$ film 73 having a thickness of approximately 200 nm are deposited in this order on the substrate 1 including the molybdenum-tantalum alloy film 71 by a plasma-enhanced CVD process to form a gate insulating film.

Figures 15D, 15E, 15F, 15G:
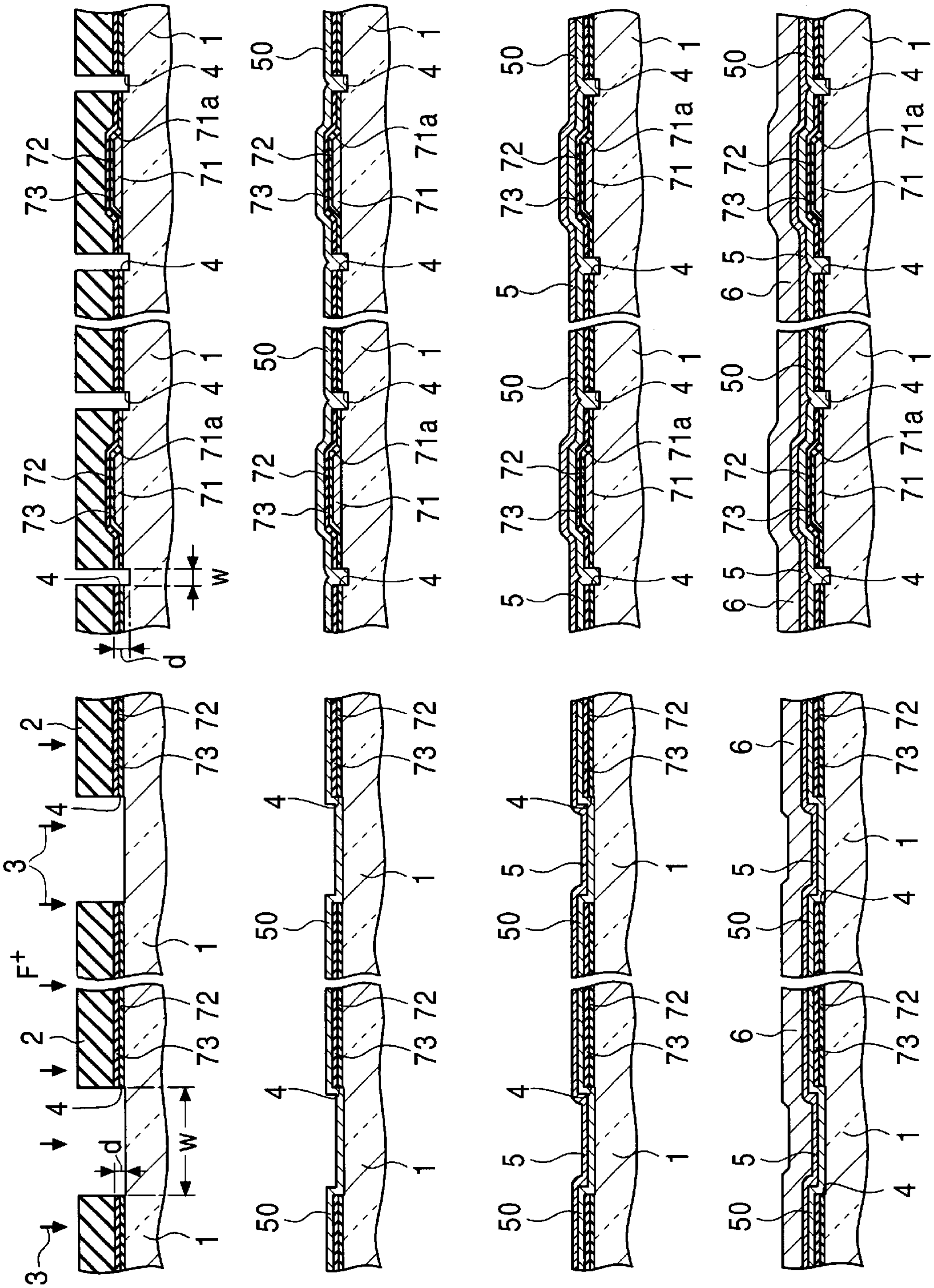

With reference to FIG. 15D, a photoresist layer 2 having a given pattern is formed in at least the TFT-forming regions, and a plurality of step differences 4 having a proper shape and size are formed in the gate insulating film and the substrate 1 through a mask of the photoresist layer 2 in the same manner as in the first embodiment.

With reference to FIG. 15E, after the photoresist layer 2 is removed, a crystalline sapphire film 50 having a thickness of 20 to 200 nm is formed in at least the TFT-forming regions including the step differences 4 on one main surface of the insulating substrate 1 by the same method as the first embodiment.

With reference to FIG. 15F, a polycrystalline silicon film 5 having a thickness of several $\mu$m to 0.005 $\mu$m (for example 0.1 $\mu$m) is deposited at a substrate temperature of 100 to 400° C. by the same method as the first embodiment.

With reference to FIG. 15G, an indium film 6 is formed on the polycrystalline silicon film 5 so that the thickness is, for example, 10 to 15 $\mu$m which is several ten to several hundred times the thickness of the polycrystalline silicon film 5 in the same manner as the first embodiment.

The substrate 1 is next maintained in a hydrogen atmosphere at a temperature of 1,000° C. or less and preferably 900 to 930° C. for approximately 5 minutes so that the polycrystalline silicon film 5 is dissolved into a melt of the indium 6.

Figure 16H:
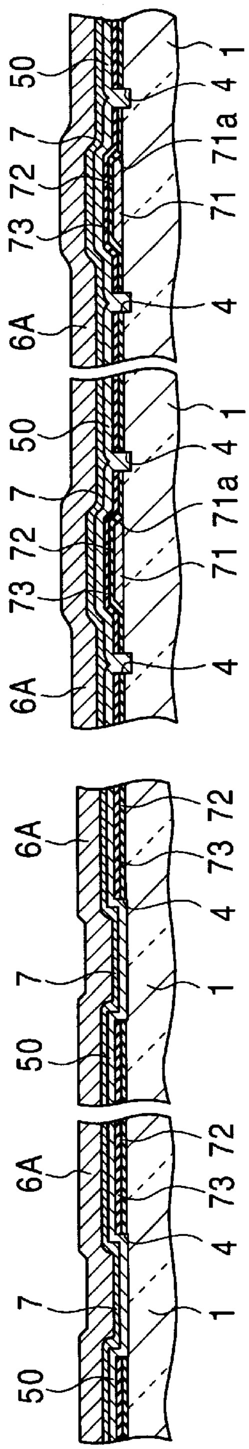

With reference to FIG. 16H, the substrate 1 is gradually cooled so that silicon dissolved in indium is heteroepitaxially grown by using the crystalline sapphire film 50 (furthermore, the bottom corner of each step difference 4) as a seed to deposit a P-type single-crystal silicon layer 7 having a thickness of, for example, approximately 0.1 $\mu$m.

Figure 16I:
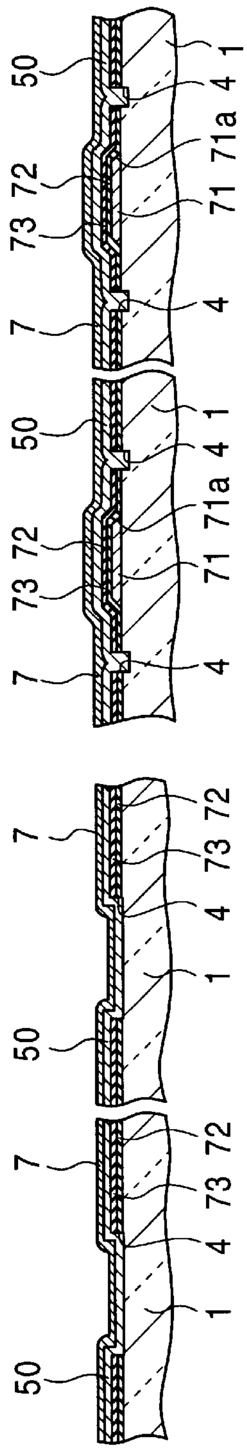

With reference to FIG. 16I, after the single-crystal silicon layer 7 is deposited on the substrate 1 by heteroepitaxy, the indium film 6A deposited on the surface is removed by resolution with hydrochloric acid or sulfuric acid to form a bottom-gate or top-gate MOSTFT having a channel region comprising the single-crystal silicon layer 7.

Figure 16J:
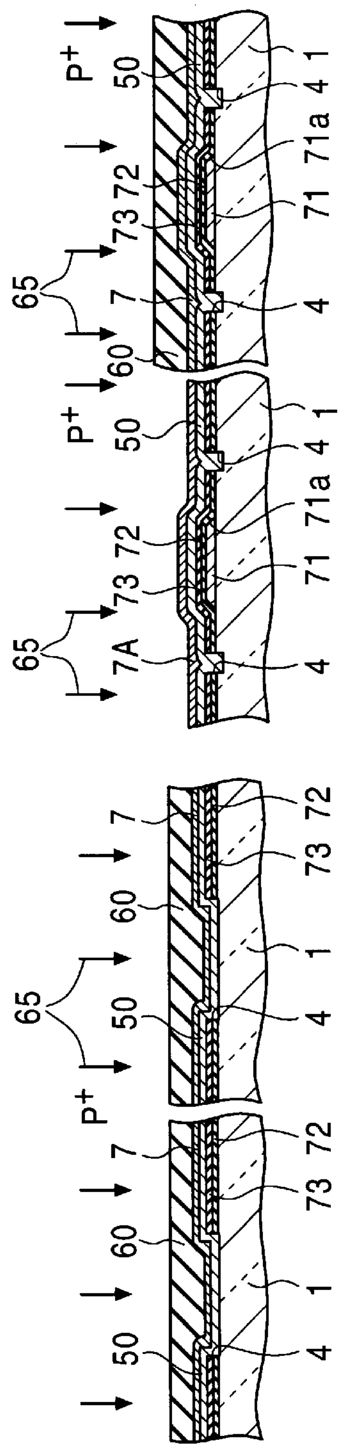

Since the concentration of the p-type impurity fluctuates, the p-channel MOSTFT sections are masked with a photoresist layer (not shown in the drawing) and are doped with p-type impurity ions such as $B^+$ at 10 kV and at a dose of $2.7\times10^{11}$ atoms/cm$^2$ to adjust specific resistance. With reference to FIG. 16J, in order to control the concentration of the impurity in the pMOSTFT-forming regions, the nMOSTFT sections are masked with a photoresist layer 60 and are doped with n-type impurity ions 65 such as $P^+$ at 10 kV and at a dose of $1\times10^{11}$ atoms/cm$^2$ to form n-type wells 7A.

Figure 17K:
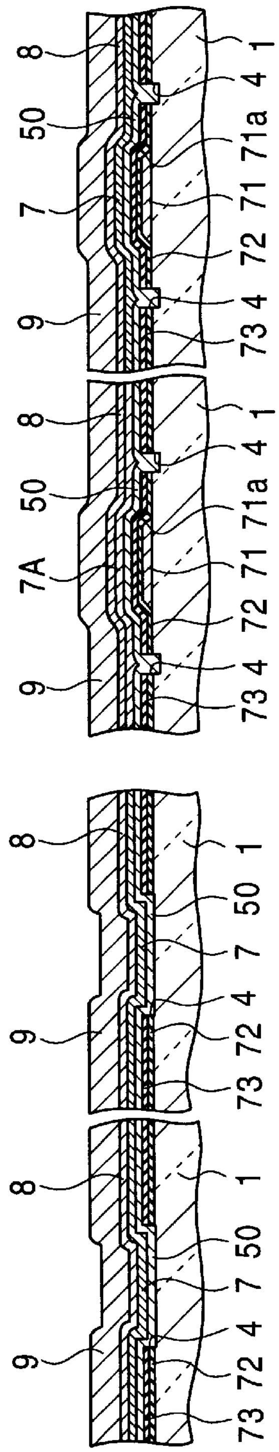

With reference to FIG. 17K, $SiO_2$ having a thickness of approximately 200 nm and SiN having a thickness of approximately 100 nm are continuously deposited in this order on the entire surface of the single-crystal silicon layer 7, and a molybdenum-tantalum (Mo—Ta) alloy film 9 having a thickness of 500 to 600 nm is formed thereon by the same method as the first embodiment.

Figure 17L:
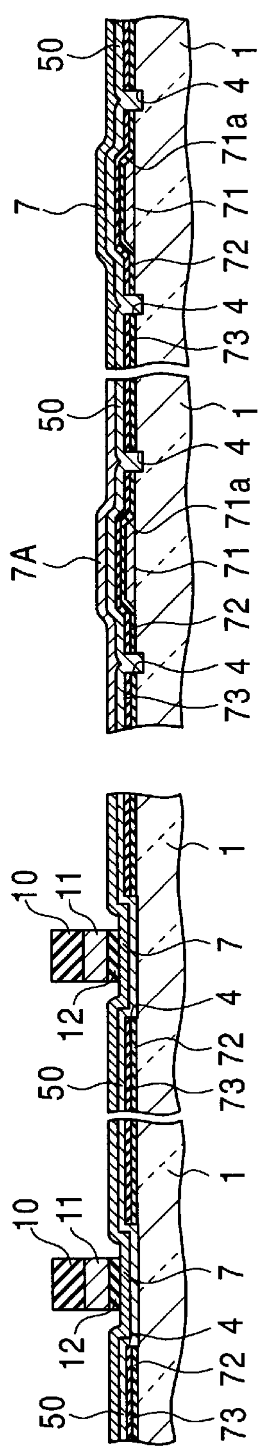

With reference to FIG. 17L, a photoresist pattern 10 is formed in the step difference regions (indented sections) of the TFT sections in the display region by any conventional photolithographic process. By continuous etching, gate electrodes 11 of the Mo—Ta alloy and gate insulating films 12 of SiN13 $SiO_2$ are formed, and the single-crystal silicon layer 7 is exposed.

Figure 17M:
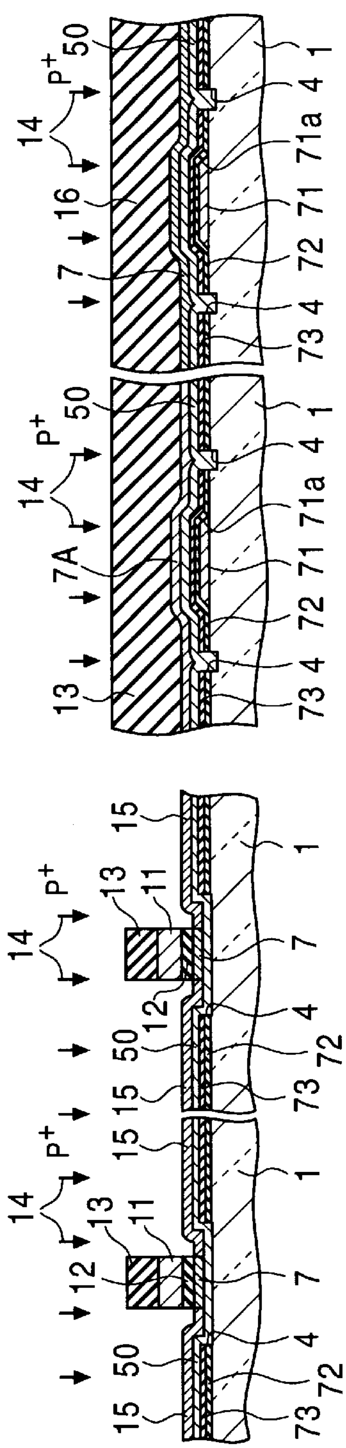

With reference to FIG. 17M, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 18N:
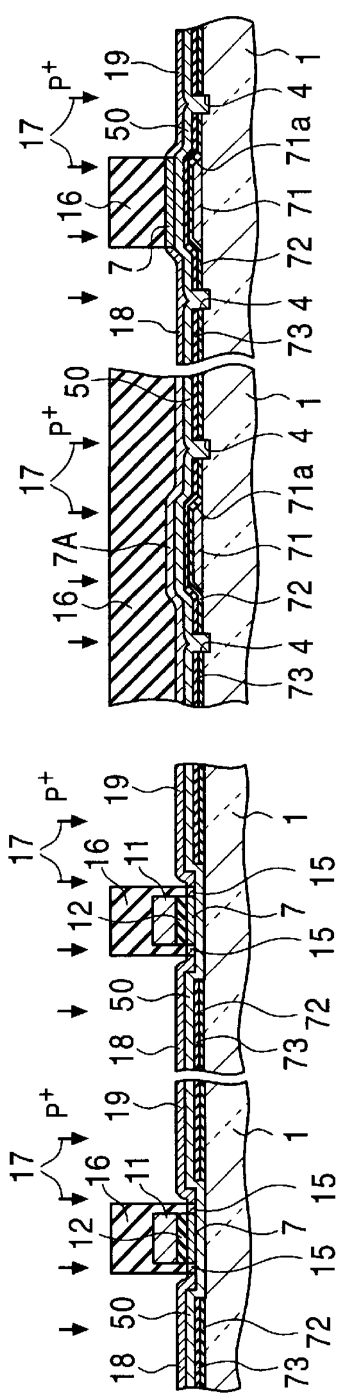
Figure 18O:
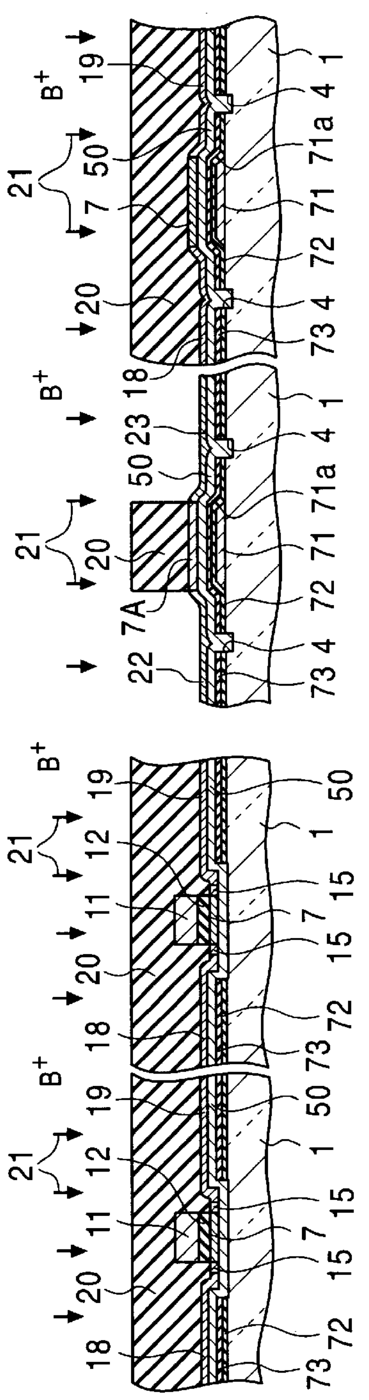

With reference to FIG. 18N, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs.

With reference to FIG. 180, all of the nMOSTFTs in the peripheral driving region and the display region and the gate sections of the pMOSTFTs in the peripheral driving region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 18P:
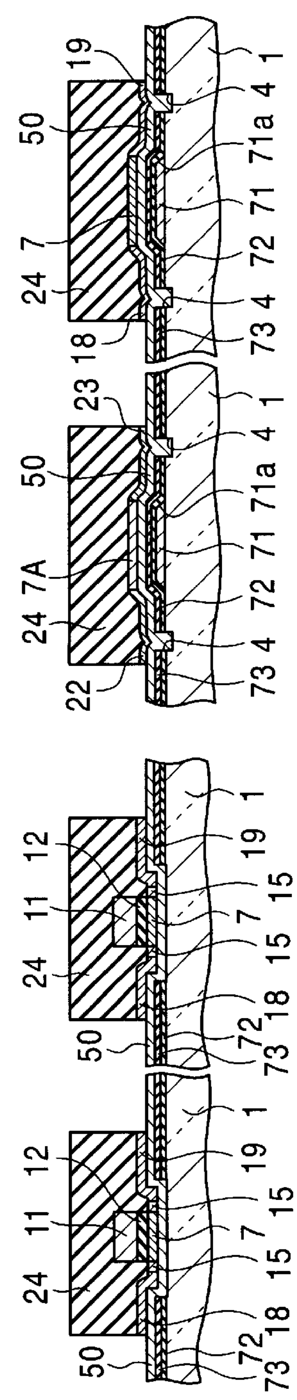

With reference to FIG. 18P, in order to island the active device sections including TFTs and diodes and the passive device sections including resistors and inductors, photoresist layers 24 are provided on all of the active device sections and the passive device sections in the peripheral driving section and the display section, and the single-crystal silicon layer 7 in other sections is removed by the same method as the first embodiment.

Figure 19Q:
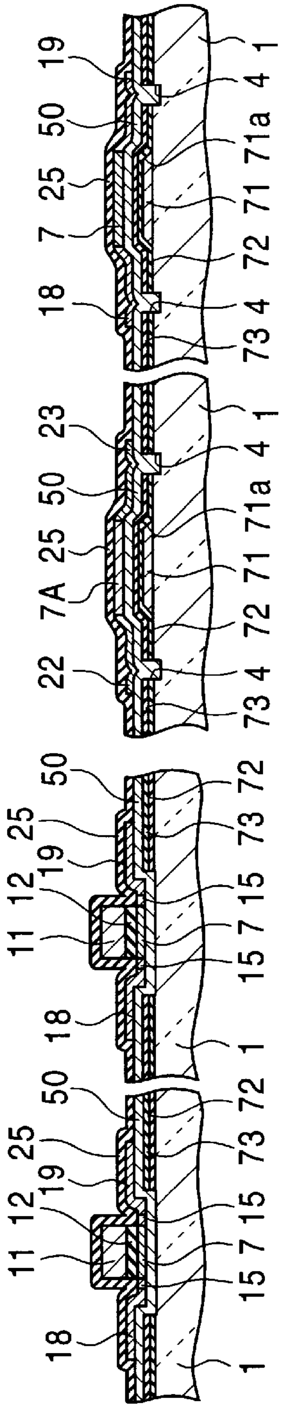

With reference to FIG. 19Q, a $SiO_2$ film having a thickness of approximately 200 nm and a phosphosilicate glass (PSG) film having a thickness of approximately 300 nm are continuously deposited in this order to form a protective film 25 on the entire surface.

In this state, the single-crystal silicon layer is activated in the same manner as the first embodiment.

Figure 19R:
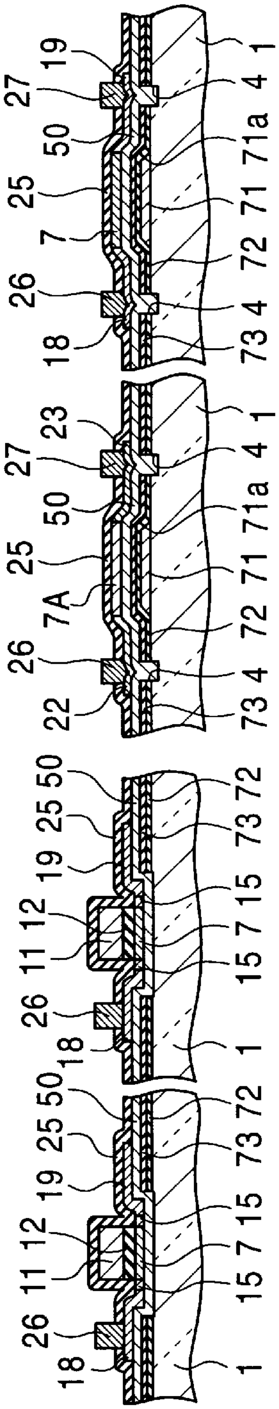

With reference to FIG. 19R, contact holes are formed in all of the source-drain sections of the TFTs in the peripheral driving circuit and the source sections of the TFTs in the display region.

A sputtered film of aluminum, an aluminum alloy, for example, aluminum containing Si or copper, copper, or the like is formed on the entire surface, and source electrodes 26 of all TFTs in the peripheral driving circuit section and the display section and drain electrodes 27 in the peripheral driving circuit section are formed by the same method as the first embodiment. At the same time, data lines and gate lines are formed, and then these are subjected to sintering.

Figure 19S:
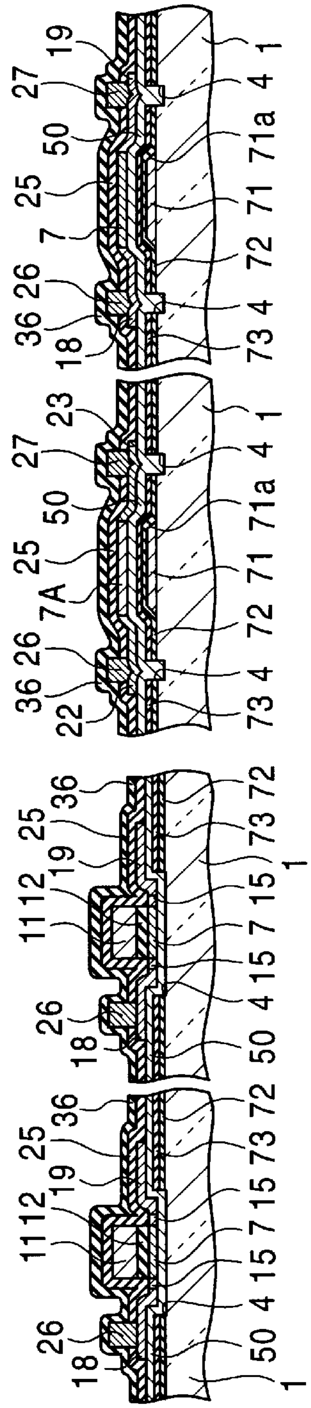

With reference to FIG. 19S, an insulating film 36 composed of a PSG film with a thickness of approximately 300 nm and a SiN film with a thickness of approximately 300 nm is formed on the entire surface, and then contact holes are formed in the drain sections of TFTs in the display region in the same manner as the first embodiment.

Figures 20T, 20U, 20V:
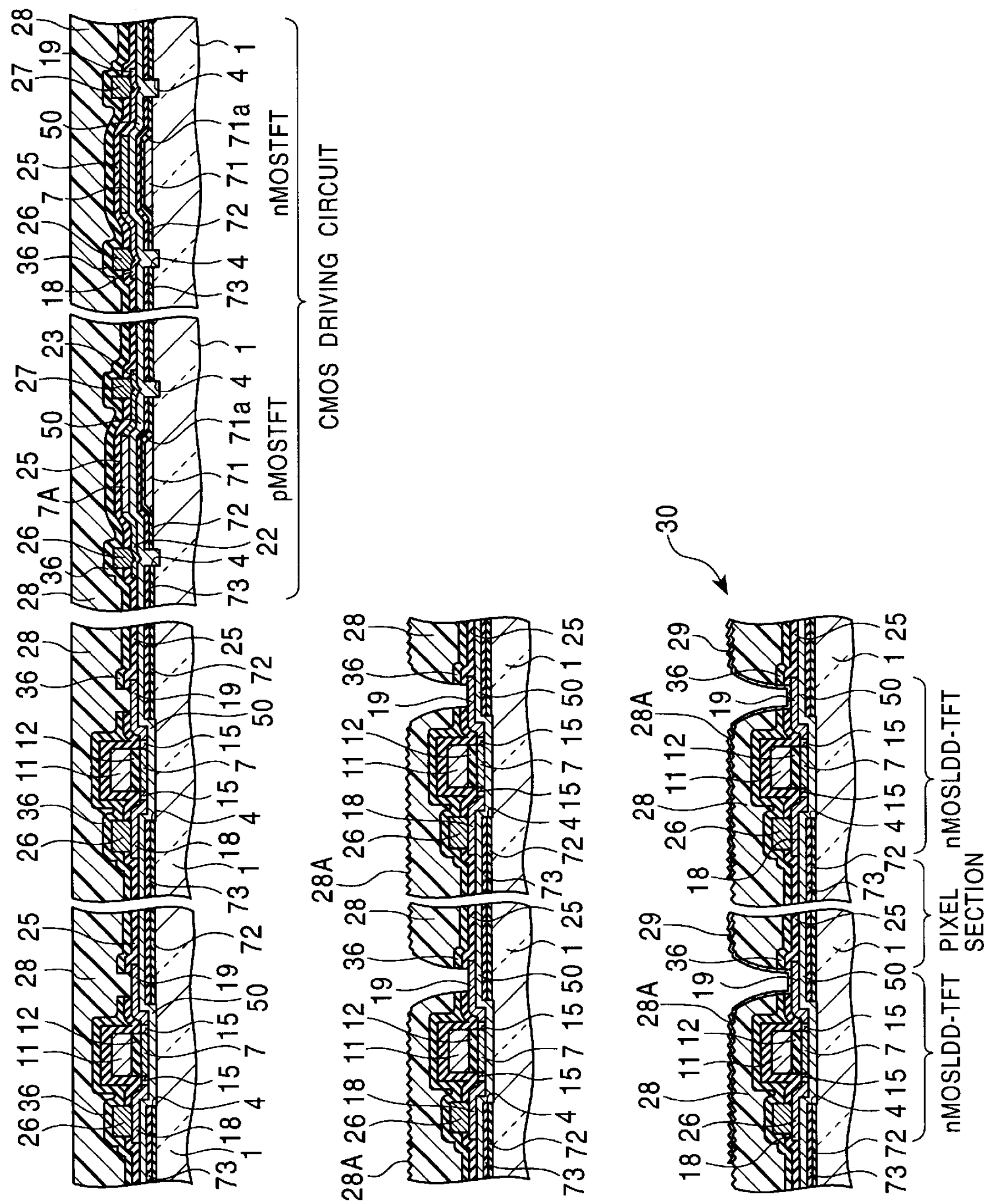

For the same reason as described above in the first embodiment, a reflector must be designed on the assumption that a point light source is located at any position. As shown in FIG. 20T, a photosensitive resin film 28 having a thickness of 2 to 3 μm is formed on the entire surface by spin coating. Next, as shown in FIG. 20U, an uneven pattern is formed in at least the pixel region and then subjected to reflow to form a lower portion of the reflective face of an uneven surface 28A by the same method as the first embodiment. At the same time, contact holes are formed in the resin film in the drain sections of TFTs in the display region.

With reference to FIG. 20V, a sputtered film of aluminum, aluminum containing Si, or the like, which has a thickness of 400 to 500 nm, is deposited on the entire surface, and then removed from regions other than the pixel sections by a general photolithographic process and an etching process to form uneven aluminum reflective sections 29 which are connected to the drain sections 19 of the display TFTs. Next, these are subjected to sintering at approximately 300° C. for 1 hour in a forming gas to achieve sufficient contact.

As described above, the single-crystal silicon layer 7 is formed by high-temperature heteroepitaxy using the sapphire thin film 50 including the step differences 4 as the seed, and top-gate nMOSLDD-TFT, and CMOS circuits each comprising bottom-gate pMOSTFT and nMOSTFT can be formed in the display section and the peripheral-driving-circuit section, respectively, each of which comprises the single-crystal silicon layer 7, to produce an active matrix substrate 30 in which the display section and the peripheral-driving-circuit section are integrated.

The method for making a reflective liquid crystal display (LCD) using the active-matrix substrate (driving substrate) 30 of this embodiment is the same as the first embodiment.

This embodiment has the following advantage in addition to the advantages shown in the first embodiment.

The bottom-gate MOSTFTs comprising the single-crystal silicon thin film formed in this embodiment permits the formation of an integrated configuration of the display section and the peripheral-driving-circuit section in which nMOS, PMOS, or cMOS TFTs of a LDD structure in the display section have high switching characteristics and a low leakage current, and TFTs of cMOS, nMOS, cMOS, or a combination thereof in the peripheral-driving-circuit section have high driving ability.

Third Embodiment

A third embodiment of the present invention will now be described with reference to FIGS. 21A to 27V.

The third embodiment is the same as the first embodiment except that a dual-gate MOSTFT comprising a single-crystal silicon layer heteroepitaxially grown from indium-silicon using a materiel layer as a seed is used for forming the peripheral-driving circuit section of an active matrix reflective liquid crystal display (LCD).

With reference to FIGS. 21A to FIG. 27V, a method for making an active-matrix reflective LCD in accordance with a third embodiment will be described. In these drawings, the left side shows the production step of the display section and the right side shows the production step of the peripheral-driving-circuit section.

Figures 21A, 21B, 21C:
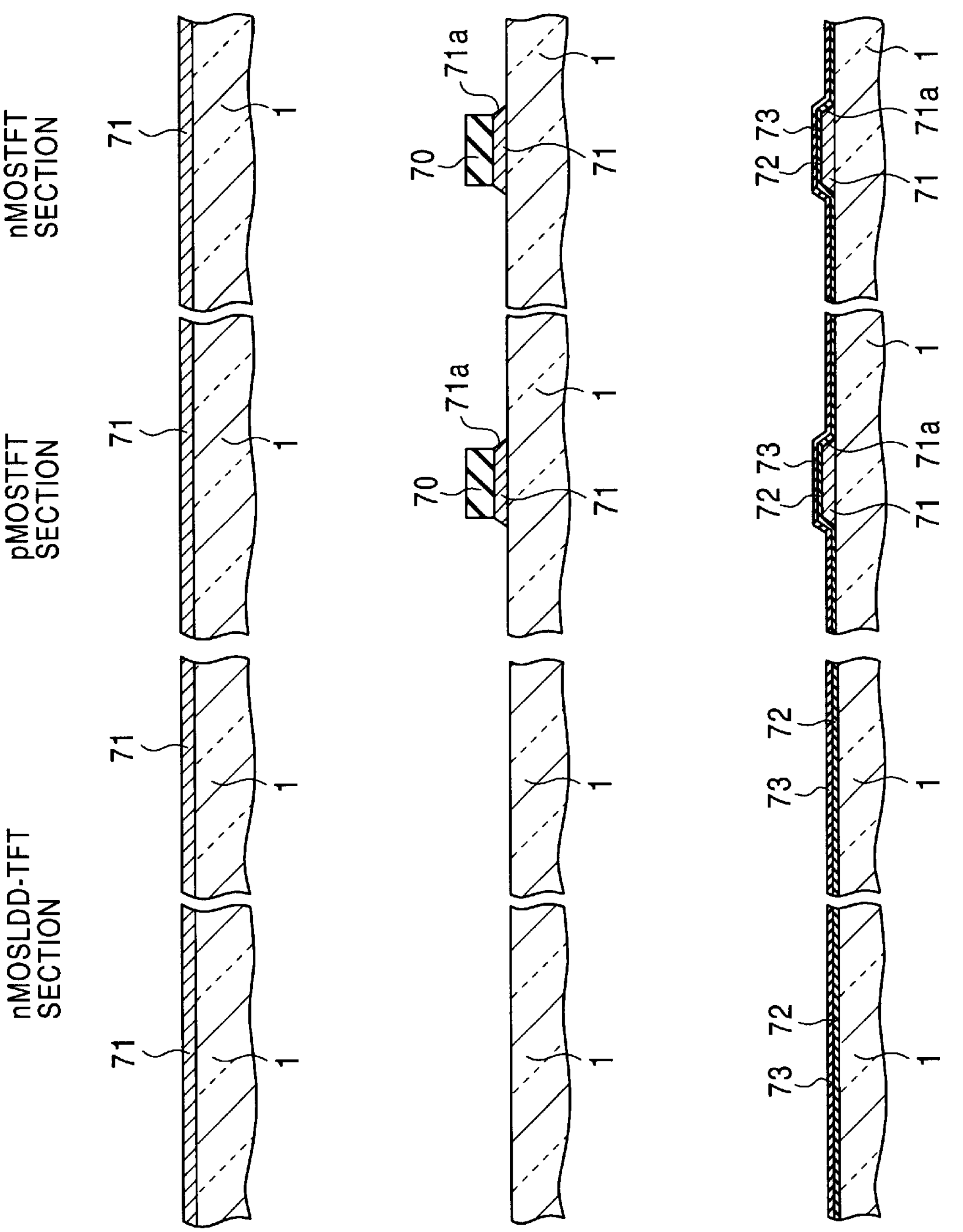
FIGS. 21A to 21C, 22D to 22G, 23H to 23J, 24K to 24M, 25N to 25P, 26Q to 26S, and 27T to 27V are cross-sectional views illustrating production steps of a liquid crystal display (LCD) in accordance with a third embodiment of the present invention.

With reference to FIG. 21A, a sputtered film 71 of a molybdenum-tantalum (Mo—Ta) alloy 71 with a thickness of 500 to 600 nm is formed on one main surface of an insulating substrate 1 composed of quartz glass or transparent crystallized glass.

With reference to FIG. 21B, a photoresist layer 70 having a given pattern is formed as a mask. The Mo—Ta film 71 is taper-etched through the mask to form gate electrodes 71, each having a trapezoidal side base 71*a* with an angle of 20 to 45 degree.

With reference to FIG. 21C, after the photoresist layer 70 is removed, a SiN film 72 having a thickness of approximately 100 nm and then a $SiO_2$ film 73 having a thickness of approximately 200 nm are deposited on the substrate 1 including the molybdenum-tantalum alloy film 71 by a plasma-enhanced CVD process to form a gate insulating film.

Figures 22D, 22E, 22F, 22G:
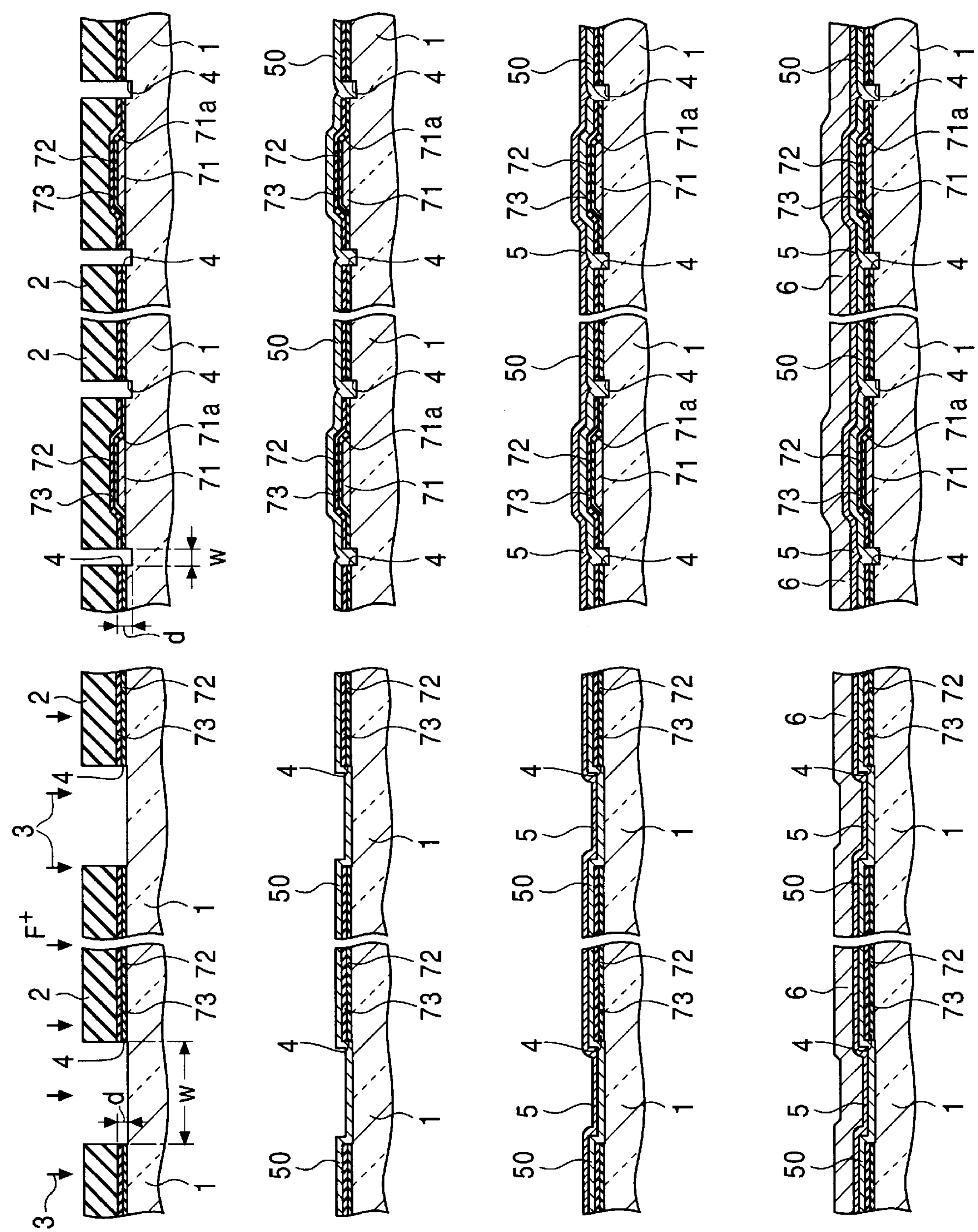

With reference to FIG. 22D, a photoresist layer 2 having a given pattern is formed as a mask in at least a TFT-forming region, and a plurality of step differences 4 having a desired shape and a size are formed in the gate insulating film and the substrate 1 through the mask by typical photolithography, such as reactive ion etching (RIE), including $F^+$ ion irradiation of $CF_4$ plasma and then by etching (photoetching).

The insulating substrate 1 may be composed of a highly-heat-resistant substrate having a diameter of 8 to 12 inches and a thickness of 700 to 800 μm, such as quartz glass, transparent crystallized glass, or ceramic. In a transmissive LCD described below, an opaque ceramic substrate or a translucent crystallized glass cannot be used. The step differences 4, as well as a crystalline sapphire film 50, function as seeds for heteroepitaxy of single-crystal silicon. Each step difference 4 has, for example, a depth d of 0.3 to 0.4 μm, a width w of 2 to 10 μm, and a length l of 10 to 20 μm (in the direction perpendicular to the drawing). The basilar angle defined by the bottom face and the side face is rectangular. A SiN film with a thickness of, for example, 50 to 200 nm, and a silicon oxide film (hereinafter referred to as a $SiO_2$ film) with a thickness of, 100 nm, if necessary, may be continuously formed on the substrate 1 in order to inhibit diffusion of Na ions and the like from the glass substrate 1.

With reference to FIG. 22E, after the photoresist layer 2 is removed, a crystalline sapphire thin film 50 having a thickness of 20 to 200 nm is formed in at least the TFT-forming regions including the step differences 4 on one main surface of the insulating substrate 1. The crystalline sapphire thin film 50 is formed by oxidative crystallization of a trimethylaluminum gas with an oxidizing gas containing oxygen and moisture by a high-density plasma-enhanced CVD process, a catalytic CVD process (refer to Japanese Unexamined Patent Publication No. 63-40314), or the like. As the insulating substrate 1, a highly-heat-resistant glass substrate having a diameter of 8 to 12 inches and a thickness of 700 to 800 nm can be used.

With reference to FIG. 22F, a polycrystalline silicon film 5 having a thickness of several μm to 0.005 μm, for example, 0.1 μm, is deposited on the entire surface of the crystalline sapphire film 50 including the step differences 4 by a known catalytic CVD process, a plasma-enhanced CVD process, or a sputtering process. Although an amorphous silicon film may be formed in place of the polycrystalline silicon film 5, the polycrystalline silicon film 5 will be described as a typical example in this embodiment.

With reference to FIG. 22G, an indium film 6 is formed on the polycrystalline silicon film 5 by a MOCVD process, a sputtering process or a vacuum evaporation process using trimethylindium in which the thickness of the indium film 6 is, for example, 10 to 15 μm which is several ten to several hundred times the thickness of the polycrystalline silicon film 5.

The substrate 1 is placed in a hydrogen-based atmosphere, such as hydrogen, a nitrogen-hydrogen mixture, or an argon-hydrogen mixture at a temperature not higher than 1,000° C., preferably 900 to 930° C. for 5 minutes. The polycrystalline silicon 5 is thereby melted into the melt of the indium 6. Silicon in the melt can be precipitated at a temperature which is significantly lower than the original precipitation temperature. The substrate 1 may be uniformly heated using an electrical furnace etc. Alternatively, a predetermined region, for example, a TFT-forming region of the substrate 1 may be locally heated using laser or electron beams.

Figure 23H:
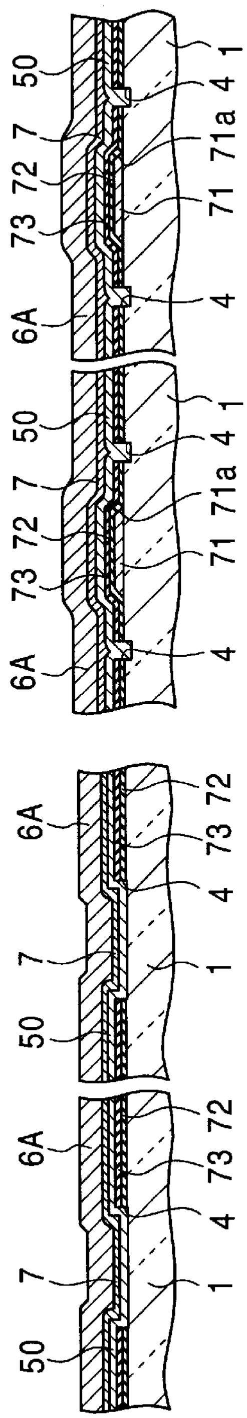

With reference to FIG. 23H, the substrate 1 is gradually cooled so that silicon dissolved in indium is deposited by heteroepitaxy, using the crystalline sapphire film 50 and the bottom corner of each step difference 4 as seeds. A P-type single-crystal silicon layer 7 having a thickness of, for example, approximately 0.1 μm is thereby formed.

Since the crystalline sapphire film 50 exhibits a high degree of lattice matching with the single-crystal silicon layer 7, the (100) plane of the deposited single-crystal silicon layer 7 is epitaxially grown on the substrate. In this case, the step differences 4 also contributes to heteroepitaxial growth including known graphoepitaxial growth and forms a single-crystal silicon layer 7 having higher crystallinity. With reference to FIGS. 8A and 8B, a vertical wall, such as the above-mentioned step difference 4, is formed on the amorphous substrate 1, such as a glass substrate and an epitaxial layer is formed thereon. As shown in FIG. 8B, the (100) plane of a single-crystal is grown along the side face of the step difference 4, whereas a crystal having random plane orientation is grown on a flat amorphous substrate 1, as shown in FIG. 8A. The size of the single-crystal grain increases in proportion to the temperature and the time. When the temperature is lowered or when the time is shortened, the distance between the step differences is decreased. The orientation of the grown crystal can be controlled by changing the shape of the step differences, as shown in FIGS. 9A to 9F. When MOS transistors are formed, the (100) plane is most frequently used. Accordingly, the step difference 4 can have any cross-sectional shape which facilitates crystal growth. For example, the angle at the bottom corner (basilar angle) may be a right angle. Alternatively, the side wall may be inclined inwardly or outwardly. The basilar angle of the step difference 4 is preferably 90° or less and the bottom corner is preferably slightly rounded.

Figure 23I:
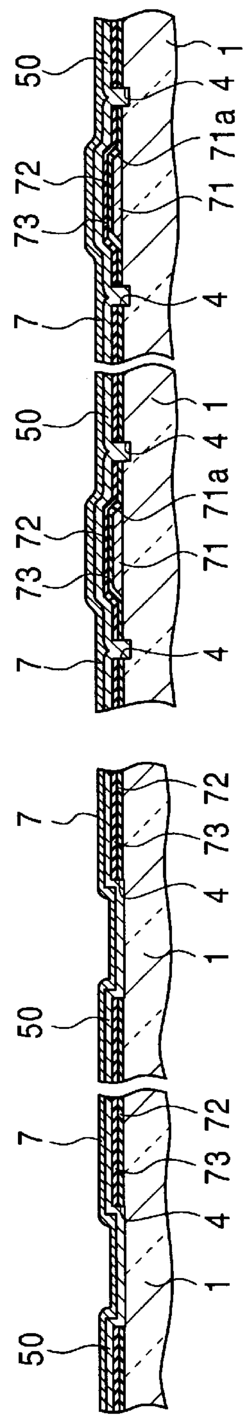

With reference to FIG. 23I, the indium film 6A deposited on the surface is removed using hydrochloric acid or sulfuric acid, followed by post-treatment to avoid the formation of a low-grade silicon oxide film, in order to form a bottom-gate or top-gate MOSTFT having a channel region of the single-crystal silicon layer 7.

Figure 23J:
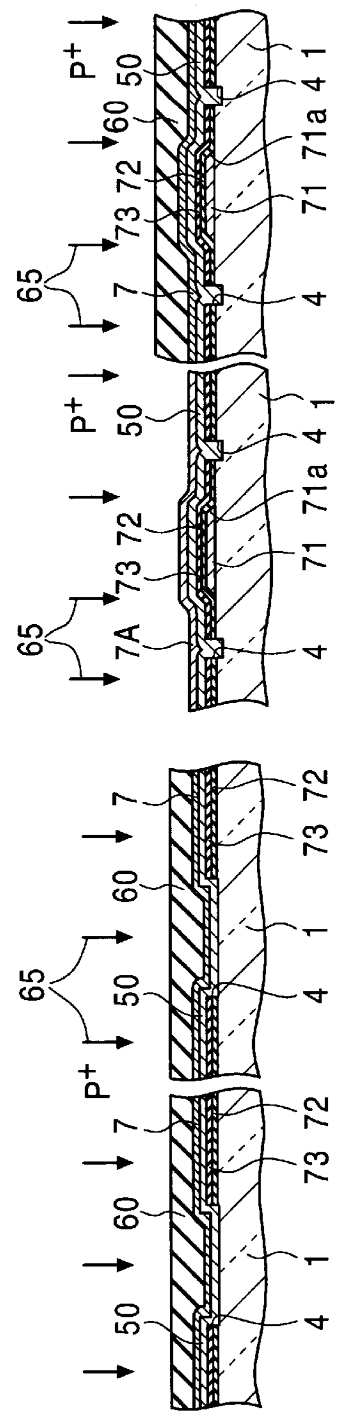

Since the single-crystal silicon layer 7 deposited by heteroepitaxy contains indium, the layer is a p-type layer. Since the concentration of the impurity is not uniform, the p-channel MOSTFT section is masked with a photoresist layer (not shown in the drawing) and is doped with p-type impurity ions such as $B^+$ at 10 kV and at a dose of $2.7\times10^{11}$ atoms/cm$^2$ to adjust the specific resistance. With reference to FIG. 23J, in order to control the concentration of the impurity in the pMOSTFT-forming region, the nMOSTFT section is masked with a photoresist layer 60 and is doped with n-type impurity ions 65 such as $P^+$ at 10 kV and at a dose of 1×10 atoms/cm$^2$ to form an n-type well 7A.

Figures 24K, 24L, 24M:
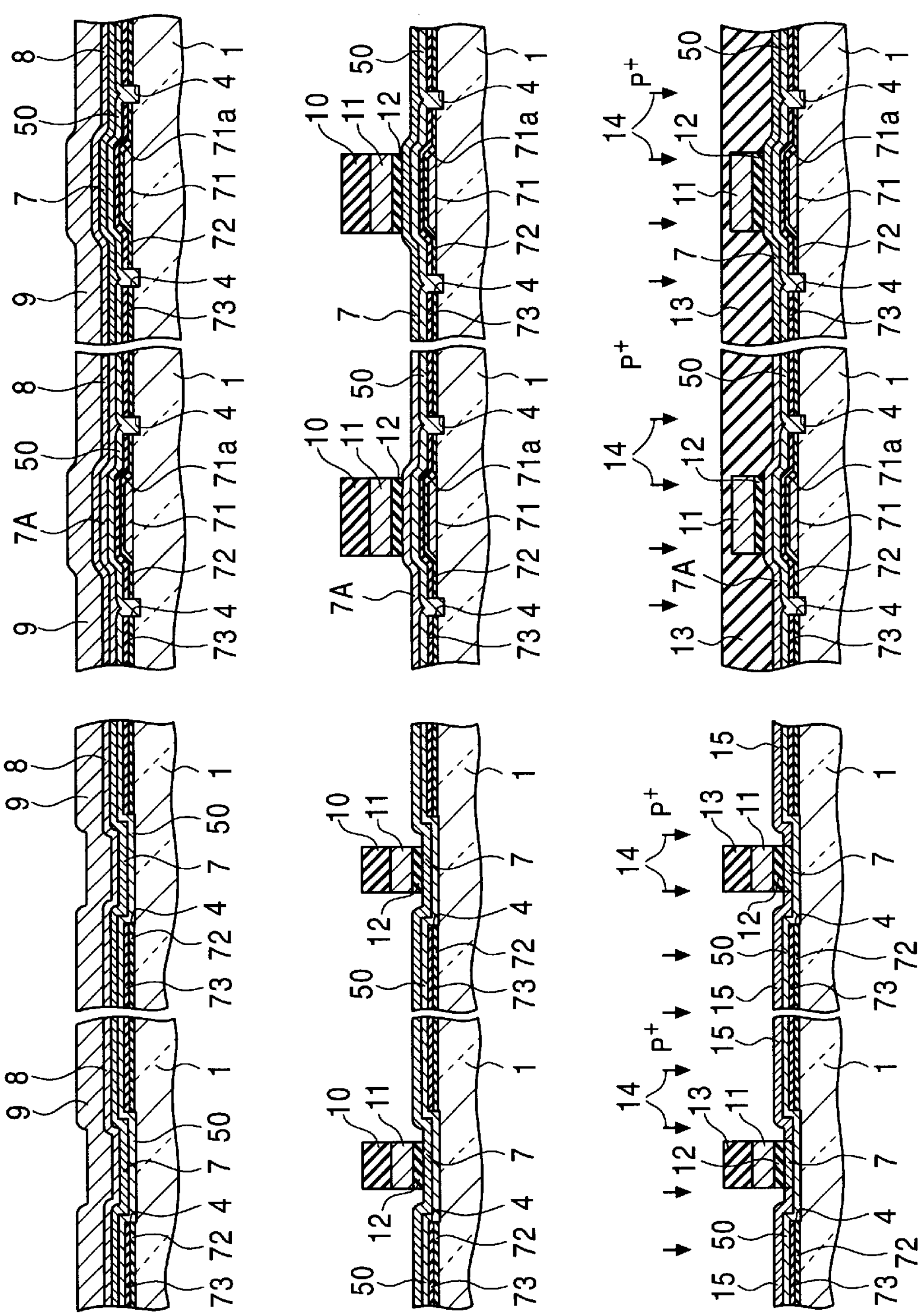

With reference to FIG. 24K, a $SiO_2$ film having a thickness of approximately 200 nm and then a SiN film having a thickness of approximately 100 nm are continuously deposited on the entire single-crystal silicon layer 7 by a plasma-enhanced CVD process, a high-density plasma-enhanced CVD process or a catalytic CVD process to form a gate insulating film 8. A molybdenum-tantalum (MO—Ta) alloy film 9 with a thickness of 500 to 600 nm is formed thereon by a sputtering process.

With reference to FIG. 24L, a photoresist pattern 10 is formed at the interior of the step difference regions (indented sections) of the TFT sections in the display region and at the exterior of the step difference regions (indented sections) of the TFT sections of the peripheral driving region by any conventional photolithographic process. By continuous etching, gate electrodes 11 of the Mo—Ta alloy film 9 and gate insulating films 12 of SiN-$SiO_2$ are formed and the single-crystal silicon layer 7 is exposed. The Mo—Ta alloy film 9 is etched using an acidic solution, the SiN is etched by plasma etching using $CF_4$ gas, and the $SiO_2$ is etched using a hydrofluoric acid solution.

With reference to FIG. 24M, all of the nMOSs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 25N:
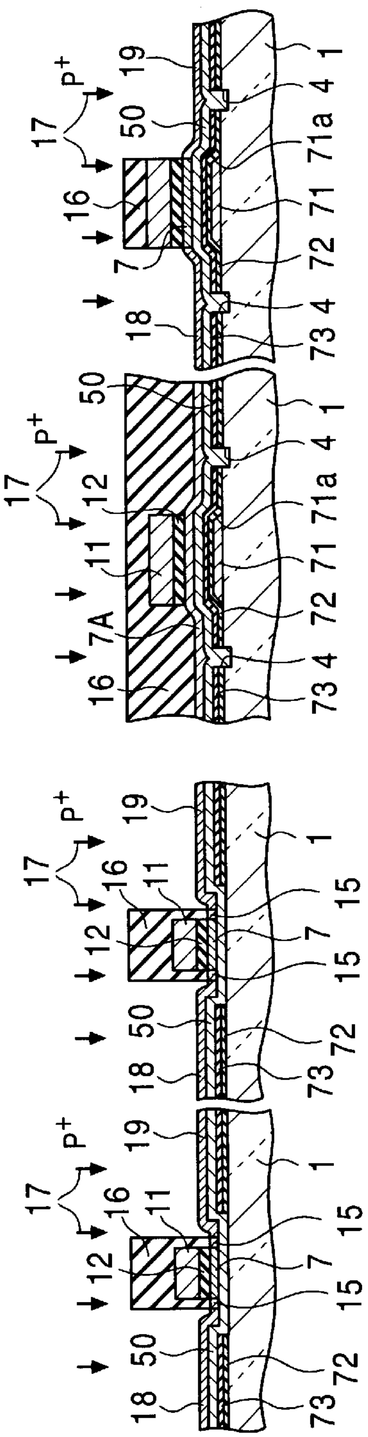

With reference to FIG. 25N, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of an $N^+$-type layer of the nMOSTFTs.

Figure 25O:
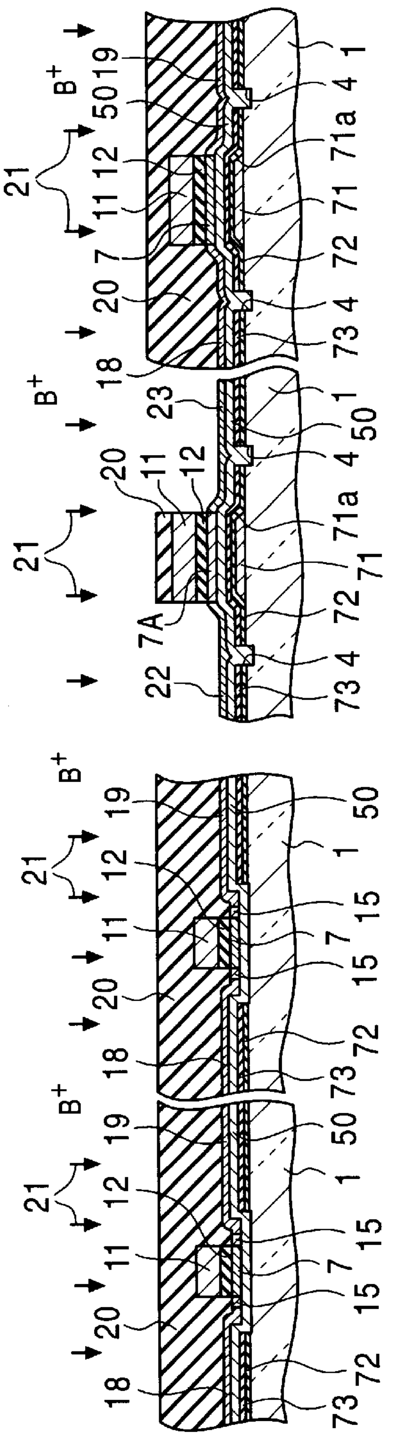

With reference to FIG. 25O, all of the nMOSTFTs in the peripheral driving region and the display region and the gate sections of the pMOSTFTs in the display region are covered with a photoresist layer 20. The exposed regions are doped with boron ions 21 by ion implantation at 10 kV and at a dose of $5\times10^{15}$ atoms/cm$^2$ to form source sections 22 and drain sections 23 of a $P^+$-type layer of the pMOSTFTs. In the case of an nMOS peripheral driving circuit, this step is not necessary since the circuit has no pMOSTFT.

Figure 25P:
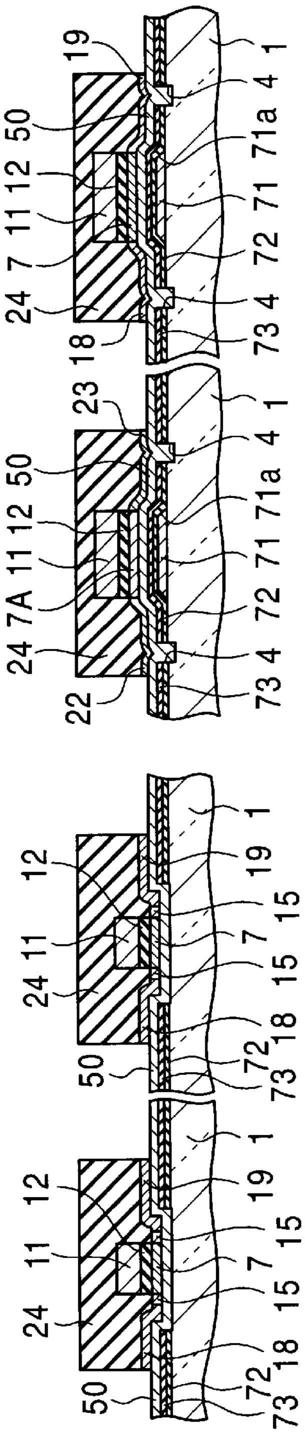

With reference to FIG. 25P, in order to island the active device sections including TFTs and diodes and the passive device sections including resistors and inductors, photoresist layers 24 are provided on all of the active device sections and the passive device sections in the peripheral driving region and the display region, and the single-crystal silicon layer in other sections is removed by a conventional photolithographic process or an etching process using a hydrofluoric acid solution.

Figure 26Q:
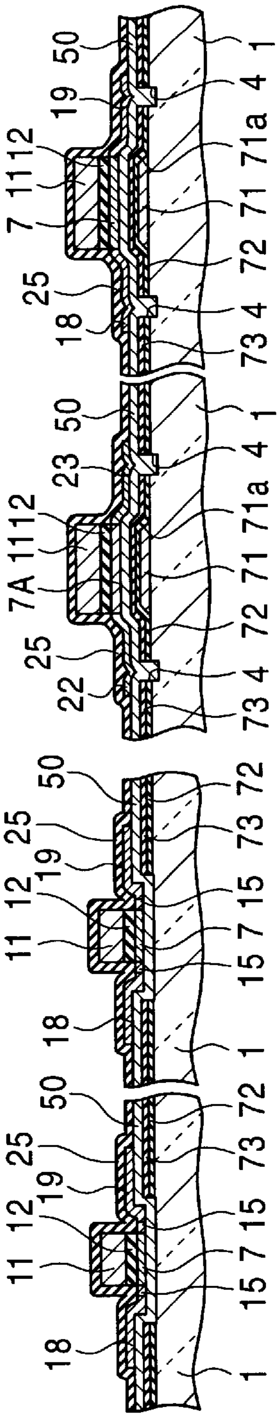

With reference to FIG. 26Q, a $SiO_2$ film having a thickness of approximately 200 nm and then a phosphosilicate glass (PSG) film having a thickness of approximately 300 nm are continuously deposited to form a protective film 25 on the entire surface by a plasma-enhanced CVD process, a high-density plasma-enhanced CVD process or a catalytic CVD process.

In such a state, the single-crystal silicon layer is activated. Since activation treatment is performed at approximately 1,000° C. for approximately 10 seconds using, for example, a halogen lamp. The gate electrode composed of the Mo—Ta alloy having a high melting point is durable to the annealing for activation. The Mo—Ta alloy can be used for not only the gate section but also lead lines over a wide range. In the activation, excimer laser annealing requiring high process costs is generally not used. If excimer laser annealing is used, overlapping scanning of 90% or more is preferably performed on the entire surface or selectively on the active device section and the passive device section using XeCl (wavelength: 308 nm).

Figure 26R:
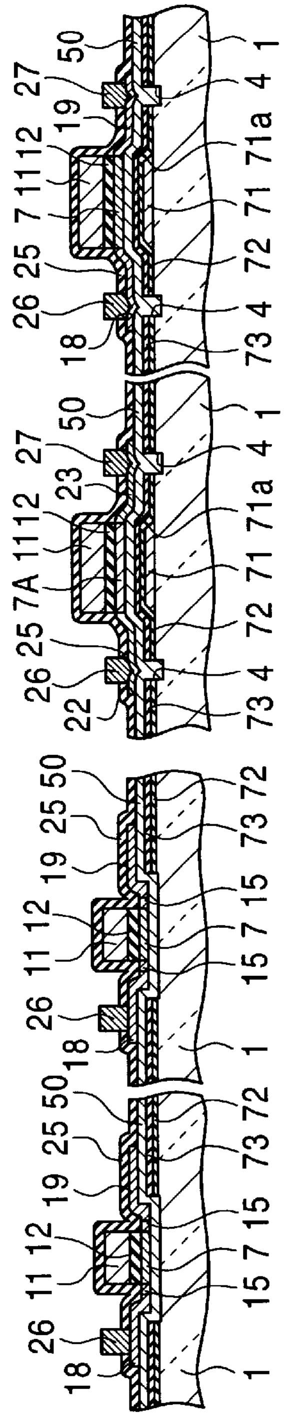

With reference to FIG. 26R, contact holes are formed in all of the source-drain sections of the TFTs in the peripheral driving circuit and the source sections of the TFTs in the display region, by a conventional photolithographic process and an etching process.

A film having a thickness of 500 to 600 nm of elemental aluminum or an aluminum alloy, for example, aluminum containing 1% silicon or 1 to 2% copper is formed on the entire surface by sputtering. By a conventional photolithographic process and an etching process, source electrodes 26 of all TFTs in the peripheral driving circuit and the display region and drain electrodes 27 in the peripheral driving circuit are formed, and data lines and gate lines are simultaneously formed. Next, these are subjected to sintering at approximately 400° C. for 1 hour in a forming gas containing nitrogen and hydrogen.

Figure 26S:
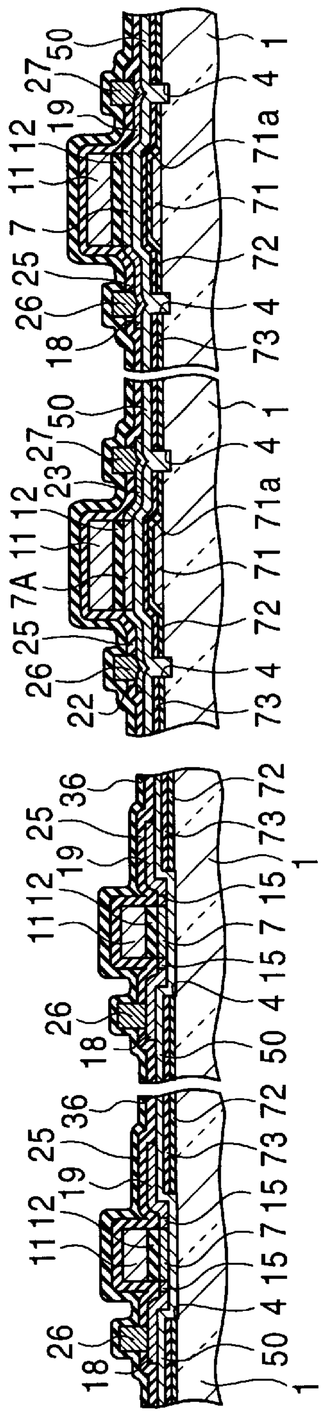

With reference to FIG. 26S, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed in the drain sections of TFTs in the display region. It is not necessary to remove the $SiO_2$, PSG and SiN films in the pixel sections.

Figures 27T, 27U, 27V:
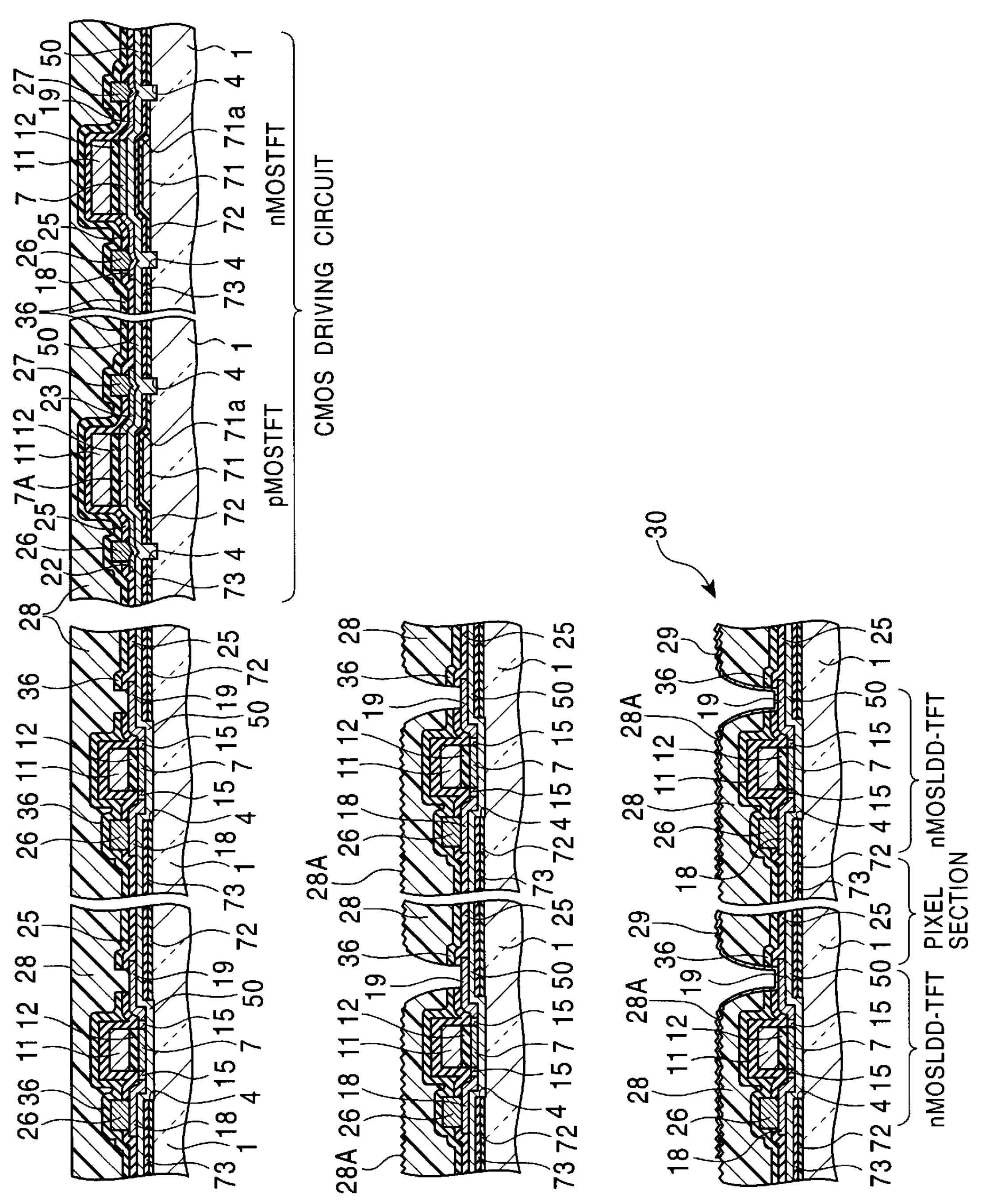

Basic requirements for a reflective liquid crystal display are to reflect the light incident on the display towards the interior of the liquid crystal panel and to scatter the light, because the direction of the incident light is uncertain although the position of the observer with respect to the display is substantially fixed. Thus, the reflector must be designed on the assumption that a point light source is located at any position. As shown in FIG. 27T, a photosensitive resin film 28 having a thickness of 2 to 3 $\mu$m is formed on the entire surface by spin coating. Next, as shown in FIG. 27U, an uneven pattern is formed in at least the pixel region by a conventional photolithographic process and an etching process so that the pixel section has optimized reflective characteristics and viewing-angle characteristics. The uneven pattern is subjected to reflow to form a lower portion of the reflective face of an uneven surface 28A. Contact holes are simultaneously formed in the resin film in the drain sections of TFTs in the display region.

With reference to FIG. 27V, an aluminum film or a 1%-silicon-containing aluminum film having a thickness of 400 to 500 nm is deposited on the entire surface by sputtering. The film at the region other than the pixel sections is removed by a general photolithographic process and an etching process to form an uneven aluminum reflective sections 29 which are connected to the drain sections 19 of the TFTs for displaying. The reflective sections 29 are used as pixel electrodes for displaying. Next, these are sintered at approximately 300° C. for 1 hour in a forming gas to enhance the contact. Elemental silver or a silver alloy may be used instead of the aluminum to increase the reflectance.

As described above, an active-matrix substrate 30 integrating a display section and a peripheral-driving-circuit section is produced by forming a single-crystal silicon layer 7 using the crystalline sapphire film 50 including the step difference 4 as a seed for high-temperature heteroepitaxy and by forming CMOS circuits, each including a top-gate type nMOSLDD-TFT, dual-gate type pMOSTFT and nMOSTFT, in the display section and the peripheral-driving-circuit section.

The method for making a reflective liquid crystal display using this active-matrix substrate (driving substrate) 30 is the same as that in the first embodiment. The advantages of this embodiment are the same as those in the first and second embodiments.

The method according to the third embodiment has an additional advantage. Since the dual-gate type MOSTFT is used in the peripheral-driving circuit in this embodiment, the cMOSTFT, nMOSTFT, and pMOSTFT have a drive capability which is 1.5 to 2 times higher than that of single-gate types. Thus, the dual-gate MOSTFTs are suitable for a peripheral driving circuit requiring TFTs having high drive capability. Moreover, this configuration can be readily changeable to top-gate types or bottom-gate types by selecting the upper or lower gate section. If one of the upper and lower gate sections does not work, the other can be used.

Fourth Embodiment

FIGS. 28A to FIG. 34U show a fourth embodiment of the present invention.

The fourth embodiment is the same as the second embodiment except the method of forming a P-type single-crystal silicon layer.

With reference to FIGS. 28A to 34U, the method in the fourth embodiment will be described based on the production steps. In FIGS. 28A to 34U, the left side of each drawing shows the production step of the display section and the right side shows the production step of the peripheral-driving-circuit section.

Figures 28A, 28B, 28C:
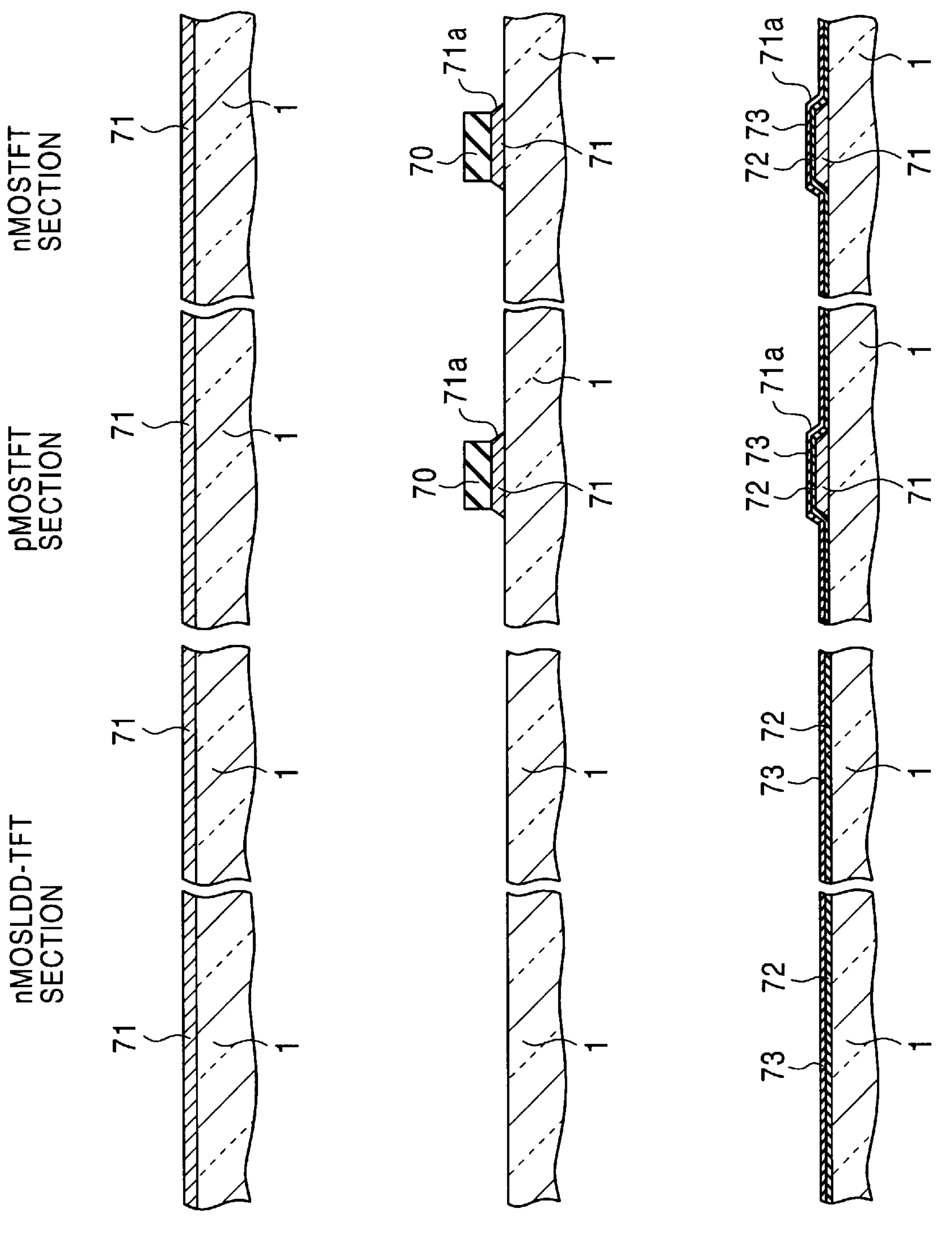
FIGS. 28A to 28C, 29D to 29F, 30G to 30I, 31J to 31L, 32M to 32O, 33P to 33R, and 34S to 34U are cross-sectional views illustrating production steps of a liquid crystal display (LCD) in accordance with a fourth embodiment of the present invention.

With reference to FIG. 28A, a molybdenum-tantalum (Mo—Ta) alloy film 71 having a thickness of 500 to 600 nm is formed by sputtering on a main surface of an insulating substrate 1 made of quartz glass, transparent crystallized glass, or the like.

With reference to FIG. 28B, a photoresist layer 70 having a given pattern is formed on the sputtered Mo—Ta film 71, and the Mo—Ta film 71 is taper-etched by using the photoresist layer 70 as a mask to form gate electrodes 71 each having a trapezoidal side base 71*a* gently inclined at an angle of 20 to 45 degrees.

With reference to FIG. 28C, after the photoresist layer 70 is removed, a SiN film 72 having a thickness of approximately 100 nm and a $SiO_2$ film 73 having a thickness of approximately 200 nm are deposited in this order on the substrate 1 including the molybdenum-tantalum alloy film 71 by a plasma-enhanced CVD process to form a gate insulating film.

Figures 29D, 29E, 29F:
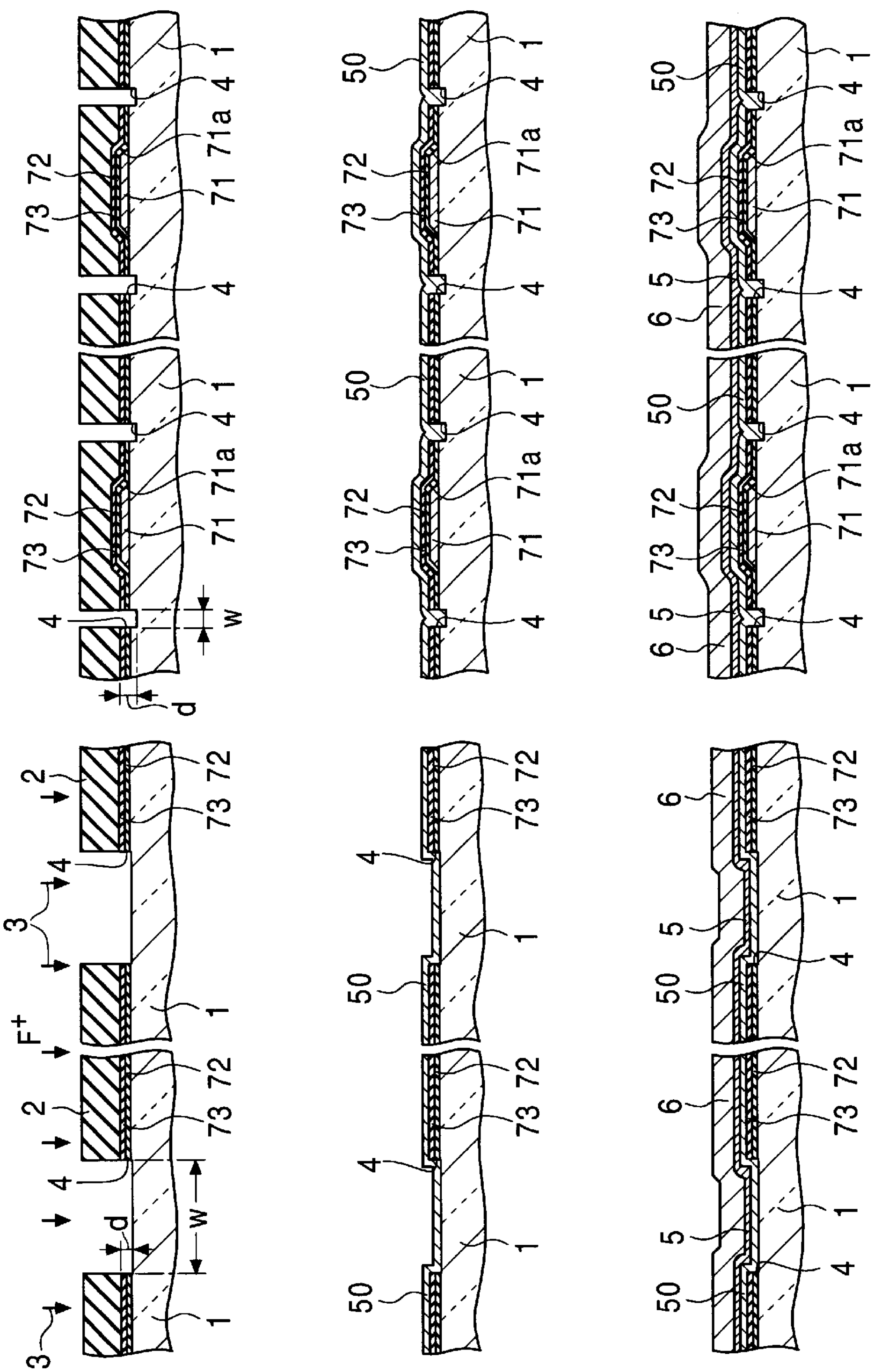

With reference to FIG. 29D, a photoresist layer 2 having a given pattern is formed in at least the TFT-forming regions, and a plurality of step differences 4 having a proper shape and size are formed in the gate insulating film and the substrate 1 through a mask of the photoresist layer 2 in the same manner as in the first embodiment.

With reference to FIG. 29E, after the photoresist layer 2 is removed, a crystalline sapphire film 50 having a thickness of 20 to 200 nm is formed in at least the TFT-forming regions including the step differences 4 on one main surface of the insulating substrate 1 by the same method as the first embodiment.

With reference to FIG. 29F, an indium-silicon melt 6 containing about 1% by weight of silicon is coated over the entire surface of the crystalline sapphire film 50 including the step differences 4 on the substrate 1 heated to 900 to 930° C. Alternatively, the substrate 1 may be dipped in the melt, or the method of gradually moving the surface of the melt to floating the melt, a jet flow method, or a method of contact under the action of ultrasonic waves may be used.

Figures 30G, 30H, 30I:
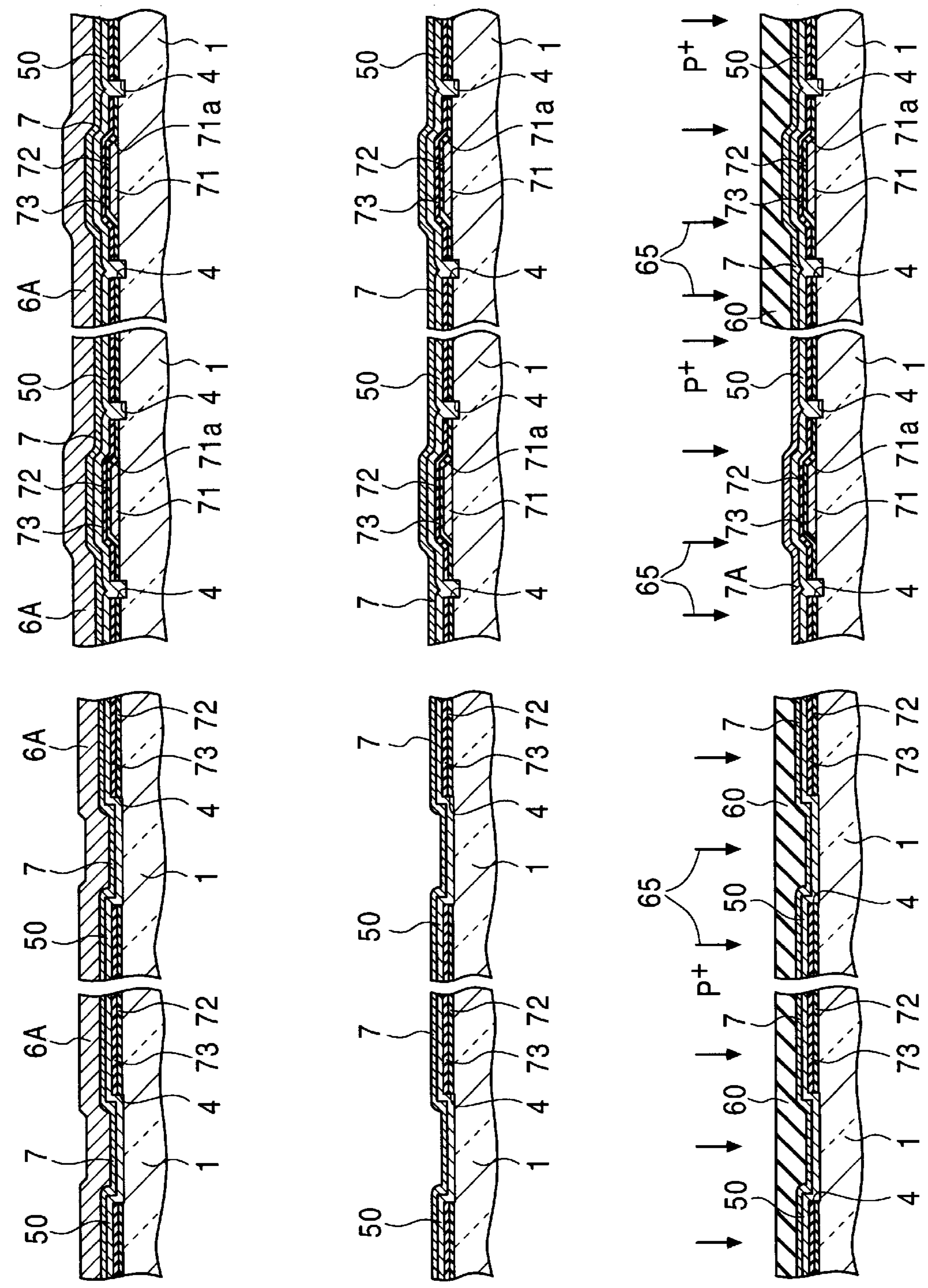

With reference to FIG. 30G, the substrate 1 is next maintained for several minutes to several tens minutes, and then gradually cooled (gradually pulled up in the case of dipping) so that silicon dissolved in indium is heteroepitaxially grown by using the crystalline sapphire film 50 (furthermore, the bottom corner of each step difference 4) as a seed to deposit a P-type single-crystal silicon layer 7 having a thickness of, for example, approximately 0.1 μm. In the dipping method or flowing method, the composition of the melt, the temperature and the pulling-up rate can easily be controlled, and thus the thickness of the epitaxially grown layer and the concentration of P-type carrier impurities can easily be controlled.

With reference to FIG. 30H, after the single-crystal silicon layer 7 is deposited on the substrate 1 by heteroepitaxy, the indium film 6A deposited on the surface is removed by resolution with hydrochloric acid or sulfuric acid to form a bottom-gate or top-gate MOSTFT having a channel region comprising the single-crystal silicon layer 7.

Since the concentration of the p-type impurity fluctuates, the p-channel MOSTFT sections are masked with a photoresist layer (not shown in the drawing) and are doped with p-type impurity ions such as $B^+$ at 10 kV and at a dose of $2.7\times10^{11}$ atoms/cm$^2$ to adjust specific resistance. With reference to FIG. 30I, in order to control the concentration of the impurity in the pMOSTFT-forming regions, the nMOSTFT sections are masked with a photoresist layer 60 and are doped with n-type impurity ions 65 such as $P^+$ at 10 kV and at a dose of $1\times10^{11}$ atoms/cm$^2$ to form n-type wells 7A.

Figure 31J:
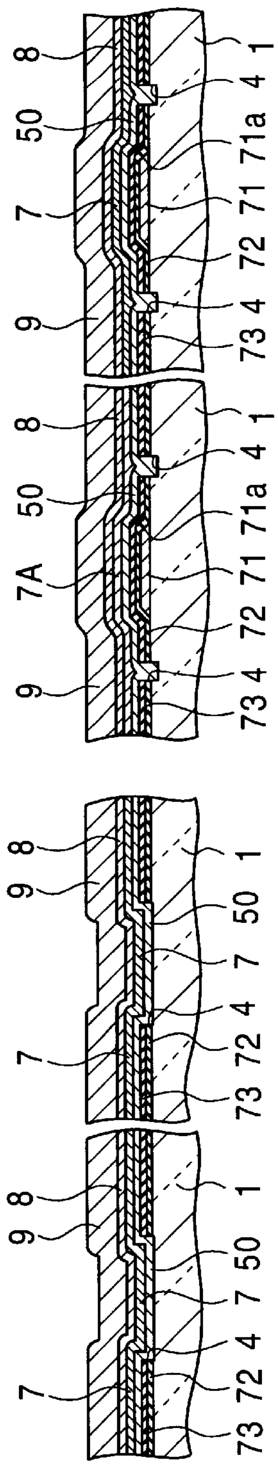

With reference to FIG. 31J, $SiO_2$ having a thickness of approximately 200 nm and SiN having a thickness of approximately 100 nm are continuously deposited in this order on the entire surface of the single-crystal silicon layer 7, and a molybdenum-tantalum (Mo—Ta) alloy sputtered film 9 having a thickness of 500 to 600 nm is formed thereon by the same method as the first embodiment.

Figure 31K:
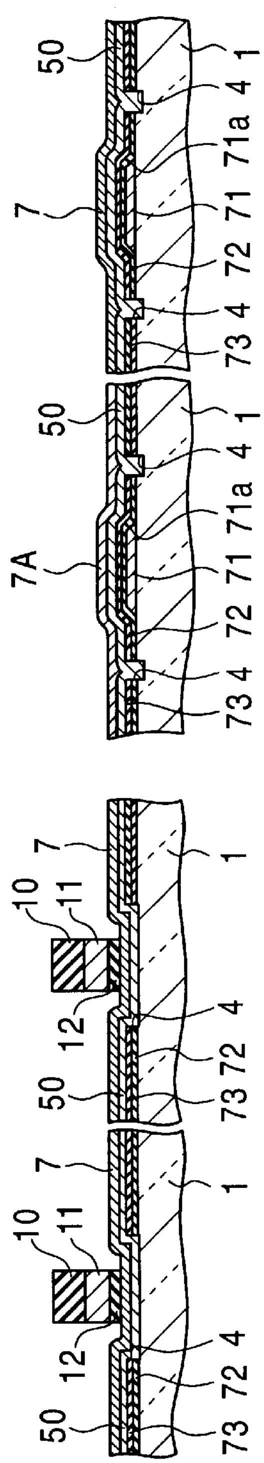

With reference to FIG. 31K, a photoresist pattern 10 is formed in the step difference regions (indented sections) of the TFT sections in the display region by any conventional photolithographic process. By continuous etching, gate electrodes 11 of the Mo—Ta alloy and gate insulating films 12 of SiN13 $SiO_2$ are formed, and the single-crystal silicon layer 7 is exposed.

Figure 31L:
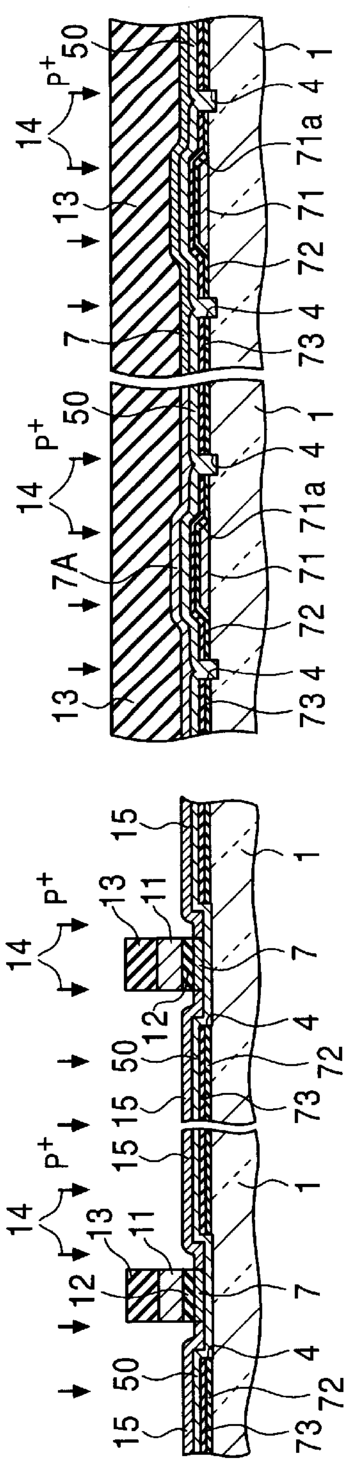

With reference to FIG. 31L, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 32M:
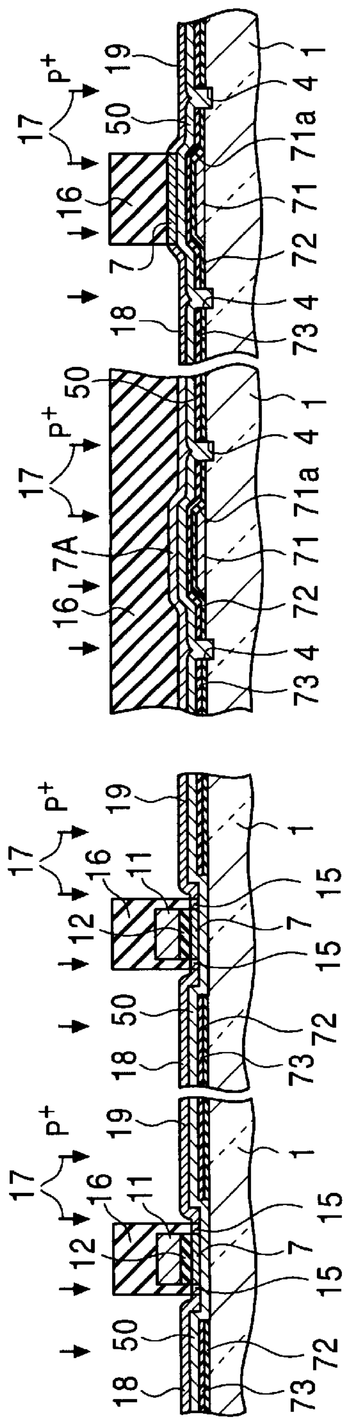

With reference to FIG. 32M, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs.

Figure 32N:
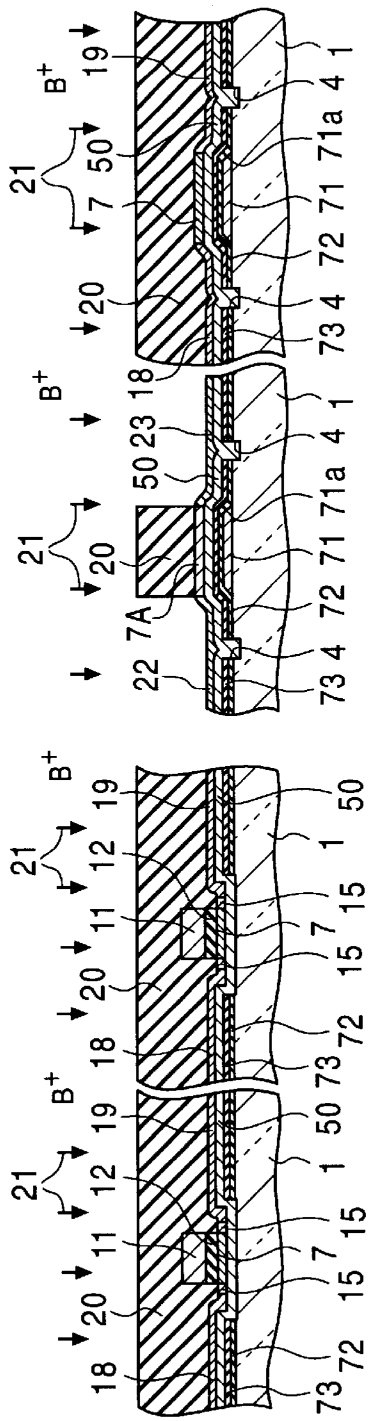

With reference to FIG. 32N, all of the nMOSTFTs in the peripheral driving region and the display region and the gate sections of the pMOSTFTs are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 32O:
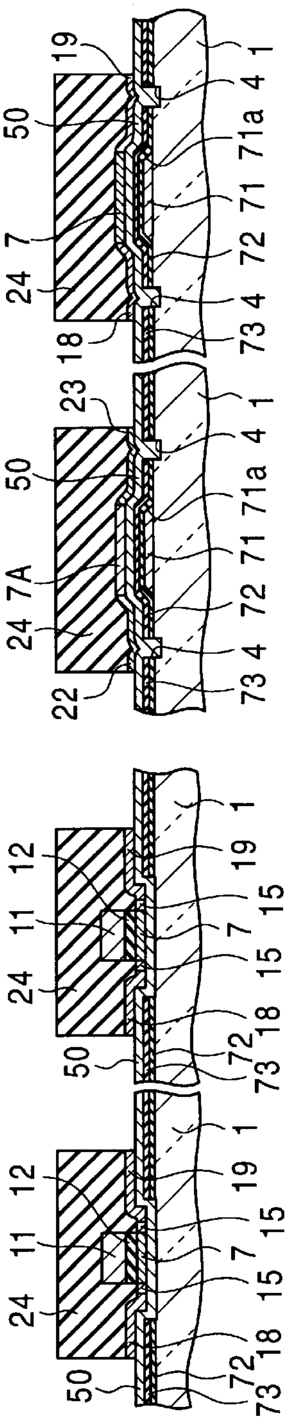

With reference to FIG. 32O, in order to island the active device sections including TFTs and diodes and the passive device sections including resistors and inductors, photoresist layers 24 are provided on all of the active device sections and the passive device sections in the peripheral driving section and the display section, and the single-crystal silicon layer 7 in other sections is removed by the same method as the first embodiment.

Figure 33P:
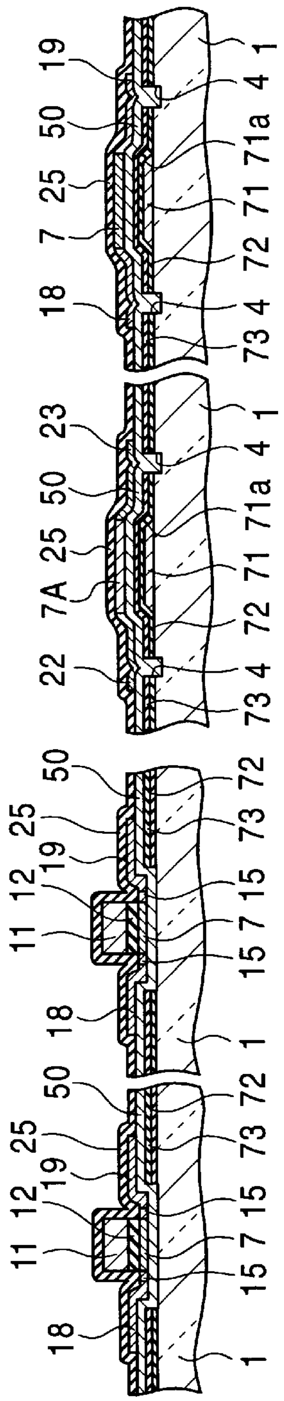

With reference to FIG. 33P, a $SiO_2$ film having a thickness of approximately 200 nm and a phosphosilicate glass (PSG) film having a thickness of approximately 300 nm are continuously deposited in this order to form a protective film 25 over the entire surface.

In this state, the single-crystal silicon layer is activated in the same manner as the first embodiment.

Figure 33Q:
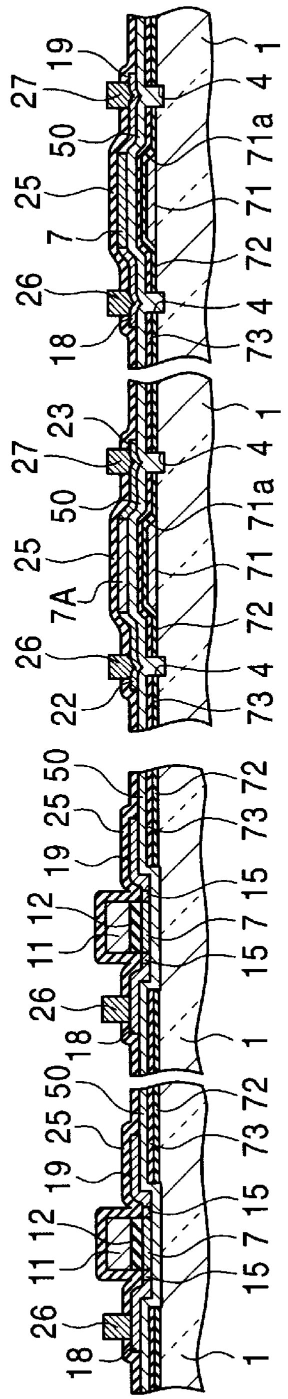

With reference to FIG. 33Q, contact holes are formed in all of the source-drain sections of the TFTs in the peripheral driving circuit and the source sections of the TFTs in the display region.

A sputtered film of aluminum, an aluminum alloy, for example, aluminum containing Si or copper, copper, or the like is formed over the entire surface, and source electrodes 26 of all TFTs in the peripheral driving circuit section and the display section and drain electrodes 27 in the peripheral driving circuit section are formed by the same method as the first embodiment. At the same time, data lines and gate lines are formed, and then these are subjected to sintering.

Figure 33R:
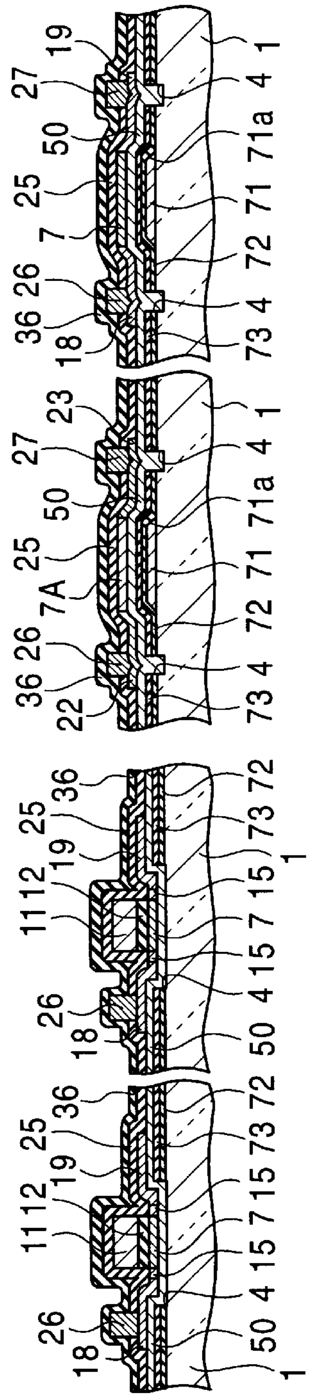

With reference to FIG. 33R, an insulating film 36 composed of a PSG film with a thickness of approximately 300 nm and a SiN film with a thickness of approximately 300 nm is formed on the entire surface, and then contact holes are formed in the drain sections of TFTs in the display region in the same manner as the first embodiment.

Figure 34S:
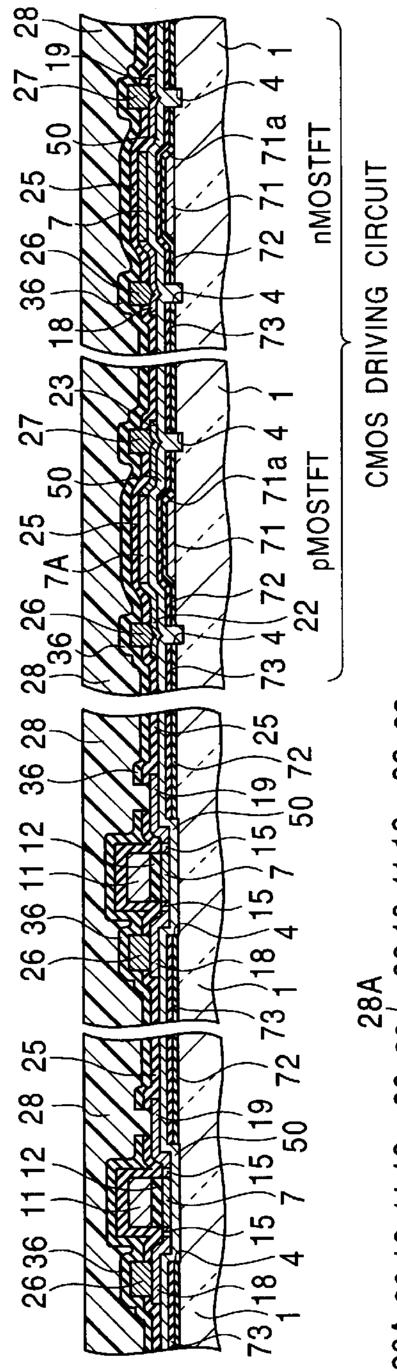
Figure 34T:
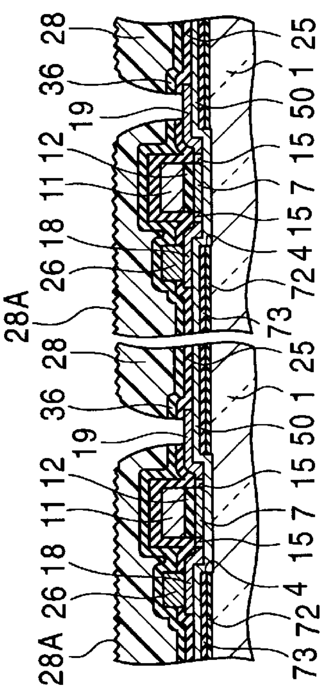

For the same reason as described above in the first embodiment, a reflector must be designed on the assumption that a point light source is located at any position. As shown in FIG. 34S, a photosensitive resin film 28 having a thickness of 2 to 3 μm is formed on the entire surface by spin coating. Next, as shown in FIG. 34T, an uneven pattern is formed in at least the pixel region and then subjected to reflow to form a lower portion of the reflective face of an uneven surface 28A by the same method as the first embodiment. At the same time, contact holes are formed in the resin film in the drain sections of TFTs in the display region.

Figure 34U:
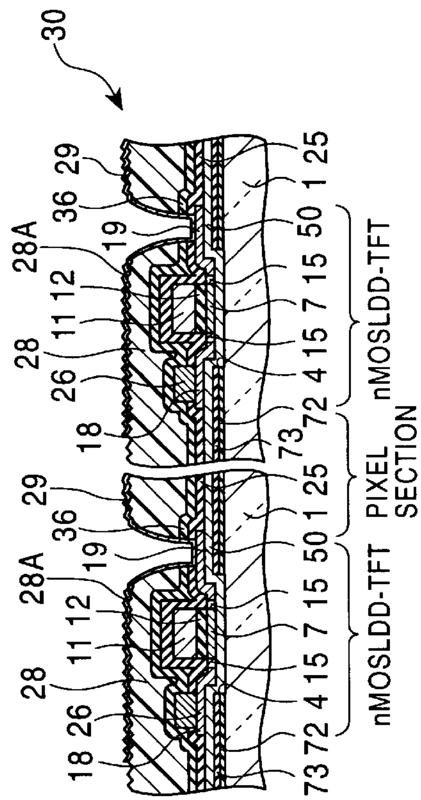

With reference to FIG. 34U, a sputtered film of aluminum, aluminum containing Si, or the like, which has a thickness of 400 to 500 nm, is deposited on the entire surface, and then removed from regions other than the pixel sections by a general photolithographic process and an etching process to form uneven aluminum reflective sections 29 which are connected to the drain sections 19 of the display TFTs. Next, these are subjected to sintering at approximately 300° C. for 1 hour in a forming gas to achieve sufficient contact.

As described above, the single-crystal silicon layer 7 is formed by high-temperature heteroepitaxy using the sapphire thin film 50 including the step differences 4 as the seed, and top-gate nMOSLDD-TFT and CMOS circuits each comprising bottom-gate pMOSTFT and nMOSTFT can be formed in the display section and the peripheral-driving-circuit section, respectively, each of which comprises the single-crystal silicon layer 7, to produce an active matrix substrate 30 in which the display section and the peripheral-driving-circuit section are integrated.

The method for making a reflective liquid crystal display (LCD) using the active-matrix substrate (driving substrate) 30 of this embodiment is the same as that in the first embodiment.

This embodiment has the same advantages as those of the second embodiment.

Fifth Embodiment

A fifth embodiment of the present invention will now be described with reference to FIGS. 35A to 41U.

The fifth embodiment is the same as the first embodiment except that a dual-gate MOSTFT comprising a single-crystal silicon layer heteroepitaxially grown from a indium-silicon melt using a materiel layer as a seed is used for forming the peripheral-driving circuit section of an active matrix reflective liquid crystal display (LCD).

With reference to FIG. 35A to FIG. 41U, a method for making an active-matrix reflective LCD in accordance with a fifth embodiment will be described. In these drawings, the left side shows the production step of the display section and the right side shows the production step of the peripheral-driving-circuit section.

Figure 35A:
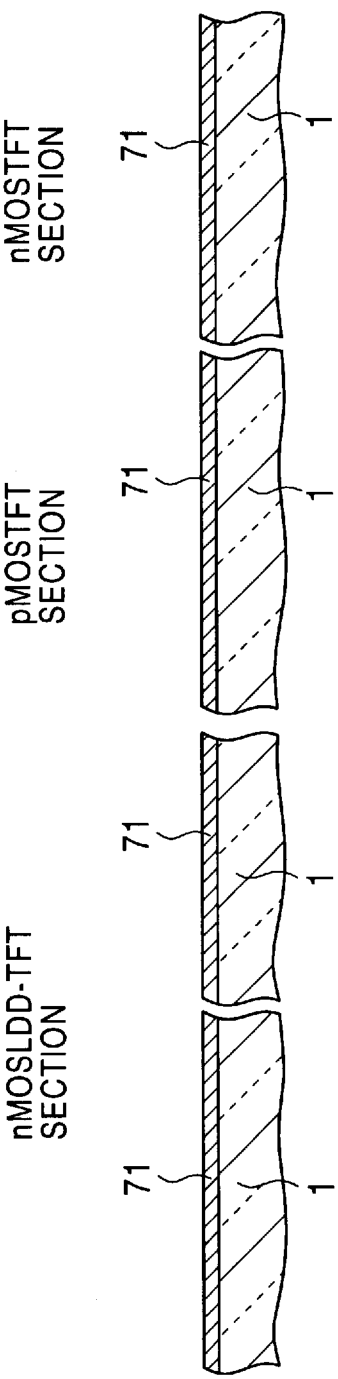
FIGS. 35A to 35C, 36D to 36F, 37G to 37I, 38J to 38L, 39M to 39O, 40P to 40R, and 41S to 41U are cross-sectional views illustrating production steps of a liquid crystal display (LCD) in accordance with a fifth embodiment of the present invention.

With reference to FIG. 35A, a sputtered film 71 of a molybdenum-tantalum (Mo—Ta) alloy 71 with a thickness of 500 to 600 nm is formed on one main surface of an insulating substrate 1 composed of quartz glass or transparent crystallized glass.

Figure 35B:
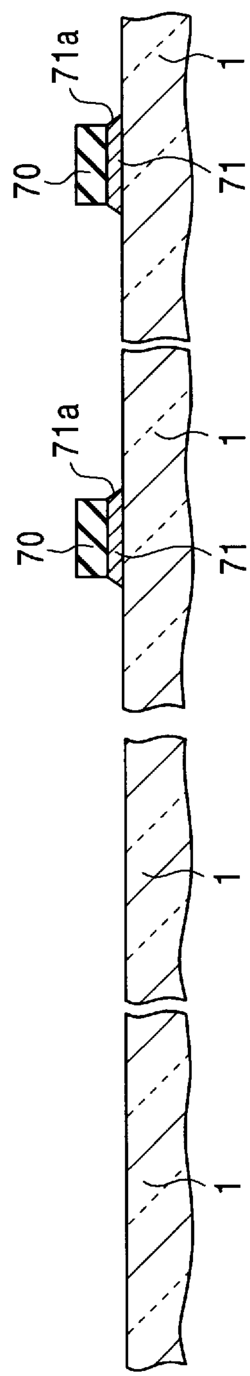

With reference to FIG. 35B, a photoresist layer 70 having a given pattern is formed as a mask. The Mo—Ta film 71 is taper-etched through the mask to form gate electrodes 71, each having a trapezoidal side base 71*a* with an angle of 20 to 45 degrees.

Figure 35C:
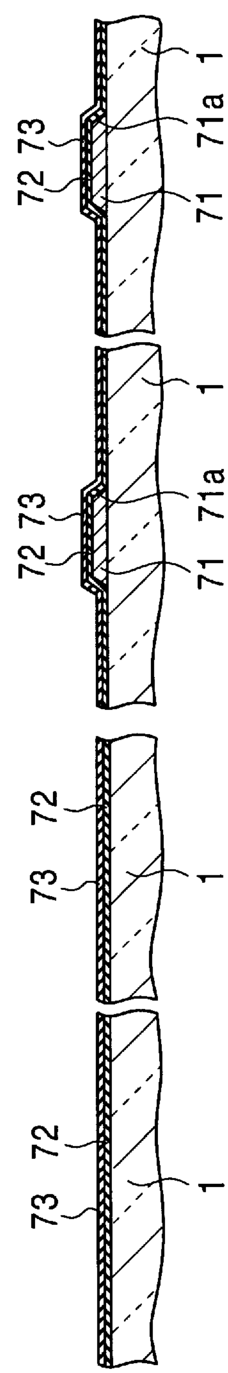

With reference to FIG. 35C, after the photoresist layer 70 is removed, a SiN film 72 having a thickness of approximately 100 nm and then a $SiO_2$ film 73 having a thickness of approximately 200 nm are deposited on the substrate 1 including the molybdenum-tantalum alloy film 71 by a plasma-enhanced CVD process to form a gate insulating film.

Figures 36D, 36E, 36F:
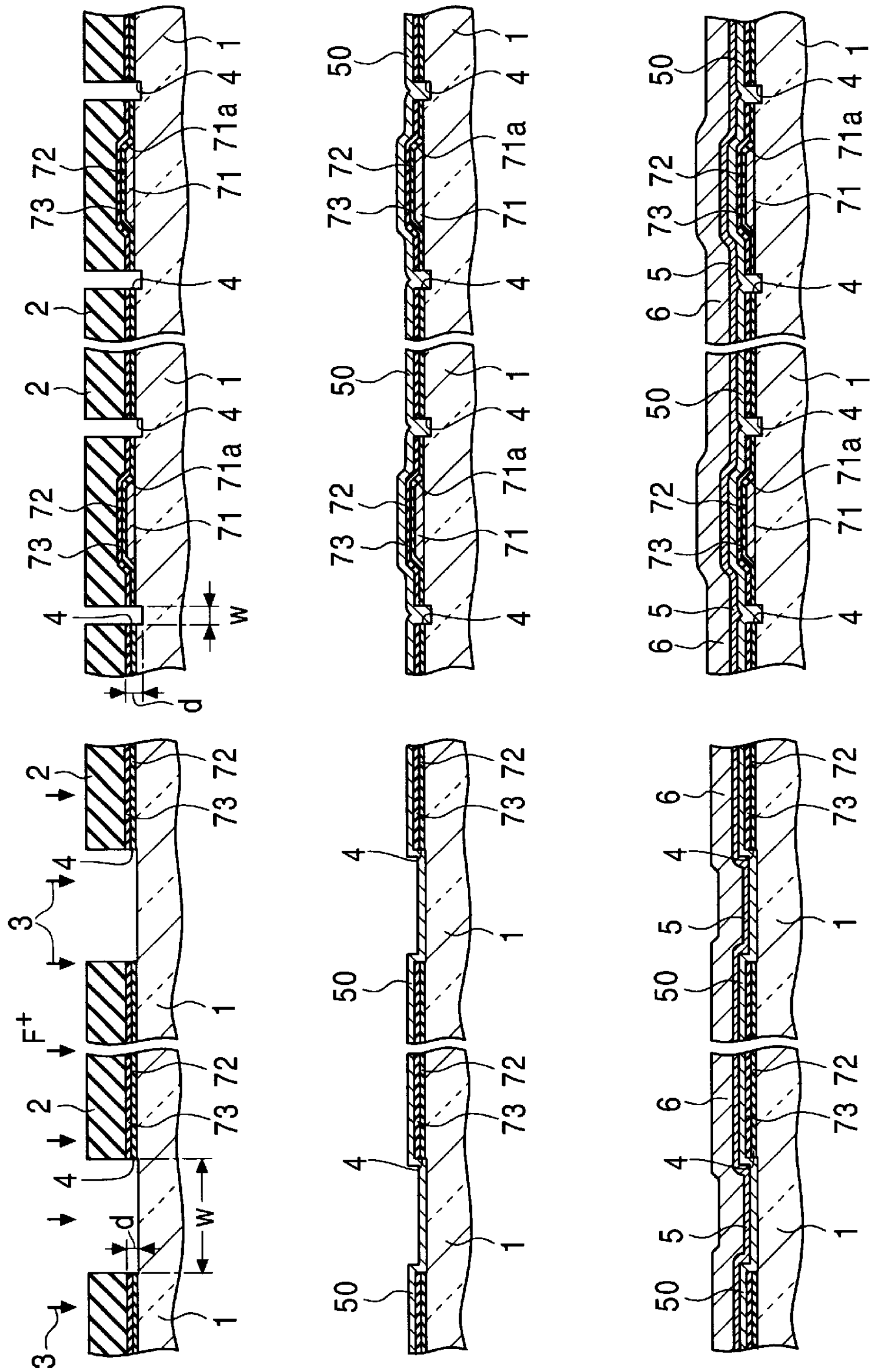

With reference to FIG. 36D, a photoresist layer 2 having a given pattern is formed as a mask in at least a TFT-forming region, and a plurality of step differences 4 having a desired shape and a size are formed in the gate insulating film and the substrate 1 through the mask by typical photolithography, such as reactive ion etching (RIE), including $F^+$ ion irradiation of $CF_4$ plasma and then by etching (photoetching).

The insulating substrate 1 may be composed of a highly-heat-resistant substrate having a diameter of 8 to 12 inches and a thickness of 700 to 800 $\mu$m, such as quartz glass, transparent crystallized glass, or ceramic. In a transmissive LCD described below, an opaque ceramic substrate or a translucent crystallized glass cannot be used. The step differences 4, as well as a crystalline sapphire film 50, function as seeds for heteroepitaxy of single-crystal silicon. Each step difference 4 has, for example, a depth d of 0.1 to 0.4 $\mu$m, a width w of 2 to 10 $\mu$m, and a length l of 10 to 20 $\mu$m (in the direction perpendicular to the drawing). The basilar angle defined by the bottom face and the side face is rectangular. A SiN film with a thickness of, for example, 50 to 200 nm, and a silicon oxide film (hereinafter referred to as a $SiO_2$ film) with a thickness of, 100 nm, if necessary, may be continuously formed on the substrate 1 in order to inhibit diffusion of Na ions and the like from the glass substrate 1.

With reference to FIG. 36E, after the photoresist layer 2 is removed, a crystalline sapphire thin film 50 having a thickness of 20 to 200 nm is formed in at least the TFT-forming regions including the step differences 4 on one main surface of the insulating substrate 1. The crystalline sapphire thin film 50 is formed by oxidative crystallization of a trimethylaluminum gas with an oxidizing gas containing oxygen and moisture by a high-density plasma-enhanced CVD process, a catalytic CVD process (refer to Japanese Unexamined Patent Publication No. 63-40314), or the like. As the insulating substrate 1, a highly-heat-resistant glass substrate having a diameter of 8 to 12 inches and a thickness of 700 to 800 nm can be used.

With reference to FIG. 36F, an indium-silicon melt 6 containing about 1% by weight of silicon is coated over the entire surface of the crystalline sapphire film 50 including the step differences 4 on the substrate 1 heated to 900 to 930° C. Alternatively, the substrate 1 may be dipped in the melt, or the method of gradually moving the surface of the melt to floating the melt, a jet flow method, or a method of contact under the action of ultrasonic waves may be used.

Figure 37G:
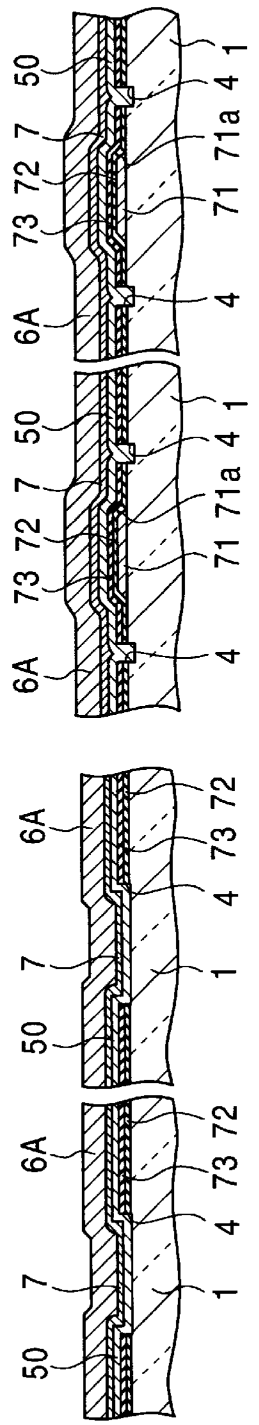

With reference to FIG. 37G, the substrate 1 is next maintained for several minutes to several tens minutes, and then gradually cooled (gradually pulled up in the case of dipping) so that silicon dissolved in indium is heteroepitaxially grown by using the crystalline sapphire film 50 (furthermore, the bottom corner of each step difference 4) as a seed to deposit a P-type single-crystal silicon layer 7 having a thickness of, for example, approximately 0.1 $\mu$m. In the dipping method or floating method, the composition of the melt, the temperature and the pulling-up rate can easily be controlled, and thus the thickness of the epitaxially grown layer and the concentration of P-type carrier impurities can easily be controlled.

Figure 37H:
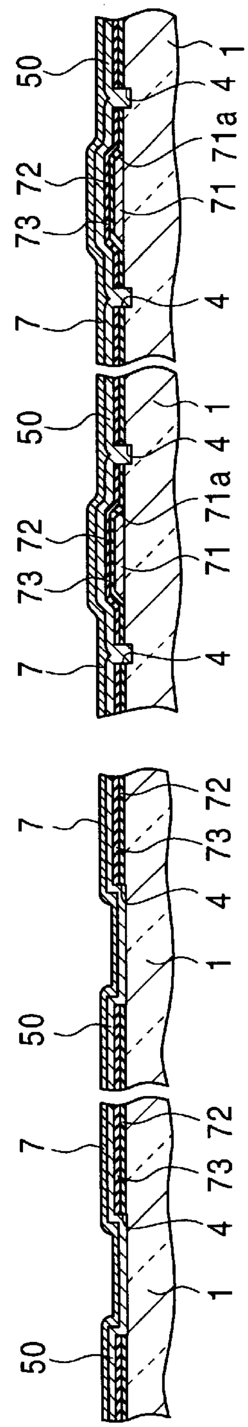

With reference to FIG. 37H, after the single-crystal silicon layer 7 is deposited on the substrate 1 by heteroepitaxy, the indium film 6A deposited on the surface is removed by resolution with hydrochloric acid or sulfuric acid to form a dual-gate or top-gate MOSTFT having a channel region comprising the single-crystal silicon layer 7.

Figure 37I:
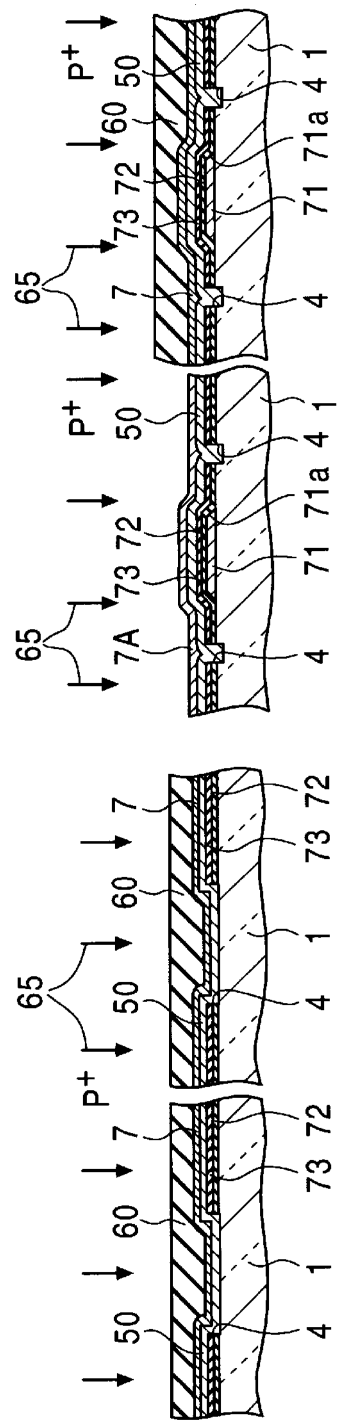

Since the concentration of the p-type impurity fluctuates, the p-channel MOSTFT sections are masked with a photoresist layer (not shown in the drawing) and are doped with p-type impurity ions such as $B^+$ at 10 kV and at a dose of $2.7\times10^{11}$ atoms/$cm^2$ to adjust specific resistance. With reference to FIG. 37I, in order to control the concentration of the impurity in the pMOSTFT-forming regions, the nMOSTFT sections are masked with a photoresist layer 60 and are doped with n-type impurity ions 65 such as $P^+$ at 10 kV and at a dose of $1\times10^{11}$ atoms/$cm^2$ to form n-type wells 7A.

Figure 38J:
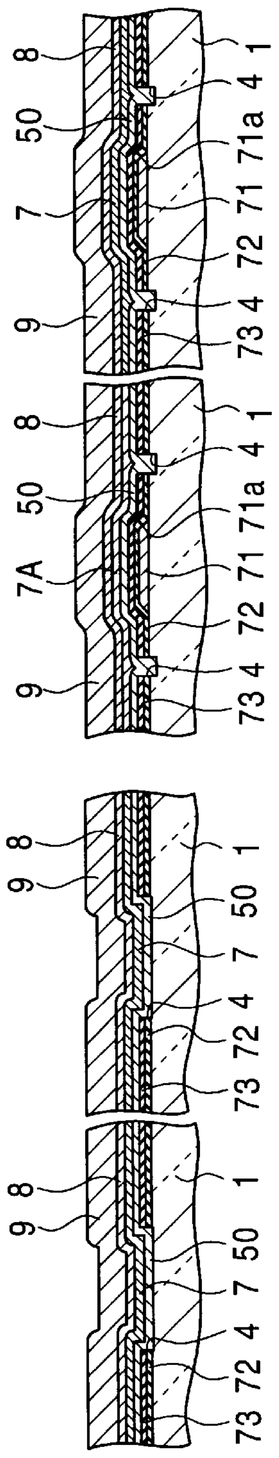

With reference to FIG. 38J, $SiO_2$ having a thickness of approximately 200 nm and SiN having a thickness of approximately 100 nm are continuously deposited in this order on the entire surface of the single-crystal silicon layer 7, and a molybdenum-tantalum (Mo—Ta) alloy sputtered film 9 having a thickness of 500 to 600 nm is formed thereon by the same method as the first embodiment.

Figure 38K:
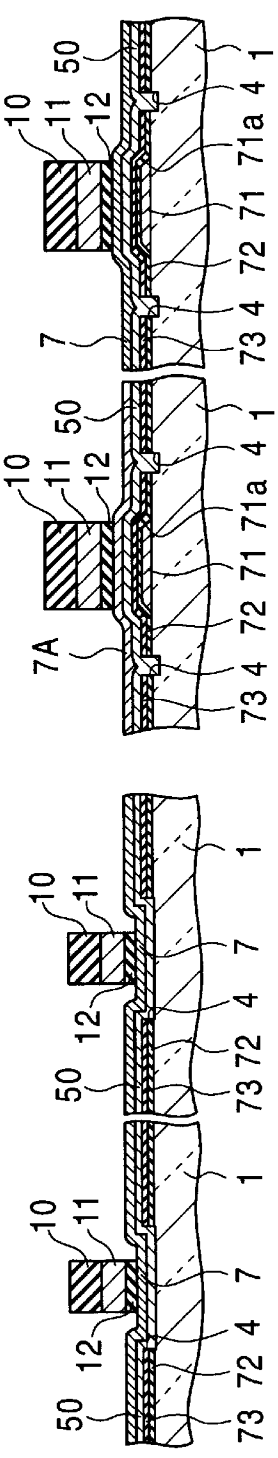

With reference to FIG. 38K, a photoresist pattern 10 is formed at the interior of the step difference regions (indented sections) of the TFT sections in the display region and at the exterior of the step difference regions (indented sections) of the TFT sections of the peripheral driving region by any conventional photolithographic process. By continuous etching, gate electrodes 11 of the Mo—Ta alloy and gate insulating films 12 of SiN—$SiO_2$ are formed, and the single-crystal silicon layer 7 is exposed.

Figure 38L:
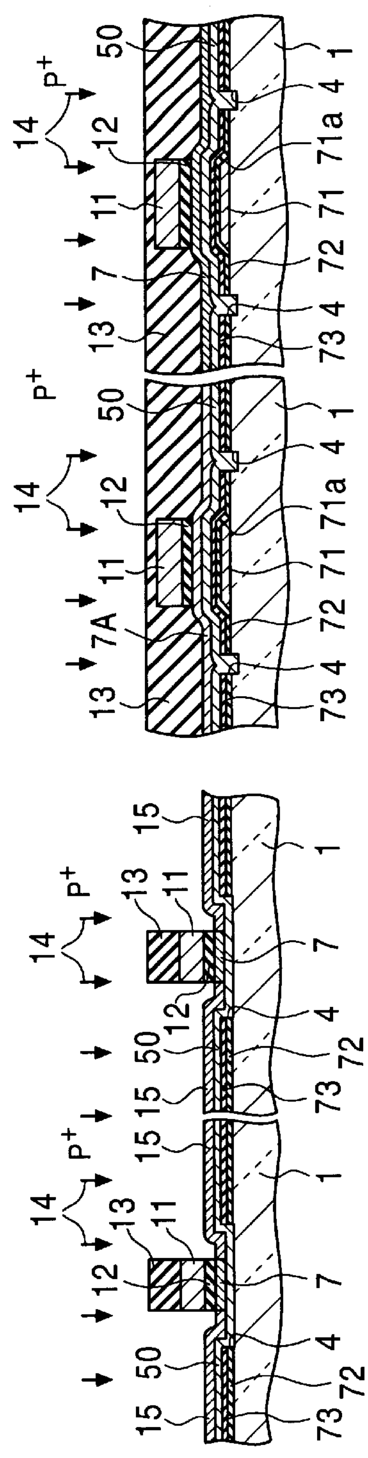

With reference to FIG. 38L, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 39M:
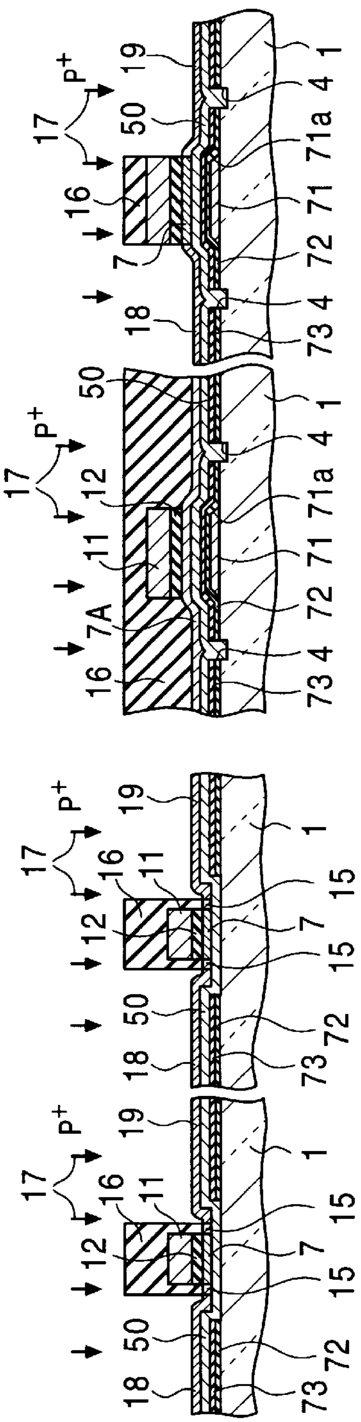

With reference to FIG. 39M, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs.

Figure 39N:
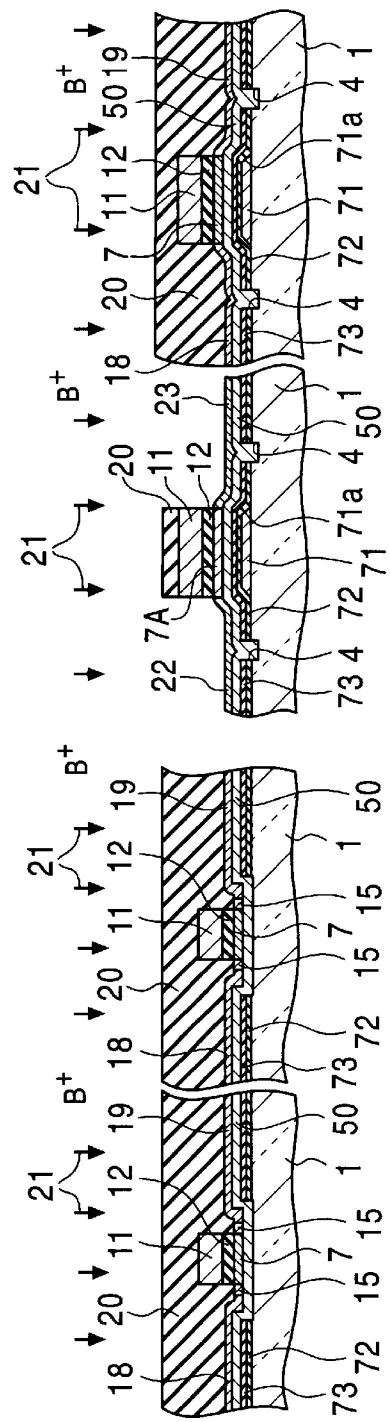

With reference to FIG. 39N, all of the nMOSTFTs in the peripheral driving region and the display region and the gate sections of the pMOSTFTs are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 39O:
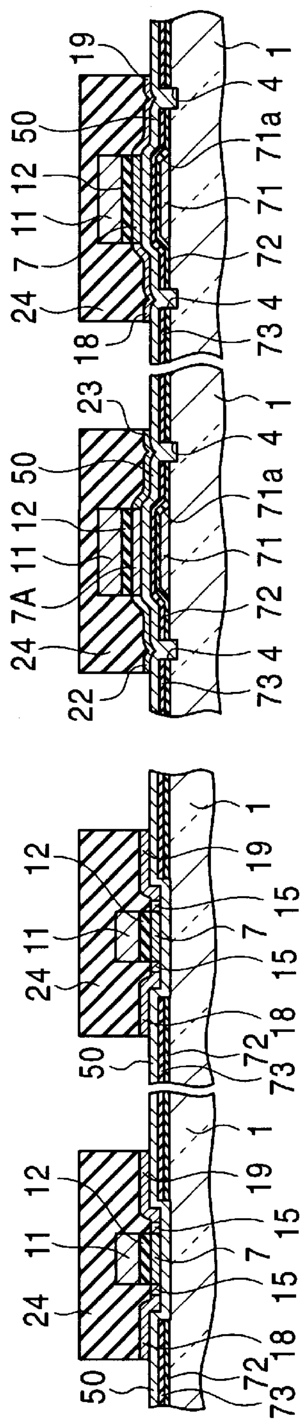

With reference to FIG. 39O, in order to island the active device sections including TFTs and diodes and the passive device sections including resistors and inductors, photoresist layers 24 are provided on all of the active device sections and the passive device sections in the peripheral driving section and the display section, and the single-crystal silicon layer 7 in other sections is removed by the same method as the first embodiment.

Figure 40P:
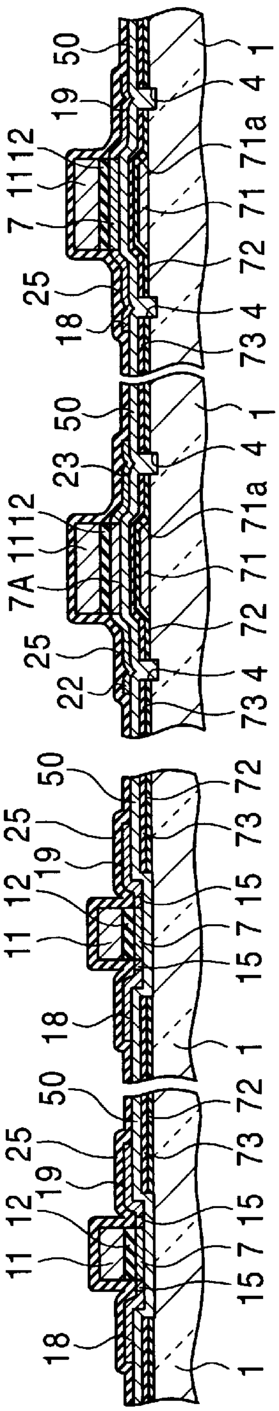

With reference to FIG. 40P, a $SiO_2$ film having a thickness of approximately 200 nm and a phosphosilicate glass (PSG) film having a thickness of approximately 300 nm are continuously deposited in this order to form a protective film 25 over the entire surface.

In this state, the single-crystal silicon layer is activated in the same manner as the first embodiment.

Figure 40Q:
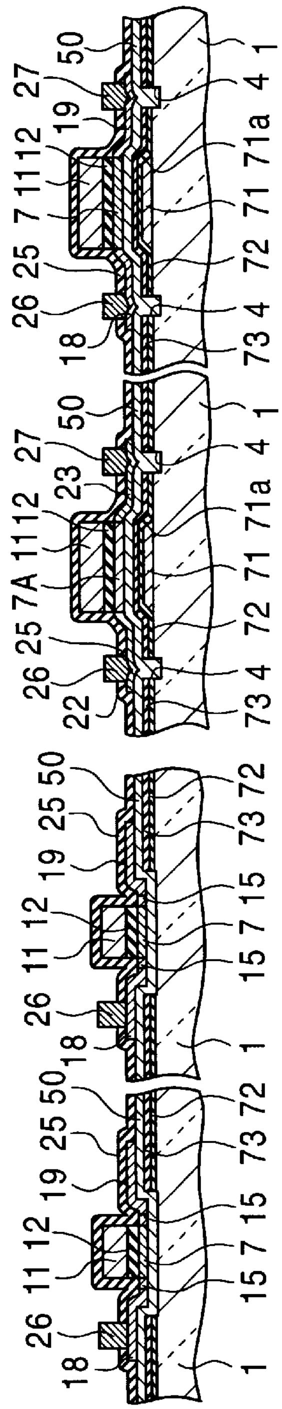

With reference to FIG. 40Q, contact holes are formed in all of the source-drain sections of the TFTs in the peripheral driving circuit and the source sections of the TFTs in the display region.

A sputtered film of aluminum, an aluminum alloy, for example, aluminum containing Si or copper, copper, or the like is formed over the entire surface, and source electrodes 26 of all TFTs in the peripheral driving circuit section and the display section and drain electrodes 27 in the peripheral driving circuit section are formed by the same method as the first embodiment. At the same time, data lines and gate lines are formed, and then these are subjected to sintering.

Figure 40R:
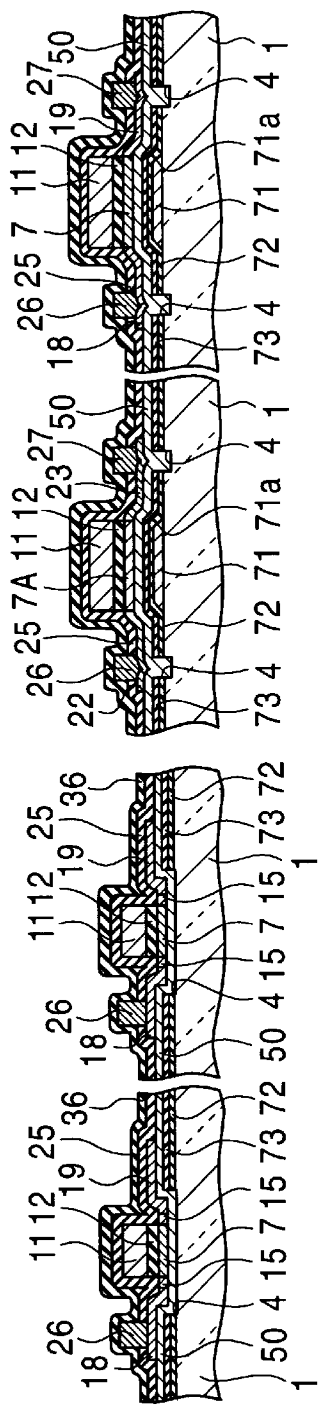

With reference to FIG. 40R, an insulating film 36 composed of a PSG film with a thickness of approximately 300 nm and a SiN film with a thickness of approximately 300 nm is formed on the entire surface, and then contact holes are formed in the drain sections of TFTs in the display region in the same manner as the first embodiment.

Figure 41S:
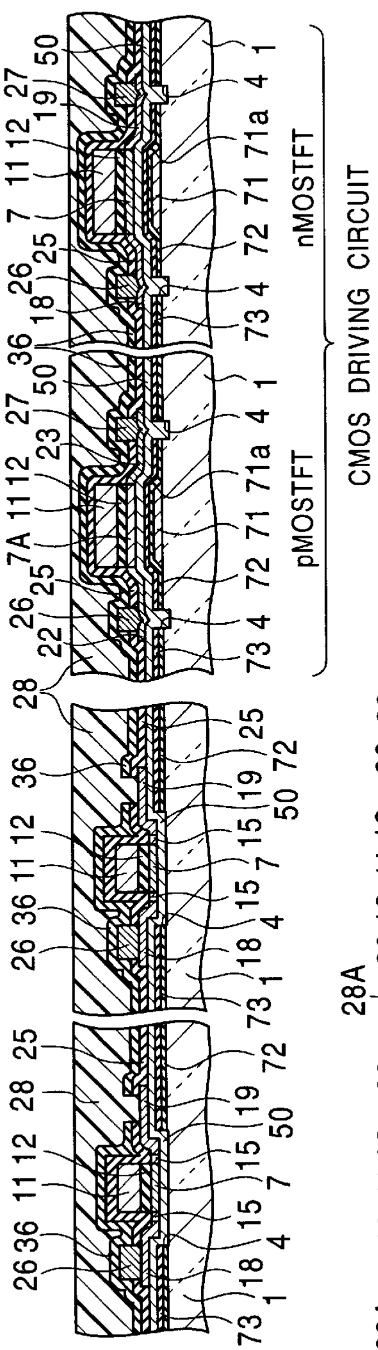
Figure 41T:
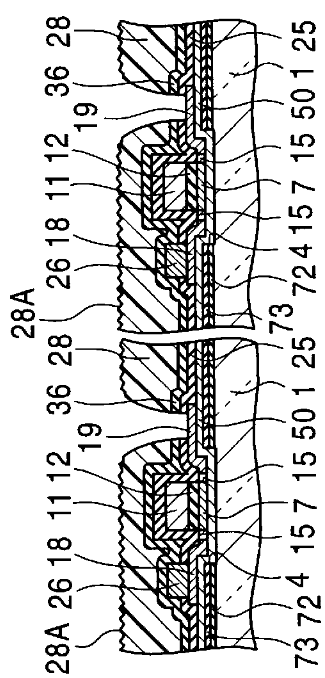

For the same reason as described above in the first embodiment, a reflector must be designed on the assumption that a point light source is located at any position. As shown in FIG. 41S, a photosensitive resin film 28 having a thickness of 2 to 3 $\mu$m is formed on the entire surface by spin coating. Next, as shown in FIG. 41T, an uneven pattern is formed in at least the pixel region and then subjected to reflow to form a lower portion of the reflective face of an uneven surface 28A by the same method as the first embodiment. At the same time, contact holes are formed in the resin film in the drain sections of TFTs in the display region.

Figure 41U:
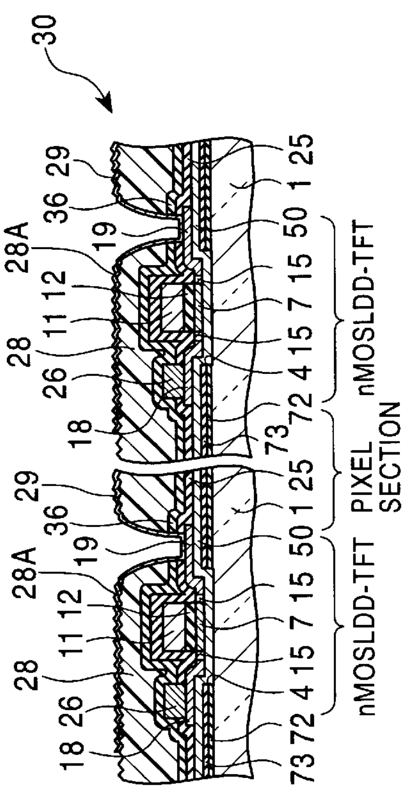

With reference to FIG. 41U, a sputtered film of aluminum, aluminum containing Si, or the like, which has a thickness of 400 to 500 nm, is deposited on the entire surface, and then removed from regions other than the pixel sections by a general photolithographic process and an etching process to form uneven aluminum reflective sections 29 which are connected to the drain sections 19 of the display TFTs. Next, these are subjected to sintering at approximately 300° C. for 1 hour in a forming gas to achieve sufficient contact. Silver or a silver alloy may be used instead of the aluminum system to increase the reflectance.

As described above, the single-crystal silicon layer 7 is formed by high-temperature heteroepitaxy using the sapphire thin film 50 including the step differences 4 as the seed, and top-gate nMOSLDD-TFT and CMOS circuits each comprising dual-gate pMOSTFT and nMOSTFT can be formed in the display section and the peripheral-driving-circuit section, respectively, each of which comprises the single-crystal silicon layer 7, to produce an active matrix substrate 30 in which the display section and the peripheral-driving-circuit section are integrated.

The method for making a reflective liquid crystal display (LCD) using the active-matrix substrate (driving substrate) 30 of this embodiment is the same as the first embodiment.

The method according to the fifth embodiment has an additional advantage. Since the dual-gate type MOSTFT is used in the peripheral-driving circuit in this embodiment, the cMOSTFT, nMOSTFT, and pMOSTFT have a drive capability which is 1.5 to 2 times higher than that of single-gate types. Thus, the dual-gate MOSTFTs are suitable for a peripheral driving circuit requiring TFTs having high drive capability. Moreover, this configuration can be readily changeable to top-gate types or bottom-gate types by selecting the upper or lower gate section. If one of the upper and lower gate sections does not work, the other can be used.

Sixth Embodiment

Figure 42C:
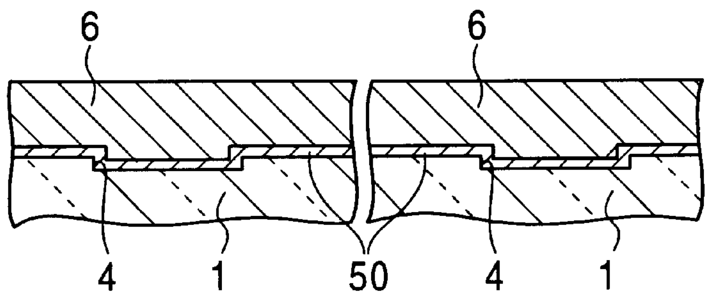
FIGS. 42C to 42E are cross-sectional views illustrating production steps of a liquid crystal display (LCD) in accordance with a sixth embodiment of the present invention.
Figure 42D:
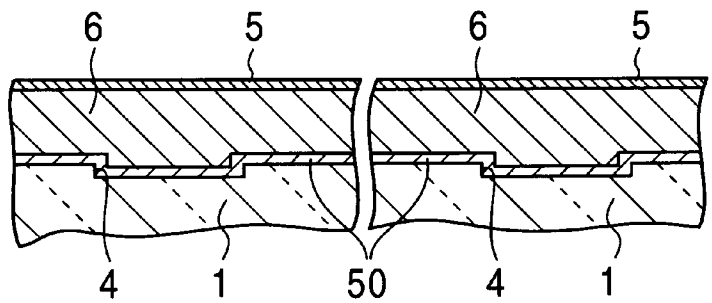
Figure 42E:
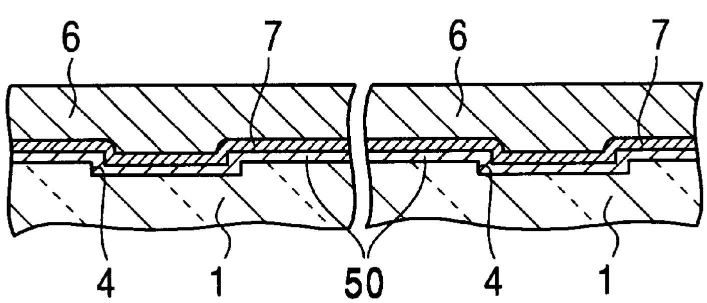

FIGS. 42C to 42E show a sixth embodiment of the present invention.

The sixth embodiment also relates to an active matrix reflective LCD as in the above first to third embodiments. This embodiment differs from the first to third embodiments, as follows. As shown in FIG. 42C, for example, an indium film 6 with a thickness of 10 to 20 $\mu$m is formed on the entire surface of the crystalline sapphire thin film 50 including the steps 4, subsequent to the step shown in FIG. 1B in the first embodiment, the step shown in FIG. 15E in the second embodiment, or the step shown in FIG. 22E in the third embodiment. The indium film 6 may be replaced with an indium-gallium film or a gallium film. Hereinafter, the indium film will be described as a typical example in this embodiment.

With reference to FIG. 42D, an amorphous silicon film 5 having a thickness of several $\mu$m to 0.005 $\mu$m (for example, 0.1 $\mu$m) is formed on the indium film 6 by a known plasma-enhanced CVD process.

Since the temperature for forming the silicon film must not significantly exceed the melting point of the low-melting-point metal 6 (156° C. for indium or 29.77° C. for gallium), this temperature is lower than the temperature (600° C. to 650° C.) suitable for the formation of the polycrystalline silicon film. Thus, the amorphous silicon film 5 is formed on the indium film 6 by a plasma-enhanced CVD process.

The substrate 1 is heated in a hydrogen atmosphere to 1,000° C. or less (particularly 900 to 930° C.) for approximately 5 minutes so that the amorphous silicon film 5 is dissolved in the indium melt.

With reference to FIG. 42E, the substrate 1 is gradually cooled so that the silicon dissolved in the indium melt is deposited by heteroepitaxy on the substrate 1 using the crystalline sapphire thin-film 50 and the step differences 4 as seeds. A single-crystal silicon layer 7 having a thickness of approximately 0.1 μm is thereby formed.

Also, in this case, the (100) plane of the single-crystal silicon layer 7 is deposited by heteroepitaxy and the orientation of the crystal layer can be controlled by changing the shape of the step differences, as shown in FIGS. 9A to 9F.

After the deposition of the single-crystal silicon layer 7 by heteroepitaxy, indium at the surface is removed by hydrochloric acid as in the first to third embodiments, and TFTs in the display section and the peripheral-driving-circuit section are produced by the step for treating the single-crystal silicon layer 7.

In this embodiment, the low-melting-point metal 6 is formed on the step difference 4, the amorphous silicon layer 5 is formed thereon, followed by melting the low-melting-point metal 6 and cooling the melt. The single-crystal silicon can also be formed by heteroepitaxy from the melt of the low-melting-point metal in this embodiment.

Seventh Embodiment

With reference to FIGS. 43S to 45U, a seventh embodiment of the present invention will now be described.

Figure 43S:
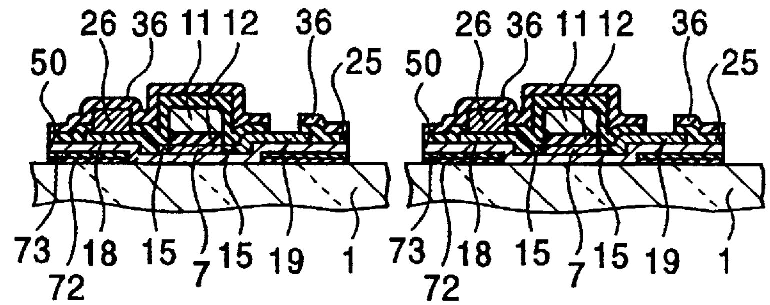
FIGS. 43S to 43U are cross-sectional views illustrating production steps of a liquid crystal display (LCD) in accordance with a seventh embodiment of the present invention.

In this embodiment, the display section has top-gate MOSTFTs and the peripheral-driving-circuit section has bottom-gate MOSTFTs, as in the fourth and fifth embodiments, but unlike these embodiments, this embodiment relates to a transmissive LCD. This embodiment includes the same steps as those shown in FIGS. 28A to 33R in the fourth embodiment or in FIGS. 35A to 40R in the fifth embodiment, but in the subsequent process, contact holes 19 of the drain sections for TFTs in the display section are formed in insulating films 25 and 36, as shown in FIG. 43S, and the unnecessary $SiO_2$, PSG, and Si films in the pixel-opening section are removed to improve the transmittance.

Figure 43T:
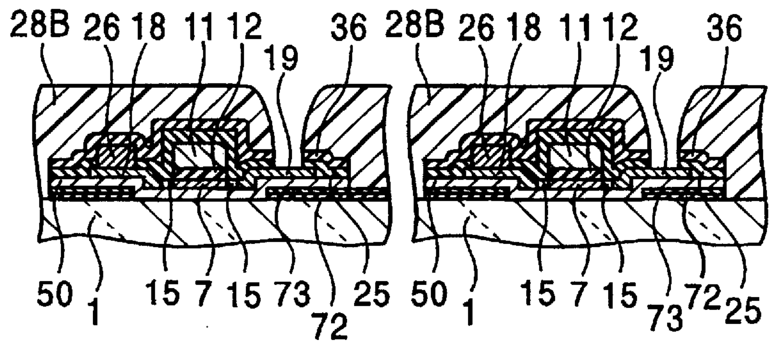

With reference to FIG. 43T, a planarization film 28B, which is composed of an acrylic photosensitive transparent resin and has a thickness of 2 to 3 μm, is formed on the entire surface by spin coating etc., and then contact holes for drains of TFTs in the displaying section (display TFTs) are formed in the transparent resin 28B by general photolithography. The transparent resin 28B is cured at a given condition.

Figure 43U:
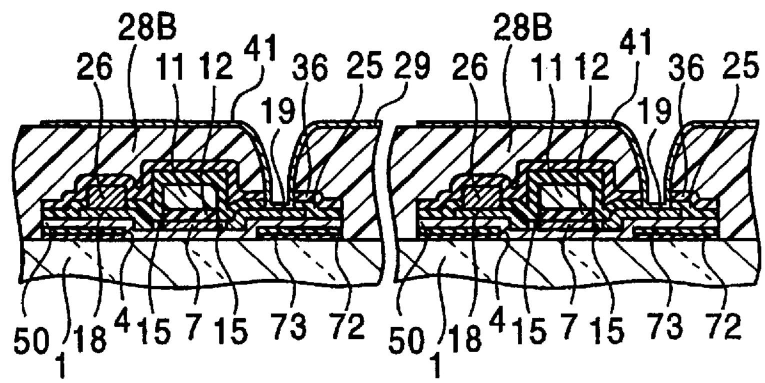

With reference to FIG. 43U, an ITO film having a thickness of 130 to 150 nm is formed on the entire surface by sputtering, and then an ITO transparent electrode 41 in contact with the drain section 19 in the display region is formed by general photolithography and etching. Next, annealing in a forming gas at 200 to 250° C. for 1 hour is performed to reduce the contact resistance between the drain of each TFT in the display section and the ITO and to improve the transparency of the ITO.

Figure 44:
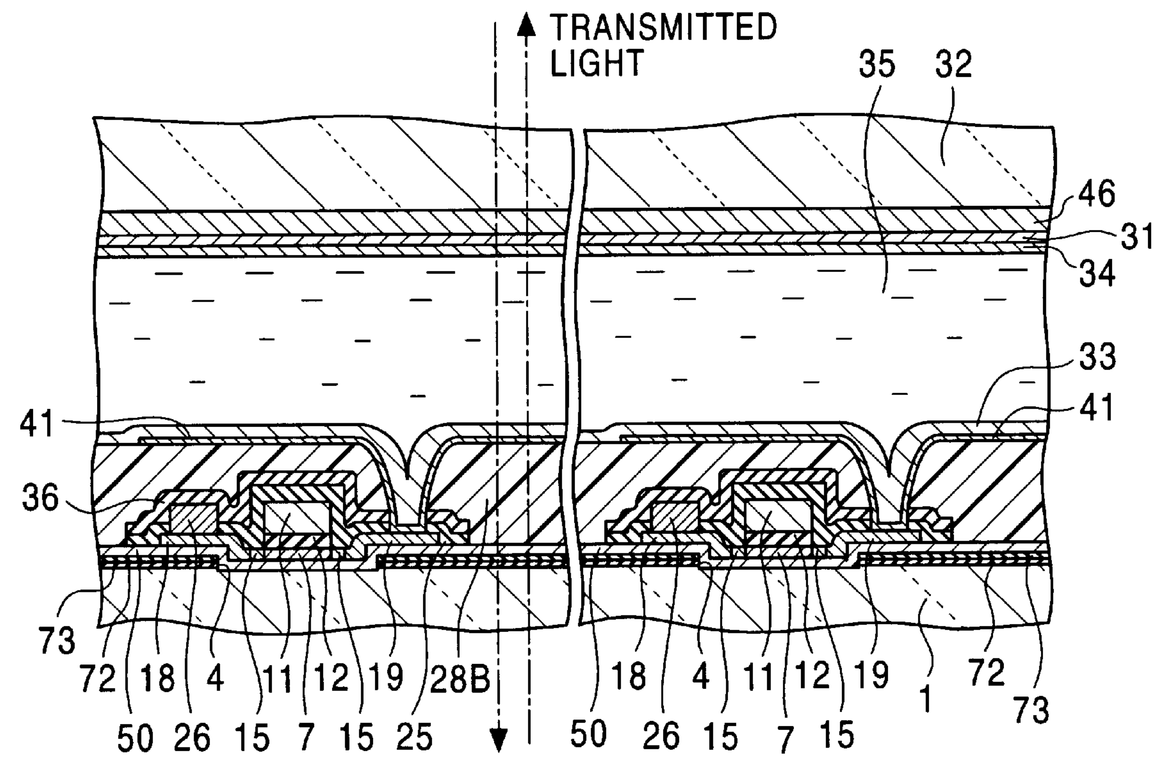
FIG. 44 is a cross-sectional view illustrating a main portion of the liquid crystal display (LCD) in accordance with the seventh embodiment of the present invention.

With reference to FIG. 44, this TFT substrate 1 and a counter substrate 32 are assembled into a transmissive LCD as in the fourth or fifth embodiment. In this embodiment, a polarizer is also provided on the TFT substrate. Although transmitted light from the TFT substrate 1 is used in this transmissive LCD as shown by a solid line in the drawing, transmission light from the counter substrate 32 may be used.

An on-chip color-filter (OCCF) structure and an on-chip black (OCB) structure may be made in this transmissive LCD, as follows.

Figure 45R:
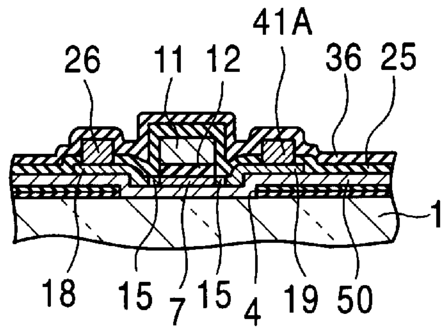
FIGS. 45R to 45U are cross-sectional views illustrating production steps of the liquid crystal display (LCD) in accordance with the seventh embodiment of the present invention.

After performing the steps shown in FIGS. 28A to 33Q, a contact hole is also formed at the drain section of the PSG-$SiO_2$ insulating film 25 as shown in FIG. 45R, and an aluminum layer 41A for a drain electrode is formed. Next, a SiN-PSG insulating film 36 is formed.

Figure 45S:
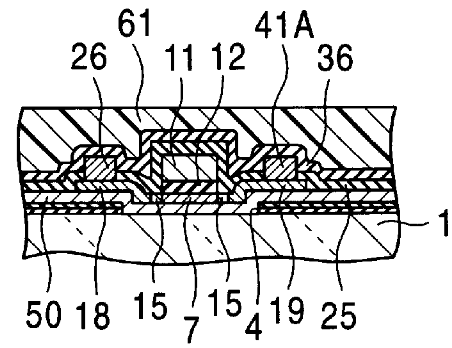
Figure 45T:
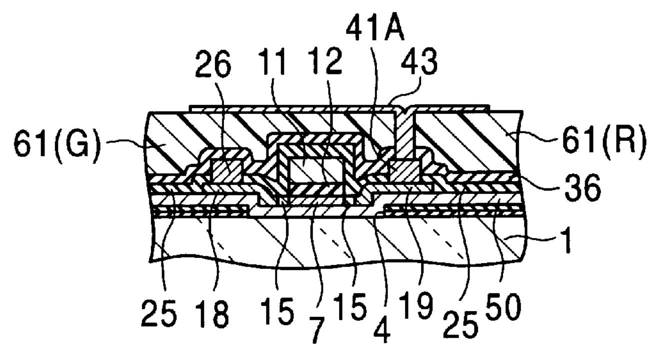

With reference to FIG. 45S, a photoresist layer 61 containing a red, green or blue pigment having a thickness of 1 to 1.5 μm is formed on the corresponding color segments. With reference to FIG. 45T, color filter layers 61(R), 61(G) and 61(B) are formed by a general photolithographic process (OCCF structure). Contact holes are also formed at the drain sections. An opaque ceramic substrate or a translucent glass or heat-resistant resin substrate cannot be used in this embodiment.

With reference to FIG. 45T, a metal shading layer 43 as a black mask layer is formed over the contact holes connecting to the drains of the display TFTs and over the color filter layers by a patterning process. For example, a molybdenum film having a thickness of 200 to 250 nm is formed by a sputtering process and is then patterned into a given shape for shading the display TFTs (OCB structure).

Figure 45U:
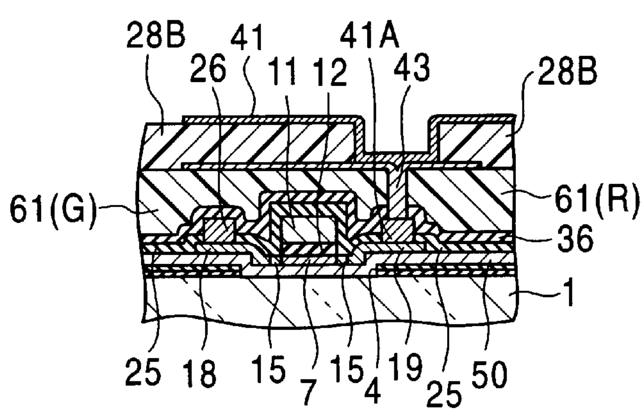

With reference to FIG. 45U, a planarization film 28B composed of a transparent resin is formed, and then an ITO transparent electrode 41 is formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

Eighth Embodiment

Figure 46C:
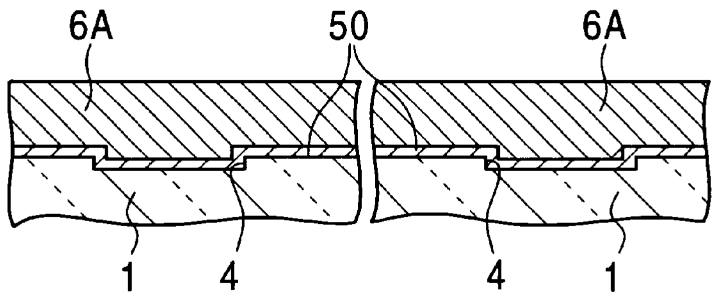
FIGS. 46C and 46D are cross-sectional views illustrating production steps of a liquid crystal display (LCD) in accordance with an eighth seventh embodiment of the present invention.
Figure 46D:
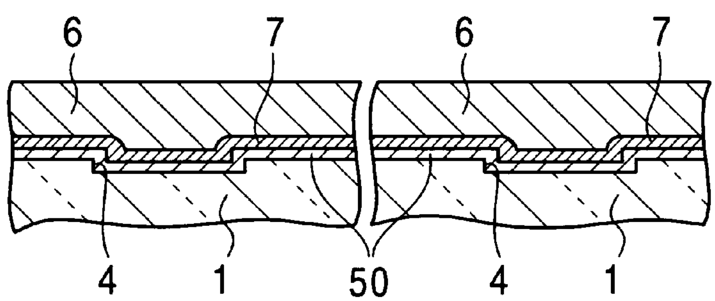

FIGS. 46C and 46D show an eighth embodiment of the present invention.

The eighth embodiment relates to the same active matrix reflective LCD as the first embodiment. However, unlike the first embodiment, after the step shown in FIG. 1B, an indium film 6A containing a predetermined amount of silicon, for example, about 1% by weight of silicon, is formed to a thickness of, for example, 10 to 20 μm over the entire surface of a crystalline sapphire thin film 50 including step differences 4 by the sputtering or vacuum evaporation process, as shown in FIG. 46C.

Then, the substrate 1 is maintained at 1,000° C. or less, preferably 900 to 930° C., in a hydrogen-based atmosphere for about 5 minutes so that the silicon is melted in an indium melt.

With reference to FIG. 46D, the melt is gradually cooled so that silicon melted in the indium melt is heteroepitaxially grown by using the crystalline sapphire thin film 50 including the step differences 4 as a seed to deposit a single-crystal silicon layer 7 having a thickness of, for example, about 0.1 μm.

In this embodiment, the single-crystal silicon layer 7 is formed by heteroepitaxy of the (100) plane on the substrate in the same manner as described above. However, the crystal orientation of the grown layer can be controlled by changing the shape of the step differences 4 to the various shapes shown in FIGS. 9A to 9F.

After the single-crystal silicon layer 7 is deposited on the substrate 1 by heteroepitaxy, indium on the surface is removed by dissolution with hydrochloric acid, as in the first embodiment. Furthermore, the single-crystal layer 7 is subjected to the step of performing predetermined processing to produce TFTs in each of the display section and the peripheral-driving circuit section.

In this embodiment, the low-melting-point metal layer 6A containing silicon is formed on the step differences 4, melted by heating and then cooled. However, heteroepitaxy of single-crystal silicon from the melt of the low-melting-point metal is the same as the above-mentioned embodiments.

Ninth Embodiment

Figure 47F:
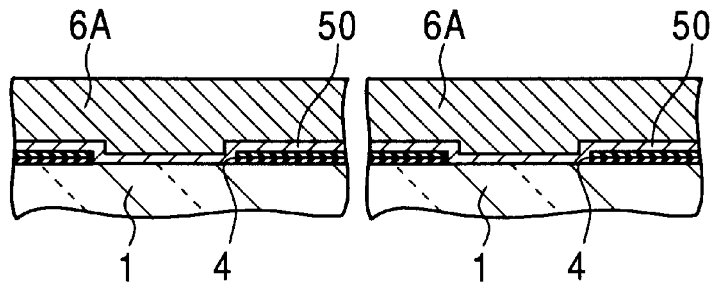
FIGS. 47F and 47G are cross-sectional views illustrating production steps of a liquid crystal display (LCD) in accordance with a ninth seventh embodiment of the present invention.
Figure 47G:
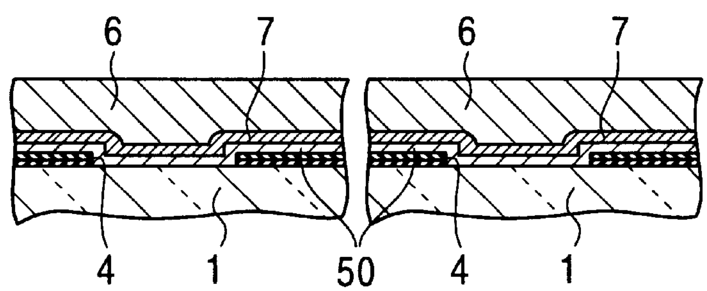

FIGS. 47F and 47G show a ninth embodiment of the present invention.

The ninth embodiment is identical to the second and third embodiments except that, as shown in FIG. 47F, an indium layer 6A having a thickness in the range of 10 to 20 μm and containing a predetermined amount, for example, about 1% by weight, of silicon is formed over the entire surface of the crystalline sapphire film 50 including the step differences 4 by sputtering process or vacuum evaporation process subsequent to the step shown in FIG. 15E.

Then, the substrate 1 is maintained at 1,000° C. or less, preferably 900 to 930° C., in a hydrogen-based atmosphere for about 5 minutes so that the silicon is melted in an indium melt.

With reference to FIG. 47G, the melt is gradually cooled so that silicon melted in the indium melt is heteroepitaxially grown by using the crystalline sapphire thin film 50 including the step differences 4 as a seed to deposit a single-crystal silicon layer 7 having a thickness of, for example, about 0.1 μm.

In this embodiment, the single-crystal silicon layer 7 is formed by heteroepitaxy of the (100) plane on the substrate in the same manner as described above. However, the crystal orientation of the grown layer can be controlled by changing the shape of the step differences 4 to the various shapes shown in FIGS. 9A to 9F.

After the single-crystal silicon layer 7 is deposited on the substrate 1 by heteroepitaxy, indium on the surface is removed by dissolution with hydrochloric acid, as in the first embodiment. Furthermore, the single-crystal layer 7 is subjected to the step of performing predetermined processing to produce TFTs in each of the display section and the peripheral-driving circuit section.

In this embodiment, the low-melting-point metal layer 6A containing silicon is formed on the step differences 4, melted by heating and then cooled. However, heteroepitaxy of single-crystal silicon from the melt of the low-melting-point metal is the same as the above-mentioned embodiments.

Tenth Embodiment

With reference to FIG. 48Q to FIG. 50S, a tenth embodiment of the present invention will be described.

Figure 48Q:
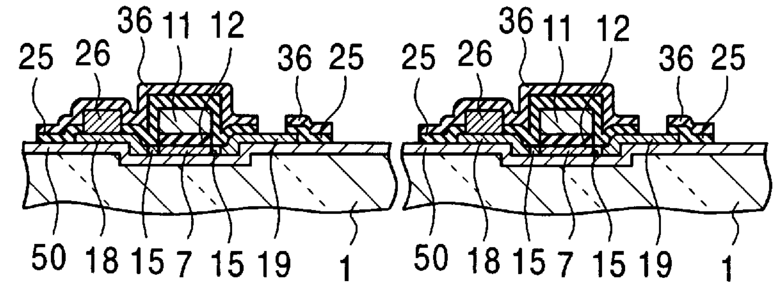
FIGS. 48Q to 48S are cross-sectional views illustrating production steps of a liquid crystal display (LCD) in accordance with a tenth embodiment of the present invention.

This embodiment relates to a transmissive LCD including a display section and a peripheral-driving circuit section which have top-gate MOSTFTs as in the first embodiment. That is, in this embodiment, the transmissive LCD is produced by the steps shown in FIG. 1A to FIG. 5P, as in the first embodiment. In the subsequent process, contact holes 19 of the drain sections for TFTs in the display section are formed in insulating films 25 and 36, as shown in FIG. 48Q, and the unnecessary $SiO_2$ film, PSG film and Si film in the pixel-opening section are removed to improve the transmittance.

Figure 48R:
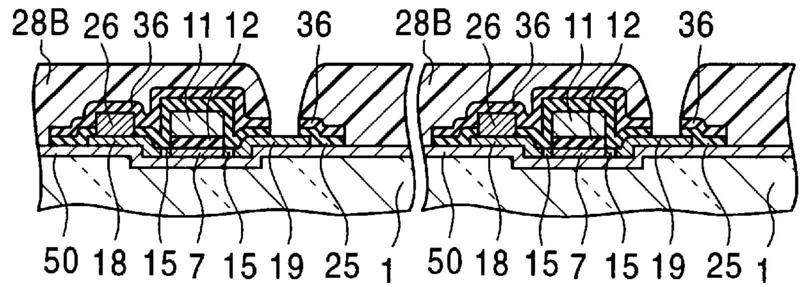

With reference to FIG. 48R, a planarization film 28B, which is composed of an acrylic photosensitive transparent resin and has a thickness of 2 to 3 μm, is formed on the entire surface by spin coating etc., and then contact holes for drains of TFTs in the displaying section (display TFTs) are formed in the transparent resin 28B. The transparent resin 28B is cured at a given condition.

Figure 48S:
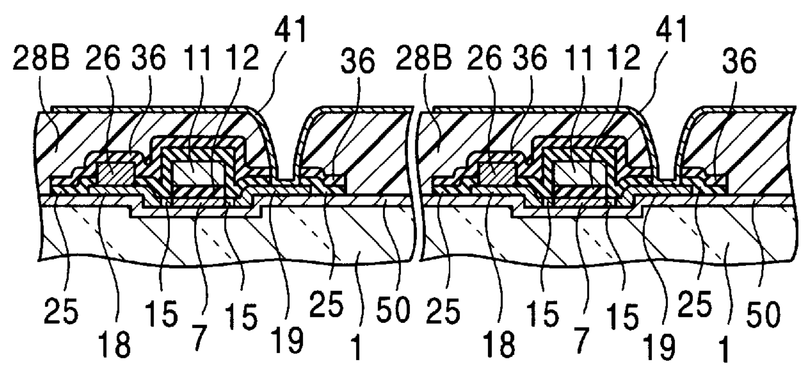

With reference to FIG. 48S, an ITO film having a thickness of 130 to 150 nm is formed on the entire surface by sputtering, and then an ITO transparent electrode 41 in contact with the drain section 19 of the TFT in the display region is formed by photolithography and etching. Next, annealing in a forming gas at 200 to 250° C. for 1 hour is performed to reduce the contact resistance between the drain of each TFT in the display section and the ITO and to improve the transparency of the ITO.

Figure 49:
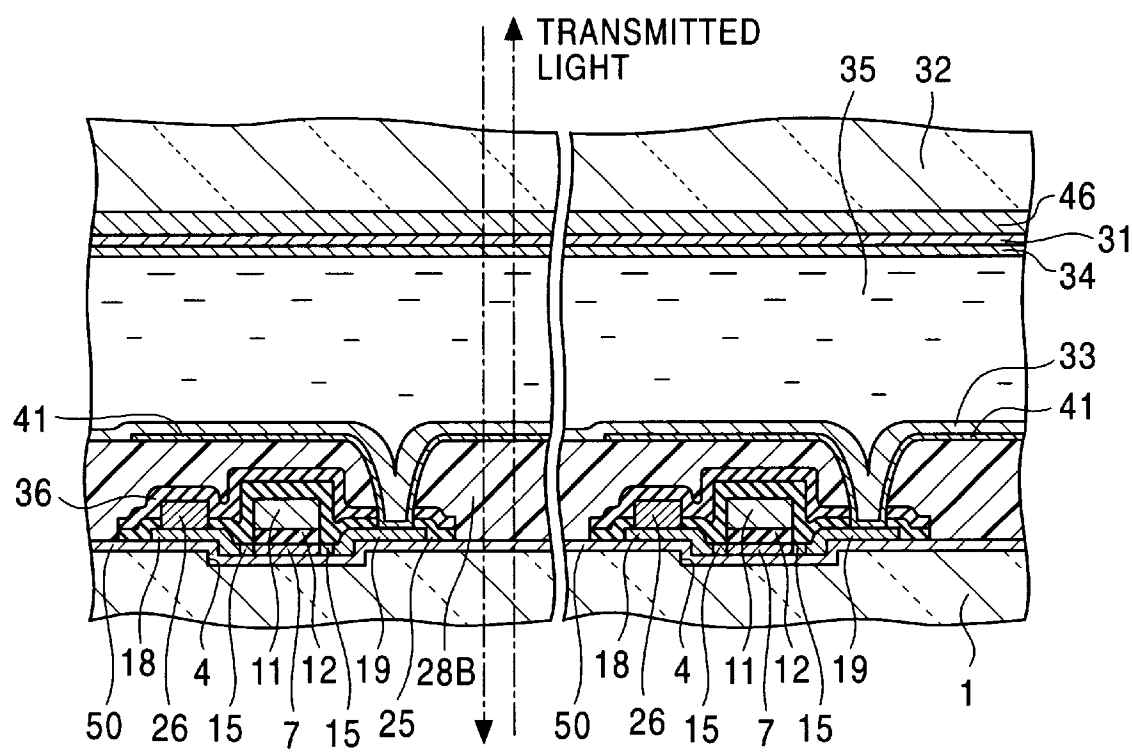
FIG. 49 is a cross-sectional view illustrating a main portion of the liquid crystal display (LCD) in accordance with the tenth embodiment of the present invention.

With reference to FIG. 49, this TFT substrate 1 and a counter substrate 32 are assembled into a transmissive LCD as in the first embodiment. In this embodiment, a polarizer is also provided on the TFT substrate. Although transmission light from the TFT substrate 1 is used in this transmissive LCD as shown by a solid line in the drawing, transmission light from the counter substrate 32 may also be used.

An on-chip color-filter (OCCF) structure and an on-chip black (OCB) structure may be made from this transmissive LCD, as follows.

Figure 50P:
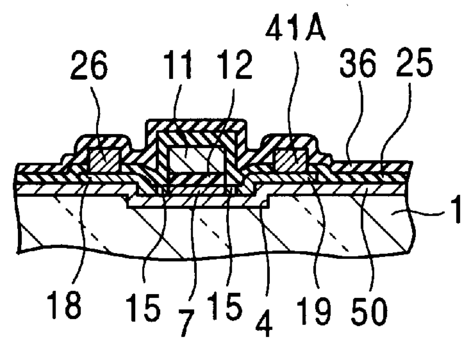
FIGS. 50P to 50S are cross-sectional views illustrating production steps of the liquid crystal display (LCD) in accordance with the tenth embodiment of the present invention.

After performing the steps shown in FIGS. 1A to 50, contact holes are also formed at the drain sections of the PSG-$SiO_2$ insulating film 25 as shown in FIG. 50P, and an aluminum layer 41A for a drain electrode is formed. Next, a SiN-PSG insulating film 36 is formed.

Figure 50Q:
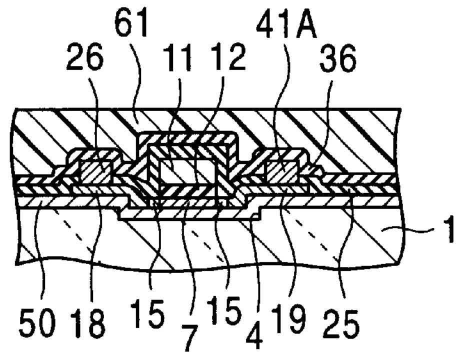
Figure 50R:
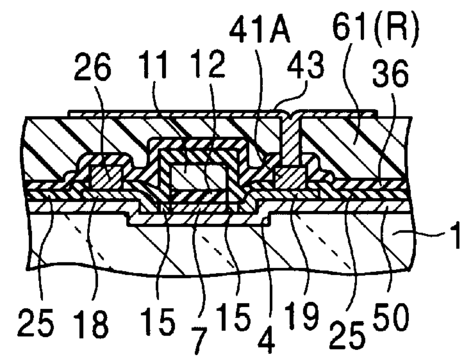

With reference to FIG. 50Q, a photoresist layer 61 containing a red, green or blue pigment having a thickness of 1 to 1.5 μm is formed on the corresponding color segments. With reference to FIG. 50R, color filter layers 61(R), 61(G) and 61(B) are formed by a general photolithographic process (OCCF structure). Contact holes are also formed at the drain sections. An opaque ceramic substrate or a translucent glass or heat-resistant resin substrate cannot be used in this embodiment.

With reference to FIG. 50R, a metal shading layer 43 as a black mask layer is formed over the contact holes connecting to the drains of the display TFTs and over the color filter layers by a patterning process. For example, a molybdenum film having a thickness of 200 to 250 nm is formed by a sputtering process and is then patterned to form a given shape for shading the display TFTs (OCB structure).

Figure 50S:
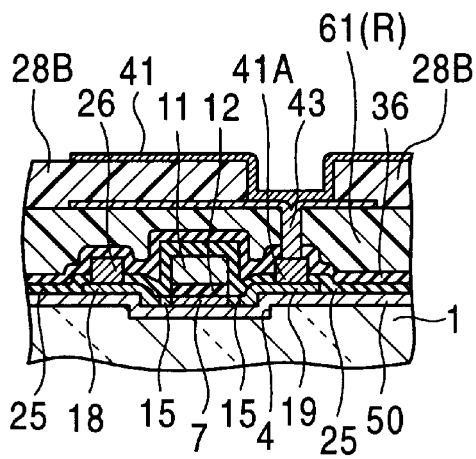

With reference to FIG. 50S, a planarization film 28B composed of a transparent resin is formed, and then an ITO transparent electrode 41 is formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

Eleventh Embodiment

With reference to FIG. 51T to FIG. 53V, an eleventh embodiment of the present invention will be described.

Figure 51T:
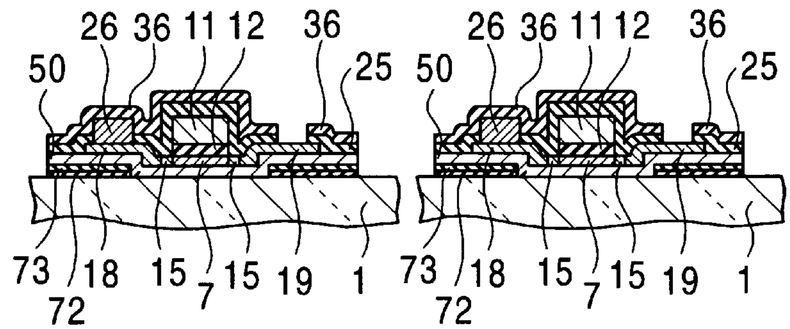
FIGS. 51T to 51V are cross-sectional views illustrating production steps of a liquid crystal display (LCD) in accordance with an eleventh embodiment of the present invention.

This embodiment relates to a transmissive LCD including a display section having top-gate MOSTFTs and a peripheral-driving circuit section having bottom-gate MOSTFTs as in the second embodiment. That is, in this embodiment, the transmissive LCD is produced by the steps shown in FIG. 14A to FIG. 19S, as in the second embodiment. In the subsequent process, contact holes 19 of the drain sections for TFTs in the display section are formed in insulating films 25 and 36, as shown in FIG. 51T, and the unnecessary $SiO_2$ film, PSG film and Si film in the pixel-opening section are removed to improve the transmittance.

Figure 51U:
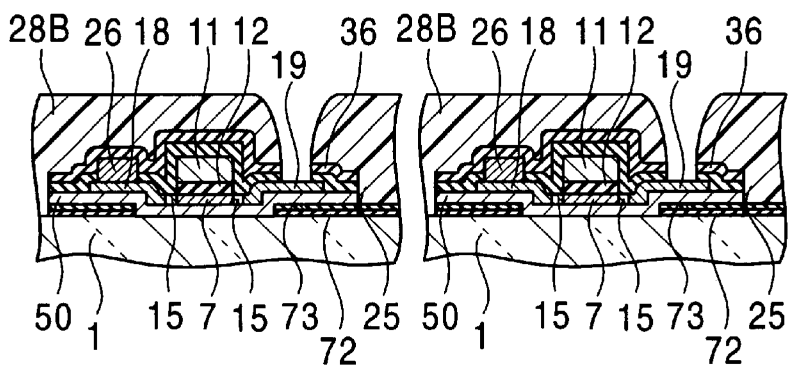

With reference to FIG. 51U, a planarization film 28B, which is composed of an acrylic photosensitive transparent resin and has a thickness of 2 to 3 μm, is formed on the entire surface by spin coating etc., and then contact holes for drains of TFTs in the displaying section (display TFTs) are formed in the transparent resin 28B. The transparent resin 28B is cured at a given condition.

Figure 51V:
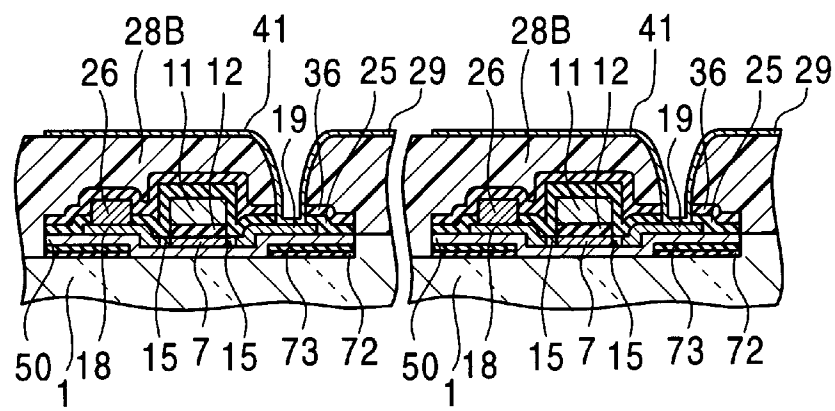

With reference to FIG. 51V, an ITO film having a thickness of 130 to 150 nm is formed on the entire surface by sputtering, and then an ITO transparent electrode 41 in contact with the drain section 19 of the TFT in the display region is formed by photolithography and etching. Next, annealing in a forming gas at 200 to 250° C. for 1 hour is performed to reduce the contact resistance between the drain of each TFT in the display section and the ITO and to improve the transparency of the ITO.

Figure 52:
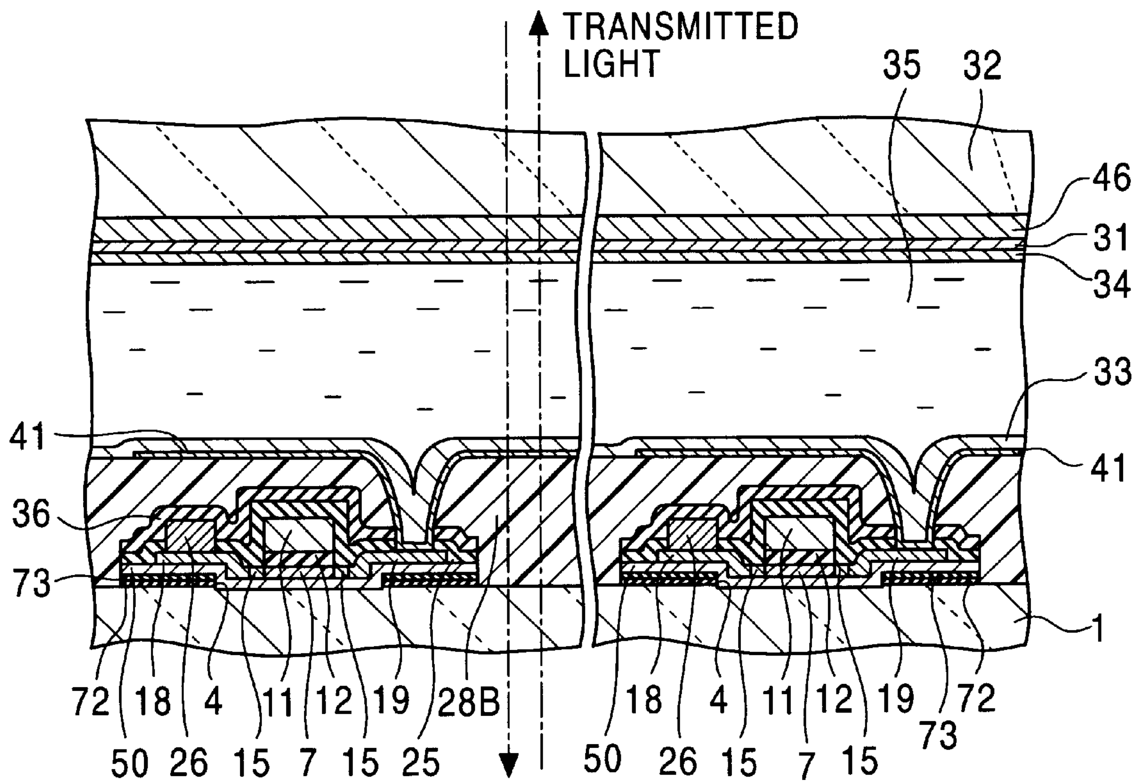
FIG. 52 is a cross-sectional view illustrating a main portion of the liquid crystal display (LCD) in accordance with the eleventh embodiment of the present invention.

With reference to FIG. 52, this TFT substrate 1 and a counter substrate 32 are assembled into a transmissive LCD as in the first embodiment. In this embodiment, a polarizer is also provided on the TFT substrate. Although transmission light from the TFT substrate 1 is used in this transmissive LCD as shown by a solid line in the drawing, transmission light from the counter substrate 32 may also be used.

An on-chip color-filter (OCCF) structure and an on-chip black (OCB) structure may be made from this transmissive LCD, as follows.

Figure 53S:
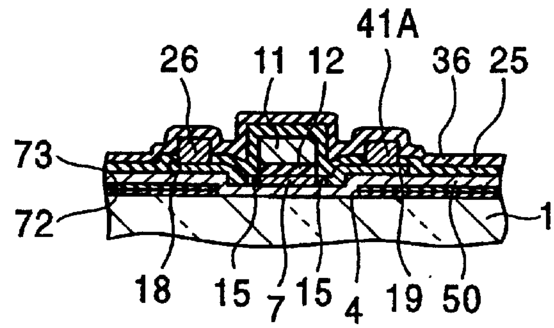
FIGS. 53S to 53V are cross-sectional views illustrating production steps of the liquid crystal display (LCD) in accordance with the eleventh embodiment of the present invention.

After performing the steps shown in FIGS. 14A to 19R, contact holes are also formed at the drain sections of the PSG-$SiO_2$ insulating film 25 as shown in FIG. 53S, and an aluminum layer 41A for a drain electrode is formed. Next, a SiN-PSG insulating film 36 is formed.

Figure 53T:
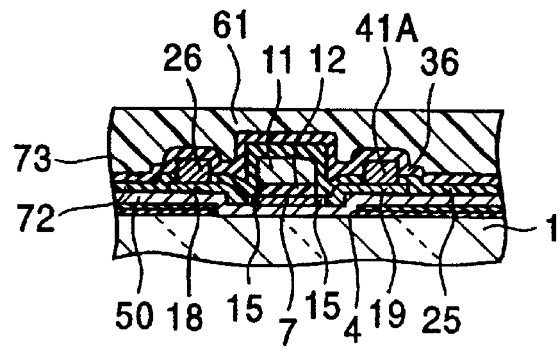
Figure 53U:
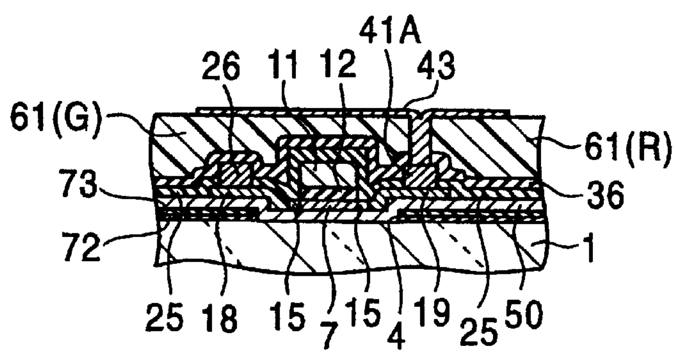

With reference to FIG. 53T, a photoresist layer 61 containing a red, green or blue pigment having a thickness of 1 to 1.5 μm is formed on the corresponding color segments. With reference to FIG. 53U, color filter layers 61(R), 61(G) and 61(B) are formed by a general photolithographic process (OCCF structure). Contact holes are also formed at the drain sections. An opaque ceramic substrate or a translucent glass or heat-resistant resin substrate cannot be used in this embodiment.

With reference to FIG. 53U, a metal shading layer 43 as a black mask layer is formed over the contact holes connecting to the drains of the display TFTs and over the color filter layers by a patterning process. For example, a molybdenum film having a thickness of 200 to 250 nm is formed by a sputtering process and is then patterned to form a given shape for shading the display TFTs (OCB structure).

Figure 53V:
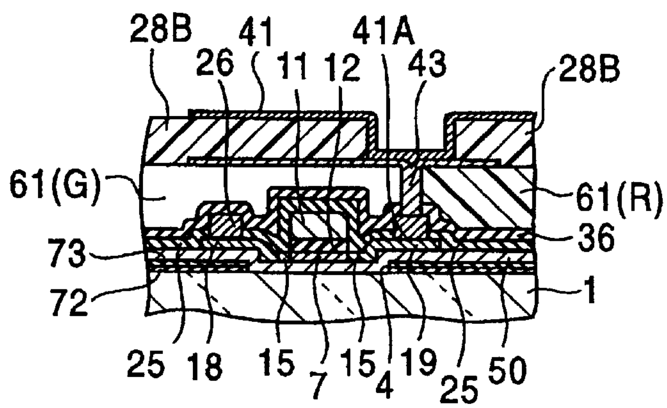

With reference to FIG. 53V, a planarization film 28B composed of a transparent resin is formed, and then an ITO transparent electrode 41 is formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

Twelfth Embodiment

With reference to FIG. 51T to FIG. 53V, a twelfth embodiment of the present invention will be described.

This embodiment relates to a transmissive LCD including a display section having top-gate MOSTFTs and a peripheral-driving circuit section having dual-gate MOSTFTs as in the third embodiment. That is, in this embodiment, the transmissive LCD is produced by the steps shown in FIG. 21A to FIG. 26S, as in the third embodiment. In the subsequent process, contact holes 19 of the drain sections for TFTs in the display section are formed in insulating films 25 and 36, as shown in FIG. 51T, and the unnecessary $SiO_2$ film, PSG film and Si film in the pixel-opening section are removed to improve the transmittance.

With reference to FIG. 51U, a planarization film 28B, which is composed of an acrylic photosensitive transparent resin and has a thickness of 2 to 3 μm, is formed on the entire surface by spin coating etc., and then contact holes for drains of TFTs in the displaying section (display TFTs) are formed in the transparent resin 28B. The transparent resin 28B is cured at a given condition.

With reference to FIG. 51V, an ITO film having a thickness of 130 to 150 nm is formed on the entire surface by sputtering, and then an ITO transparent electrode 41 in contact with the drain section 19 of the TFT in the display region is formed by photolithography and etching. Next, annealing in a forming gas at 200 to 250° C. for 1 hour is performed to reduce the contact resistance between the drain of each TFT in the display section and the ITO and to improve the transparency of the ITO.

With reference to FIG. 52, this TFT substrate 1 and a counter substrate 32 are assembled into a transmissive LCD as in the first embodiment. In this embodiment, a polarizer is also provided on the TFT substrate. Although transmission light from the TFT substrate 1 is used in this transmissive LCD as shown by a solid line in the drawing, transmission light from the counter substrate 32 may also be used.

An on-chip color-filter (OCCF) structure and an on-chip black (OCB) structure may be made from this transmissive LCD, as follows.

After performing the steps shown in FIGS. 21A to 26R, contact holes are also formed at the drain sections of the PSG-$SiO_2$ insulating film 25 as shown in FIG. 53S, and an aluminum layer 41A for a drain electrode is formed. Next, a SiN-PSG insulating film 36 is formed.

With reference to FIG. 53T, a photoresist layer 61 containing a red, green or blue pigment having a thickness of 1 to 1.5 μm is formed on the corresponding color segments. With reference to FIG. 53U, color filter layers 61(R), 61(G) and 61(B) are formed by a general photolithographic process (OCCF structure). Contact holes are also formed at the drain sections. An opaque ceramic substrate or a translucent glass or heat-resistant resin substrate cannot be used in this embodiment.

With reference to FIG. 53U, a metal shading layer 43 as a black mask layer is formed over the contact holes connecting to the drains of the display TFTs and over the color filter layers by a patterning process. For example, a molybdenum film having a thickness of 200 to 250 nm is formed by a sputtering process and is then patterned to form a given shape for shading the display TFTs (OCB structure).

With reference to FIG. 53V, a planarization film 28B composed of a transparent resin is formed, and then an ITO transparent electrode 41 is formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

Thirteenth Embodiment

A thirteenth embodiment of the present invention will be described.

The thirteenth embodiment relates to an active-matrix reflective liquid crystal display (LCD) comprising top-gate MOSTFTs formed by using a single-crystal silicon layer which is heteroepitaxially grown from an indium-gallium-silicon or gallium silicon melt at low temperature using, as a seed, a crystalline sapphire film 50 formed on a surface including a step difference (indented section) 4 provided on a low-distortion-point glass substrate 1.

More particularly, the substrate 1 used in this embodiment in the step shown in FIG. 1A is a glass substrate having a low distortion point or maximum usable temperature of 600° C., such as borosilicate glass or aluminosilicate glass, unlike the first embodiment. Such a glass is inexpensive and can easily be produced in large sizes. For example, a thin and large glass substrate of 500 mm×600 mm×0.1 to 1.1 mm can be formed using long rolled glass. Also, quartz and crystallized glass may be used.

After forming the step differences 4, the crystalline sapphire film 50, and a polysilicon film 5 and in the step shown in FIG. 1D, an indium-gallium film (or a gallium film) is formed on the polysilicon film 5 by a MOCVD, sputtering or vacuum evaporation process using trimethyl indium gallium or trimethyl gallium to the thickness of several ten to several hundred times the thickness of the polycrystalline silicon film 5, for example, 10 to 20 μm.

The substrate 1 is then heated in a hydrogen atmosphere to 300 to 600° C. (or 420 to 600° C.) and maintained for 5 minutes. The polycrystalline silicon 6 (or amorphous silicon) is dissolved into the indium-gallium or gallium melt. Silicon in the melt precipitates at a temperature significantly lower than the temperature at which pure silicon precipitates.

When the substrate 1 is gradually cooled, as shown in FIG. 2E, silicon dissolved in indium-gallium (or gallium) is heteroepitaxially deposited on the bottom corners of the step differences 4 as a seed to form a single-crystal silicon layer 7 having a thickness of, for example, 0.1 μm.

In this case, the (100) plane of the single-crystal silicon layer 7 is heteroepitaxially deposited. As shown in FIGS. 9A to 9F, the orientation of the crystal layer can be controlled by changing the shape of the step differences 4.

After the deposition of the single-crystal silicon layer 7 by low-temperature heteroepitaxy, indium and gallium at the surface are removed by hydrochloric acid or sulfuric acid, as shown in FIG. 2F.

Using the single-crystal silicon layer 7, top-gate MOSTFTs are formed in the display section and the peripheral-driving-circuit section, as in the first embodiment. The structure shown in FIG. 7 may also be employed in this embodiment.

This embodiment has the following noticeable advantages, in addition to the advantages in the first embodiment.

(A) The single-crystal silicon layer 7 can be more uniformly formed on the glass substrate 1 by heteroepitaxy at a lower temperature of approximately 300 to 600° C. (or 420 to 600° C).

(B) This process enables the formation of the single-crystal silicon layer on an insulating substrate such as an organic substrate, as well as on the glass substrate. That is, any inexpensive material having a low distortion point and improved physical properties can be used as the substrate. A large substrate can be readily produced. Accordingly, a thin, long and rolled glass or organic substrate provided with a single-crystal silicon layer can be produced using such a material with high productivity. When the constituents in the glass substrate are diffused into the upper layer and affect the transistor characteristics, a thin barrier layer, for example, a silicon nitride layer having a thickness of 50 to 200 nm, is preferably provided.

(C) In the low-temperature heteroepitaxy, a single-crystal silicon layer having a variety of p-type impurity concentrations and a high mobility can be readily produced by controlling the ratio of indium to gallium of the indium-gallium film, the heating temperature of the substrate, and the cooling rate. Thus, the threshold voltage ($V_{th}$) can be readily controlled and the resulting low resistance facilitates high-speed operation.

Fourteenth Embodiment

A fourteenth embodiment of the present invention will be described.

The fourteenth embodiment relates to an active-matrix reflective liquid crystal display (LCD) comprising bottom-gate MOSTFTs formed by using a single-crystal silicon layer which is heteroepitaxially grown from an indium-gallium-silicon or gallium silicon melt at low temperature using, as a seed, a crystalline sapphire film 50 formed on a surface including a step difference (indented section) 4 provided on a low-distortion-point glass substrate 1.

Unlike the above-described second embodiment, the substrate 1 used in this embodiment in the step shown in FIG. 14A is a glass substrate having a low distortion point or maximum usable temperature of 600° C., such as borosilicate glass or aluminosilicate glass. Such a glass is inexpensive and can easily be produced in large sizes. For example, a thin and large glass substrate of 500 mm×600 mm×0.1 to 1.1 mm can be formed using long rolled glass. Also, quartz and crystallized glass may be used.

After forming the step differences 4, the crystalline sapphire film 50, and a polysilicon film 5, in the step shown in FIG. 15G, an indium-gallium film (or a gallium film) is formed on the polysilicon film 5 by a MOCVD, sputtering or vacuum evaporation process using trimethyl indium gallium or trimethyl gallium to the thickness of several ten to several hundred times the thickness of the polycrystalline silicon film 5, for example, 10 to 20 μm.

The substrate 1 is then heated in a hydrogen atmosphere to 300 to 600° C. (or 420 to 600° C.) and maintained for 5 minutes. The polycrystalline silicon 6 (or amorphous silicon) is dissolved into the indium-gallium or gallium melt. Silicon in the melt precipitates at a temperature significantly lower than the temperature at which pure silicon precipitates.

When the substrate 1 is gradually cooled, as shown in FIG. 16H, silicon dissolved in indium-gallium (or gallium) is heteroepitaxially deposited on the bottom corners of the step differences 4 as a seed to form a single-crystal silicon layer 7 having a thickness of, for example, 0.1 μm.

In this case, the (100) plane of the single-crystal silicon layer 7 is heteroepitaxially deposited. As shown in FIGS. 9A to 9F, the orientation of the crystal layer can be controlled by changing the shape of the step differences 4.

After the deposition of the single-crystal silicon layer 7 by low-temperature heteroepitaxy, indium and gallium at the surface are removed by hydrochloric acid or sulfuric acid, as shown in FIG. 16I.

Using the single-crystal silicon layer 7, bottom-gate MOSTFTs are formed in the display section and the peripheral-driving-circuit section, as in the second embodiment. The structure shown in FIG. 7 may also be employed in this embodiment.

This embodiment has the same noticeable advantages as does the thirteenth embodiment, in addition to the advantages in the second embodiment.

Fifteenth Embodiment

A fifteenth embodiment of the present invention will be described.

The fifteenth embodiment relates to an active-matrix reflective liquid crystal display (LCD) comprising dual-gate MOSTFTs formed by using a single-crystal silicon layer which is heteroepitaxially grown from an indium-gallium-silicon or gallium silicon melt at low temperature using, as a seed, a crystalline sapphire film 50 formed on a surface including a step difference (indented section) 4 provided on a low-distortion-point glass substrate 1.

Unlike the above-described third embodiment, the substrate 1 used in this embodiment in the step shown in FIG. 21A is a glass substrate having a low distortion point or maximum usable temperature of 600° C., such as borosilicate glass or aluminosilicate glass. Such a glass is inexpensive and can easily be produced in large sizes. For example, a thin and large glass substrate of 500 mm×600 mm×0.1 to 1.1 mm can be formed using long rolled glass. Also, quartz and crystallized glass may be used.

As in the third embodiment, after forming the step differences 4, the crystalline sapphire film 50, and a polysilicon film 5, an indium-gallium film (or a gallium film) is formed on the polysilicon film 5 by a MOCVD, sputtering or vacuum evaporation process using trimethyl indium gallium or trimethyl gallium to the thickness of several ten to several hundred times the thickness of the polycrystalline silicon film 5, for example, 10 to 20 μm in the step shown in FIG. 22G.

The substrate 1 is then heated in a hydrogen atmosphere to 300 to 600° C. (or 420 to 600° C.) and maintained for 5 minutes. The polycrystalline silicon 6 (or amorphous silicon) is dissolved into the indium-gallium or gallium melt. Silicon in the melt precipitates at a temperature significantly lower than the temperature at which pure silicon precipitates.

When the substrate 1 is gradually cooled, as shown in FIG. 23H, silicon dissolved in indium-gallium (or gallium) is heteroepitaxially deposited on the bottom corners of the step differences 4 as a seed to form a single-crystal silicon layer 7 having a thickness of, for example, 0.1 μm.

In this case, the (100) plane of the single-crystal silicon layer 7 is heteroepitaxially deposited. As shown in FIGS. 9A to 9F, the orientation of the crystal layer can be controlled by changing the shape of the step differences 4.

After the deposition of the single-crystal silicon layer 7 by low-temperature heteroepitaxy, indium and gallium at the surface are removed by hydrochloric acid or sulfuric acid, as shown in FIG. 23I.

Using the single-crystal silicon layer 7, dual-gate MOSTFTs are formed in the display section and the peripheral-driving-circuit section, as in the third embodiment. The structure shown in FIG. 7 may also be employed in this embodiment.

This embodiment has the same noticeable advantages as does the thirteenth embodiment, in addition to the advantages in the third embodiment.

Sixteenth Embodiment

A sixteenth embodiment of the present invention will be described.

The sixteenth embodiment relates to an active-matrix reflective liquid crystal display (LCD) comprising bottom-gate MOSTFTs formed by using a single-crystal silicon layer which is heteroepitaxially grown from an indium-gallium-silicon or gallium silicon melt at low temperature using, as a seed, a crystalline sapphire film 50 formed on a surface including a step difference (indented section) 4 provided on a low-distortion-point glass substrate 1.

Unlike the above-described fourth embodiment, the substrate 1 used in this embodiment in the step shown in FIG. 28A is a glass substrate having a low distortion point or maximum usable temperature of 600° C., such as borosilicate glass or aluminosilicate glass. Such a glass is inexpensive and can easily be produced in large sizes. For example, a thin and large glass substrate of 500 mm×600 mm×0.1 to 1.1 mm can be formed using long rolled glass. Also, quartz and crystallized glass may be used.

As in the fourth embodiment, after forming the step differences 4 and the crystalline sapphire film 5, an indium-gallium melt (or a gallium melt) is applied on the crystalline sapphire film 50 in the step shown in FIG. 29F.

When the substrate 1 is gradually cooled, as shown in FIG. 30G, silicon dissolved in indium-gallium (or gallium) is heteroepitaxially deposited on the bottom corners of the step differences 4 as a seed to form a single-crystal silicon layer 7 having a thickness of, for example, 0.1 μm.

In this case, the (100) plane of the single-crystal silicon layer 7 is heteroepitaxially deposited. As shown in FIGS. 9A to 9F, the orientation of the crystal layer can be controlled by changing the shape of the step differences 4.

After the deposition of the single-crystal silicon layer 7 by low-temperature heteroepitaxy, indium and gallium at the surface are removed by hydrochloric acid or sulfuric acid, as shown in FIG. 30H.

Using the single-crystal silicon layer 7, bottom-gate MOSTFTs are formed in the display section and the peripheral-driving-circuit section, as in the fourth embodiment. The structure shown in FIG. 7 may also be employed in this embodiment.

This embodiment has the same noticeable advantages as does the thirteenth embodiment, in addition to the advantages in the fourth embodiment.

Seventeenth Embodiment

A seventeenth embodiment of the present invention will be described.

The seventeenth embodiment relates to an active-matrix reflective liquid crystal display (LCD) comprising dual-gate MOSTFTs formed by using a single-crystal silicon layer which is heteroepitaxially grown from an indium-gallium-silicon or gallium silicon melt at low temperature using, as a seed, a crystalline sapphire film 50 formed on a surface including a step difference (indented section) 4 provided on a low-distortion-point glass substrate 1.

Unlike the above-described fifth embodiment, the substrate 1 used in this embodiment in the step shown in FIG. 35A is a glass substrate having a low distortion point or maximum usable temperature of 600° C., such as borosilicate glass or aluminosilicate glass. Such a glass is inexpensive and can easily be produced in large sizes. For example, a thin and large glass substrate of 500 mm×600 mm×0.1 to 1.1 mm can be formed using long rolled glass. Also, quartz and crystallized glass may be used.

As in the fifth embodiment, after forming the step differences 4 and the crystalline sapphire film 5, an indium-gallium melt (or a gallium melt) is applied on the crystalline sapphire film 50 in the step shown in FIG. 36F.

When the substrate 1 is gradually cooled, as shown in FIG. 37G, silicon dissolved in indium-gallium (or gallium) is heteroepitaxially deposited on the bottom corners of the step differences 4 as a seed to form a single-crystal silicon layer 7 having a thickness of, for example, 0.1 μm.

In this case, the (100) plane of the single-crystal silicon layer 7 is heteroepitaxially deposited. As shown in FIGS. 9A to 9F, the orientation of the crystal layer can be controlled by changing the shape of the step differences 4.

After the deposition of the single-crystal silicon layer 7 by low-temperature heteroepitaxy, indium and gallium at the surface are removed by hydrochloric acid or sulfuric acid, as shown in FIG. 37H.

Using the single-crystal silicon layer 7, dual-gate MOSTFTs are formed in the display section and the peripheral-driving-circuit section, as in the fifth embodiment. The structure shown in FIG. 7 may also be employed in this embodiment.

This embodiment has the same noticeable advantages as does the thirteenth embodiment, in addition to the advantages in the fifth embodiment.

Eighteenth Embodiment

An eighteenth embodiment of the present invention is described.

Unlike the above-mentioned thirteenth to seventeenth embodiments, the eighteenth embodiment relates to a transmissive LCD. However, the manufacturing process of this embodiment comprises forming a single-crystal silicon thin film by low-temperature heteroepitaxy using an indium-gallium film, as in the seventh and tenth to twelfth embodiments.

A transmissive LCD can be manufactured through the steps shown in FIGS. 48Q to 50S (tenth embodiment), FIGS. 51T to 53V (eleventh and twelfth embodiments), or FIGS. 43S to 45U (seventh embodiment). However, an opaque ceramic substrate, or an opaque or low-transmittance organic plate is unsuitable for the transmissive LCD.

Therefore, this embodiment has the excellent advantages of the seventh and eleven to seventeenth embodiments. Namely, this embodiment has not only the same advantages as the first to fifth embodiments but also the following advantages.

A substrate which can be thinned and elongated at low cost, such as a borosilicate glass substrate, an organic substrate of heat-resistant polyimide or the like, can be used as the substrate 1. The conduction type and Vth of the single-crystal thin film 7 can easily be controlled by controlling the indium/gallium composition ratio. The color filter 42 and the black mask 43 formed on the display array section improve the aperture ratio of the liquid crystal display panel and realize low electrical power consumption of the display module including a back light.

Nineteenth Embodiment

FIGS. 54A to 64T show a nineteenth embodiment of the present invention. In this embodiment, the peripheral-driving-circuit section includes a CMOS driving circuit including top-gate pMOSTFTs and nMOSTFTs as in the first embodiment, bottom-gate pMOSTFTs and nMOSTFTs as in the second embodiment, or dual-gate pMOSTFTs and nMOSTFTs as in the third embodiment. The display section is a reflective type and includes TFTs having various gate configurations.

Figures 54A, 54B, 54C:
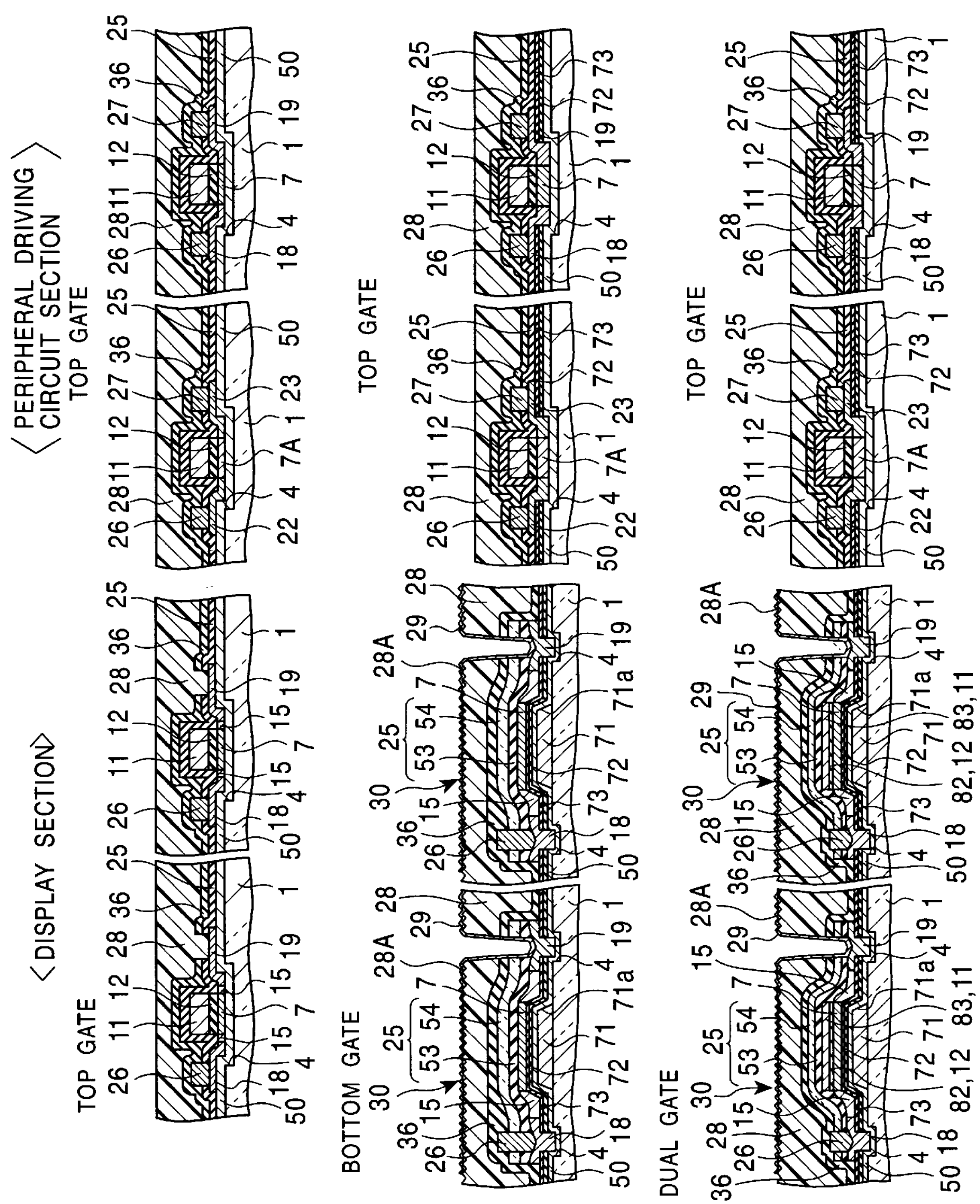
FIGS. 54A to 54C are cross-sectional views illustrating production steps of a liquid crystal display (LCD) in accordance with a nineteenth embodiment of the present invention.
Figures 55A, 55B, 55C:
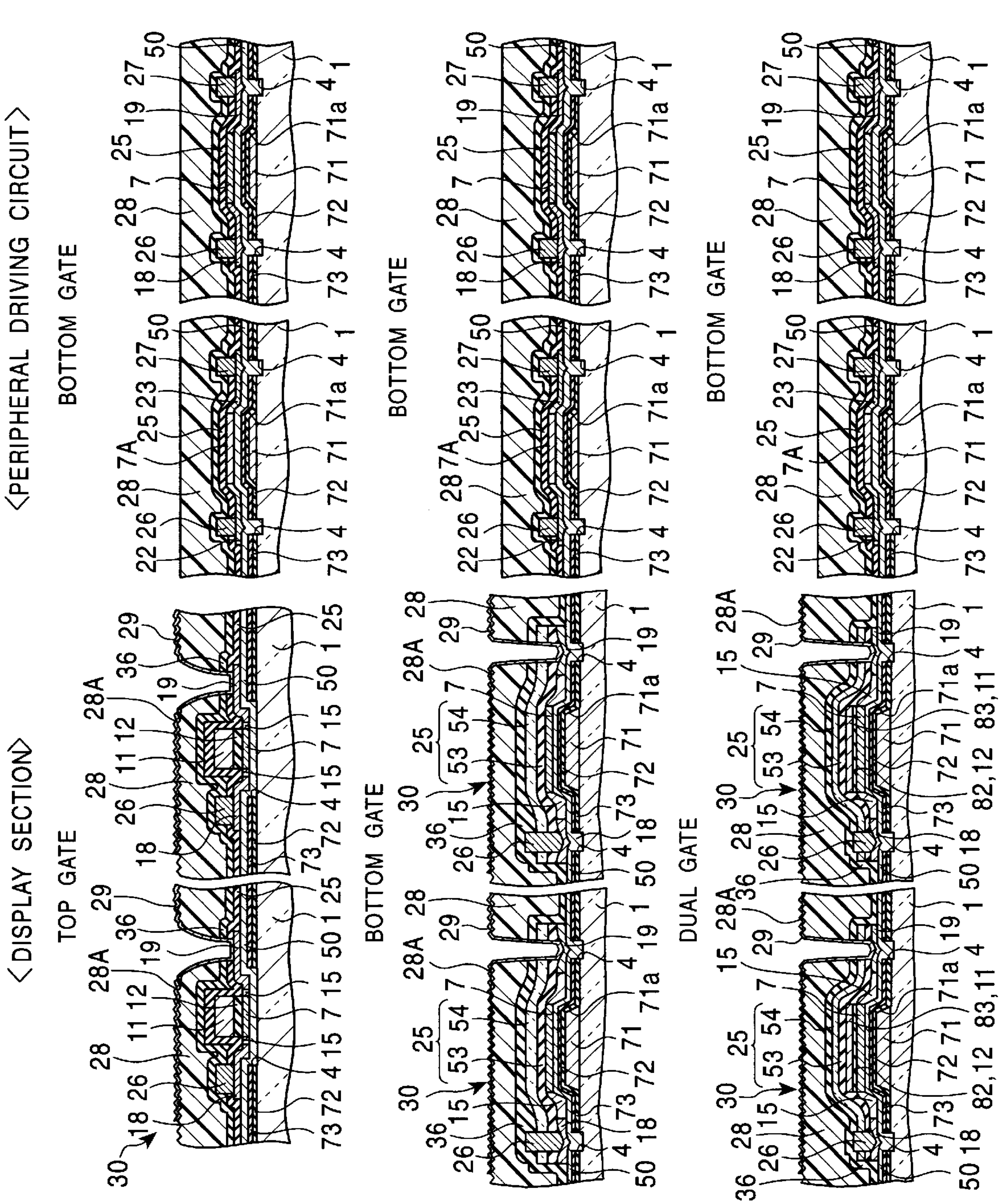
FIGS. 55A to 55C are cross-sectional views illustrating production steps of a liquid crystal display (LCD) in accordance with a nineteenth embodiment of the present invention.
Figures 56A, 56B, 56C:
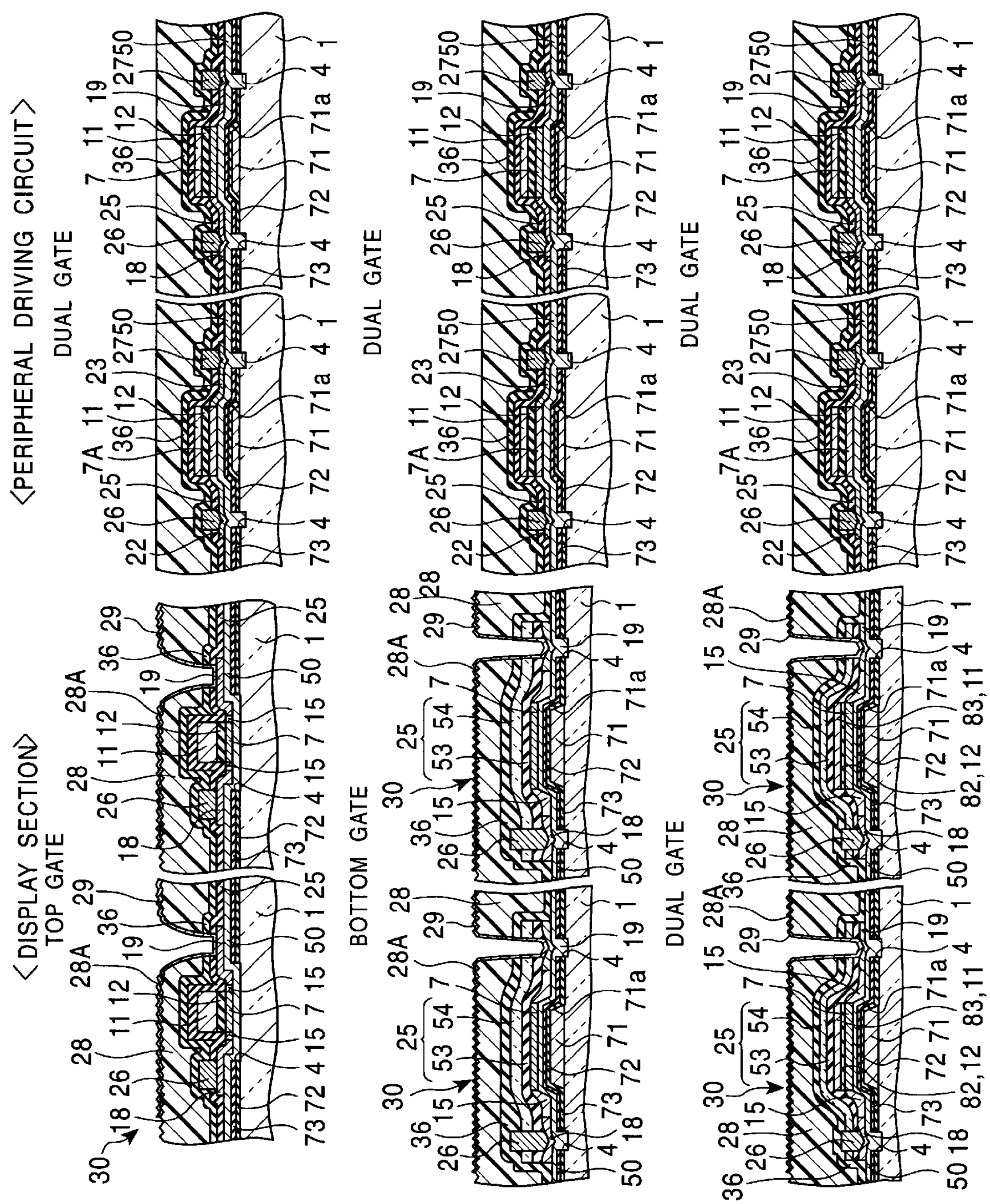
FIGS. 56A to 56C are cross-sectional views illustrating production steps of a liquid crystal display (LCD) in accordance with a nineteenth embodiment of the present invention.

The display section shown in each of FIGS. 54A, 55A, and 56A includes top-gate nMOSLDD-TFTs as in the first to third embodiments, the display section shown in each of FIGS. 54B, 55B, and 56B includes bottom-gate nMOSLDD-TFTs, and the display section shown in each of FIGS. 54C, 55C, and 56C includes dual-gate nMOSLDD-TFTs. These TFTs can be produced by the same process for the top-gate, bottom-gate, or dual-gate MOSTFTs in the peripheral-driving-circuit section, as described below. The dual-gate MOSTFT has higher driving ability and is suitable for high-speed switching. Furthermore, the upper or lower gate may be selectively used as a top- or bottom-gate type during operation.

In the bottom-gate MOSTFT shown in of FIG. 54B, 55B, or 56B, a gate electrode 71 is composed of, for example, a molybdenum-tantalum alloy, and a gate insulating film is composed of a SiN film 72 and a $SiO_2$ film 73. A channel region and the like using the single-crystal silicon layer is formed on the gate insulating film as in the top-gate MOSTFT (first embodiment), bottom-gate MOSTFT (second embodiment), or dual-gate MOSTFT (third embodiment). In the dual-gate MOSTFT shown in FIG. 54C, 55C, or 56C, the lower-gate section is substantially the same as that in the bottom-gate MOSTFT and the upper-gate section includes an upper-gate electrode 74 formed on a gate insulating film 73 composed of a $SiO_2$ film and a SiN film. In all the cases, each gate section is formed in the exterior of the step difference 4 as a seed for heteroepitaxy.

A method for making the bottom-gate MOSTFT will be described with reference to FIGS. 57A to 61E, and a method for making the dual-gate MOSTFT will be described with reference to FIGS. 62J to 64T. The method for making the top-gate MOSTFT in the peripheral-driving-circuit section is as shown above with reference to FIGS. 1A to 6S; the description thereof is omitted.

Figure 57A:
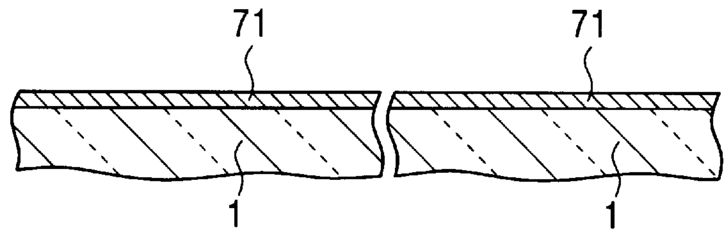
FIGS. 57A to 57E, 58F to 58J, 59K to 59N, and 60O to 60R are cross-sectional views illustrating production steps of a liquid crystal display (LCD) in accordance with the nineteenth embodiment of the present invention.

With reference to FIG. 57A, in the production of the bottom-gate MOSTFT in the display section, a molybdenum-tantalum alloy film 71 having a thickness of 500 to 600 nm is formed on a substrate 1 by sputtering.

Figure 57B:
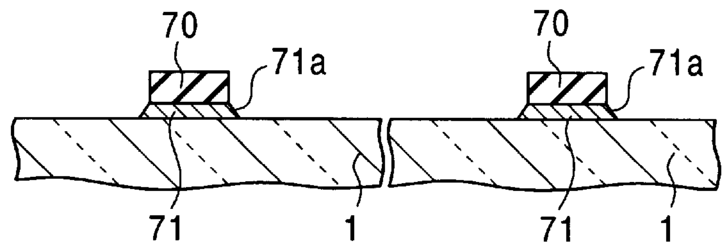

With reference to FIG. 57B, a photoresist layer 70 having a given pattern is formed and the molybdenum-tantalum alloy film 71 is taper-etched using the photoresist layer 70 as a mask to form a gate electrode 71 having a trapezoidal side base 71*a* with an angle of 20 to 45 degree.

Figure 57C:
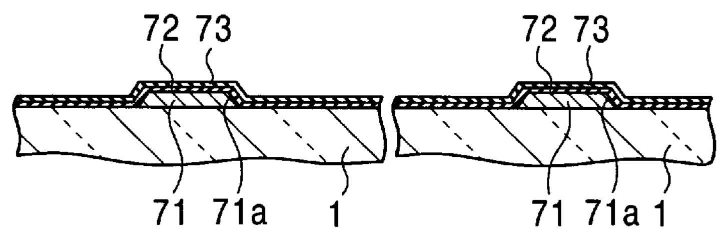

With reference to FIG. 57C, after the photoresist layer 70 is removed, a SiN film 72 having a thickness of approximately 100 nm and then a $SiO_2$ film 73 having a thickness of approximately 200 nm are deposited on the substrate 1 including the molybdenum-tantalum alloy film 71 by a plasma-enhanced CVD process or the like to form a gate insulating film.

Figure 57D:
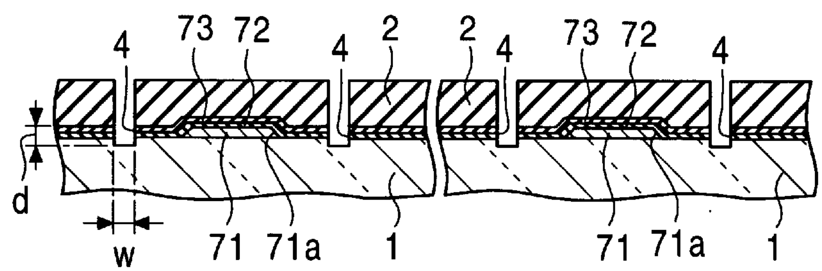

With reference to FIG. 57D, a photoresist layer 2 having a given pattern is formed in at least the TFT-forming region, as in the step shown in FIG. 1A, and a plurality of step differences 4 having a proper shape and size is formed in the gate insulating film and the substrate 1 through a mask of the photoresist layer 2, as described above. The step differences 4 function as seeds during heteroepitaxy of the single-crystal silicon layer, facilitates growth of the single-crystal silicon film, enhances the crystallinity thereof, and have a depth d of 0.3 to 0.4 $\mu$m, a width of 2 to 3 $\mu$m, a length of 10 to 20 $\mu$m, and an basilar angle (between the bottom and the side wall) which is a right angle.

Figure 57E:
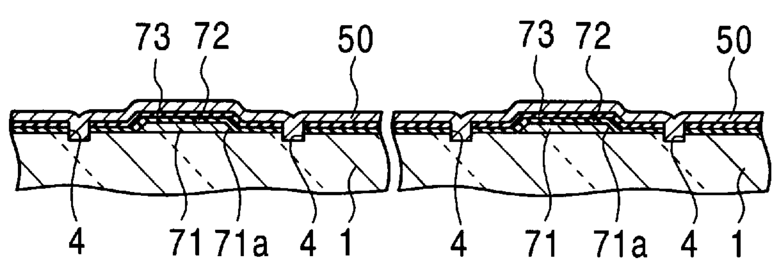

With reference to FIG. 57E, the photoresist layer 2 is removed, and a crystalline sapphire film 50 having a thickness of 20 to 200 nm is deposited at least in TFT-forming regions including the step differences 4 on one main surface of the insulating substrate 1, as in the step shown in FIG. 1B.

Figure 58F:
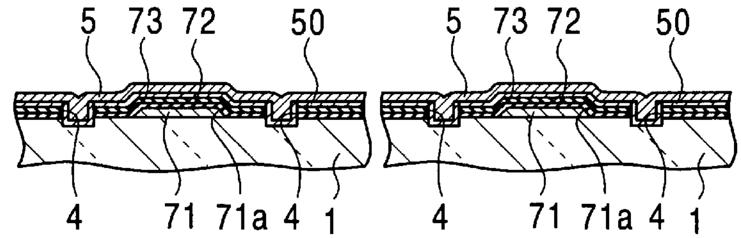

With reference to FIG. 58F, a polycrystalline silicon film 5 is formed, as in the step shown in FIG. 1C.

Figure 58G:
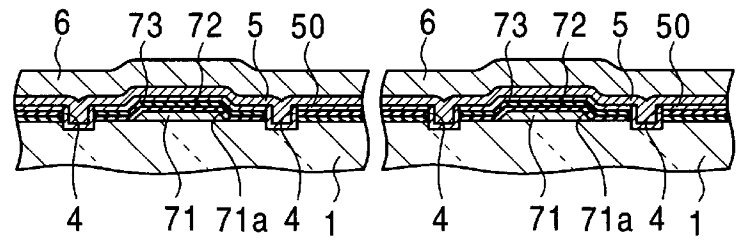

With reference to FIG. 58G, an indium, indium-gallium, or gallium film 6 is formed thereon, as in the step shown in FIG. 1D.

Figure 58H:
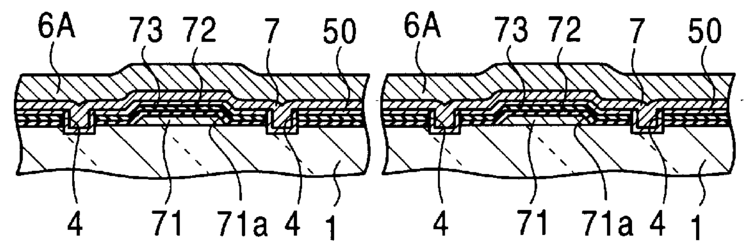

With reference to FIG. 58H, single-crystal silicon is heteroepitaxially grown to deposit a single-crystal silicon layer 7 with a thickness of approximately 0.1 $\mu$m, as in the step shown in FIG. 1E. Since the underlying gate electrode 71 has a moderately slanted side face which does not inhibit epitaxy, the single-crystal silicon layer 7 can be deposited without discontinuity at the step differences 4.

Figure 58I:
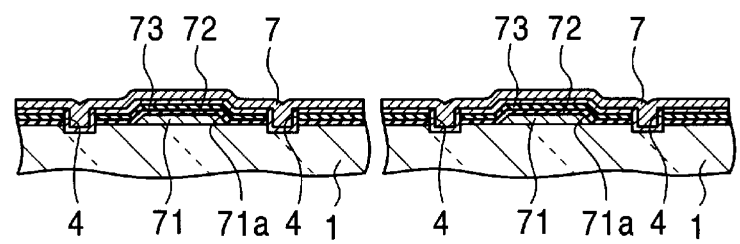
Figure 58J:
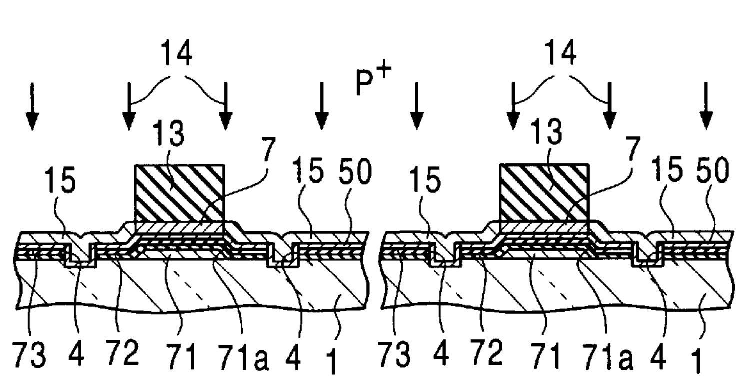

With reference to FIG. 58I, the indium film 6A is removed. After the steps shown in FIGS. 2G to 3I, as shown in FIG. 58J, the gate sections of the nMOSTFT in the display section are covered with a photoresist layer 13, as in the step shown in FIG. 3J. The exposed source and drain regions of the nMOSTFT are doped with phosphorus ions 14 by ion implantation to form a LDD section 15 composed of an $N^-$-type layer by self-alignment. The bottom-gate electrode 71 facilitates recognition of the difference in surface height or the pattern. Thus, the photoresist layer 13 is readily aligned with high precision.

Figure 59K:
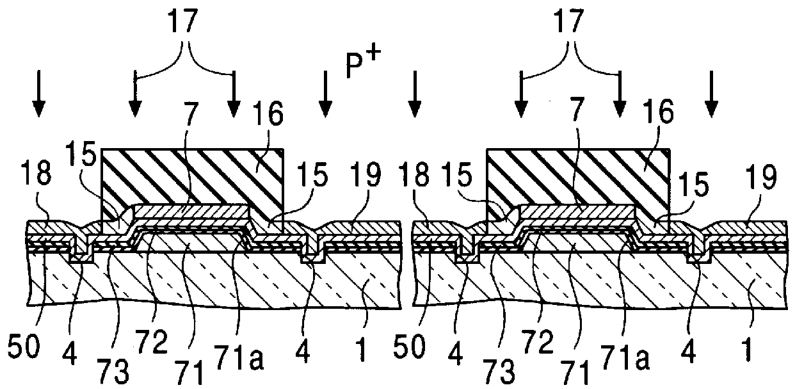

With reference to FIG. 59K, the gate section and the LDD section of the nMOSTFT are covered with a photoresist layer 16 and the exposed region is doped with phosphorus or arsenic ions 17 by ion implantation to form a source section 18 and a drain section 19 composed of an $N^+$-type layer of the nMOSTFT, as in the step shown in FIG. 4K.

Figure 59L:
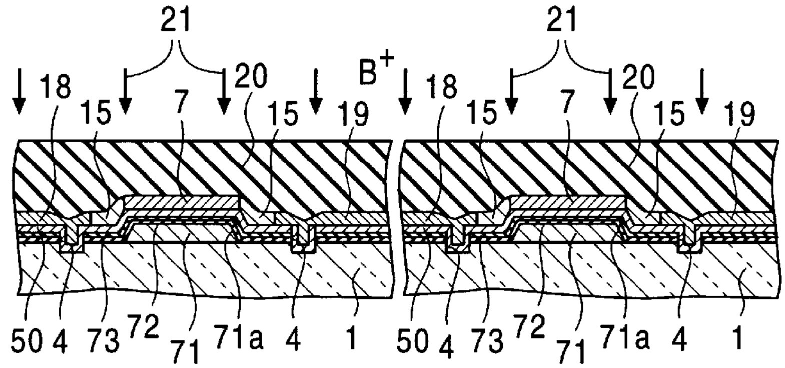

With reference to FIG. 59L, the entire nMOSTFT is covered with a photoresist layer 20 and then doped with boron ions 21 by ion implantation to form a source section and a drain section of the $p^+$ layer of the pMOSTFT in the peripheral-driving-circuit section, as in the step shown in FIG. 4L.

Figure 59M:
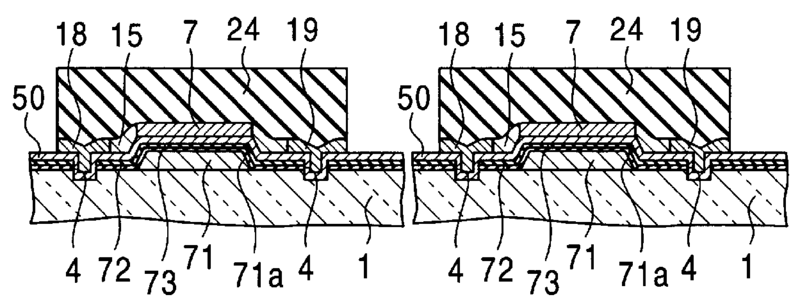

With reference to FIG. 59M, a photoresist layer 24 is provided and then the single-crystal silicon layer is selectively removed by conventional photolithography and etching to island the active device section and the passive device section, as in the step shown in FIG. 4M.

Figure 59N:
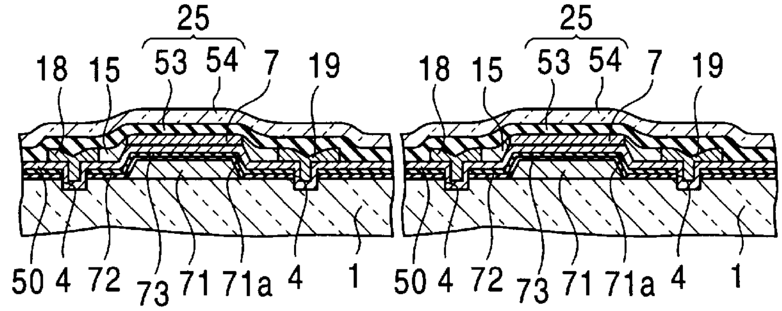

With reference to FIG. 59N, a $SiO_2$ film 53 having a thickness of approximately 300 nm and then a phosphosilicate glass (PSG) film 54 having a thickness of approximately 300 nm are formed on the entire surface by a plasma-enhanced CVD process, a high-density plasma-enhanced CVD process, or a catalytic CVD process, as in the step shown in FIG. 5N. The $SiO_2$ film 53 and the PSG film 54 correspond to the above-described protective film 25. The single-crystal silicon layer is activated as described above.

Figure 60O:
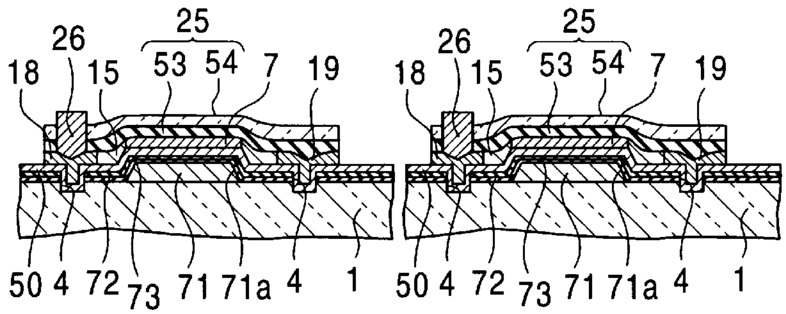

With reference to FIG. 60O, contact holes are formed at the source sections by conventional photolithography and etching, as in the step shown in FIG. 50. An aluminum film having a thickness of 400 to 500 nm is formed on the entire surface by sputtering. Source electrodes 26, data lines and gate lines of TFTs are simultaneously formed by conventional photolithography and etching. The substrate is sintered in a forming gas at approximately 400° C. for 1 hour.

Figure 60P:
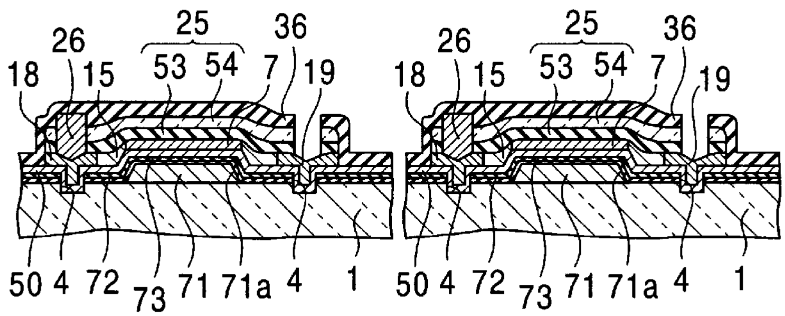

With reference to FIG. 60P, an insulating film 36 composed of a PSG film having a thickness of approximately 300 nm and a SiN film having a thickness of approximately 300 nm are formed on the entire surface by a high-density plasma-enhanced CVD process or a catalytic CVD process, and contact holes are formed at the drain sections of display TFTs, as in FIG. 5P.

Figure 60Q:
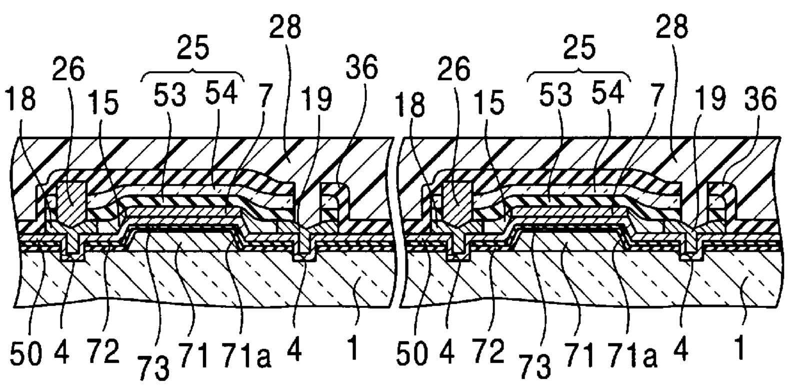
Figure 60R:
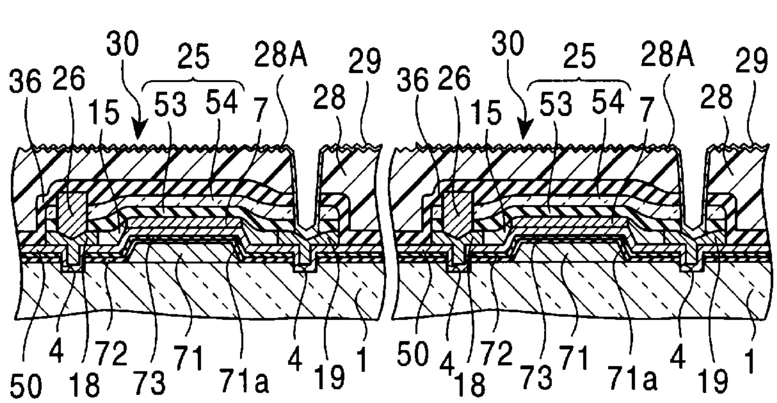

With reference to FIG. 60Q, a photosensitive resin film 28 having a thickness of 2 to 3 $\mu$m is formed by spin coating, as in the step shown in FIG. 6Q. With reference to FIG. 60R, an uneven pattern is formed and then subjected to reflow to form a lower portion of a reflective layer having an uneven surface 28A so that the pixel section has optimized reflective and viewing-angle characteristics. Contact holes are simultaneously formed at the contact sections of the display TFTs.

With reference to FIG. 60R, an aluminum film having a thickness of 400 to 500 nm is formed on the entire surface by sputtering, and then an uneven aluminum reflective section 29 connecting to the drain section 19 of the display TFT is formed by conventional photolithography and etching, as in the step shown in FIG. 6S.

As described above, the resulting active-matrix substrate 30 integrates a display section and a peripheral-driving-circuit section, in which the display section includes bottom-gate nMOSLDD-TFTs using the single-crystal silicon layer 7 formed by high-temperature heteroepitaxy on the step differences 4 as seeds and the peripheral-driving-circuit section includes a CMOS driving circuit having pMOSTFTs and nMOSTFTs.

Figure 61C:
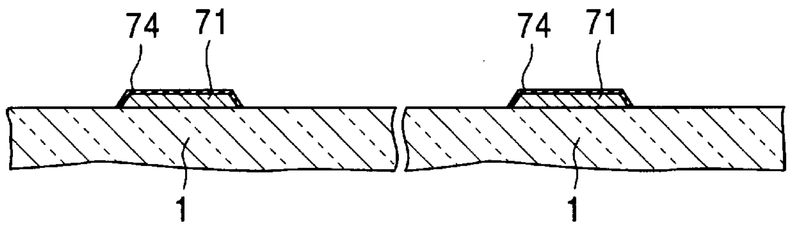
FIGS. 61C to 61E are cross-sectional views illustrating production steps of a liquid crystal display (LCD) in accordance with the nineteenth embodiment of the present invention.
Figure 61D:
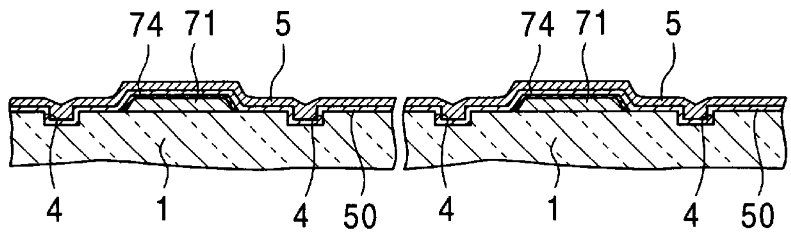
Figure 61E:
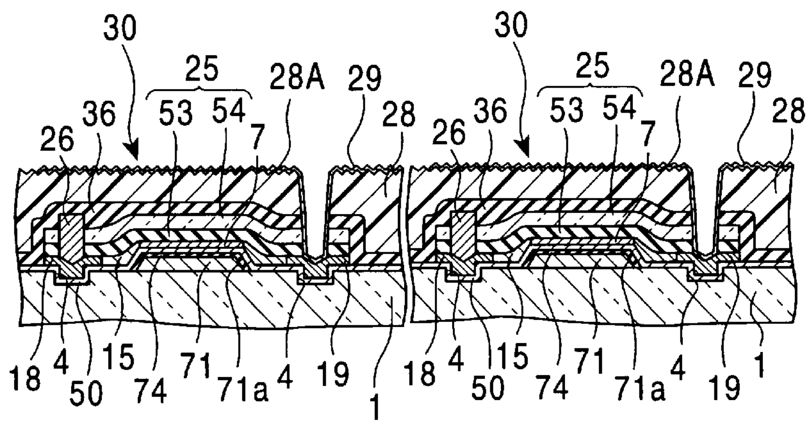

FIGS. 61C to 61E show the formation of the gate insulating film of the above bottom-gate MOSTFT in the display section by anodic oxidation of the molybdenum-tantalum alloy.

After the step of FIG. 57B, the molybdenum-tantalum alloy film 71 is subjected to conventional anodic oxidation treatment, as shown in FIG. 61C, to form a gate insulating film 74, composed of $Ta_2O_5$ and having a thickness of 100 to 200 nm, on the surface.

Next, with reference to FIG. 61D, step differences 4 and a crystalline sapphire thin-film 50 are formed, as in the steps shown in FIGS. 57D to 58H, and a single-crystal silicon film 7 is formed by heteroepitaxy. With reference to FIG. 61E, an active-matrix substrate 30 is prepared according to the process shown in FIGS. 58I to 60R.

When the dual-gate MOSTFTs are produced in the display section, the processes shown in FIGS. 57A to 58I are performed.

Figure 62J:
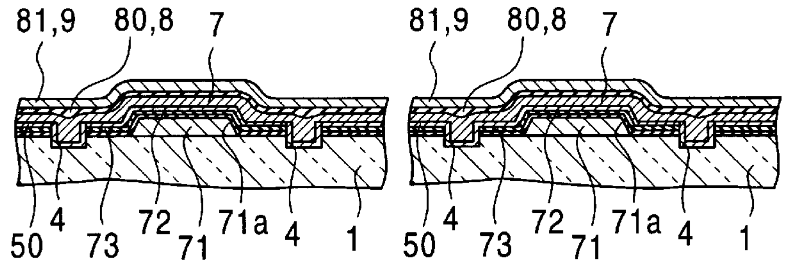
FIGS. 62J to 62M, 63N to 63Q, and 64R to 64T are cross-sectional views illustrating production steps of a liquid crystal display (LCD) in accordance with the nineteenth embodiment of the present invention.

With reference to FIG. 62J, step differences 4 are formed on the insulating films 72 and 73 and the substrate 1, and then a single-crystal silicon layer 7 is deposited by heteroepitaxy on the step differences 4 as seeds. Next, as in the step shown in FIG. 3H, a $SiO_2$ film having a thickness of approximately 200 nm and then a SiN film having a thickness of approximately 100 nm are continuously formed on the entire surface of the single-crystal silicon layer 7 by a plasma-enhanced CVD process or a catalytic CVD process to form an insulating film 80 (corresponding to the insulating film 8). A molybdenum-tantalum alloy film 81 having a thickness of 500 to 600 nm (corresponding to the sputtered film 9) is formed by sputtering.

Figure 62K:
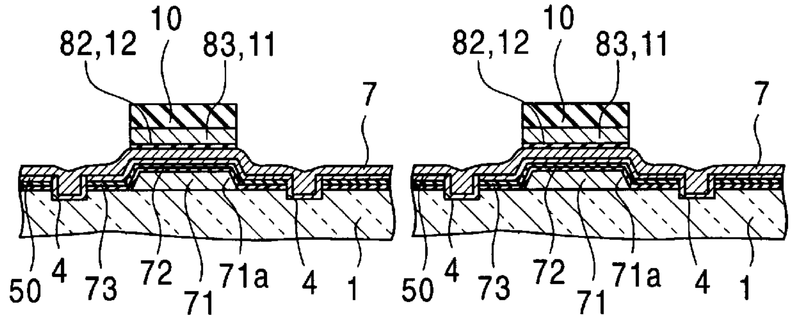

With reference to FIG. 62K, a photoresist pattern 10 is formed, as in the step shown in FIG. 3I, and is subjected to continuous etching to form a top-gate electrode 82 (corresponding to the gate electrode 12) composed of the molybdenum-tantalum alloy and a gate insulating film 83 (corresponding to the gate insulating film 11) and to expose the single-crystal silicon layer 7.

Figure 62L:
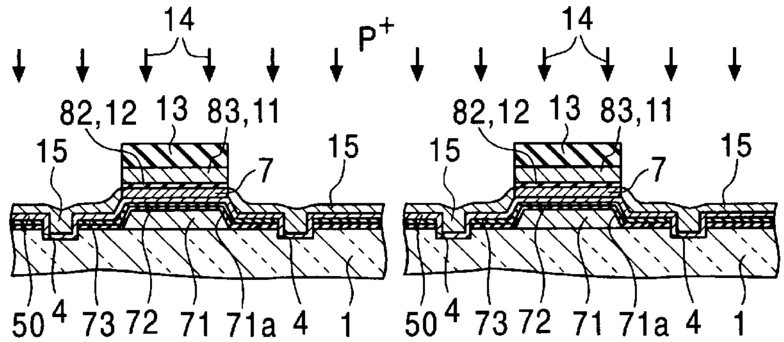

With reference to FIG. 62L, the top-gate section of the nMOSTFT is covered with a photoresist layer 13, and the exposed source and drain regions of the nMOSTFT for display are doped with phosphorus ions 14 by ion implantation to form an $N^-$-type LDD section 15, as in the step shown in FIG. 3J.

Figure 62M:
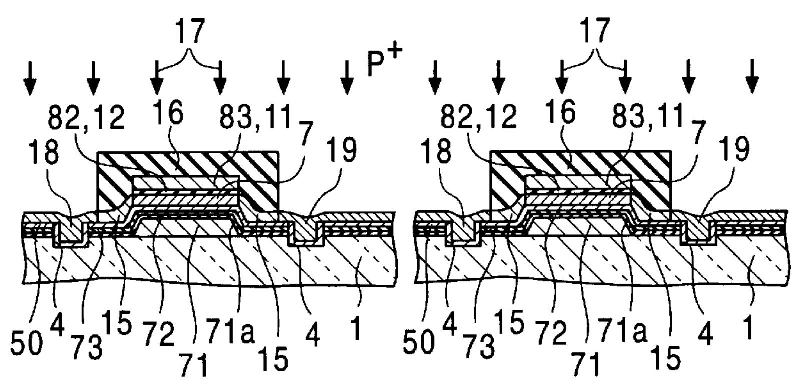

With reference to FIG. 62M, the gate section and the LDD section of the nMOSTFT are covered with a photoresist layer 16, and the exposed region is doped with phosphorus or arsenic ions 17 by ion implantation to form a source section 18 and a drain section 19 of nMOSTFT composed of an $N^+$-type layer, as in the step in FIG. 4K.

Figure 63N:
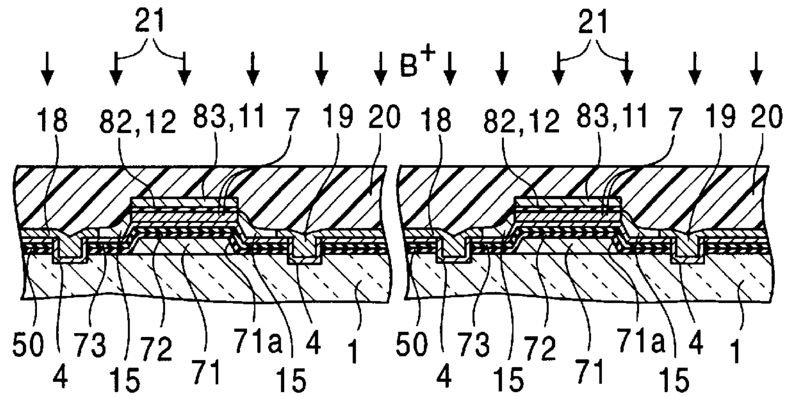

With reference to FIG. 63N, the gate section of the pMOSTFT is covered with a photoresist layer 20 and the exposed region is doped with boron ions 21 by ion implantation to form a source section and a drain section of the pMOSTFT composed of a $P^+$-layer in the peripheral-driving-circuit section, as in the step shown in FIG. 4L.

Figure 63O:
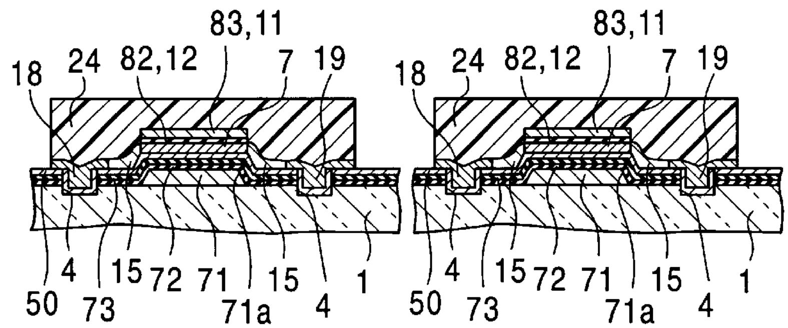

With reference to FIG. 63O, a photoresist layer 24 is provided and the single-crystal silicon layer is selectively removed by conventional photolithography and etching to island the active device section and the passive device section, as in the step shown in FIG. 4M.

Figure 63P:
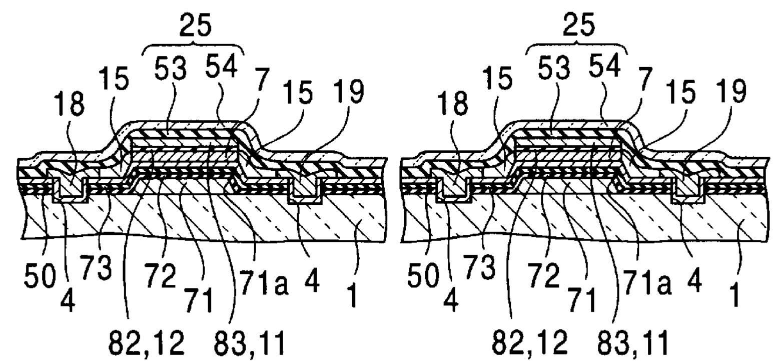

With reference to FIG. 63P, a $SiO_2$ film 53 having a thickness of approximately 200 nm and a phosphosilicate glass (PSG) glass 54 having a thickness of approximately 300 nm are formed on the entire surface by a plasma-enhanced CVD process, a high-density plasma-enhanced CVD process, or a catalytic CVD process, as in the step shown in FIG. 5N. These films 53 and 54 correspond to the protective film 25. Next, the single-crystal silicon layer 7 is activated.

Figure 63Q:
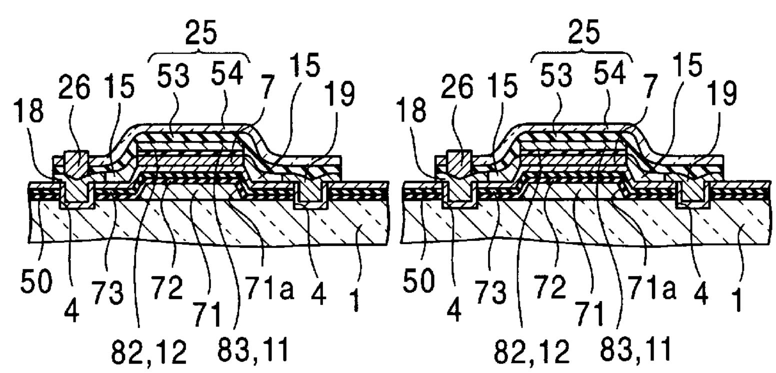

With reference to FIG. 63Q, contact holes are formed at the source sections, as in the step shown in FIG. 50. An aluminum film having a thickness of 400 to 500 nm is formed on the entire surface by sputtering, and then source electrodes 26, data lines, and gate lines are simultaneously formed by conventional photolithography and etching.

Figure 64R:
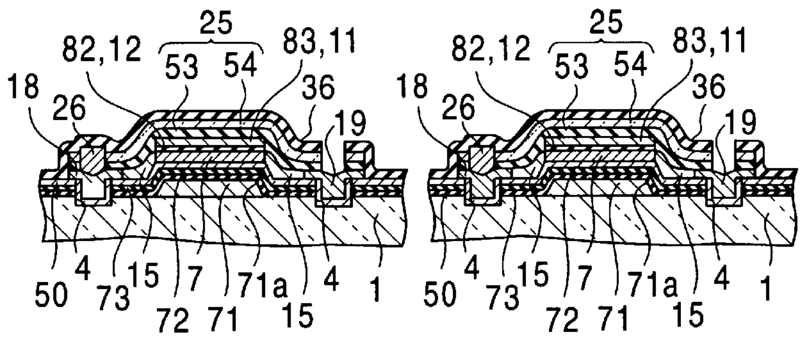

With reference to FIG. 64R, an insulating film 36 including a PSG film having a thickness of approximately 300 nm and a SiN film having a thickness of approximately 300 nm is formed on the entire surface and contact holes are formed at the drain section of the display TFT, as in the step shown in FIG. 5P.

Figure 64S:
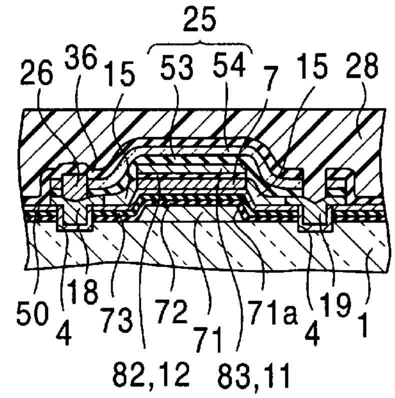
Figure 64T:
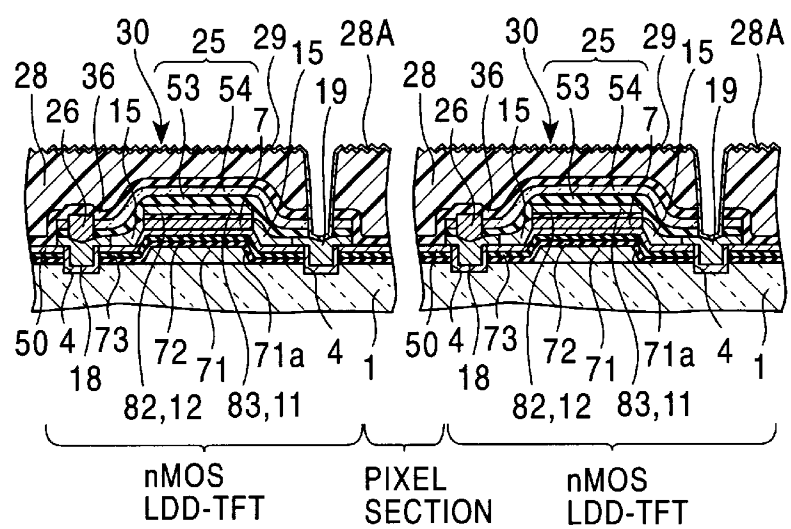

With reference to FIG. 64S, a photosensitive resin film 28 having a thickness of 2 to 3 $\mu$m is formed on the entire surface by spin coating or the like. With reference to FIG. 64T, a lower portion of a reflective face comprising an uneven surface 28A is formed in at least the pixel section, contact holes are formed at the drain sections of the display TFTs and an uneven aluminum reflective section 29 connecting to the drain sections 19 are formed so that optimized reflective and viewing-angle characteristics are achieved, as in the steps shown in FIGS. 6R and 6S.

The resulting active-matrix substrate 30 integrates a display section and a peripheral-driving-circuit section, in which the display section includes dual-gate nMOSLDD-TFTs and the peripheral-driving-circuit section includes a CMOS driving circuit having top-gate, bottom-gate, or dual-gate nMOSTFTs and pMOSTFTs. These TFTs are formed of the single-crystal silicon layer 7 formed by high-temperature heteroepitaxy on the step differences 4 as seeds.

Twentieth Embodiment

FIGS. 55A to 55C, 56A to 56C, and 65A to 72S show a twentieth embodiment of the present invention. In this embodiment, the peripheral-driving-circuit section includes a CMOS driving circuit including bottom-gate pMOSTFTs and nMOSTFTs as in the fourth embodiment or dual-gate pMOSTFTs and nMOSTFTs as in the fifth embodiment. The display section is a reflective type and includes TFTs having various gate configurations.

The display section shown in each of FIGS. 55A and 56A includes top-gate nMOSLDD-TFTs as in the fourth and fifth embodiments, the display section shown in each of FIGS. 55B and 56B includes bottom-gate nMOSLDD-TFTs, and the display section shown in each of FIGS. 55C and 56C includes dual-gate nMOSLDD-TFTs. These TFTs can be produced by the same process for the bottom-gate or dual-gate MOSTFTs in the peripheral-driving-circuit section, as described below. The dual-gate MOSTFT has higher driving ability and is suitable for high-speed switching. Furthermore, the upper or lower gate may be selectively used as a top- or bottom-gate type during operation.

In the bottom-gate MOSTFT shown in of FIG. 55B or 56C, a gate electrode 71 is composed of, for example, a molybdenum-tantalum alloy, and a gate insulating film is composed of a SiN film 72 and a $SiO_2$ film 73. A channel region and the like using the single-crystal silicon layer is formed on the gate insulating film as in the bottom-gate (fourth embodiment) or dual-gate (fifth embodiment) MOSTFT. In the dual-gate MOSTFT shown in FIG. 55C or 56C, the lower-gate section is substantially the same as that in the bottom-gate MOSTFT and the upper-gate section includes an upper-gate electrode 83 formed on a gate insulating film 82 composed of a $SiO_2$ film and a SiN film. In all the cases, each gate section is formed in the exterior of the step difference 4 as a seed for heteroepitaxy.

A method for making the bottom-gate MOSTFT will be described with reference to FIGS. 65A to 69E, and a method for making the dual-gate MOSTFT will be described with reference to FIGS. 70I to 72S. The method for making the bottom-gate MOSTFT in the peripheral-driving-circuit section is as shown above with reference to FIGS. 28A to 34U and 35A to 41U; the description there of is omitted.

Figure 65A:
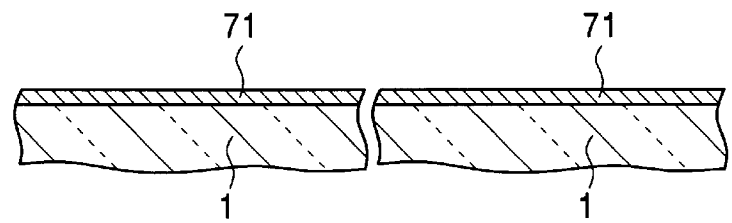
FIGS. 65A to 65E, 66F to 66I, 67J to 67M, and 68N to 68Q are cross-sectional views illustrating production steps of a liquid crystal display (LCD) in accordance with a twentieth embodiment of the present invention.

With reference to FIG. 65A, in the production of the bottom-gate MOSTFT in the display section, a molybdenum-tantalum alloy film 71 having a thickness of 500 to 600 nm is formed on a substrate 1 by sputtering, as in the step shown in FIG. 28A.

Figure 65B:
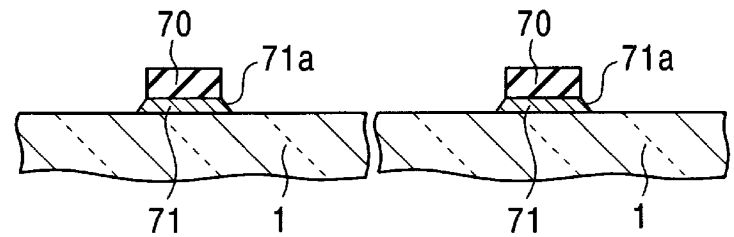

With reference to FIG. 65B, a photoresist layer 70 having a given pattern is formed and the molybdenum-tantalum alloy film 71 is taper-etched using the photoresist layer 70 as a mask to form a gate electrode 71 having a trapezoidal side base 71*a* with an angle of 20 to 45 degree, as in the step shown in FIG. 28B.

Figure 65C:
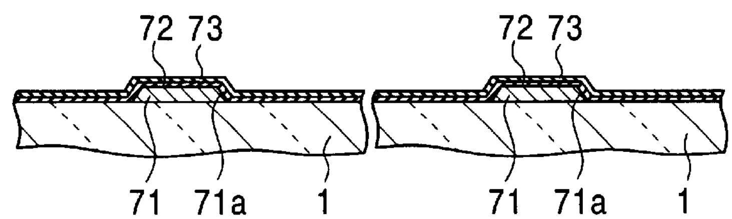

With reference to FIG. 65C, after the photoresist layer 70 is removed, a SiN film 72 having a thickness of approximately 100 nm and then a $SiO_2$ film 73 having a thickness of approximately 200 nm are deposited on the substrate 1 including the molybdenum-tantalum alloy film 71 by a plasma-enhanced CVD process or the like to form a gate insulating film during the step shown in FIG. 28C.

Figure 65D:
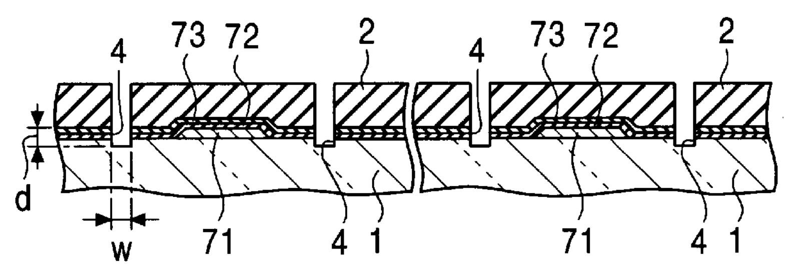

With reference to FIG. 65D, a photoresist layer 2 having a given pattern is formed in at least the TFT-forming region, as in the step shown in FIG. 29D, and a plurality of step differences 4 having a proper shape and size is formed in the gate insulating film and the substrate 1 through a mask of the photoresist layer 2, as described above. The step differences 4 function as seeds during heteroepitaxy of the single-crystal silicon layer, facilitates growth of the single-crystal silicon film, enhances the crystallinity thereof, and have a depth d of 0.3 to 0.4 $\mu$m, a width of 2 to 3 $\mu$m, a length of 10 to 20 $\mu$m, and an basilar angle (between the bottom and the side wall) which is a right angle.

Figure 65E:
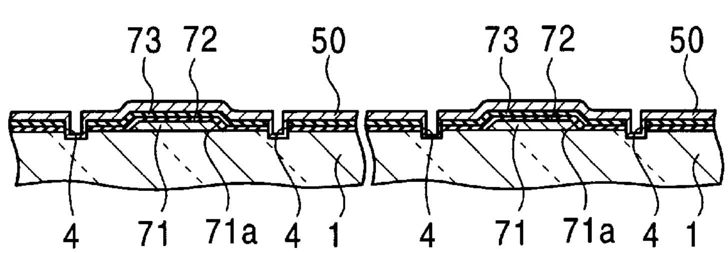

With reference to FIG. 65E, the photoresist layer 2 is removed, and a crystalline sapphire film 50 having a thickness of 20 to 200 nm is deposited at least in TFT-forming regions including the step differences 4 on one main surface of the insulating substrate 1, as in the step shown in FIG. 29E.

Figure 66F:
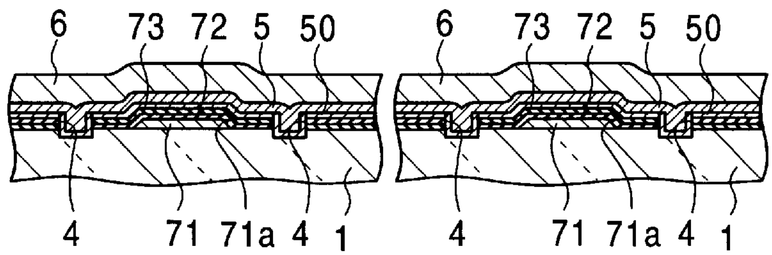

With reference to FIG. 66F, an indium, indium-gallium or gallium melt 6 containing or not containing silicon is applied, as in the step shown in FIG. 29F.

Figure 66G:
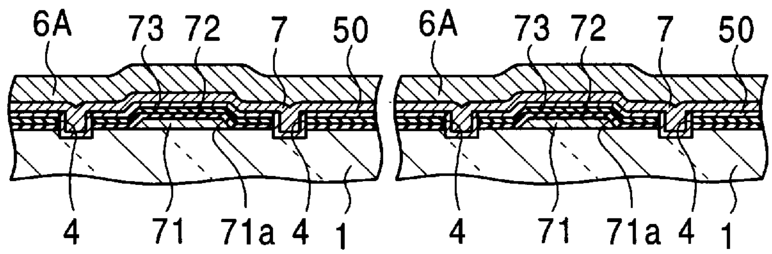

With reference to FIG. 66G, single-crystal silicon is heteroepitaxially grown to deposit a single-crystal silicon layer 7 with a thickness of approximately 0.1 $\mu$m, as in the step shown in FIG. 30G. Since the underlying gate electrode 71 has a moderately slanted side face which does not inhibit epitaxy, the single-crystal silicon layer 7 can be deposited without discontinuity at the step differences 4.

Figure 66H:
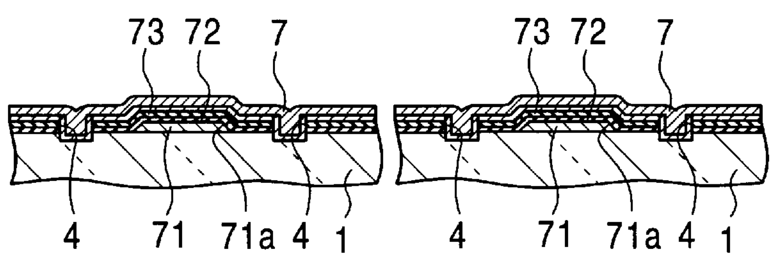
Figure 66I:
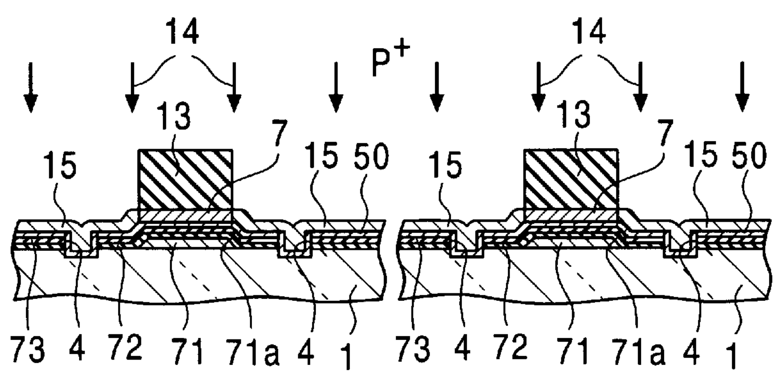

With reference to FIG. 66H, the indium film 6A is removed. After the steps shown in FIGS. 30I to 31K, as shown in FIG. 66I, the gate sections of the nMOSTFT in the display section are covered with a photoresist layer 13, as in the step shown in FIG. 31L. The exposed source and drain regions of the nMOSTFT are doped with phosphorus ions 14 by ion implantation to form an LDD section 15 composed of an $N^-$-type layer by self-alignment. The bottom-gate electrode 71 facilitates recognition of the difference in surface height or the pattern. Thus, the photoresist layer 13 is readily aligned with high precision.

Figure 67J:
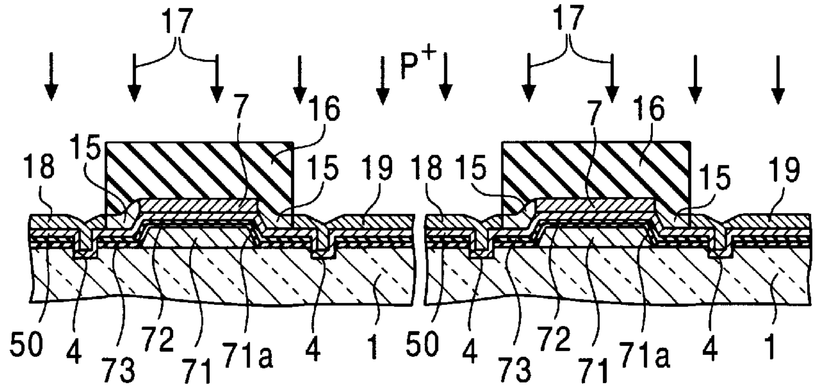

With reference to FIG. 67J, the gate section and the LDD section of the nMOSTFT are covered with a photoresist layer 16 and the exposed region is doped with phosphorus or arsenic ions 17 by ion implantation to form a source section 18 and a drain section 19 composed of an $N^+$-type layer of the nMOSTFT, as in the step shown in FIG. 32M.

Figure 67K:
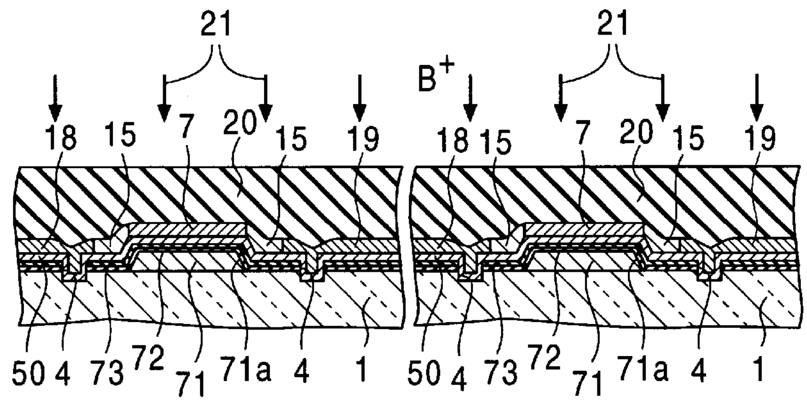

With reference to FIG. 67K, the entire nMOSTFT is covered with a photoresist layer 20 and then doped with boron ions 21 by ion implantation to form a source section and a drain section of the $p^+$ layer of the pMOSTFT in the peripheral-driving-circuit section, as in the step shown in FIG. 32N.

Figure 67L:
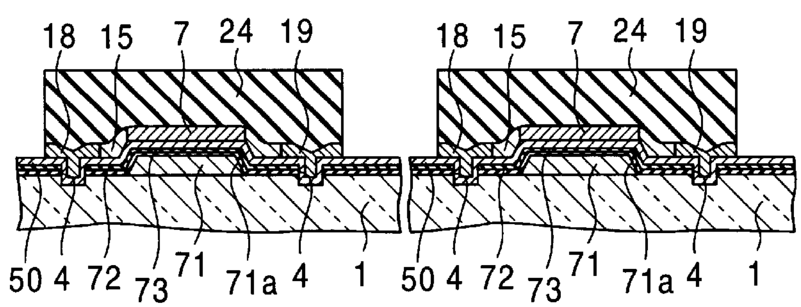

With reference to FIG. 67L, a photoresist layer 24 is provided and then the single-crystal silicon layer is selectively removed by conventional photolithography and etching to island the active device section and the passive device section, as in the step shown in FIG. 320.

Figure 67M:
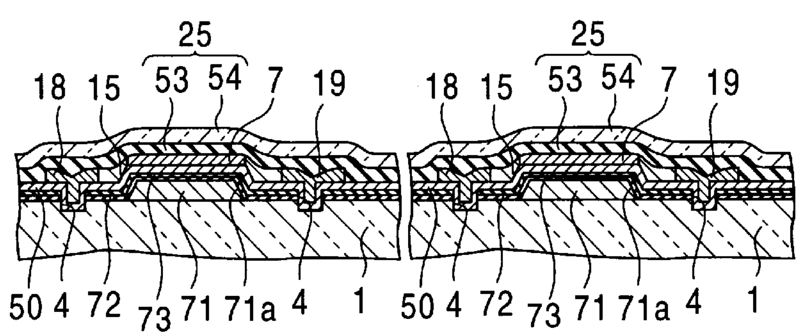

With reference to FIG. 67M, a $SiO_2$ film 53 having a thickness of approximately 300 nm and then a phosphosilicate glass (PSG) film 54 having a thickness of approximately 300 nm are formed on the entire surface by a plasma-enhanced CVD process, a high-density plasma-enhanced CVD process, or a catalytic CVD process, as in the step shown in FIG. 33P. The $SiO_2$ film 53 and the PSG film 54 correspond to the above-described protective film 25. The single-crystal silicon layer is activated as described above.

Figure 68N:
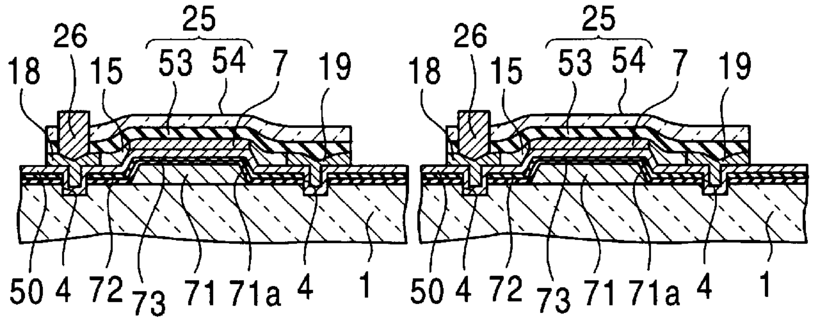

With reference to FIG. 68N, contact holes are formed at the source sections by conventional photolithography and etching, as in the step shown in FIG. 33Q. An aluminum film having a thickness of 400 to 500 nm is formed on the entire surface by sputtering. Source electrodes 26, data lines, and gate lines of TFTs are simultaneously formed by conventional photolithography and etching. The substrate is sintered in a forming gas at approximately 400° C. for 1 hour.

Figure 68O:
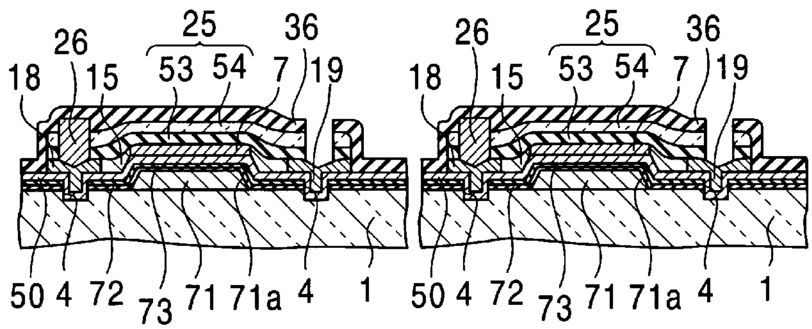

With reference to FIG. 68O, an insulating film 36 composed of a PSG film having a thickness of approximately 300 nm and a SiN film having a thickness of approximately 300 nm are formed on the entire surface by a high-density plasma-enhanced CVD process or a catalytic CVD process, and contact holes are formed at the drain sections of display TFTs, as in FIG. 33R.

Figure 68P:
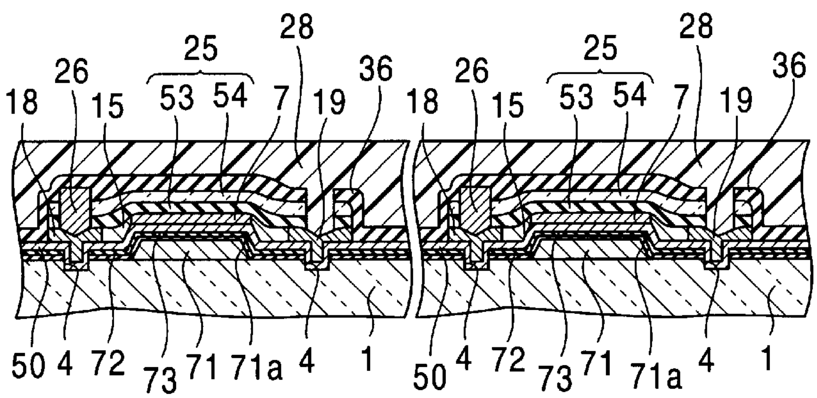
Figure 68Q:
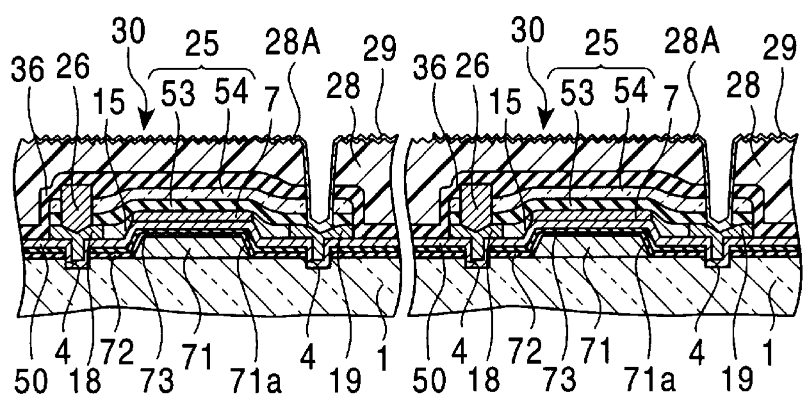

With reference to FIG. 68P, a photosensitive resin film 28 having a thickness of 2 to 3 μm is formed by spin coating, as in the step shown in FIG. 34S. With reference to FIG. 68Q, an uneven pattern is formed and then subjected to reflow to form a lower portion of a reflective layer having an uneven surface 28A so that the pixel section has optimized reflective and viewing-angle characteristics. Contact holes are simultaneously formed at the contact sections of the display TFTs.

With reference to FIG. 68Q, an aluminum film having a thickness of 400 to 500 nm is formed on the entire surface by sputtering, as in the step shown in FIG. 34T. An uneven aluminum reflective film 29 connecting to the drain section 19 of the display TFT is formed by conventional photolithography and etching.

As described above, the resulting active-matrix substrate 30 integrates a display section and a peripheral-driving-circuit section, in which the display section includes bottom-gate nMOSLDD-TFTs using the single-crystal silicon layer 7 formed by heteroepitaxy on the crystalline sapphire film 50 and the step differences 4 as seeds and the peripheral-driving-circuit section includes a CMOS driving circuit having bottom-gate or dual-gate pMOSTFTs and nMOSTFTs.

Figure 69C:
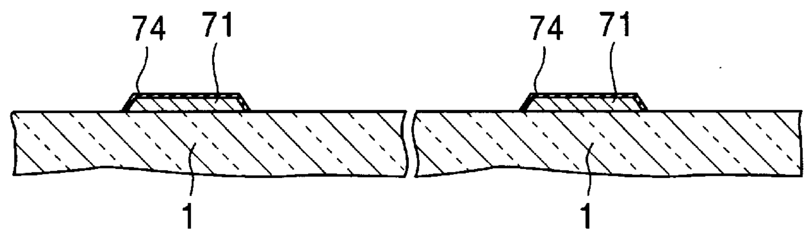
FIGS. 69C to 69E are cross-sectional views illustrating production steps of a liquid crystal display (LCD) in accordance with the twentieth embodiment of the present invention.
Figure 69D:
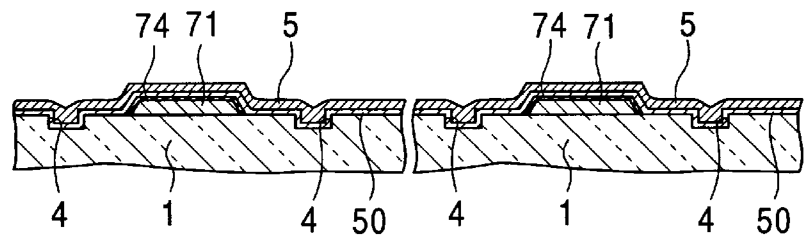
Figure 69E:
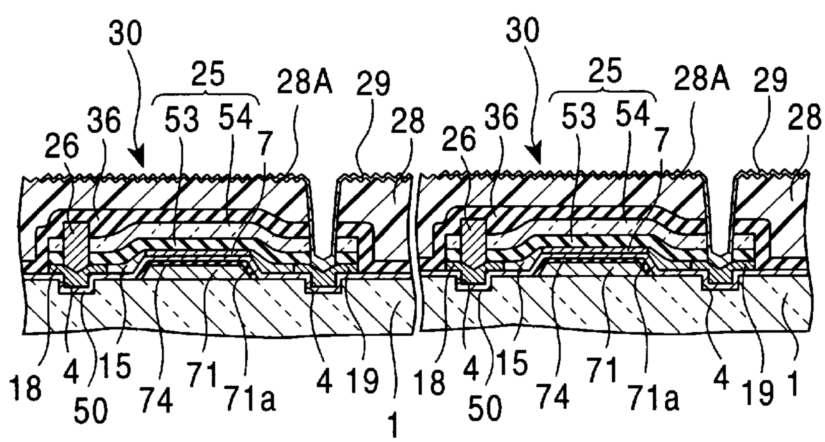

FIGS. 69C to 69E show the formation of the gate insulating film of the above bottom-gate MOSTFT in the display section by anodic oxidation of the molybdenum-tantalum alloy.

After the step of FIG. 65B, the molybdenum-tantalum alloy film 71 is subjected to conventional anodic oxidation treatment, as shown in FIG. 69C, to form a gate insulating film 74, composed of $Ta_2O_5$ and having a thickness of 100 to 200 nm, on the surface.

Next, with reference to FIG. 69D, step differences 4 and a crystalline sapphire thin-film 50 are formed, as in the steps shown in FIGS. 65D to 66H, and a single-crystal silicon film 7 is formed by heteroepitaxy. With reference to FIG. 69E, an active-matrix substrate 30 is prepared according to the process shown in FIGS. 66I to 68Q.

When the dual-gate MOSTFTs are produced in the display section, the processes shown in FIGS. 65A to 66H are performed.

Figure 70I:
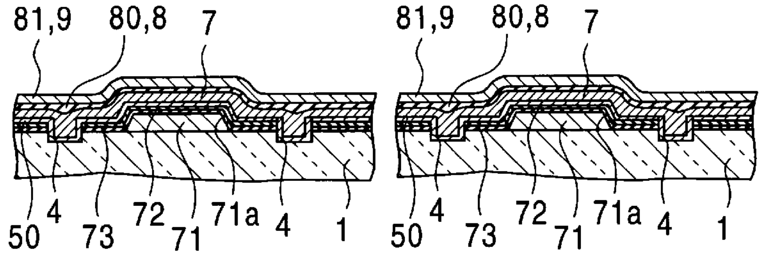
FIGS. 70I to 70L, 71M to 71P, and 72Q to 72S are cross-sectional views illustrating production steps of a liquid crystal display (LCD) in accordance with the twentieth embodiment of the present invention.

With reference to FIG. 70I, step differences 4 are formed on the insulating films 72 and 73 and the substrate 1, and then a single-crystal silicon layer 7 is deposited by heteroepitaxy on the step differences 4 as seeds. Next, as in the step shown in FIG. 31J, a $SiO_2$ film having a thickness of approximately 200 nm and then a SiN film having a thickness of approximately 100 nm are continuously formed on the entire surface of the single-crystal silicon layer 7 by a plasma-enhanced CVD process or a catalytic CVD process to form an insulating film 80 (corresponding to the insulating film 8). A molybdenum-tantalum alloy film 81 having a thickness of 500 to 600 nm (corresponding to the sputtered film 9) is formed by sputtering.

Figure 70J:
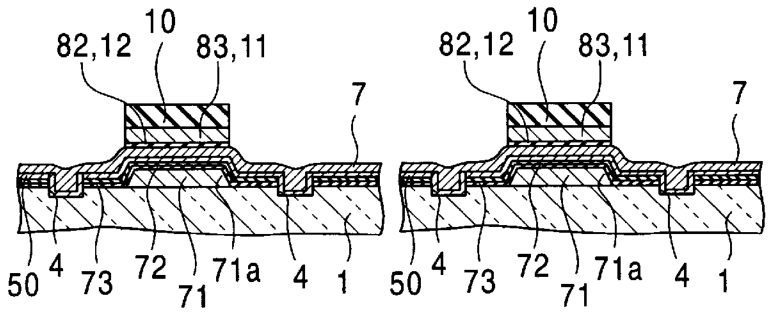

With reference to FIG. 70J, a photoresist pattern 10 is formed, as in the step shown in FIG. 31K, and is subjected to continuous etching to form a top-gate electrode 82 (corresponding to the gate electrode 12) composed of the molybdenum-tantalum alloy and a gate insulating film 83 (corresponding to the gate insulating film 11) and to expose the single-crystal silicon layer 7.

Figure 70K:
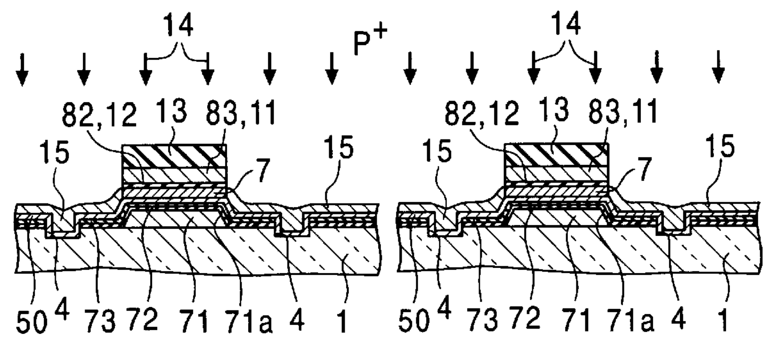

With reference to FIG. 70K, the top-gate section of the nMOSTFT is covered with a photoresist layer 13, and the exposed source and drain regions of the nMOSTFT for display are doped with phosphorus ions 14 by ion implantation to form an $N^-$-type LDD section 15, as in the step shown in FIG. 31L.

Figure 70L:
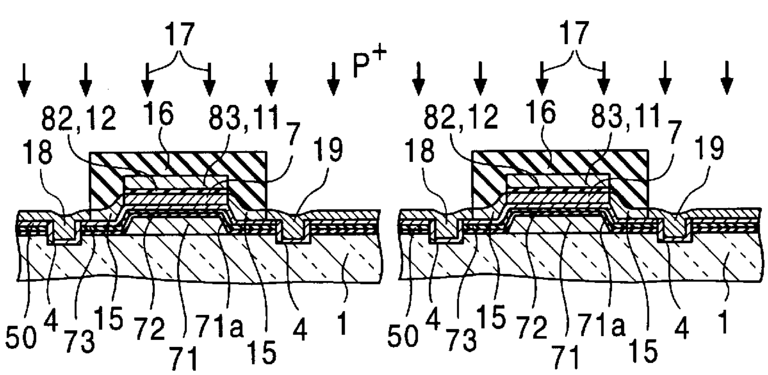

With reference to FIG. 70L, the gate section and the LDD section of the nMOSTFT are covered with a photoresist layer 16, and the exposed region is doped with phosphorus or arsenic ions 17 by ion implantation to form a source section 18 and a drain section 19 of nMOSTFT composed of an $N^+$-type layer, as in the step in FIG. 32M.

Figure 71M:
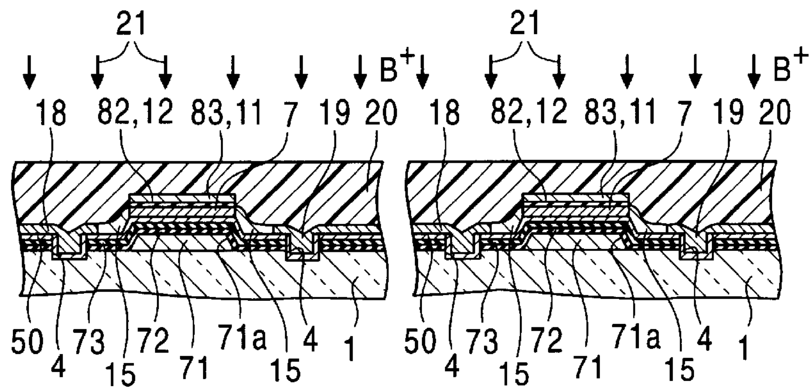

With reference to FIG. 71M, the gate section of the pMOSTFT is covered with a photoresist layer 20 and the exposed region is doped with boron ions 21 by ion implantation to form a source section and a drain section of the pMOSTFT composed of a $P^+$-layer in the peripheral-driving-circuit section, as in the step shown in FIG. 32N.

Figure 71N:
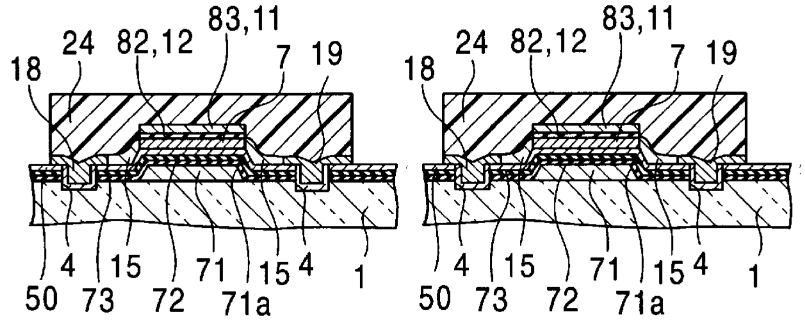

With reference to FIG. 71N, a photoresist layer 24 is provided and the single-crystal silicon layer is selectively removed by conventional photolithography and etching to island the active device section and the passive device section, as in the step shown in FIG. 330.

Figure 71O:
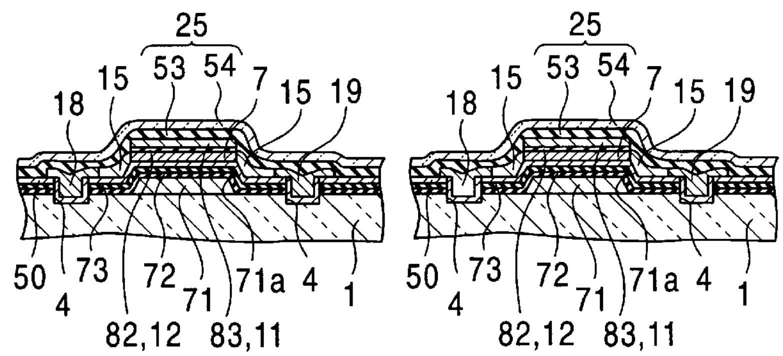

With reference to FIG. 71O, a $SiO_2$ film 53 having a thickness of approximately 200 nm and a phosphosilicate glass (PSG) glass 54 having a thickness of approximately 300 nm are formed on the entire surface by a plasma-enhanced CVD process, a high-density plasma-enhanced CVD process, or a catalytic CVD process, as in the step shown in FIG. 33P. These films 53 and 54 correspond to the protective film 25. Next, the single-crystal silicon layer 7 is activated.

Figure 71P:
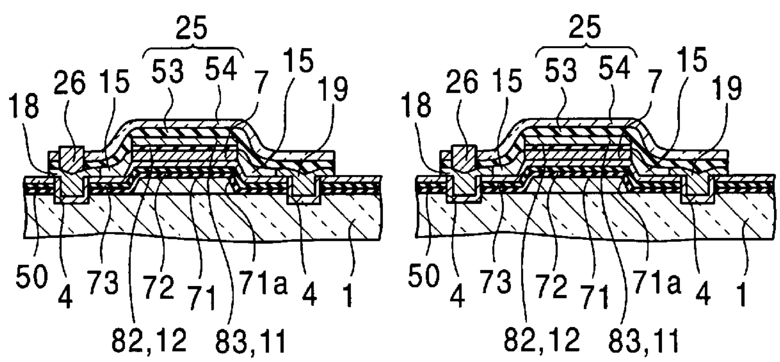

With reference to FIG. 71P, contact holes are formed at the source sections, as in the step shown in FIG. 33Q. An aluminum film having a thickness of 400 to 500 nm is formed on the entire surface by sputtering, and then source electrodes 26, data lines, and gate lines are simultaneously formed by conventional photolithography and etching.

Figure 72Q:
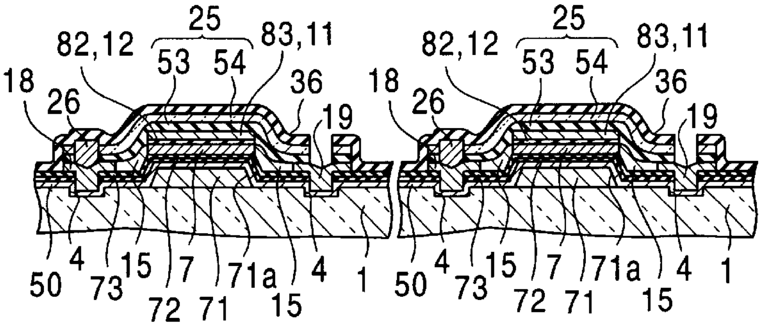

With reference to FIG. 72Q, an insulating film 36 including a PSG film having a thickness of approximately 300 nm and a SiN film having a thickness of approximately 300 nm is formed on the entire surface and contact holes are formed at the drain section of the display TFT, as in the step shown in FIG. 33R.

Figure 72R:
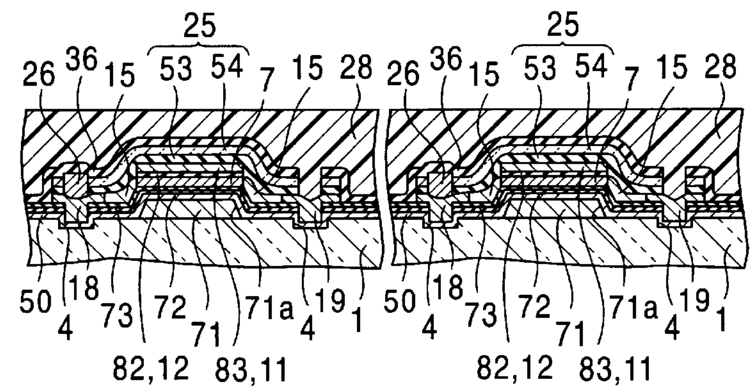
Figure 72S:
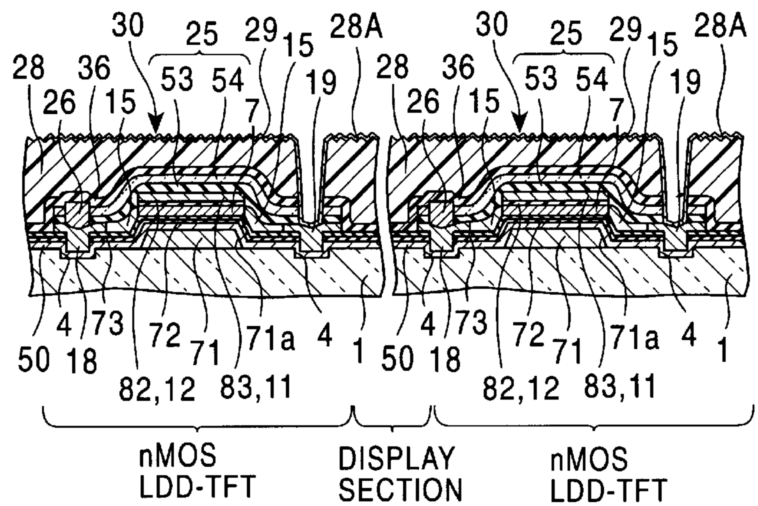

With reference to FIG. 72R, a photosensitive resin film 28 having a thickness of 2 to 3 μm is formed on the entire surface by spin coating or the like. With reference to FIG. 72S, a lower portion of a reflective face comprising an uneven surface 28A is formed in at least the pixel section, contact holes are formed at the drain sections of the display TFTs and an uneven aluminum reflective section 29 connecting to the drain sections 19 are formed so that optimized reflective and viewing-angle characteristics are achieved, as in the steps shown in FIGS. 34T and 34U.

The resulting active-matrix substrate 30 integrates a display section and a peripheral-driving-circuit section, in which the display section includes dual-gate nMOSLDD-TFTs and the peripheral-driving-circuit section includes a CMOS driving circuit having bottom-gate or dual-gate nMOSTFTs and pMOSTFTs. These TFTs are formed of the single-crystal silicon layer 7 formed by heteroepitaxy on the crystalline sapphire film 50 and the step differences 4 as seeds.

Twenty-first Embodiment

FIGS. 73G to 78P show a twenty-first embodiment of the present invention.

In the twenty-first embodiment, the gate electrode of each top-gate section is made of a material having relatively low heat resistance, such as aluminum or the like, unlike in the above-mentioned embodiments.

Figure 73G:
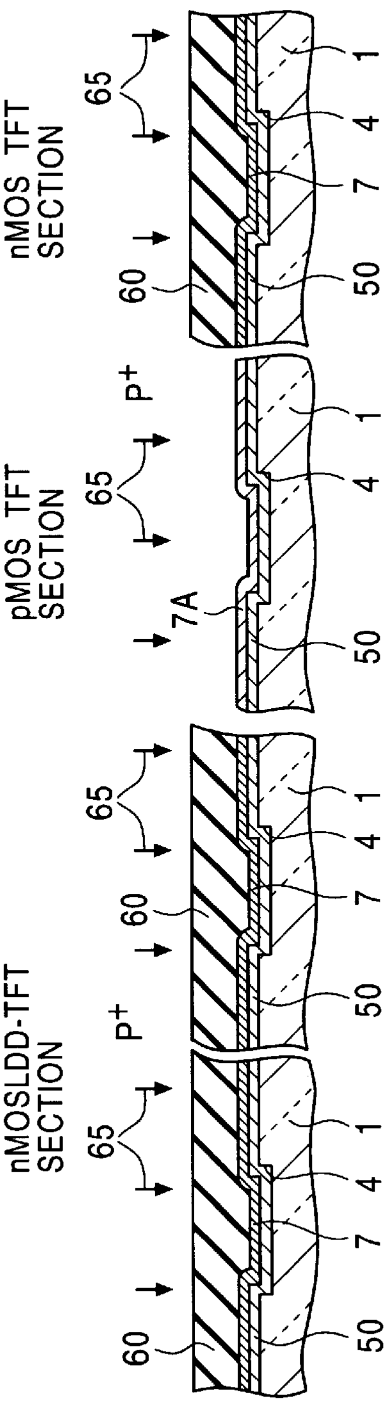
FIGS. 73G to 73H, 74I to 74K, and 75L to 75M are cross-sectional views illustrating production steps of a liquid crystal display (LCD) in accordance with a twenty-first embodiment of the present invention.

When top-gate MOSTFTs are provided in the display section and the peripheral driving circuit section, the same steps as those shown in FIGS. 1A to 2G are repeated to form N-type wells 7A in pMOSTFT sections of the peripheral driving circuit section, as shown in FIG. 73G.

Figure 73H:
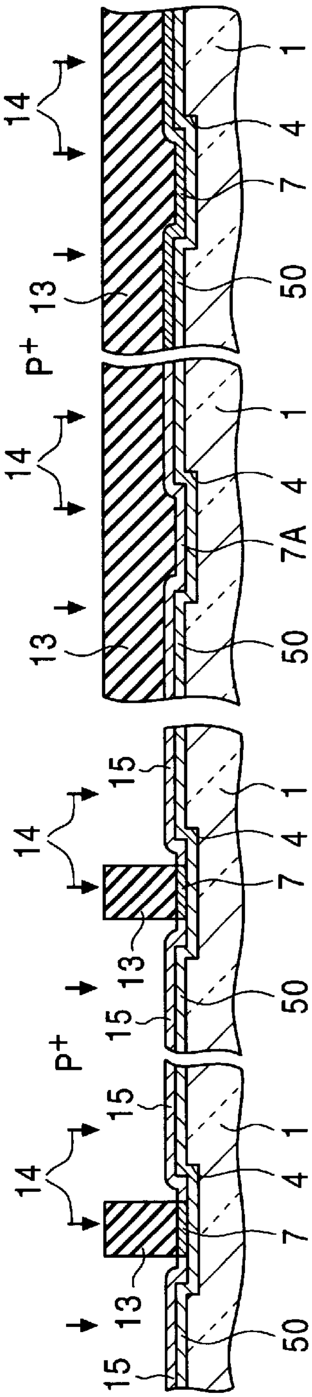

With reference to FIG. 73H, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 74I:
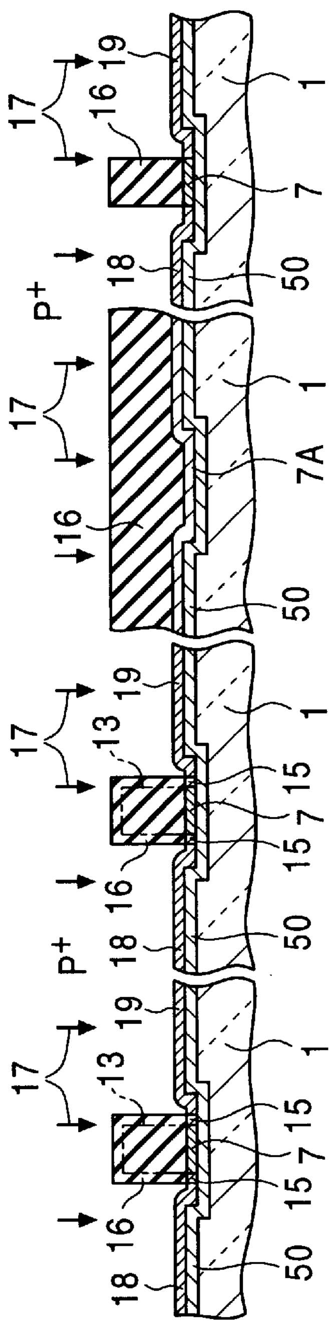

With reference to FIG. 74I, all of the pMOSTFTs in the peripheral driving region, the gate sections of the nMOSTFTs n the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs. In this case, preferably, the photoresist layer 13 is left as shown by phantom lines, and the photoresist layer 16 is provided to cover the photoresist layer 13. As a result, a mask used in forming the photoresist layer 16 can be aligned on the basis of the resist layer 13, thereby facilitating mask alignment and decreasing alignment error.

Figure 74J:
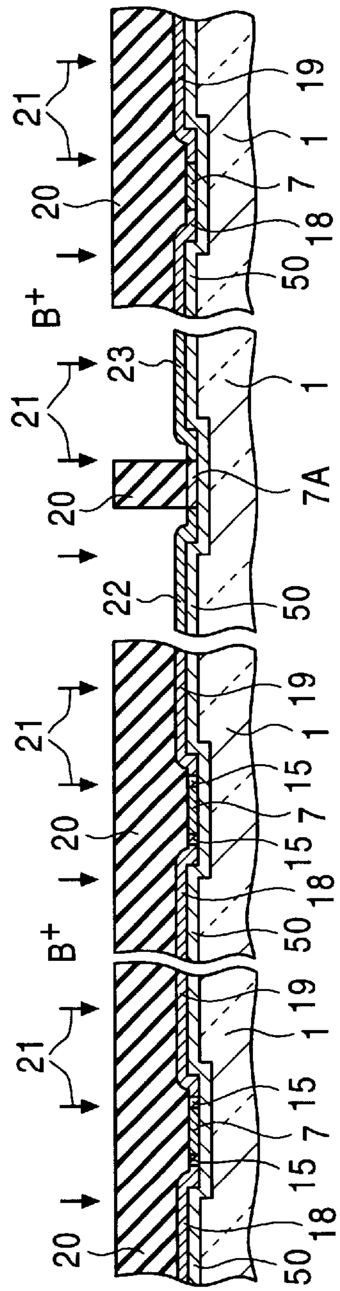

With reference to FIG. 74J, all of the nMOSTFTs in the peripheral driving region and the display region and the gate sections of the pMOSTFTs in the display region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 74K:
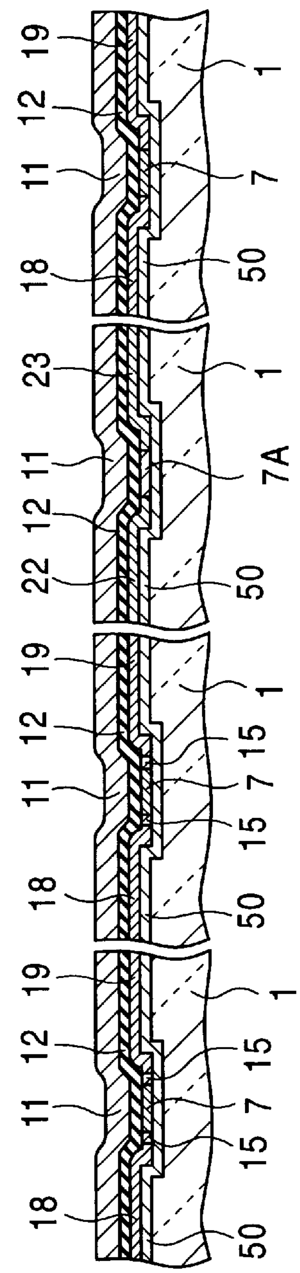

With reference to FIG. 74K, after the resist layer 20 is removed, the single-crystal silicon layers 7 and 7A are activated by the same method as described above, and a gate insulating film 12 and a gate electrode material (aluminum or aluminum containing 1% Si) 11 are further formed on the surface. The gate electrode material layer 11 can be formed by the vacuum evaporation or sputtering process.

Figure 75L:
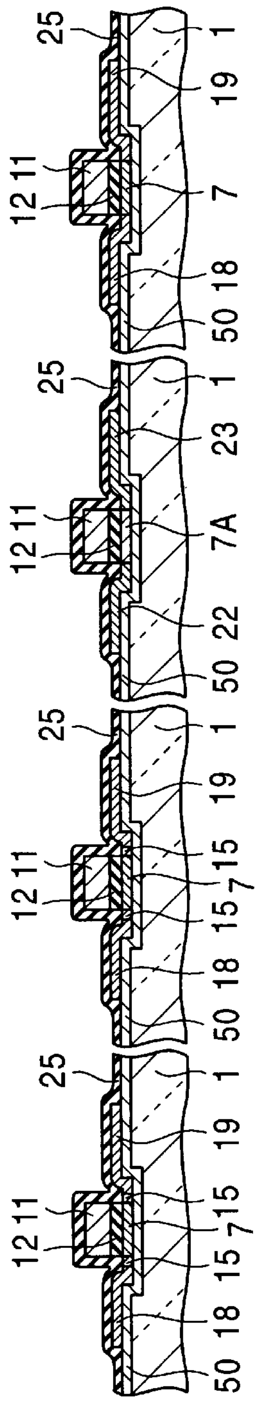

After the gate sections are patterned, the active device sections and the passive device sections are islanded by the same method as described above. With reference to FIG. 75L, a $SiO_2$ film having a thickness of approximately 200 nm and a phosphosilicate glass (PSG) film having a thickness of approximately 300 nm are continuously deposited in this order to form a protective film 25.

Figure 75M:
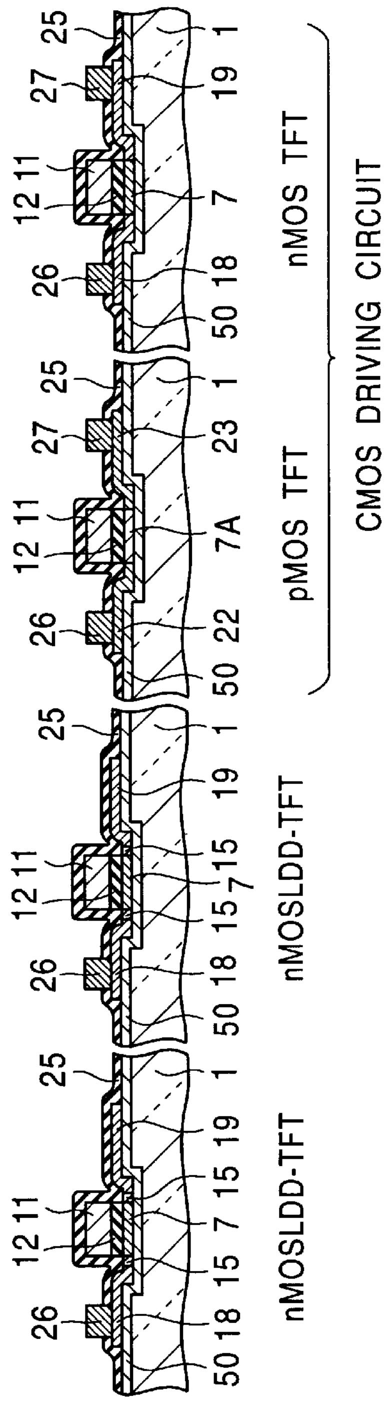

With reference to FIG. 75M, contact holes are formed in the source-drain sections of all TFTs in the peripheral driving circuit and the source sections of the TFTs in the display region by a conventional photolithographic process and etching process.

A sputtered film of aluminum, aluminum containing 1% Si, or the like, which has a thickness of 500 to 600 nm, is formed on the entire surface. By a conventional photolithographic process and etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Then, top-gate nMOSLDD-TFTs and CMOS driving circuits each comprising top-gate pMOSTFT and nMOSTFT, each of which comprises the gate electrode made of aluminum or aluminum containing 1% Si, are formed in the display section and the peripheral driving circuit section each comprising the single-crystal silicon layer 7 by the same steps as those shown in FIGS. 5P to 6S. As a result, an active matrix substrate 30 can be formed, in which the display section and the peripheral driving circuit section are integrated.

In this embodiment, the gate electrodes 11 made of aluminum or aluminum containing 1% Si are formed after activation of the single-crystal silicon layer 7, and thus the heat resistance of the gate electrode material is irrelevant to the thermal effect of activation. Therefore, inexpensive aluminum or aluminum containing 1% Si having relatively low heat resistance can be used as the top gate electrode material, thereby widening the range of selection of the electrode material. This is true for the display section comprising bottom-gate MOSTFTs.

Figure 76I:
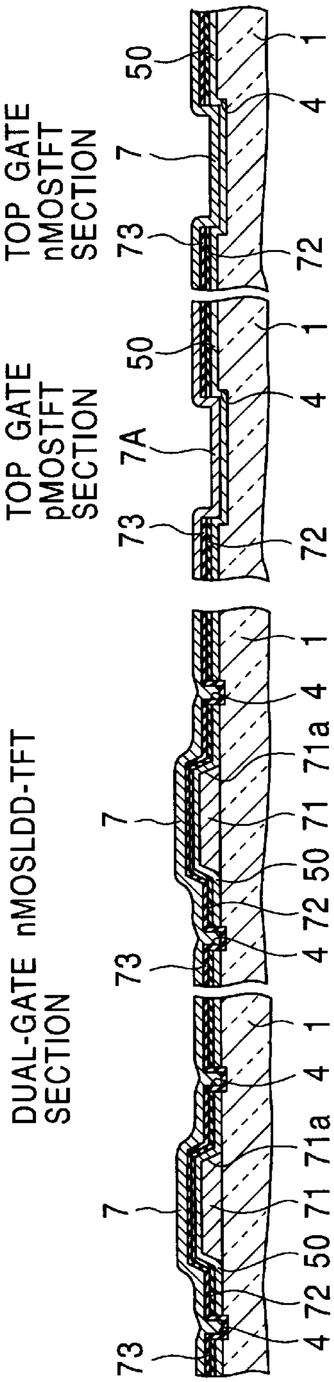
FIGS. 76I to 76J, 77K to 77M, and 78N to 78P are cross-sectional views illustrating production steps of a liquid crystal display (LCD) in accordance with the twenty-first embodiment of the present invention.

When dual-gate MOSTFTs are provided in the display section, and top-gate MOSTFTs are provided in the peripheral driving circuit section, the same steps as those shown in FIGS. 57A to 58I of the above-described nineteenth embodiment are repeated to form N-type wells 7A in the pMOSTFTs of the peripheral driving circuit section, as shown in FIG. 76I.

Figure 76J:
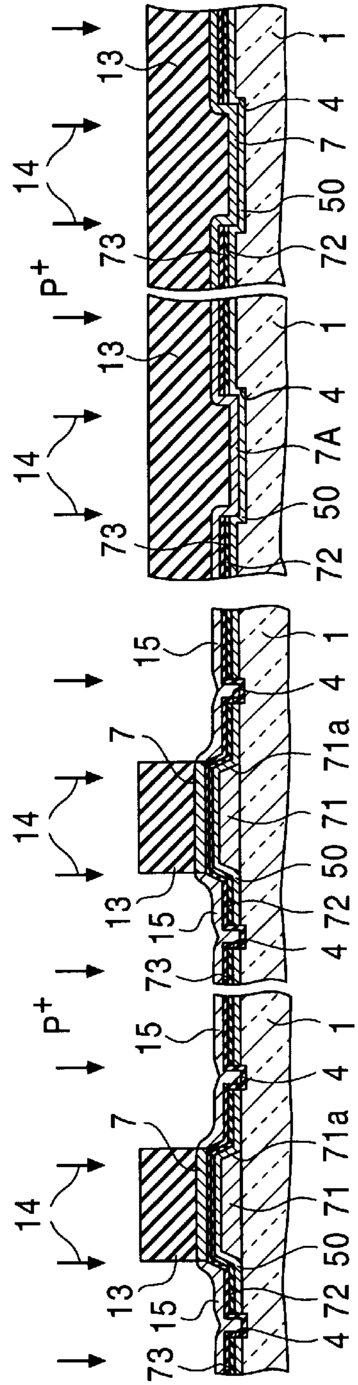

With reference to FIG. 76J, the TFTs in the display section are doped with phosphorus ions 14 to form the LDD sections 15 by the same step as shown in FIG. 73H.

Figures 77K, 77L, 77M:
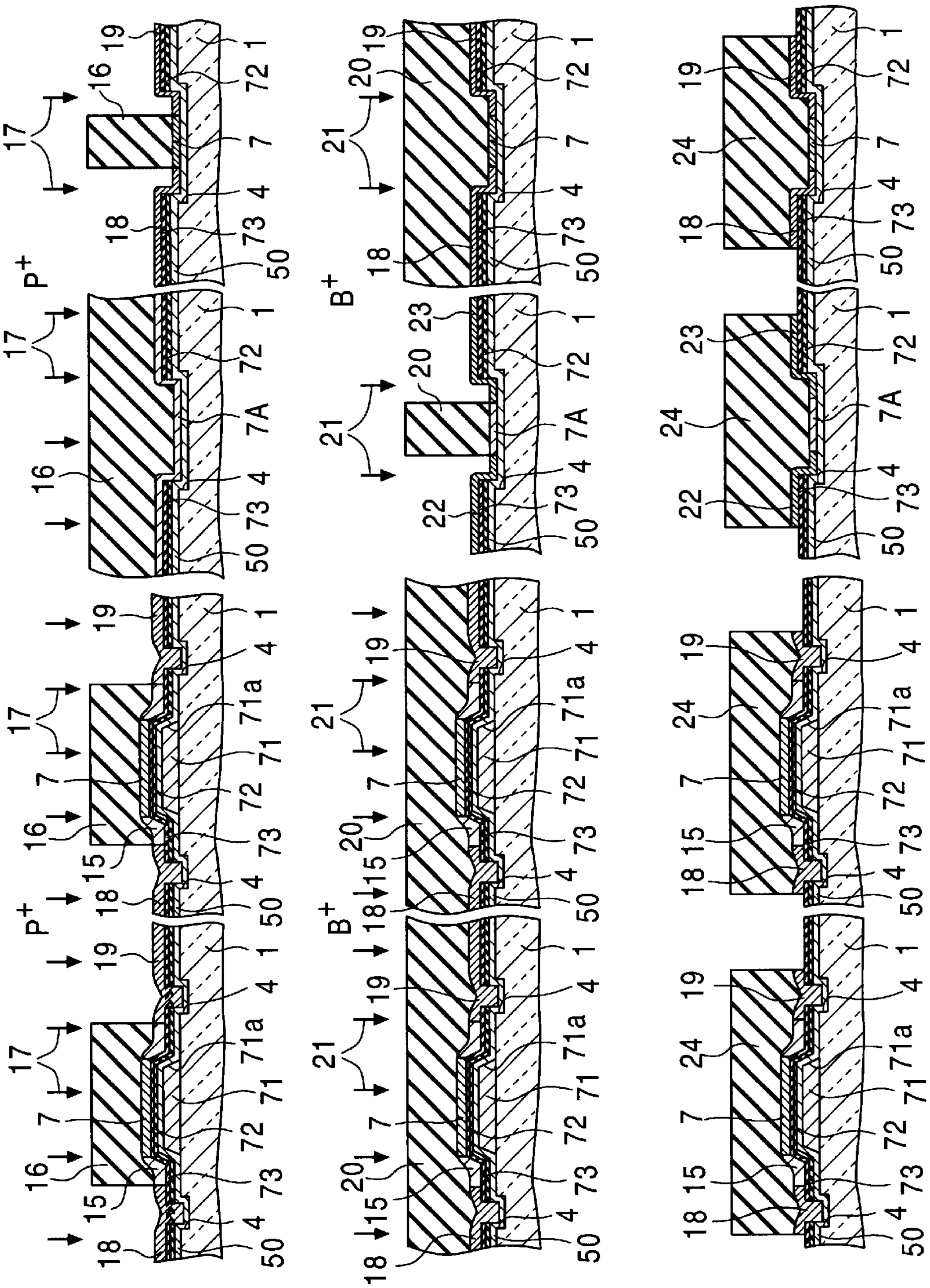

With reference to FIG. 77K, the nMOSTFTs in the display section and the peripheral driving section are doped with phosphorus ions 17 to form $N^+$-type source regions 18 and drain regions 19 by the same step as shown in FIG. 74I.

With reference to FIG. 77L, the pMOSTFTs in the peripheral driving circuit section are doped with boron ions 21 to form $P^+$-type source regions 22 and drain regions 23 by the same step as shown in FIG. 74J.

Figure 78N:
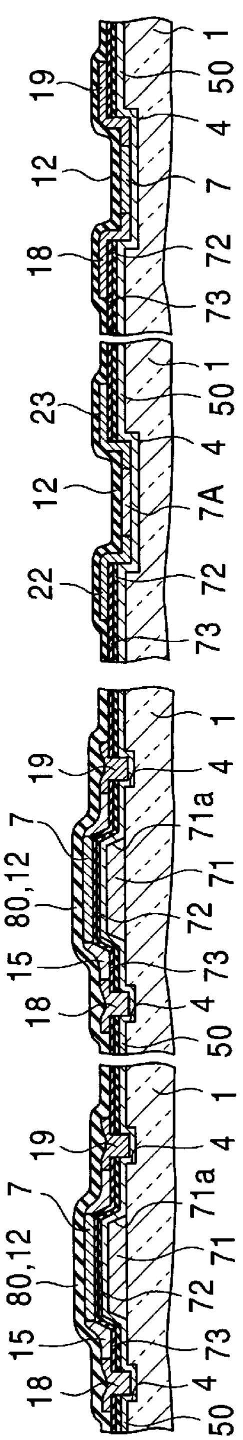

With reference to FIG. 77M, after the resist layer 20 is removed, the single-crystal layer 7 is patterned to island the active device sections and the passive device sections. With reference to FIG. 78N, the single-crystal silicon layers 7 and 7A are activated by the same method as described above, and gate insulating films 80 and 12 are formed on the surfaces of the display section and the peripheral driving circuit section, respectively.

Figure 78O:
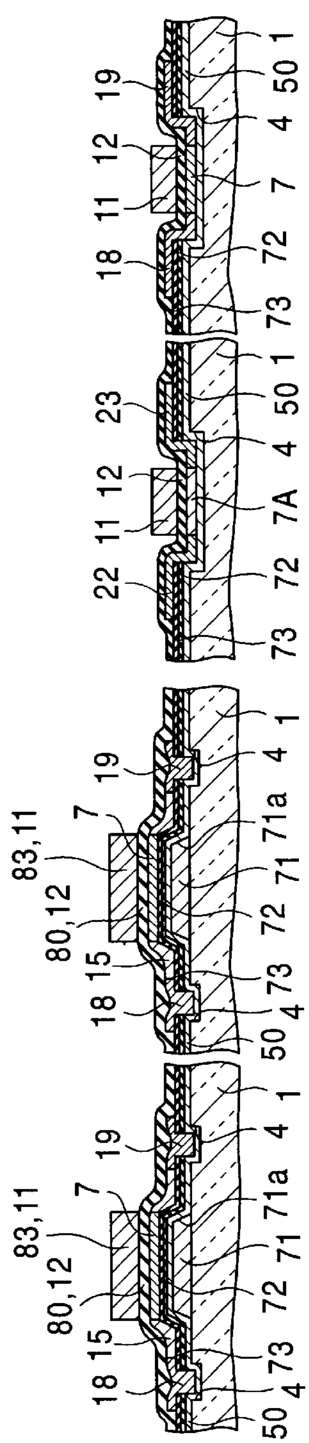

With reference to FIG. 78O, aluminum or aluminum containing 1% Si deposited by sputtering over the entire surface is patterned to form upper-gate electrodes 83 in the display section and gate electrodes 11 in the peripheral driving circuit section.

Figure 78P:
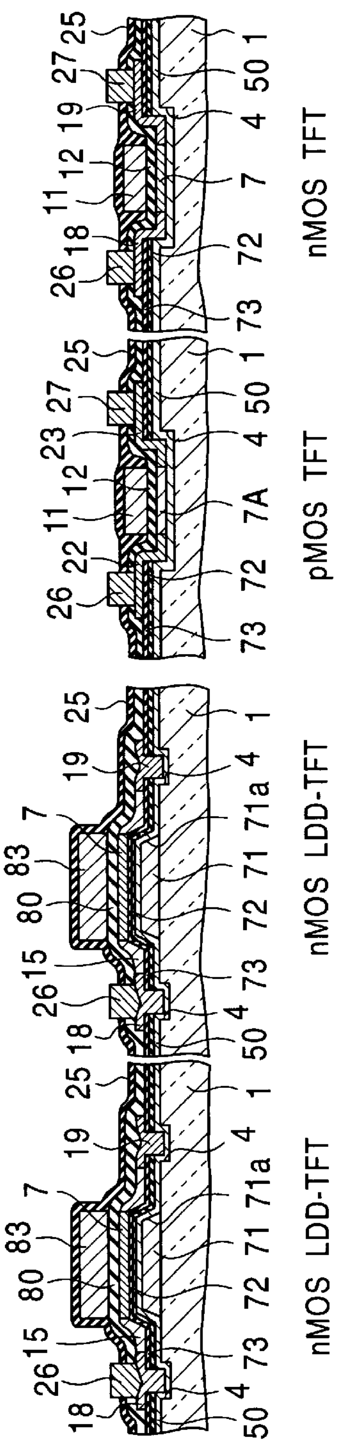

With reference to FIG. 78P, a $SiO_2$ film having a thickness of about 200 nm and a phosphosilicate glass (PSG) film having a thickness of about 300 nm are continuously formed in this order over the entire surface to form a protective film 25.

The source electrodes 26 of all of the TFTs in the peripheral driving circuit section and the display section, and the drain electrodes 27 in the peripheral driving circuit section are formed by the same method as described above. Then, dual-gate nMOSLDD-TFTs and CMOS driving circuits each comprising top-gate pMOSTFT and nMOSTFT, each of which comprises the gate electrode made of aluminum or the like, are formed in the display section and the peripheral driving circuit section each comprising the single-crystal silicon layer 7 by the same method as described above. As a result, an active matrix substrate 30 can be formed, in which the display section and the peripheral driving circuit section are integrated.

In this embodiment, the gate electrodes 11 and 83 made of aluminum or the like are formed after activation of the single-crystal silicon layer 7, and thus the heat resistance of the gate electrode material is irrelevant to the thermal effect of activation. Therefore, inexpensive aluminum or the like having relatively low heat resistance can be used as the top-gate electrode material, thereby widening the range of selection of the electrode material. In the step shown in FIG. 78O, the source electrodes 26 (further drain electrodes) can be formed at the same time, thereby causing an advantage for the manufacturing method.

Figure 79A:
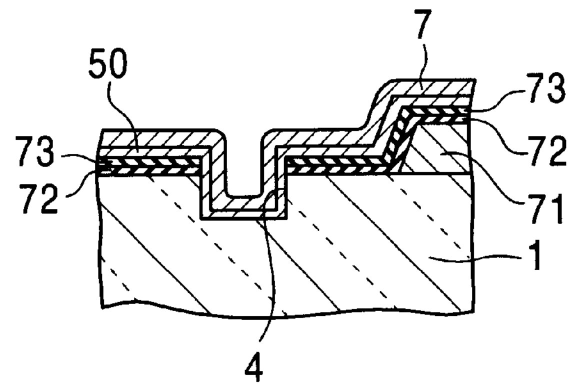
FIGS. 79A to 79C are cross-sectional views of main portions in the production steps of the LCDs in accordance with the twenty-first embodiment of the present invention.
Figure 79B:
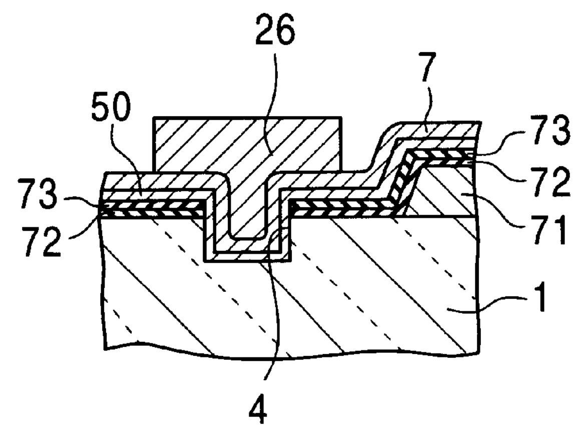
Figure 79C:
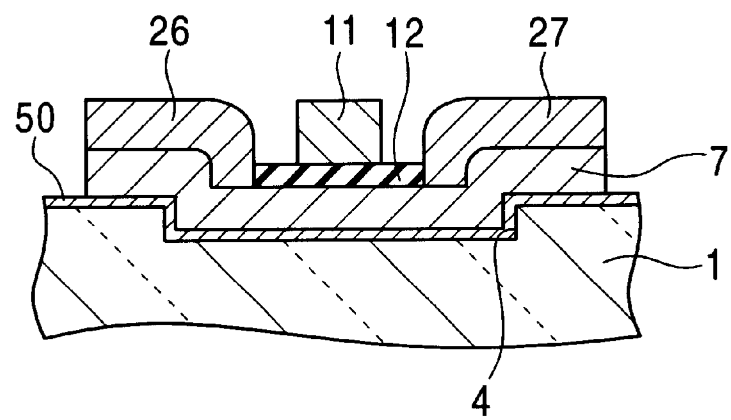

In any one of the above embodiments, in forming, for example, bottom-gate, top-gate or dual-gate MOSTFTs, the single-crystal silicon layer 7 deposited on each step difference 4 may have a discontinued (defective connection) or thin portion (increased resistance), as schematically shown in FIG. 79A. Thus, each of the source electrodes 26 (or the drain electrodes) is preferably provided in a region including the step difference 4 in order to ensure the connection to the single-crystal silicon layer 7, as shown in FIGS. 79B and 79C.

In the step shown in FIG. 73H or FIG. 76J, after the formation of the top-gate insulating film on the single-crystal silicon layer 7, ion implantation and activation treatment may be performed and then the top-gate electrodes and source and drain electrodes may be simultaneously formed of aluminum.

Figure 80A:
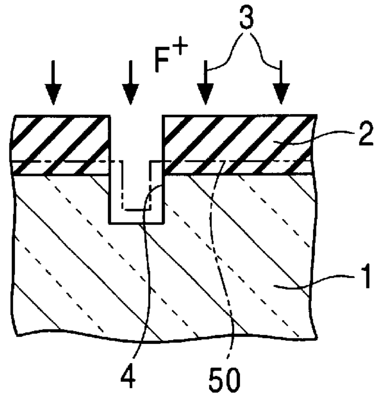
FIGS. 80A to 80E are cross-sectional views of main portions in the production steps of the LCDs in accordance with the twenty-first embodiment of the present invention.
Figure 80B:
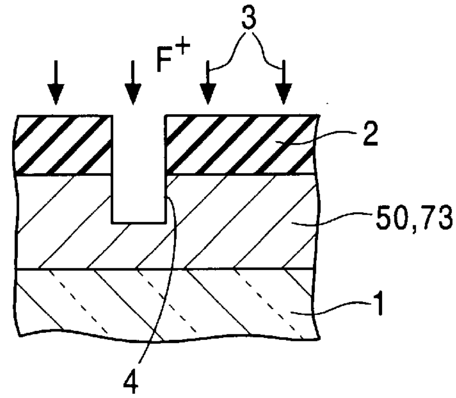
Figure 80C:
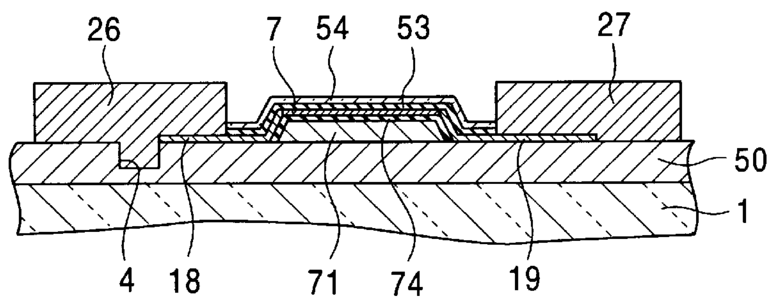
Figure 80D:
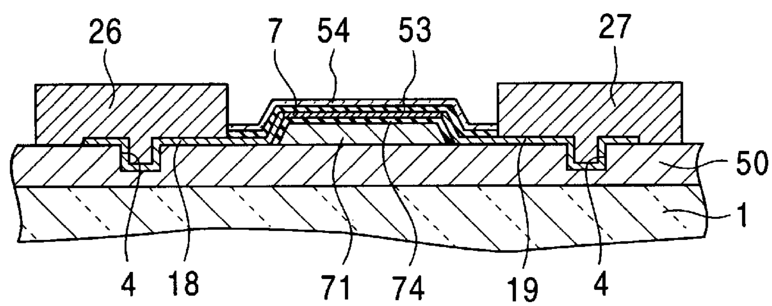
Figure 80E:
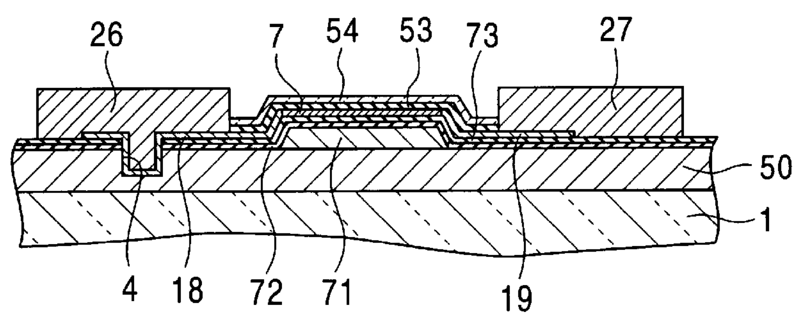

The step differences 4 are formed on the substrate 1 (and the SiN film formed thereon) in the above embodiments, as shown in FIG. 80A. For example, as shown in FIG. 80B, the step differences 4 may be formed on a crystalline sapphire thin film 50 on the substrate 1, in which the crystalline sapphire thin film 50 has the function as a stopper to diffusion of ions from the glass substrate 1. Alternatively, the gate insulating films 72 and 73 may be formed instead of the crystalline sapphire thin film 50 or below the crystalline sapphire film 50, and the step differences 4 may be formed thereon. FIGS. 80C, 80D and 80E show examples in which the step differences 4 are provided on the crystalline sapphire thin film 50.

Twenty-second Embodiment

FIGS. 81J to 86Q show a twenty-second embodiment of the present invention.

Unlike in the above-mentioned embodiments, in the twenty-second embodiment, the gate electrode of each top-gate section is made of a material having relatively low heat resistance, such as aluminum, an aluminum alloy, for example, aluminum containing 1% Si or 1 to 2% copper, copper, or the like.

Figures 81J, 81K:
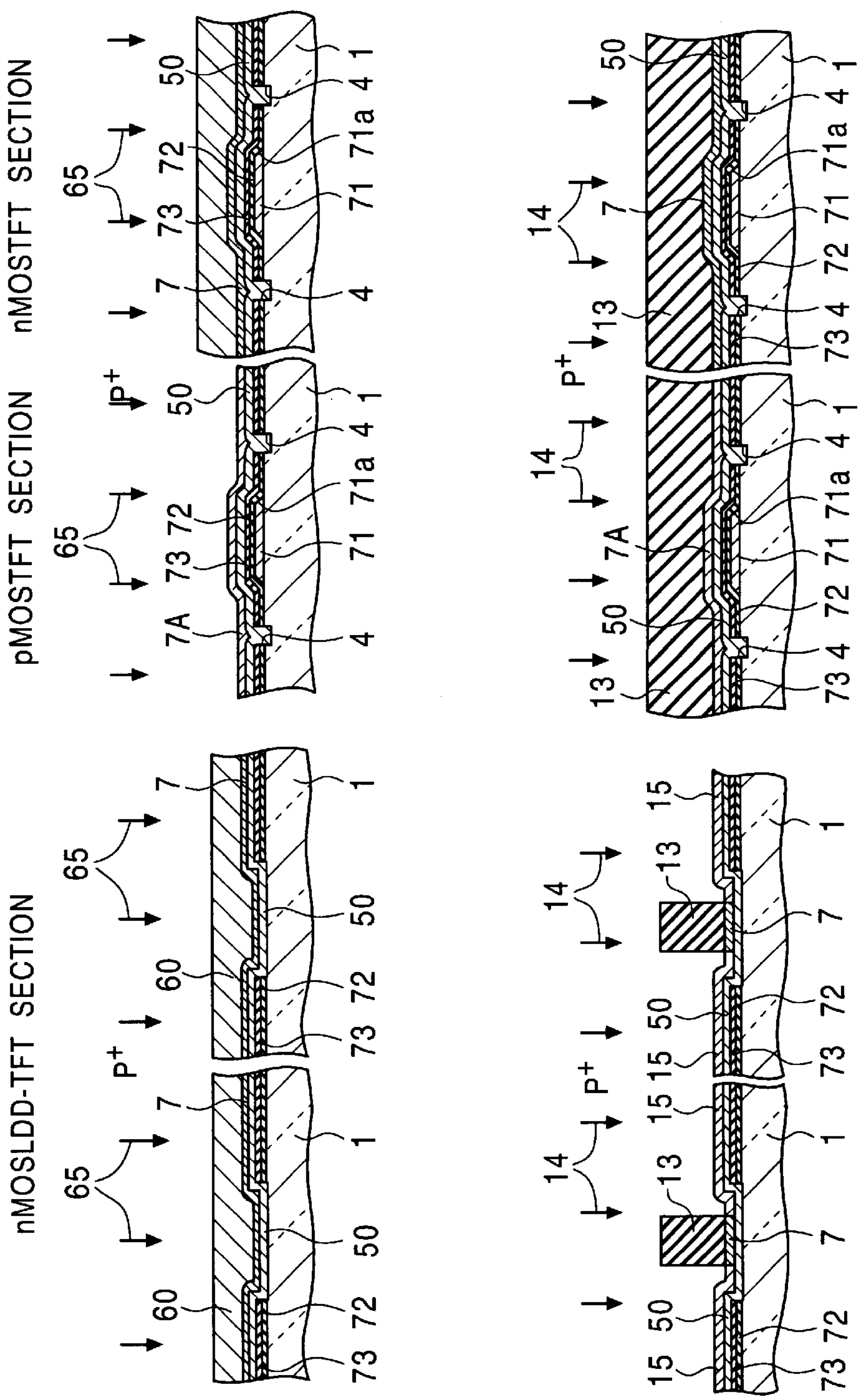
FIGS. 81J to 81K, 82L to 82N, and 83O to 83P are cross-sectional views illustrating the production steps of the LCD in accordance with a twenty-second embodiment of the present invention.

When top-gate MOSTFTs are provided in the display section, and bottom-gate MOSTFTs are provided in the peripheral driving circuit section, the same steps as those shown in FIGS. 14A to 16J in the second embodiment are repeated to form N-type wells 7A in pMOSTFT sections of the peripheral driving circuit section, as shown in FIG. 81J.

With reference to FIG. 81K, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 82L:
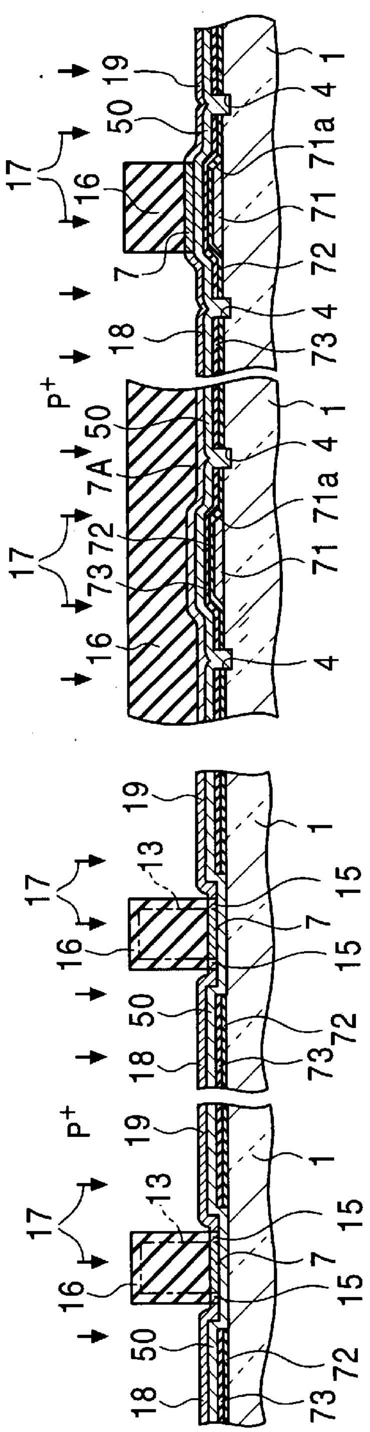

With reference to FIG. 82L, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs. In this case, preferably, the photoresist layer 13 is left as shown by phantom lines, and the photoresist layer 16 is provided to cover the photoresist layer 13. As a result, a mask used in forming the photoresist layer 16 can be aligned on the basis of the resist layer 13, thereby facilitating mask alignment and decreasing alignment error.

Figure 82M:
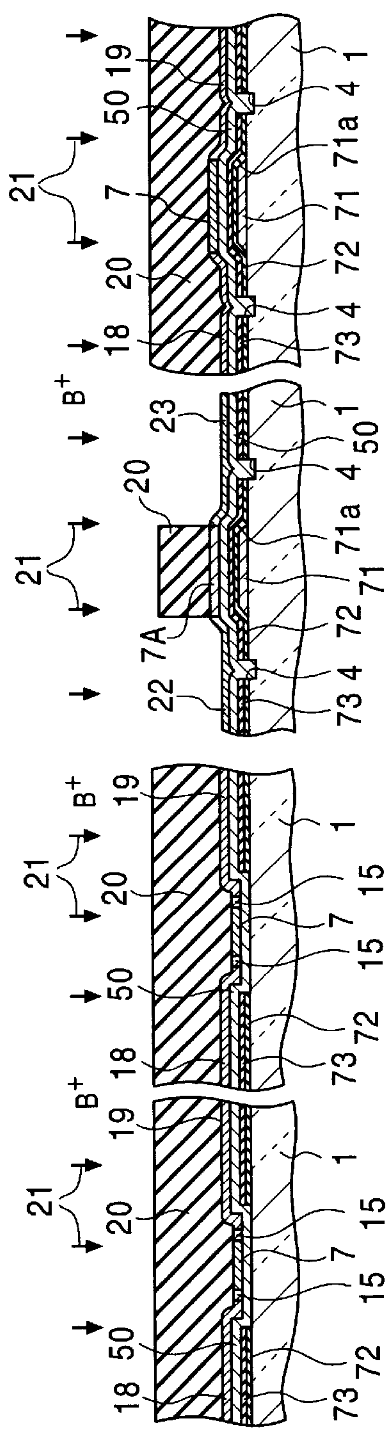

With reference to FIG. 82M, all of the nMOSTFTs in the peripheral driving region and the display region and the gate sections of the pMOSTFTs in the display region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 82N:
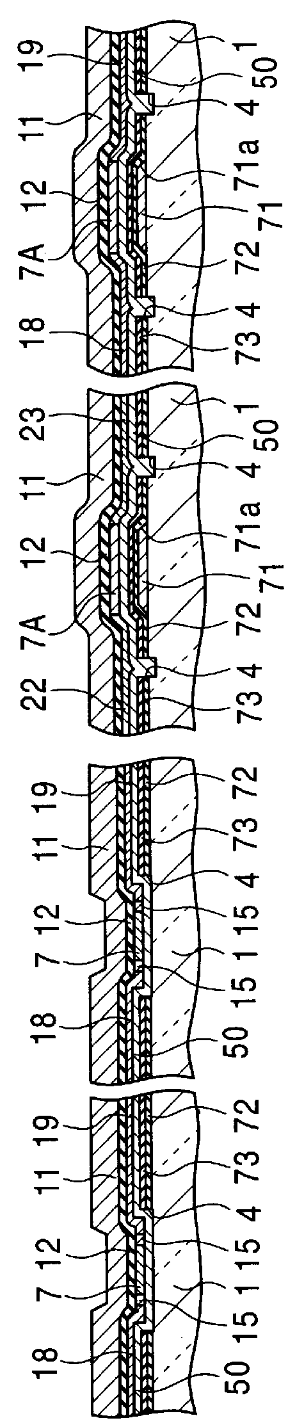

With reference to FIG. 82N, after the resist layer 20 is removed, the single-crystal silicon layers 7 and 7A are activated by the same method as described above, and a gate insulating film 12 and a gate electrode material (aluminum or aluminum containing 1% Si) 11 are further formed on the surface. The gate electrode material layer 11 can be formed by the vacuum evaporation or sputtering process.

Figure 83O:
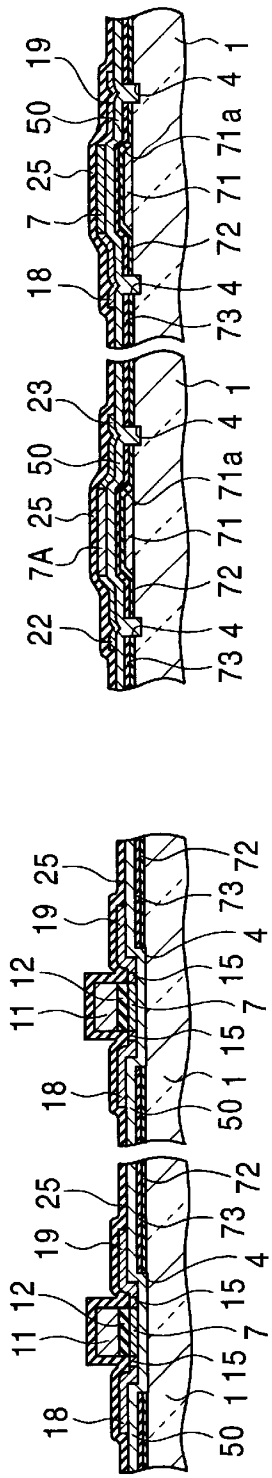

After the gate sections are patterned, the active device sections and the passive device sections are islanded by the same method as described above. With reference to FIG. 83O, a $SiO_2$ film having a thickness of approximately 200 nm and a phosphosilicate glass (PSG) film having a thickness of approximately 300 nm are continuously deposited in this order to form a protective film 25.

Figure 83P:
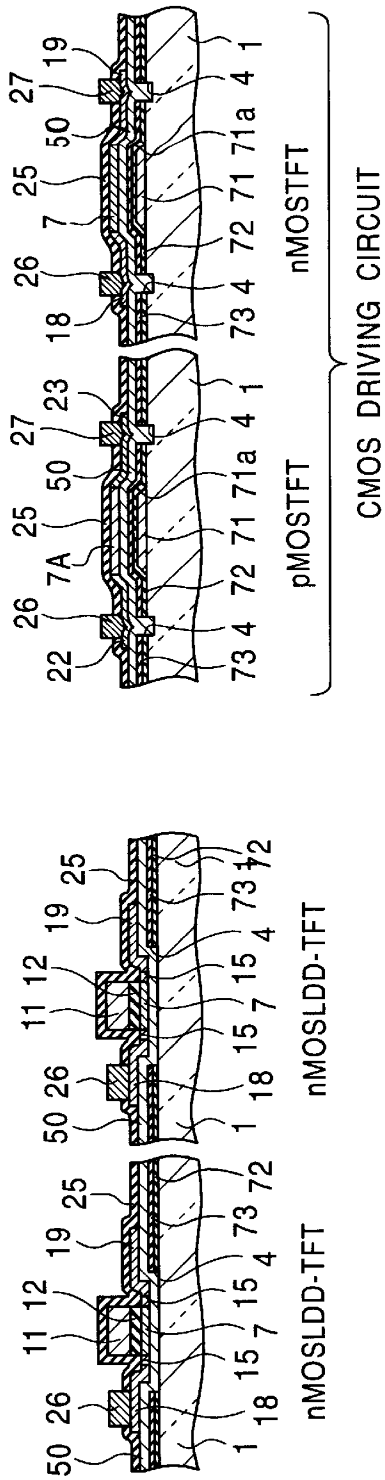

With reference to FIG. 83P, contact holes are formed in the source-drain sections of all TFTs in the peripheral driving circuit and the source sections of the TFTs in the display region by a conventional photolithographic process and etching process.

A sputtered film of aluminum, aluminum containing 1% Si, or the like, which has a thickness of 500 to 600 nm, is formed on the entire surface. By a conventional photolithographic process and etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Then, top-gate nMOSLDD-TFTs and CMOS driving circuits each comprising bottom-gate pMOSTFT and nMOSTFT, each of which comprises the gate electrode made of aluminum or aluminum containing 1% Si, are formed in the display section and the peripheral driving circuit section each comprising the single-crystal silicon layer 7 by the same steps as those shown in FIGS. 19S to 20V. As a result, an active matrix substrate 30 can be formed, in which the display section and the peripheral driving circuit section are integrated.

In this embodiment, the gate electrodes 11 made of aluminum or aluminum containing 1% Si are formed after activation of the single-crystal silicon layer 7, and thus the heat resistance of the gate electrode material is irrelevant to the thermal effect of activation. Therefore, inexpensive aluminum or aluminum containing 1% Si having relatively low heat resistance can be used as the top gate electrode material, thereby widening the range of selection of the electrode material. This is true for the display section comprising bottom-gate MOSTFTs.

Figure 84J:
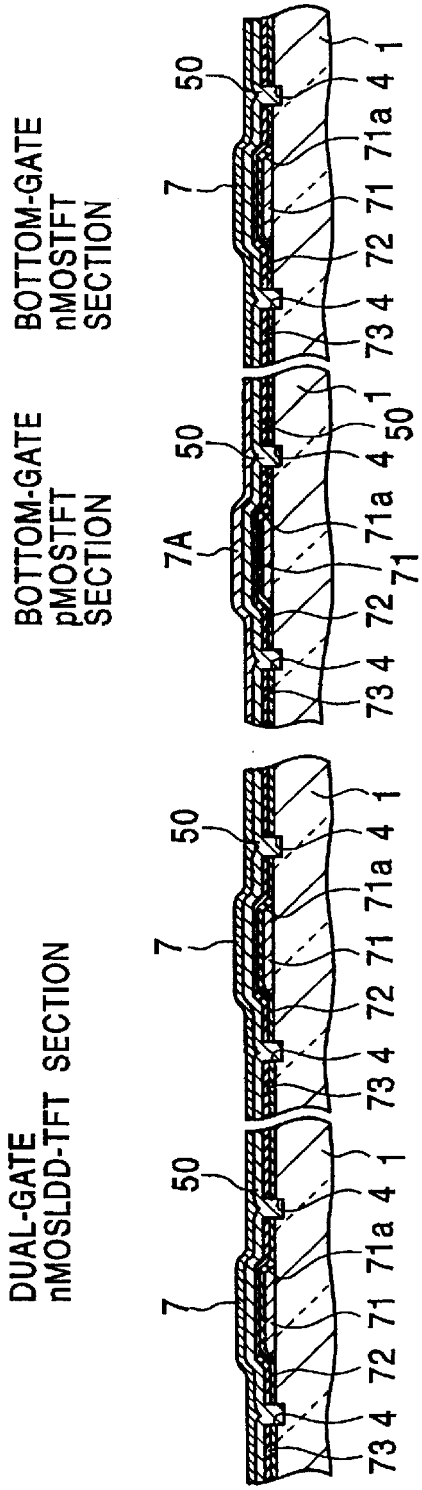

When dual-gate MOSTFTs are provided in the display section, and bottom-gate MOSTFTs are provided in the peripheral driving circuit section, the same steps as those shown in FIGS. 57A to 58I of the above-described nineteenth embodiment are repeated to form N-type wells 7A in the pMOSTFTs of the peripheral driving circuit section, as shown in FIG. 84J.

Figure 84K:
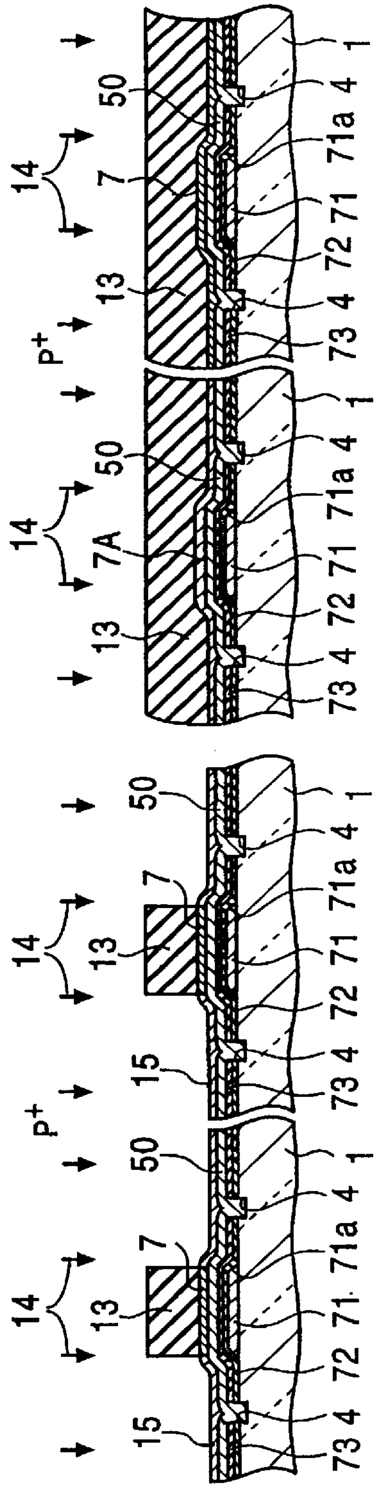

With reference to FIG. 84K, the TFTs in the display section are doped with phosphorus ions 14 to form the LDD sections 15 by the same step as shown in FIG. 81K.

Figure 85L:
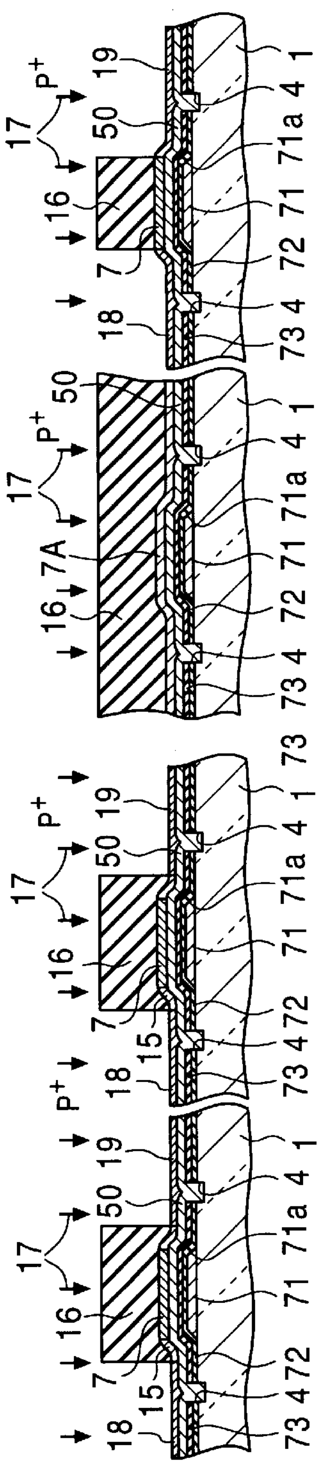

With reference to FIG. 85L, the nMOSTFTs in the display section and the peripheral driving section are doped with phosphorus ions 17 to form $N^+$-type source regions 18 and drain regions 19 by the same step as shown in FIG. 82L.

Figure 85M:
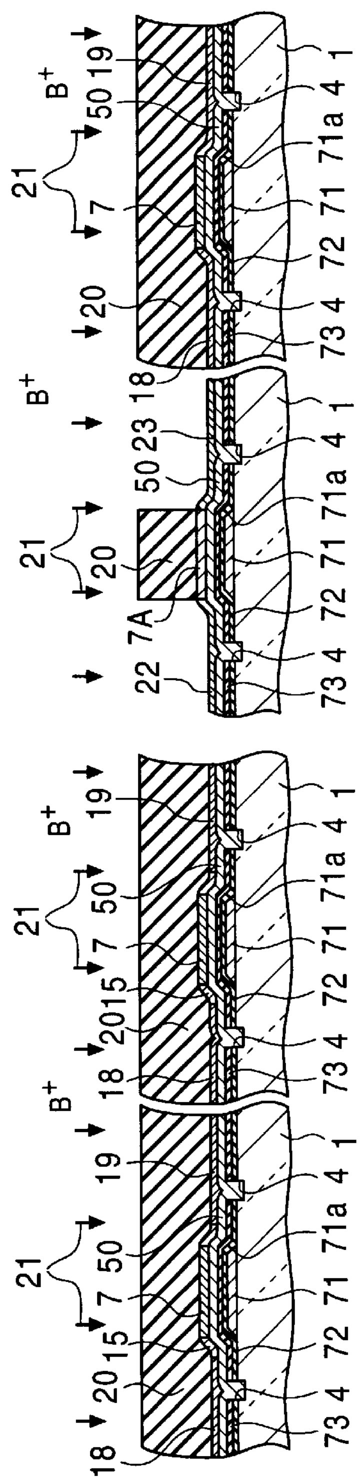

With reference to FIG. 85M, the pMOSTFTs in the peripheral driving circuit section are doped with boron ions 21 to form $P^+$-type source regions 22 and drain regions 23 by the same step as shown in FIG. 82M.

Figure 85N:
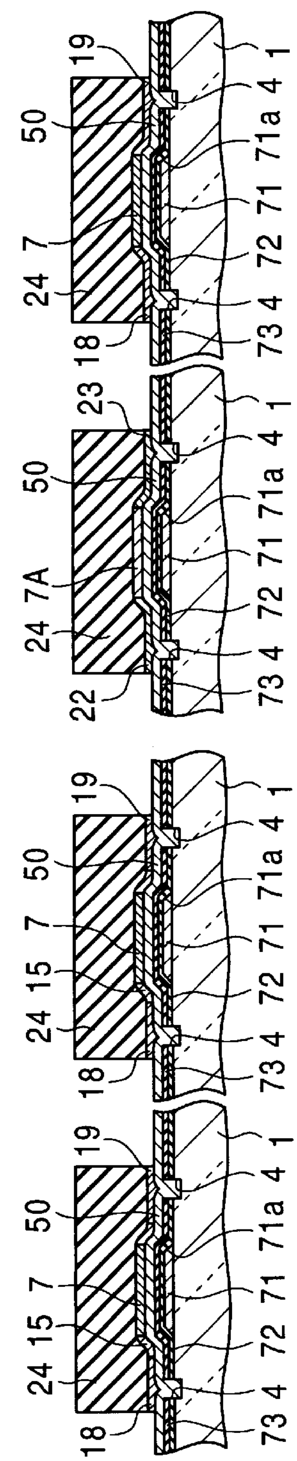
Figures 86O, 86P, 86Q:
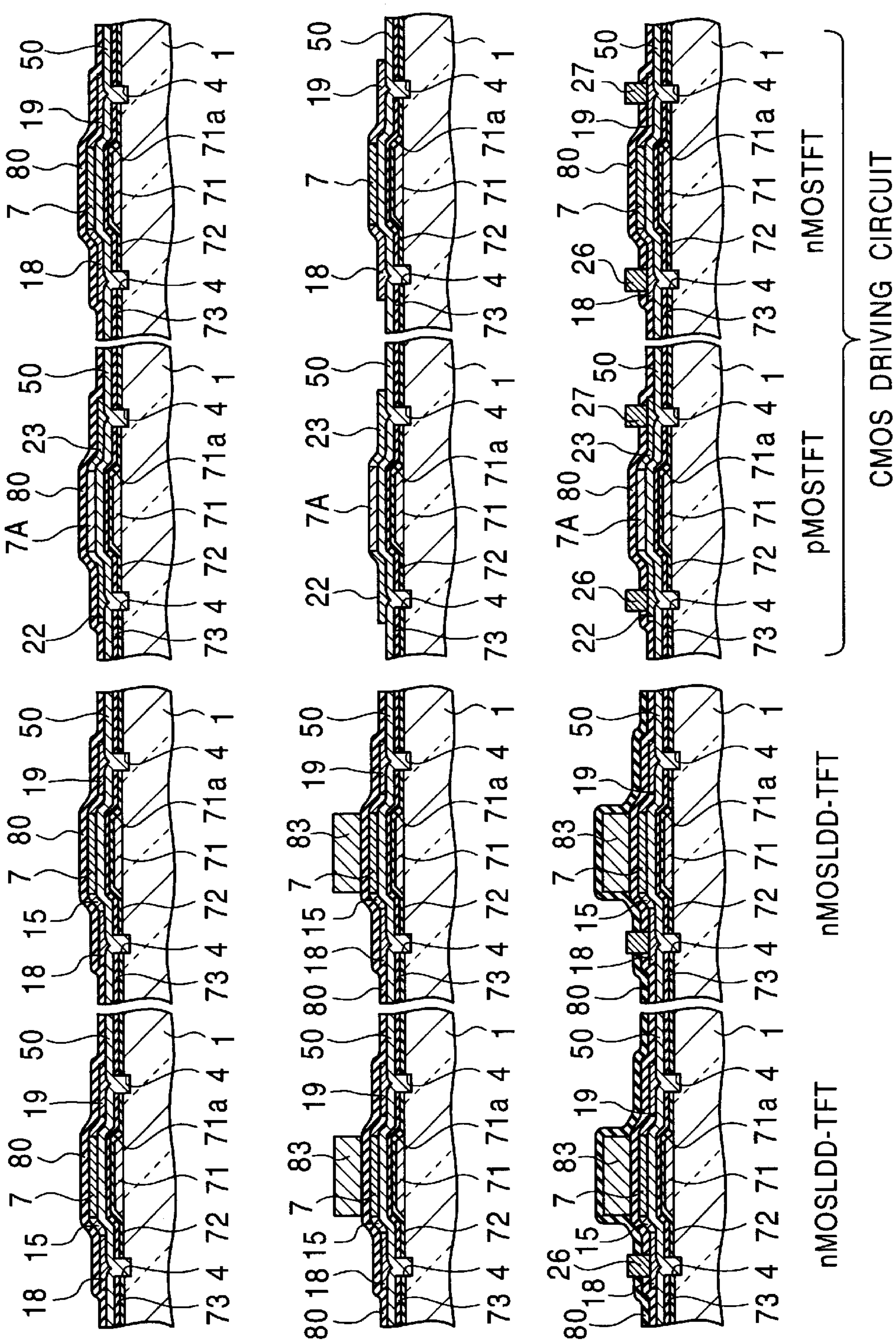

With reference to FIG. 85N, after the resist layer 20 is removed, the single-crystal layer 7 is patterned to island the active device sections and the passive device sections. With reference to FIG. 86O, the single-crystal silicon layers 7 and 7A are activated by the same method as described above, and a gate insulating film 80 is formed on the surface.

With reference to FIG. 86P, aluminum or the like deposited by sputtering over the entire surface is patterned to form upper-gate electrodes 83 in the display section.

With reference to FIG. 86Q, a $SiO_2$ film having a thickness of about 200 nm and a phosphosilicate glass (PSG) film having a thickness of about 300 nm are continuously formed in this order over the entire surface to form a protective film 25.

The source electrodes 26 of all of the TFTs in the peripheral driving circuit section and the display section, and the drain electrodes 27 in the peripheral driving circuit section are formed by the same method as described above. Then, dual-gate nMOSLDD-TFTs and CMOS driving circuits each comprising bottom-gate pMOSTFT and nMOSTFT, each of which comprises the gate electrode made of aluminum or the like, are formed in the display section and the peripheral driving circuit section each comprising the single-crystal silicon layer 7 by the same method as described above. As a result, an active matrix substrate 30 can be formed, in which the display section and the peripheral driving circuit section are integrated.

In this embodiment, the gate electrodes 83 made of aluminum or the like are formed after activation of the single-crystal silicon layer 7, and thus the heat resistance of the gate electrode material is irrelevant to the thermal effect of activation. Therefore, inexpensive aluminum or the like having relatively low heat resistance can be used as the top gate electrode material, thereby widening the range of selection of the electrode material. In the step shown in FIG. 86P, the source electrodes 26 (further drain electrodes) can be formed at the same time, thereby causing an advantage for the manufacturing method.

Figure 87A:
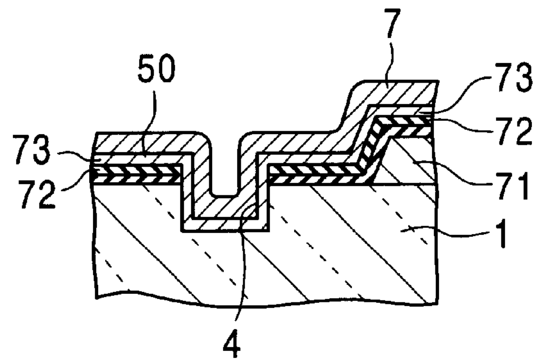
FIGS. 87A to 87C are cross-sectional views of main portions in the production steps of the LCD in accordance with the twenty-second embodiment of the present invention.
Figure 87B:
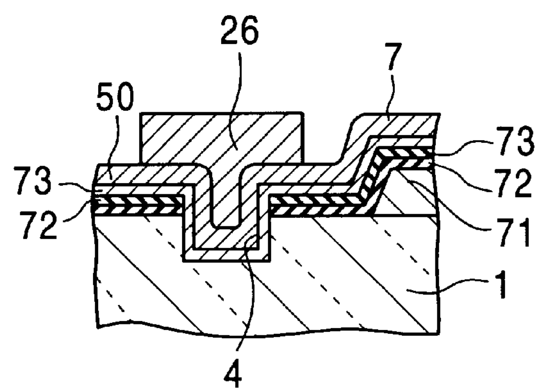
Figure 87C:
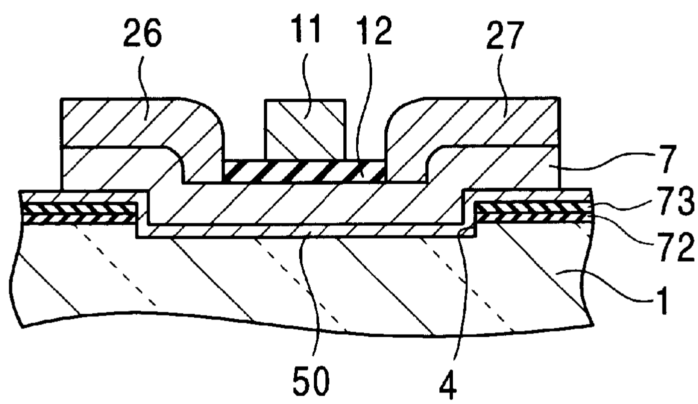

In any one of the above embodiments, in forming, for example, bottom-gate, top-gate or dual-gate MOSTFTs, the single-crystal silicon layer 7 deposited on each step difference 4 may have a discontinued (defective connection) or thin portion (increased resistance), as schematically shown in FIG. 87A. Thus, each of the source electrodes 26 (or the drain electrodes) is preferably provided in a region including the step difference 4 in order to ensure the connection to the single-crystal silicon layer 7, as shown in FIGS. 87B and 87C.

In the step shown in FIG. 81K or FIG. 84K, after the formation of the top-gate insulating film on the single-crystal silicon layer 7, ion implantation and activation treatment may be performed and then the top-gate electrodes and source and drain electrodes may be simultaneously formed of aluminum.

Figure 88A:
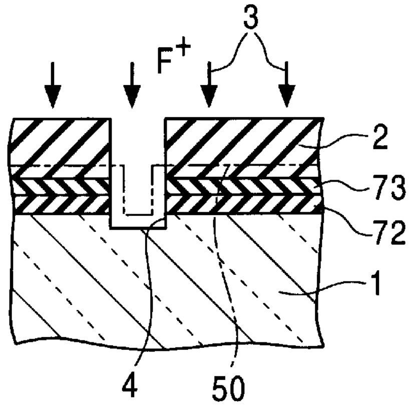
FIGS. 88A to 88E are cross-sectional views of main portions in the production steps of the LCD in accordance with the twenty-second embodiment of the present invention.
Figure 88B:
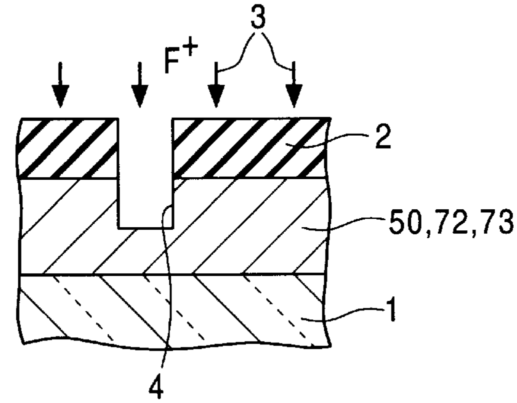
Figure 88C:
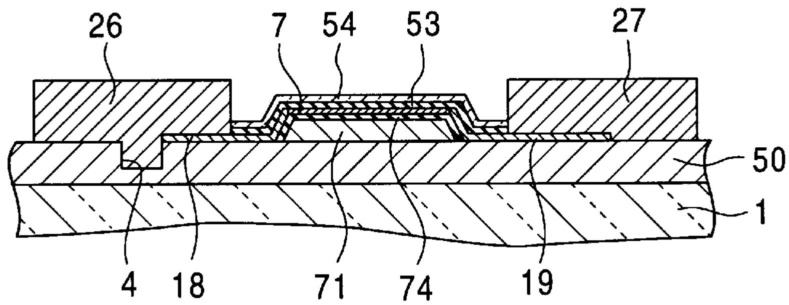
Figure 88D:
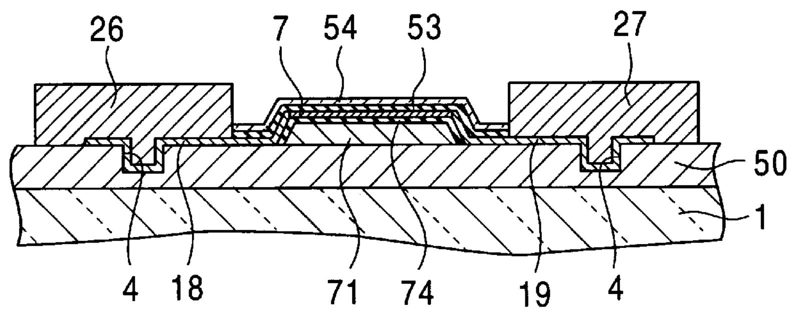
Figure 88E:
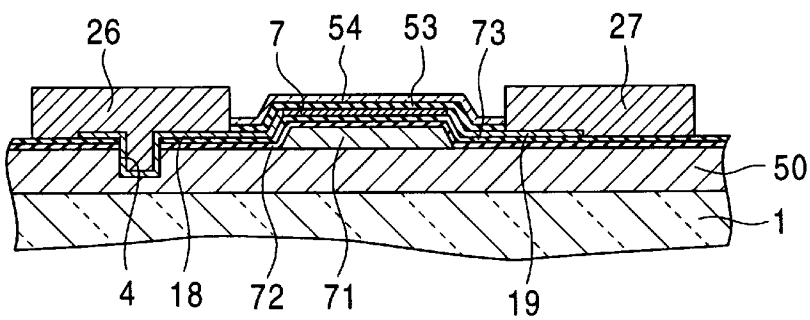

The step differences 4 are formed on the substrate 1 (and the SiN film formed thereon) in the above embodiments, as shown in FIG. 88A. For example, as shown in FIG. 88B, the step differences 4 may be formed on a crystalline sapphire thin film 50 on the substrate 1, in which the crystalline sapphire thin film 50 has the function as a stopper to diffusion of ions from the glass substrate 1. Alternatively, the gate insulating films 72 and 73 may be formed instead of the crystalline sapphire thin film 50 or below the crystalline sapphire film 50, and the step differences 4 may be formed thereon. FIGS. 88C, 88D and 88E show examples in which the step differences 4 are provided on the crystalline sapphire thin film 50.

Twenty-third Embodiment

FIGS. 89J to 94Q show a twenty-third embodiment of the present invention.

Unlike in the above-mentioned embodiments, in the twenty-third embodiment, the gate electrode of each top-gate section is made of a material having relatively low heat resistance, such as aluminum, an aluminum alloy, for example, aluminum containing 1% Si or 1 to 2% copper, copper, or the like.

Figure 89J:
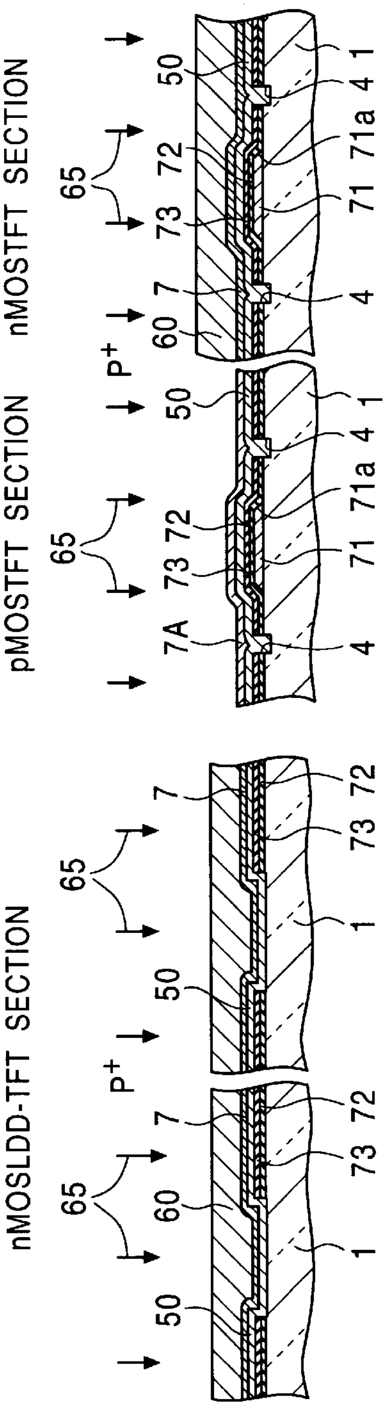
FIGS. 89J to 89K, 90L to 90N, and 91O to 91P are cross-sectional views of main portions in the production steps of the LCD in accordance with a twenty-third embodiment of the present invention.

When top-gate MOSTFTs are provided in the display section, and dual-gate MOSTFTs are provided in the peripheral driving circuit section, the same steps as those shown in FIGS. 21A to 23J in the third embodiment are repeated to form N-type wells 7A in pMOSTFT sections of the peripheral driving circuit section, as shown in FIG. 89J.

Figure 89K:
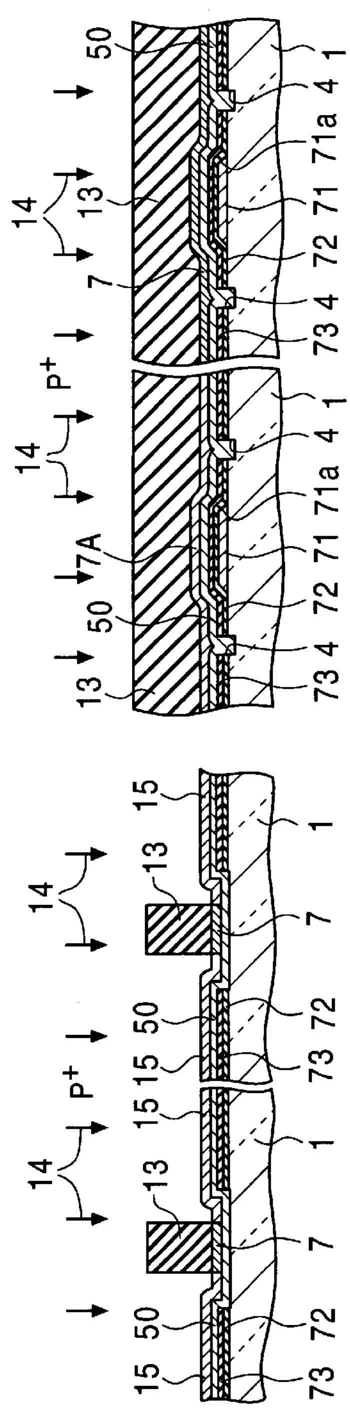

With reference to FIG. 89K, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 90L:
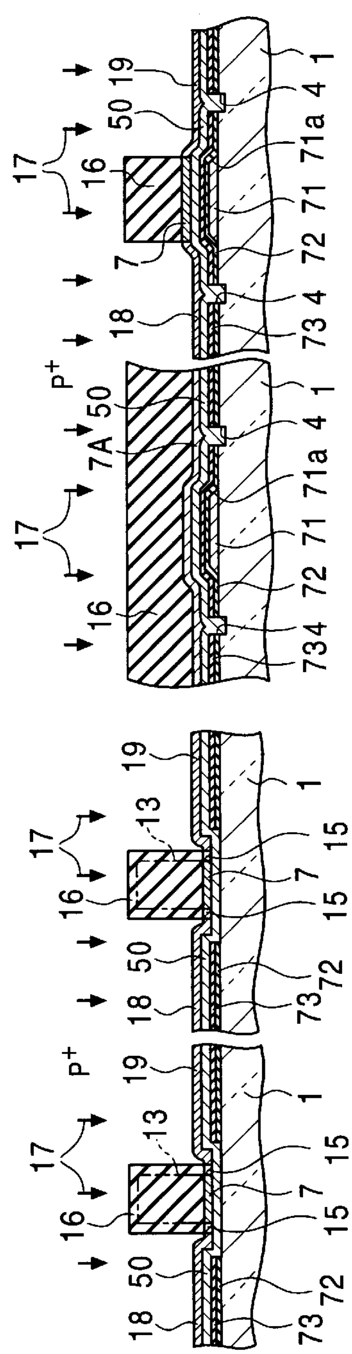

With reference to FIG. 90L, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs. In this case, preferably, the photoresist layer 13 is left as shown by phantom lines, and the photoresist layer 16 is provided to cover the photoresist layer 13. As a result, a mask used in forming the photoresist layer 16 can be aligned on the basis of the resist layer 13, thereby facilitating mask alignment and decreasing alignment error.

Figure 90M:
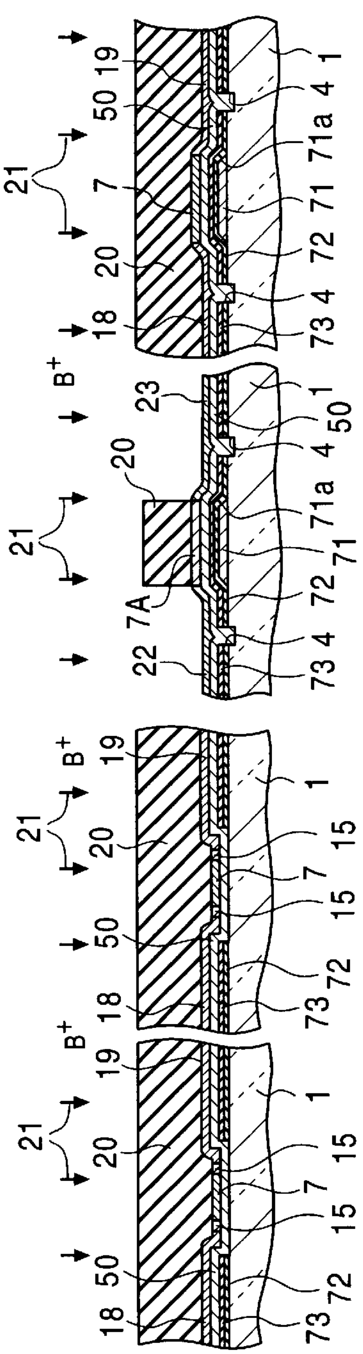

With reference to FIG. 90M, all of the nMOSTFTs in the peripheral driving region and the display region and the gate sections of the pMOSTFTs in the peripheral driving region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 90N:
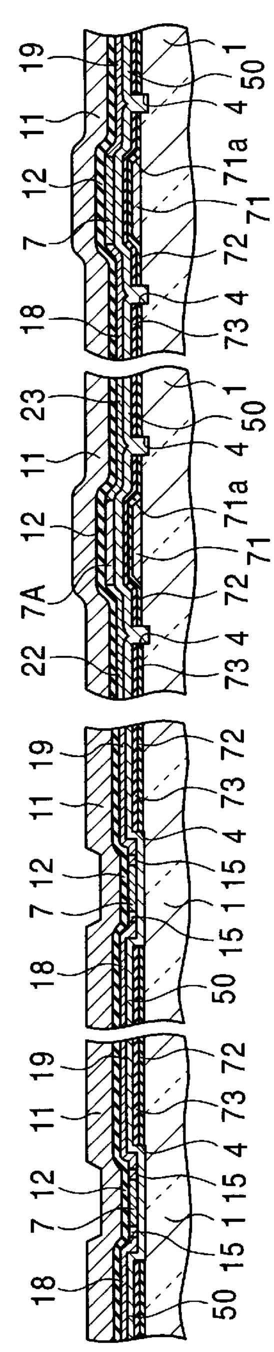

With reference to FIG. 90N, after the resist layer 20 is removed, the single-crystal silicon layers 7 and 7A are activated by the same method as described above, and a gate insulating film 12 and a gate electrode material (aluminum or aluminum containing 1% Si) 11 are further formed on the surface. The gate electrode material layer 11 can be formed by the vacuum evaporation or sputtering process.

Figure 91O:
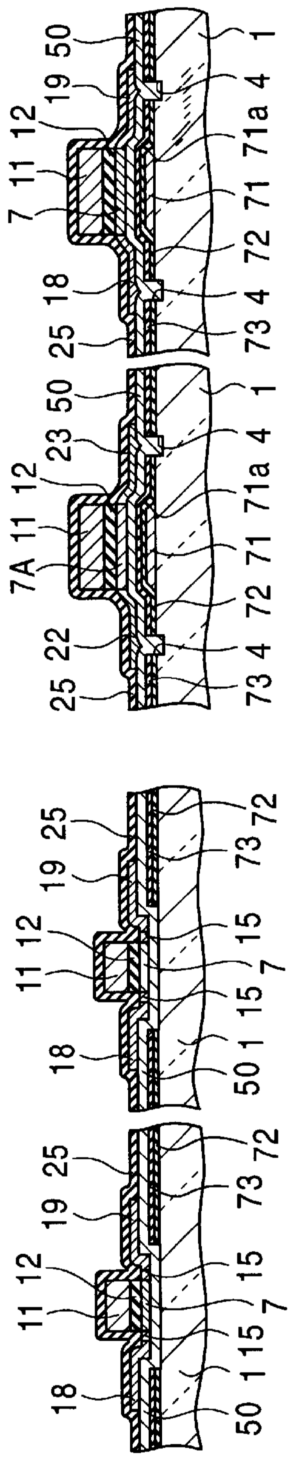

After the gate sections are patterned, the active device sections and the passive device sections are islanded by the same method as described above. With reference to FIG. 91O, a $SiO_2$ film having a thickness of approximately 200 nm and a phosphosilicate glass (PSG) film having a thickness of approximately 300 nm are continuously deposited in this order to form a protective film 25.

Figure 91P:
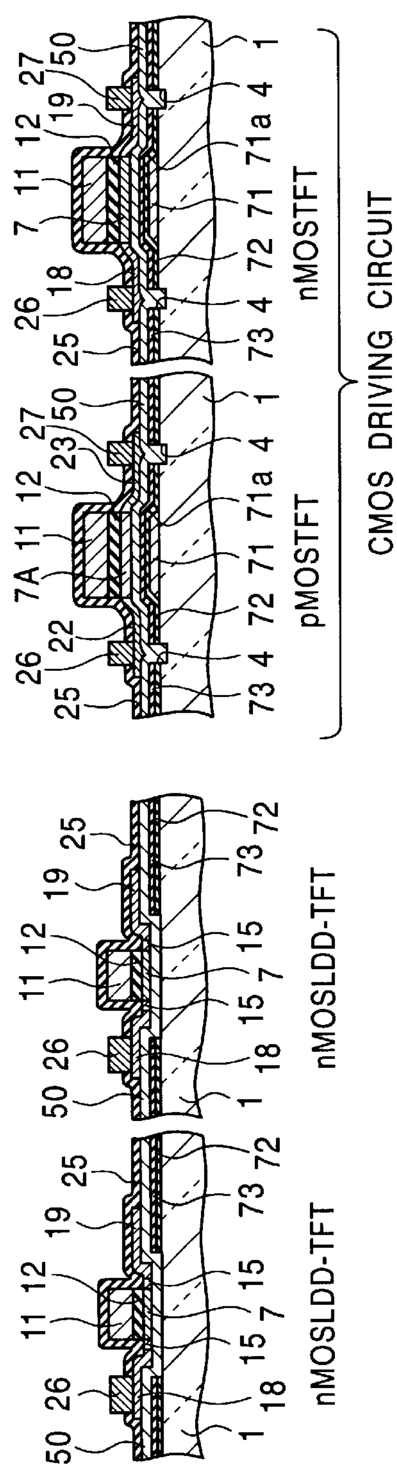

With reference to FIG. 91P, contact holes are formed in the source-drain sections of all TFTs in the peripheral driving circuit and the source sections of the TFTs in the display region by a conventional photolithographic process and etching process.

A sputtered film of aluminum, aluminum containing 1% Si, or the like, which has a thickness of 500 to 600 nm, is formed on the entire surface. By a conventional photolithographic process and etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Then, top-gate nMOSLDD-TFTs and CMOS driving circuits each comprising dual-gate pMOSTFT and nMOSTFT, each of which comprises the gate electrode made of aluminum or aluminum containing 1% Si, are formed in the display section and the peripheral driving circuit section each comprising the single-crystal silicon layer 7 by the same steps as those shown in FIGS. 26S to 27V. As a result, an active matrix substrate 30 can be formed, in which the display section and the peripheral driving circuit section are integrated.

In this embodiment, the gate electrodes 11 made of aluminum or aluminum containing 1% Si are formed after activation of the single-crystal silicon layer 7, and thus the heat resistance of the gate electrode material is irrelevant to the thermal effect of activation. Therefore, inexpensive aluminum or aluminum containing 1% Si having relatively low heat resistance can be used as the top gate electrode material, thereby widening the range of selection of the electrode material. This is true for the display section comprising bottom-gate MOSTFTs.

Figure 92J:
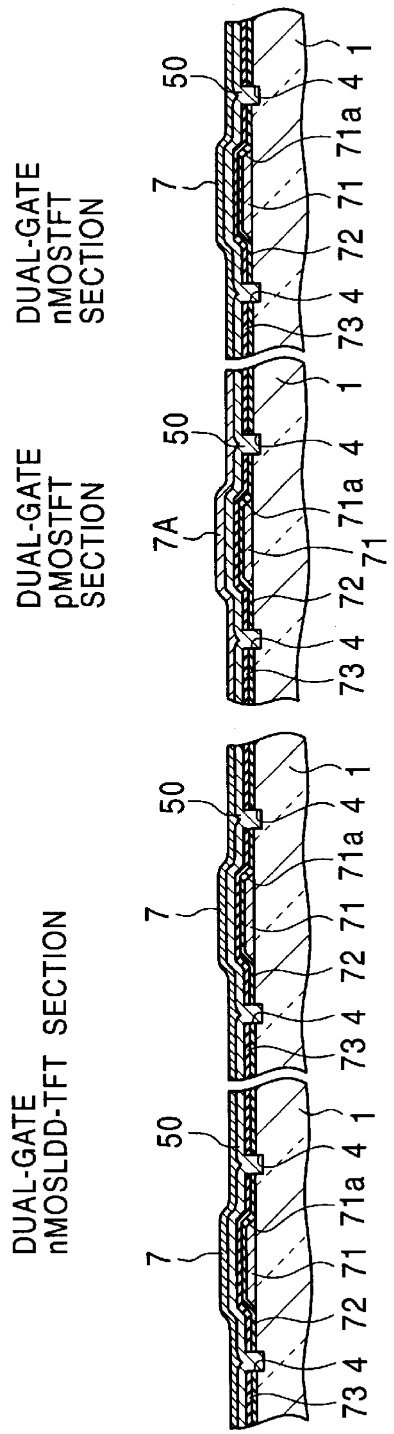
FIGS. 92J to 92K, 93L to 93N, and 94O to 94Q are cross-sectional views of main portions in the production steps of the LCD in accordance with the twenty-third embodiment of the present invention.

When dual-gate MOSTFTs are provided in the display section, and dual-gate MOSTFTs are provided in the peripheral driving circuit section, the same steps as those shown in FIGS. 57A to 58I of the above-described nineteenth embodiment are repeated to form N-type wells 7A in the pMOSTFTs of the peripheral driving circuit section, as shown in FIG. 92J.

Figure 92K:
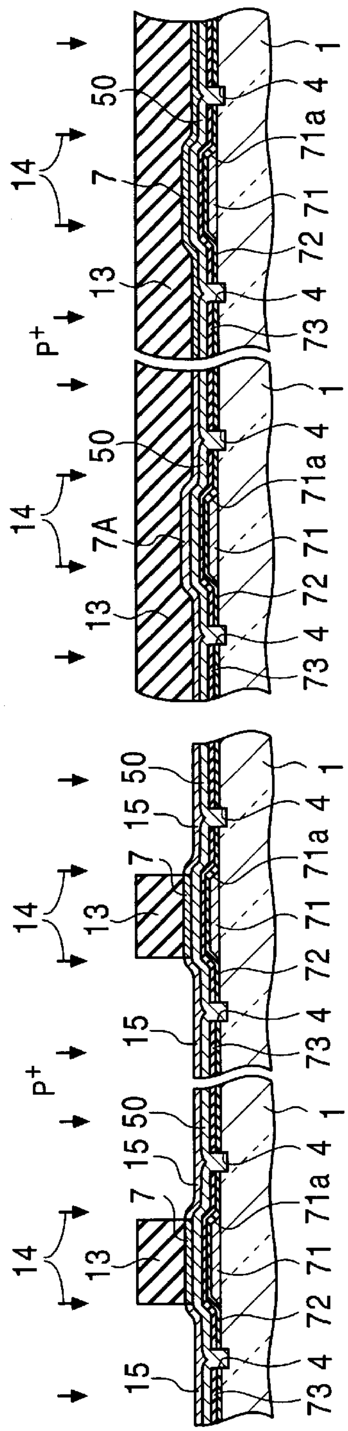

With reference to FIG. 92K, the TFTs in the display section are doped with phosphorus ions 14 to form the LDD sections 15 by the same step as shown in FIG. 89K.

Figure 93L:
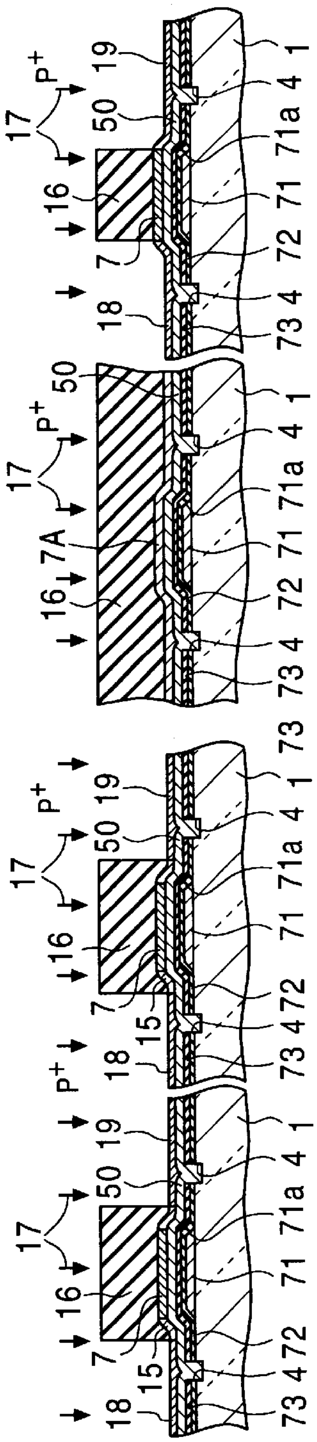

With reference to FIG. 93L, the nMOSTFTs in the display section and the peripheral driving section are doped with phosphorus ions 17 to form $N^+$-type source regions 18 and drain regions 19 by the same step as shown in FIG. 90L.

Figure 93M:
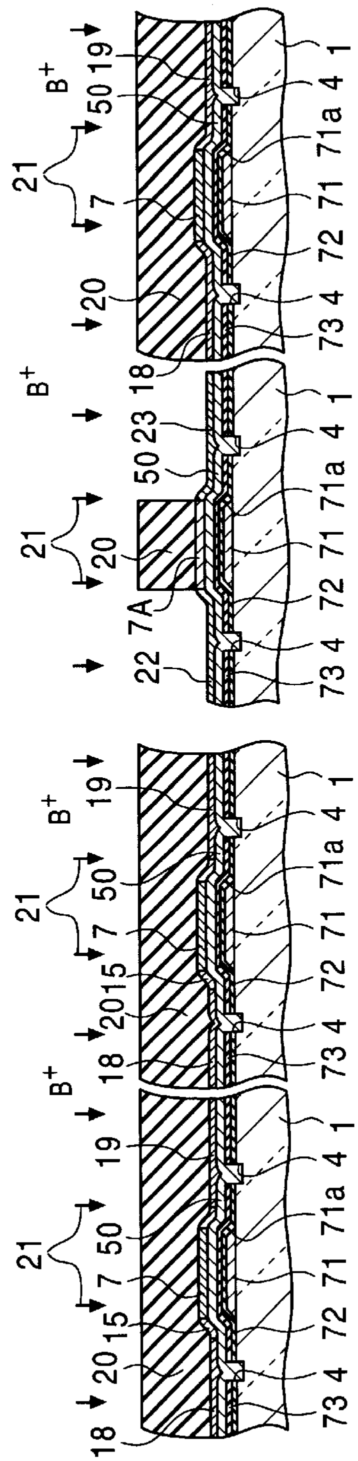

With reference to FIG. 93M, the pMOSTFTs in the peripheral driving circuit section are doped with boron ions 21 to form $P^+$-type source regions 22 and drain regions 23 by the same step as shown in FIG. 90M.

Figure 93N:
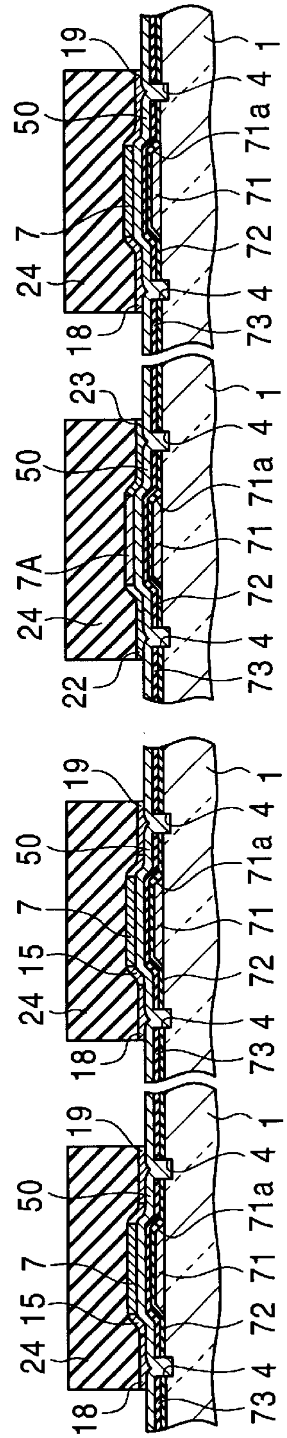
Figures 94O, 94P, 94Q:
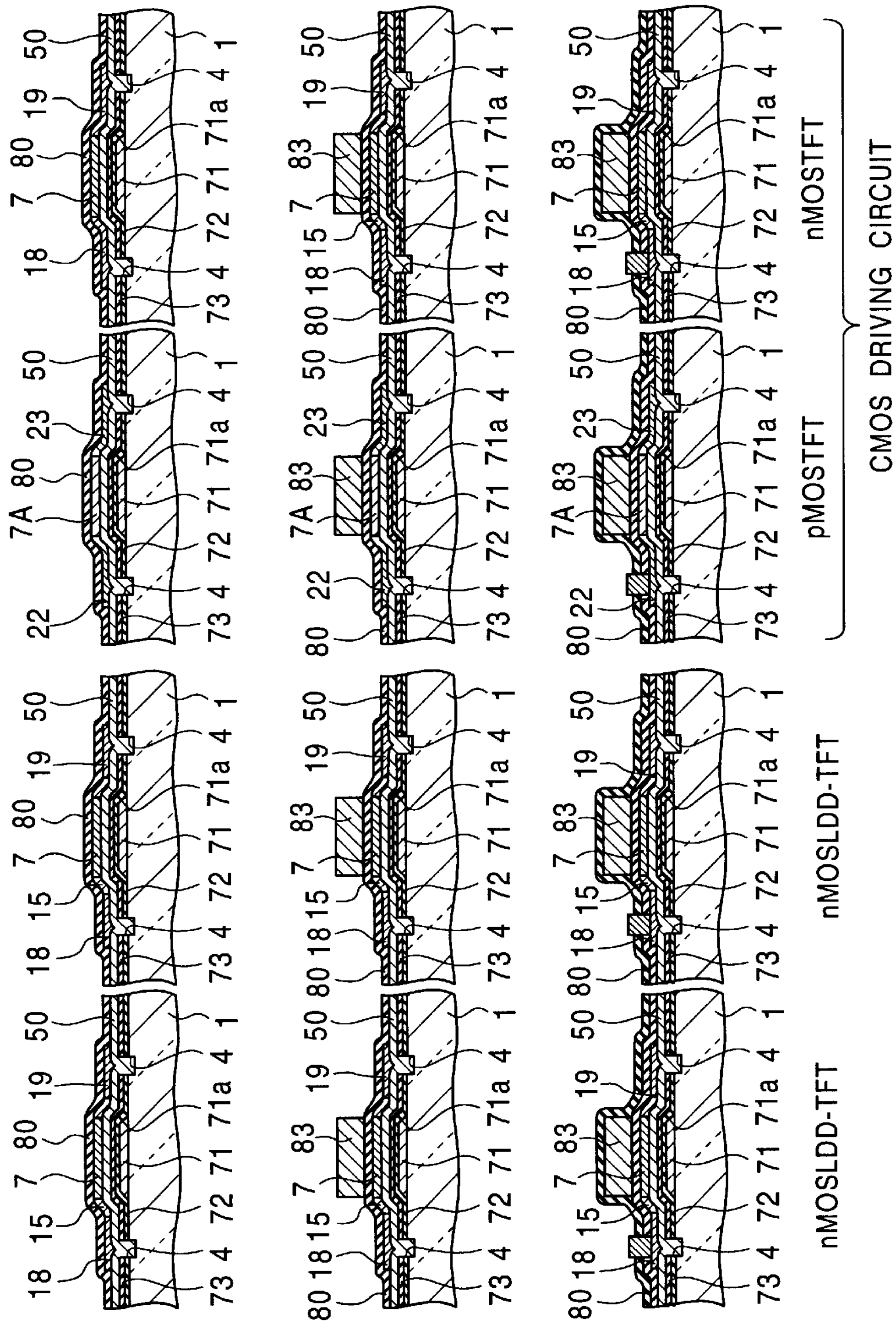

With reference to FIG. 93N, after the resist layer 20 is removed, the single-crystal layer 7 is patterned to island the active device sections and the passive device sections. With reference to FIG. 94O, the single-crystal silicon layers 7 and 7A are activated by the same method as described above, and gate insulating films 80 and 12 are formed on the surfaces in the display section and the peripheral driving circuit section, respectively.

With reference to FIG. 94P, aluminum or the like deposited by sputtering over the entire surface is patterned to form upper-gate electrodes 83 in the display section and upper-gate electrodes 11 in the peripheral driving circuit section.

With reference to FIG. 94Q, a $SiO_2$ film having a thickness of about 200 nm and a phosphosilicate glass (PSG) film having a thickness of about 300 nm are continuously formed in this order over the entire surface to form a protective film 25.

The source electrodes 26 of all of the TFTs in the peripheral driving circuit section and the display section, and the drain electrodes 27 in the peripheral driving circuit section are formed by the same method as described above. Then, dual-gate nMOSLDD-TFTs and CMOS driving circuits each comprising dual-gate pMOSTFT and nMOSTFT, each of which comprises the gate electrode made of aluminum or the like, are formed in the display section and the peripheral driving circuit section each comprising the single-crystal silicon layer 7 by the same method as described above. As a result, an active matrix substrate 30 can be formed, in which the display section and the peripheral driving circuit section are integrated.

In this embodiment, the gate electrodes 11 and 83 made of aluminum or the like are formed after activation of the single-crystal silicon layer 7, and thus the heat resistance of the gate electrode material is irrelevant to the thermal effect of activation. Therefore, inexpensive aluminum or the like having relatively low heat resistance can be used as the top gate electrode material, thereby widening the range of selection of the electrode material. In the step shown in FIG. 94P, the source electrodes 26 (further drain electrodes) can be formed at the same time, thereby causing an advantage for the manufacturing method.

Figure 95A:
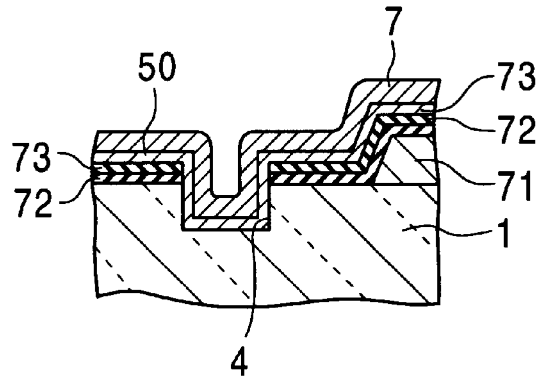
FIGS. 95A to 95C are cross-sectional views of main portions in the production steps of the LCD in accordance with the twenty-third embodiment of the present invention.
Figure 95B:
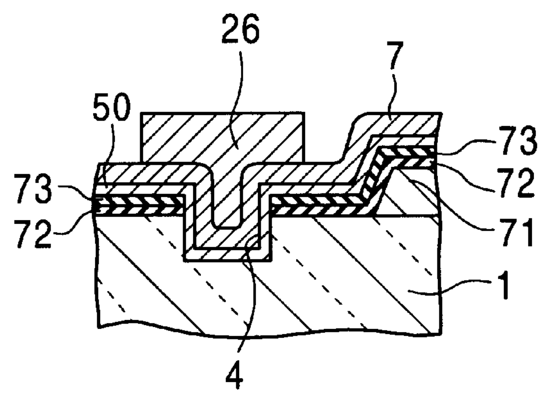
Figure 95C:
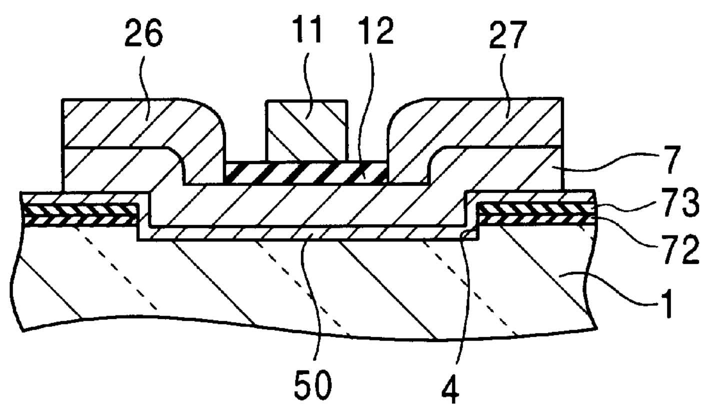

In any one of the above embodiments, in forming, for example, bottom-gate, top-gate or dual-gate MOSTFTs, the single-crystal silicon layer 7 deposited on each step difference 4 may have a discontinued (defective connection) or thin portion (increased resistance), as schematically shown in FIG. 95A. Thus, each of the source electrodes 26 (or the drain electrodes) is preferably provided in a region including the step difference 4 in order to ensure the connection to the single-crystal silicon layer 7, as shown in FIGS. 95B and 95C.

In the step shown in FIG. 89K or FIG. 92K, after the formation of the top-gate insulating film on the single-crystal silicon layer 7, ion implantation and activation treatment may be performed and then the top-gate electrodes and source and drain electrodes may be simultaneously formed of aluminum.

Figure 96A:
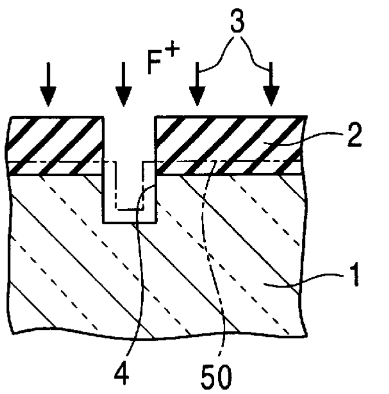
FIGS. 96A to 96E are cross-sectional views of main portions in the production steps of the LCD in accordance with the twenty-second embodiment of the present invention.
Figure 96B:
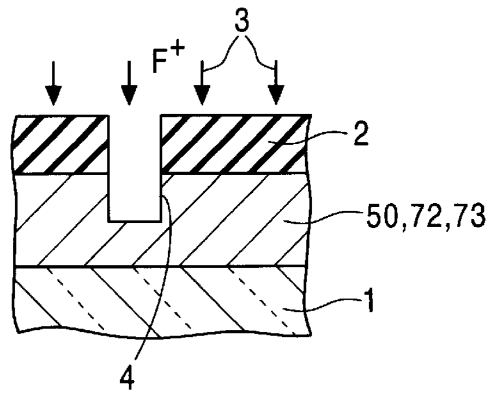
Figure 96C:
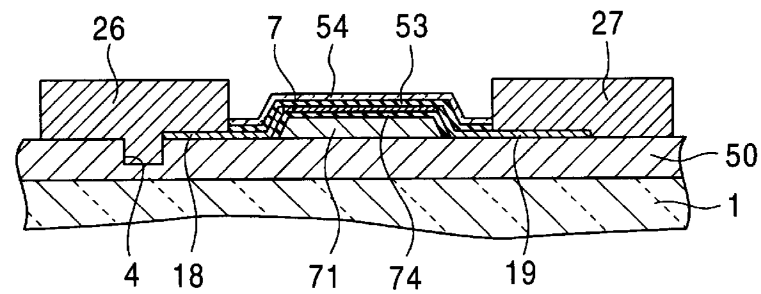
Figure 96D:
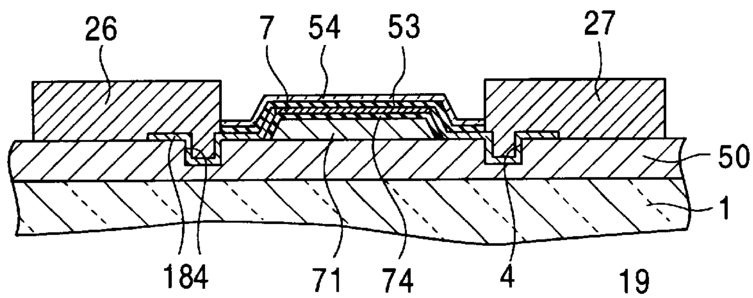
Figure 96E:
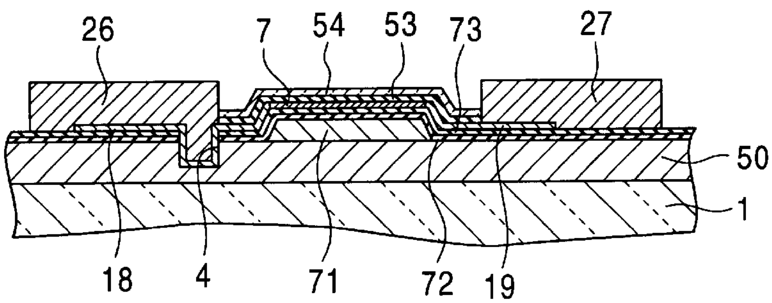

The step differences 4 are formed on the substrate 1 (and the SiN film formed thereon) in the above embodiments, as shown in FIG. 96A. For example, as shown in FIG. 96B, the step differences 4 may be formed on a crystalline sapphire thin film 50 on the substrate 1, in which the crystalline sapphire thin film 50 has the function as a stopper to diffusion of ions from the glass substrate 1. Alternatively, the gate insulating films 72 and 73 may be formed instead of the crystalline sapphire thin film 50 or below the crystalline sapphire film 50, and the step differences 4 may be formed thereon. FIGS. 96C, 96D and 96E show examples in which the step differences 4 are provided on the crystalline sapphire thin film 50.

Twenty-fourth Embodiment

FIGS. 97I to 102P show a twenty-fourth embodiment of the present invention.

Unlike in the above-mentioned embodiments, in the twenty-fourth embodiment, the gate electrode of each top-gate section is made of a material having relatively low heat resistance, such as aluminum, an aluminum alloy, for example, aluminum containing 1% Si or 1 to 2% copper, copper, or the like.

Figure 97I:
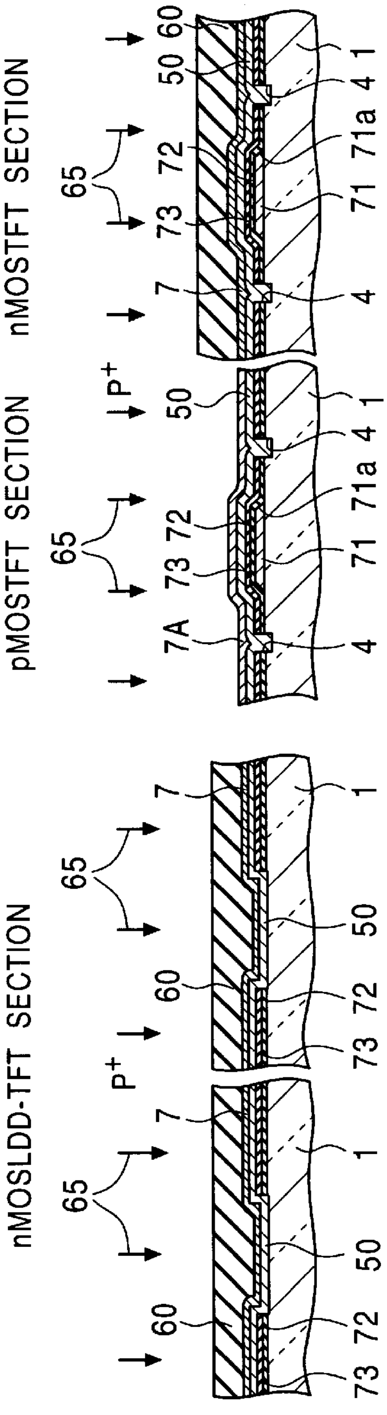
FIGS. 97I to 97J, 98K to 98M, and 99N to 99O are cross-sectional views of main portions in the production steps of the LCD in accordance with a twenty-fourth embodiment of the present invention.

When top-gate MOSTFTs are provided in the display section, and bottom-gate MOSTFTs are provided in the peripheral driving circuit section, the same steps as those shown in FIGS. 28A to 30I in the fourth embodiment are repeated to form N-type wells 7A in pMOSTFT sections of the peripheral driving circuit section, as shown in FIG. 97I.

Figure 97J:
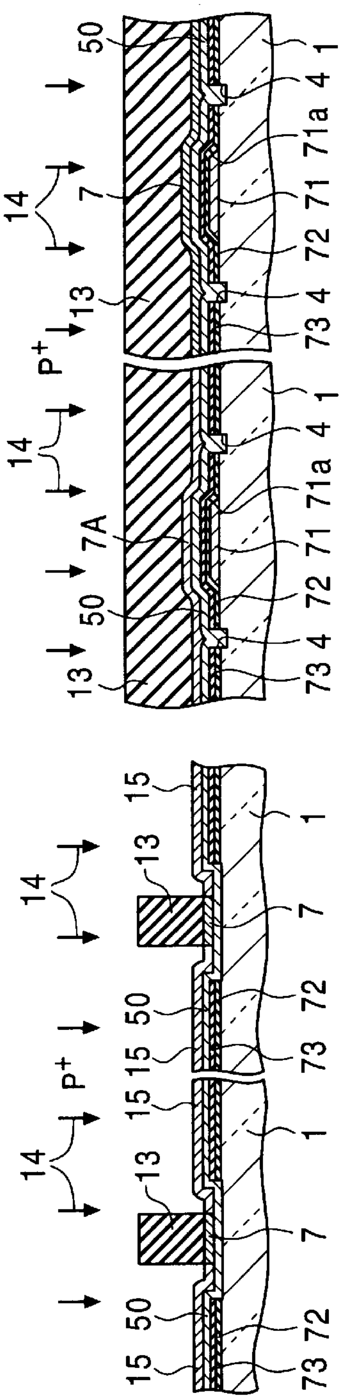

With reference to FIG. 97J, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 98K:
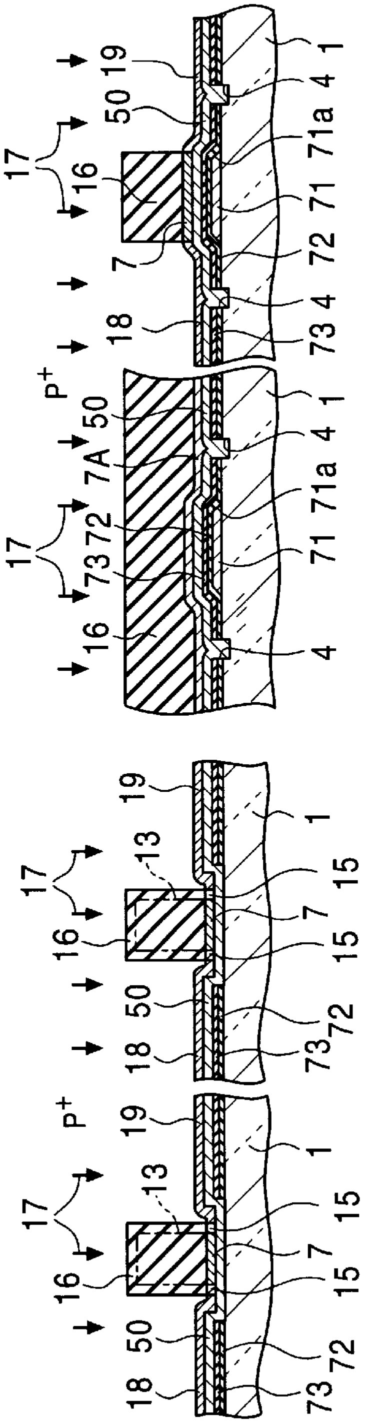

With reference to FIG. 98K, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs. In this case, preferably, the photoresist layer 13 is left as shown by phantom lines, and the photoresist layer 16 is provided to cover the photoresist layer 13. As a result, a mask used in forming the photoresist layer 16 can be aligned on the basis of the resist layer 13, thereby facilitating mask alignment and decreasing alignment error.

Figure 98L:
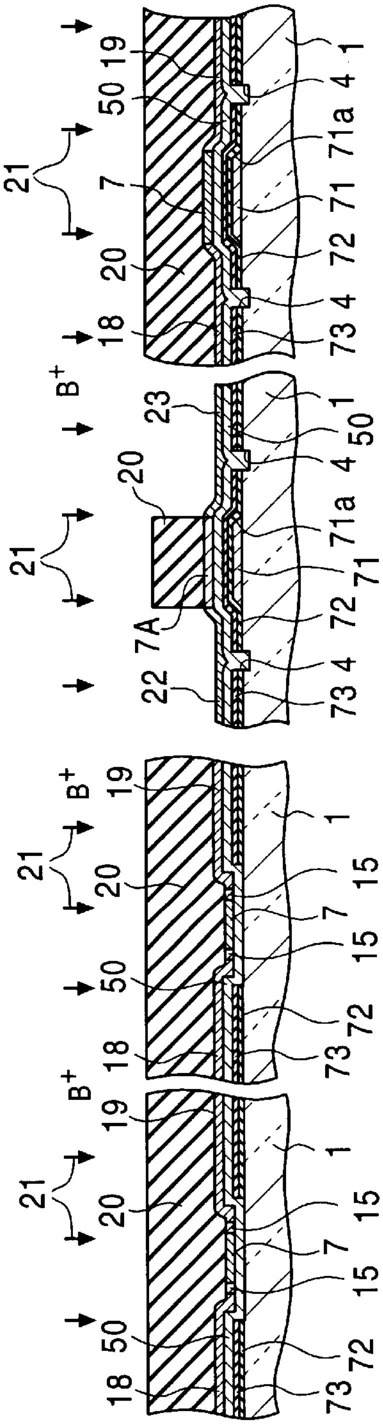

With reference to FIG. 98L, all of the nMOSTFTs in the peripheral driving region and the display region and the gate sections of the pMOSTFTs in the display region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 98M:
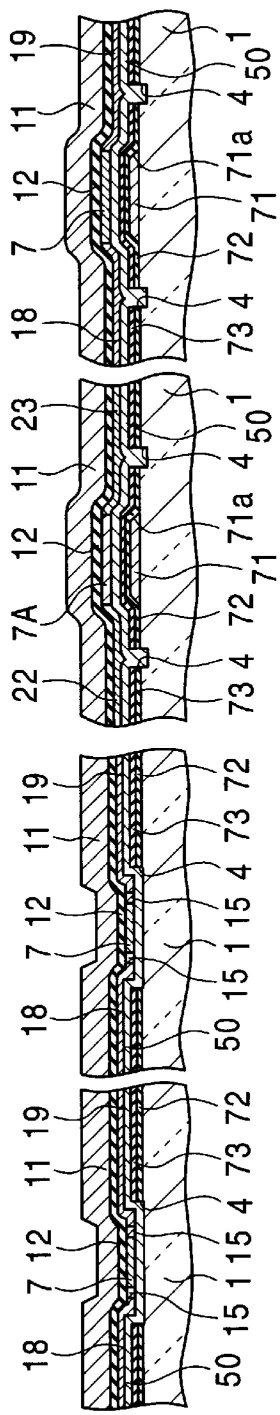

With reference to FIG. 98M, after the resist layer 20 is removed, the single-crystal silicon layers 7 and 7A are activated by the same method as described above, and a gate insulating film 12 and a gate electrode material (aluminum or aluminum containing 1% Si) 11 are further formed on the surface. The gate electrode material layer 11 can be formed by the vacuum evaporation or sputtering process.

Figure 99N:
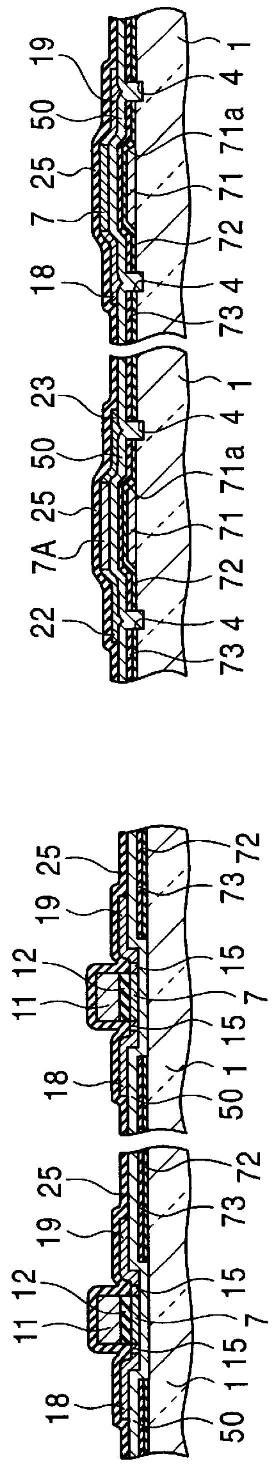

After the gate sections are patterned, the active device sections and the passive device sections are islanded by the same method as described above. With reference to FIG. 99N, a $SiO_2$ film having a thickness of approximately 200 nm and a phosphosilicate glass (PSG) film having a thickness of approximately 300 nm are continuously deposited in this order to form a protective film 25.

Figure 99O:
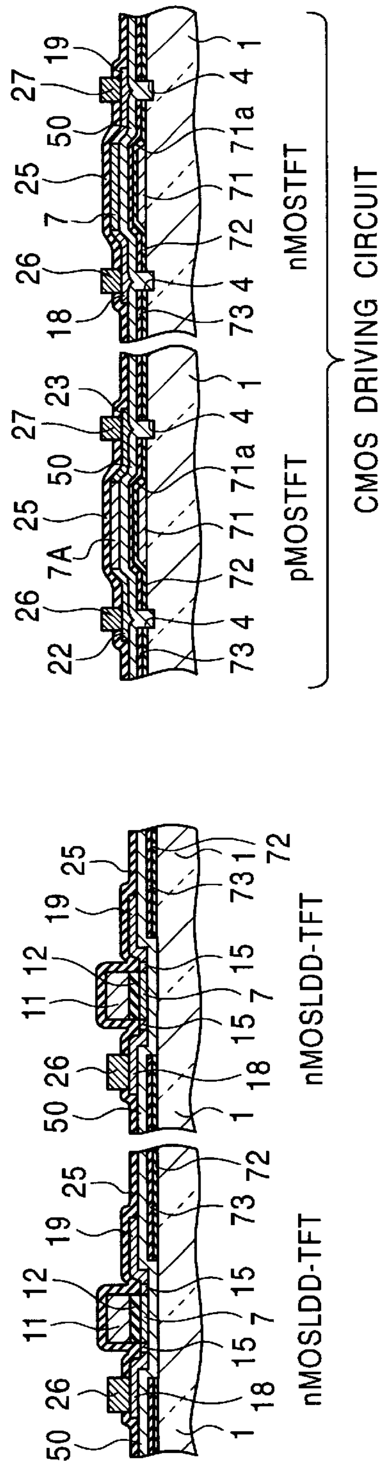

With reference to FIG. 99O, contact holes are formed in the source-drain sections of all TFTs in the peripheral driving circuit and the source sections of the TFTs in the display region by a conventional photolithographic process and etching process.

A sputtered film of aluminum, aluminum containing 1% Si, or the like, which has a thickness of 500 to 600 nm, is formed on the entire surface. By a conventional photolithographic process and etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Then, top-gate nMOSLDD-TFTs and CMOS driving circuits each comprising bottom-gate pMOSTFT and nMOSTFT, each of which comprises the gate electrode made of aluminum or aluminum containing 1% Si, are formed in the display section and the peripheral driving circuit section each comprising the single-crystal silicon layer 7 by the same steps as those shown in FIGS. 33R to 34U. As a result, an active matrix substrate 30 can be formed, in which the display section and the peripheral driving circuit section are integrated.

In this embodiment, the gate electrodes 11 made of aluminum or aluminum containing 1% Si are formed after activation of the single-crystal silicon layer 7, and thus the heat resistance of the gate electrode material is irrelevant to the thermal effect of activation. Therefore, inexpensive aluminum or aluminum containing 1% Si having relatively low heat resistance can be used as the top gate electrode material, thereby widening the range of selection of the electrode material. This is true for the display section comprising bottom-gate MOSTFTs.

Figure 100I:
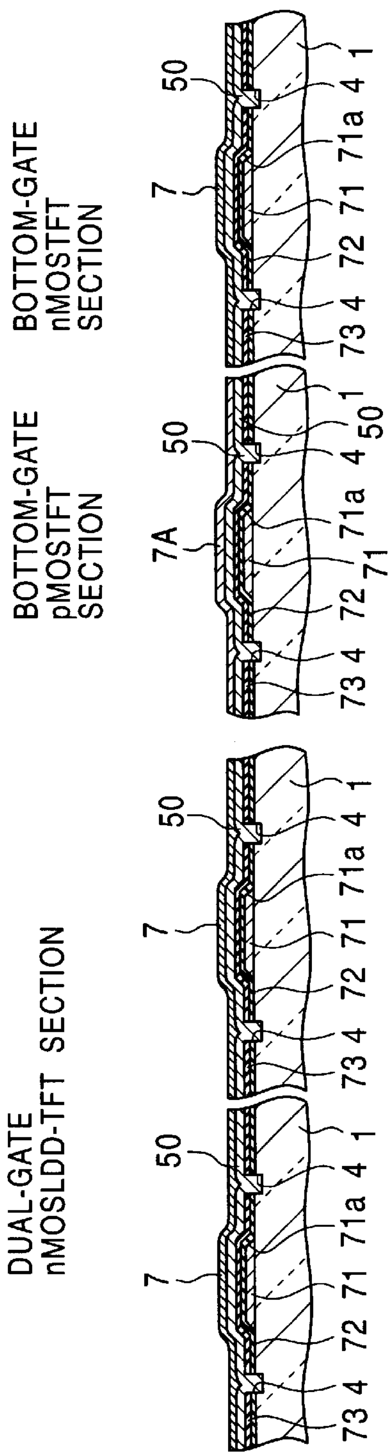
FIGS. 100I to 100J, 101K to 101M, and 102N to 102P are cross-sectional views of main portions in the production steps of the LCD in accordance with the twenty-fourth embodiment of the present invention.

When dual-gate MOSTFTs are provided in the display section, and bottom-gate MOSTFTs are provided in the peripheral driving circuit section, the same steps as those shown in FIGS. 65A to 66H of the above-described twentieth embodiment are repeated to form N-type wells 7A in the pMOSTFTs of the peripheral driving circuit section, as shown in FIG. 100I.

Figure 100J:
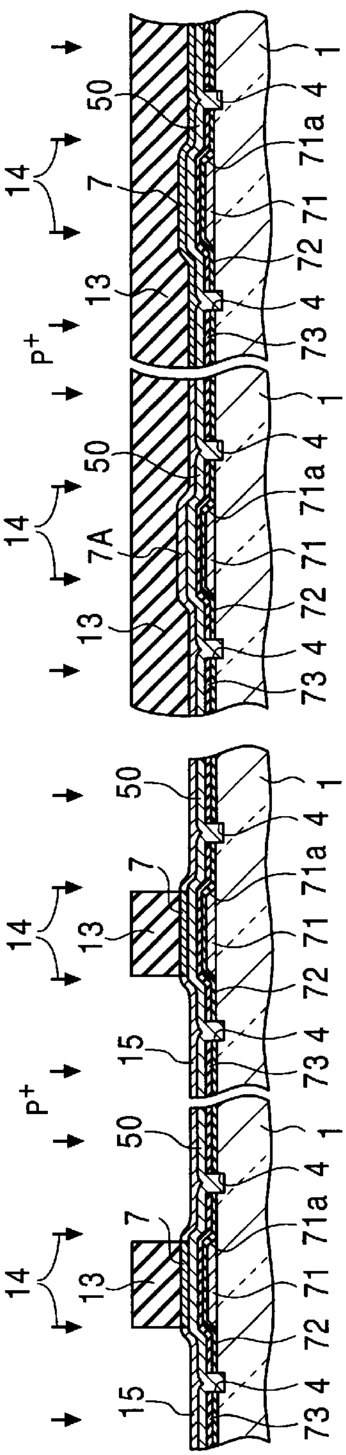

With reference to FIG. 100J, the TFTs in the display section are doped with phosphorus ions 14 to form the LDD sections 15 by the same step as shown in FIG. 97J.

Figure 101K:
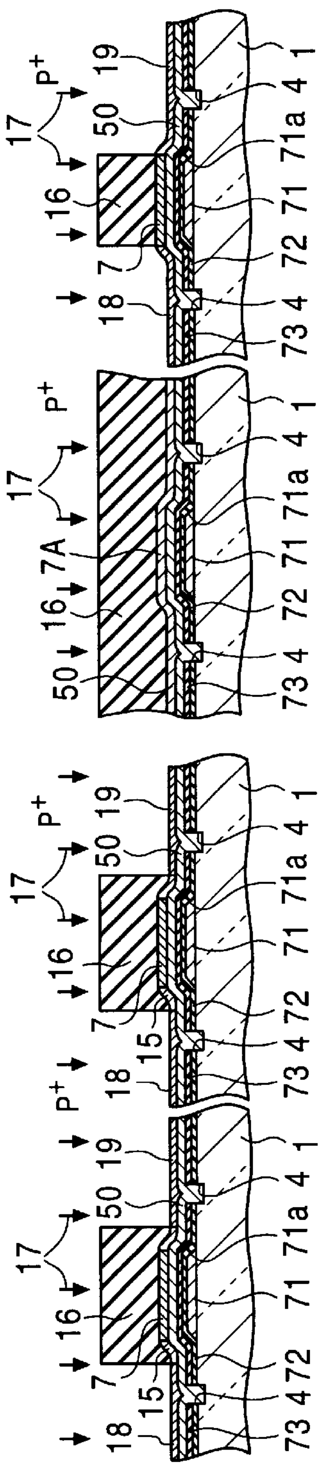

With reference to FIG. 101K, the nMOSTFTs in the display section and the peripheral driving section are doped with phosphorus ions 17 to form $N^+$-type source regions 18 and drain regions 19 by the same step as shown in FIG. 98K.

Figure 101L:
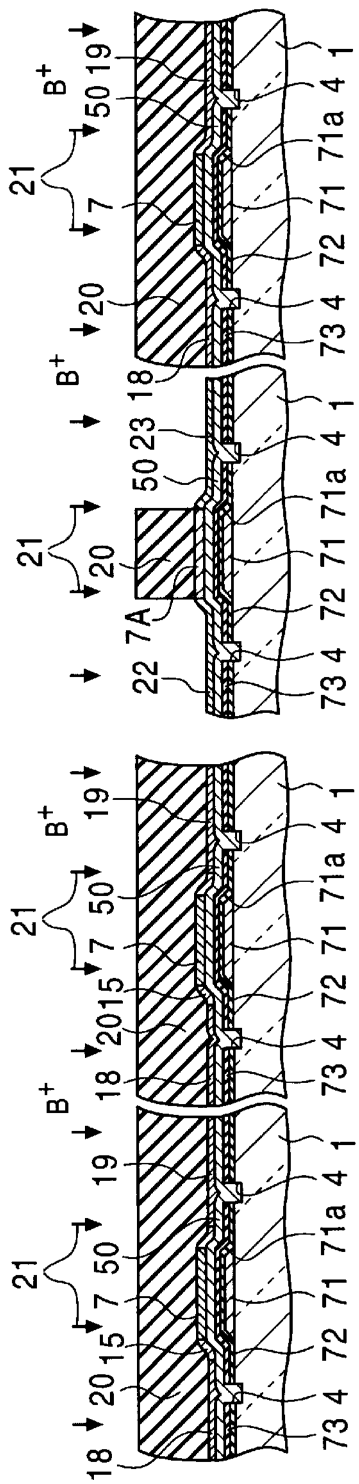

With reference to FIG. 101L, the pMOSTFTs in the peripheral driving circuit section are doped with boron ions 21 to form $P^+$-type source regions 22 and drain regions 23 by the same step as shown in FIG. 98L.

Figure 101M:
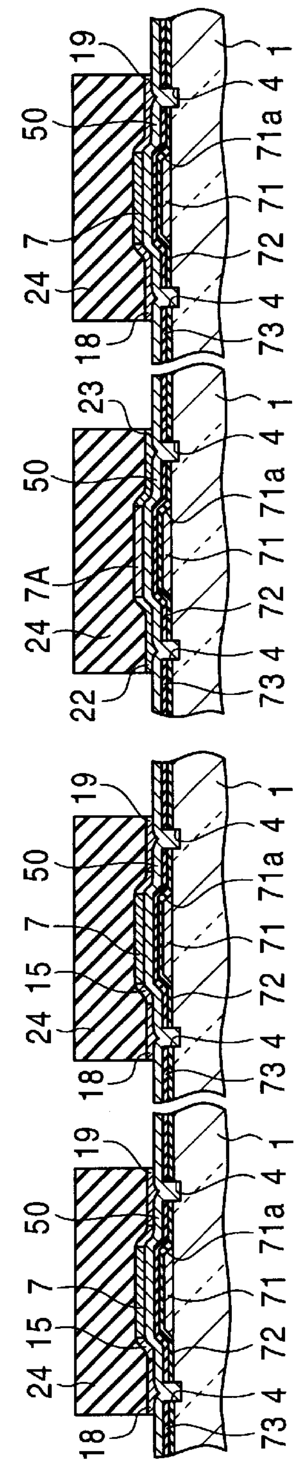
Figure 102N:
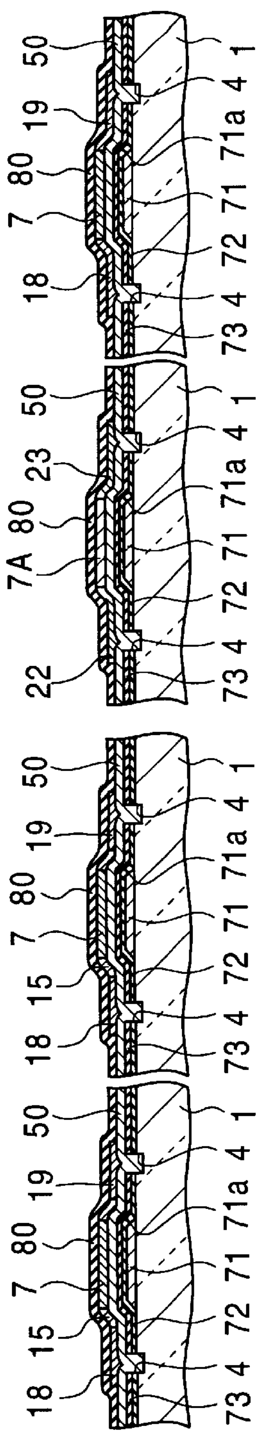

With reference to FIG. 101M, after the resist layer 20 is removed, the single-crystal layer 7 is patterned to island the active device sections and the passive device sections. With reference to FIG. 102N, the single-crystal silicon layers 7 and 7A are activated by the same method as described above, and a gate insulating film 80 is formed on the surface.

Figure 102O:
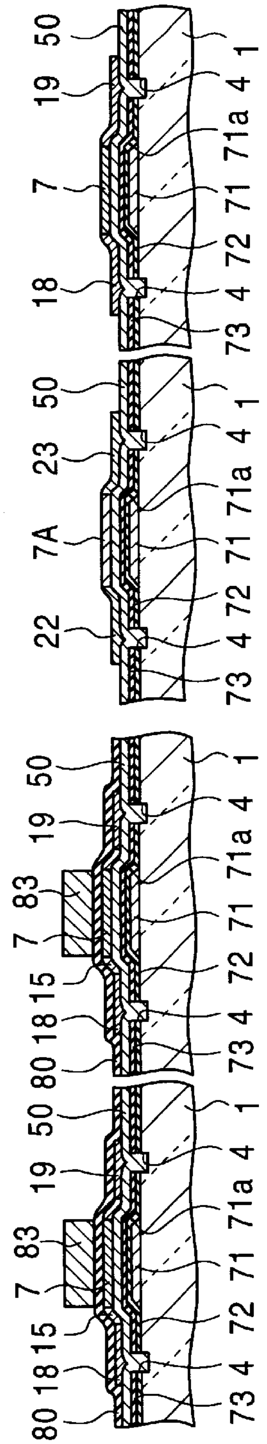

With reference to FIG. 102O, aluminum or the like deposited by sputtering over the entire surface is patterned to form upper-gate electrodes 83 in the display section.

Figure 102P:
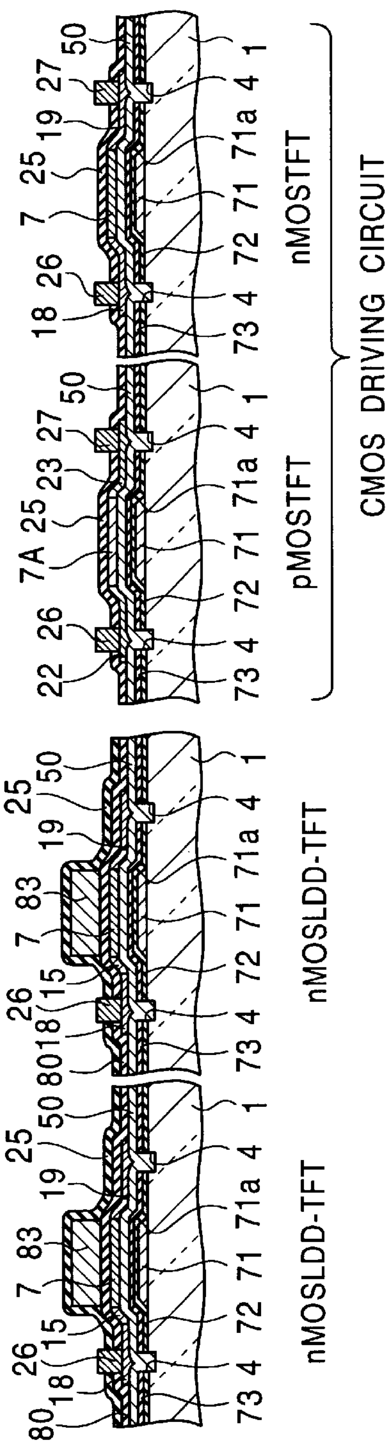

With reference to FIG. 102P, a $SiO_2$ film having a thickness of about 200 nm and a phosphosilicate glass (PSG) film having a thickness of about 300 nm are continuously formed in this order over the entire surface to form a protective film 25.

The source electrodes 26 of all of the TFTs in the peripheral driving circuit section and the display section, and the drain electrodes 27 in the peripheral driving circuit section are formed by the same method as described above. Then, dual-gate nMOSLDD-TFTs and CMOS driving circuits each comprising bottom-gate pMOSTFT and nMOSTFT, each of which comprises the gate electrode made of aluminum or the like, are formed in the display section and the peripheral driving circuit section each comprising the single-crystal silicon layer 7 by the same method as described above. As a result, an active matrix substrate 30 can be formed, in which the display section and the peripheral driving circuit section are integrated.

In this embodiment, the gate electrodes 83 made of aluminum or the like are formed after activation of the single-crystal silicon layer 7, and thus the heat resistance of the gate electrode material is irrelevant to the thermal effect of activation. Therefore, inexpensive aluminum or the like having relatively low heat resistance can be used as the top gate electrode material, thereby widening the range of selection of the electrode material. In the step shown in FIG. 102O, the source electrodes 26 (further drain electrodes) can be formed at the same time, thereby causing an advantage for the manufacturing method.

Figure 103A:
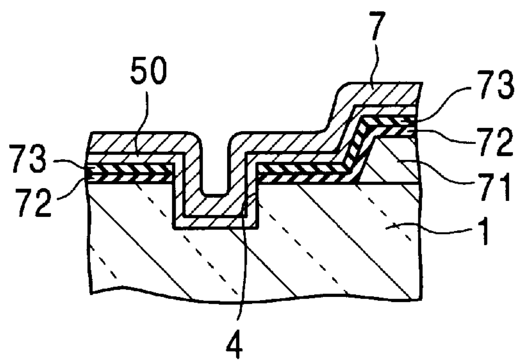
FIGS. 103A to 103C are cross-sectional views of main portions in the production steps of the LCD in accordance with the twenty-fourth embodiment of the present invention.
Figure 103B:
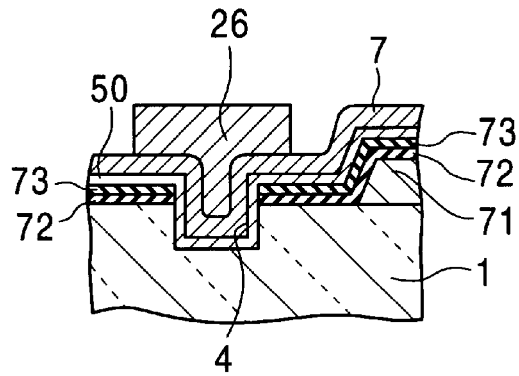
Figure 103C:
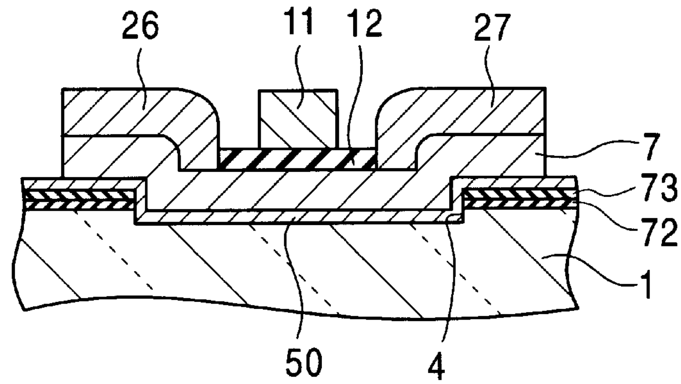

In any one of the above embodiments, in forming, for example, bottom-gate, top-gate or dual-gate MOSTFTs, the single-crystal silicon layer 7 deposited on each step difference 4 may have a discontinued (defective connection) or thin portion (increased resistance), as schematically shown in FIG. 103A. Thus, each of the source electrodes 26 (or the drain electrodes) is preferably provided in a region including the step difference 4 in order to ensure the connection to the single-crystal silicon layer 7, as shown in FIGS. 103B and 103C.

In the step shown in FIG. 97J or FIG. 100J, after the formation of the top-gate insulating film on the single-crystal silicon layer 7, ion implantation and activation treatment may be performed and then the top-gate electrodes and source and drain electrodes may be simultaneously formed of aluminum.

Figure 104A:
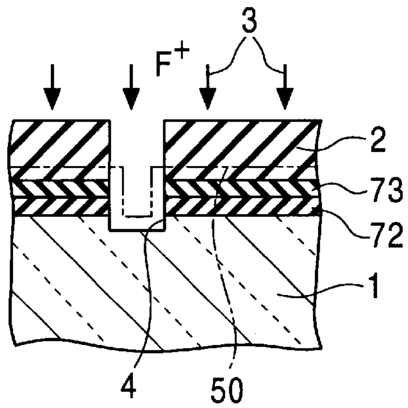
FIGS. 104A to 104E are cross-sectional views of main portions in the production steps of the LCD in accordance with the twenty-fourth embodiment of the present invention.
Figure 104B:
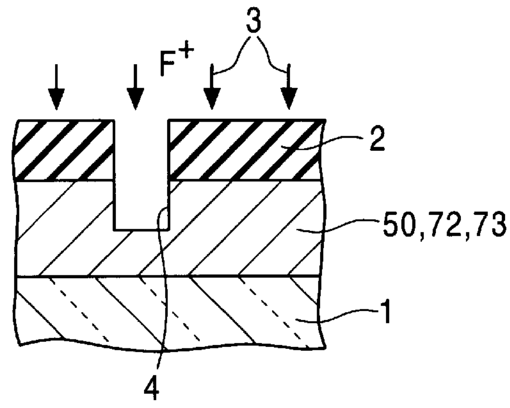
Figure 104C:
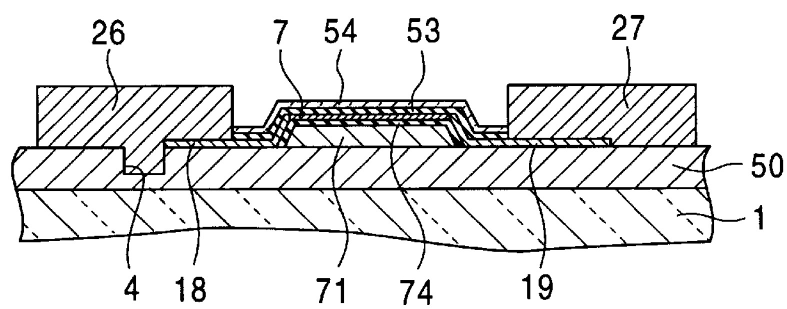
Figure 104D:
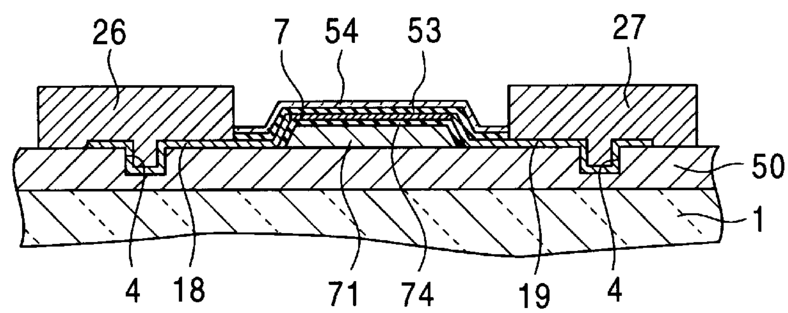
Figure 104E:
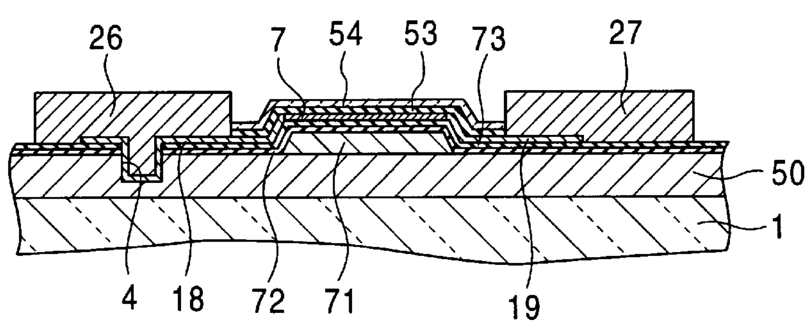

The step differences 4 are formed on the substrate 1 (and the SiN film formed thereon) in the above embodiments, as shown in FIG. 104A. For example, as shown in FIG. 104B, the step differences 4 may be formed on a crystalline sapphire thin film 50 on the substrate 1, in which the crystalline sapphire thin film 50 has the function as a stopper to diffusion of ions from the glass substrate 1. Alternatively, the gate insulating films 72 and 73 may be formed instead of the crystalline sapphire thin film 50 or below the crystalline sapphire film 50, and the step differences 4 may be formed thereon. FIGS. 104C, 104D and 104E show examples in which the step differences 4 are provided on the crystalline sapphire thin film 50.

Twenty-fifth Embodiment

FIGS. 105I to 110P show a twenty-fifth embodiment of the present invention.

Unlike in the above-mentioned embodiments, in the twenty-third embodiment, the gate electrode of each top-gate section is made of a material having relatively low heat resistance, such as aluminum, an aluminum alloy, for example, aluminum containing 1% Si or 1 to 2% copper, copper, or the like.

Figure 105I:
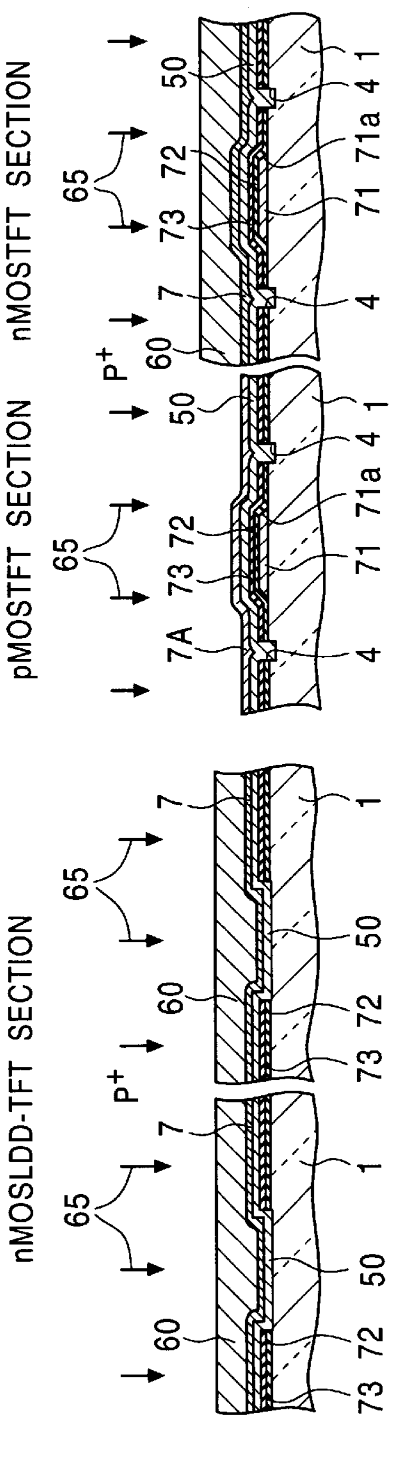
FIGS. 105I to 105J, 106K to 106M, and 107N to 107O are cross-sectional views of main portions in the production steps of the LCD in accordance with a twenty-fifth embodiment of the present invention.

When top-gate MOSTFTs are provided in the display section, and dual-gate MOSTFTs are provided in the peripheral driving circuit section, the same steps as those shown in FIGS. 35A to 37I in the fifth embodiment are repeated to form N-type wells 7A in pMOSTFT sections of the peripheral driving circuit section, as shown in FIG. 105I.

Figure 105J:
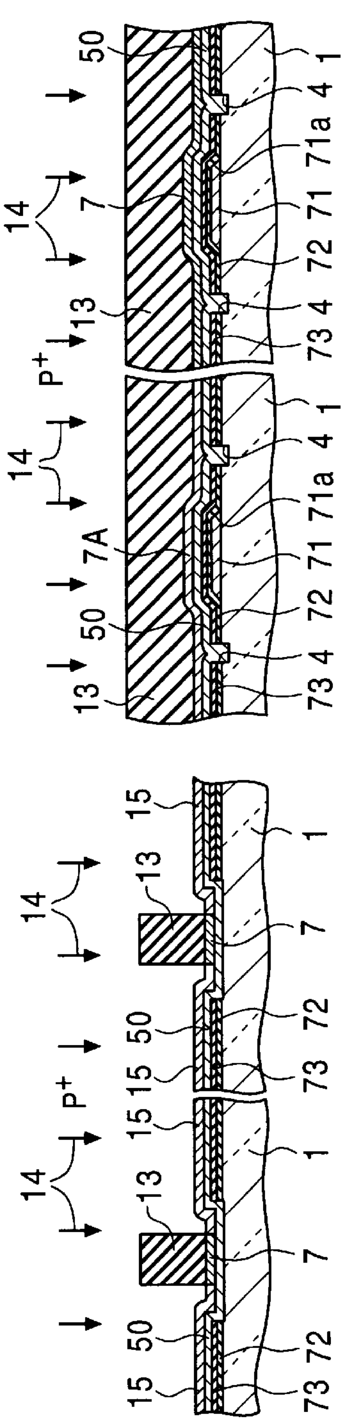

With reference to FIG. 105J, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 106K:
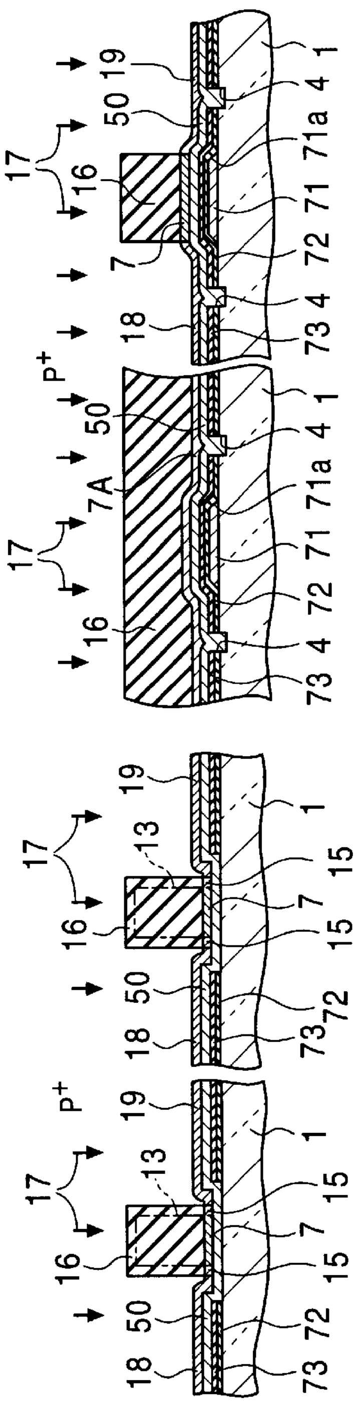

With reference to FIG. 106K, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs. In this case, preferably, the photoresist layer 13 is left as shown by phantom lines, and the photoresist layer 16 is provided to cover the photoresist layer 13. As a result, a mask used in forming the photoresist layer 16 can be aligned on the basis of the resist layer 13, thereby facilitating mask alignment and decreasing alignment error.

Figure 106L:
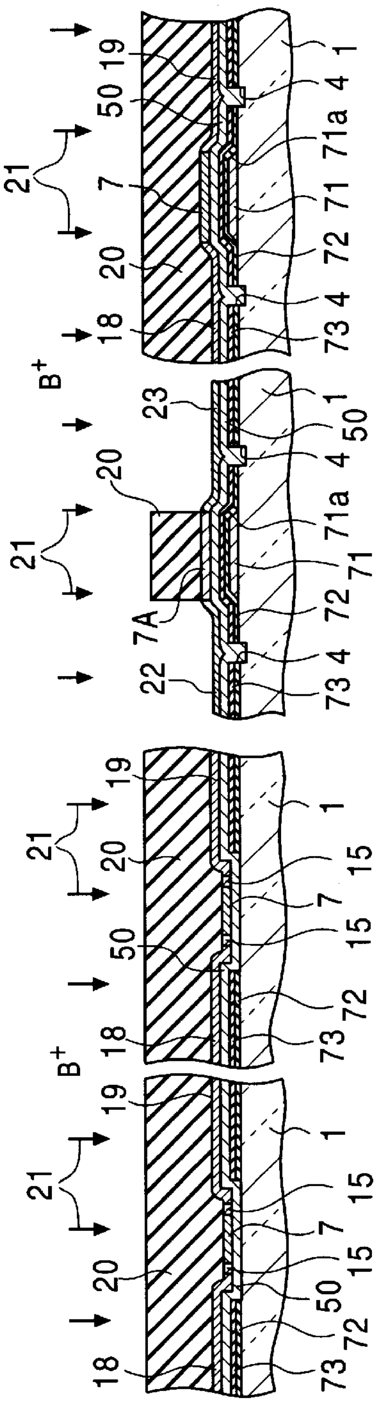

With reference to FIG. 106L, all of the nMOSTFTs in the peripheral driving region and the display region and the gate sections of the pMOSTFTs in the peripheral driving region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs.

Figure 106M:
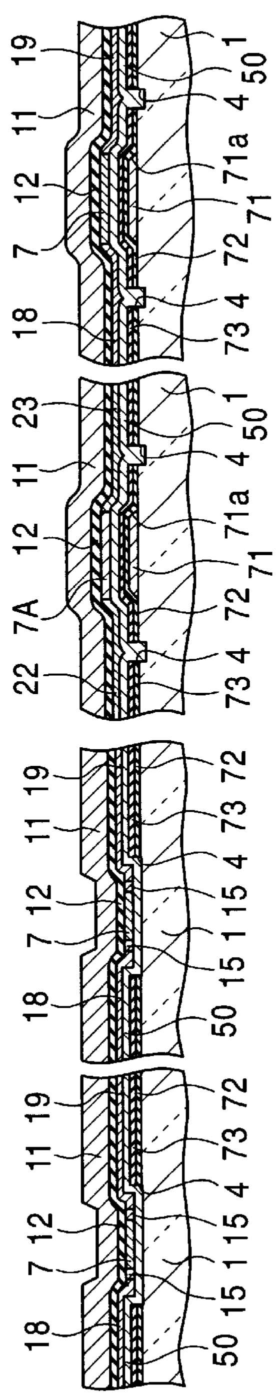

With reference to FIG. 106M, after the resist layer 20 is removed, the single-crystal silicon layers 7 and 7A are activated by the same method as described above, and a gate insulating film 12 and a gate electrode material (aluminum or aluminum containing 1% Si) 11 are further formed on the surface. The gate electrode material layer 11 can be formed by the vacuum evaporation or sputtering process.

Figure 107N:
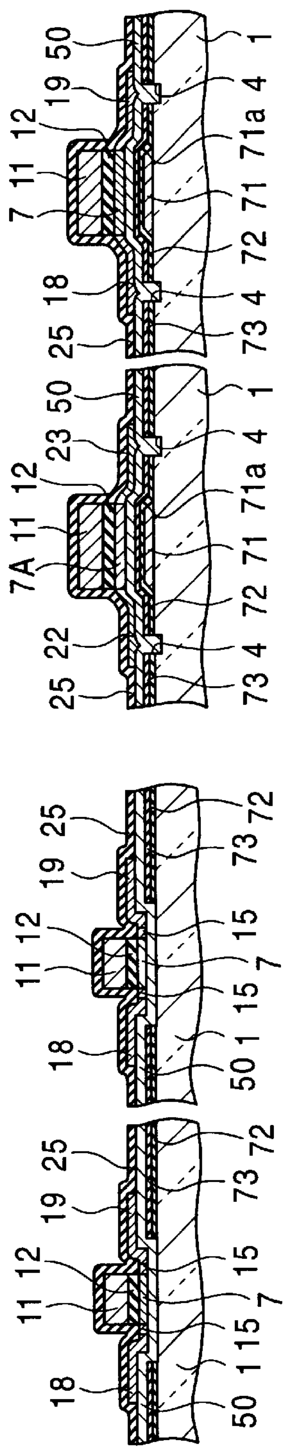

After the gate sections are patterned, the active device sections and the passive device sections are islanded by the same method as described above. With reference to FIG. 107N, a $SiO_2$ film having a thickness of approximately 200 nm and a phosphosilicate glass (PSG) film having a thickness of approximately 300 nm are continuously deposited in this order to form a protective film 25.

Figure 107O:
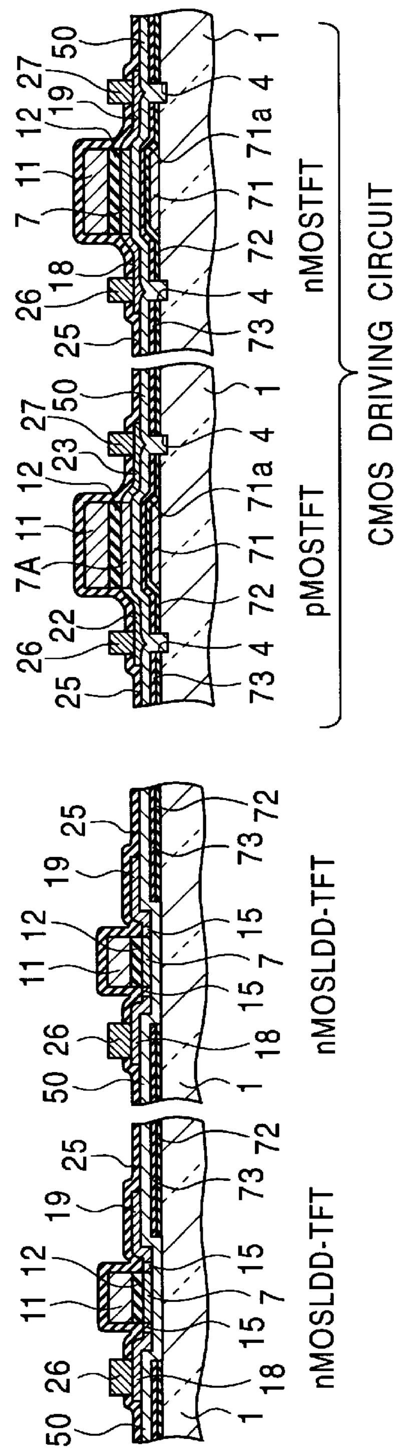

With reference to FIG. 107O, contact holes are formed in the source-drain sections of all TFTs in the peripheral driving circuit and the source sections of the TFTs in the display region by a conventional photolithographic process and etching process.

A sputtered film of aluminum, aluminum containing 1% Si, or the like, which has a thickness of 500 to 600 nm, is formed on the entire surface. By a conventional photolithographic process and etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Then, top-gate nMOSLDD-TFTs and CMOS driving circuits each comprising dual-gate pMOSTFT and nMOSTFT, each of which comprises the gate electrode made of aluminum or aluminum containing 1% Si, are formed in the display section and the peripheral driving circuit section each comprising the single-crystal silicon layer 7 by the same steps as those shown in FIGS. 40R to 41U. As a result, an active matrix substrate 30 can be formed, in which the display section and the peripheral driving circuit section are integrated.

In this embodiment, the gate electrodes 11 made of aluminum or aluminum containing 1% Si are formed after activation of the single-crystal silicon layer 7, and thus the heat resistance of the gate electrode material is irrelevant to the thermal effect of activation. Therefore, inexpensive aluminum or aluminum containing 1% Si having relatively low heat resistance can be used as the top gate electrode material, thereby widening the range of selection of the electrode material. This is true for the display section comprising bottom-gate MOSTFTs.

Figure 108I:
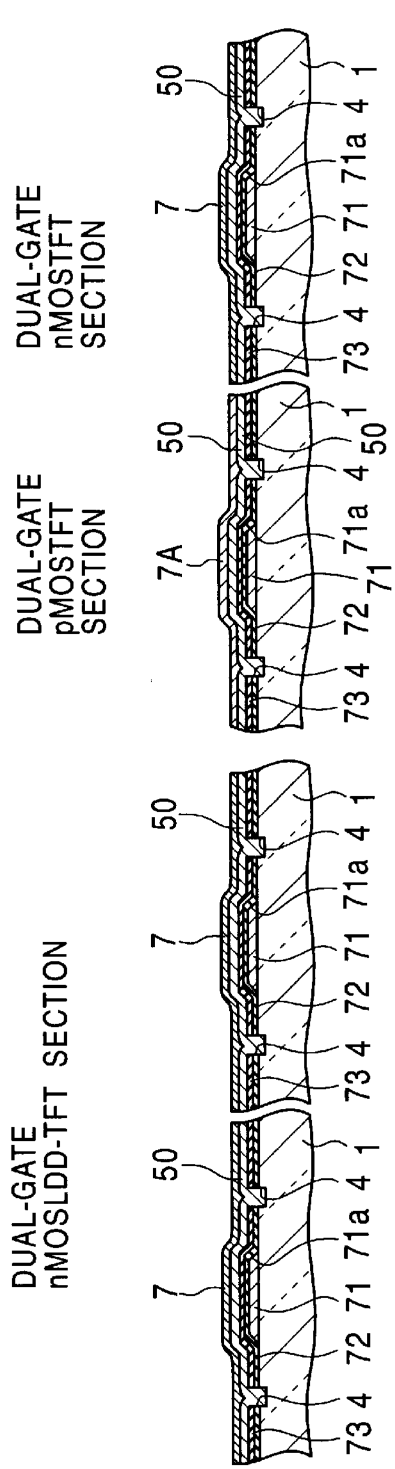

When dual-gate MOSTFTs are provided in the display section, and dual-gate MOSTFTs are provided in the peripheral driving circuit section, the same steps as those shown in FIGS. 65A to 66H of the above-described twentieth embodiment are repeated to form N-type wells 7A in the pMOSTFTs of the peripheral driving circuit section, as shown in FIG. 108I.

Figure 108J:
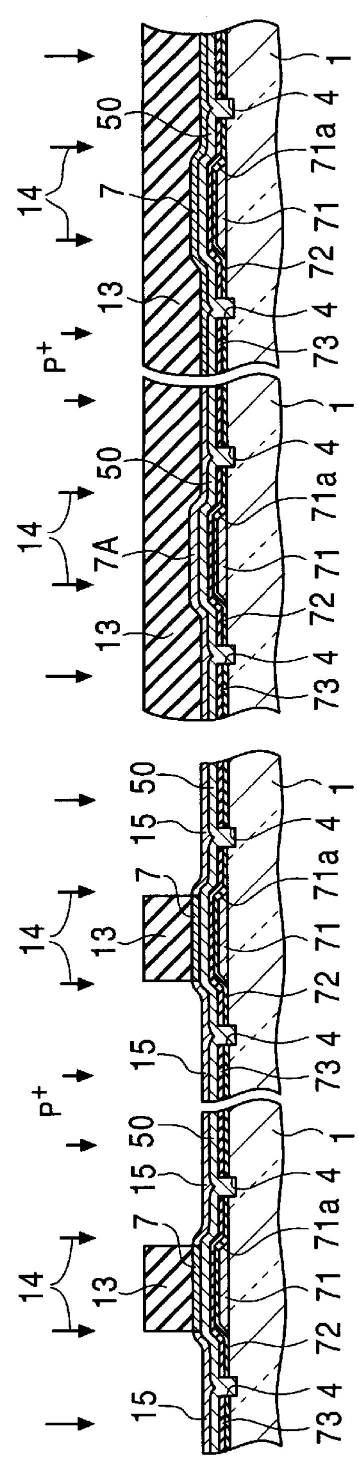

With reference to FIG. 108J, the TFTs in the display section are doped with phosphorus ions 14 to form the LDD sections 15 by the same step as shown in FIG. 105I.

Figure 109K:
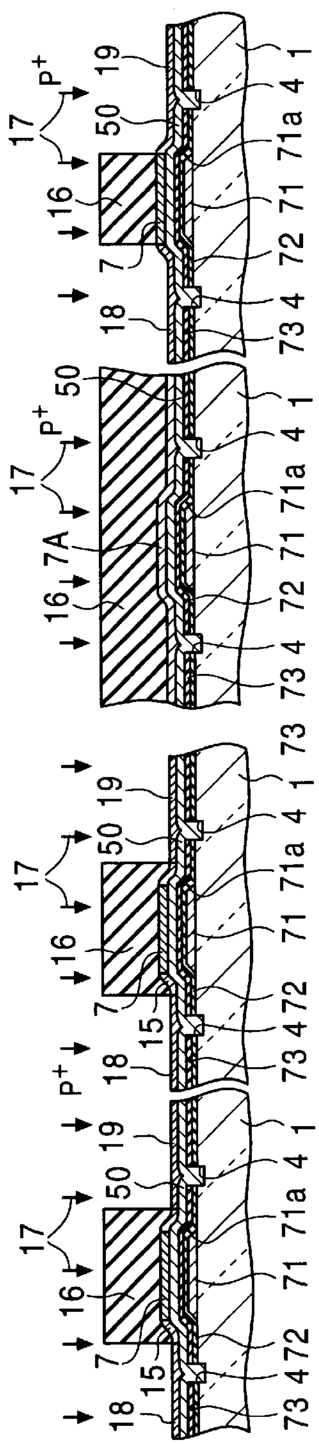

With reference to FIG. 109K, the nMOSTFTs in the display section and the peripheral driving section are doped with phosphorus ions 17 to form $N^+$-type source regions 18 and drain regions 19 by the same step as shown in FIG. 106K.

Figure 109L:
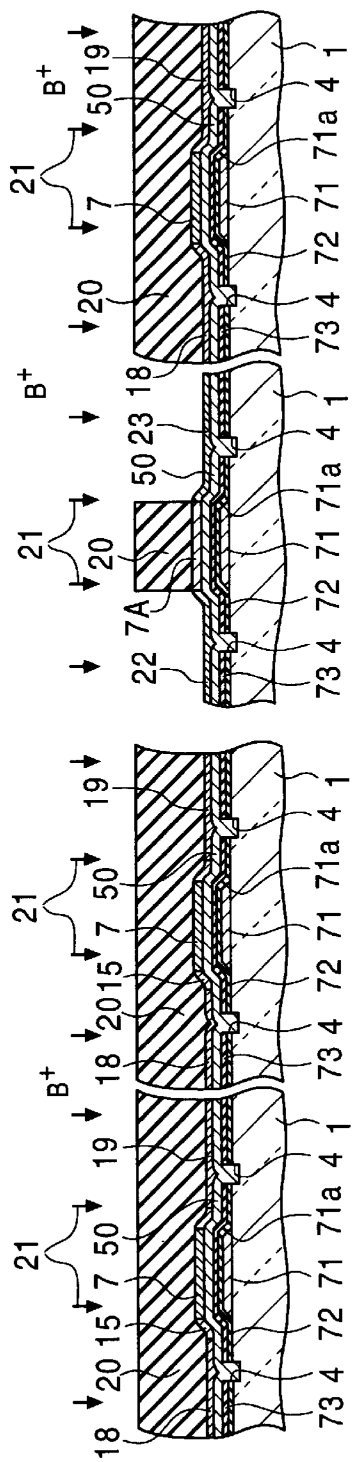

With reference to FIG. 109L, the pMOSTFTs in the peripheral driving circuit section are doped with boron ions 21 to form $P^+$-type source regions 22 and drain regions 23 by the same step as shown in FIG. 106L.

Figure 109M:
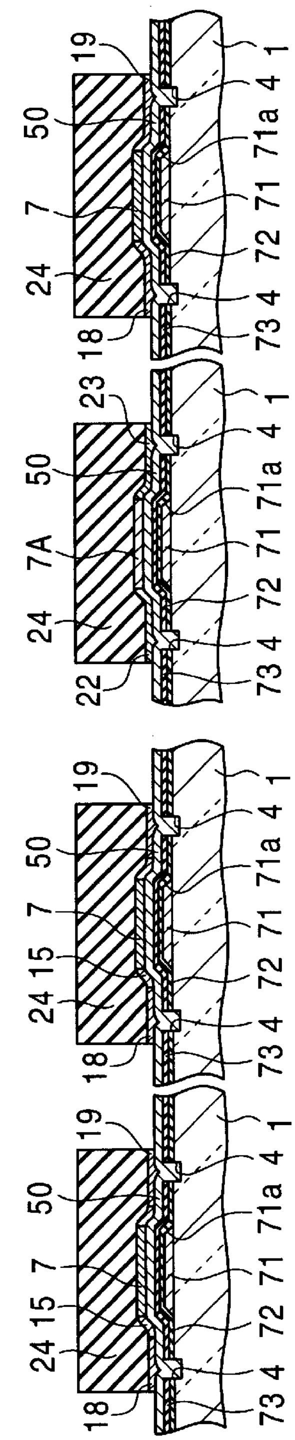
Figure 110N:
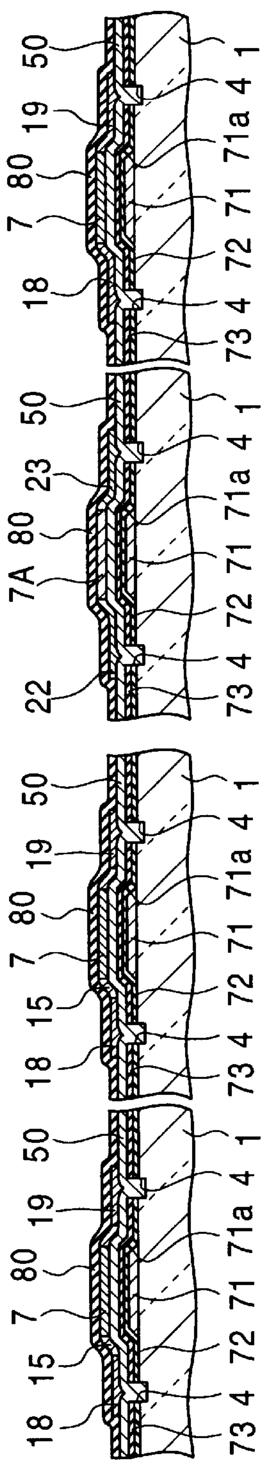

With reference to FIG. 109M, after the resist layer 20 is removed, the single-crystal layer 7 is patterned to island the active device sections and the passive device sections. With reference to FIG. 110N, the single-crystal silicon layers 7 and 7A are activated by the same method as described above, and gate insulating films 80 and 12 are formed on the surfaces in the display section and the peripheral driving circuit section, respectively.

Figure 110O:
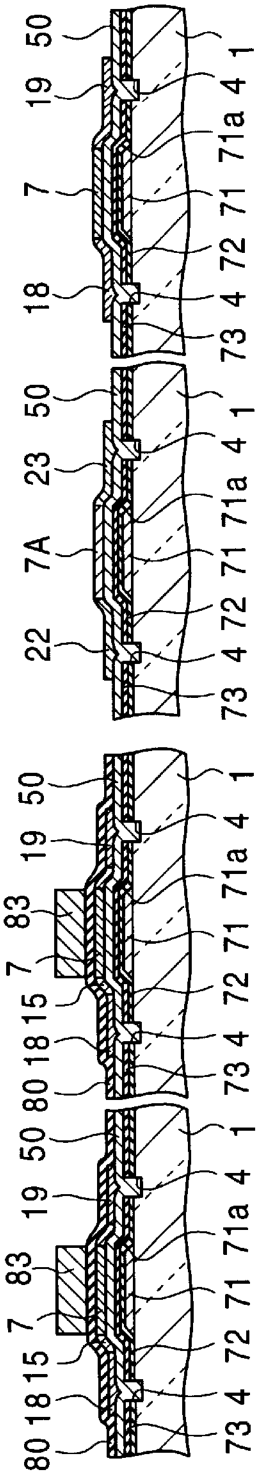

With reference to FIG. 110O, aluminum or the like deposited by sputtering over the entire surface is patterned to form upper-gate electrodes 83 in the display section and upper-gate electrodes 11 in the peripheral driving circuit section.

Figure 110P:
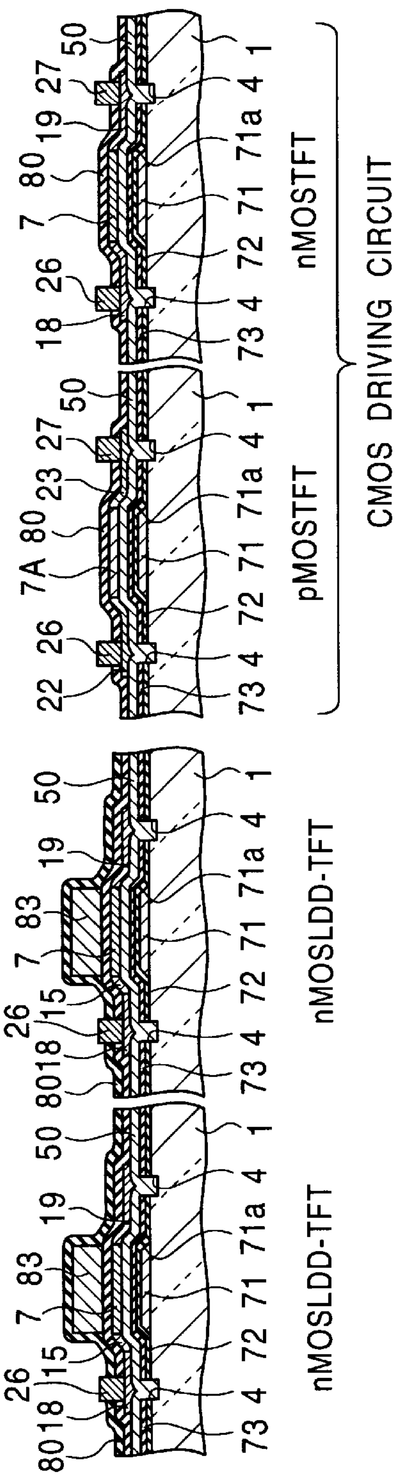

With reference to FIG. 110P, a $SiO_2$ film having a thickness of about 200 nm and a phosphosilicate glass (PSG) film having a thickness of about 300 nm are continuously formed in this order over the entire surface to form a protective film 25.

The source electrodes 26 of all of the TFTs in the peripheral driving circuit section and the display section, and the drain electrodes 27 in the peripheral driving circuit section are formed by the same method as described above. Then, dual-gate nMOSLDD-TFTs and CMOS driving circuits each comprising dual-gate pMOSTFT and nMOSTFT, each of which comprises the gate electrode made of aluminum or the like, are formed in the display section and the peripheral driving circuit section each comprising the single-crystal silicon layer 7 by the same method as described above. As a result, an active matrix substrate 30 can be formed, in which the display section and the peripheral driving circuit section are integrated.

In this embodiment, the gate electrodes 11 and 83 made of aluminum or the like are formed after activation of the single-crystal silicon layer 7, and thus the heat resistance of the gate electrode material is irrelevant to the thermal effect of activation. Therefore, inexpensive aluminum or the like having relatively low heat resistance can be used as the top gate electrode material, thereby widening the range of selection of the electrode material. In the step shown in FIG. 110O, the source electrodes 26 (further drain electrodes) can be formed at the same time, thereby causing an advantage for the manufacturing method.

Figure 111A:
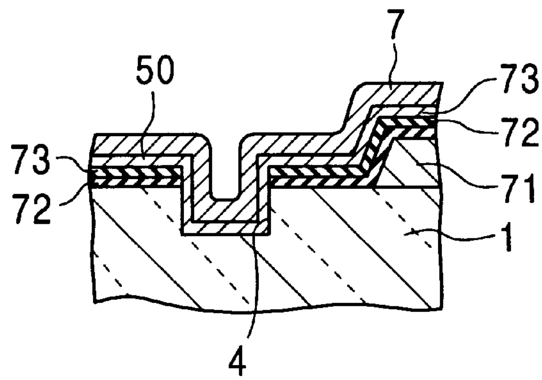
FIGS. 111A to 111C are cross-sectional views of main portions in the production steps of the LCD in accordance with the twenty-fifth embodiment of the present invention.
Figure 111B:
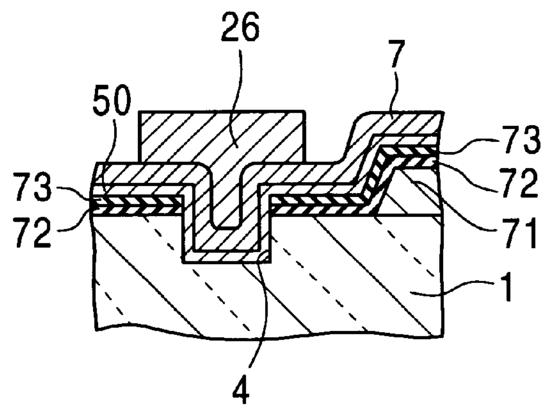
Figure 111C:
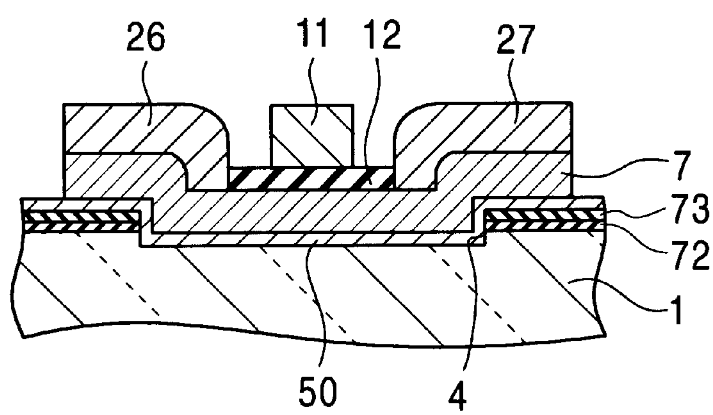

In any one of the above embodiments, in forming, for example, bottom-gate, top-gate or dual-gate MOSTFTs, the single-crystal silicon layer 7 deposited on each step difference 4 may have a discontinued (defective connection) or thin portion (increased resistance), as schematically shown in FIG. 11A. Thus, each of the source electrodes 26 (or the drain electrodes) is preferably provided in a region including the step difference 4 in order to ensure the connection to the single-crystal silicon layer 7, as shown in FIGS. 111B and 111C.

In the step shown in FIG. 105J or FIG. 108J, after the formation of the top-gate insulating film on the single-crystal silicon layer 7, ion implantation and activation treatment may be performed and then the top-gate electrodes and source and drain electrodes may be simultaneously formed of aluminum.

Figure 112A:
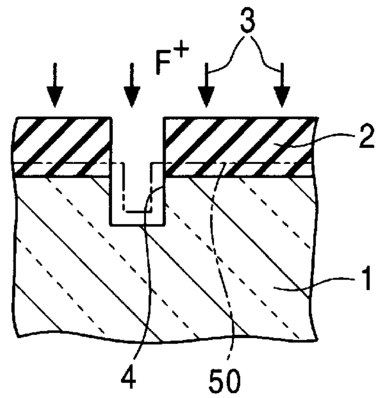
FIGS. 112A to 112E are cross-sectional views of main portions in the production steps of the LCD in accordance with the twenty-fifth embodiment of the present invention.
Figure 112B:
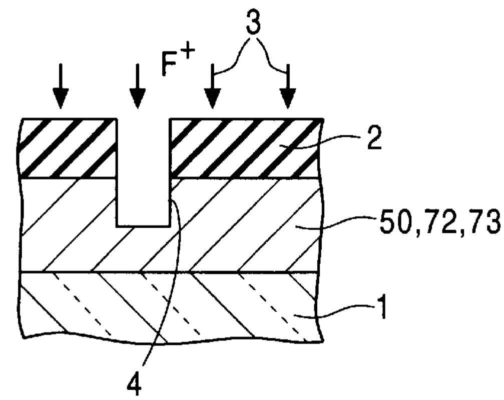
Figure 112C:
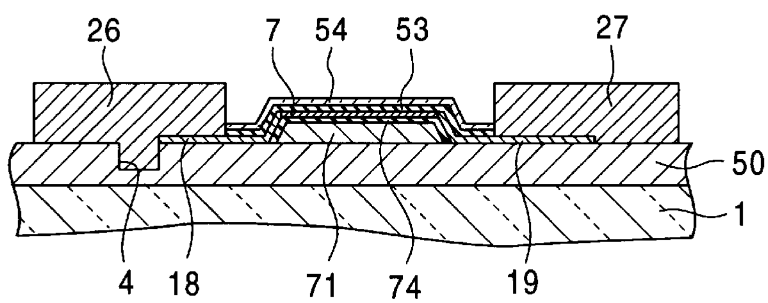
Figure 112D:
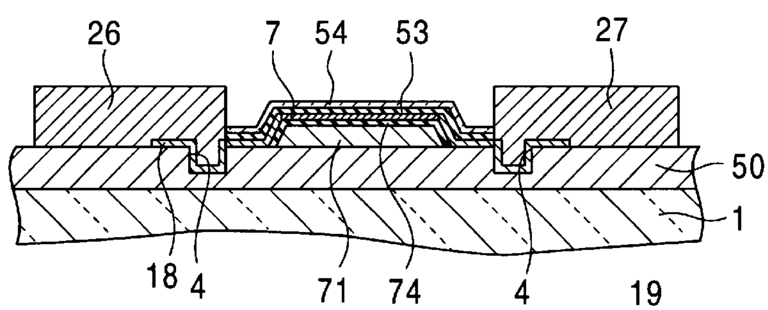
Figure 112E:
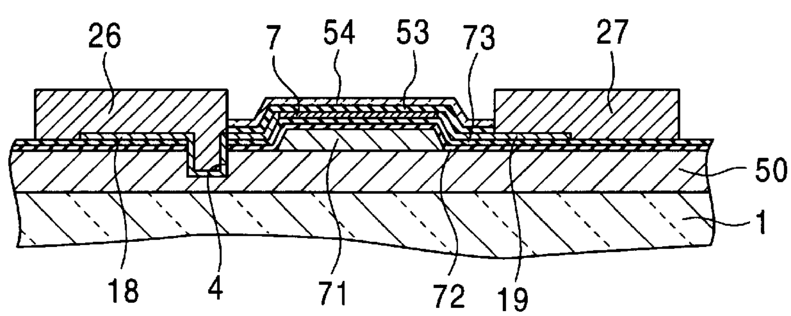

The step differences 4 are formed on the substrate 1 (and the SiN film formed thereon) in the above embodiments, as shown in FIG. 112A. For example, as shown in FIG. 112B, the step differences 4 may be formed on a crystalline sapphire thin film 50 on the substrate 1, in which the crystalline sapphire thin film 50 has the function as a stopper to diffusion of ions from the glass substrate 1. Alternatively, the gate insulating films 72 and 73 may be formed instead of the crystalline sapphire thin film 50 or below the crystalline sapphire film 50, and the step differences 4 may be formed thereon. FIGS. 112C, 112D and 112E show examples in which the step differences 4 are provided on the crystalline sapphire thin film 50.

Twenty-sixth Embodiment

FIGS. 113A to 115B show a twenty-sixth embodiment of the present invention.

In this embodiment, TFTs are formed at the exterior of the step differences 4, that is, on the regions of the substrate 1 other than the step differences 4. In these drawings, the single-crystal silicon layer 7, the gate electrodes 11, the source electrodes 26, and the drain electrodes 27 are simplified.

Figure 113A:
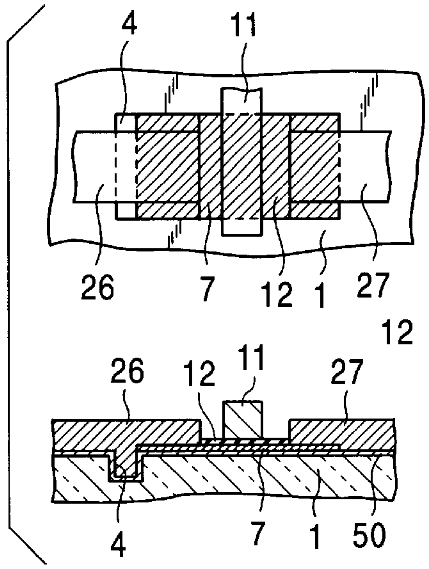
FIGS. 113A to 113E are plan views and cross-sectional views of various TFTs in a LCD in accordance with a twenty-sixth embodiment of the present invention.
Figure 113B:
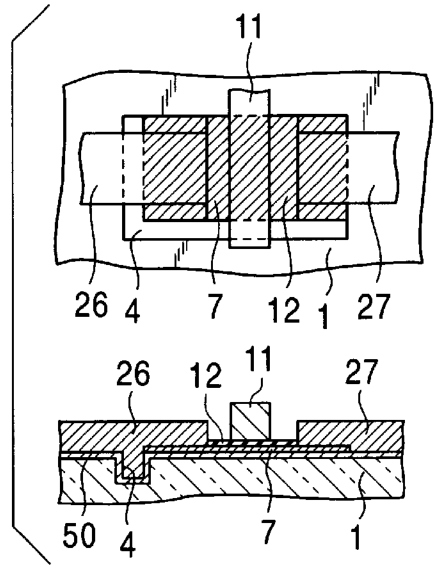
Figure 113C:
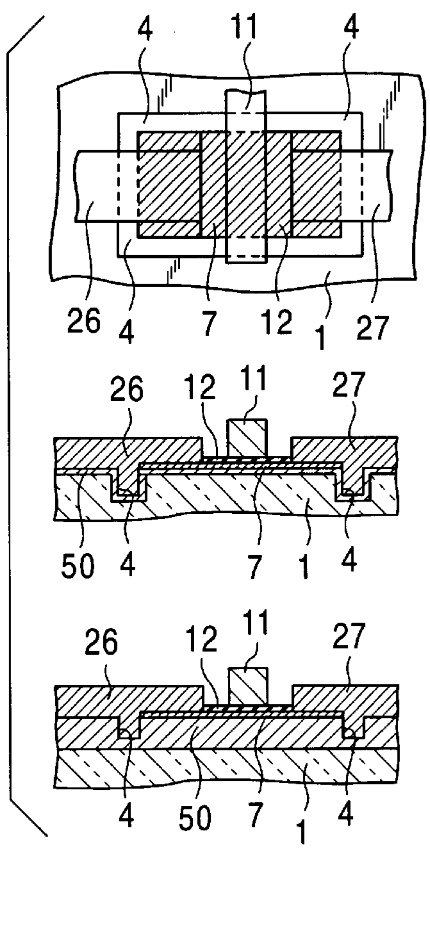
Figure 113D:
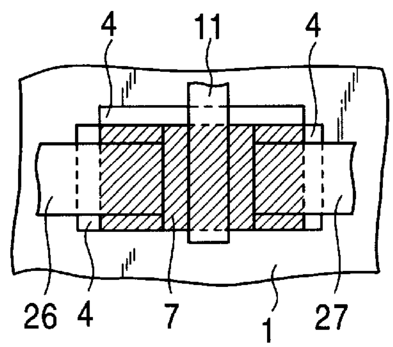
Figure 113E:
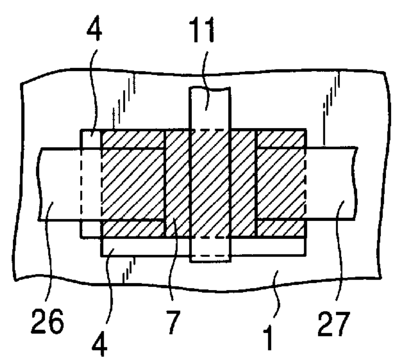

FIGS. 113A to 113E show top-gate MOSTFTs. In FIG. 113A, the source electrode 26 is formed on the step difference 4 (indent) formed in the source region, whereas the gate insulating film 12 and the gate electrode 11 are formed on the flat portion of the single-crystal silicon layer 7 on the substrate. In FIG. 113B, the step difference 4 has an L shape and extends from the source region to the edge of the drain region in the longitudinal direction of the channel. In FIG. 113C, the step difference 4 is rectangular and extends so that the TFT active region is entirely surrounded by the step difference. In FIG. 113D, three sides of the step difference 4 surround the TFT active region, and in FIG. 113E, two sides of the step difference 4 surround the TFT active region. In any case, two adjacent step differences 4 are not continuous.

Accordingly, the TFT can be readily provided on the flat surface other than the step difference 4 having any shape.

Figure 114A:
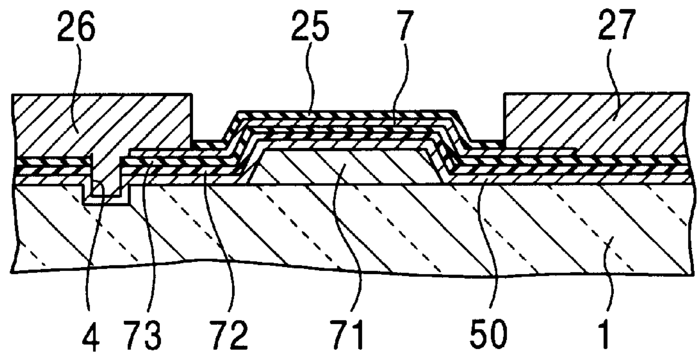
FIGS. 114A to 114D are cross-sectional views of various TFTs in the LCD in accordance with the twenty-sixth embodiment of the present invention.
Figure 114B:
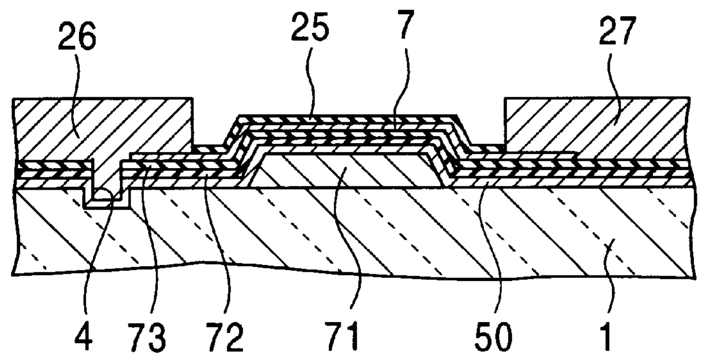
Figure 114C:
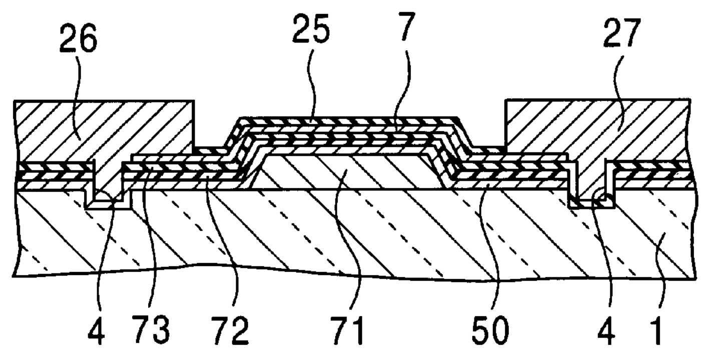
Figure 114D:
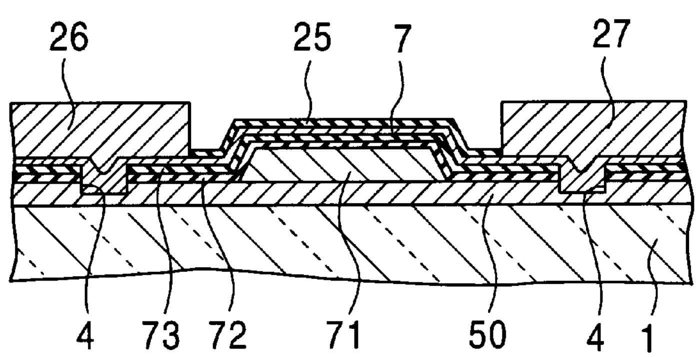

FIGS. 114A to 114D show bottom-gate MOSTFTs. Any step difference 4 shown in FIGS. 113A to 113E may also be formed in this type. In FIG. 114A corresponding to FIG. 113A, the bottom-gate MOSTFT is formed on the flat portion other than the step difference 4. FIG. 114B corresponds to FIG. 113B, and FIG. 114C corresponds to FIG. 113C or 113D.

Figure 115A:
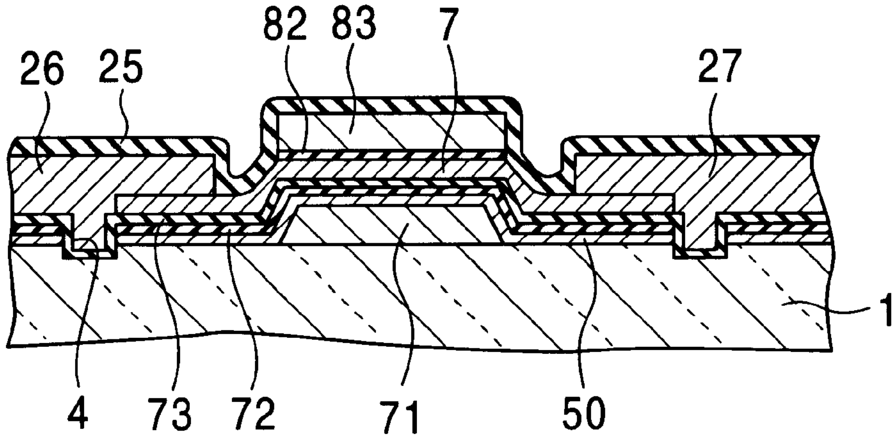
FIG. 115A and 115B are cross-sectional views of main portions of the LCD in accordance with the twenty-sixth embodiment of the present invention.
Figure 115B:
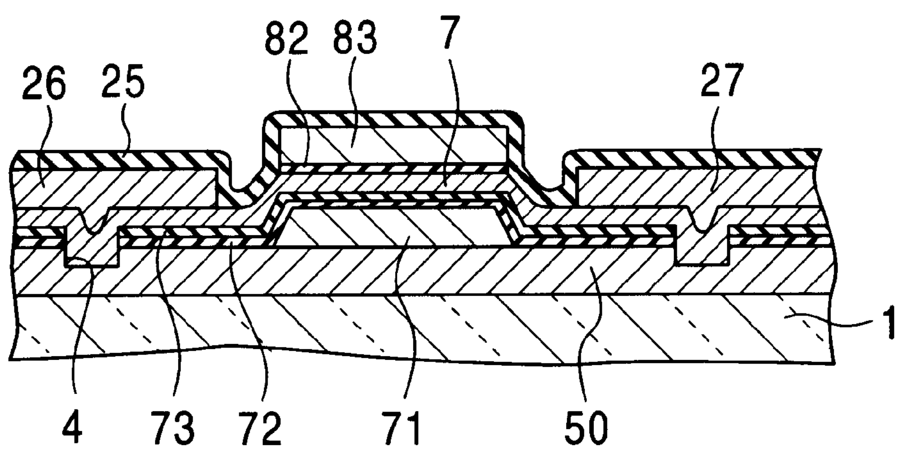
Figure 116A:
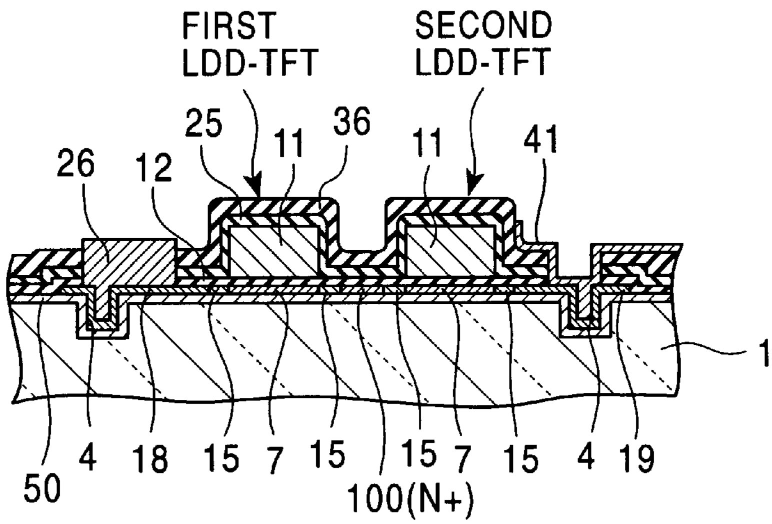
FIGS. 116A and 116B are a cross-sectional view and a plan view, respectively, of a LCD in accordance with a twenty-seventh embodiment of the present invention.
Figure 116B:
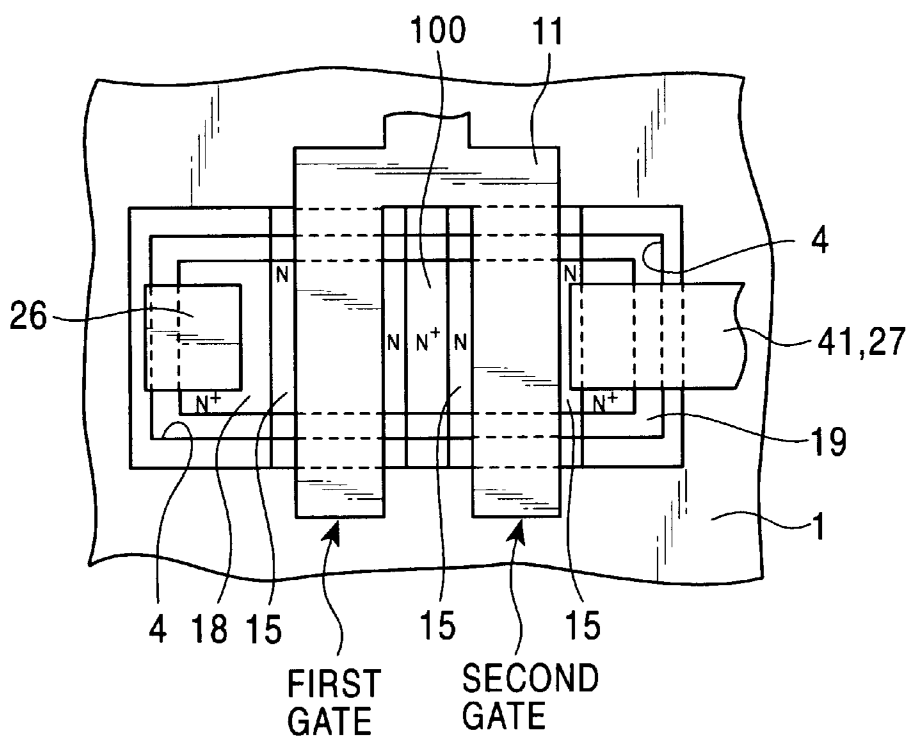
Figure 117A:
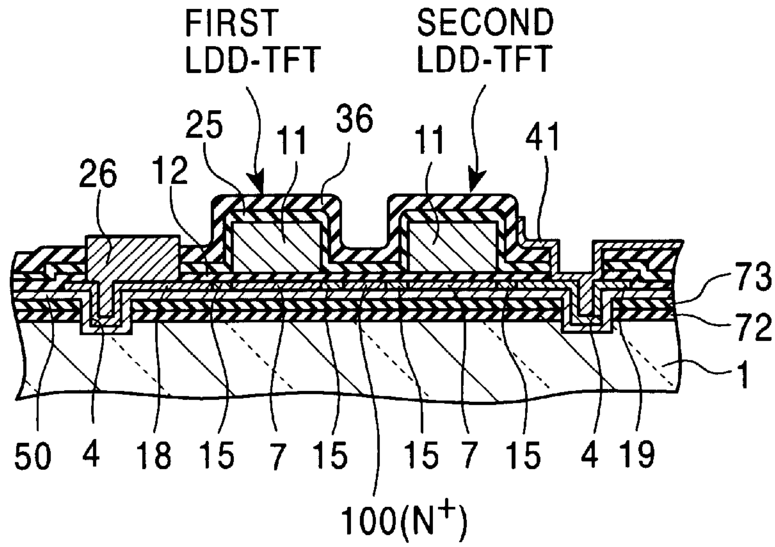
FIGS. 117A and 117B are a cross-sectional view and the plan view, respectively, of a LCD in accordance with a twenty-seventh embodiment of the present invention.
Figure 117B:
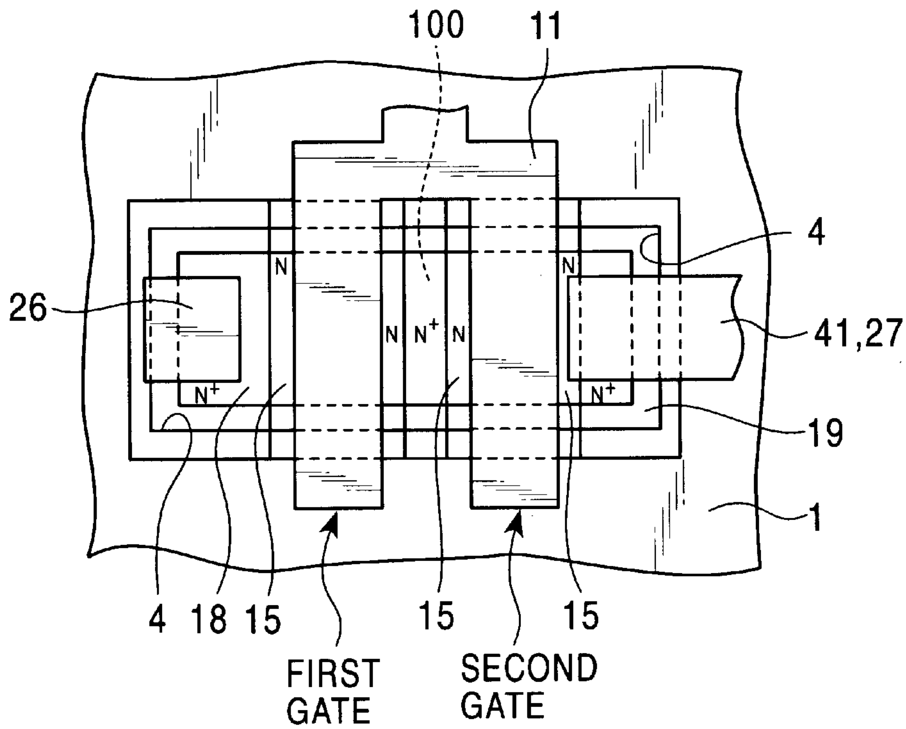
Figure 118A:
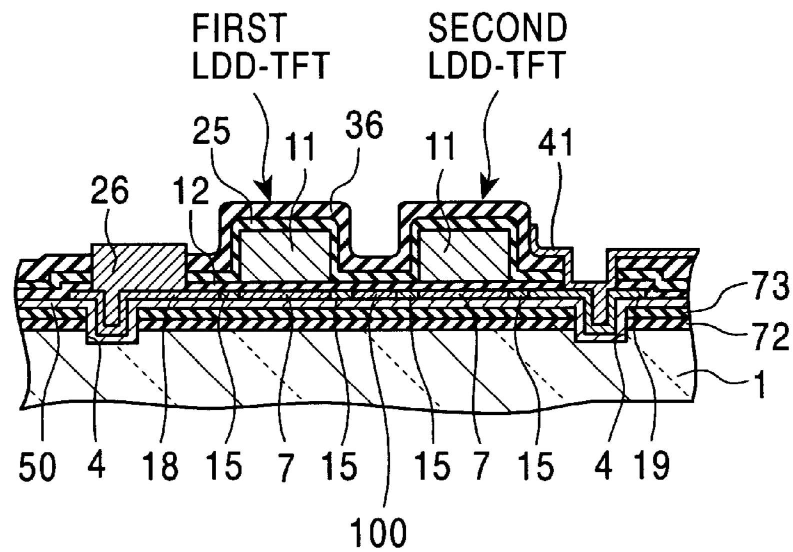
FIGS. 118A and 118B are a cross-sectional view and the plan view, respectively, of a LCD in accordance with a twenty-seventh embodiment of the present invention.
Figure 118B:
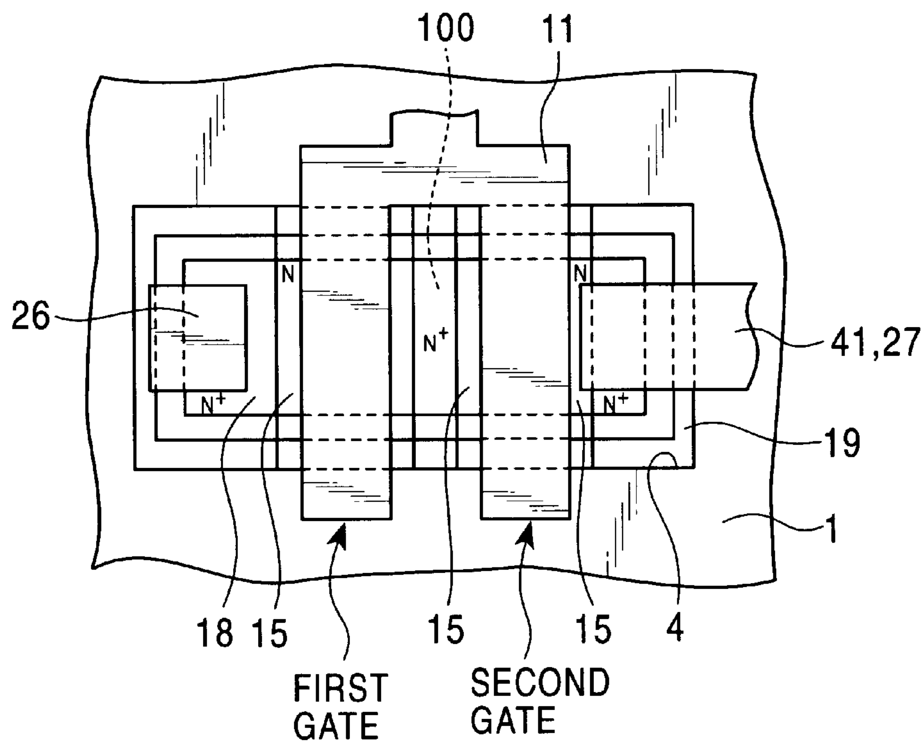

FIGS. 115A and 115B show a dual gate MOSTFT. Any step difference 4 shown in FIGS. 113A to 113E may also be formed in this type. For example, the dual-gate MOSTFT may be formed on the flat portion in the interior of the step difference 4 shown in FIG. 113C.

Twenty-seventh Embodiment

FIGS. 116A to 120B show a twenty-seventh embodiment of the present invention.

FIGS. 116A to 118B show a self-alignment type LDD-TFT, for example, a double-gate MOSTFT including a plurality of top-gate MOSLDD-TFTs.

A gate electrode 11 has two branches, that is, a first gate and a second gate. The first gate is used for a first LDD-TFT and the second gate is used for a second LDD-TFT. An $N^+$-type region 100 is provided in the center of the single-crystal silicon layer between these gates in order to decrease resistance. Different voltages may be applied to these gates. If one gate is not operable for any reason, the other gate will perform transfer of carriers between the source and the drain. Thus, the two-gate configuration has high reliability. The first LDD-TFT and the second LDD-TFT are connected in series and function as thin-film transistors for driving a pixel. In an OFF mode, a voltage applied between the source and the drain of each thin-film transistor can be significantly reduced. Thus, the leakage current in the OFF mode can be reduced, resulting in improved contrast and image quality in the liquid crystal display. Since these two LDD transistors are connected with the semiconductor layer which is the same as the low-concentration drain region, the conductive distance between the transistors can be reduced. Thus, this configuration can avoid an increase in the transistor area regardless of a dual LDD transistor configuration. The first and second gates may be isolated for independent operation.

Figure 119A:
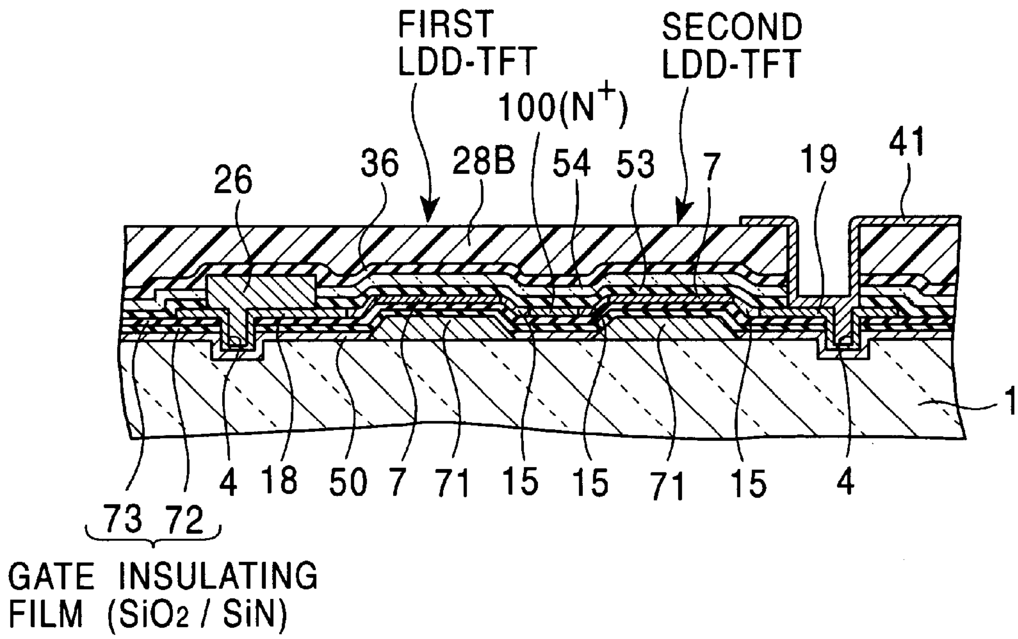
FIGS. 119A and 119B are cross-sectional views of TFTs in the LCD in accordance with the twenty-seventh embodiment of the present invention.
Figure 119B:
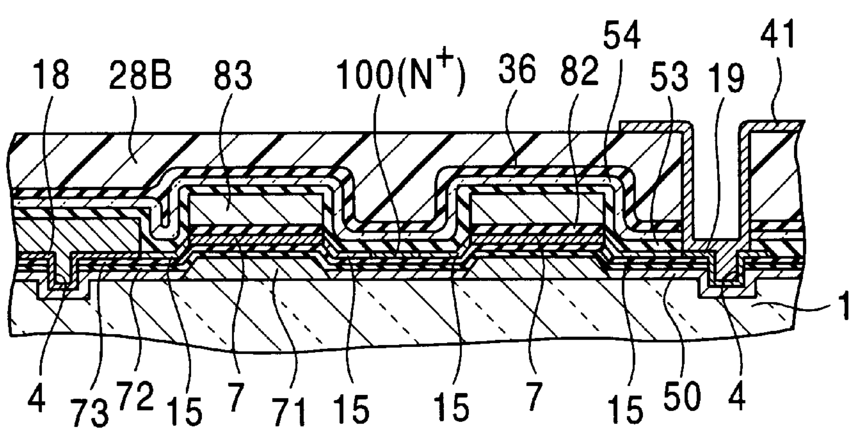

FIG. 119A shows a double gate configuration of bottom-gate MOSTFTs, and FIG. 119B shows a double gate configuration of dual-gate MOSTFTs.

These double-gate MOSTFTs have the same advantages as those in the above-described top-gate type. If one gate section is not operable in the dual-gate type, the other gate section can be used.

Figure 120A:
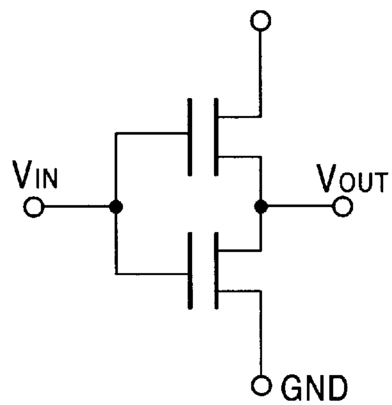
FIGS. 120A and 120B are equivalent circuit diagrams of TFTs in the LCD in accordance with the twenty-seventh embodiment of the present invention.
Figure 120B:
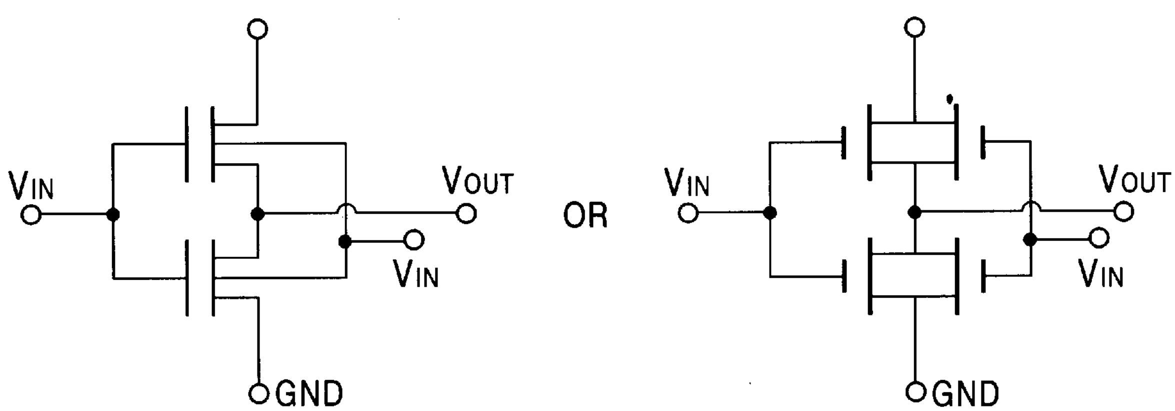

FIG. 120A is an equivalent circuit diagram of a top-gate or bottom-gate MOSTFT having a double-gate configuration. FIG. 120B is a equivalent circuit diagram of a dual-gate MOSTFT having a double-gate configuration. The gate may be divided into three or more. In the multi-gate configuration, the branched gate electrodes having the same potential may be provided or isolated gate electrodes having the same potential or different potentials may be provided in the channel region.

Twenty-eighth Embodiment

Figure 121A:
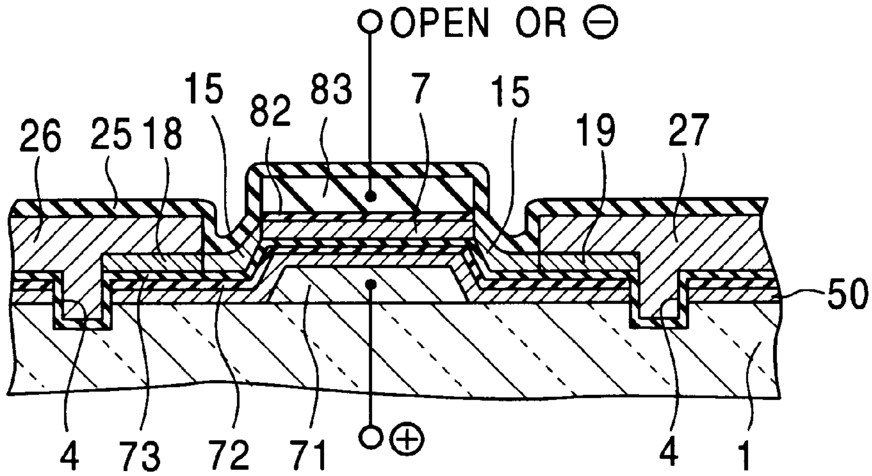
FIGS. 121A and 121B are cross-sectional views of TFTs in a LCD in accordance with a twenty-eighth embodiment of the present invention.
Figure 121B:
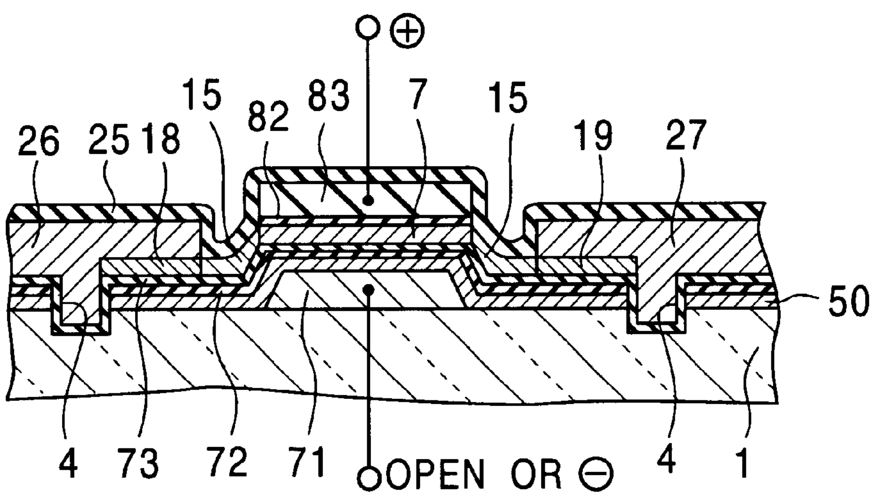

FIGS. 121A and 121B show a twenty-eighth embodiment of the present invention. In a TFT comprising a dual-gate type nMOSTFT, one of the upper and lower-gate sections is used in a transistor operation, whereas the other operates as follows.

In an nMOSTFT shown in FIG. 121A, an appropriate negative voltage is always applied to the gate electrode at the top gate side to reduce the leakage current in the back channel. When the top gate electrode is opened, this is used as a bottom-gate type. In FIG. 121B, an appropriate negative voltage is always applied to the gate electrode at the bottom gate side to reduce the leakage current in the back channel. When the bottom gate electrode is opened, this is used as a top-gate type. In a pMOSTFT, an appropriate positive voltage is applied to the gate electrode to reduce the leakage current in the back channel.

The interface between the single-crystal silicon layer 7 and the insulating film has low crystallinity and readily causes a leakage current. The above-mentioned negative voltage applied to the gate electrode can reduce the leakage current. Furthermore, the bottom gate electrode shades the light incident on the substrate 1. Thus, the leakage current caused by the incident light can be reduced.

Twenty-ninth Embodiment

FIGS. 122A to 127 show a twenty-ninth embodiment of the present invention.

This embodiment relates to an active-matrix reflective liquid crystal display (LCD) comprising top-gate MOSTFTs formed by using a single-crystal silicon layer which is heteroepitaxially grown using, as a seed, a material layer (for example, a crystalline sapphire film) formed on a surface of a substrate having no step difference (indented section).

With reference to FIGS. 122A to 127, the active-matrix reflective LCD in this embodiment will be described based on the production steps. In FIGS. 122A to 126R, the left side of each drawing shows the production step of the display section and the right side shows the production step of the peripheral-driving-circuit section.

Figures 122A, 122B, 122C, 122D:
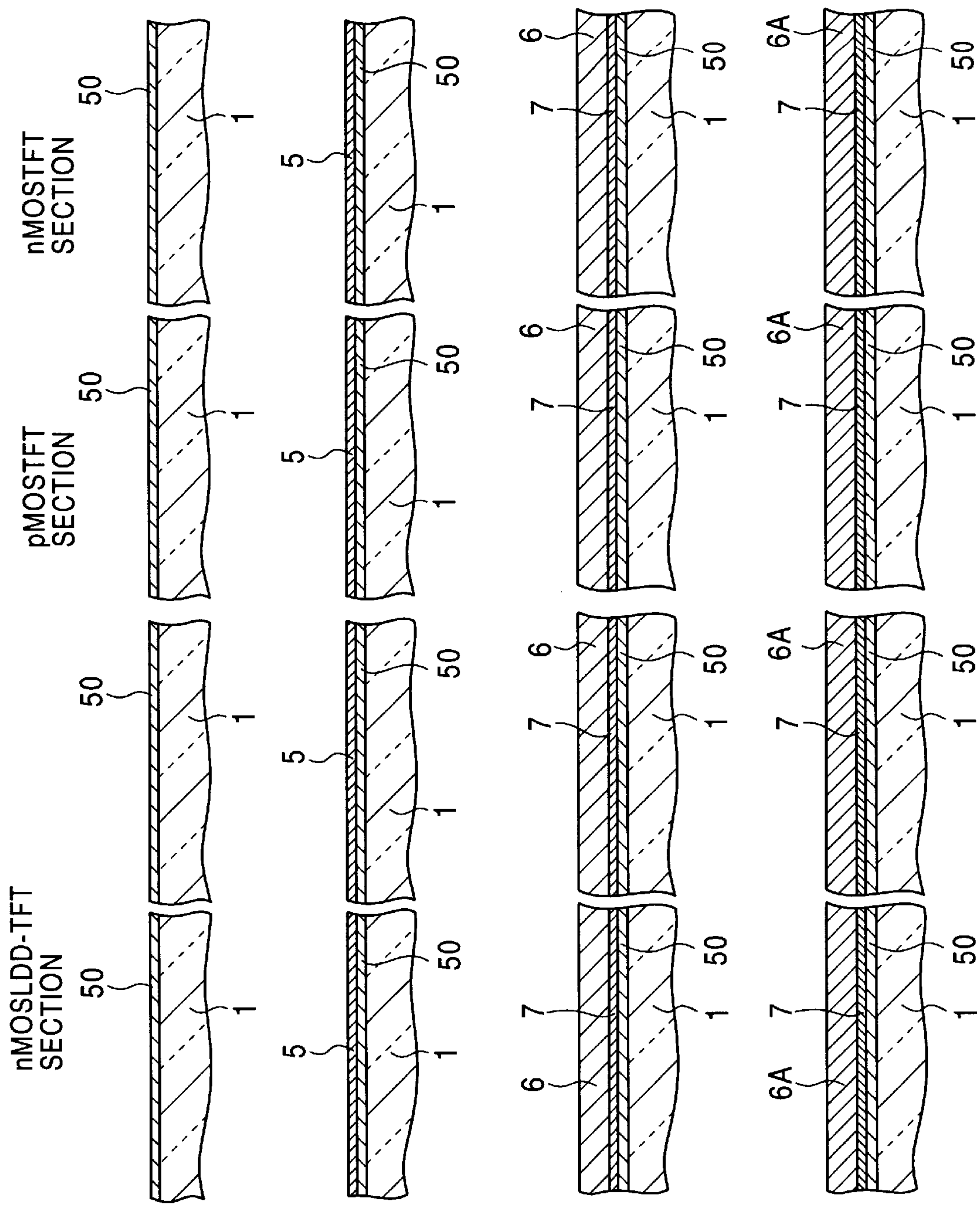

With reference to FIG. 122A, a crystalline sapphire thin film 50 having a thickness of 20 to 200 nm is formed in at least the TFT-forming regions on one main surface of the insulating substrate 1 formed of quartz glass, transparent crystallized glass or the like. The crystalline sapphire thin film 50 is formed by oxidative crystallization of a trimethylaluminum gas with an oxidizing gas containing oxygen and moisture by a high-density plasma-enhanced CVD process, a catalytic CVD process (refer to Japanese Unexamined Patent Publication No. 63-40314), or the like. As the insulating substrate 1, a highly-heat-resistant glass substrate having a diameter of 8 to 12 inches and a thickness of 700 to 800 μm can be used.

With reference to FIG. 122B, a polycrystalline silicon film 5 having a thickness of several μm to 0.005 μm, for example, 0.1 μm, is deposited on the entire surface of the crystalline sapphire thin film 50 by a known catalytic CVD process, a plasma-enhanced CVD process, or a sputtering process, at a substrate temperature in the range of 100 to 400° C.

With reference to FIG. 122C, an indium film 6 is formed on the polysilicon film 5 by a MOCVD process, a sputtering process, or a vacuum evaporation process using trimethylindium so that the thickness of the indium film 6 is, for example, 10 to 15 μm which is several ten to several hundred times the thickness of the polycrystalline silicon film 5.

Although an indium-gallium layer or gallium layer may be formed in place of the indium film 6, the indium film 6 will be described as a typical example in this embodiment.

The substrate 1 is then heated in a hydrogen-based atmosphere, such as hydrogen, a nitrogen-hydrogen mixture, or an argon-hydrogen mixture to a temperature not higher than 1,000° C., preferably 900 to 930° C. for 5 minutes. The polycrystalline silicon 5 is thereby melted into the melt of the indium film 6. Silicon in the melt precipitates at a temperature significantly lower than the original precipitation temperature. The entire substrate 1 may be uniformly heated using an electrical furnace or the like. Alternatively, predetermined regions, for example, the TFT-forming regions of the substrate 1, may be locally heated using laser, electron beams, or the like.

With reference to FIG. 122D, the substrate 1 is then gradually cooled so that silicon dissolved in indium is heteroepitaxially grown by using the crystalline sapphire thin film 50 as a seed to deposit a P-type single-crystal silicon layer 7 having a thickness of, for example, approximately 0.1 $\mu$m.

In the thus-deposited single-crystal silicon layer 7, for example, a (100) plane is heteroepitaxially grown on the substrate because the crystalline sapphire film 50 exhibits good lattice matching with single-crystal silicon.

Figures 123E, 123F, 123G, 123H:
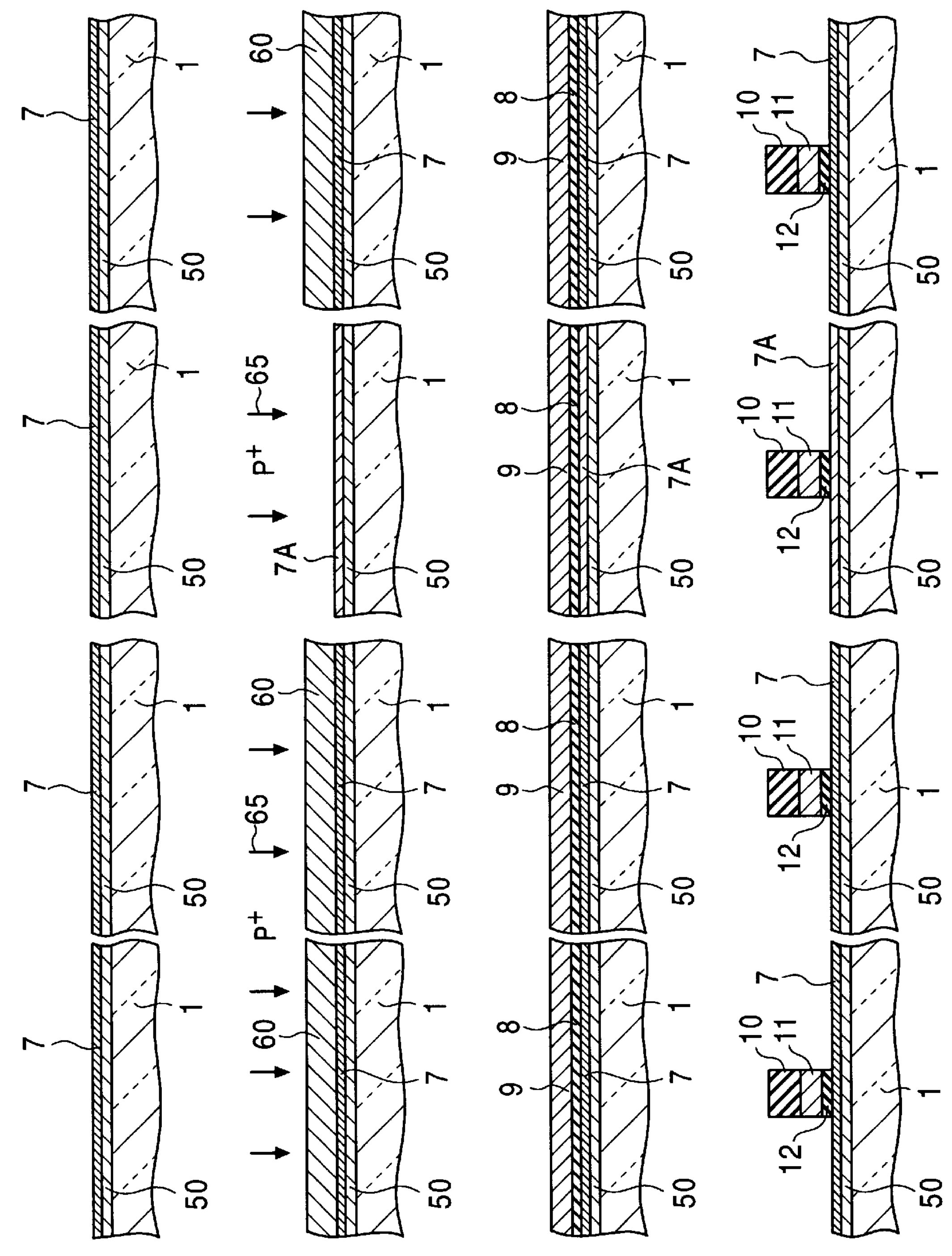

With reference to FIG. 123E, after the single-crystal silicon layer 7 is deposited on the substrate 1 by heteroepitaxy, the indium film 6A deposited on the surface is removed by resolution with hydrochloric acid or sulfuric acid as in the first embodiment to form a top-gate MOSTFT having a channel region comprising the single-crystal silicon layer 7.

The entire surface of the heteroepitaxially deposited single-crystal silicon layer 7 is doped with a p-type carrier impurity, such as boron, at an adequate concentration to adjust specific resistance. Moreover, the pMOSTFT-forming regions are selectively doped with an n-type carrier impurity to form an N-type well.

More specifically, the p-channel MOSTFT sections are masked with a photoresist layer (not shown in the drawing) and are doped with p-type impurity ions such as $B^+$ at 10 kV and at a dose of $2.7\times10^{11}$ atoms/cm$^2$ to adjust specific resistance. With reference to FIG. 123F, in order to control the concentration of the impurity in the pMOSTFT-forming regions, the nMOSTFT sections are masked with a photoresist layer 60 and are doped with n-type impurity ions 65 such as $P^+$ at 10 kV and at a dose of $1\times10^{11}$ atoms/cm$^2$ to form n-type wells 7A.

With reference to FIG. 123G, $SiO_2$ having a thickness of approximately 200 nm and SiN having a thickness of approximately 100 nm are continuously deposited in this order on the entire surface of the single-crystal silicon layer 7 by a plasma-enhanced CVD process, a high-density plasma-enhanced CVD process or a catalytic CVD process to form a gate insulating film 8. A molybdenum-tantalum (Mo—Ta) alloy film 9 having a thickness of 500 to 600 nm is formed thereon by a sputtering process.

With reference to FIG. 123H, a photoresist pattern 10 is formed in the step difference regions (indented sections) of the TFT sections in the display region and of the TFT sections of the peripheral driving region by any conventional photolithographic process. By continuous etching, gate electrodes 11 of the Mo—Ta alloy and gate insulating films 12 of SiN—$SiO_2$ are formed, and the single-crystal silicon layer 7 is exposed. The Mo—Ta alloy film 9 is etched with an acidic solution, SiN is etched by plasma etching with $CF_4$ gas, and $SiO_2$ is etched with a hydrofluoric acid solution.

Figure 124I:
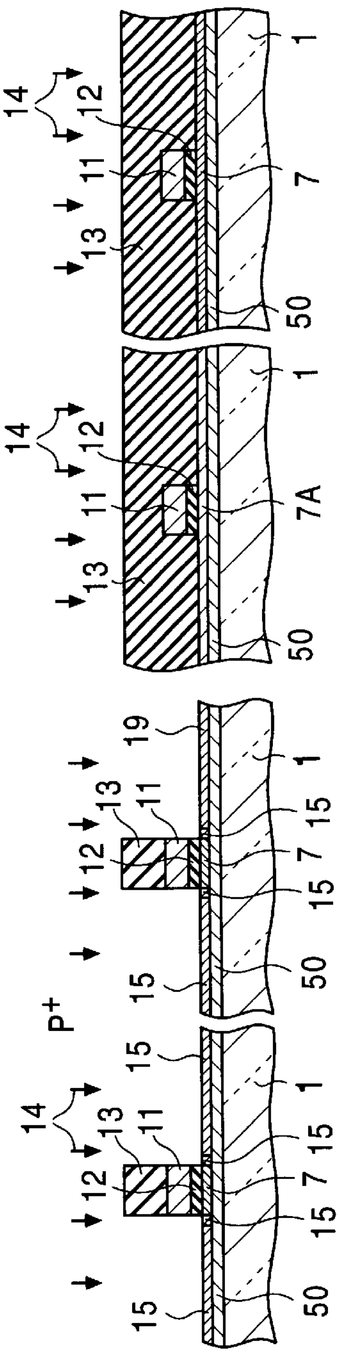

With reference to FIG. 124I, all of the nMOSs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 124J:
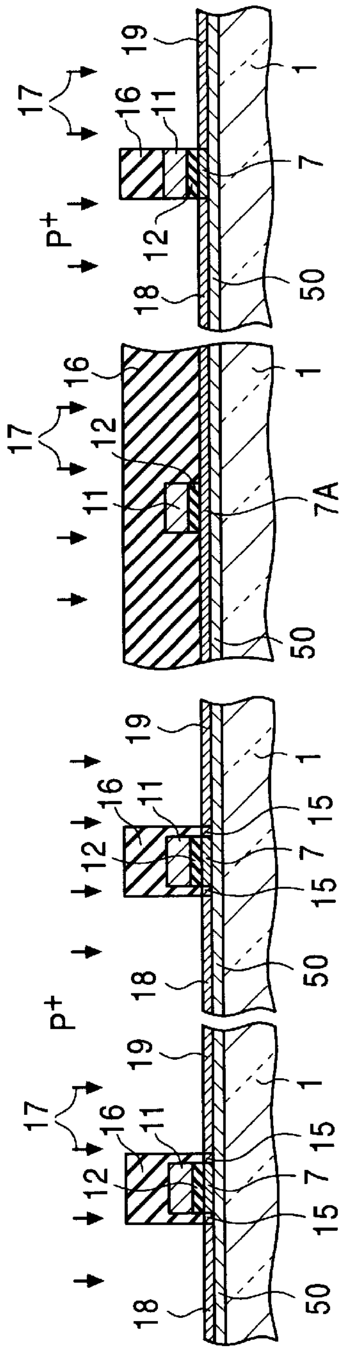

With reference to FIG. 124J, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs.

Figure 124K:
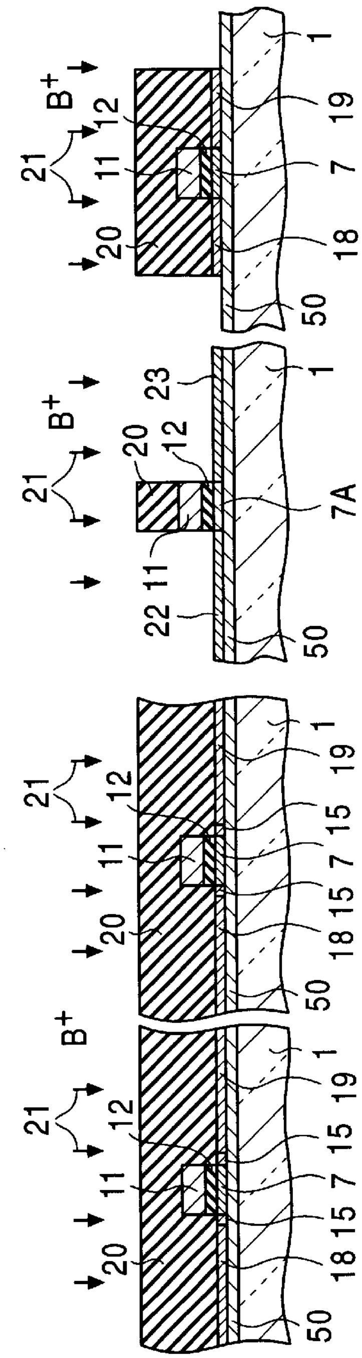

With reference to FIG. 124K, all of the nMOSTFTs in the peripheral driving region and the display region and the gate sections of the pMOSTFTs in the peripheral driving region are covered with a photoresist layer 20. The exposed regions are doped with boron ions 21 by ion implantation at 10kV and at a dose of $5\times10^{15}$ atoms/cm$^2$ to form source sections 22 and drain sections 23 of $P^+$-type layers of the pMOSTFTs. In the case of an nMOS peripheral driving circuit, this step is not necessary since the circuit does not have a pMOSTFT.

Figure 125L:
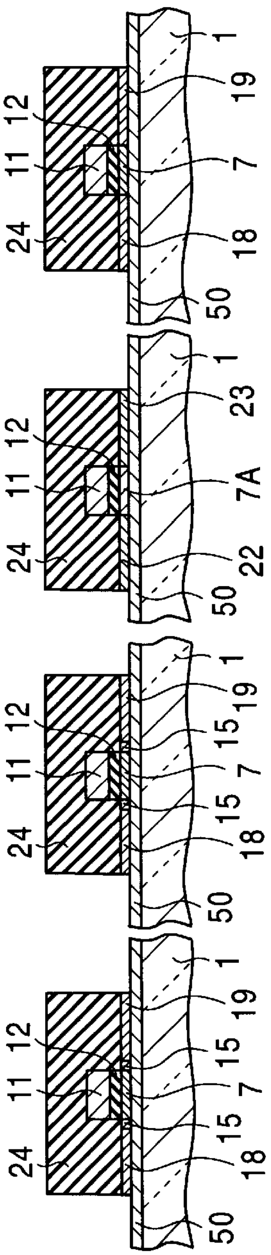

With reference to FIG. 125L, in order to island the active device sections including TFTs and diodes and the passive device sections including resistors and inductors, photoresist layers 24 are provided on all of the active device sections and the passive device sections in the peripheral driving section and the display section, and the single-crystal silicon layer 7 in other sections is removed by a conventional photolithographic process and etching process using a hydrofluoric acid etching solution.

Figure 125M:
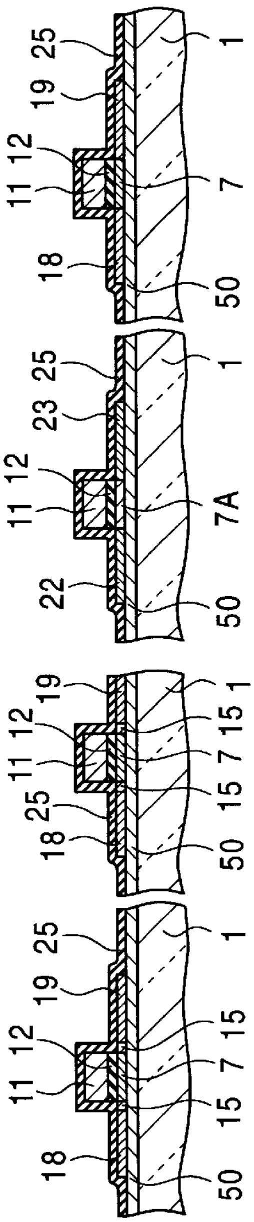

With reference to FIG. 125M, a $SiO_2$ film having a thickness of approximately 200 nm and a phosphosilicate glass (PSG) film having a thickness of approximately 300 nm are continuously deposited in this order to form a protective film 25 on the entire surface by a plasma-enhanced CVD process, a high-density plasma-enhanced CVD process or a catalytic CVD process.

In this state, the single-crystal silicon layer is activated. Since activation is performed at approximately 1,000° C. for approximately 10 seconds using, for example, a halogen lamp or the like, the gate electrode material composed of the Mo—Ta alloy having a high melting point is durable during the annealing for activation. The gate electrode material can thus be used for not only the gate sections but also lead lines over a wide range. In the activation, expensive excimer laser annealing is generally not used. If excimer laser annealing is used, overlapping scanning of 90% or more is preferably performed on the entire surface or selectively the active device sections and the passive device sections using XeCl (wavelength: 308 nm).

Figure 125N:
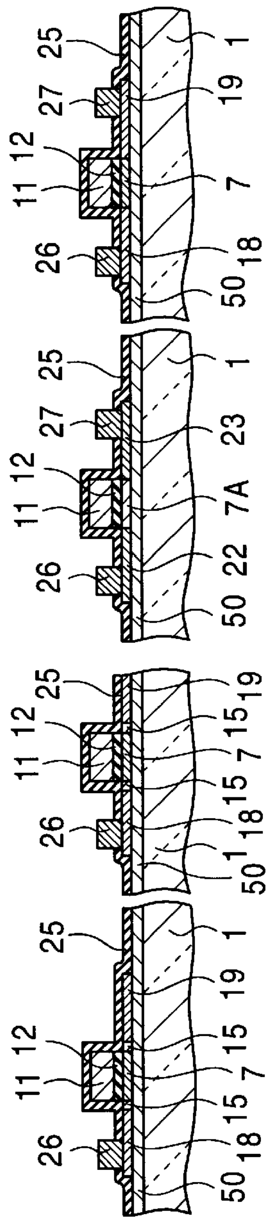

With reference to FIG. 125N, contact holes are formed in all of the source-drain sections of the TFTs in the peripheral driving circuit and the source sections of the TFTs in the display region, by a conventional photolithographic process and an etching process.

A sputtered film of aluminum or an aluminum alloy containing 1% Si, having a thickness of 500 to 600 nm, is formed on the entire surface. By a conventional photolithographic process and an etching process, source electrodes 26 of all TFTs in the peripheral-driving-circuit section and the display section and drain electrodes 27 in the peripheraldriving-circuit section are formed, and at the same time, data lines and gate lines are formed. Next, these are subjected to sintering at approximately 400° C. for 1 hour in a forming gas containing nitrogen and hydrogen.

Figure 125O:
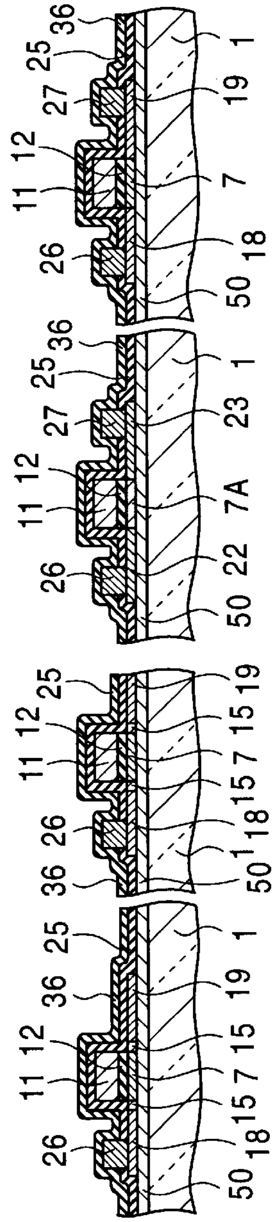

With reference to FIG. 125O, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed in the drain sections of TFTs in the display region. It is not necessary to remove the $SiO_2$, PSG and SiN films in the pixel sections.

Figures 126P, 126Q, 126R:
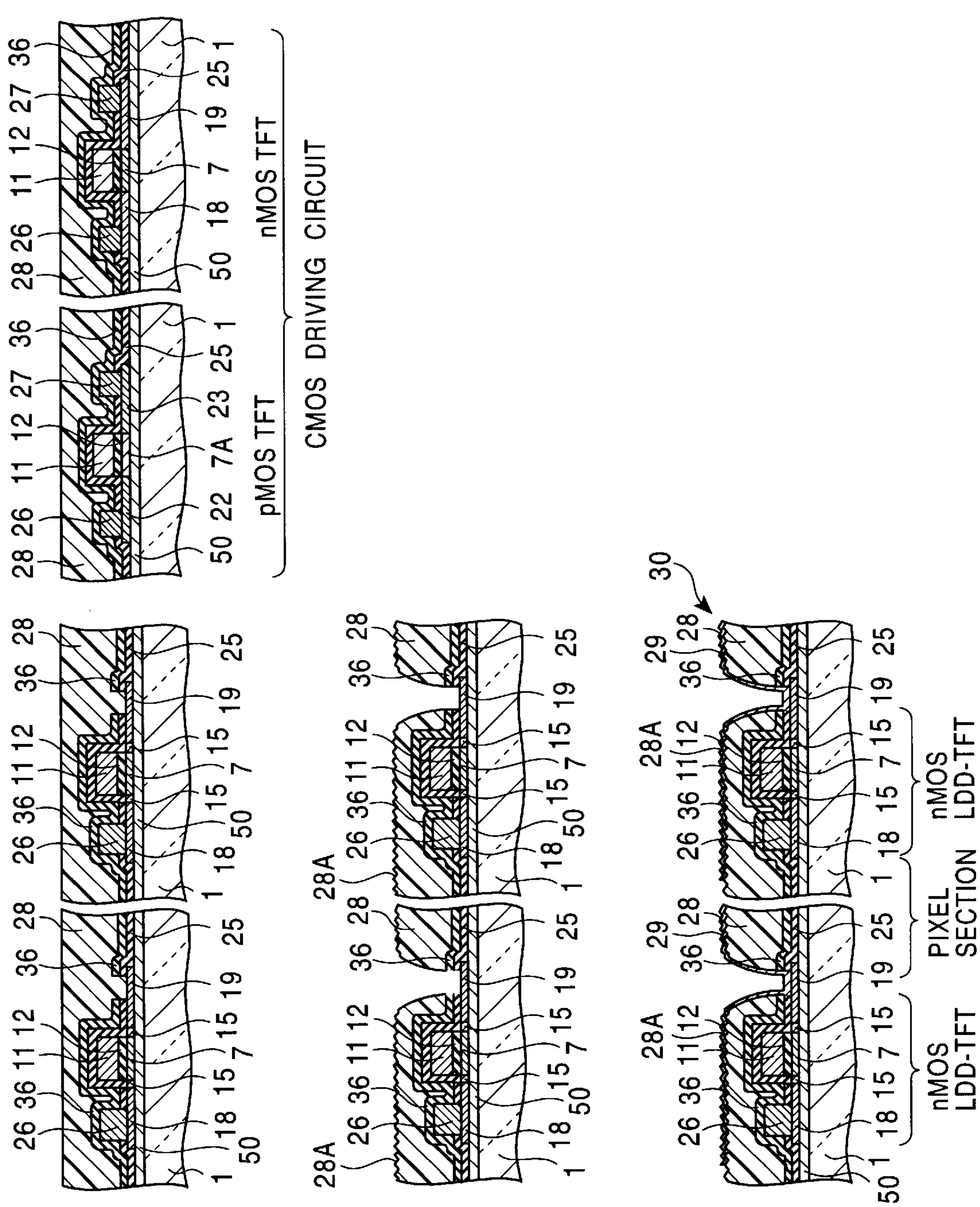

For the same purpose as in the above-described step shown in FIG. 6R, as shown in FIG. 126P, a photosensitive resin film 28 having a thickness of 2 to 3 $\mu$m is formed on the entire surface by spin coating. Next, as shown in FIG. 126Q, an uneven pattern is formed in at least the pixel region by a conventional photolithographic process and an etching process so that the pixel section has optimized reflective characteristics and viewing-angle characteristics. The uneven pattern is subjected to reflow to form a lower portion of the reflective face of an uneven surface 28A. At the same time, contact holes are formed in the resin film in the drain sections of TFTs in the display region.

With reference to FIG. 126R, a sputtered film of aluminum, aluminum containing 1% Si, or the like, which has a thickness of 400 to 500 nm, is deposited on the entire surface. The sputtered film is removed from regions other than the pixel sections by a general photolithographic process and an etching process to form uneven aluminum reflective sections 29 which are connected to the drain sections 19 of the display TFTs. The reflective sections 29 are used as pixel electrodes for displaying. Next, these are subjected to sintering at approximately 300° C. for 1 hour in a forming gas to achieve sufficient contact. Silver or a silver alloy may be used instead of the aluminum system to increase the reflectance.

As described above, the single-crystal silicon layer 7 is formed by high-temperature heteroepitaxy using the crystalline sapphire thin film 50 as the seed, and CMOS circuits each comprising top-gate nMOSLDD-TFT, pMOSTFT and nMOSTFT are formed in each of the display section and the peripheral-driving-circuit section each comprising the single-crystal silicon layer 7, to produce an active matrix substrate 30 in which the display section and the peripheral-driving-circuit section are integrated.

Figure 127:
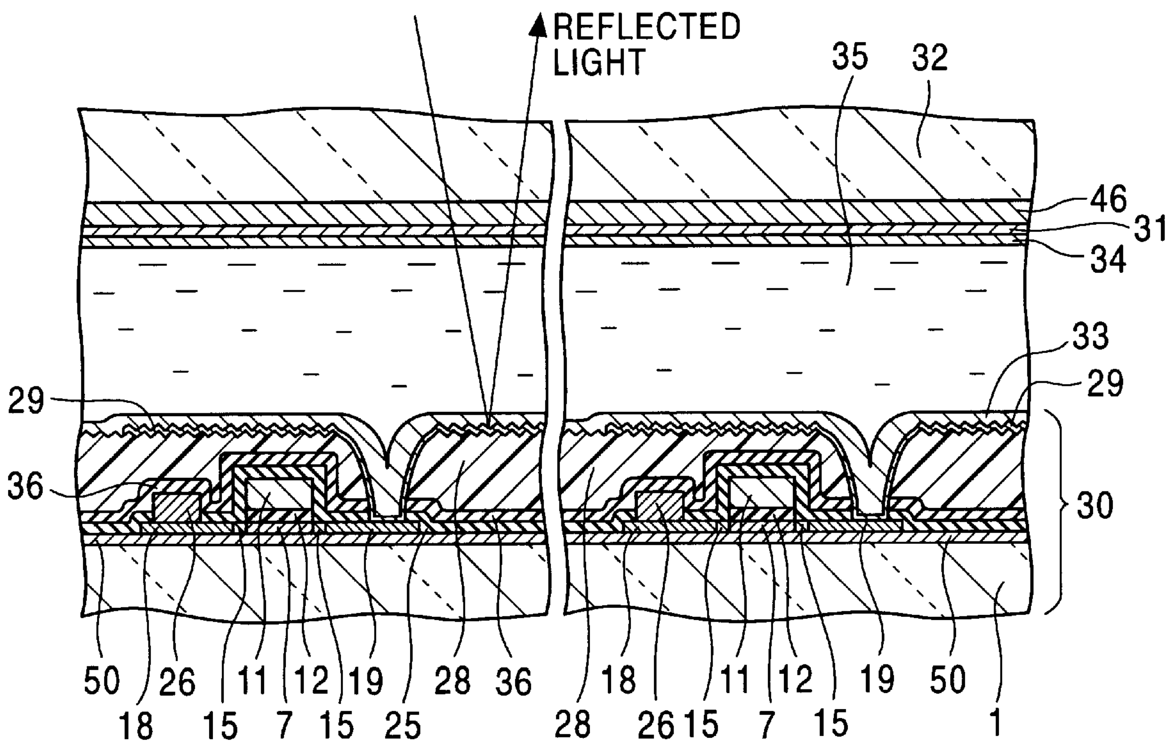
FIG. 127 is a cross-sectional view illustrating a main portion of the liquid crystal display (LCD) in accordance with the twenty-ninth embodiment of the present invention.

A reflective liquid crystal display (LCD) shown in FIG. 127 is then made using the resulting active-matrix substrate (driving substrate) 30 by the same method described above concerning FIG. 7.

This embodiment apparently has the same advantages as the first embodiment does. In addition, since the single-crystal silicon thin film 7 is heteroepitaxially deposited using the crystalline sapphire thin film 50 formed on the substrate 1 not provided with step differences as a seed, the step of forming the step differences can be omitted and the process can be further simplified. Furthermore, the single-crystal silicon layer 7 is free of discontinued or thin portions.

Thirtieth Embodiment

FIGS. 128A to 134 show a thirtieth embodiment of the present invention.

This embodiment relates to an active-matrix reflective liquid crystal display (LCD) comprising top-gate MOSTFTs in the display section and bottom-gate MOSTFTs in the peripheral-driving-circuit section formed by using a single-crystal silicon layer which is heteroepitaxially grown using, as a seed, a material layer (for example, a crystalline sapphire film) formed on a surface of a substrate having no step difference (indented section).

With reference to FIGS. 128A to 134, the active-matrix reflective LCD in this embodiment will be described based on the production steps. In FIGS. 128A to 133T, the left side of each drawing shows the production step of the display section and the right side shows the production step of the peripheral-driving-circuit section.

Figure 128A:
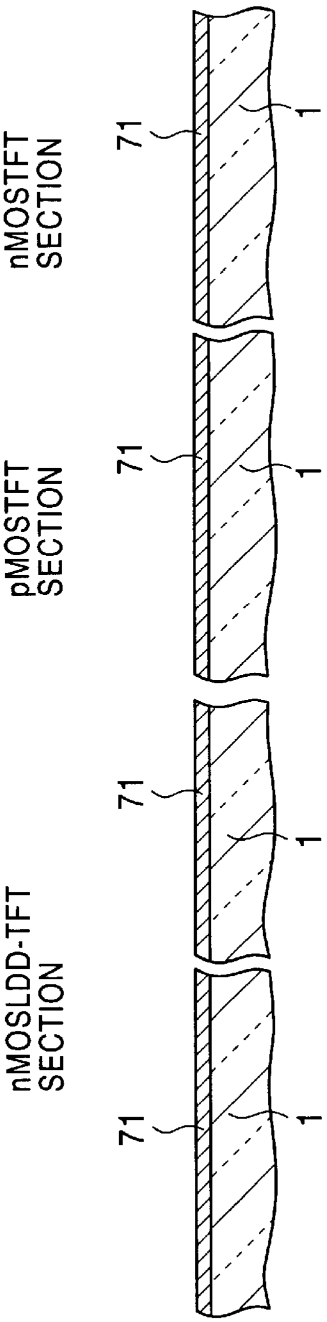

With reference to FIG. 128A, a molybdenum-tantalum alloy film 71 having a thickness of 500 to 600 nm is formed on one main surface of an insulating substrate 1 composed of quartz glass, transparent crystalline glass, or the like, by sputtering.

Figure 128B:
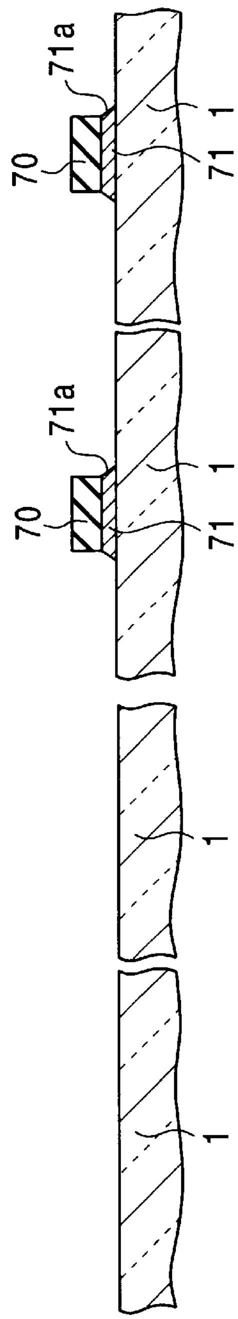

With reference to FIG. 128B, a photoresist layer 70 having a given pattern is formed and the molybdenum-tantalum alloy film 71 is subjected to taper etching using the photoresist layer 70 as a mask to form a gate electrode 71 having a trapezoidal side base 71$a$ with an angle of 20 to 45 degree.

Figure 128C:
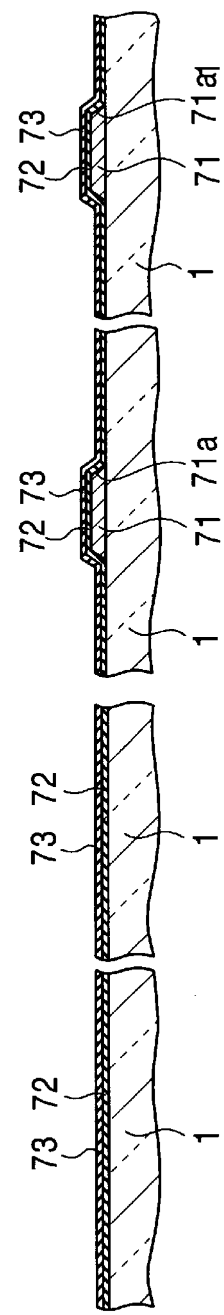

With reference to FIG. 128C, after the photoresist layer 70 is removed, a SiN film 72 having a thickness of approximately 100 nm and then a $SiO_2$ film 73 having a thickness of approximately 200 nm are deposited on the substrate 1 including the molybdenum-tantalum alloy film 71 by a plasma-enhanced CVD process to form a gate insulating film.

Figure 129D:
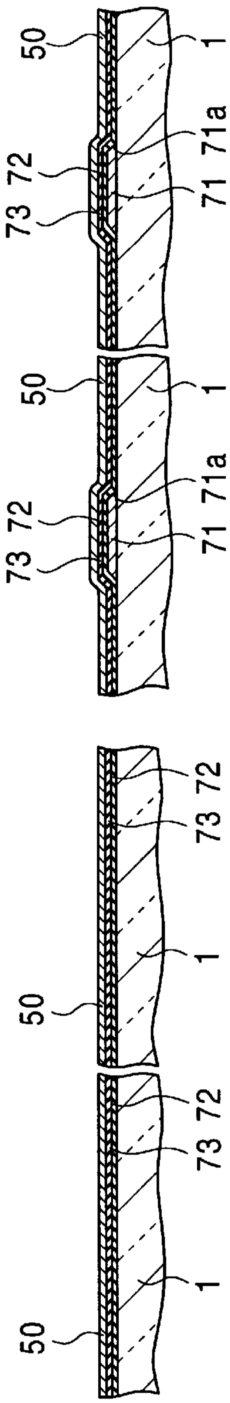

With reference to FIG. 129D, a crystalline sapphire thin film 50 having a thickness of 20 to 200 nm is formed in at least the TFT-forming regions on one main surface of the insulating substrate 1. The crystalline sapphire thin film 50 is formed by oxidative crystallization of a trimethylaluminum gas with an oxidizing gas containing oxygen and moisture by a high-density plasma-enhanced CVD process, a catalytic CVD process (refer to Japanese Unexamined Patent Publication No. 63-40314), or the like. As the insulating substrate 1, a highly-heat-resistant glass substrate having a diameter of 8 to 12 inches and a thickness of 700 to 800 $\mu$m can be used.

Figure 129E:
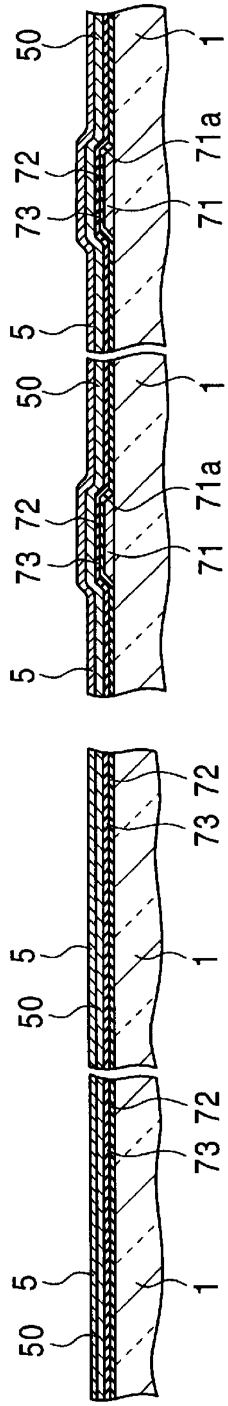

With reference to FIG. 129E, as in FIG. 15F in the second embodiment, a polycrystalline silicon film 5 having a thickness of several $\mu$m to 0.005 $\mu$m, for example, 0.1 $\mu$m, is deposited on the entire surface of the crystalline sapphire thin film 50 by a known catalytic CVD process, a plasma-enhanced CVD process, or a sputtering process, at a substrate temperature in the range of 100 to 400° C.

Figure 129F:
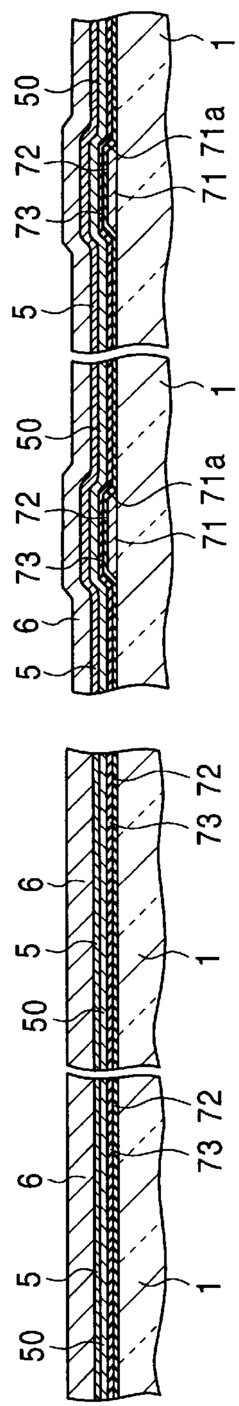

With reference to FIG. 129F, an indium film 6 is formed on the polycrystalline silicon film 5 by a MOCVD process, a sputtering process, or a vacuum evaporation process using trimethylindium so that the thickness of the indium film 6 is, for example, 10 to 15 $\mu$m which is several ten to several hundred times the thickness of the polycrystalline silicon film 5. Although an indium-gallium layer or gallium layer may be formed in place of the indium film 6, the indium film 6 will be described as a typical example in this embodiment.

The substrate 1 is then heated in a hydrogen-based atmosphere, such as hydrogen, a nitrogen-hydrogen mixture, or an argon-hydrogen mixture to a temperature not higher than 1,000° C., preferably 900 to 930° C. for 5 minutes. The polycrystalline silicon 5 is thereby melted into the melt of the indium film 6. Silicon in the melt precipitates at a temperature significantly lower than the original precipitation temperature. The entire substrate 1 may be uniformly heated using an electrical furnace or the like. Alternatively, predetermined regions, for example, the TFT-forming regions of the substrate 1, may be locally heated using laser, electron beams, or the like.

Figure 129G:
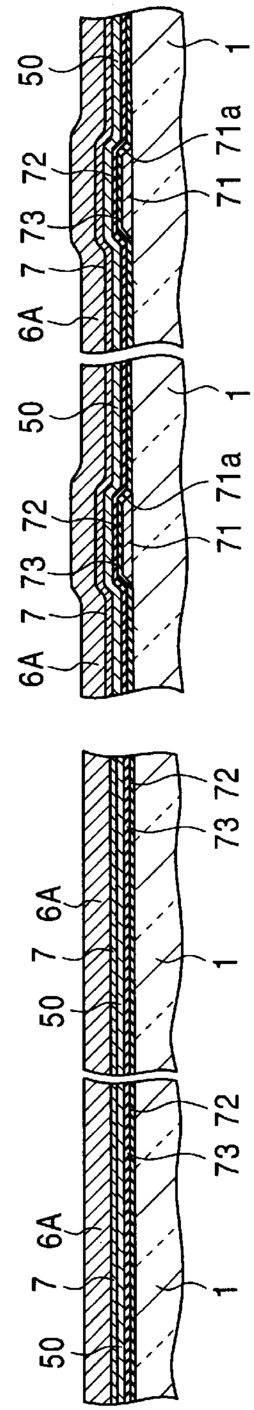

With reference to FIG. 129G, the substrate 1 is then gradually cooled so that silicon dissolved in indium is heteroepitaxially grown by using the crystalline sapphire thin film 50 as a seed to deposit a P-type single-crystal silicon layer 7 having a thickness of, for example, approximately 0.1 $\mu$m.

In the thus-deposited single-crystal silicon layer 7, for example, a (100) plane is heteroepitaxially grown on the substrate because the crystalline sapphire film 50 exhibits good lattice matching with single-crystal silicon.

Figures 130H, 130I, 130J, 130K:
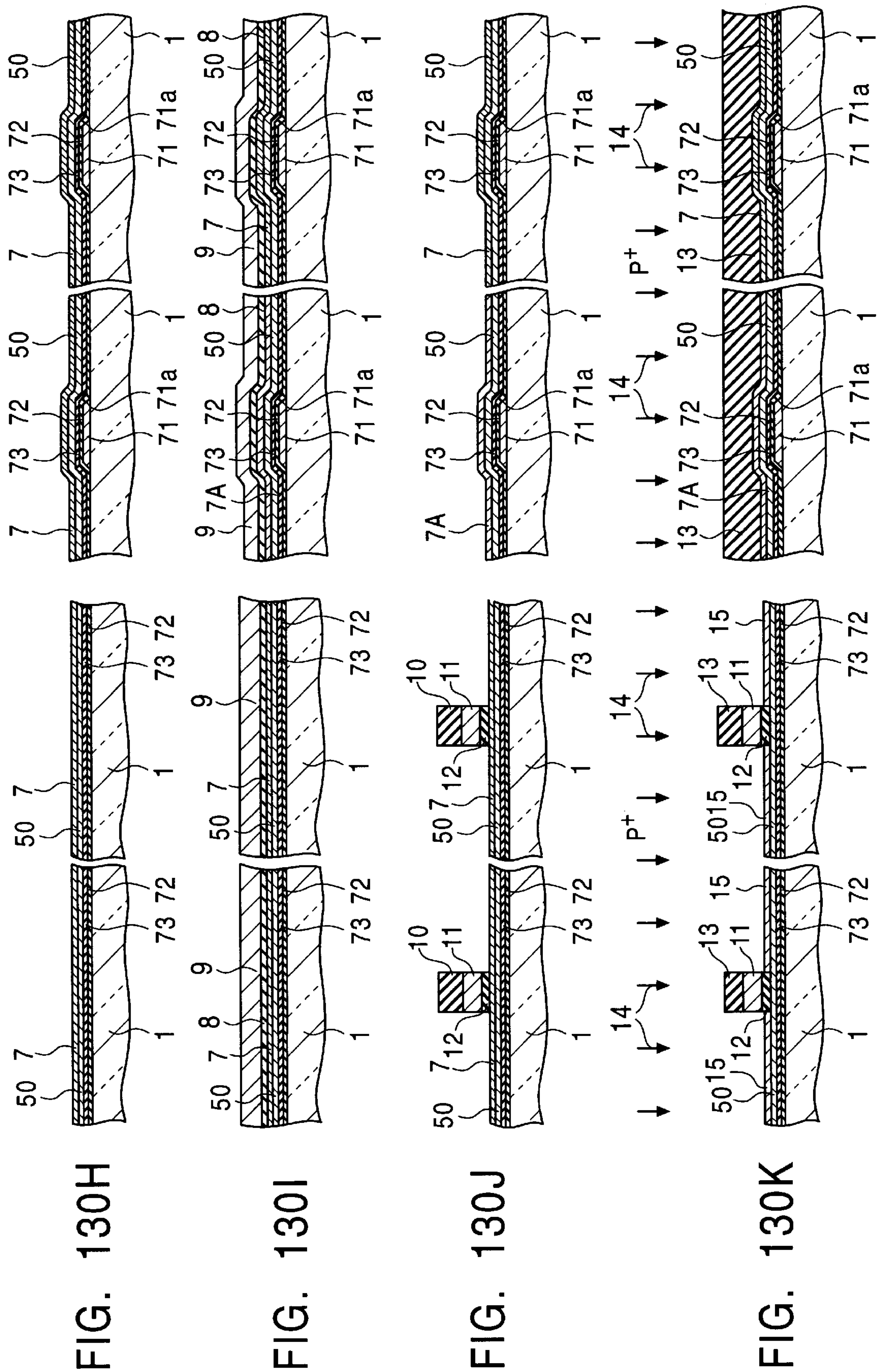

With reference to FIG. 130H, after the single-crystal silicon layer 7 is deposited on the substrate 1 by heteroepitaxy, the indium film 6A deposited on the surface is removed by resolution with hydrochloric acid or sulfuric acid as in the first embodiment to form a top or bottom-gate MOSTFT having a channel region comprising the single-crystal silicon layer 7.

The entire surface of the heteroepitaxially deposited single-crystal silicon layer 7 is doped with a p-type carrier impurity, such as boron, at an adequate concentration to adjust specific resistance. Moreover, the pMOSTFT-forming regions are selectively doped with an n-type carrier impurity to form an N-type well.

More specifically, the p-channel MOSTFT sections are masked with a photoresist layer (not shown in the drawing) and are doped with p-type impurity ions such as $B^+$ at 10 kV and at a dose of $2.7\times10^{11}$ atoms/cm$^2$ to adjust specific resistance. With reference to FIG. 123F, in order to control the concentration of the impurity in the pMOSTFT-forming regions, the nMOSTFT sections are masked with a photoresist layer 60 and are doped with n-type impurity ions 65 such as $P^+$ at 10 kV and at a dose of $1\times10^{11}$ atoms/cm$^2$ to form n-type wells 7A.

With reference to FIG. 130I, $SiO_2$ having a thickness of approximately 200 nm and SiN having a thickness of approximately 100 nm are continuously deposited in this order on the entire surface of the single-crystal silicon layer 7 by a plasma-enhanced CVD process, a high-density plasma-enhanced CVD process or a catalytic CVD process to form a gate insulating film 8. A molybdenum-tantalum (Mo—Ta) alloy film 9 having a thickness of 500 to 600 nm is formed thereon by a sputtering process.

With reference to FIG. 130J, a photoresist pattern 10 is formed in the step difference regions (indented sections) of the TFT sections in the display region and of the TFT sections of the peripheral driving region by any conventional photolithographic process. By continuous etching, gate electrodes 11 of the Mo—Ta alloy and gate insulating films 12 of SiN—$SiO_2$ are formed, and the single-crystal silicon layer 7 is exposed. The Mo—Ta alloy film 9 is etched with an acidic solution, SiN is etched by plasma etching with $CF_4$ gas, and $SiO_2$ is etched with a hydrofluoric acid solution.

With reference to FIG. 130K, all of the nMOSs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 131L:
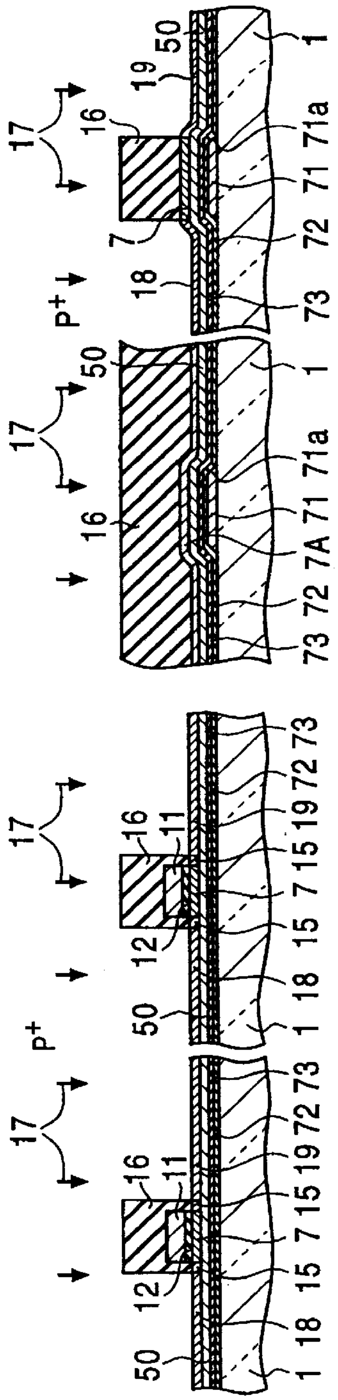

With reference to FIG. 131L, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs.

With reference to FIG. 131M, all of the nMOSTFTs in the peripheral driving region and the display region and the gate sections of the pMOSTFTs in the peripheral driving region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs. In the case of an nMOS peripheral driving circuit, this step is not necessary since the circuit does not have a pMOSTFT.

Figure 131N:
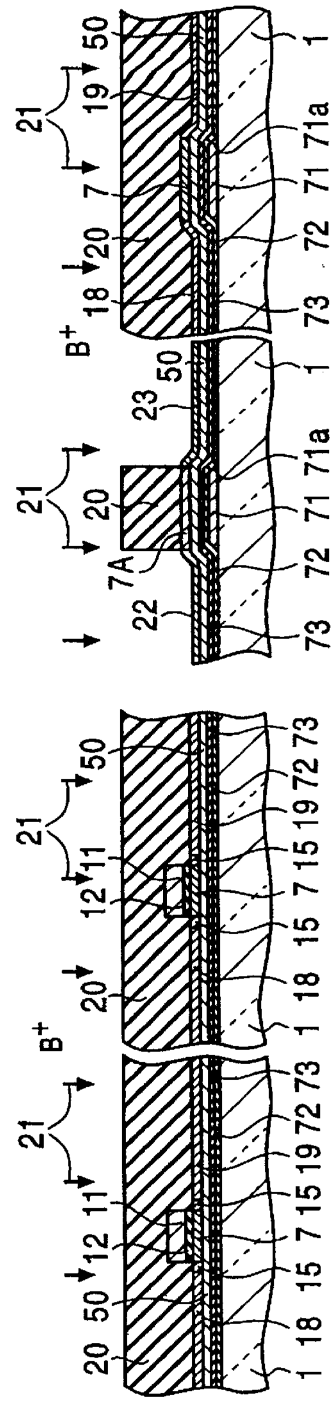
Figure 131N:
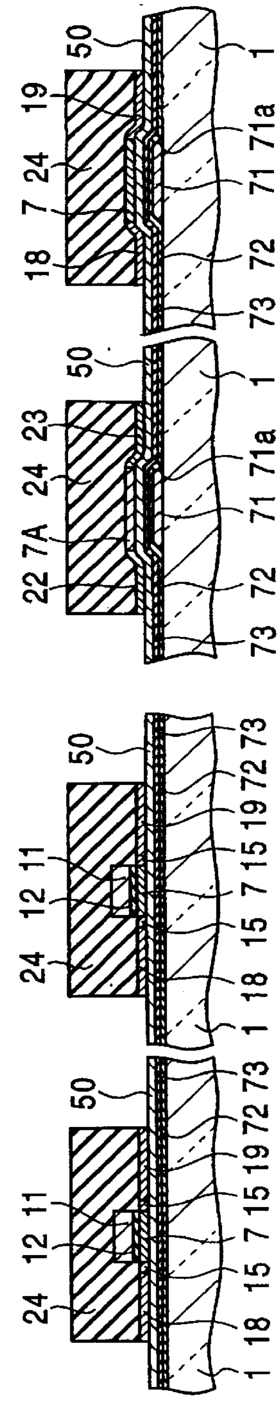

With reference to FIG. 131N, in order to island the active device sections including TFTs and diodes and the passive device sections including resistors and inductors, photoresist layers 24 are provided on all of the active device sections and the passive device sections in the peripheral driving section and the display section, and the single-crystal silicon layer 7 in other sections is removed by a conventional photolithographic process and etching process using a hydrofluoric acid etching solution.

Figure 132O:
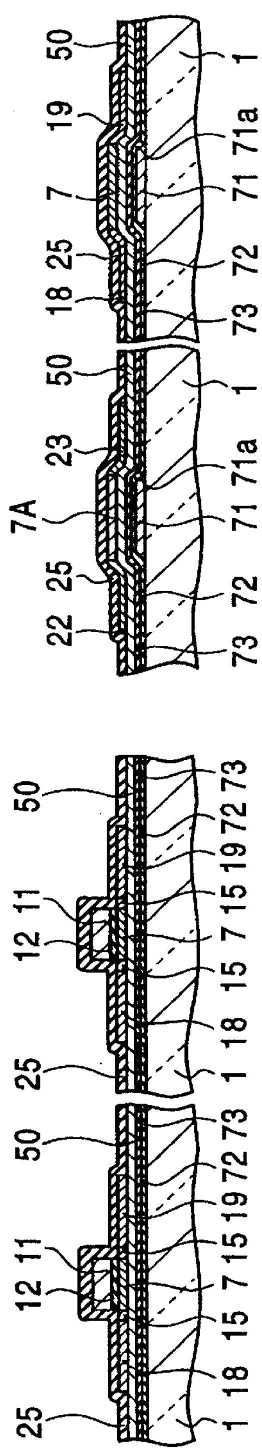

With reference to FIG. 132O, a $SiO_2$ film having a thickness of approximately 200 nm and a phosphosilicate glass (PSG) film having a thickness of approximately 300 nm are continuously deposited in this order to form a protective film 25 on the entire surface by a plasma-enhanced CVD process, a high-density plasma-enhanced CVD process or a catalytic CVD process.

In this state, the single-crystal silicon layer is activated. Since activation is performed at approximately 1,000° C. for approximately 10 seconds using, for example, a halogen lamp or the like, the gate electrode material composed of the Mo—Ta alloy having a high melting point is durable during the annealing for activation. The gate electrode material can thus be used for not only the gate sections but also lead lines over a wide range. In the activation, expensive excimer laser annealing is generally not used. If excimer laser annealing is used, overlapping scanning of 90% or more is preferably performed on the entire surface or selectively the active device sections and the passive device sections using XeCl (wavelength: 308 nm).

Figure 132P:
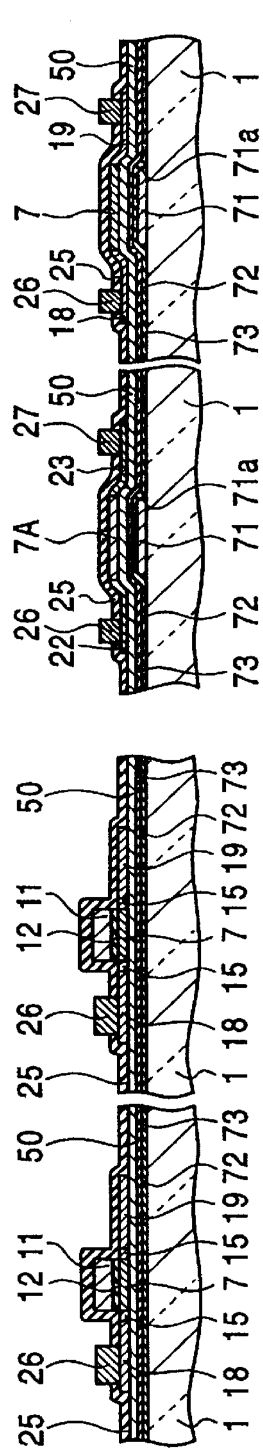

With reference to FIG. 132P, contact holes are formed in all of the source-drain sections of the TFTs in the peripheral driving circuit and the source sections of the TFTs in the display region, by a conventional photolithographic process and an etching process.

A sputtered film of aluminum or an aluminum alloy containing 1% Si, having a thickness of 500 to 600 nm, is formed on the entire surface. By a conventional photolithographic process and an etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Figure 132Q:
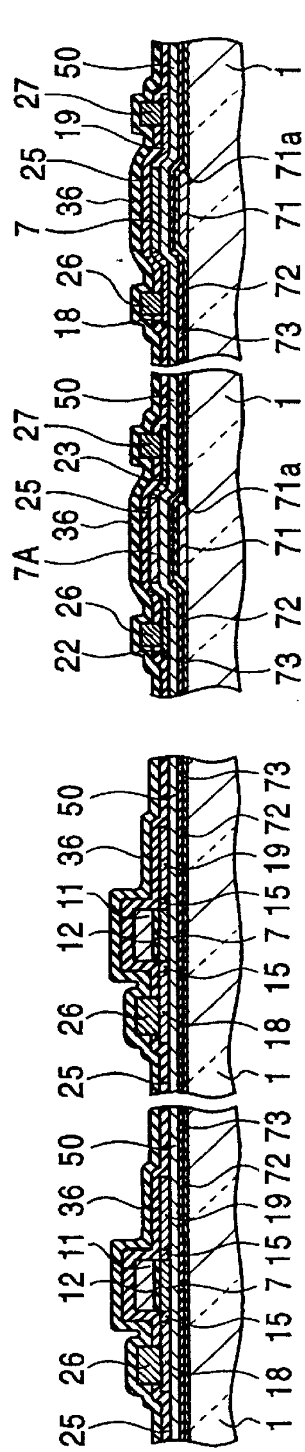

With reference to FIG. 132Q, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed in the drain sections of TFTs in the display region. It is not necessary to remove the $SiO_2$, PSG and SiN films in the pixel sections.

Figures 133R, 133S, 133T:
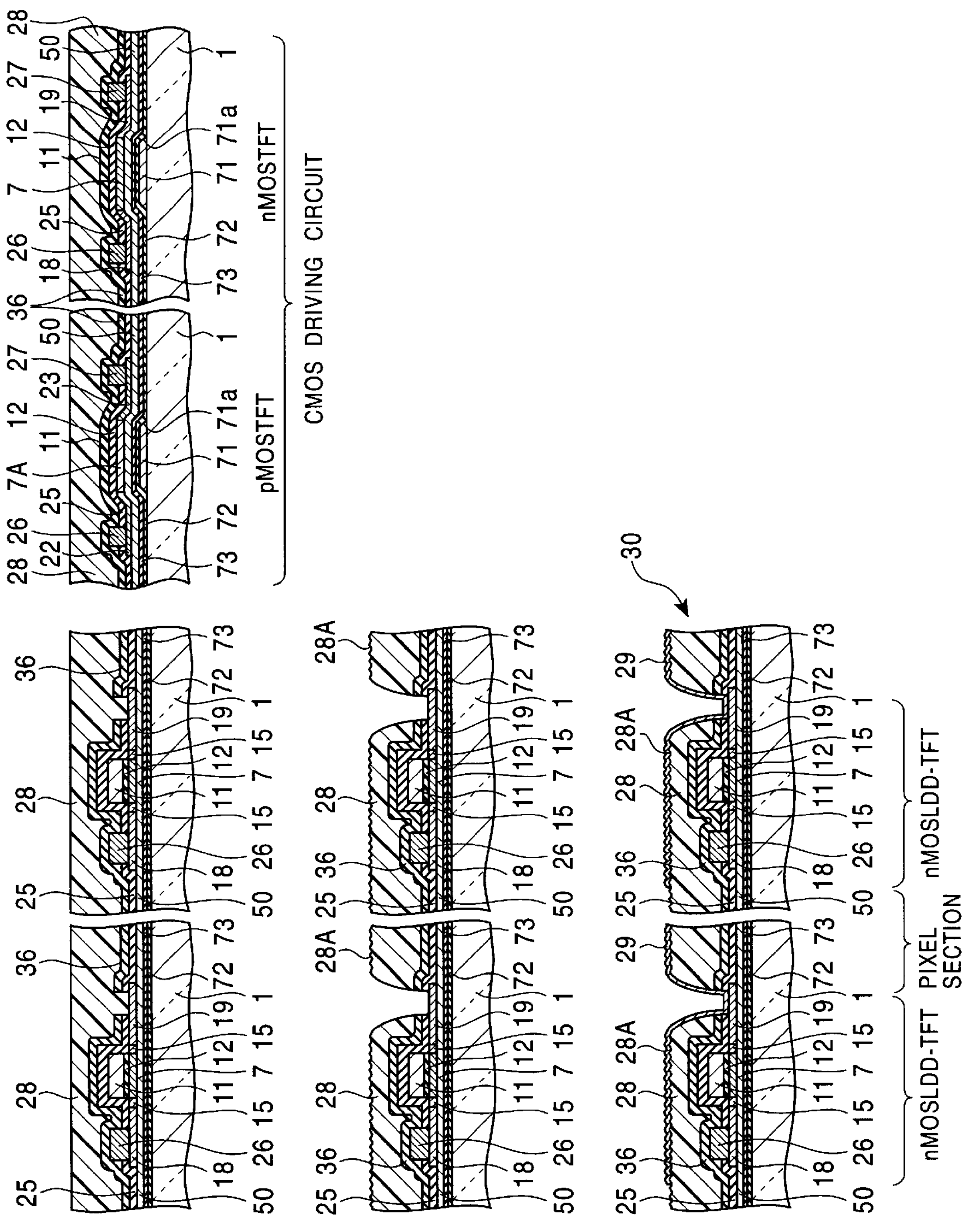

For the same purpose as in the above-described step shown in FIG. 20T, as shown in FIG. 133R, a photosensitive resin film 28 having a thickness of 2 to 3 μm is formed on the entire surface by spin coating. Next, as shown in FIG. 133S, an uneven pattern is formed in at least the pixel region by a conventional photolithographic process and an etching process so that the pixel section has optimized reflective characteristics and viewing-angle characteristics. The uneven pattern is subjected to reflow to form a lower portion of the reflective face of an uneven surface 28A. At the same time, contact holes are formed in the resin film in the drain sections of TFTs in the display region.

With reference to FIG. 133T, a sputtered film of aluminum, aluminum containing 1% Si, or the like, which has a thickness of 400 to 500 nm, is deposited on the entire surface. The sputtered film is removed from regions other than the pixel sections by a general photolithographic process and an etching process to form uneven aluminum reflective sections 29 which are connected to the drain sections 19 of the display TFTs. The reflective sections 29 are used as pixel electrodes for displaying. Next, these are subjected to sintering at approximately 300° C. for 1 hour in a forming gas to achieve sufficient contact. Silver or a silver alloy may be used instead of the aluminum system to increase the reflectance.

As described above, the single-crystal silicon layer 7 is formed by high-temperature heteroepitaxy using the crystalline sapphire thin film 50 as the seed, and CMOS circuits each comprising top-gate nMOSLDD-TFT and bottom-gate pMOSTFT and nMOSTFT are formed in each of the display section and the peripheral-driving-circuit section each comprising the single-crystal silicon layer 7, to produce an active matrix substrate 30 in which the display section and the peripheral-driving-circuit section are integrated.

Figure 134:
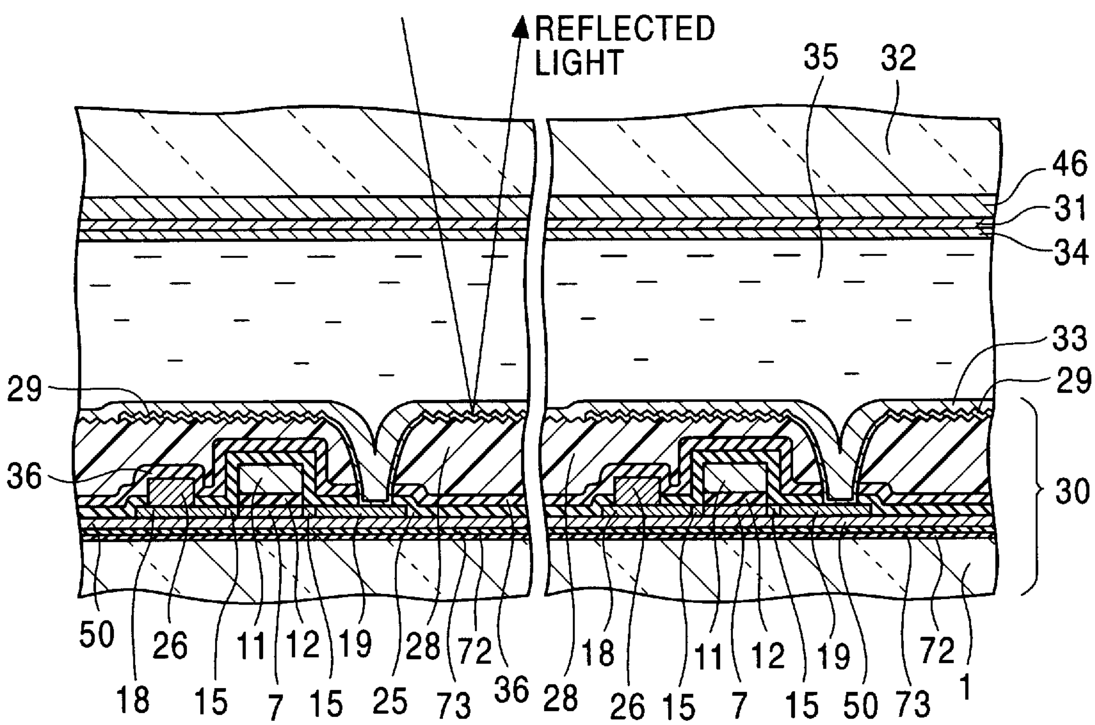
FIG. 134 is a cross-sectional view illustrating a main portion of the liquid crystal display (LCD) in accordance with the thirtieth embodiment of the present invention.

A reflective liquid crystal display (LCD) shown in FIG. 134 is then made using the resulting active-matrix substrate (driving substrate) 30 by the same method described above concerning FIG. 7.

This embodiment apparently has the same advantages as the second embodiment does. In addition, since the single-crystal silicon thin film 7 is heteroepitaxially deposited using the crystalline sapphire thin film 50 formed on the substrate 1 not provided with step differences as a seed, the step of forming the step differences can be omitted and the process can be further simplified. Furthermore, the single-crystal silicon layer 7 is free of discontinued or thin portions.

Thirty-first Embodiment

FIGS. 135A to 141 show a thirty-first embodiment of the present invention.

This embodiment relates to an active-matrix reflective liquid crystal display (LCD) comprising top-gate MOSTFTs in the display section and dual-gate MOSTFTs in the peripheral-driving-circuit section formed by using a single-crystal silicon layer which is heteroepitaxially grown using, as a seed, a material layer (for example, a crystalline sapphire film) formed on a surface of a substrate having no step difference (indented section).

With reference to FIGS. 135A to 141, the active-matrix reflective LCD in this embodiment will be described based on the production steps. In FIGS. 135A to 140T, the left side of each drawing shows the production step of the display section and the right side shows the production step of the peripheral-driving-circuit section.

Figures 135A, 135B, 135C:
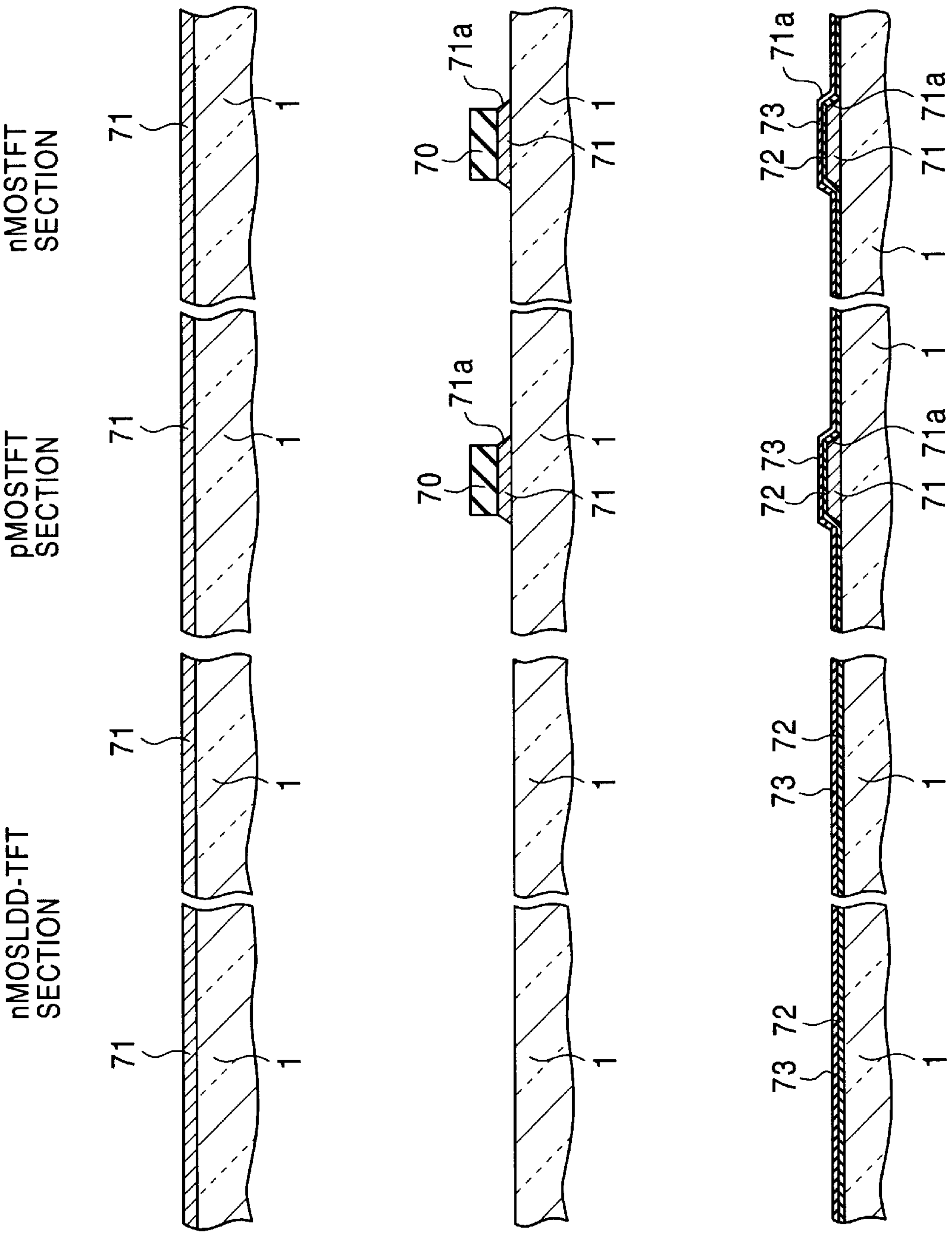
FIGS. 135A to 135C, 136D to 136G, 137H to 137K, 138L to 138N, 139O to 139Q, and 140R to 140T are cross-sectional views illustrating production steps of a liquid crystal display (LCD) in accordance with a thirty-first embodiment of the present invention.

With reference to FIG. 135A, a molybdenum-tantalum alloy film 71 having a thickness of 500 to 600 nm is formed on one main surface of an insulating substrate 1 composed of borosilicate glass, quartz glass, transparent crystalline glass, or the like, by sputtering.

With reference to FIG. 135B, a photoresist layer 70 having a given pattern is formed and the molybdenum-tantalum alloy film 71 is subjected to taper etching using the photoresist layer 70 as a mask to form a gate electrode 71 having a trapezoidal side base 71*a* with an angle of 20 to 45 degree.

With reference to FIG. 135C, after the photoresist layer 70 is removed, a SiN film 72 having a thickness of approximately 100 nm and then a $SiO_2$ film 73 having a thickness of approximately 200 nm are deposited on the substrate 1 including the molybdenum-tantalum alloy film 71 by a plasma-enhanced CVD process to form a gate insulating film.

Figure 136D:
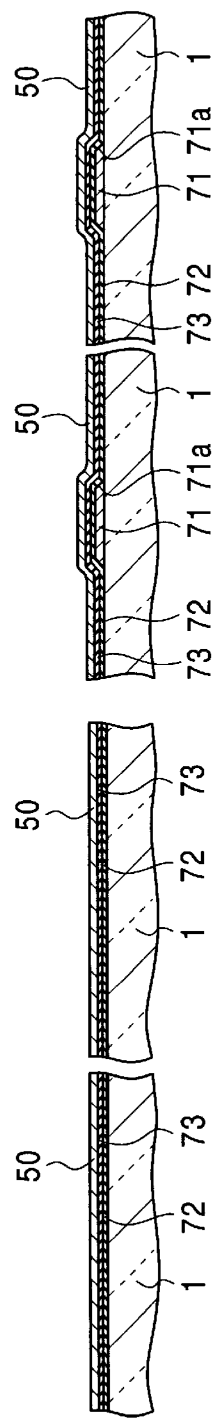

With reference to FIG. 136D, a crystalline sapphire thin film 50 having a thickness of 20 to 200 nm is formed in at least the TFT-forming regions on one main surface of the insulating substrate 1. The crystalline sapphire thin film 50 is formed by oxidative crystallization of a trimethylaluminum gas with an oxidizing gas containing oxygen and moisture by a high-density plasma-enhanced CVD process, a catalytic CVD process (refer to Japanese Unexamined Patent Publication No. 63-40314), or the like. As the insulating substrate 1, a highly-heat-resistant glass substrate having a diameter of 8 to 12 inches and a thickness of 700 to 800 μm can be used.

Figure 136E:
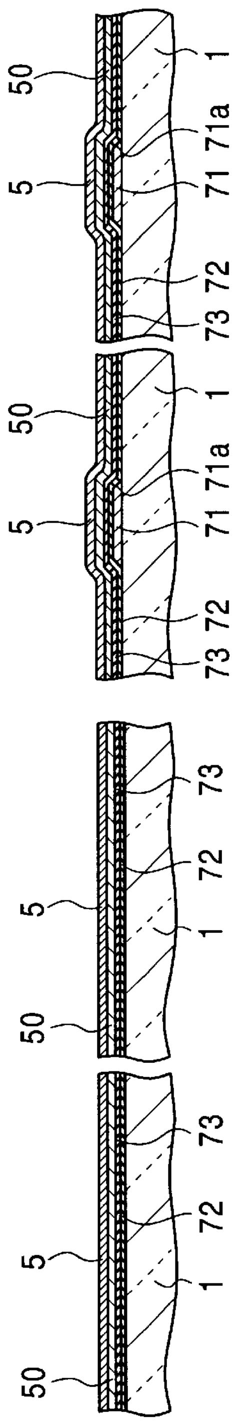

With reference to FIG. 136E, as in FIG. 22F, a polycrystalline silicon film 5 having a thickness of several μm to 0.005 μm, for example, 0.1 μm, is deposited on the entire surface of the crystalline sapphire thin film 50 by a known catalytic CVD process, a plasma-enhanced CVD process, or a sputtering process, at a substrate temperature in the range of 100 to 400° C.

Figure 136F:
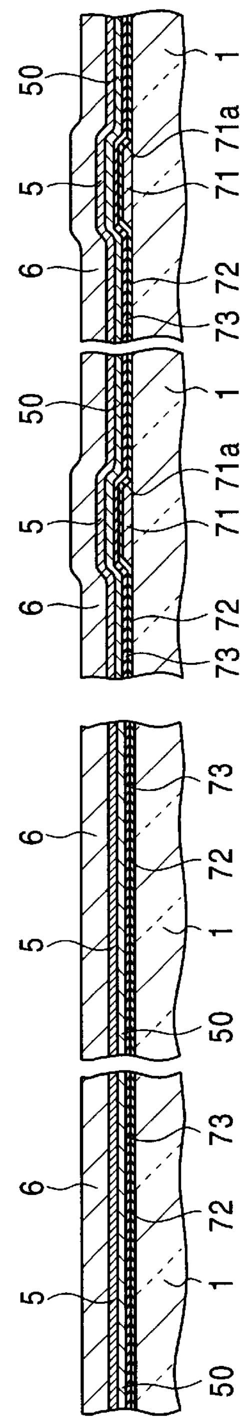

With reference to FIG. 136F, an indium film 6 is formed on the polysilicon film 5 by a MOCVD process, a sputtering process, or a vacuum evaporation process using trimethylindium so that the thickness of the indium film 6 is, for example, 10 to 15 μm which is several ten to several hundred times the thickness of the polycrystalline silicon film 5. Although an indium-gallium layer or gallium layer may be formed in place of the indium film 6, the indium film 6 will be described as a typical example in this embodiment.

The substrate 1 is then heated in a hydrogen-based atmosphere, such as hydrogen, a nitrogen-hydrogen mixture, or an argon-hydrogen mixture to a temperature not higher than 1,000° C., preferably 900 to 930° C. for 5 minutes. The polycrystalline silicon 5 is thereby melted into the melt of the indium film 6. Silicon in the melt precipitates at a temperature significantly lower than the original precipitation temperature. The entire substrate 1 may be uniformly heated using an electrical furnace or the like. Alternatively, predetermined regions, for example, the TFT-forming regions of the substrate 1, may be locally heated using laser, electron beams, or the like.

Figure 136G:
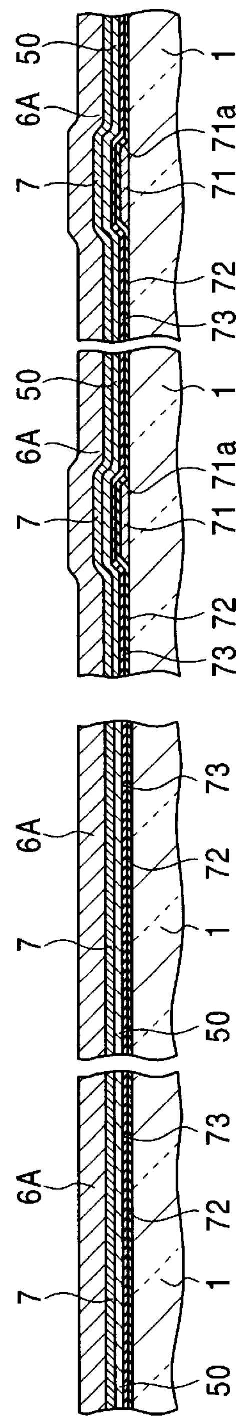

With reference to FIG. 136G, the substrate 1 is then gradually cooled so that silicon dissolved in indium is heteroepitaxially grown by using the crystalline sapphire thin film 50 as a seed to deposit a P-type single-crystal silicon layer 7 having a thickness of, for example, approximately 0.1 μm.

In the thus-deposited single-crystal silicon layer 7, for example, a (100) plane is heteroepitaxially grown on the substrate because the crystalline sapphire film 50 exhibits good lattice matching with single-crystal silicon.

Figure 137H:
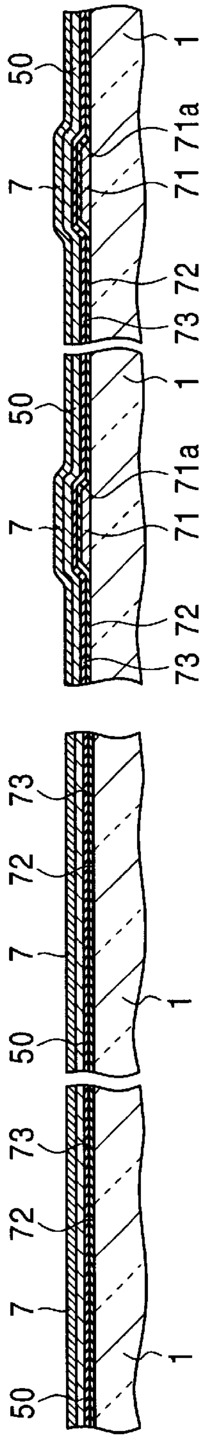

With reference to FIG. 137H, after the single-crystal silicon layer 7 is deposited on the substrate 1 by heteroepitaxy, the indium film 6A deposited on the surface is removed by resolution with hydrochloric acid or sulfuric acid as in the first embodiment to form a top or bottom-gate MOSTFT having a channel region comprising the single-crystal silicon layer 7.

The entire surface of the heteroepitaxially deposited single-crystal silicon layer 7 is doped with a p-type carrier impurity, such as boron, at an adequate concentration to adjust specific resistance. Moreover, the pMOSTFT-forming regions are selectively doped with an n-type carrier impurity to form an N-type well.

More specifically, the p-channel MOSTFT sections are masked with a photoresist layer (not shown in the drawing) and are doped with p-type impurity ions such as $B^+$ at 10 kV and at a dose of $2.7\times10^{11}$ atoms/cm$^2$ to adjust specific resistance. With reference to FIG. 123F, in order to control the concentration of the impurity in the pMOSTFT-forming regions, the nMOSTFT sections are masked with a photoresist layer 60 and are doped with n-type impurity ions 65 such as $P^+$ at 10 kV and at a dose of $1\times10^{11}$ atoms/cm$^2$ to form n-type wells 7A.

Figure 137I:
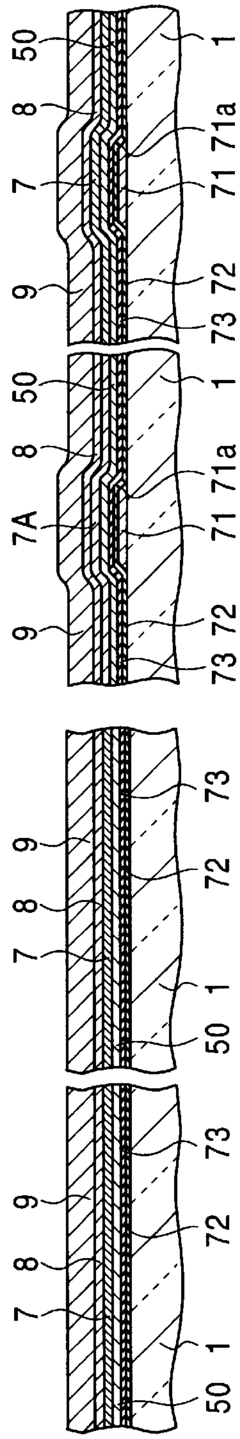

With reference to FIG. 137I, $SiO_2$ having a thickness of approximately 200 nm and SiN having a thickness of approximately 100 nm are continuously deposited in this order on the entire surface of the single-crystal silicon layer 7 by a plasma-enhanced CVD process, a high-density plasma-enhanced CVD process or a catalytic CVD process to form a gate insulating film 8. A molybdenum-tantalum (Mo—Ta) alloy film 9 having a thickness of 500 to 600 nm is formed thereon by a sputtering process.

Figure 137J:
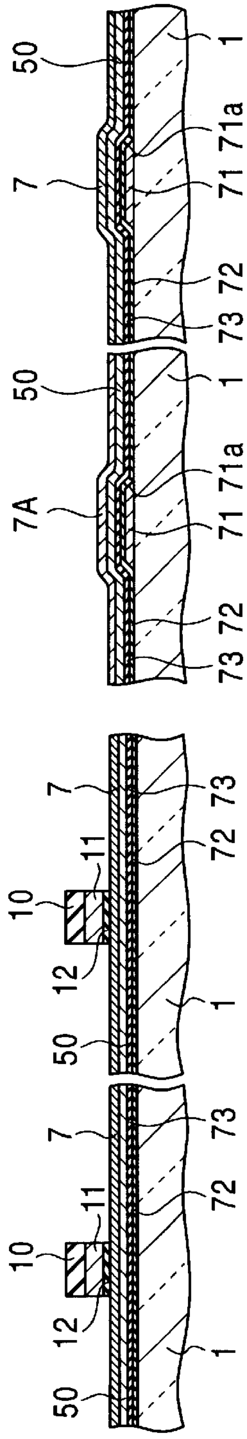

With reference to FIG. 137J, a photoresist pattern 10 is formed in the step difference regions (indented sections) of the TFT sections in the display region and of the TFT sections of the peripheral driving region by any conventional photolithographic process. By continuous etching, gate electrodes 11 of the Mo—Ta alloy and gate insulating films 12 of SiN-$SiO_2$ are formed, and the single-crystal silicon layer 7 is exposed. The Mo—Ta alloy film 9 is etched with an acidic solution, SiN is etched by plasma etching with $CF_4$ gas, and $SiO_2$ is etched with a hydrofluoric acid solution.

Figure 137K:
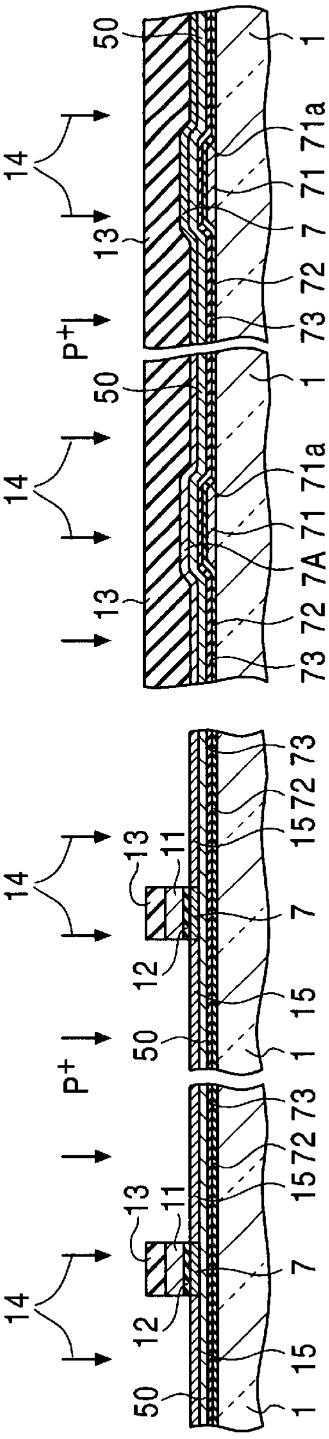

With reference to FIG. 137K, all of the nMOSTFTs and pMOSTFTs in the peripheral driving region and the gate sections of the nMOSTFTs in the display region are covered with a photoresist layer 13. The exposed source and drain regions of the nMOSTFTs are doped with, for example, phosphorus ions 14 by ion implantation at 20 kV and at a dose of $5\times10^{13}$ atoms/cm$^2$ to form LDD sections 15 of an $N^-$-type layer by self-alignment.

Figure 138L:
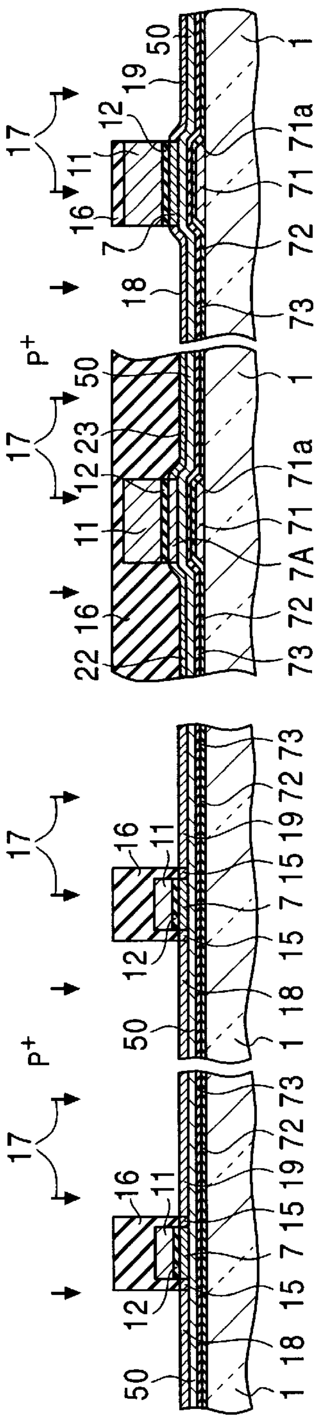

With reference to FIG. 138L, all of the pMOSTFTs in the peripheral driving region, the gate sections of the nMOSTFTs in the peripheral driving region, and the gate sections and the LDD sections of the nMOSTFTs in the display region are covered with a photoresist layer 16. The exposed regions are doped with phosphorus or arsenic ions 17 by ion implantation at 20 kV and at a dose of $5\times10^{15}$ atoms/cm$^2$ to form source sections 18, drain sections 19 and the LDD sections 15 of $N^+$-type layers of the nMOSTFTs.

Figure 138M:
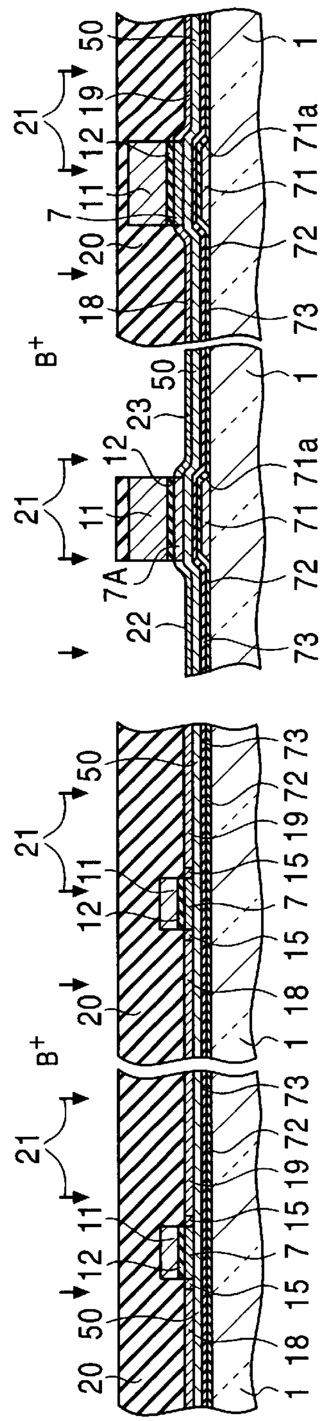

With reference to FIG. 138M, all of the nMOSTFTs in the peripheral driving region and the display region and the gate sections of the pMOSTFTs in the peripheral driving region are covered with a photoresist layer 20. The exposed regions are doped with boron ions 21 by ion implantation at 10 kV and at a dose of $5\times10^{15}$ atoms/cm$^2$ to form source sections 22 and drain sections 23 of $P^+$-type layers of the pMOSTFTs. In the case of an nMOS peripheral driving circuit, this step is not necessary since the circuit does not have a pMOSTFT.

Figure 138N:
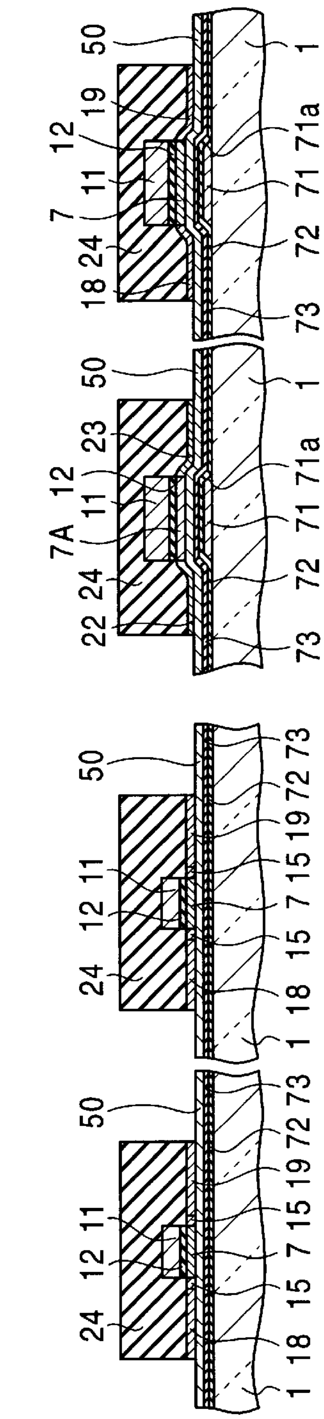

With reference to FIG. 138N, in order to island the active device sections including TFTs and diodes and the passive device sections including resistors and inductors, photoresist layers 24 are provided on all of the active device sections and the passive device sections in the peripheral driving section and the display section, and the single-crystal silicon layer 7 in other sections is removed by a conventional photolithographic process and etching process using a hydrofluoric acid etching solution.

Figure 139O:
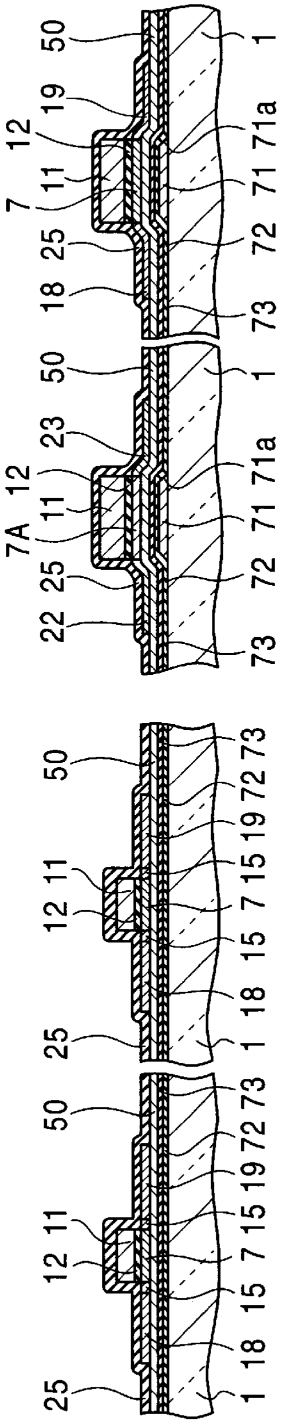

With reference to FIG. 139O, a $SiO_2$ film having a thickness of approximately 200 nm and a phosphosilicate glass (PSG) film having a thickness of approximately 300 nm are continuously deposited in this order to form a protective film 25 on the entire surface by a plasma-enhanced CVD process, a high-density plasma-enhanced CVD process or a catalytic CVD process.

In this state, the single-crystal silicon layer is activated. Since activation is performed at approximately 1,000° C. for approximately 10 seconds using, for example, a halogen lamp or the like, the gate electrode material composed of the Mo—Ta alloy having a high melting point is durable during the annealing for activation. The gate electrode material can thus be used for not only the gate sections but also lead lines over a wide range. In the activation, expensive excimer laser annealing is generally not used. If excimer laser annealing is used, overlapping scanning of 90% or more is preferably performed on the entire surface or selectively the active device sections and the passive device sections using XeCl (wavelength: 308 nm).

Figure 139P:
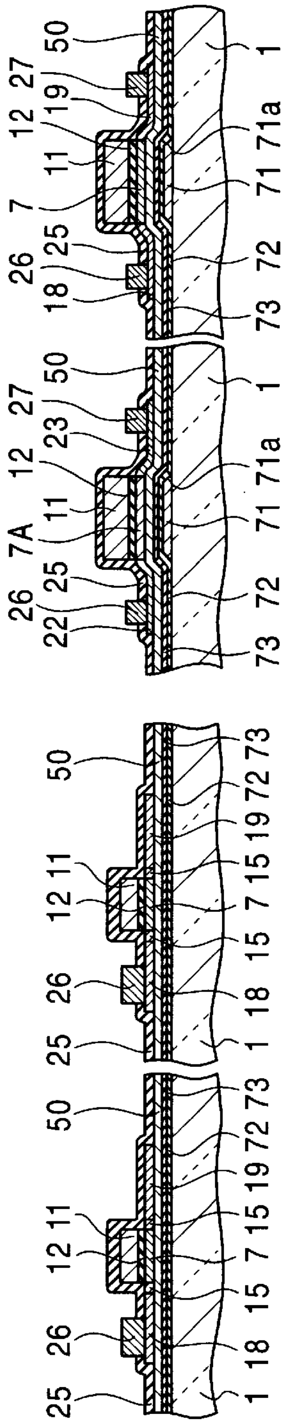

With reference to FIG. 139P, contact holes are formed in all of the source-drain sections of the TFTs in the peripheral driving circuit and the source sections of the TFTs in the display region, by a conventional photolithographic process and an etching process.

A sputtered film of aluminum or an aluminum alloy containing 1% Si, having a thickness of 500 to 600 nm, is formed on the entire surface. By a conventional photolithographic process and an etching process, source electrodes 26 of all TFTs in the peripheral driving circuit section and the display section and drain electrodes 27 in the peripheral driving circuit section are formed, and at the same time, data lines and gate lines are formed. Next, these are subjected to sintering at approximately 400° C. for 1 hour in a forming gas containing nitrogen and hydrogen.

Figure 139Q:
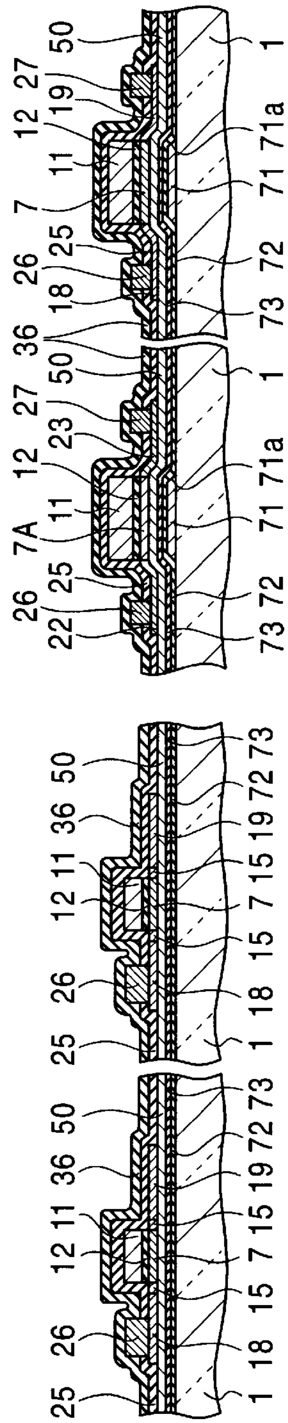

With reference to FIG. 139Q, an insulating film 36 composed of a PSG film with a thickness of approximately 300 nm and a SiN film with a thickness of approximately 300 nm is formed on the entire surface by a plasma-enhanced CVD process, a high-density plasma-enhanced CVD process, or a catalytic CVD process. Next, contact holes are formed in the drain sections of TFTs in the display region. It is not necessary to remove the $SiO_2$, PSG and SiN films in the pixel sections.

Figures 140R, 140S, 140T:
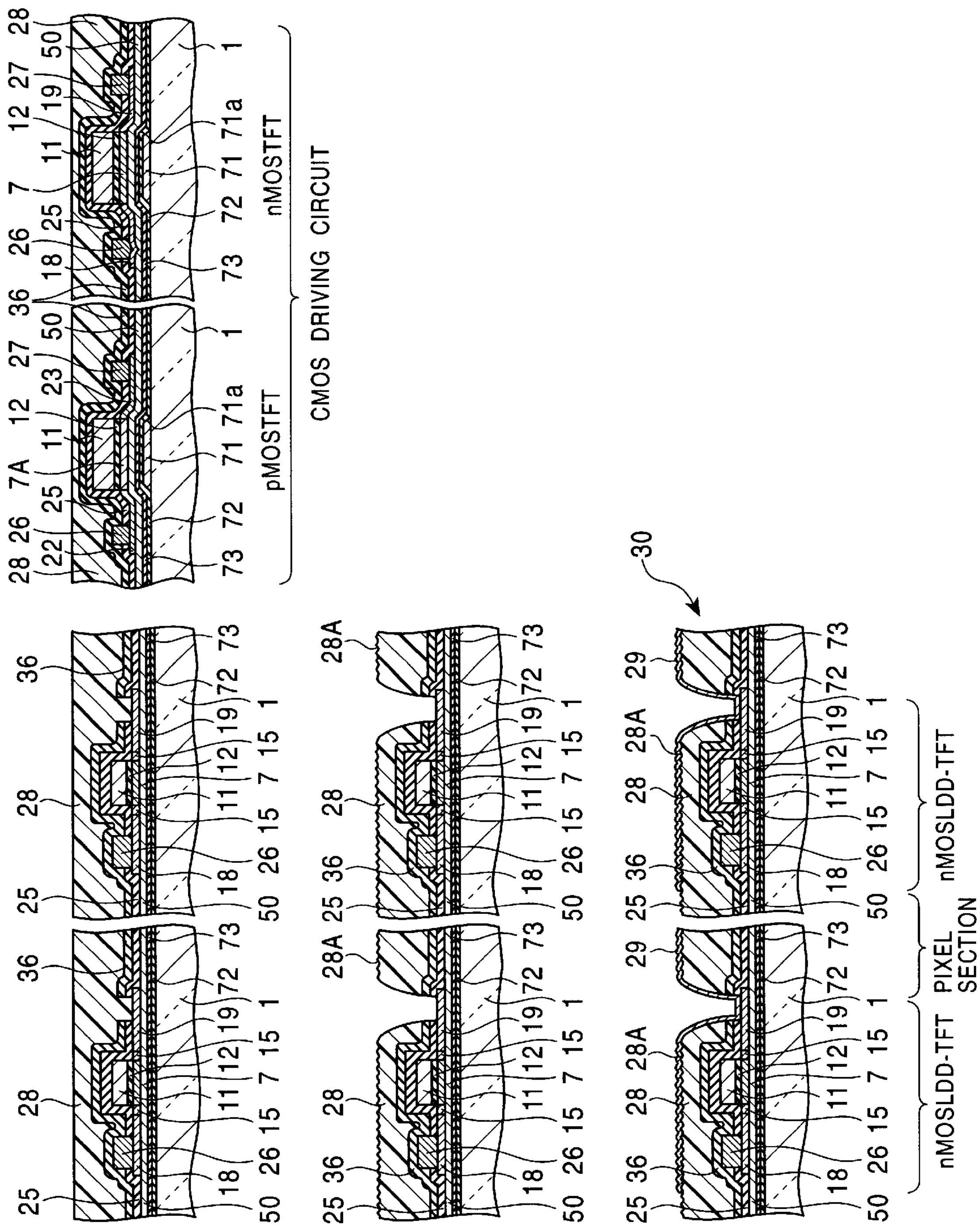

For the same purpose as in the above-described step shown in FIG. 27T, as shown in FIG. 140R, a photosensitive resin film 28 having a thickness of 2 to 3 $\mu$m is formed on the entire surface by spin coating. Next, as shown in FIG. 140S, an uneven pattern is formed in at least the pixel region by a conventional photolithographic process and an etching process so that the pixel section has optimized reflective characteristics and viewing-angle characteristics. The uneven pattern is subjected to reflow to form a lower portion of the reflective face of an uneven surface 28A. At the same time, contact holes are formed in the resin film in the drain sections of TFTs in the display region.

With reference to FIG. 140T, a sputtered film of aluminum, aluminum containing 1% Si, or the like, which has a thickness of 400 to 500 nm, is deposited on the entire surface. The sputtered film is removed from regions other than the pixel sections by a general photolithographic process and an etching process to form uneven aluminum reflective sections 29 which are connected to the drain sections 19 of the display TFTs. The reflective sections 29 are used as pixel electrodes for displaying. Next, these are subjected to sintering at approximately 300° C. for 1 hour in a forming gas to achieve sufficient contact. Silver or a silver alloy may be used instead of the aluminum system to increase the reflectance.

As described above, the single-crystal silicon layer 7 is formed by high-temperature heteroepitaxy using the crystalline sapphire thin film 50 as the seed, and CMOS circuits each comprising top-gate nMOSLDD-TFT and dual-gate pMOSTFT and nMOSTFT are formed in each of the display section and the peripheral-driving-circuit section each comprising the single-crystal silicon layer 7, to produce an active matrix substrate 30 in which the display section and the peripheral-driving-circuit section are integrated.

Figure 141:
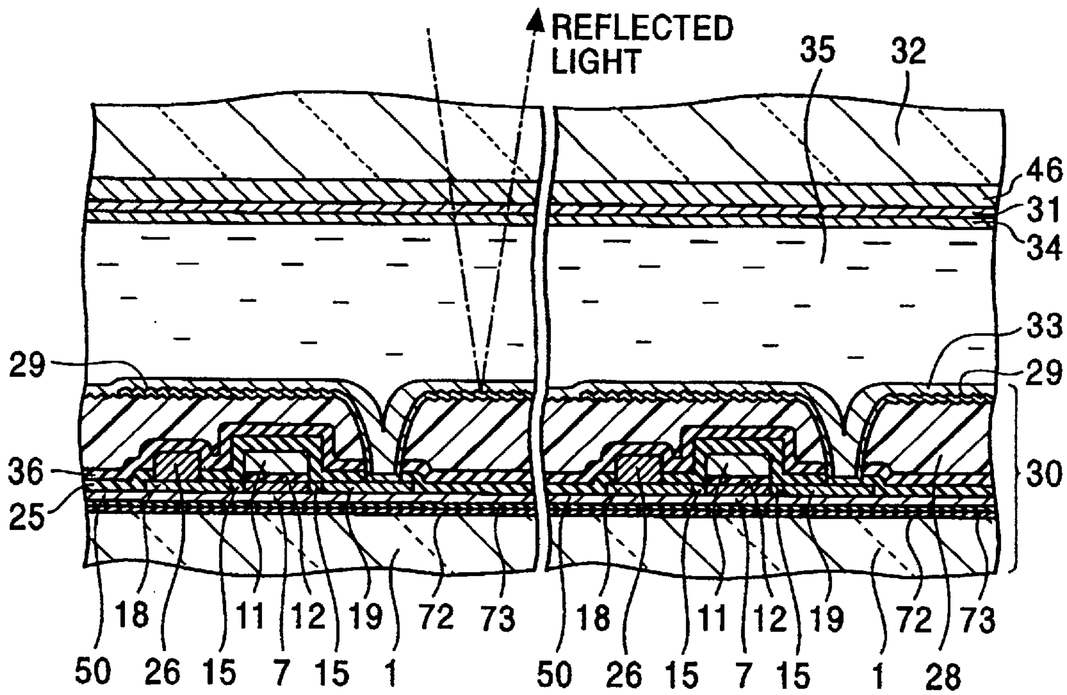
FIG. 141 is a cross-sectional view illustrating a main portion of the liquid crystal display (LCD) in accordance with the thirty-first embodiment of the present invention.

A reflective liquid crystal display (LCD) shown in FIG. 141 is then made using the resulting active-matrix substrate (driving substrate) 30 by the same method described above concerning FIG. 27.

This embodiment apparently has the same advantages as the third embodiment does. In addition, since the single-crystal silicon thin film 7 is heteroepitaxially deposited using the crystalline sapphire thin film 50 formed on the substrate 1 not provided with step differences as a seed, the step of forming the step differences can be omitted and the process can be further simplified. Furthermore, the single-crystal silicon layer 7 is free of discontinued or thin portions.

Thirty-second Embodiment

Figure 142B:
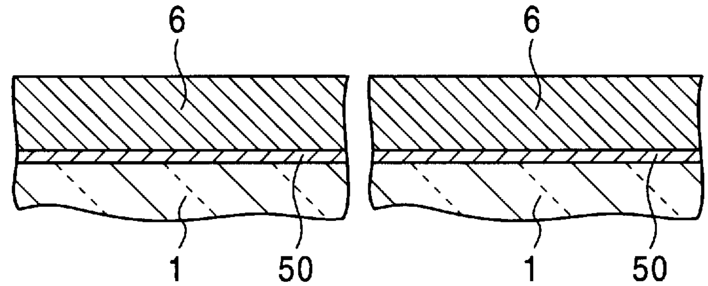
FIGS. 142B to 142D are cross-sectional views illustrating production steps of a liquid crystal display (LCD) in accordance with a thirty-second embodiment of the present invention.
Figure 142C:
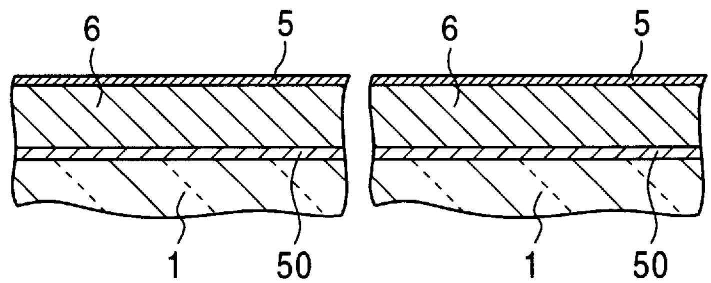
Figure 142D:
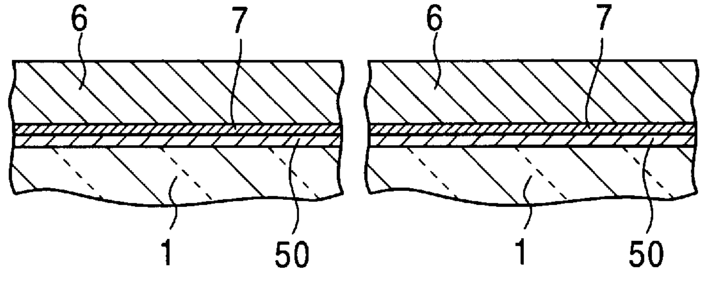

FIGS. 142B to 142D show a thirty-second embodiment of the present invention.

This embodiment is similar to the method of making active-matrix reflective liquid crystal display (LCD) according to the above-described twenty-ninth embodiment. Unlike the twenty-ninth embodiment, an indium film 6 having a thickness of 10 to 20 μm is formed on the entire surface by a sputtering process or a vacuum evaporation process after the step shown in FIG. 122A, as shown in FIG. 142B.

With reference to FIG. 142C, an amorphous silicon film 5 having a thickness of several μm to 0.005 μm (for example, 0.1 μm) is formed on the indium film 6 by a known plasma-enhanced CVD process.

Since the temperature for forming the silicon film must not significantly exceed the melting point of the low-melting-point metal 6 (156° C. for indium or 29.77° C. for gallium), this temperature is lower than the temperature (600° C. to 650° C.) suitable for the formation of the polycrystalline silicon film. Thus, the amorphous silicon film 5 is formed on the indium film 6 by a plasma-enhanced CVD process.

The substrate 1 is heated in a hydrogen atmosphere to 1,000° C. or less (particularly 900 to 930° C.) for approximately 5 minutes so that the amorphous silicon film 5 is dissolved in the indium melt.

With reference to FIG. 142D, the substrate 1 is gradually cooled so that the silicon dissolved in the indium melt is deposited by heteroepitaxy on the substrate 1 using the crystalline sapphire thin film 50 as a seed. A single-crystal silicon layer 7 having a thickness of approximately 0.1 μm is thereby formed.

In the thus-deposited single-crystal silicon layer 7, a (100) plane is heteroepitaxially grown on the substrate, as in the above-described embodiments.

After the single-crystal silicon layer 7 is deposited on the substrate 1 by heteroepitaxy, the indium film 6A deposited on the surface is removed by resolution with hydrochloric acid or sulfuric acid and the post-treatment of the single-crystal silicon layer 7 is performed as in the above-described twenty-ninth embodiment, so as to make TFTs in the display region and the peripheral driving region.

In this embodiment, heating and cooling is performed after formation of the low-melting-point metal layer 6 on the crystalline sapphire thin film and after the formation of the amorphous silicon layer 5 on the low-melting-point metal layer 6. Still, single-crystal silicon can be grown by heteroepitaxy from the melt of the low-melting-point metal, as in the above-described embodiments.

Thirty-third Embodiment

Figure 143E:
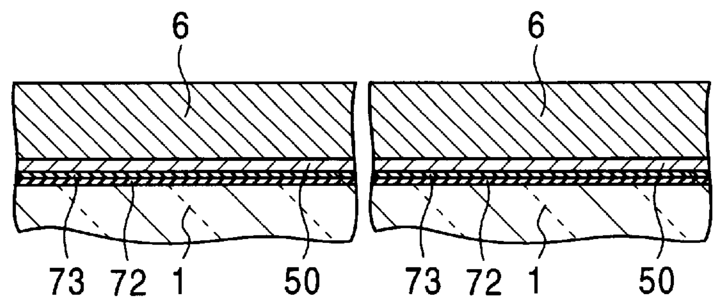
FIGS. 143E to 143G are cross-sectional views illustrating production steps of a liquid crystal display (LCD) in accordance with a thirty-third embodiment of the present invention.
Figure 143F:
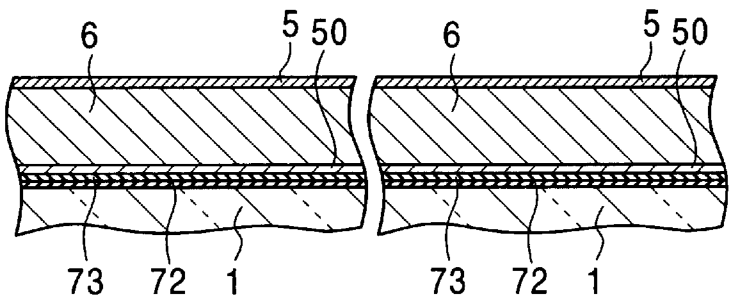
Figure 143G:
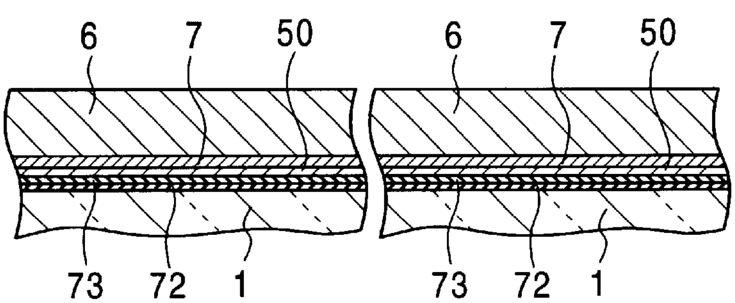

FIGS. 143E to 143G show a thirty-third embodiment of the present invention.

This embodiment is similar to the method of making active-matrix reflective liquid crystal display (LCD) according to the above-described thirtieth and thirty-first embodiments. Unlike the these embodiments, an indium film 6 having a thickness of 10 to 20 μm is formed on the entire surface by a sputtering process or a vacuum evaporation process after the step shown in FIGS. 129D and 136D, as shown in FIG. 143E.

With reference to FIG. 143F, an amorphous silicon film 5 having a thickness of several μm to 0.005 μm (for example, 0.1 μm) is formed on the indium film 6 by a known plasma-enhanced CVD process.

Since the temperature for forming the silicon film must not significantly exceed the melting point of the low-melting-point metal 6 (156° C. for indium or 29.77° C. for gallium), this temperature is lower than the temperature (600° C. to 650° C.) suitable for the formation of the polycrystalline silicon film. Thus, the amorphous silicon film 5 is formed on the indium film 6 by a plasma-enhanced CVD process.

The substrate 1 is heated in a hydrogen atmosphere to 1,000° C. or less (particularly 900 to 930° C.) for approximately 5 minutes so that the amorphous silicon film 5 is dissolved in the indium melt.

With reference to FIG. 143G, the substrate 1 is gradually cooled so that the silicon dissolved in the indium melt is deposited by heteroepitaxy on the substrate 1 using the crystalline sapphire thin film 50 as a seed. A single-crystal silicon layer 7 having a thickness of approximately 0.1 μm is thereby formed.

In the thus-deposited single-crystal silicon layer 7, a (100) plane is heteroepitaxially grown on the substrate, as in the above-described embodiments.

After the single-crystal silicon layer 7 is deposited on the substrate 1 by heteroepitaxy, the indium film 6A deposited on the surface is removed by resolution with hydrochloric acid or sulfuric acid and the post-treatment of the single-crystal silicon layer 7 is performed as in the above-described thirtieth and thirty-first embodiments, so as to make TFTs in the display region and the peripheral driving region.

In this embodiment, heating and cooling is performed after formation of the low-melting-point metal layer 6 on the crystalline sapphire thin film and after the formation of the amorphous silicon layer 5 on the low-melting-point metal layer 6. Still, single-crystal silicon can be grown by heteroepitaxy from the melt of the low-melting-point metal, as in the above-described embodiments.

Thirty-fourth Embodiment

Figure 144B:
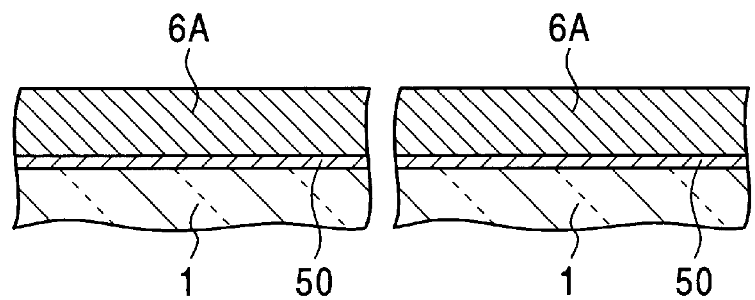
FIGS. 144B and 144C are cross-sectional views illustrating production steps of a liquid crystal display (LCD) in accordance with a thirty-fourth embodiment of the present invention.
Figure 144C:
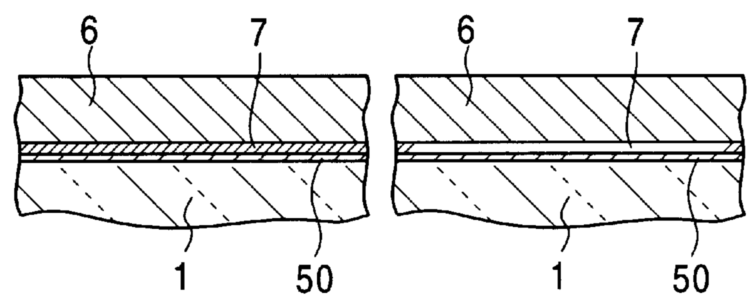

FIGS. 144B and 144C show a thirty-fourth embodiment of the present invention.

Like the twenty-ninth embodiment, this embodiment also describes an active-matrix reflective LCD. With reference to FIG. 144B, in this embodiment, after the step shown in FIG. 122A, for example, an indium film 6A having a thickness of 10 to 20 μm and containing a given amount (for example approximately 1 percent by weight) of silicon is formed on the entire surface of the crystalline sapphire thin-film 50 by a sputtering process or a vacuum evaporation process.

The substrate 1 is maintained in a hydrogen atmosphere at 1,000° C. or less (particularly 900 to 930° C.) for approximately 5 minutes so that the silicon is dissolved in the indium melt.

With reference to FIG. 144C, the substrate 1 is gradually cooled so that the silicon dissolved in the indium melt is deposited by heteroepitaxy using the crystalline sapphire thin-film 50 as a seed. A single-crystal silicon layer 7 having a thickness of approximately 0.1 μm is thereby formed.

Also, in this case, the (100) plane of the single-crystal silicon layer 7 is deposited by heteroepitaxy.

After the deposition of the single-crystal silicon layer 7 by heteroepitaxy, indium at the surface is removed by hydrochloric acid as in the twenty-ninth embodiment, and each TFT in the display section and the peripheral-driving-circuit section is produced by the steps for treating the single-crystal silicon layer 7.

In this embodiment, the low-melting-point metal layer 6A containing silicon is formed on the crystalline sapphire thin-film 50, and is melted by heat. Single-crystal silicon can also be formed by heteroepitaxy from the melt of the low-melting-point metal.

Thirty-fifth Embodiment

Figure 145E:
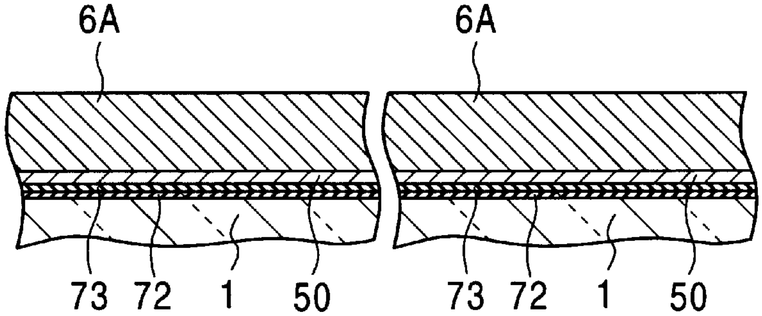
FIGS. 145E and 145F are cross-sectional views illustrating production steps of a liquid crystal display (LCD) in accordance with a thirty-fifth embodiment of the present invention.
Figure 145F:
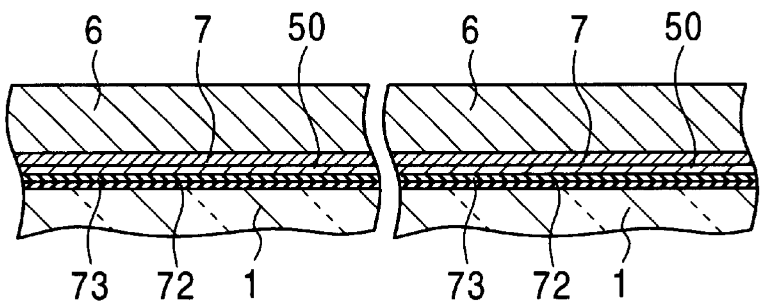

FIGS. 145E and 145F show a thirty-fifth embodiment of the present invention.

Like the thirtieth embodiment or the thirty-first embodiment, this embodiment also describes an active-matrix reflective LCD. With reference to FIG. 145E, in this embodiment, after the step shown in FIG. 129D in the thirtieth embodiment or 136D in the thirty-first embodiment, for example, an indium film 6A having a thickness of 10 to 20 μm and containing a given amount (for example approximately 1 percent by weight) of silicon is formed on the entire surface of the crystalline sapphire thin-film 50 by a sputtering process or a vacuum evaporation process.

The substrate 1 is maintained in a hydrogen atmosphere at 1,000° C. or less (particularly 900 to 930° C.) for approximately 5 minutes so that the silicon is dissolved in the indium melt.

With reference to FIG. 145F, the substrate 1 is gradually cooled so that the silicon dissolved in the indium melt is deposited by heteroepitaxy using the crystalline sapphire thin-film 50 as a seed. A single-crystal silicon layer 7 having a thickness of approximately 0.1 μm is thereby formed.

Also, in this case, the (100) plane of the single-crystal silicon layer 7 is deposited by heteroepitaxy.

After the deposition of the single-crystal silicon layer 7 by heteroepitaxy, indium at the surface is removed by hydrochloric acid as in the thirtieth embodiment or the thirty-first embodiment, and each TFT in the display section and the peripheral-driving-circuit section is produced by the steps for treating the single-crystal silicon layer 7.

In this embodiment, the low-melting-point metal layer 6A containing silicon is formed on the crystalline sapphire thin-film 50, and is melted by heat. Single-crystal silicon can also be formed by heteroepitaxy from the melt of the low-melting-point metal.

Thirty-sixth Embodiment

FIGS. 146P to 148R show a thirty-sixth embodiment of the present invention.

Unlike the above-mentioned twenty-ninth embodiment, the thirty-sixth embodiment relates to a transmissive LCD in which each of the display section and the peripheral driving circuit section comprises top-gate MOSTFTs. Namely, after the same steps as those shown in FIG. 122A to FIG. 125O in the twenty-ninth embodiment are repeated, with reference to FIG. 146P, contact holes 19 of the drain sections for TFTs in the display section are formed in insulating films 25 and 36. At the same time, unnecessary $SiO_2$ film, PSG film and SiN film in the pixel-opening sections are removed to improve the transmittance.

Figure 146P:
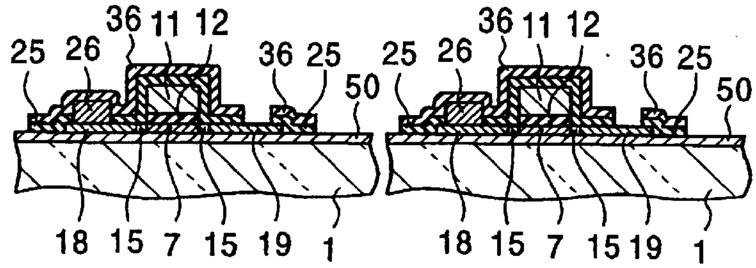
FIGS. 146P to 146R are cross-sectional views illustrating production steps of a liquid crystal display (LCD) in accordance with a thirty-sixth embodiment of the present invention.
Figure 146Q:
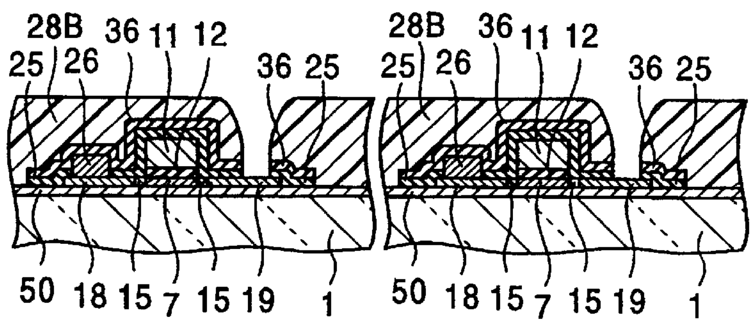

With reference to FIG. 146Q, a planarization film 28B, which is composed of an acrylic photosensitive transparent resin and has a thickness of 2 to 3 μm, is formed on the entire surface by spin coating etc., and then contact holes for drains of TFTs in the display section (display TFTs) are formed in the transparent resin 28B. The transparent resin 28B is cured at a given condition.

Figure 146R:
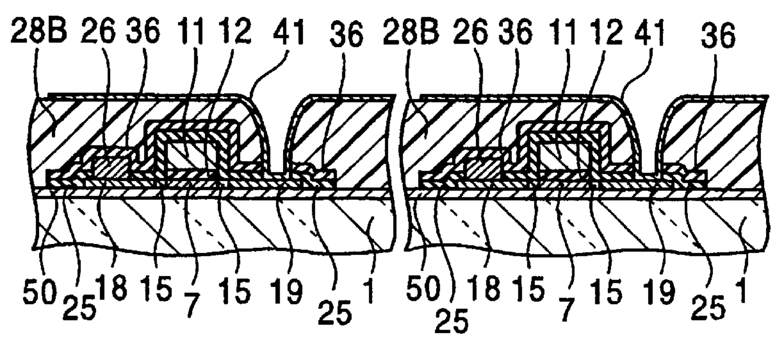

With reference to FIG. 146R, an ITO film having a thickness of 130 to 150 nm is formed on the entire surface by sputtering, and then an ITO transparent electrode 41 in contact with the TFT drain sections 19 in the display region is formed by photolithography and etching. Next, annealing in a forming gas at 200 to 250° C. for 1 hour is performed to reduce the contact resistance between the drain of each TFT in the display section and the ITO and to improve the transparency of the ITO.

Figure 147:
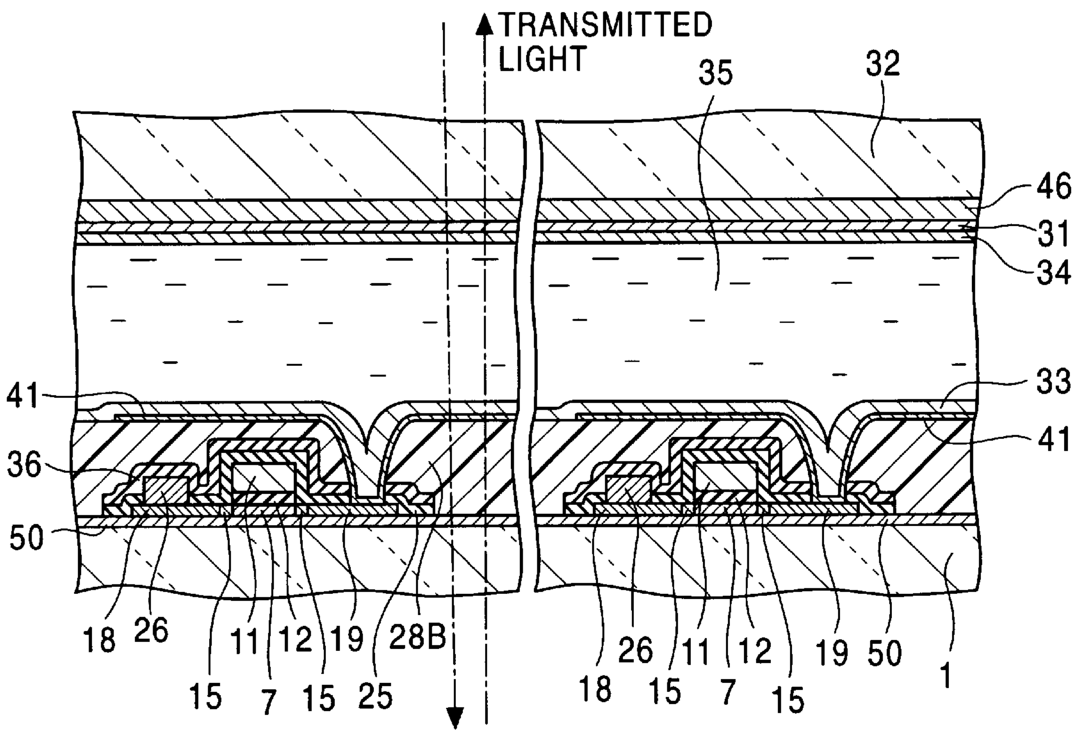
FIG. 147 is a cross-sectional view illustrating a main portion of the liquid crystal display (LCD) in accordance with the thirty-sixth embodiment of the present invention.

With reference to FIG. 147, a transmissive LCD is assembled by combining this TFT substrate 1 and a counter substrate 32 as in the tenth embodiment. In this embodiment, a polarizer is also provided on the TFT substrate. Although transmission light from the TFT substrate 1 is used in this transmissive LCD as shown by a solid line in the drawing, transmission light from the counter substrate 32 may be used.

An on-chip color-filter (OCCF) structure and an on-chip black (OCB) structure may be made from this transmissive LCD, as follows.

Figure 148O:
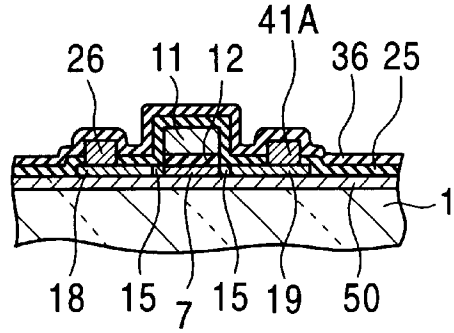
FIGS. 148O to 148R are cross-sectional views illustrating production steps of a liquid crystal display (LCD) in accordance with the thirty-sixth embodiment of the present invention.

After performing the steps shown in FIGS. 122A to 125N, contact holes are also formed at the drain sections of the PSG-$SiO_2$ insulating film 25 as shown in FIG. 148O, and an aluminum layer 41A for drain electrodes is formed. Next, a SiN-PSG insulating film 36 is formed.

Figure 148P:
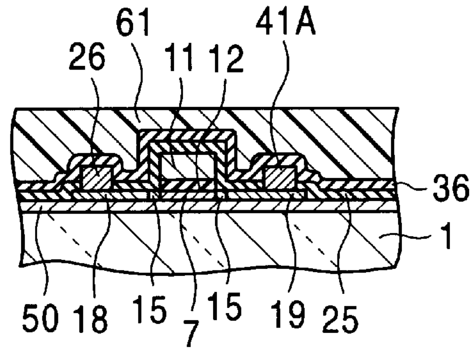
Figure 148Q:
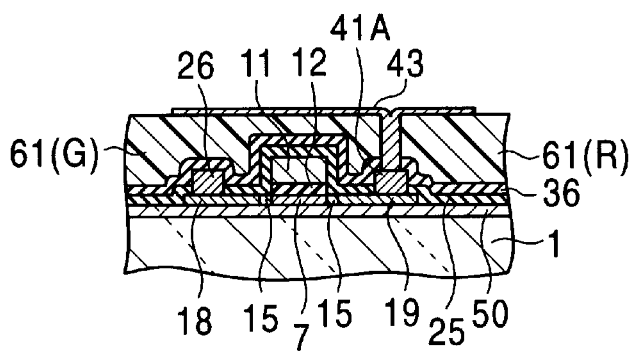

With reference to FIG. 148P, a photoresist layer 61 containing a red, green or blue pigment having a thickness of 1 to 1.5 μm is formed on the corresponding color segments. With reference to FIG. 148Q, color filter layers 61(R), 61(G) and 61(B) are formed by a general photolithographic process (OCCF structure). Contact holes are also formed at the drain sections. An opaque ceramic substrate cannot be used in this embodiment.

With reference to FIG. 148Q, a metal shading layer 43 as a black mask layer is formed over the contact holes connecting to the drains of the display TFTs and over the color filter layer by a patterning process. For example, a molybdenum film having a thickness of 200 to 250 nm is formed by a sputtering process and is then patterned to form a given shape for shading the display TFTs (OCB structure).

Figure 148R:
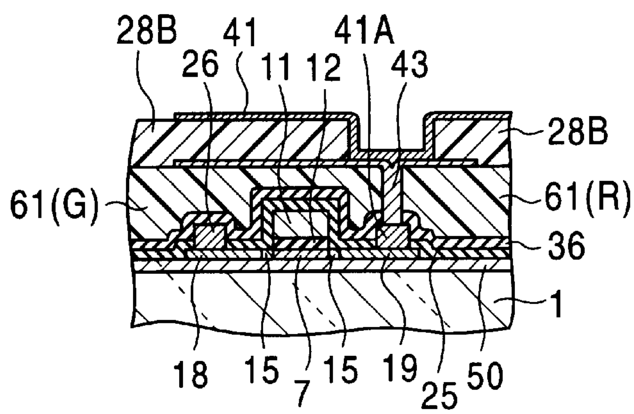

With reference to FIG. 148R, a planarization film 28B composed of a transparent resin is formed, and then an ITO transparent electrode 41 is formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

Thirty-seventh Embodiment

FIGS. 149R to 151T show a thirty-seventh embodiment of the present invention.

Unlike the above-mentioned thirtieth embodiment, the thirty-seventh embodiment relates to a transmissive LCD in which the display section comprises top-gate MOSTFTs, and the peripheral driving circuit section comprises bottom-gate MOSTFTs or dual-gate MOSTFTs. Namely, after the same steps as those shown in FIG. 129A to FIG. 132Q in the thirtieth embodiment or 136D to 139Q in the thirty-first embodiment are repeated, with reference to FIG. 149R, contact holes 19 of the drain sections for TFTs in the display section are formed in insulating films 25 and 36. At the same time, unnecessary $SiO_2$ film, PSG film and SiN film in the pixel-opening sections are removed to improve the transmittance.

Figure 149R:
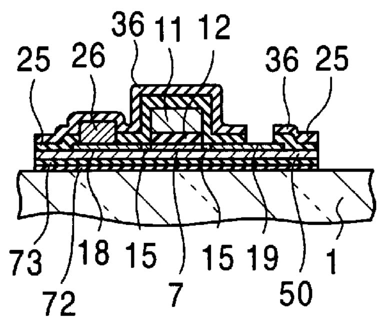
FIGS. 149R to 149T are cross-sectional views illustrating production steps of a liquid crystal display (LCD) in accordance with a thirty-seventh embodiment of the present invention.
Figure 149S:
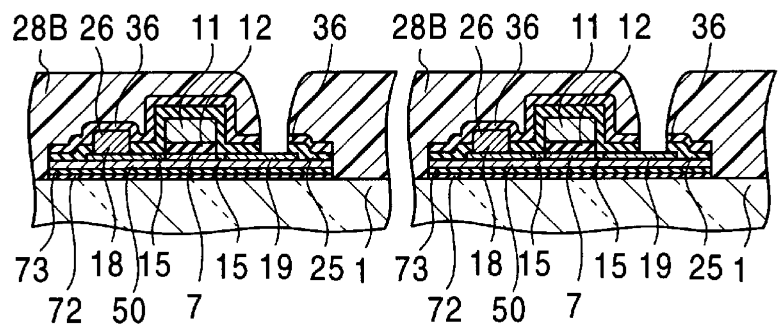

With reference to FIG. 149S, a planarization film 28B, which is composed of an acrylic photosensitive transparent resin and has a thickness of 2 to 3 $\mu$m, is formed on the entire surface by spin coating etc., and then contact holes for drains of TFTs in the display section (display TFTs) are formed in the transparent resin 28B. The transparent resin 28B is cured at a given condition.

Figure 149T:
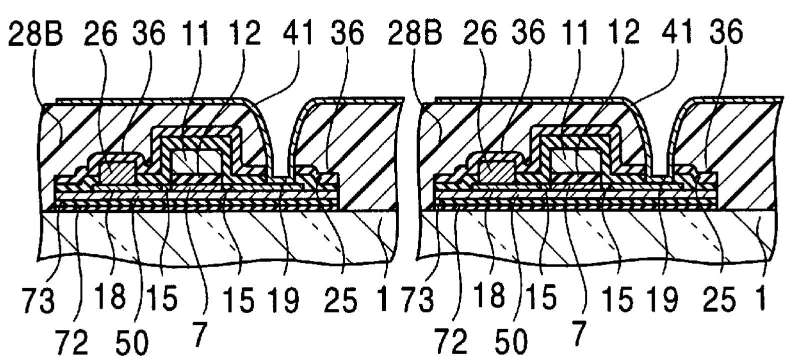

With reference to FIG. 149T, an ITO film having a thickness of 130 to 150 nm is formed on the entire surface by sputtering, and then an ITO transparent electrode 41 in contact with the TFT drain sections 19 in the display region is formed by photolithography and etching. Next, annealing in a forming gas at 200 to 250° C. for 1 hour is performed to reduce the contact resistance between the drain of each TFT in the display section and the ITO and to improve the transparency of the ITO.

Figure 150:
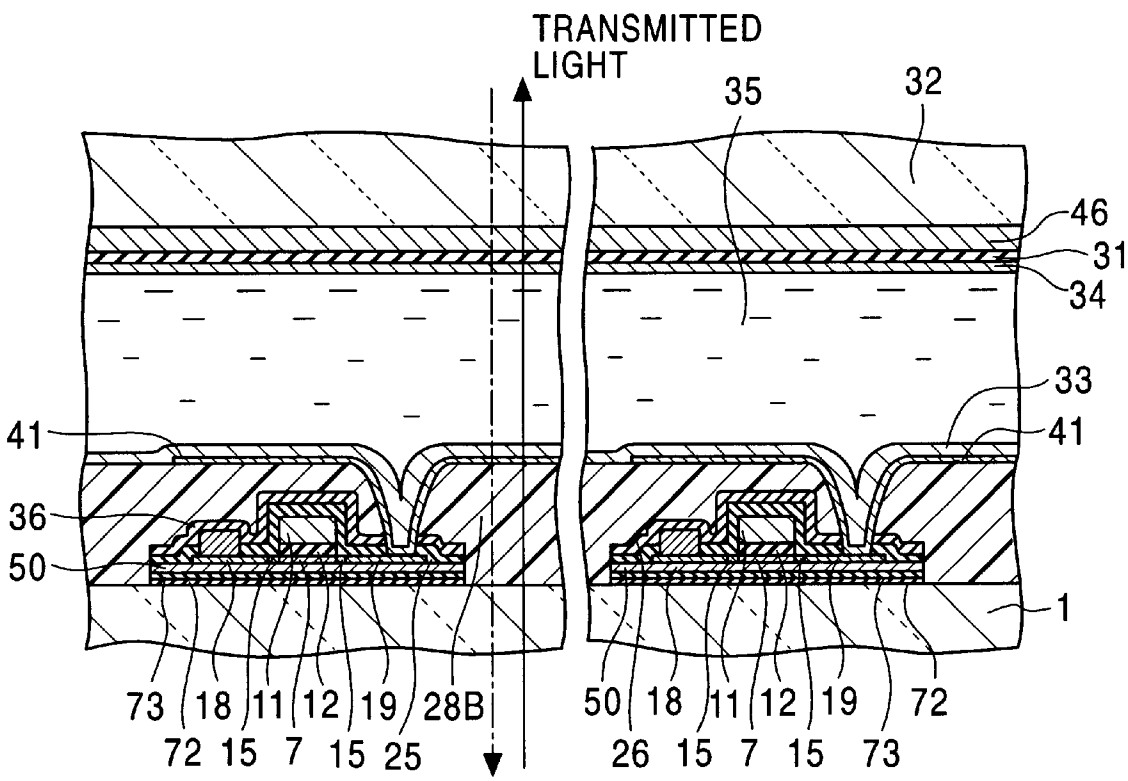
FIG. 150 is a cross-sectional view illustrating a main portion of the liquid crystal display (LCD) in accordance with the thirty-seventh embodiment of the present invention.

With reference to FIG. 150, a transmissive LCD is assembled by combining this TFT substrate 1 and a counter substrate 32 as in the twenty-second embodiment. In this embodiment, a polarizer is also provided on the TFT substrate. Although transmission light from the TFT substrate 1 is used in this transmissive LCD as shown by a solid line in the drawing, transmission light from the counter substrate 32 may be used.

An on-chip color-filter (OCCF) structure and an on-chip black (OCB) structure may be made from this transmissive LCD, as follows.

Figure 151Q:
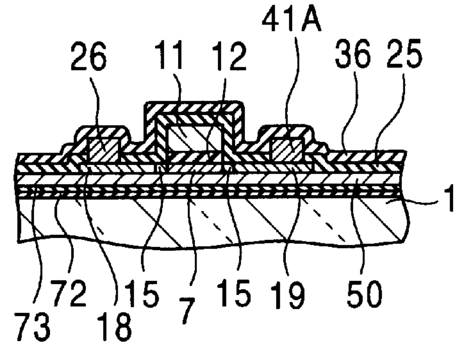
FIGS. 151Q to 151T are cross-sectional views illustrating production steps of a liquid crystal display (LCD) in accordance with the thirty-seventh embodiment of the present invention.

After performing the steps shown in FIGS. 128A to 132P according to the above-mentioned steps, contact holes are also formed at the drain sections of the PSG-$SiO_2$ insulating film 25 as shown in FIG. 151Q, and an aluminum layer 41A for drain electrodes is formed. Next, a SiN-PSG insulating film 36 is formed.

Figure 151R:
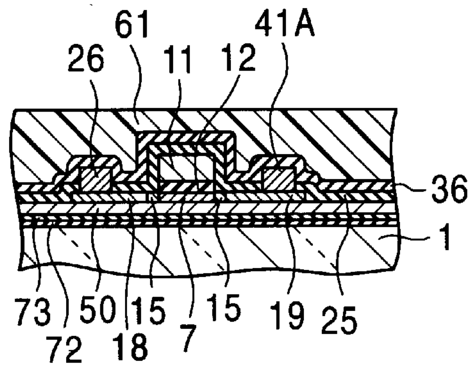
Figure 151S:
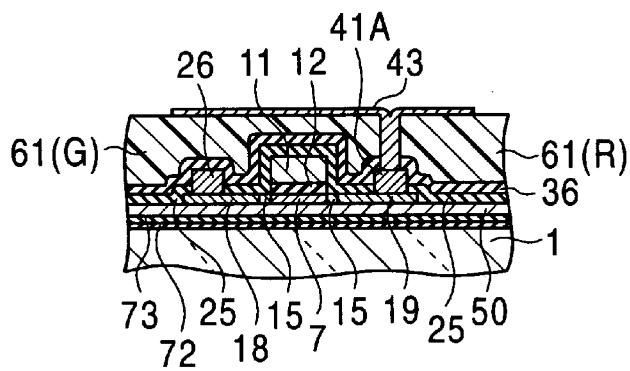

With reference to FIG. 151R, a photoresist layer 61 containing a red, green or blue pigment having a thickness of 1 to 1.5 $\mu$m is formed on the corresponding color segments. With reference to FIG. 151S, color filter layers 61(R), 61(G) and 61(B) are formed by a general photolithographic process (OCCF structure). Contact holes are also formed at the drain sections. An opaque ceramic substrate cannot be used in this embodiment.

With reference to FIG. 151S, a metal shading layer 43 as a black mask layer is formed over the contact holes connecting to the drains of the display TFTs and over the color filter layer by a patterning process. For example, a molybdenum film having a thickness of 200 to 250 nm is formed by a sputtering process and is then patterned to form a given shape for shading the display TFTs (OCB structure).

Figure 151T:
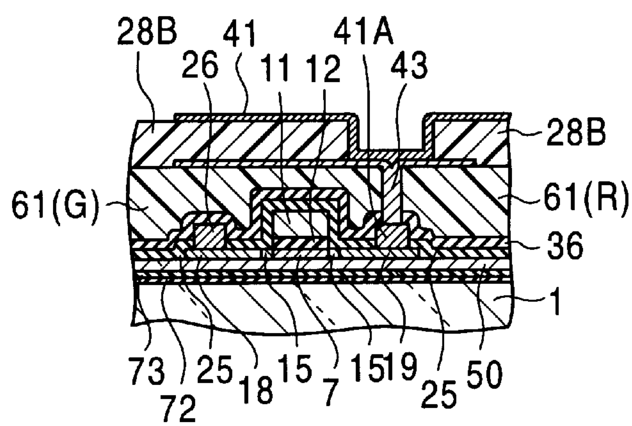

With reference to FIG. 151T, a planarization film 28B composed of a transparent resin is formed, and then an ITO transparent electrode 41 is formed so as to connect to the shading layer 43 through the contact holes provided in the planarization film.

The color filter 61 and the shading layer (black mask) 43 formed on the display array section improves the aperture ratio of the liquid crystal display panel and decreases electrical power consumption of the display module including a back light.

Thirty-eighth Embodiment

FIGS. 152A to 162P show a thirty-eighth embodiment of the present invention.

In this embodiment, the peripheral-driving-circuit section includes a CMOS driving circuit including top-gate pMOSTFTs and nMOSTFTs as in the twenty-ninth embodiment, including bottom-gate pMOSTFTs and nMOSTFTs as in the thirtieth embodiment, or including dual-gate pMOSTFTs and nMOSTFTs as in the thirty-first embodiment. The display section is a reflective type and includes TFTs having various gate configurations.

Figures 152A, 152B, 152C:
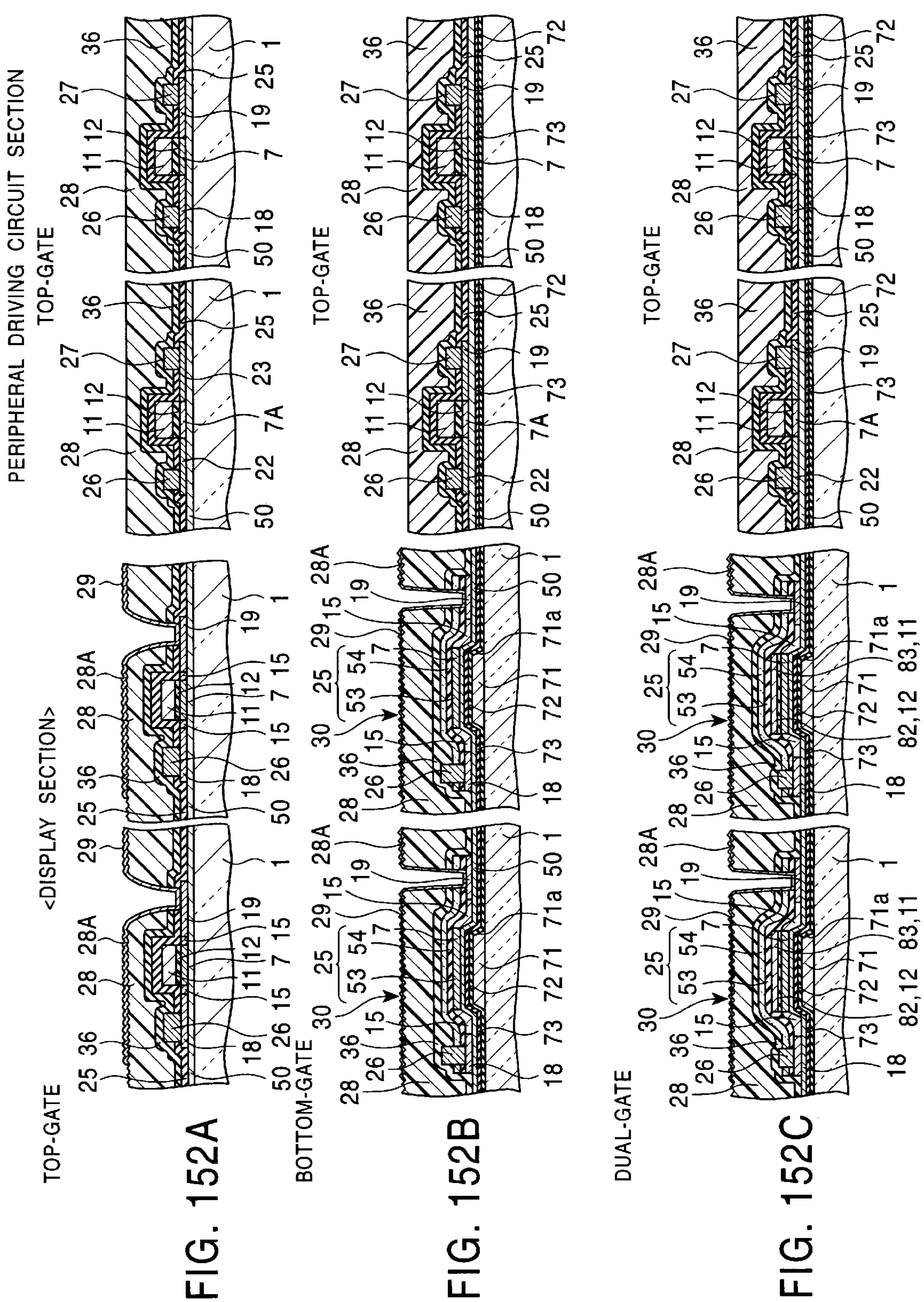
FIGS. 152A to 152C, 153A to 153C, and 154A to 154C are cross-sectional views of main portions in the production steps of the LCDs in accordance with the thirty-eighth embodiment of the present invention.
Figures 153A, 153B, 153C:
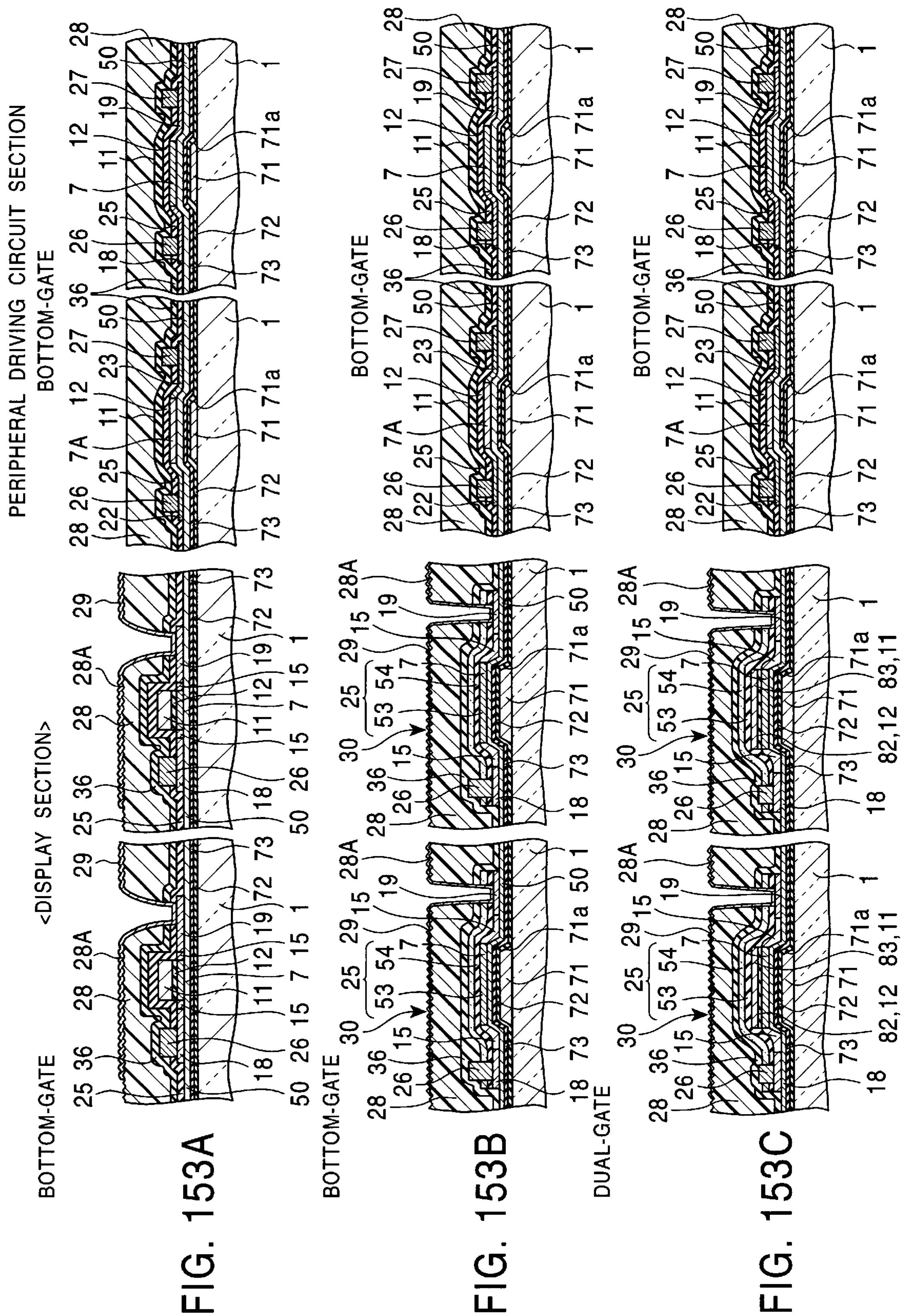
Figures 154A, 154B, 154C:
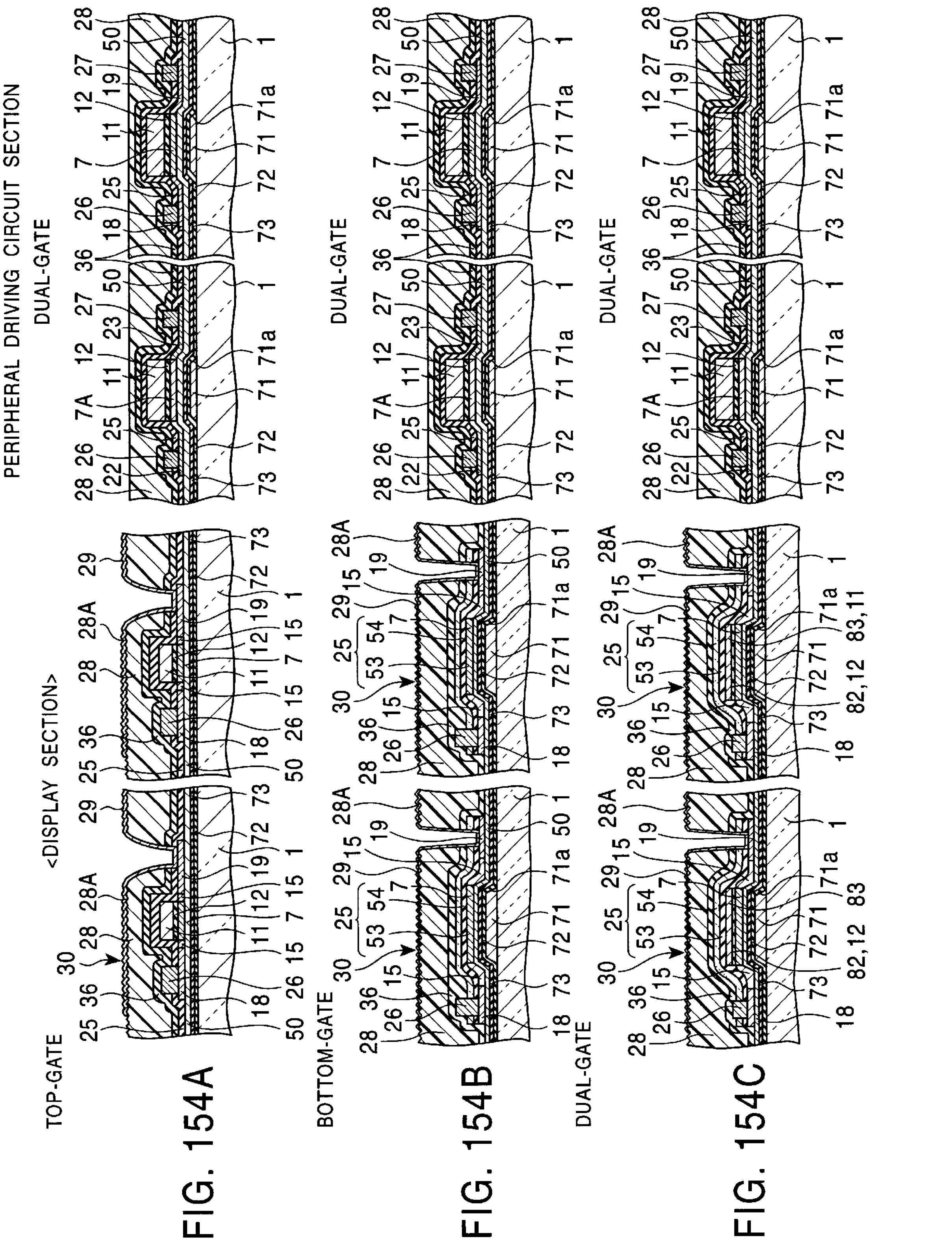

The display section shown in FIG. 152A, 153A, or 154A includes top-gate nMOSLDD-TFTs as in the twenty-ninth, thirtieth, or thirty-first embodiment, the display section shown in FIG. 152B, 153B, or 154B includes bottom-gate nMOSLDD-TFTs, and the display section shown in FIG. 152C, 153C, or 154C includes dual-gate nMOSLDD-TFTs. These TFTs can be produced by the same process for the top-gate, bottom-gate, or dual-gate MOSTFTs in the peripheral-driving-circuit section. In particular, the dual-gate MOSTFT has higher driving ability and is suitable for high-speed switching. Furthermore, the upper or lower gate may be selectively used as a top- or bottom-gate type during operation.

In the bottom-gate MOSTFT shown in FIG. 152B, a gate electrode 71 is composed of, for example, molybdenum or tantalum, and a gate insulting film is composed of a SiN film 72 and a $SiO_2$ film 73. A channel region and the like using the single-crystal silicon layer are formed on the gate insulating film as in the top-gate MOSTFT. In the dual-gate MOSTFT shown in FIG. 152C, the lower-gate section is substantially the same as that in the bottom-gate MOSTFT and the upper-gate section includes an upper-gate electrode 74 formed on a gate insulating film 73 composed of a $SiO_2$ film and a SiN film.

A method for making the bottom-gate MOSTFT will be described with reference to FIGS. 155A to 159E, and a method for making the dual-gate MOSTFT will be described with reference to FIGS. 160F to 162P. The method for making the top-gate, bottom-gate, or dual-gate MOSTFT in the peripheral-driving-circuit section is shown above with reference to FIGS. 122A to 126R, 128A to 133T, or 135A to 140T.

Figure 155A:
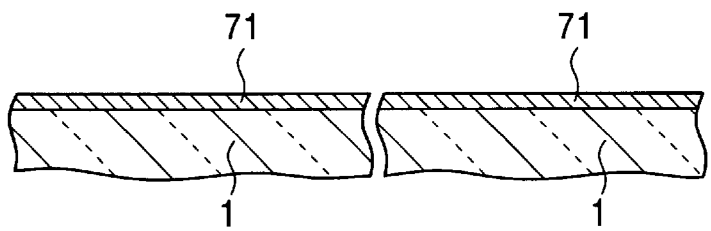
FIGS. 155A to 155C, 156D to 156F, 157G to 157J, and 158K to 158N are cross-sectional views illustrating production steps of a liquid crystal display (LCD) in accordance with the thirty-eighth embodiment of the present invention.

With reference to FIG. 155A, in the production of the bottom-gate MOSTFT in the display section, a molybdenum-tantalum alloy film 71 having a thickness of 500 to 600 nm is formed on a substrate 1 by sputtering.

Figure 155B:
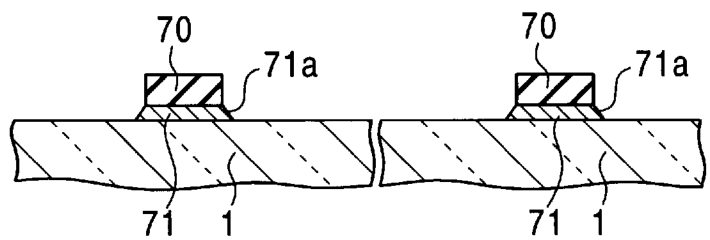

With reference to FIG. 155B, a photoresist layer 70 having a given pattern is formed and the molybdenum-tantalum alloy film 71 is taper-etched using the photoresist layer 70 as a mask to form a gate electrode 71 having a trapezoidal side base 71*a* with an angle of 20 to 45 degree.

Figure 155C:
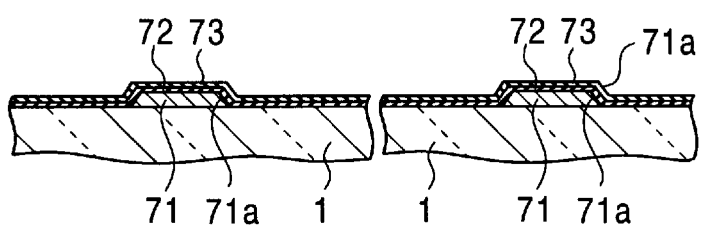

With reference to FIG. 155C, after the photoresist layer 70 is removed, a SiN film 72 having a thickness of approximately 100 nm and then a $SiO_2$ film 73 having a thickness of approximately 200 nm are deposited on the substrate 1 including the molybdenum-tantalum alloy film 71 by a plasma-enhanced CVD process to form a gate insulating film.

Figure 156D:
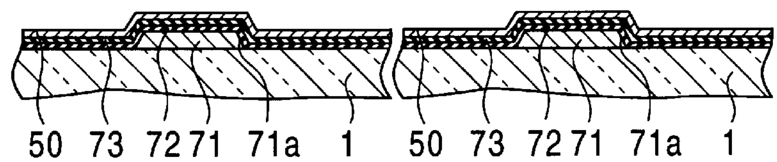

With reference to FIG. 156D, and a crystalline sapphire thin-film 50 having a thickness of 20 to 200 nm is deposited at least in TFT-forming regions on one main surface of the insulating substrate 1, as in the step shown in FIG. 122A.

Figure 156E:
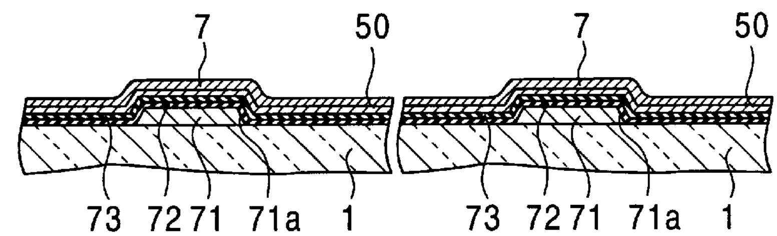

With reference to FIG. 156E, single-crystal silicon is heteroepitaxially grown to deposit a single-crystal silicon layer 7 with a thickness of approximately 0.1 μm, as in the steps shown in FIGS. 122B to 122D. Since the underlying gate electrode 71 has a moderately slanted side face which does not inhibit epitaxy, the single-crystal silicon layer 7 can be deposited without discontinuity at the step differences 4.

Figure 156F:
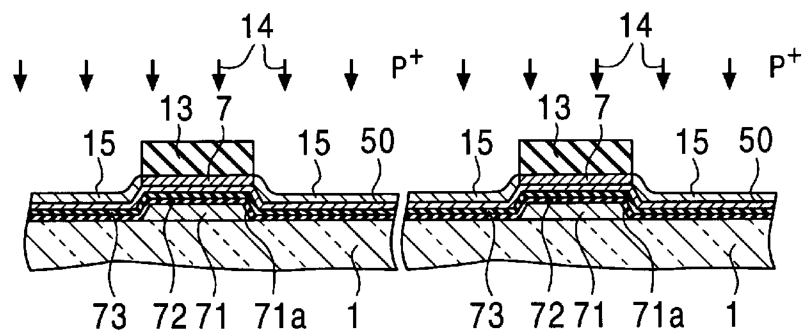

With reference to FIG. 156F, after the steps shown in FIGS. 123E to 123H, the gate sections of the nMOSTFT in the display section are covered with a photoresist layer 13, as in the step shown in FIG. 124I. The exposed source and drain regions of the nMOSTFT are doped with phosphorus ions 14 by ion implantation to form a LDD section 15 composed of an $N^-$-type layer by self-alignment. The bottom-gate electrode 71 facilitates recognition of the difference in surface height or the pattern. Thus, the photoresist layer 13 is readily aligned with high precision.

Figure 157G:
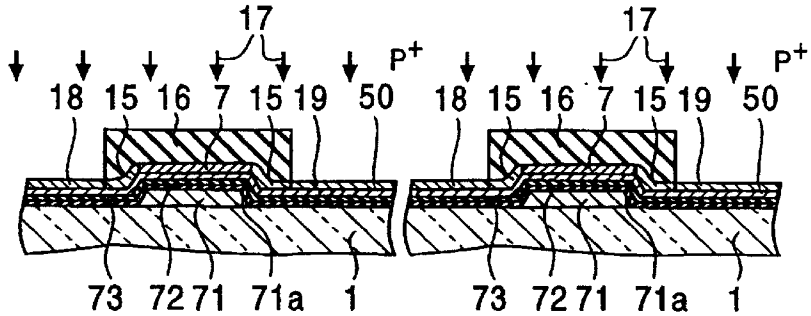

With reference to FIG. 157G, the gate section and the LDD section of the nMOSTFT are covered with a photoresist layer 16 and the exposed region is doped with phosphorus or arsenic ions 17 by ion implantation to form a source section 18 and a drain section 19 composed of an $N^+$-type layer of the nMOSTFT, as in the step shown in FIG. 124J.

Figure 157H:
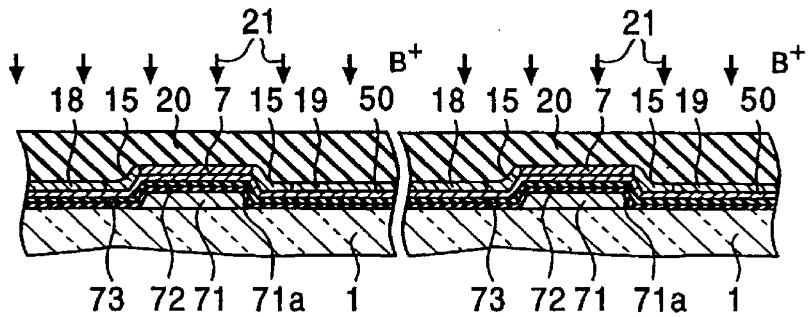

With reference to FIG. 157H, the entire nMOSTFT is covered with a photoresist layer 20 and then doped with boron ions 21 by ion implantation to form a source section and a drain section of the $p^+$ layer of the pMOSTFT in the peripheral-driving-circuit section, as in the step shown in FIG. 124K.

Figure 157I:
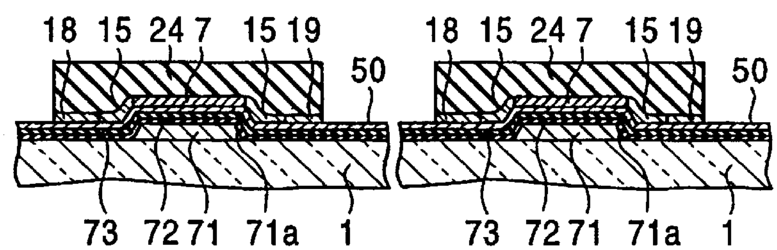

With reference to FIG. 157I, a photoresist layer 24 is provided and then the single-crystal silicon layer is selectively removed by conventional photolithography and etching to island the active device section and the passive device section, as in the step shown in FIG. 124L.

Figure 157J:
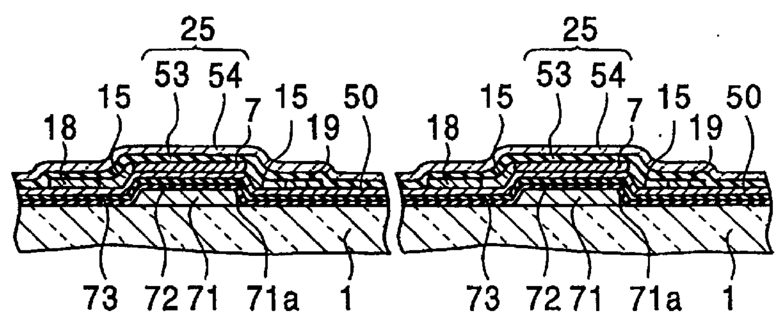

With reference to FIG. 157J, a $SiO_2$ film 53 having a thickness of approximately 300 nm and then a phosphosilicate glass (PSG) film 54 having a thickness of approximately 300 nm are formed on the entire surface by a plasma-enhanced CVD process, a high-density plasma-enhanced CVD process, or a catalytic CVD process, as in the step shown in FIG. 125M. The $SiO_2$ film 53 and the PSG film 54 correspond to the above-described protective film 25. The single-crystal silicon layer is activated as described above.

Figure 158K:
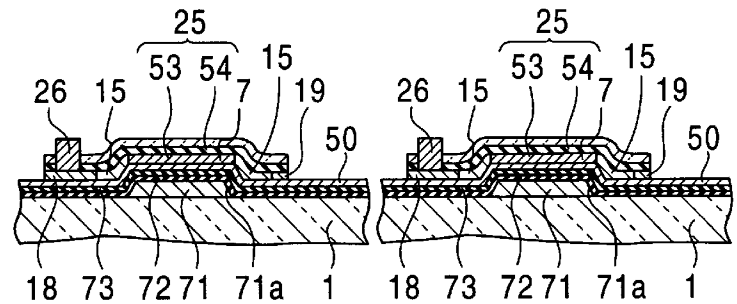

With reference to FIG. 158K, contact holes are formed at the source sections by conventional photolithography and etching, as in the step shown in FIG. 125N. An aluminum film (or an aluminum film containing 1% silicon) having a thickness of 400 to 500 nm is formed on the entire surface by sputtering. Source electrodes 26, data lines, and gate lines of TFTs are simultaneously formed by conventional photolithography and etching. The substrate is sintered in a forming gas at approximately 400° C. for 1 hour.

Figure 158L:
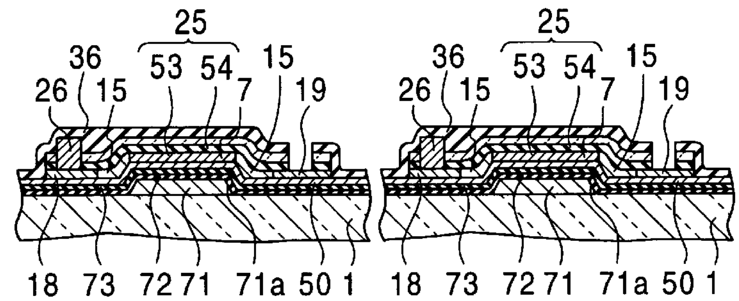

With reference to FIG. 158L, an insulating film 36 composed of a PSG film having a thickness of approximately 300 nm and a SiN film having a thickness of approximately 300 nm are formed on the entire surface by a high-density plasma-enhanced CVD process or a catalytic CVD process, and contact holes are formed at the drain sections of display TFTs, as in FIG. 125O.

Figure 158M:
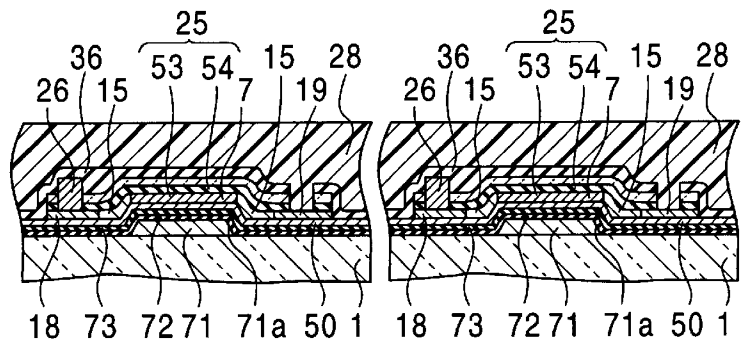
Figure 158N:
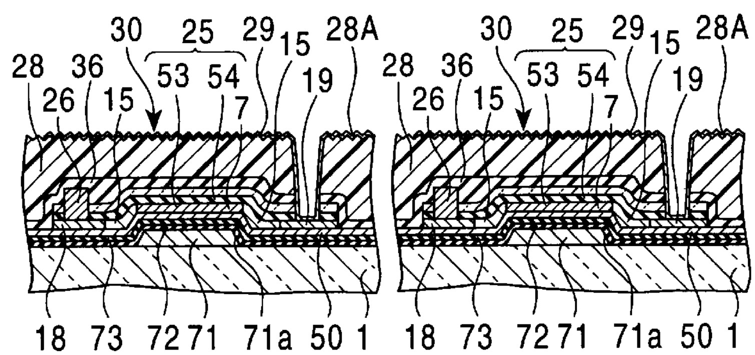

With reference to FIG. 158M, a photosensitive resin film 28 having a thickness of 2 to 3 μm is formed by spin coating, as in the step shown in FIG. 126P. With reference to FIG. 158N, an uneven pattern is formed and then subjected to reflow to form a lower portion of a reflective layer having an uneven surface 28A so that the pixel section has optimized reflective and viewing-angle characteristics. Contact holes are simultaneously formed at the contact sections of the display TFTs.

With reference to FIG. 158N, an aluminum film (or an aluminum film containing 1% silicon) having a thickness of 400 to 500 nm is formed on the entire surface by sputtering, as in the step shown in FIG. 126R. An uneven aluminum reflective film 29 connecting to the drain section 19 of the display TFT is formed by conventional photolithography and etching.

As described above, the resulting active-matrix substrate 30 integrates a display section and a peripheral-driving-circuit section, in which the display section includes bottom-gate nMOSLDD-TFTs using the single-crystal silicon layer 7 formed by heteroepitaxy on the crystalline sapphire film 50 as a seed and the peripheral-driving-circuit section includes a CMOS driving circuit having top-gate, bottom-gate, or dual-gate pMOSTFTs and nMOSTFTs.

Figure 159C:
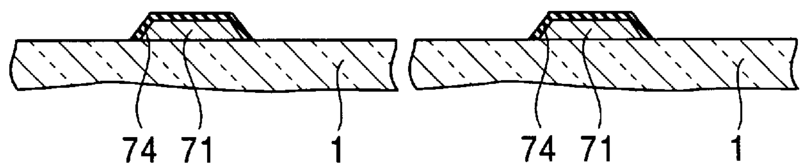
FIGS. 159C to 159E, 160F to 160I, 161J to 161M, and 162N to 162P are cross-sectional views illustrating production steps of a liquid crystal display (LCD) in accordance with the thirty-eighth embodiment of the present invention.
Figure 159D:
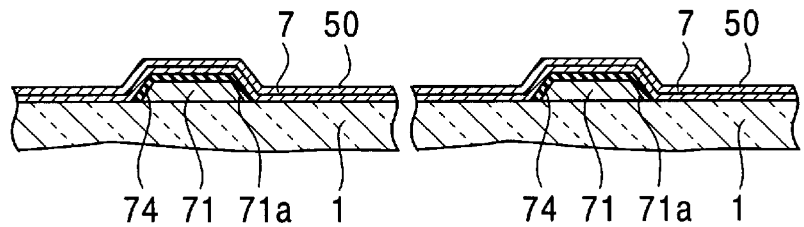
Figure 159E:
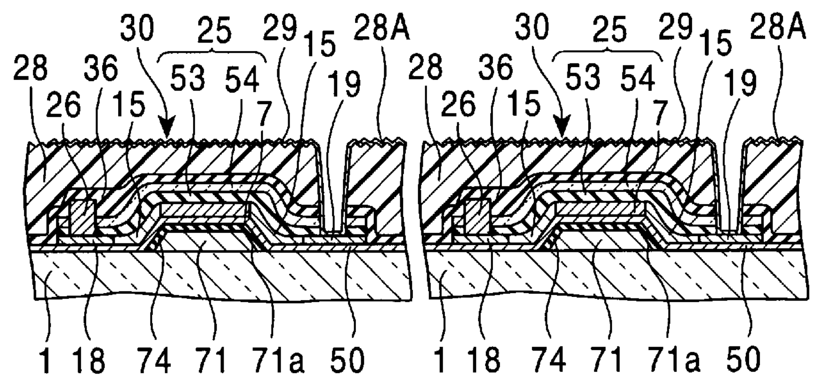

FIGS. 159C to 159E show the formation of the gate insulating film of the above bottom-gate MOSTFT in the display section by anodic oxidation of the molybdenum-tantalum alloy.

After the step of FIG. 155B, the molybdenum-tantalum alloy film 71 is subjected to conventional anodic oxidation treatment, as shown in FIG. 159C, to form a gate insulating film 74, composed of $Ta_2O_5$ and having a thickness of 100 to 200 nm, on the surface.

Next, with reference to FIG. 159D, a crystalline sapphire thin-film 50 is formed, as in the steps shown in FIGS. 156D to 156E, and a single-crystal silicon film 7 is formed by heteroepitaxy. With reference to FIG. 159E, an active-matrix substrate 30 is prepared according to the process shown in FIGS. 156F to 158N.

When the dual-gate MOSTFTs are produced in the display section, the processes shown in FIGS. 155A to 156E are performed.

Figure 160F:
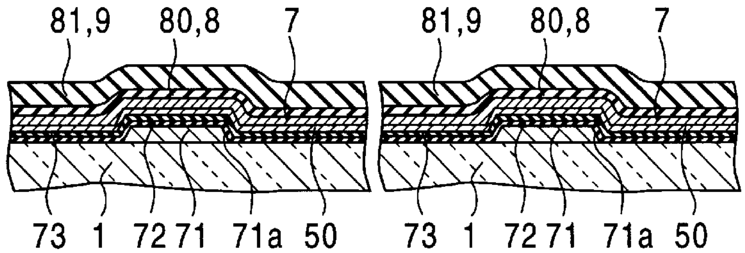

With reference to FIG. 160F, a crystalline sapphire thin-film 50 is formed on the insulating films 72 and 73 and the substrate 1, and then a single-crystal silicon layer 7 is deposited by heteroepitaxy on the crystalline sapphire thin-film 50 as a seed. Next, as in the step shown in FIG. 123G, a $SiO_2$ film having a thickness of approximately 200 nm and then a SiN film having a thickness of approximately 100 nm are continuously formed on the entire surface of the single-crystal silicon layer 7 by a plasma-enhanced CVD process or a catalytic CVD process to form an insulating film 80 (corresponding to the insulating film 8). A molybdenum-tantalum alloy film 81 having a thickness of 500 to 600 nm (corresponding to the above-mentioned sputtered film 71) is formed by sputtering.

Figure 160G:
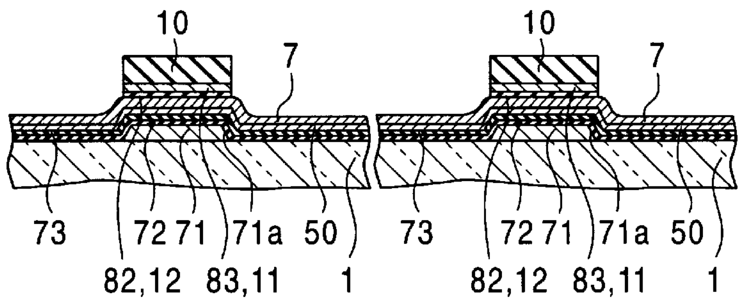

With reference to FIG. 160G, a photoresist pattern 10 is formed, as in the step shown in FIG. 123H, and is continuously etched to form a top-gate electrode 82 (corresponding to the gate electrode 12) composed of the molybdenum-tantalum alloy and a gate insulating film 83 (corresponding to the gate insulating film 11) and to expose the single-crystal silicon layer 7.

Figure 160H:
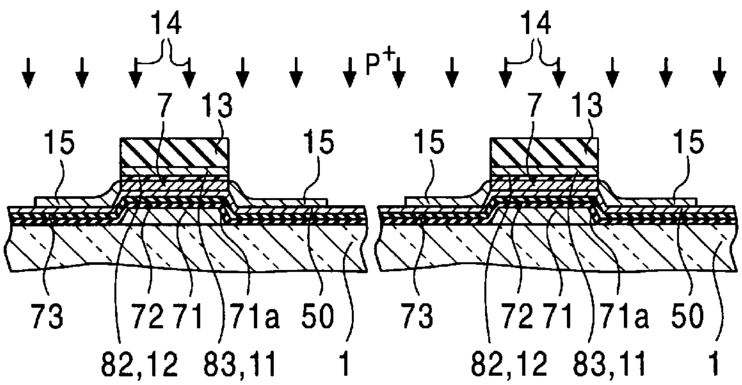

With reference to FIG. 160H, the top-gate section of the nMOSTFT is covered with a photoresist layer 13, and the exposed source and drain regions of the nMOSTFT for display are doped with phosphorus ions 14 by ion implantation to form an $N^-$-type LDD section 15, as in the step shown in FIG. 124I.

Figure 160I:
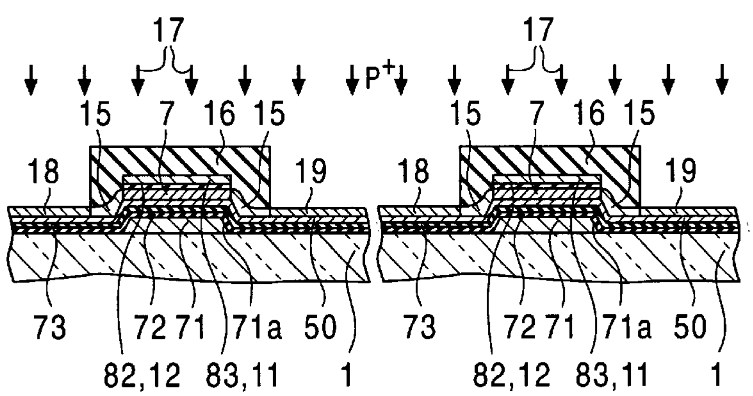

With reference to FIG. 160I, the gate section and the LDD section of the nMOSTFT are covered with a photoresist layer 16, and the exposed region is doped with phosphorus or arsenic ions 17 by ion implantation to form a source section 18 and a drain section 19 of nMOSTFT composed of an $N^+$-type layer, as in the step in FIG. 124J.

Figure 161J:
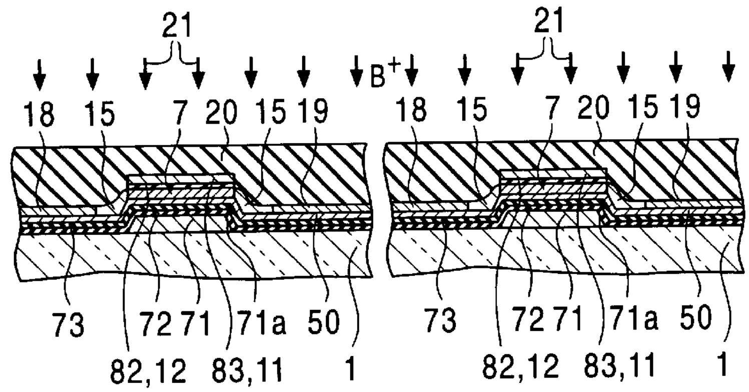

With reference to FIG. 161J, the gate section of the pMOSTFT is covered with a photoresist layer 20 and the exposed region is doped with boron ions 21 by ion implantation to form a source section and a drain section of the pMOSTFT composed of a $P^+$-layer in the peripheral-driving-circuit section, as in the step shown in FIG. 124K.

Figure 161K:
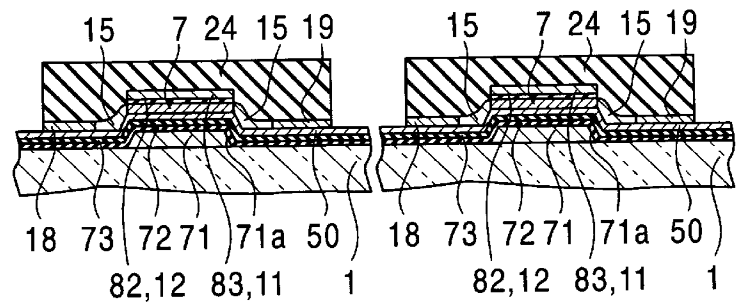

With reference to FIG. 161K, a photoresist layer 24 is provided and the single-crystal silicon layer is selectively removed by conventional photolithography and etching to island the active device section and the passive device section, as in the step shown in FIG. 125L.

Figure 161L:
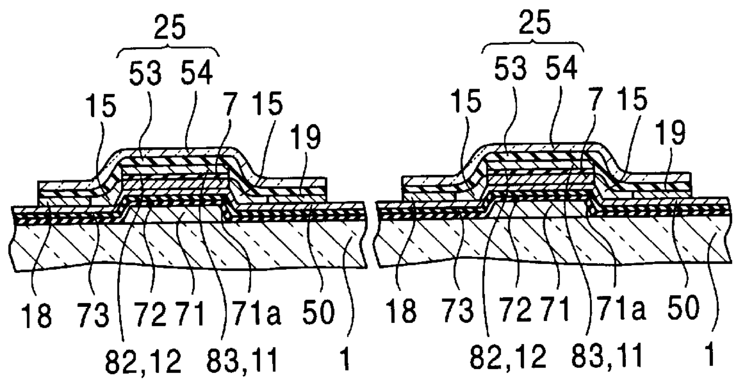

With reference to FIG. 161L, a $SiO_2$ film 53 having a thickness of approximately 200 nm and a phosphosilicate glass (PSG) glass 54 having a thickness of approximately 300 nm are formed on the entire surface by a plasma-enhanced CVD process, a high-density plasma-enhanced CVD process, or a catalytic CVD process, as in the step shown in FIG. 125M. These films 53 and 54 correspond to the protective film 25. Next, the single-crystal silicon layer 7 is activated.

Figure 161M:
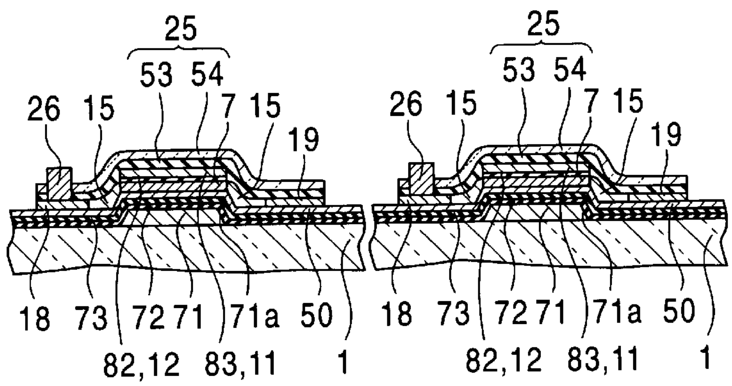

With reference to FIG. 161M, contact holes are formed at the source sections, as in the step shown in FIG. 125N. An aluminum film (or an aluminum film containing 1% silicon) having a thickness of 400 to 500 nm is formed on the entire surface by sputtering, and then source electrodes 26, data lines, and gate lines are simultaneously formed by conventional photolithography and etching.

Figure 162N:
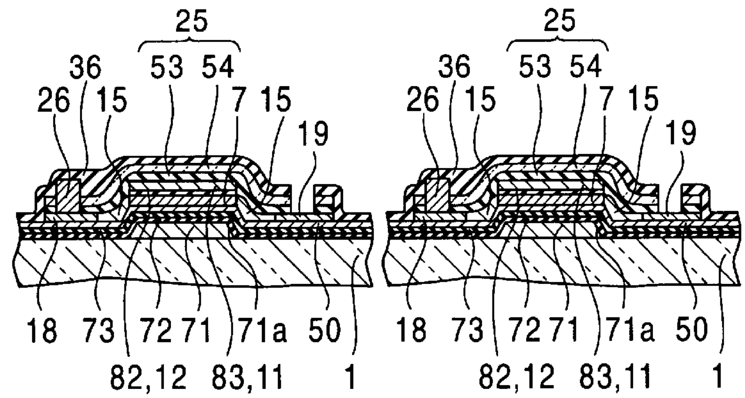

With reference to FIG. 162N, an insulating film 36 including a PSG film having a thickness of approximately 300 nm and a SiN film having a thickness of approximately 300 nm is formed on the entire surface and contact holes are formed at the drain section of the display TFT, as in the step shown in FIG. 126P.

Figure 162O:
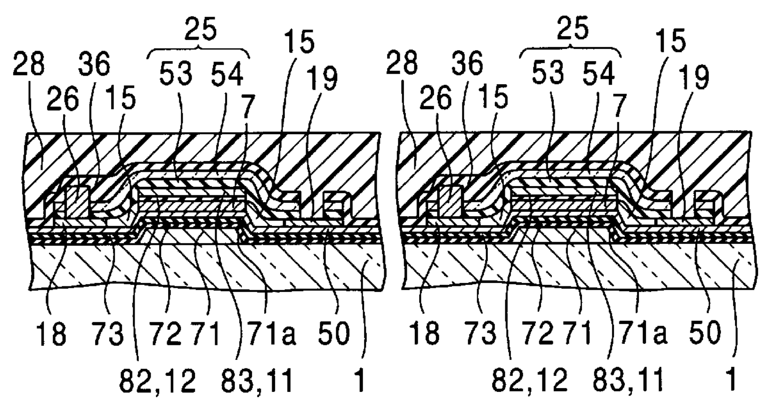
Figure 162P:
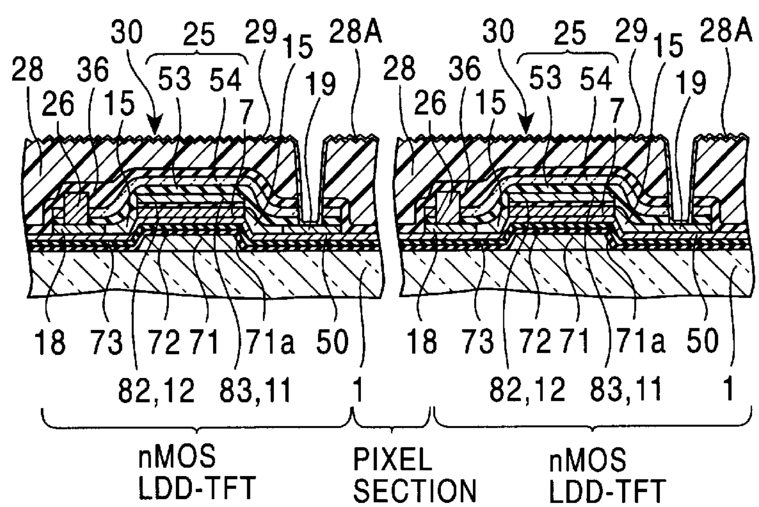

With reference to FIG. 162O, a photosensitive resin film 28 having a thickness of 2 to 3 $\mu$m is formed on the entire surface by spin coating or the like. With reference to FIG. 162P, a lower portion of a reflective face comprising an uneven surface 28A is formed in at least the pixel section, contact holes are formed at the drain sections of the display TFTs and an uneven aluminum reflective section 29 connecting to the drain sections 19 are formed so that optimized reflective and viewing-angle characteristics are achieved, as in the steps shown in FIGS. 126Q and 126R.

The resulting active-matrix substrate 30 integrates a display section and a peripheral-driving-circuit section, in which the display section includes dual-gate nMOSLDD-TFTs and the peripheral-driving-circuit section includes a CMOS driving circuit having top-gate, bottom-gate or dual-gate nMOSTFTs and pMOSTFTs. These TFTs are formed of the single-crystal silicon layer 7 formed by heteroepitaxy on the crystalline sapphire film 50 as a seed.

Thirty-ninth Embodiment

FIGS. 163F to 165L show a thirty-ninth embodiment of the present invention.

Unlike the above-described embodiments, in this embodiment, the gate electrode in the top gate section is composed of a material having a relatively low thermal resistance such as aluminum.

Figures 163F, 163G:
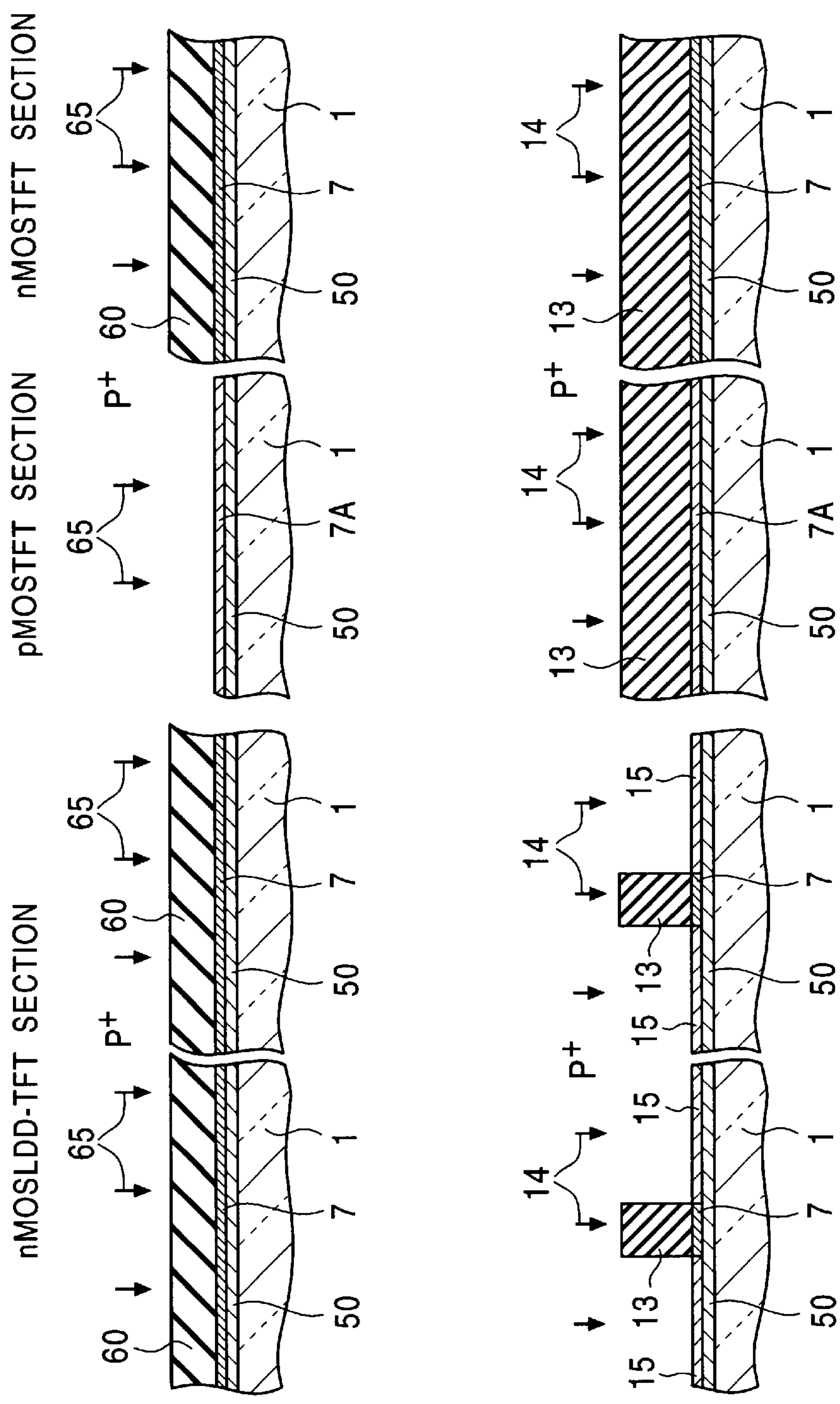
FIGS. 163F to 163G, 164H to 164J, and 165K to 165L are cross-sectional views illustrating production steps of a liquid crystal display (LCD) in accordance with a thirty-ninth embodiment of the present invention.

In case of forming a top-gate MOSTFT, an n-type well 7A is formed in the pMOSTFT section of the peripheral-driving-circuit section as shown in FIG. 163F using the same process shown in FIGS. 122A to 124F of the above-described twenty-ninth embodiment.

With reference to FIG. 163G, all of the nMOSs and pMOSTFTs in the peripheral-driving-circuit section and the gate section of the nMOSTFTs in the display section are covered with a photoresist layer 13, and the exposed source and drain regions of the nMOSTFTs are doped with phosphorus ions 14 by ion implantation, for example, at 20 kV and at a dose of $5\times10^{13}$ atoms/cm$^2$ to form a LDD section 15 composed of an $N^-$-type layer by self-alignment.

Figure 164H:
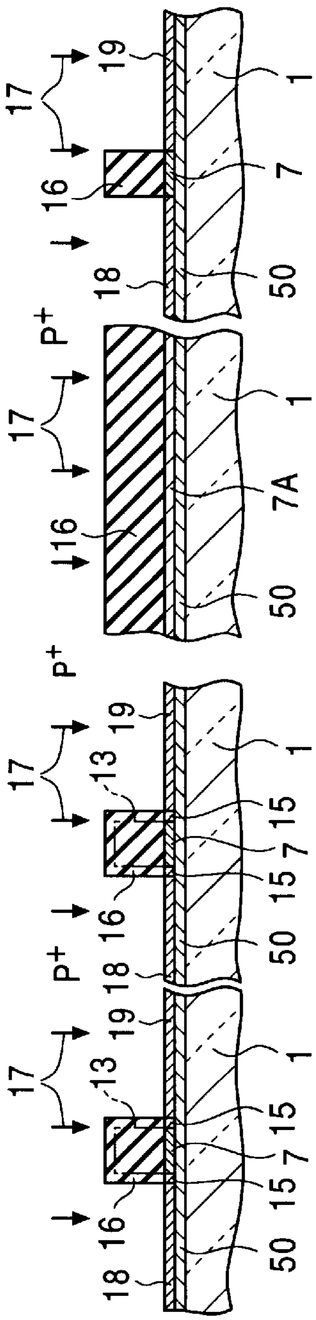

With reference to FIG. 164H, all of the pMOSTFTs in the peripheral-driving-circuit section, the gate sections of the nMOSTFTs in the peripheral-driving-circuit section, and the gate section and the LDD section of the nMOSTFTs in the display section are covered with a photoresist layer 16. The exposed region is doped with phosphorus or arsenic ions 17, for example, at 20 kV and at a dose of $5\times10^{15}$ atoms/cm$^2$ by ion implantation to form a source section 18 and a drain section 19 of nMOSTFT composed of an $N^+$-type layer and an LDD section 15. Preferably, the resist layer 13 is retained, as shown by the dotted line in the drawing, and the resist layer 16 is provided so as to cover the resist layer 13. In the formation process of the resist layer 16, a mask is readily aligned with high accuracy with reference to the resist layer 13.

Figure 164I:
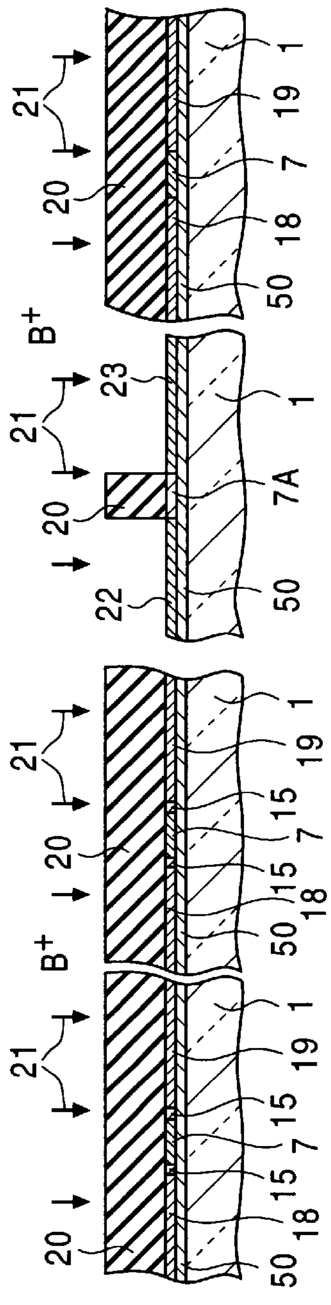

With reference to FIG. 164I, all of the nMOSTFTs in the peripheral-driving-circuit section and the display section and the gate sections of the pMOSTFTs are covered with a photoresist layer 20. The exposed regions are doped with boron ions 21 by ion implantation at 10 kV and at a dose of $5\times10^{15}$ atoms/cm$^2$ to form source sections 22 and drain sections 23 of the pMOSTFTs composed of a $P^+$-type layer.

Figure 164J:
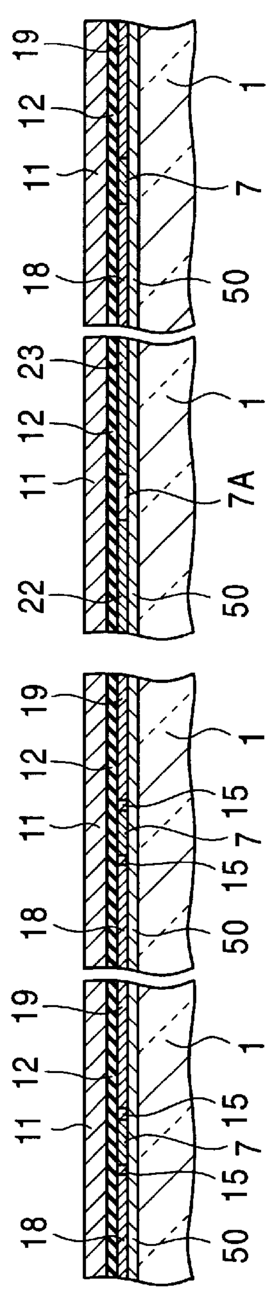

With reference to FIG. 164J, the resist layer 20 is removed, and then the single-crystal silicon layers 7 and 7A are activated as above. Furthermore, a gate insulating film 12 and an aluminum gate electrode layer 11 composed of aluminum or aluminum containing 1% of Si are formed. The gate electrode layer 11 may be formed by a vacuum evaporation process or a sputtering process.

Figure 165K:
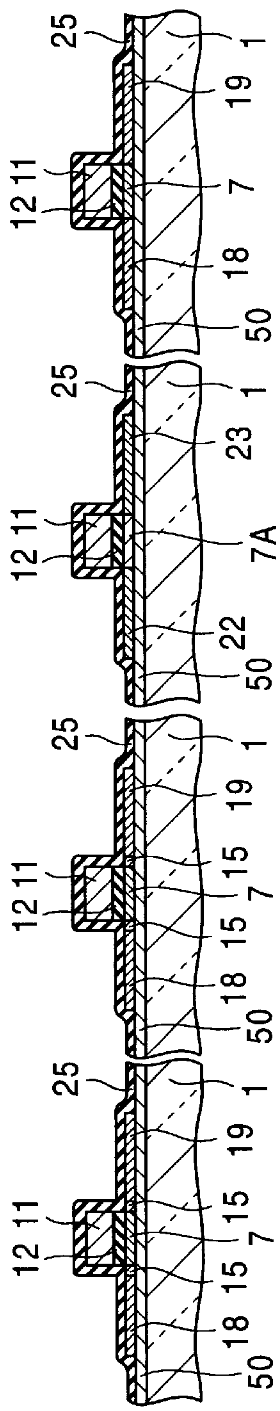

The gate section is patterned, and the active device section and the passive device section are isolated. With reference to FIG. 165K, a $SiO_2$ film having a thickness of approximately 200 nm and then a phosphosilicate glass (PSG) film having a thickness of approximately 300 nm are deposited on the entire surface to form a protective film 25.

Figure 165L:
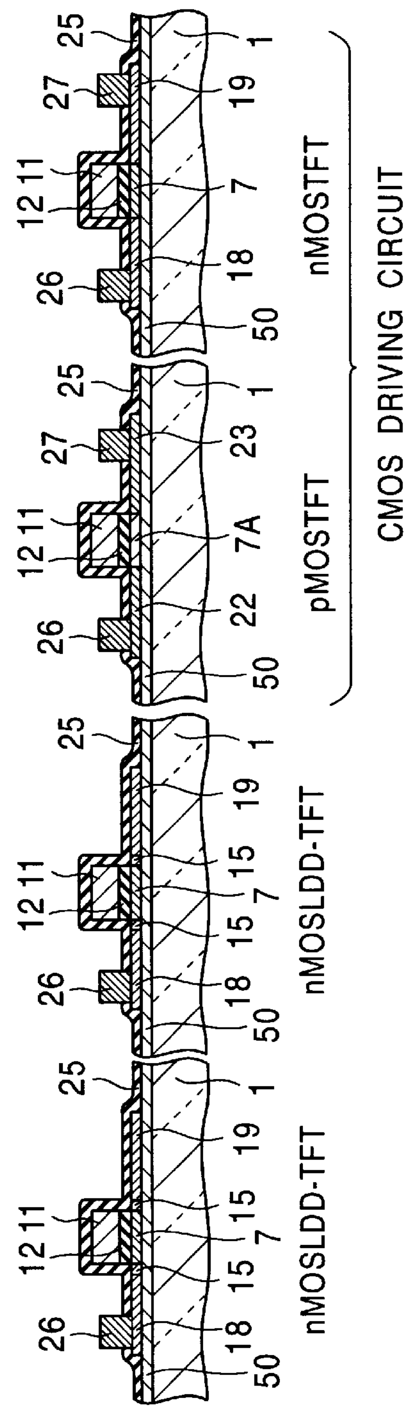

With reference to FIG. 165L, contact holes are formed at the source and drain sections of all TFTs in the peripheral-driving-circuit section and the source sections of the display TFTs by conventional photolithography and etching.

An aluminum sputtered film having a thickness of 500 to 600 nm is formed on the entire surface. Source electrodes 26 of all TFTs in the peripheral-driving-circuit section and the display section, drain electrodes 27 in the peripheral-driving-circuit section, data lines and gate lines are simultaneously formed by conventional photolithography and etching. The substrate is subjected to sintering treatment in a forming gas (nitrogen and hydrogen) at approximately 400° C. for 1 hour.

As in the steps shown in FIGS. 125O to 127R, an active-matrix substrate 30 integrating a display section and a peripheral-driving-circuit section is produced, in which the display section and the peripheral-driving-circuit section include top-gate nMOSLDD-TFTs having aluminum gate electrodes, and a CMOS driving circuit having pMOSTFTs and nMOSTFTs using the single-crystal silicon layer 7.

Since the aluminum gate electrodes 11 are formed after the activation treatment of the single-crystal silicon layer 7, the gate electrode material is not subjected to the activation treatment. Any inexpensive material having relatively low heat resistance, such as aluminum, may be used for the gate electrode. This process can also be applied when the display section includes bottom-gate MOSTFTs.

When dual-gate MOSTFTs and top-gate MOSTFTs are formed in the display section and the peripheral-driving-circuit section, respectively, the processes shown in FIGS. 76I to 78P are performed as in the above-described twenty-first embodiment to form an active-matrix substrate 30 integrating a display section and a peripheral-driving-circuit section, in which the display section comprises a CMOS driving circuit comprising dual-gate nMOSLDD-TFTs having aluminum gate electrodes and in which the peripheral-driving-circuit section comprises a CMOS driving circuit having top-gate pMOSTFTs and nMOSTFTs.

Fortieth Embodiment

FIGS. 166J to 168P show a fortieth embodiment of the present invention.

In this embodiment, the gate electrode in the top gate section is composed of a material having a relatively low thermal resistance such as aluminum.

Figure 166J:
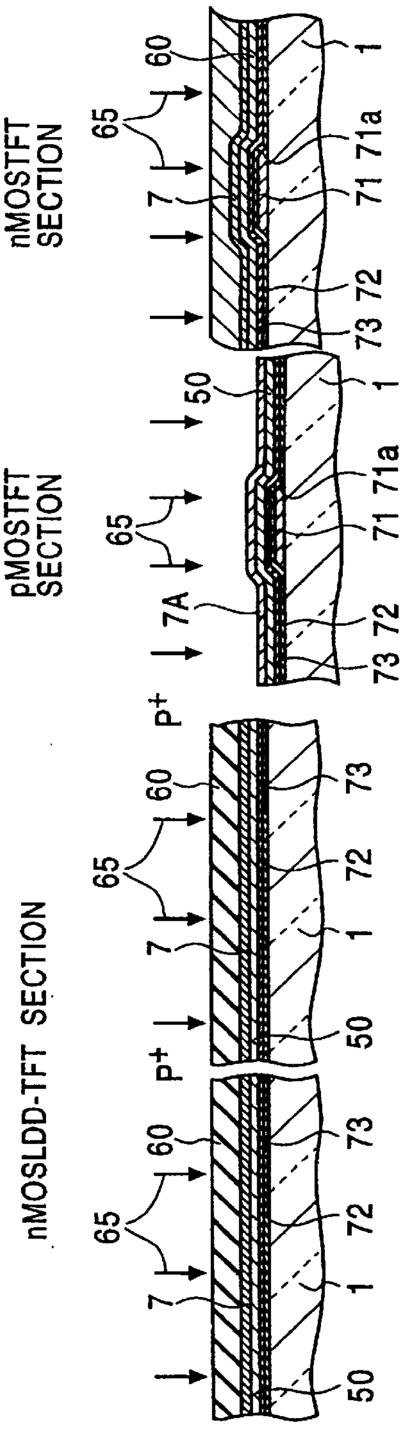
FIGS. 166J to 166K, 167L to 167N, and 168O to 168P are cross-sectional views illustrating production steps of a liquid crystal display (LCD) in accordance with a fortieth embodiment of the present invention.

In case of forming a top-gate MOSTFT, an n-type well 7A is formed in the pMOSTFT section of the peripheral driving circuit section as shown in FIG. 166J using the same process shown in FIGS. 128A to 130H of the above-described thirtieth embodiment.

Figure 166K:
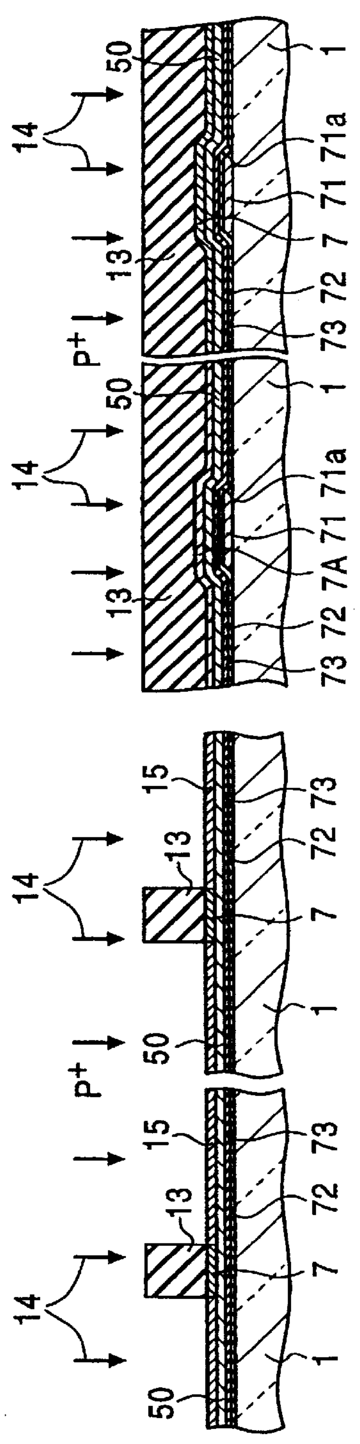

With reference to FIG. 166K, all of the nMOSTFTs and pMOSTFTs in the peripheral-driving-circuit section and the gate section of the nMOSTFTs in the display section are covered with a photoresist layer 13, and the exposed source and drain regions of the nMOSTFTs are doped with phosphorus ions 14 by ion implantation, for example, at 20 kV and at a dose of $5\times10^{13}$ atoms/cm$^2$ to form a LDD section 15 composed of an $N^-$-type layer by self-alignment.

Figure 167L:
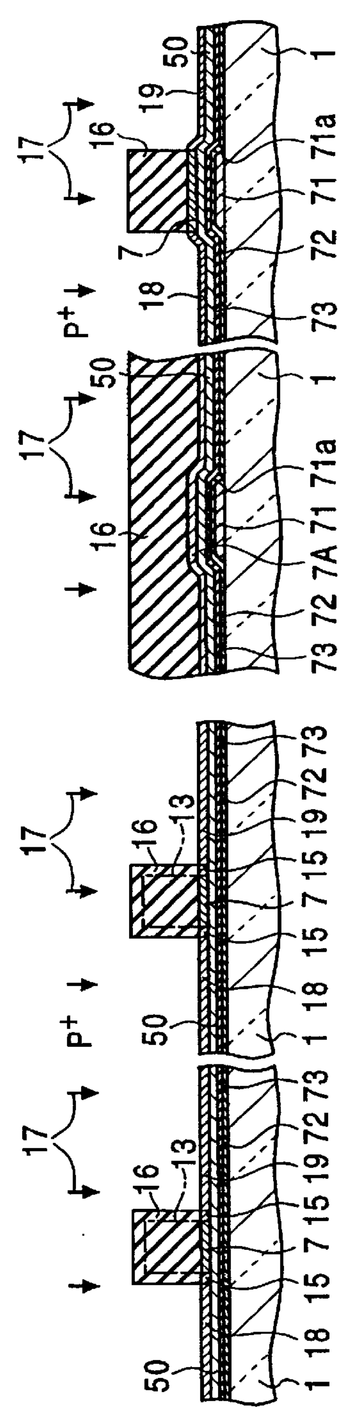

With reference to FIG. 167L, all of the pMOSTFTs in the peripheral-driving-circuit section, the gate sections of the nMOSTFTs in the peripheral-driving-circuit section, and the gate section and the LDD section of the nMOSTFTs in the display section are covered with a photoresist layer 16. The exposed region is doped with phosphorus or arsenic ions 17, for example, at 20 kV and at a dose of $5\times10^{15}$ atoms/cm$^2$ by ion implantation to form a source section 18 and a drain section 19 of nMOSTFT composed of an $N^+$-type layer and an LDD section 15. Preferably, the resist layer 13 is retained, as shown by the dotted line in the drawing, and the resist layer 16 is provided so as to cover the resist layer 13. In the formation process of the resist layer 16, a mask is readily aligned with high accuracy with reference to the resist layer 13.

Figure 167M:
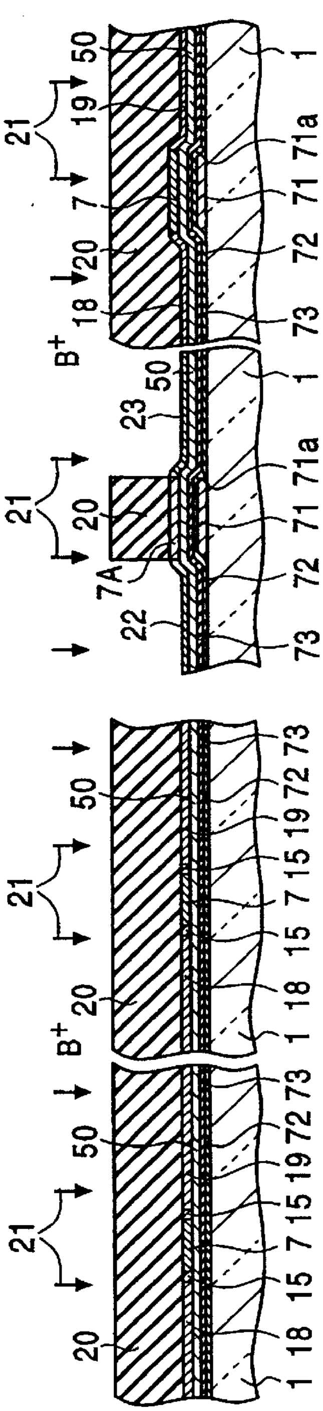

With reference to FIG. 167M, all of the nMOSTFTs in the peripheral-driving-circuit section and the display section and the gate sections of the pMOSTFTs are covered with a photoresist layer 20. The exposed regions are doped with boron ions 21 by ion implantation at 10 kV and at a dose of $5\times10^{15}$ atoms/cm$^2$ to form source sections 22 and drain sections 23 of the pMOSTFTs composed of a $P^+$-type layer.

Figure 167N:
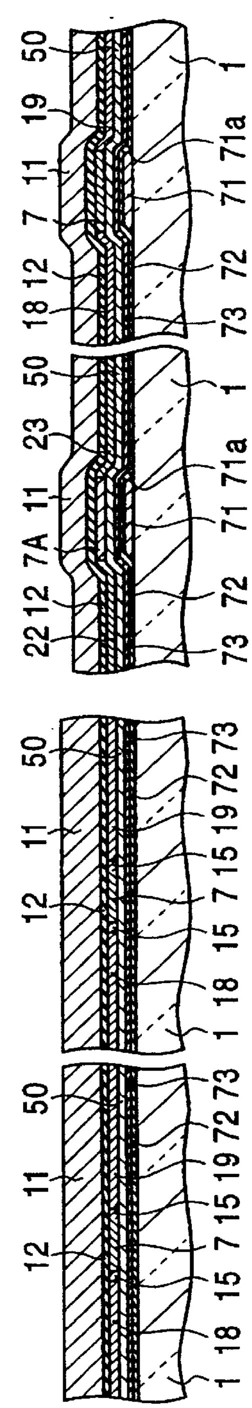

With reference to FIG. 167N, the resist layer 20 is removed, and then the single-crystal silicon layers 7 and 7A are activated as above. Furthermore, a gate insulating film 12 and an aluminum gate electrode layer 11 composed of aluminum or aluminum containing 1% of Si are formed. The gate electrode layer 11 may be formed by a vacuum evaporation process or a sputtering process.

Figure 168O:
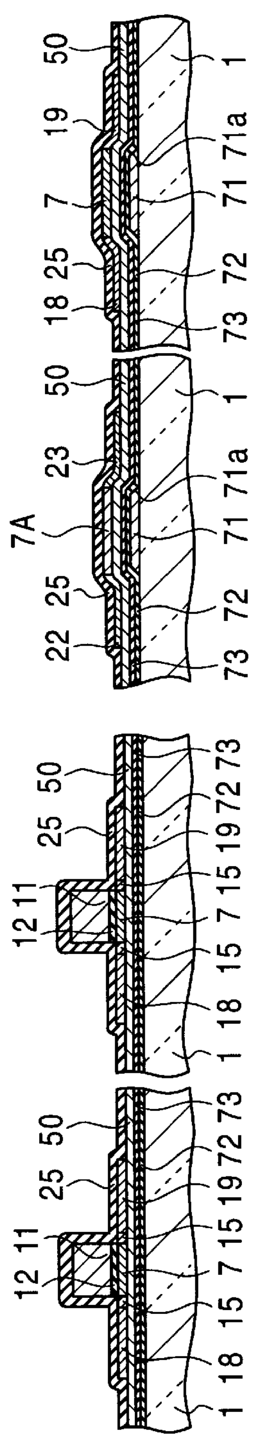

The gate section is patterned, and the active device section and the passive device section are isolated. With reference to FIG. 168O, a $SiO_2$ film having a thickness of approximately 200 nm and then a phosphosilicate glass (PSG) film having a thickness of approximately 300 nm are deposited on the entire surface to form a protective film 25.

Figure 168P:
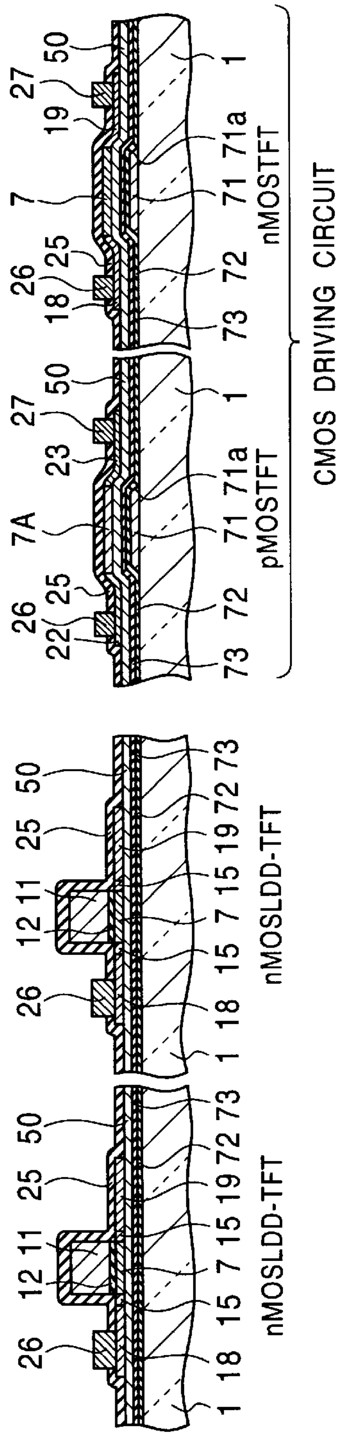

With reference to FIG. 168P, contact holes are formed at the source and drain sections of all TFTs in the peripheral-driving-circuit section and the source sections of the display TFTs by conventional photolithography and etching.

An aluminum sputtered film having a thickness of 500 to 600 nm is formed on the entire surface. Source electrodes 26 of all TFTs in the peripheral-driving-circuit section and the display section, drain electrodes 27 in the peripheral-driving-circuit section, data lines and gate lines are simultaneously formed by conventional photolithography and etching. The substrate is subjected to sintering treatment in a forming gas (nitrogen and hydrogen) at approximately 400° C. for 1 hour.

As in the steps shown in FIGS. 132Q to 133T, an active-matrix substrate 30 integrating a display section and a peripheral-driving-circuit section is produced, in which the display section and the peripheral-driving-circuit section include top-gate nMOSLDD-TFTs having aluminum gate electrodes, and a CMOS driving circuit having pMOSTFTs and nMOSTFTs using the single-crystal silicon layer 7.

Since the aluminum gate electrodes 11 are formed after the activation treatment of the single-crystal silicon layer 7, the gate electrode material is not subject to the activation treatment. Any inexpensive material having relatively low heat resistance, such as aluminum, may be used for the gate electrode. This process can also be applied when the display section includes bottom-gate MOSTFTs.

When dual-gate MOSTFTs and bottom-gate MOSTFTs are formed in the display section and the peripheral-driving-circuit section, respectively, the processes shown in FIGS. 84J to 86Q are performed as in the above-described twenty-second embodiment to form an active-matrix substrate 30 integrating a display section and a peripheral-driving-circuit section, in which the display section comprises a CMOS driving circuit comprising dual-gate nMOSLDD-TFTs having aluminum gate electrodes and in which the peripheral-driving-circuit section comprises a CMOS driving circuit having a bottom-gate pMOSTFTs and nMOSTFTs.

Alternatively, the processes shown in FIGS. 100I to 102P are performed as in the above-described twenty-fourth embodiment to form the above-described active-matrix substrate 30.

Forty-first Embodiment

FIGS. 169J to 171P show a forty-first embodiment of the present invention.

In this embodiment, the gate electrode in the top gate section is composed of a material having a relatively low thermal resistance such as aluminum.

Figure 169J:
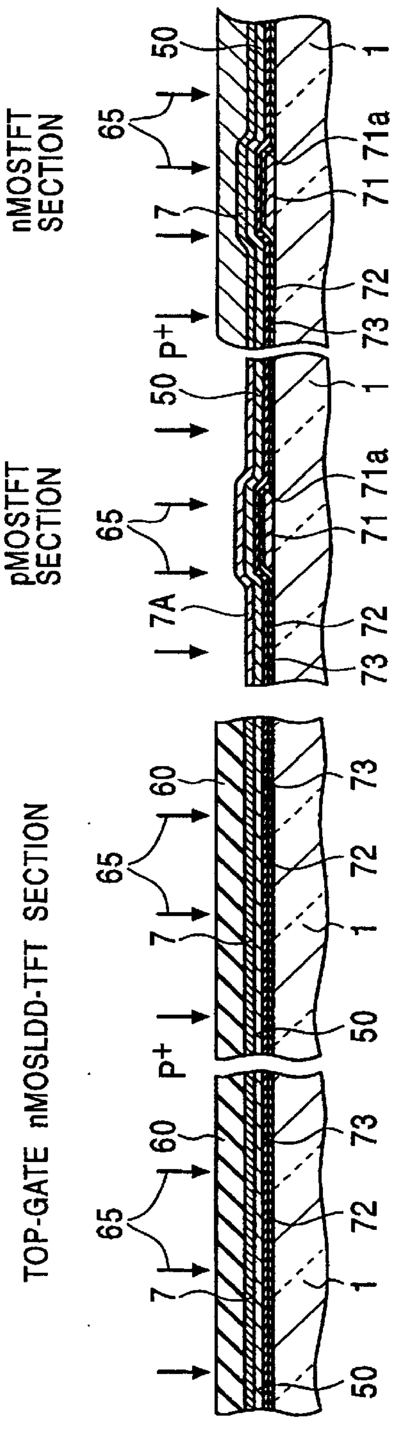
FIGS. 169J to 169K, 170L to 170N, and 171O to 171P are cross-sectional views illustrating production steps of a liquid crystal display (LCD) in accordance with a forty-first embodiment of the present invention.

In case of forming a top-gate MOSTFT, an n-type well 7A is formed in the pMOSTFT section of the peripheral driving circuit section as shown in FIG. 169J using the same process shown in FIGS. 135A to 137H of the above-described thirty-first embodiment.

Figure 169K:
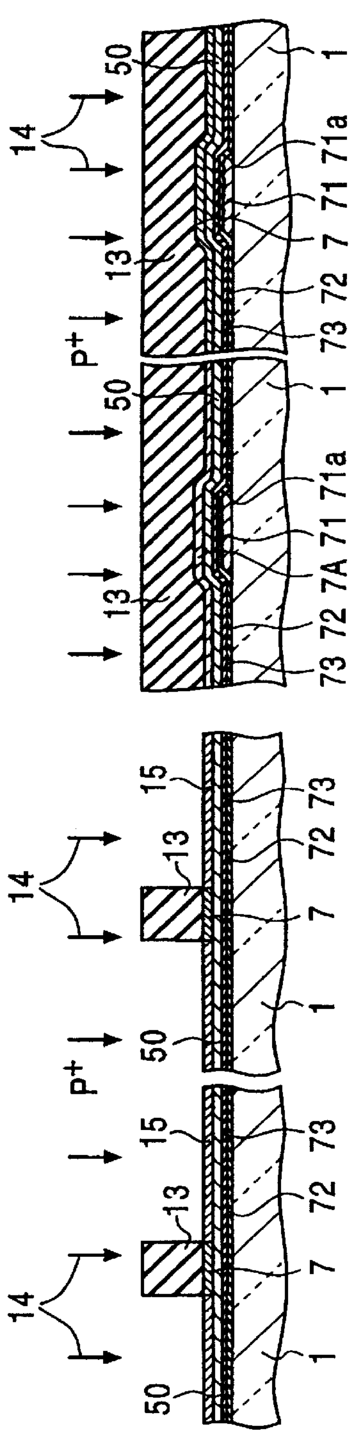

With reference to FIG. 169K, all of the nMOSs and pMOSTFTs in the peripheral-driving-circuit section and the gate section of the nMOSTFTs in the display section are covered with a photoresist layer 13, and the exposed source and drain regions of the nMOSTFTs are doped with phosphorus ions 14 by ion implantation, for example, at 20 kV and at a dose of $5\times10^{13}$ atoms/cm$^2$ to form a LDD section 15 composed of an $N^-$-type layer by self-alignment.

Figure 170L:
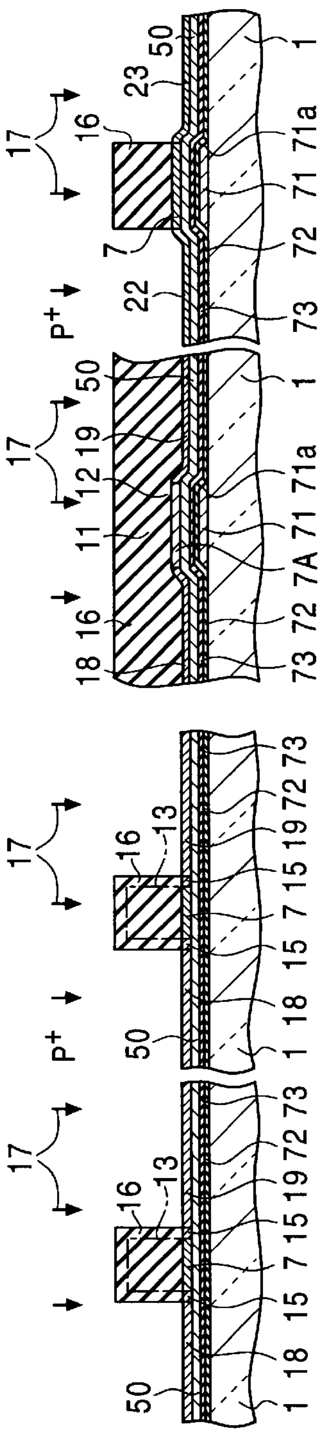

With reference to FIG. 170L, all of the pMOSTFTs in the peripheral-driving-circuit section, the gate sections of the nMOSTFTs in the peripheral-driving-circuit section, and the gate section and the LDD section of the nMOSTFTs in the display section are covered with a photoresist layer 16. The exposed region is doped with phosphorus or arsenic ions 17, for example, at 20 kV and at a dose of $5\times10^{15}$ atoms/$cm^2$ by ion implantation to form a source section 18 and a drain section 19 of nMOSTFT composed of an $N^+$-type layer and an LDD section 15. Preferably, the resist layer 13 is retained, as shown by the dotted line in the drawing, and the resist layer 16 is provided so as to cover the resist layer 13. In the formation process of the resist layer 16, a mask is readily aligned with high accuracy with reference to the resist layer 13.

Figure 170M:
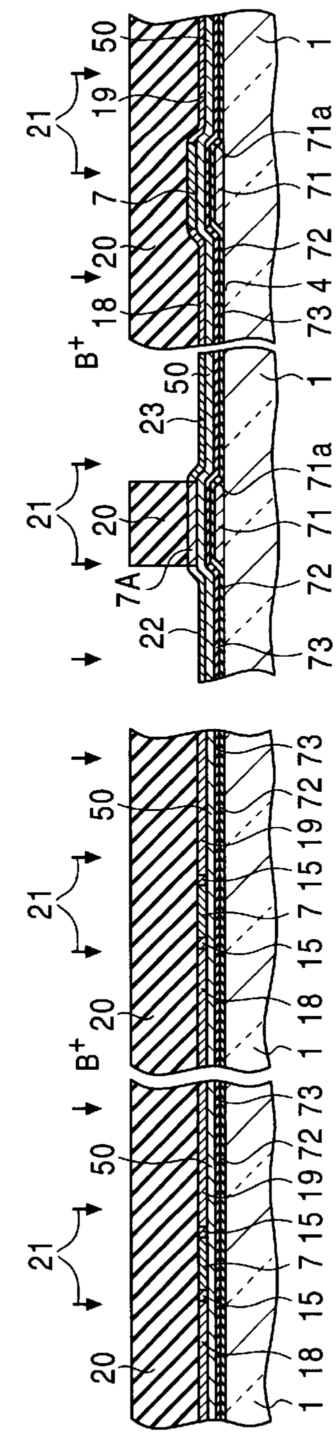

With reference to FIG. 170M, all of the nMOSTFTs in the peripheral-driving-circuit section and the display section and the gate sections of the pMOSTFTs are covered with a photoresist layer 20. The exposed regions are doped with boron ions 21 by ion implantation at 10 kV and at a dose of $5\times10^{15}$ atoms/$cm^2$ to form source sections 22 and drain sections 23 of the pMOSTFTs composed of a $P^+$-type layer.

Figure 170N:
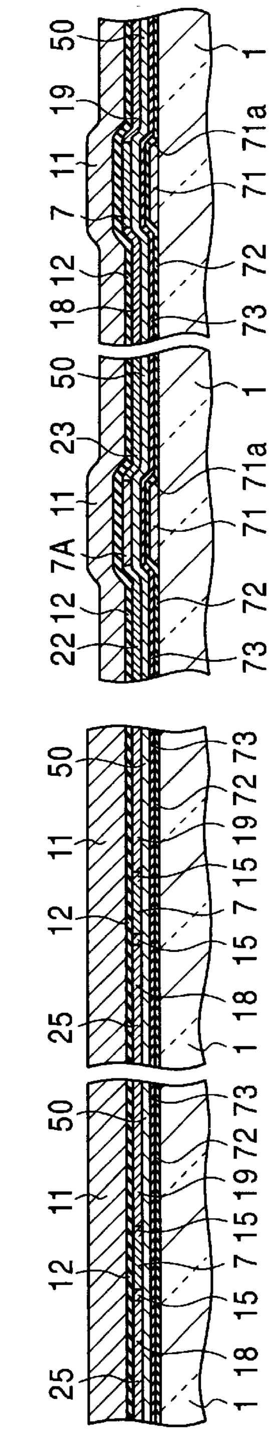

With reference to FIG. 170N, the resist layer 20 is removed, and then the single-crystal silicon layers 7 and 7A are activated as above. Furthermore, a gate insulating film 12 and an aluminum gate electrode layer 11 composed of aluminum or aluminum containing 1% of Si are formed. The gate electrode layer 11 may be formed by a vacuum evaporation process or a sputtering process.

Figure 171O:
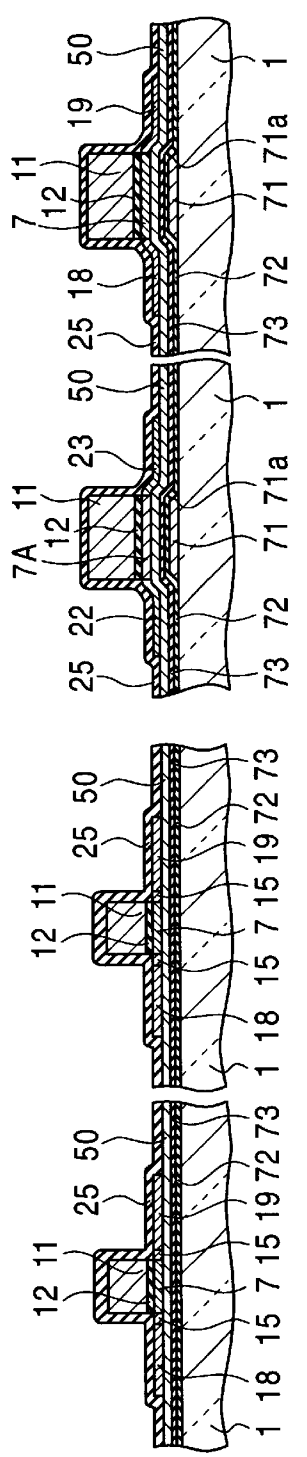

The gate section is patterned, and the active device section and the passive device section are isolated. With reference to FIG. 171O, a $SiO_2$ film having a thickness of approximately 200 nm and then a phosphosilicate glass (PSG) film having a thickness of approximately 300 nm are deposited on the entire surface to form a protective film 25.

Figure 171P:
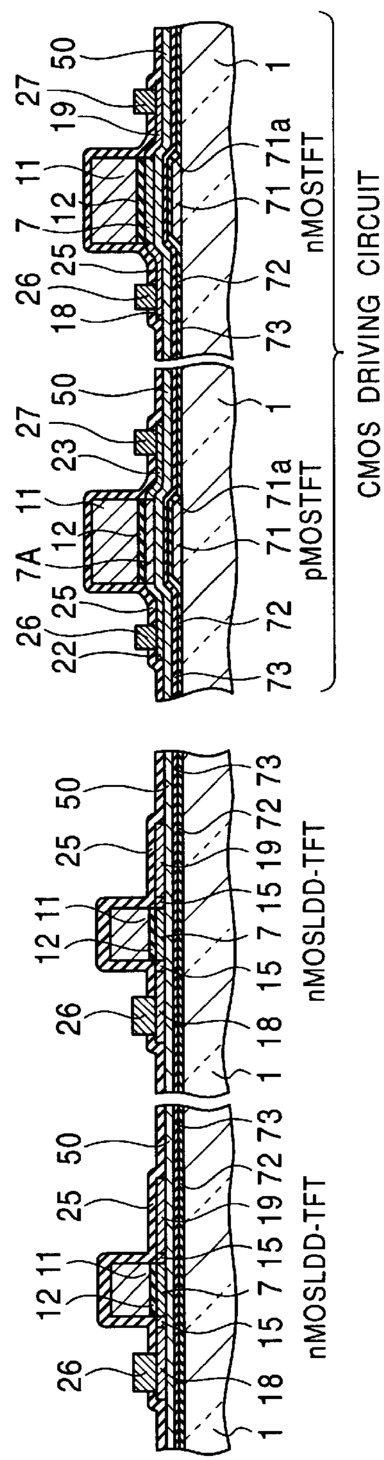

With reference to FIG. 171P, contact holes are formed at the source and drain sections of all TFTs in the peripheral-driving-circuit section and the source sections of the display TFTs by conventional photolithography and etching.

An aluminum sputtered film having a thickness of 500 to 600 nm is formed on the entire surface. Source electrodes 26 of all TFTs in the peripheral-driving-circuit section and the display section, drain electrodes 27 in the peripheral-driving-circuit section, data lines and gate lines are simultaneously formed by conventional photolithography and etching. The substrate is subjected to sintering treatment in a forming gas (nitrogen and hydrogen) at approximately 400° C. for 1 hour.

As in the steps shown in FIGS. 139Q to 141T, an active-matrix substrate 30 integrating a display section and a peripheral-driving-circuit section is produced, in which the display section and the peripheral-driving-circuit section include top-gate nMOSLDD-TFTs having aluminum gate electrodes, and a CMOS driving circuit having dual-gate pMOSTFTs and nMOSTFTs using the single-crystal silicon layer 7.

Since the aluminum gate electrodes 11 are formed after the activation treatment of the single-crystal silicon layer 7, the gate electrode material is not subject to the activation treatment. Any inexpensive material having relatively low heat resistance, such as aluminum, may be used for the gate electrode. This process can also be applied when the display section includes bottom-gate MOSTFTs.

When dual-gate MOSTFTs and top-gate MOSTFTs are formed in the display section and the peripheral-driving-circuit section, respectively, the processes shown in FIGS. 92J to 94Q are performed as in the above-described twenty-third embodiment to form an active-matrix substrate 30 integrating a display section and a peripheral-driving-circuit section, in which the display section comprises a CMOS driving circuit comprising dual-gate nMOSLDD-TFTs having aluminum gate electrodes and in which the peripheral-driving-circuit section comprises a CMOS driving circuit having pMOSTFTs and nMOSTFTs.

Alternatively, the processes shown in FIGS. 108I to 110P are performed as in the above-described twenty-fifth embodiment to form the above-described active-matrix substrate 30.

Forty-second Embodiment

Figure 172:
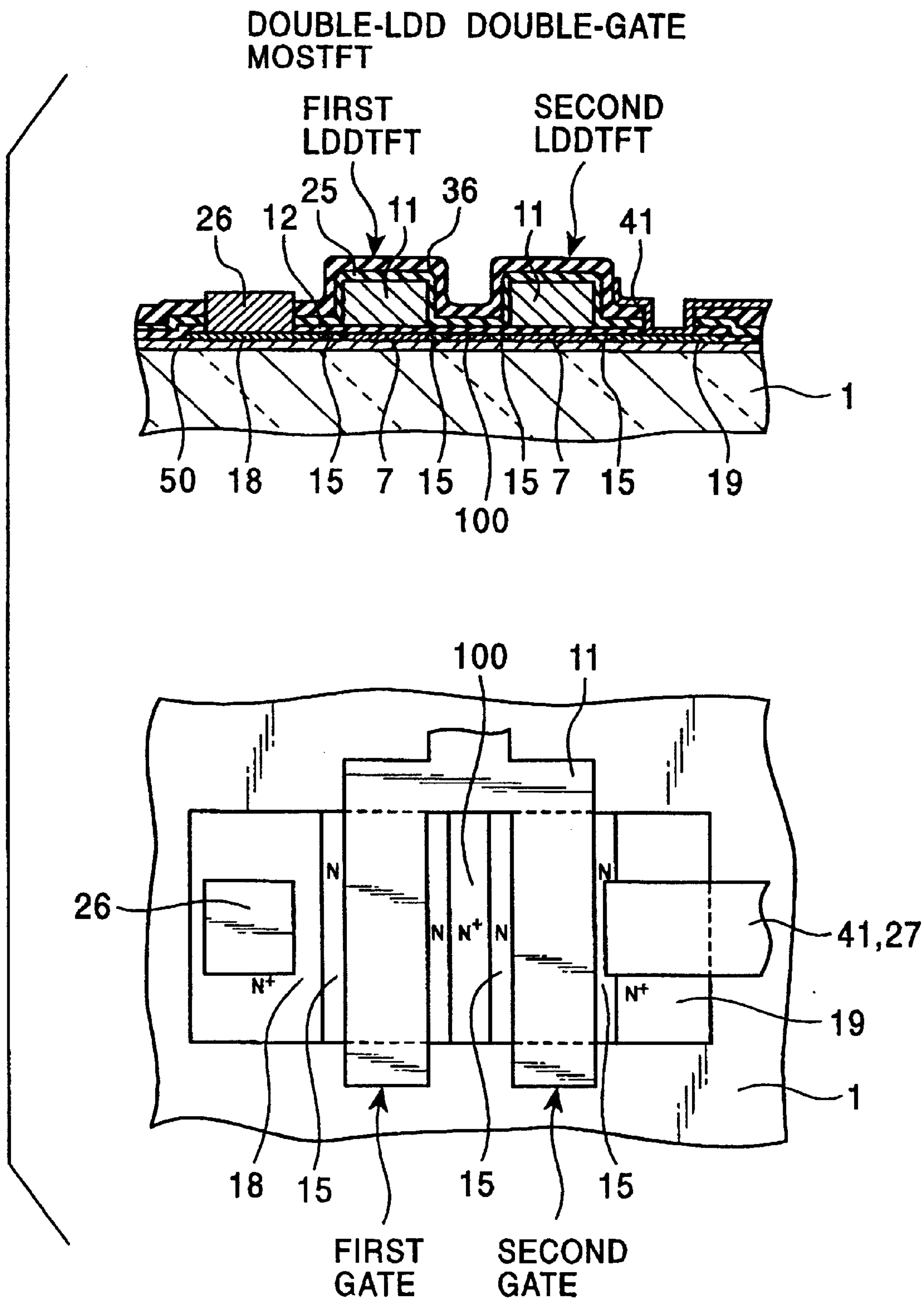
FIGS. 172A and 172B are a cross-sectional view and a plan view, respectively, of a LCD in accordance with a forty-second embodiment of the present invention.
Figure 173A:
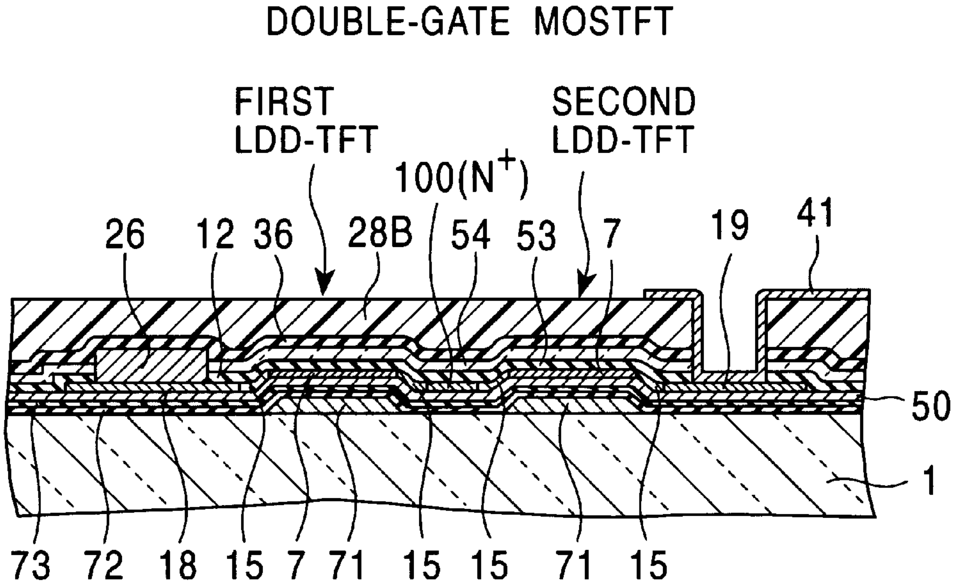
FIGS. 173A and 173B are cross-sectional views of various TFTs in the LCD in accordance with the forty-second embodiment of the present invention.
Figure 173B:
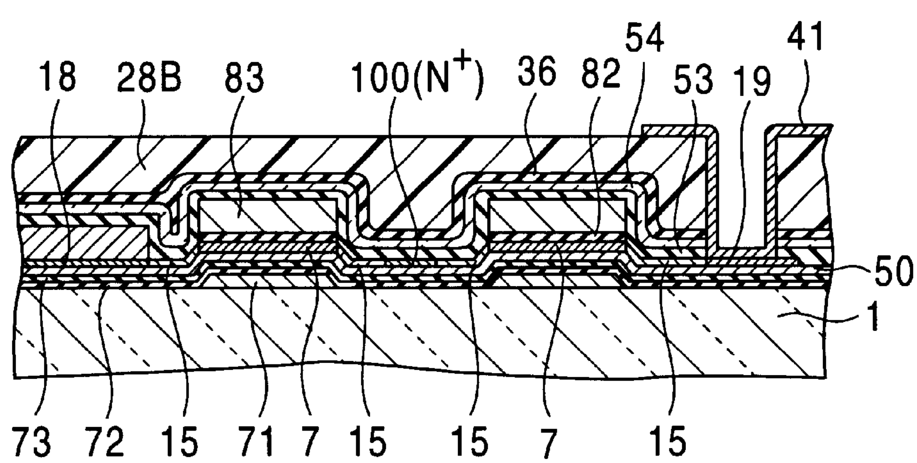

FIGS. 172A and 173B show a forty-second embodiment of the present invention.

FIG. 172A shows an example of a double-gate MOSTFT comprising a plurality of self-alignment LDD-TFTs, for example, top-gate LDD-TFTs, which are connected in a line in the twenty-ninth embodiment.

FIG. 173A shows an example of a double-gate structure comprising bottom-gate MOSTFTs, and FIG. 173B shows an example of a double-gate structure comprising dual-gate MOSTFTs.

These double-gate MOSTFTs have the same advantages as described above with reference to FIGS. 116A to 119B.

Forty-third Embodiment

FIGS. 174 to 200 show a forty-third embodiment of the present invention.

As described above, the top-gate, bottom-gate and dual gate TFTs have different structures, functions and characteristics. A variety of combination of these TFTs may be employed in the display section and the peripheral-driving-circuit section.

For example, as shown in FIG. 174, when any one of the top-gate MOSTFT, the bottom-gate MOSTFT and the dual-gate MOSTFT is used in the display section, the top-gate type is used alone or in a combination with at least one of the other types in the peripheral-driving-circuit section. Alternatively, as shown in FIG. 175, when any one of the top-gate MOSTFT, the bottom-gate MOSTFT and the dual-gate MOSTFT is used in the display section, the bottom-gate type is used alone or in a combination with at least one of the other types in the peripheral-driving-circuit section. Alternatively, as shown in FIG. 176, when any one of the top-gate MOSTFT, the bottom-gate MOSTFT and the dual-gate MOSTFT is used in the display section, the dual-gate type is used alone or in a combination with at least one of the other types in the peripheral-driving-circuit section. In these cases, there are 12 types of combination. When a dual-gate structure is employed in the MOSTFT in the peripheral-driving-circuit section, this dual-gate structure functions as a top-gate type or a bottom-gate type by selecting the upper or lower gate. If the peripheral driving circuit requires TFTs having large driving power, the dual-gate type is preferable. For example, electrooptical devices using organic EL or FED will require the dual-gate type.

FIGS. 177 and 178, FIGS. 185 and 186, and FIGS. 193 and 194 show possible combinations when the MOSTFTs in the display section do not have a LDD structure. FIGS. 179 and 180, FIGS. 187 and 188, and FIGS. 195 and 196 show possible combinations when the MOSTFTs in the display section have a LDD structure. FIGS. 181 and 182, FIGS. 189 and 190, and FIGS. 197 and 198 show possible combinations when the peripheral-driving-circuit section includes TFTs having a LDD structure. FIGS. 183 and 184, FIGS. 191 and 192, and FIGS. 199 and 200 show possible combinations when the peripheral-driving-circuit section and the display section include TFTs having a LDD structure.

The details of the combinations shown in FIG. 174 are shown in FIGS. 177 to 184. The details of the combinations shown in FIG. 175 are shown in FIGS. 185 to 192. The details of the combinations shown in FIG. 176 are shown in FIGS. 193 to 200. These combinations are also available when the peripheral-driving-circuit section includes the top-gate MOSTFT and the other-type MOSTFT(s). These combinations are also applicable when the channel region of the TFT is formed of polycrystalline silicon or amorphous silicon (only in the display section).

Forty-fourth Embodiment

Figure 201A:
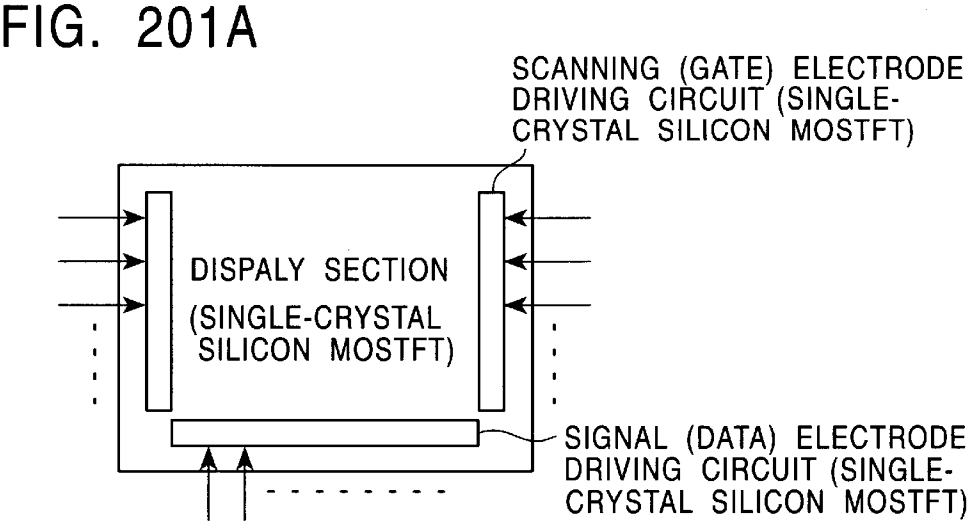
FIGS. 201A to 201C are outline schematic views of LCDs in accordance with a forty-fourth embodiment of the present invention.

FIGS. 201A to FIG. 202 show a forty-fourth embodiment of the present invention.

This embodiment relates to an active-matrix LCD which includes TFTs having high driving power and using the above-mentioned single-crystal silicon layer in the peripheral-driving-circuit section. Any gate type among the above-mentioned top-gate, bottom-gate, and dual-gate types may be included in this embodiment. Furthermore, any channel conductive type may be employed. In addition, MOSTFTs using a polycrystalline silicon layer may be included. In contrast, a single-crystal silicon layer is preferably used for MOSTFTs in the display section; however, a polycrystalline or amorphous silicon layer may be usable. Alternatively, two or three types of silicon layers may be present. When the display section is formed of nMOSTFTs, a single-crystal or polycrystalline silicon layer is preferable due to a smaller TFT area and reduced pixel defects compared with an amorphous silicon layer. Polysilicon, in addition to single-crystal silicon, may be formed during heteroepitaxy to form a continuous grain silicon (CGS) structure which can be advantageously used for the formation of the active device and the passive device in some cases.

Figure 201B:
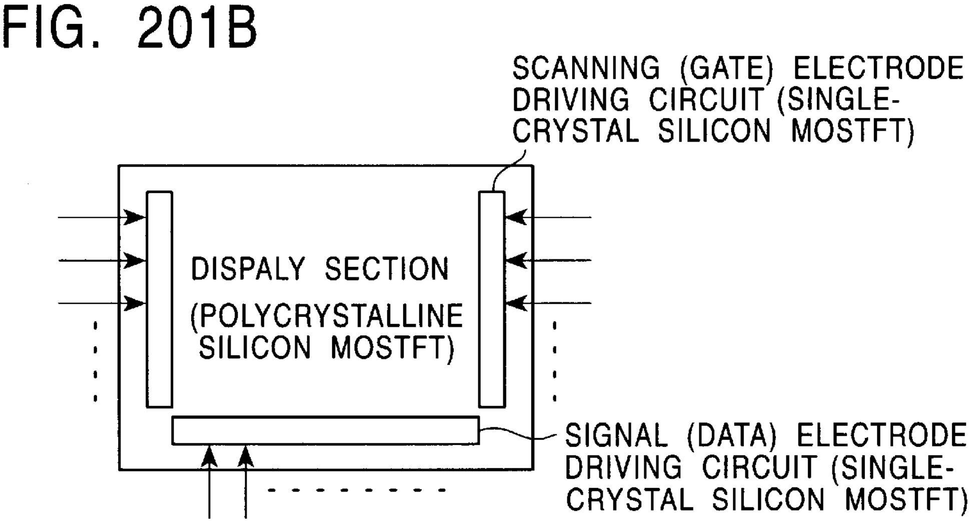
Figure 201C:
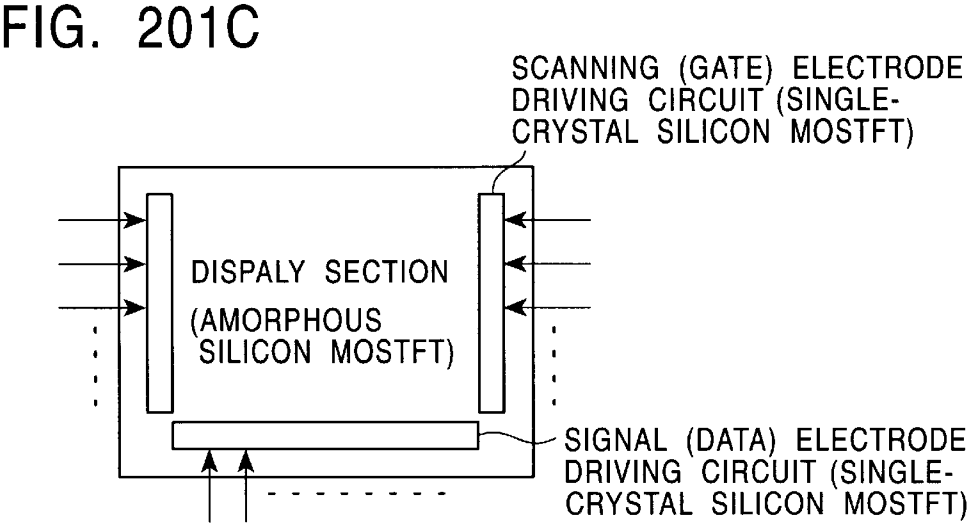

FIGS. 201A to 201C show possible combinations of various MOSTFTs in the display section and the peripheral-driving-circuit section. FIG. 202 shows the details of these combinations. The use of single-crystal silicon causes improved current driving ability. Thus, the size of the device can be decreased while the size of the screen can be increased, and the aperture ratio in the display section can be improved.

In the peripheral-driving-circuit section, an electric circuit integrating diodes, capacitors, resistors, and inductors, in addition to the MOSTFTs can be formed on the insulating substrate such as a glass substrate.

Forty-fifth Embodiment

Figure 203:
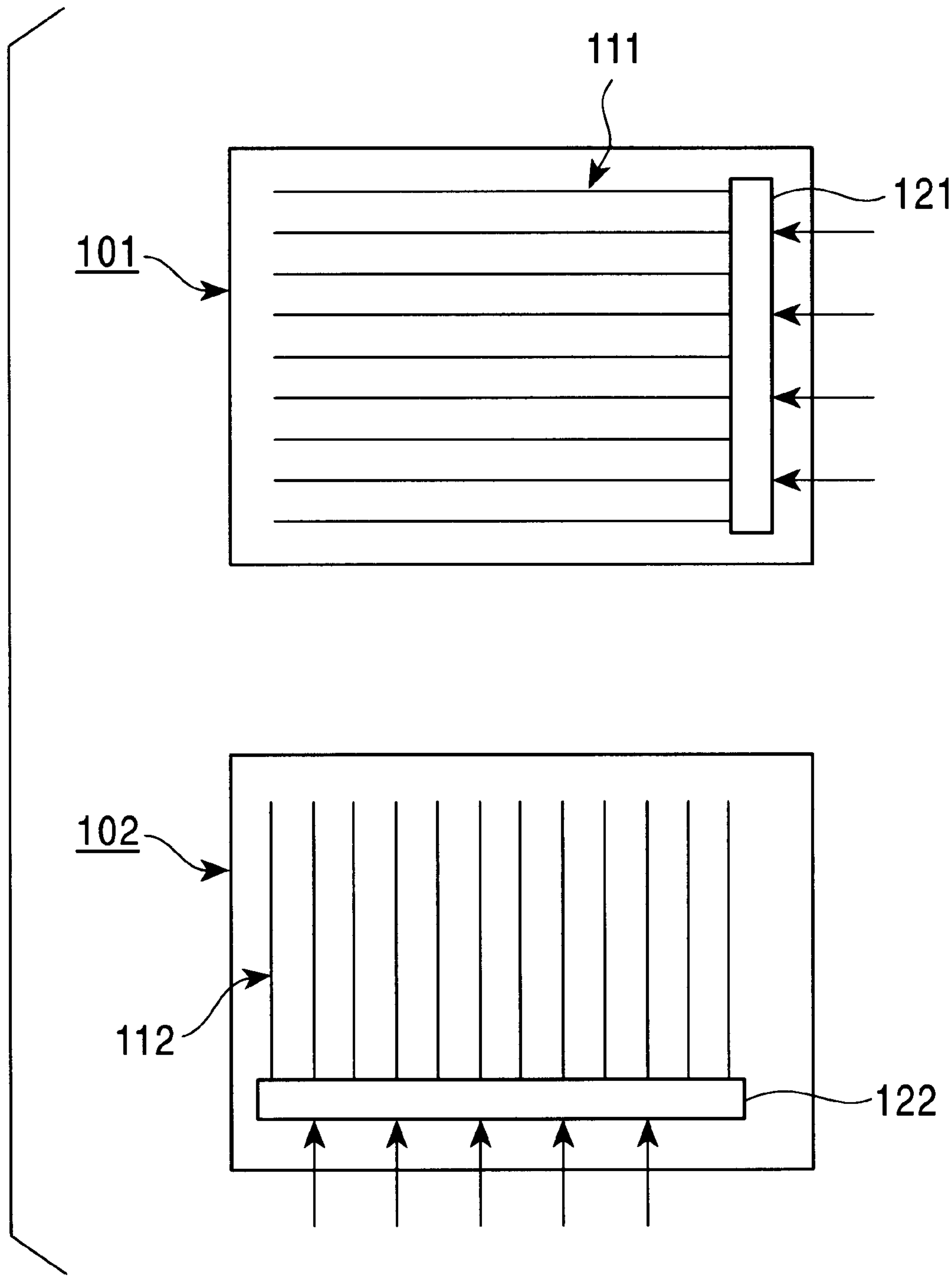
FIG. 203 is an outline schematic view of a device in accordance with a forty-fifth embodiment of the present invention.

FIG. 203 shows a forty-fifth embodiment of the present invention. This embodiment relates to a passive-matrix drive, unlike the above embodiments for the active matrix drive. The display section does not have switching devices such as MOSTFTs, and modulation of the incident or reflected light in the display section is performed by only the difference in voltage applied to a pair of electrodes formed on two opposing substrates. That is, an upper glass substrate 101 has signal or data electrodes 111 connected to a signal-electrode driving circuit 121 including, for example, single-crystal silicon MOSTFTs, and a lower glass substrate 102 has scanning or gate electrodes 112 connected to a scanning-electrode driving circuit 122 including, for example, single-crystal silicon MOSTFTs. Examples of such modulation devices include reflective or transmissive LCDs, organic EL devices, FEDs, LEPDs, and LEDs.

Forty-sixth Embodiment

Figure 204A:
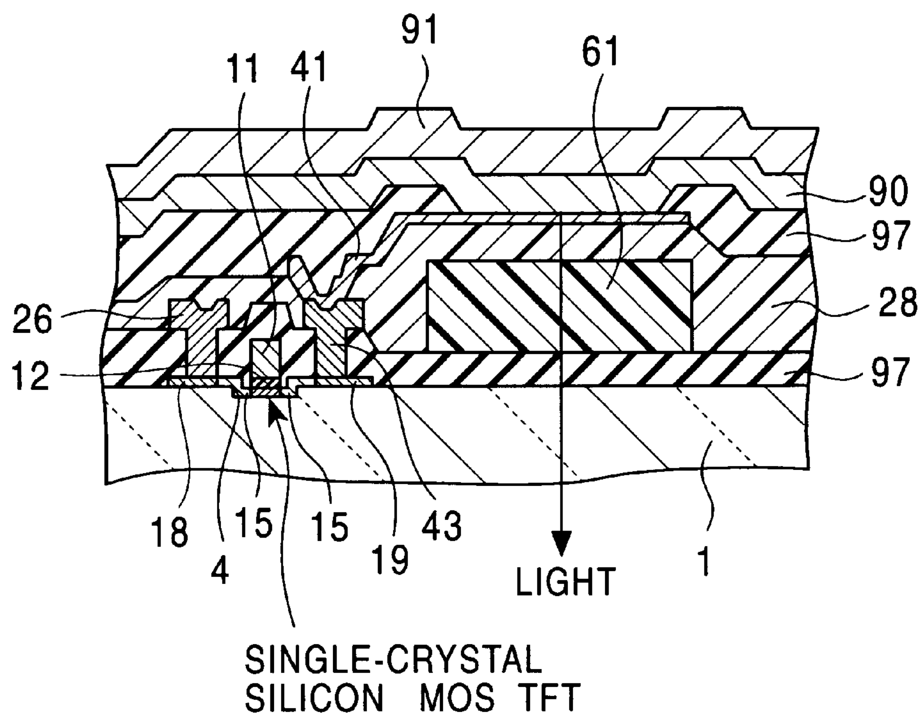
FIGS. 204A and 204B are cross-sectional views of an EL device and an FED, respectively, in accordance with a forty-sixth embodiment of the present invention.
Figure 204B:
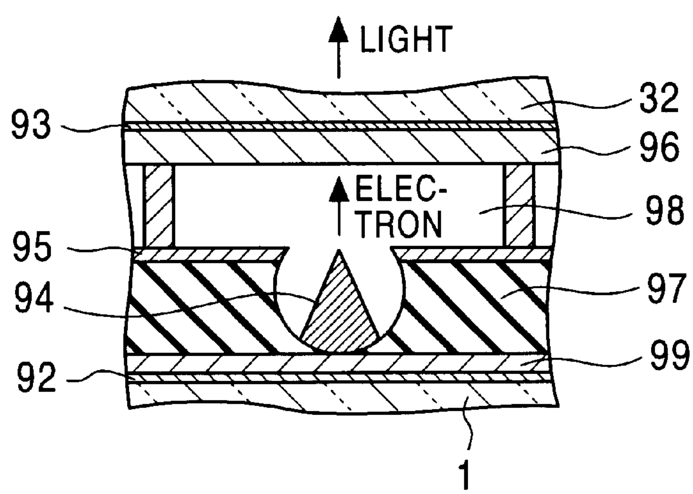

FIGS. 204A and 204B show a forth-sixth embodiment of the present invention.

This embodiment relates to electrooptical devices other than LCDs, such as organic or inorganic electroluminescence (EL) devices, field-emission devices (FEDs), light-emitting polymer devices (LEPDs), and light-emitting diodes.

FIG. 204A shows one pixel portion of an active-matrix EL device. An EL layer 90 composed of an amorphous organic compound or an inorganic compound, such as ZnS:Mn, is formed on a substrate 1. A transparent ITO electrode 41 is provided below the EL layer 90, and a cathode 91 is formed on the EL layer 90. When a voltage is applied to these electrodes 41 and 91, colored light is emitted through a color filter 61.

In order to apply a data voltage to the transparent electrode 41 by active-matrix drive, a substrate 1 is provided with a single-crystal silicon MOSTFT, that is, nMOSLDD-TFT, using a single-crystal silicon layer deposited by heteroepitaxy on a step difference 4 as a seed on the substrate 1. Similar TFTs are also formed in a peripheral driving circuit. In FIG. 204A, numeral 28 represents a transparent planarization layer, and numeral 97 represents an insulating film. Other numerals assigned for the single-crystal silicon MOSTFT are the same as in the above embodiments. Since this EL device is driven by MOSLDD-TFTs using the single-crystal silicon layer, the EL device has a high switching rate and a reduced leakage current. The color filter 61 may be omitted if the EL layer 90 emits a specified color.

Since the EL device requires a high driving voltage, the peripheral driving circuit preferably has driver devices having high voltage resistance, such as cMOSTFTs and bipolar devices, in addition to the MOSTFTs.

FIG. 204B shows one pixel portion of a passive-matrix FED. When a voltage is applied between an emitter line 92 and an anode 93, electrons are emitted from a cold cathode 94 in a vacuum section 98 between two opposing glass substrates 1 and 32, and are incident on a fluorescent layer 96 via selection by a gate line 95 to emit light having a predetermined color.

The emitter line 92 is connected to a peripheral driving circuit and is driven by a data voltage. The peripheral driving circuit includes MOSTFTs using a single-crystal silicon layer based on the present invention and contributes to high-speed driving of the emitter line 92. In FIG. 204B, numeral 99 represents a resistance film. In this FED, the above-mentioned MOSTFT may be connected to each pixel electrode so that the FED is driven by an active-matrix system.

When a conventional light-emitting polymer is used instead of the EL layer 90 in the EL device shown in FIG. 204A, this device becomes a passive-matrix or active-matrix light-emitting polymer device (LEPD). In the FED shown in FIG. 204B, a diamond thin-film may be used as the cathode. In a light emitting diode, a light emitting section composed of a gallium-based film, such as gallium-aluminum-arsenic, may be driven by MOSTFTs of the epitaxial single-crystal silicon in accordance with the present invention. Alternatively, the light-emitting film may be formed by epitaxy in accordance with the present invention.

The above-described embodiments of the present invention may have various modifications, as described below.

When the polycrystalline silicon film 5 (or an amorphous silicon film) is deposited, the film 5 may be doped with a Group III or V element having high solubility, e.g., boron, phosphorus, antimony, arsenic, aluminum, gallium, indium, or bismuth, in an adequate amount to control the channel conductive type (P or N) of and the carrier content in the epitaxial silicon layer 7.

Any one of the sixth to ninth embodiments may be applied to any one of the thirteenth to seventeenth embodiments using an indium-gallium alloy or metallic gallium. In order to avoid diffusion of ions from the glass substrate, a SiN film having a thickness of, for example, 50 to 200 nm and a $SiO_2$ film having a thickness of 100 nm, if necessary, may be formed on the substrate surface. The above-described step differences 4 may be formed on these films. The step differences may be formed by ion milling instead of the above-mentioned RIE process. The step differences 4 may be formed in the crystalline sapphire film or a sapphire substrate within the thickness thereof, in addition to the formation of the step differences 4 in the substrate 1.

The above-mentioned sapphire ($Al_2O_3$) may be replaced with a spinel structure such as magnesia spinel ($MgO.Al_2O_3$), calcium fluoride ($CaF_2$), strontium fluoride ($SrF_2$), barium fluoride ($BaF_2$), boron phosphide (BP), yttrium oxide ($(Y_2O_3)_m$), and zirconium oxide $(ZrO_2)_{1-m}$.

In addition to TFTs in the peripheral driving circuit, active regions, such as diodes, and passive regions, such as resistors, capacitors, and inductors, of devices may be formed of the single-crystal silicon layer in accordance with the present invention.

What is claimed is:

1. A method for making an electrooptical device comprising a first substrate including a display section provided with pixel electrodes and a peripheral-driving-circuit section provided at a periphery of the display section, a second substrate, and an optical material disposed between the first substrate and the second substrate; the method comprising:

forming a material layer having a high degree of lattice matching with single-crystal silicon above the first substrate;

forming a polycrystalline or amorphous silicon layer having a given thickness over the first substrate and the material layer and then forming a low-melting-point metal layer on or under the polycrystalline or amorphous silicon layer or forming a low-melting-point metal layer containing silicon over the first substrate and the material layer;

dissolving the polycrystalline or amorphous silicon layer or the silicon into the low-melting-point metal layer by a heat treatment;

precipitating a single-crystal silicon layer from the silicon in the polycrystalline or amorphous silicon layer or the silicon in the low-melting-point metal layer by heteroepitaxial growth including a cooling treatment using the material layer as a seed; and treating the single-crystal silicon layer through a predetermined process to form at least an active device.

2. A method for making an electrooptical device according to claim 1, the method further comprising the steps of:

forming a channel region, a source region, and a drain region in the deposited single-crystal silicon layer; and forming a gate section above the channel region so as to form a top-gate type first thin-film transistor constituting at least as a part of the peripheral-driving-circuit section.

3. A method for making an electrooptical device according to claim 1, wherein the polycrystalline or amorphous silicon layer is formed by a low-temperature deposition process, the low-melting-point metal layer is deposited thereon or thereunder or the low-melting-point metal layer containing silicon is deposited, and the heating treatment and the cooling treatment are performed.

4. A method for making an electrooptical device according to claim 1, wherein the first substrate comprises one of a glass substrate and a heat-resistant organic substrate, the material layer comprises at least one material selected from the group consisting of sapphire, a spinel structure, calcium fluoride, strontium fluoride, barium fluoride, boron phosphide, yttrium oxide, and zirconium oxide, and the low-melting-point metal layer comprises at least one metal selected from the group consisting of indium, gallium, tin, bismuth, lead, zinc, antimony, and aluminum.

5. A method for making an electrooptical device according to claim 4, wherein the heating treatment is performed in a hydrogen atmosphere at a temperature of 850 to 1,100° C. when the low-melting-point metal layer comprises indium, at a temperature of 300 to 1,100° C. when the low-melting-point metal layer comprises an indium-gallium alloy, and at a temperature of 400 to 1,100° C. when the low-melting-point metal layer comprises gallium.

6. A method for making an electrooptical device according to claim 1, wherein the melt is applied onto the first substrate heated to 850 to 1,100° C. when the low-melting-point metal comprises indium, 300 to 1,100° C. when the low-melting-point metal comprises an indium-gallium alloy, or 400 to 1,100° C. when the low-melting-point metal comprises gallium.

7. A method for making an electrooptical device according to claim 1, wherein a diffusion-barrier layer is formed over the first substrate, and the polycrystalline or amorphous silicon layer, the low-melting-point metal layer containing silicon, or the melt layer of the low-melting-point metal is formed thereon.

8. A method for making an electrooptical device according to claim 1, wherein a Group III or V impurity element is contained in the polycrystalline or amorphous silicon layer or the low-melting-point metal layer containing silicon determine a type and concentration of the impurity element in the single-crystal silicon layer.

9. A method for making an electrooptical device according to claim 2, wherein a gate section including a gate insulating film and a gate electrode is formed on the single-crystal silicon layer after the deposition of the single-crystal silicon layer, and the single-crystal silicon layer is doped with a Group III or V impurity element using the gate section as a mask.

10. A method for making an electrooptical device according to claim 1, wherein a step difference is formed on the first substrate, the material layer is formed over the first substrate and the step difference, and the single-crystal silicon layer is formed on the material layer.

11. A method for making an electrooptical device according to claim 10, wherein the step difference has an indented section having a cross-section in which a side face is perpendicular to or slanted with respect to a plane of the substrate, and the step difference and the material layer function as seeds for epitaxial growth of the single-crystal silicon layer.

12. A method for making an electrooptical device according to claim 10, wherein a first thin-film transistor is formed the indented section of the step difference which is formed on either the first substrate or a film formed on the first substrate.

13. A method for making an electrooptical device according to claim 10, wherein the step difference is formed along at least one side of a device region including the active device.

14. A method for making an electrooptical device according to claim 10, wherein the step difference is formed along at least one side of a device region including a first thin-film transistor.

15. A method for making an electrooptical device according to claim 1, wherein a step difference is formed in the material layer, and the single-crystal silicon layer is formed over the material layer including the step difference.

16. A method for making an electrooptical device according to claim 15, wherein the step difference has an indented section having a cross-section in which a side face is perpendicular to or slanted with respect to a plane of the substrate, and the step difference and the material layer function as seeds for epitaxial growth of the single-crystal silicon layer.

17. A method for making an electrooptical device according to claim 15, wherein a first thin-film transistor is formed at the indented section formed by the step difference which is formed on either on the first substrate or a film formed on the first substrate.

18. A method for making an electrooptical device according to claim 15, wherein the step difference is formed along at least one side of a device region including the active device.

19. A method for making an electrooptical device according to claim 15, wherein the step difference is formed along at least one side of a device region including a first thin-film transistor.

20. A method for making an electrooptical device according to claim 1, wherein the first substrate is either a glass substrate or a heat-resistant organic substrate.

21. A method for making an electrooptical device according to claim 1, wherein the first substrate is optically opaque or transparent.

22. A method for making an electrooptical device according to claim 1, wherein pixel electrodes are provided for a reflective or transmissive display.

23. A method for making an electrooptical device according to claim 1, wherein the display section further comprises a laminated configuration of pixel electrodes and a color filter layer.

24. A method for making an electrooptical device according to claim 1, wherein unevenness is formed on a resin film when pixel electrodes are reflective electrodes, or the surface is planarized by a transparent planarization film and the pixel electrodes are formed on the planarized plane when the pixel electrodes are transparent electrodes.

25. A method for making an electrooptical device according to claim 1, wherein the display section comprises one of a liquid crystal display, an electroluminescent display, a field emission display, a light-emitting polymer display, and a light-emitting diode display.

26. A method for making a driving substrate for an electrooptical device comprising a substrate including a display section provided with pixel electrodes and a peripheral-driving-circuit section provided at a periphery of the display section, the method comprising the steps of:

forming a material layer having a high degree of lattice matching with single-crystal silicon above the substrate;

forming a polycrystalline or amorphous silicon layer having a given thickness over the substrate and the material layer and then forming a low-melting-point metal layer on or under the polycrystalline or amorphous silicon layer, or forming a low-melting-point metal layer containing silicon over the substrate and the material layer;

dissolving the polycrystalline or amorphous silicon layer or the silicon into the low-melting-point metal layer by a heat treatment;

precipitating a single-crystal silicon layer from the silicon in the polycrystalline or amorphous silicon layer or the silicon in the low-melting-point metal layer by heteroepitaxial growth including a cooling treatment using the material layer as a seed; and treating the single-crystal silicon layer through a predetermined process to form at least an active device.

27. A method for making a driving substrate for an electrooptical device according to claim 26, the method further comprising the steps of:

forming a channel region, a source region, and a drain region in the deposited single-crystal silicon layer by a predetermined process; and forming a gate section above the channel region so as to form a top-gate type first thin-film transistor constituting at least a part of the peripheral-driving-circuit section.

28. A method for making a driving substrate for an electrooptical device according to claim 26, wherein the polycrystalline or amorphous silicon layer is formed by a low-temperature deposition process, the low-melting-point metal layer is deposited thereon or thereunder or the low-melting-point metal layer containing silicon is deposited, and the heating treatment and the cooling treatment are performed.

29. A method for making a driving substrate for an electrooptical device according to claim 26, wherein the substrate is either a glass substrate or a heat-resistant organic substrate, the material layer comprises at least one material selected from the group consisting of sapphire, a spinel structure, calcium fluoride, strontium fluoride, barium fluoride, boron phosphide, yttrium oxide, and zirconium oxide, and the low-melting-point metal layer comprises at least one metal selected from the group consisting of indium, gallium, tin, bismuth, lead, zinc, antimony, and aluminum.

30. A method for making a driving substrate for an electrooptical device according to claim 29, wherein the heating treatment is performed in a hydrogen atmosphere at a temperature of 850 to 1,100° C. when the low-melting-point metal layer comprises indium, at a temperature of 300 to 1,100° C. when the low-melting-point metal layer comprises an indium-gallium alloy, and at a temperature of 400 to 1,100° C. when the low-melting-point metal layer comprises gallium.

31. A method for making a driving substrate for an electrooptical device according to claim 26, wherein the melt is applied onto the first substrate heated to 850 to 1,100° C. when the low-melting-point metal comprises indium, 300 to 1,100° C. when the low-melting-point metal comprises an indium-gallium alloy, or 400 to 1,100° C. when the low-melting-point metal comprises gallium.

32. A method for making a driving substrate for an electrooptical device according to claim 26, wherein a diffusion-barrier layer is formed above the substrate, and the polycrystalline or amorphous silicon layer, the low-melting-point metal layer containing silicon, or the melt layer of the low-melting-point metal is formed thereon.

33. A method for making a driving substrate for an electrooptical device according to claim 26, wherein a Group III or V impurity element is contained in the polycrystalline or amorphous silicon layer or the low-melting-point metal layer containing silicon to control a type and concentration of the impurity element in the single-crystal silicon layer.

34. A method for making a driving substrate for an electrooptical device according to claim 27, wherein a gate section including a gate insulating film and a gate electrode is formed over the single-crystal silicon layer after the deposition of the single-crystal silicon layer, and the single-crystal silicon layer is doped with a Group III or V impurity element using the gate section as a mask to form the channel region, the source region, and the drain region.

35. A method for making a driving substrate for an electrooptical device according to claim 26, wherein a step difference is formed on the substrate, the material layer is formed over the substrate and the step difference, and the single-crystal silicon layer is formed on the material layer.

36. A method for making a driving substrate for an electrooptical device according to claim 35, wherein the step difference has an indented section having a cross-section in which a side face is perpendicular to or slanted to a plane of the substrate, and the step difference and the material layer function as seeds for epitaxial growth of the single-crystal silicon layer.

37. A method for making a driving substrate for an electrooptical device according to claim 35, wherein a first thin-film transistor is formed at the indented section.

38. A method for making a driving substrate for an electrooptical device according to claim 35, wherein the step difference is formed along at least one side of a device region.

39. A method for making a driving substrate for an electrooptical device according to claim 35, wherein the step difference is formed along at least one side of a device region including a first thin-film transistor.

40. A method for making a driving substrate for an electrooptical device according to claim 26, wherein a step difference is formed in the material layer, and the single-crystal silicon layer is formed over the material layer including the step difference.

41. A method for making a driving substrate for an electrooptical device according to claim 40, wherein the step difference has an indented section having a cross-section in which a side face is perpendicular to or slanted with respect to a plane of the substrate, and the step difference and the material layer function as seeds for epitaxial growth of the single-crystal silicon layer.

42. A method for making a driving substrate for an electrooptical device according to claim 40, wherein a first thin-film transistor is formed at the indented section.

43. A method for making a driving substrate for an electrooptical device according to claim 40, wherein the step difference is formed along at least one side of a device region including the active device.

44. A method for making a driving substrate for an electrooptical device according to claim 40, wherein the step difference is formed along at least one side of a device region including a first thin-film transistor.

45. A method for making a driving substrate for an electrooptical device according to claim 26, wherein the substrate is one either a glass substrate or a heat-resistant organic substrate.

46. A method for making a driving substrate for an electrooptical device according to claim 26 , wherein the substrate is optically opaque or transparent.

47. A method for making a driving substrate for an electrooptical device according to claim 26, wherein pixel electrodes are provided for a reflective or transmissive display.

48. A method for making a driving substrate for an electrooptical device according to claim 26, wherein the display section has a laminated configuration of pixel electrodes and a color filter layer.

49. A method for making a driving substrate for an electrooptical device according to claim 26, wherein unevenness is formed on a resin film when pixel electrodes are reflective electrodes, or the surface is planarized by a transparent planarization film and the pixel electrodes are formed on the planarized plane when the pixel electrodes are transparent electrodes.

50. A method for making a driving substrate for an electrooptical device according to claim 26, wherein the display section is either a liquid crystal display, an electroluminescent display, a field emission display, a light-emitting polymer display, or a light-emitting diode display.

* * * * *